US012703711B2

(12) United States Patent
Zink et al.

(10) Patent No.: US 12,703,711 B2
(45) Date of Patent: Aug. 11, 2026

(54) ORGANIC MOLECULES FOR OPTOELECTRONIC DEVICES

(71) Applicant: Samsung Display Co., Ltd., Yongin-si (KR)

(72) Inventors: Daniel Zink, Graben-Neudorf (DE); Damien Thirion, Karlsdorf-Neuthard (DE); Stefan Seifermann, Bühl (DE); Sebastian Dück, Heidelberg (DE)

(73) Assignee: Samsung Display Co., Ltd., Yongin-si (KR)

( * ) Notice: Subject to any disclaimer, the term of this patent is extended or adjusted under 35 U.S.C. 154(b) by 790 days.

(21) Appl. No.: 17/996,926

(22) PCT Filed: Apr. 23, 2021

(86) PCT No.: PCT/EP2021/060707

§ 371 (c)(1),
(2) Date: Oct. 21, 2022

(87) PCT Pub. No.: WO2021/214310

PCT Pub. Date: Oct. 28, 2021

(65) Prior Publication Data

US 2023/0174558 A1 Jun. 8, 2023

(30) Foreign Application Priority Data

Apr. 23, 2020 (EP) .................................... 20171128
Dec. 23, 2020 (EP) .................................... 20217125

(51) Int. Cl.

| | |
|---|---|
| ***H01L 51/50*** | (2006.01) |
| ***C07F 5/02*** | (2006.01) |
| ***C09K 11/06*** | (2006.01) |
| ***H10K 50/11*** | (2023.01) |
| ***H10K 85/60*** | (2023.01) |

(52) U.S. Cl.

CPC .............. *C07F 5/027* (2013.01); *C09K 11/06* (2013.01); *H10K 50/11* (2023.02); *H10K 85/615* (2023.02); *H10K 85/636* (2023.02); *H10K 85/657* (2023.02); *H10K 85/658* (2023.02); *C09K 2211/1018* (2013.01)

(58) Field of Classification Search

None

See application file for complete search history.

(56) References Cited

U.S. PATENT DOCUMENTS 9,166,176 B2 10/2015 Hatakeyama et al.
9,231,218 B2 1/2016 Lin et al.
9,318,710 B2 4/2016 Kwong
10,981,930 B2 4/2021 Danz et al.
(Continued)

FOREIGN PATENT DOCUMENTS

CN 104641483 A 5/2015
CN 108675985 A 10/2018
(Continued)

OTHER PUBLICATIONS

International Search Report and Written Opinion of PCT/EP2021/060705, Sep. 3, 2021, 10 pp.
International Search Report and Written Opinion of PCT/EP2021/060706, Sep. 3, 2021, 11 pp.
International Search Report and Written Opinion of PCT/EP2021/060703, Sep. 3, 2021, 11 pp.
(Continued)

*Primary Examiner* — Gregory D Clark

(74) *Attorney, Agent, or Firm* — Womble Bond Dickinson (US) LLP

(57) ABSTRACT

The invention relates to an organic molecule, in particular for the application in optoelectronic devices. According to the invention, the organic molecule is represented by a plurality of units, wherein each unit includes or consists of a structure represented by Formula IIIe-0

Formula IIIe-0

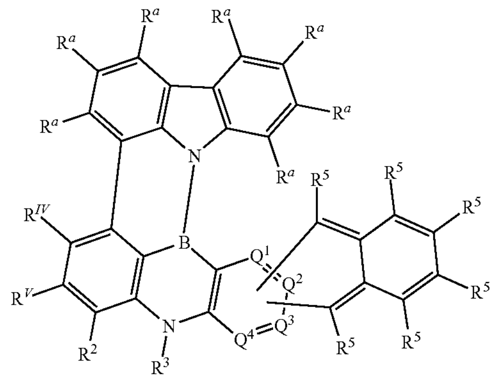

wherein $Q^1$ is selected from the group consisting of C and $CR^{III}$;

$Q^2$ is selected from the group consisting of C and $CR^{II}$;

$Q^3$ is selected from the group consisting of C and $CR^{I}$;

$Q^4$ is selected from the group consisting of C and $CR^1$;

wherein at least one substituent selected from the group consisting of $Q^2$ and $Q^3$ is C; and exactly one substituent selected from the group consisting of $Q^1$ and $Q^4$ is C, if only one substituent selected from the group consisting of $Q^2$ and $Q^3$ is C.

18 Claims, No Drawings

(56) References Cited

U.S. PATENT DOCUMENTS

| | | | |
|---|---|---|---|
| 10,998,506 B2 | 5/2021 | Xia | |
| 12,167,683 B2 | 12/2024 | Hayano | |
| 2003/0157366 A1 | 8/2003 | Matsuura et al. | |
| 2005/0123789 A1 | 6/2005 | Vargas et al. | |
| 2011/0285274 A1 | 11/2011 | Hamada et al. | |
| 2014/0005399 A1 | 1/2014 | Hatakeyama et al. | |
| 2015/0097162 A1 | 4/2015 | Ono et al. | |
| 2017/0222191 A1 | 8/2017 | Hamada et al. | |
| 2018/0047912 A1 | 2/2018 | Kwong et al. | |
| 2018/0114929 A1 | 4/2018 | Kwong et al. | |
| 2019/0067577 A1 | 2/2019 | Xia | |
| 2019/0115537 A1 | 4/2019 | Makishima et al. | |
| 2020/0203652 A1* | 6/2020 | Duan | H10K 85/631 |
| 2020/0259097 A1 | 8/2020 | Zink et al. | |
| 2021/0202861 A1 | 7/2021 | Hayano | |
| 2022/0052265 A1 | 2/2022 | Dück | |
| 2023/0137925 A1 | 5/2023 | Schaefer et al. | |
| 2023/0167135 A1 | 6/2023 | Dück | |
| 2023/0174558 A1 | 6/2023 | Zink et al. | |
| 2023/0189647 A1 | 6/2023 | Duck | |
| 2023/0320214 A1 | 10/2023 | Kim et al. | |
| 2024/0114789 A1 | 4/2024 | Seifermann et al. | |
| 2024/0215448 A1 | 6/2024 | Dück | |
| 2024/0224802 A1 | 7/2024 | Seifermann et al. | |
| 2024/0389458 A1 | 11/2024 | Seifermann | |
| 2025/0059216 A1 | 2/2025 | Zink et al. | |
| 2025/0101048 A1 | 3/2025 | Dück et al. | |
| 2025/0127058 A1 | 4/2025 | Dück | |
| 2025/0197426 A9 | 6/2025 | Seifermann | |
| 2025/0261501 A1 | 8/2025 | Kim et al. | |
| 2025/0268015 A1 | 8/2025 | Kim et al. | |

FOREIGN PATENT DOCUMENTS

| | | | |
|---|---|---|---|
| CN | 109422770 | A | 3/2019 |
| CN | 109923191 | A | 6/2019 |
| CN | 111471061 | A | 7/2020 |
| CN | 111471449 | A | 7/2020 |
| CN | 111560030 | A | 8/2020 |
| CN | 113227106 | A | 8/2021 |
| CN | 115443280 | A | 12/2022 |
| CN | 115461348 | A | 12/2022 |
| CN | 115461350 | A | 12/2022 |
| CN | 115715293 | A | 2/2023 |
| CN | 115968592 | A | 4/2023 |
| CN | 117203213 | A | 12/2023 |
| CN | 117242082 | A | 12/2023 |
| DE | 10 2017 109 593 | A1 | 11/2018 |
| JP | 2014-24845 | A | 2/2014 |
| JP | 2014-58504 | A | 4/2014 |
| JP | 2023-526758 | A | 6/2023 |
| JP | 2023-526759 | A | 6/2023 |
| JP | 2023-526760 | A | 6/2023 |
| JP | 2023-526761 | A | 6/2023 |
| JP | 2023-531421 | A | 7/2023 |
| JP | 2023-537928 | A | 9/2023 |
| JP | 2023-140012 | A | 10/2023 |
| JP | 2024-516964 | A | 4/2024 |
| JP | 2024-517649 | A | 4/2024 |
| JP | 2025-505116 | A | 2/2025 |
| JP | 2025-506369 | A | 3/2025 |
| JP | 7771083 | B9 | 11/2025 |
| KR | 10-2023-0026477 | A | 2/2023 |
| KR | 10-2822247 | B1 | 6/2025 |
| WO | 2012/121398 | A1 | 9/2012 |
| WO | 2014/042197 | A1 | 3/2014 |
| WO | WO 2017/195669 | A1 | 11/2017 |
| WO | WO 2018/202840 | A1 | 11/2018 |
| WO | WO 2020/135953 | A1 | 7/2020 |
| WO | WO 2021/126593 | A1 | 6/2021 |
| WO | WO 2021/214306 | A1 | 10/2021 |
| WO | WO 2021/214308 | A1 | 10/2021 |
| WO | WO 2021/214309 | A1 | 10/2021 |
| WO | WO 2021/214310 | A1 | 10/2021 |
| WO | WO 2021/255698 | A1 | 12/2021 |

OTHER PUBLICATIONS

International Search Report for corresponding Application No. PCT/EP2022/060935 dated Oct. 11, 2020, 3 pp.

International Search Report for corresponding Application No. PCT/EP2022/060907 dated Oct. 11, 2022, 2 pp.

International Search Report for corresponding Application No. PCT/EP2022/060905 dated Oct. 10, 2022, 4 pp.

International Search Report for corresponding Application No. PCT/EP2022/060937 dated Oct. 11, 2022, 3 pp.

International Search Report of PCT/EP2022/060927, Oct. 19, 2022, 3 pp.

International Search Report of PCT/KR2022/015914, Jan. 27, 2023, 4 pp.

Kondakov, Denis Y, "Triplet-triplet annihilation in highly efficient fluorescent organic light-emitting diodes: current state and future outlook," Phil. Trans. R. Soc. A 373: 20140321, The Royal Society Publishing, 2015, 16 pp.

Office Action for corresponding JP Patent Application No. 2021-535790, dated Jun. 2, 2022, 2 pp.

PCT Written Opinion of the International Searching Authority and International Search Report dated Mar. 2, 2020, issued in PCT/EP2019/082382, 7 pp.

U.S. Final Office Action for U.S. Appl. No. 17/296,324, dated Aug. 29, 2024, 17 pp.

U.S. Office Action for U.S. Appl. No. 17/296,324, dated Dec. 16, 2024, 13 pp.

U.S. Office Action for U.S. Appl. No. 17/296,324, dated May 17, 2024, 18 pp.

US Notice of Allowance dated Mar. 25, 2025, issued in U.S. Appl. No. 17/296,324, pages.

International Search Report and Written Opinion of PCT/EP2021/060707, Sep. 3, 2021, 10 pages.

Japanese Office Action corresponding to JP Application No. 2023-564249, dated Jan. 27, 2026 (6 pages).

US Office Action dated Nov. 26, 2025, issued in U.S. Appl. No. 17/997,022 (17 pages).

US Office Action dated Dec. 9, 2025, issued in U.S. Appl. No. 17/997,024 (25 pages).

US Notice of Allowance dated Mar. 3, 2026, issued in U.S. Appl. No. 17/997,023 (9 pages).

US Final Office Action dated Mar. 16, 2026, issued in U.S. Appl. No. 17/997,022 (20 pages).

Chinese Office Action corresponding to CN Application No. 202280030421.1, dated Apr. 4, 2026 (11 pages).

US Notice of Allowance dated May 18, 2026, issued in U.S. Appl. No. 17/997,024 (12 pages).

* cited by examiner

ORGANIC MOLECULES FOR OPTOELECTRONIC DEVICES

CROSS-REFERENCE TO RELATED APPLICATIONS

This application is a U.S. National Phase Patent Application of International Patent Application Number PCT/EP2021/060707, filed on Apr. 23, 2021, which claims priority to European Patent Application Number 20171128.0, filed on Apr. 23, 2020, and European Patent Application Number 20217125.2, filed on Dec. 23, 2020, the entire contents of all of which are incorporated herein by reference.

The invention relates to light-emitting organic molecules and their use in organic light-emitting diodes (OLEDs) and in other optoelectronic devices.

DESCRIPTION

The object of the present invention is to provide molecules which are suitable for use in optoelectronic devices.

This object is achieved by the invention which provides a new class of organic molecules.

According to the invention the organic molecules are purely organic molecules, i.e. they do not contain any metal ions in contrast to metal complexes known for use in optoelectronic devices.

According to the present invention, the organic molecules exhibit emission maxima in the blue, sky-blue or green spectral range. The organic molecules exhibit in particular emission maxima between 420 nm and 520 nm, preferably between 440 nm and 495 nm, more preferably between 450 nm and 470 nm or the organic molecules exhibit in particular emission maxima below 560 nm, more preferably below 550 nm, even more preferably below 545 nm or even below 540 nm. It will typically be above 500 nm, more preferably above 510 nm, even more preferably above 515 nm or even above 520 nm. The photoluminescence quantum yields of the organic molecules according to the invention are, in particular, 50% or more. The use of the molecules according to the invention in an optoelectronic device, for example an organic light-emitting diode (OLED), leads to higher efficiencies or higher color purity, expressed by the full width at half maximum (FWHM) of the emission spectrum, of the device.

Corresponding OLEDs have a higher stability than OLEDs with known emitter materials and comparable color.

The organic molecule of the invention includes or consists of a structure of Formula I:

Formula I

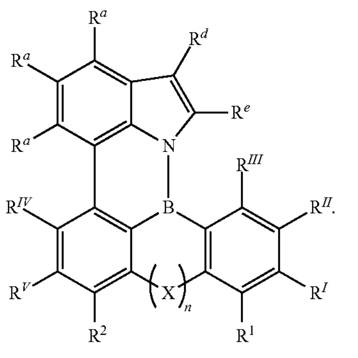

wherein n=0 or 1;

X is at each occurrence independently from each other selected from the group consisting of a direct bond, $CR^3R^4$, $C{=}CR^3R^4$, C=O, $C{=}NR^3$, $NR^3$, O, $SiR^3R^4$, S, S(O) and $S(O)_2$;

$R^1$, $R^2$, $R^3$, $R^4$, $R^I$, $R^{II}$, $R^{III}$, $R^{IV}$ and $R^V$ are each independently selected from the group consisting of:

hydrogen, deuterium, $N(R^5)_2$, $OR^5$, $Si(R^5)_3$, $B(OR^5)_2$, $B(R^5)_2$, $OSO_2R^5$, $CF_3$, CN, F, Br, I;

$C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^5$; and $C_2$-$C_{57}$-heteroaryl, which is optionally substituted with one or more substituents $R^5$;

$R^d$ and $R^e$ are each independently from each other selected from the group consisting of: hydrogen, deuterium, $CF_3$, CN, F, Br, I;

$C_1$-$C_{40}$-alkyl, which is optionally substituted with one or more substituents $R^a$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^a$; and $C_2$-$C_{57}$-heteroaryl, which is optionally substituted with one or more substituents $R^a$;

$R^a$ is at each occurrence independently selected from the group consisting of: hydrogen, deuterium, $N(R^5)_2$, $OR^5$, $Si(R^5)_8$, $B(OR^5)_2$, $B(R^5)_2$, $OSO_2R^5$, $CF_3$, CN, F, Br, I;

$C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;

$C_6$-$C_{60}$-aryl, which is optionally substituted with one or more substituents $R^5$; and $C_2$-$C_{57}$-heteroaryl, which is optionally substituted with one or more substituents $R^5$;

$R^5$ is at each occurrence independently from one another selected from the group consisting of: hydrogen, deuterium, $N(R^6)_2$, $OR^6$, $Si(R^6)_3$, $B(OR^6)_2$, $B(R^6)_2$, $OSO_2R^6$, $CF_3$, CN, F, Br, I, $C_1$-$C_{40}$-alkyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, C=$NR^6$, P(=O)($R^6$), SO, $SO_2$, $NR^6$, O, S or $CONR^6$;

$C_1$-$C_{40}$-alkoxy, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, C=$NR^6$, P(=O)($R^6$), SO, $SO_2$, $NR^6$, O, S or $CONR^6$;

$C_1$-$C_{40}$-thioalkoxy, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, C=$NR^6$, P(=O)($R^6$), SO, $SO_2$, $NR^6$, O, S or $CONR^6$;

$C_2$-$C_{40}$-alkenyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, C=$NR^6$, P(=O)($R^6$), SO, $SO_2$, $NR^6$, O, S or $CONR^6$;

$C_2$-$C_{40}$-alkynyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, C=$NR^6$, P(=O)($R^6$), SO, $SO_2$, $NR^6$, O, S or $CONR^6$;

$C_6$-$C_{60}$-aryl, which is optionally substituted with one or more substituents $R^6$; and $C_2$-$C_{57}$-heteroaryl, which is optionally substituted with one or more substituents $R^6$;

$R^a$ is at each occurrence independently from one another selected from the group consisting of: hydrogen, deuterium, OPh, $CF_3$, CN, F;

$C_1$-$C_5$-alkyl, wherein one or more hydrogen atoms are optionally, independently from each other substituted by deuterium, CN, $CF_3$, or F;

$C_1$-$C_5$-alkoxy, wherein one or more hydrogen atoms are optionally, independently from each other substituted by deuterium, CN, $CF_3$, or F;

$C_1$-$C_5$-thioalkoxy, wherein one or more hydrogen atoms are optionally, independently from each other substituted by deuterium, CN, $CF_3$, or F;

$C_2$-$C_5$-alkenyl, wherein one or more hydrogen atoms are optionally, independently from each other substituted by deuterium, CN, $CF_3$, or F;

$C_2$-$C_5$-alkynyl, wherein one or more hydrogen atoms are optionally, independently from each other substituted by deuterium, CN, $CF_3$, or F;

$C_6$-$C_{18}$-aryl, which is optionally substituted with one or more $C_1$-$C_5$-alkyl substituents;

$C_2$-$C_{17}$-heteroaryl, which is optionally substituted with one or more $C_1$-$C_5$-alkyl substituents;

N($C_6$-$C_{18}$-aryl$)_2$;

N($C_2$-$C_{17}$-heteroaryl$)_2$; and

N($C_2$-$C_{17}$-heteroaryl)($C_6$-$C_{18}$-aryl);

wherein the substituents $R^a$, $R^d$, $R^e$, and $R^5$, independently from each other, optionally form a mono- or polycyclic, aliphatic, aromatic, heteroaromatic and/or benzo-fused ring system with one or more adjacent substituents selected from among $R^a$, $R^d$, $R^e$, and $R^5$;

wherein the substituents $R^1$, $R^2$, $R^3$, $R^4$, $R^5$, $R^I$, $R^{II}$, $R^{III}$, $R^{IV}$, and $R^V$ independently from each other, optionally form a mono- or polycyclic, aliphatic, aromatic, heteroaromatic and/or benzo-fused ring system with one or more adjacent substituents selected from among $R^1$, $R^2$, $R^3$, $R^4$, $R^5$, $R^I$, $R^{II}$, $R^{III}$, $R^{IV}$, and $R^V$.

Examples for the substituents $R^a$, $R^d$, $R^e$, $R^1$, $R^2$, $R^3$, $R^4$, $R^5$, $R^I$, $R^{II}$, $R^{III}$, $R^{IV}$, and $R^V$ include $C_6$-$C_{60}$-aryl, preferably $C_6$-$C_{30}$-aryl, more preferably $C_6$-$C_{18}$-aryl, and even more preferably $C_6$-$C_{10}$-aryl.

Examples of specific aryl substituents include monocyclic benzene, bicyclic biphenyl, condensed bicyclic naphthalene, tricyclic terphenyl (m-terphenyl, o-terphenyl, p-terphenyl), condensed tricyclic systems such as acenaphthylene, fluorene, phenalene, and phenanthrene, condensed tetracyclic systems such as triphenylene, pyrene, and naphthacene, and condensed pentacyclic system, examples thereof include a perylene and a pentacene.

Examples for the substituents $R^a$, $R^d$, $R^e$, $R^1$, $R^2$, $R^3$, $R^4$, $R^5$, $R^I$, $R^{II}$, $R^{III}$, $R^{IV}$, and $R^V$ include $C_2$-$C_{57}$-heteroaryl, preferably $C_2$-$C_{30}$-heteroaryl, more preferably $C_2$-$C_{17}$-heteroaryl, and even more preferably $C_2$-$C_{10}$-heteroaryl.

Examples of specific heteroaryl substituents include pyrrole, oxazole, isoxazole, thiazole, isothiazole, imidazole, oxadiazole, thiadiazole, triazole, tetrazole, pyrazole, pyridine, pyrimidine, pyridazine, pyrazine, triazine, indole, isoindole, 1H-indazole, benzimidazole, benzoxazole, benzothiazole, 1H-benzotriazole, quinoline, isoquinoline, cinnoline, quinazoline, quinoxaline, phthalazine, naphthyridine, purine, pteridine, carbazole, acridine, phenoxathiin, phenoxazine ring, phenothiazine, phenazine, furan, benzofuran, isobenzofuran, dibenzofuran, thiophene, benzothiophene, dibenzothiophene, furazan, oxadiazole, and thianthrene.

Examples for the substituents $R^a$, $R^d$, $R^e$, $R^1$, $R^2$, $R^3$, $R^4$, $R^5$, $R^I$, $R^{II}$, $R^{III}$, $R^{IV}$, and $R^V$ include $C_1$-$C_{40}$-alkyl, preferably $C_1$-$C_{24}$-alkyl or branched or cyclic $C_3$-$C_{40}$-alkyl, more preferably $C_1$-$C_{18}$-alkyl or branched or cyclic $C_3$-$C_{18}$-alkyl, even more preferably $C_1$-$C_{12}$-alkyl or branched or cyclic $C_3$-$C_{12}$-alkyl, even more preferably $C_1$-$C_6$-alkyl or branched or cyclic $C_3$-$C_6$-alkyl, and particularly preferably $C_1$-$C_4$-alkyl or branched $C_3$-$C_4$-alkyl.

Examples of specific alkyl substituents include methyl, ethyl, n-propyl, isopropyl, n-butyl, isobutyl, s-butyl, t-butyl, n-pentyl, isopentyl, neopentyl, t-pentyl, n-hexyl, and 1-methyl, pentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propyl Pentyl, n-nonyl, cyclo-hexyl 2,2-dimethylheptyl, 2,6-dimethyl-4-heptyl, 3,5, 5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, n-eicosyl, and the like.

Examples for the substituents $R^a$, $R^d$, $R^e$, $R^1$, $R^2$, $R^3$, $R^4$, $R^5$, $R^I$, $R^{II}$, $R^{III}$, $R^{IV}$, and $R^V$ include $C_1$-$C_{40}$-alkoxy, preferably $C_1$-$C_{24}$-alkoxy or branched or cyclic $C_3$-$C_{40}$-alkoxy, more preferably $C_1$-$C_{18}$-alkoxy or branched or cyclic $C_3$-$C_{18}$-alkoxy, even more preferably $C_1$-$C_{12}$-alkoxy or branched or cyclic $C_3$-$C_{12}$-alkoxy, even more preferably $C_1$-$C_6$-alkoxy or branched or cyclic $C_3$-$C_6$-alkoxy, and particularly preferably $C_1$-$C_4$-alkoxy or branched $C_3$-$C_4$-alkoxy.

Examples of specific alkoxy substituents include methoxy, ethoxy, propoxy, isopropoxy, butoxy, isobutoxy, s-butoxy, t-butoxy, pentyloxy, hexyloxy, heptyloxy, octyloxy and the like.

Examples for the substituents $R^a$, $R^d$, $R^e$, $R^1$, $R^2$, $R^3$, $R^4$, $R^5$, $R^I$, $R^{II}$, $R^{III}$, $R^{IV}$, and $R^V$ include $C_1$-$C_4$-thioalkyl, preferably $C_1$-$C_{24}$-thioalkyl or branched or cyclic $C_3$-$C_{40}$-thioalkyl, more preferably $C_1$-$C_{18}$-thioalkyl or branched or cyclic $C_3$-$C_1$-thioalkyl, even more preferably $C_1$-$C_{12}$-thioalkyl or branched or cyclic $C_3$-$C_{12}$-thioalkyl, even more preferably $C_2$-$C_6$-thioalkyl or branched or cyclic $C_3$-$C_6$-thioalkyl, and particularly preferably $C_1$-$C_4$-thioalkyl or branched $C_3$-$C_4$-thioalkyl.

Examples for the substituents $R^a$, $R^d$, $R^e$, $R^1$, $R^2$, $R^3$, $R^4$, $R^5$, $R^I$, $R^{II}$, $R^{III}$, $R^{IV}$, and $R^V$ include $C_2$-$C_{40}$-alkenyl, preferably $C_2$-$C_{24}$-alkenyl or branched or cyclic $C_3$-$C_{40}$-alkenyl, more preferably $C_2$-Cia-alkenyl or branched or cyclic $C_3$-$C_{12}$-alkenyl, even more preferably $C_2$-$C_{12}$-alkenyl or branched or cyclic $C_3$-$C_{12}$-alkenyl, even more preferably $C_2$-$C_6$-alkenyl or branched or cyclic $C_3$-$C_6$-alkenyl, and particularly preferably $C_1$-$C_4$-alkenyl or branched $C_3$-$C_4$-alkenyl.

Examples for the substituents $R^a$, $R^d$, $R^e$, $R^1$, $R^2$, $R^3$, $R^4$, $R^5$, $R^I$, $R^{II}$, $R^{III}$, $R^{IV}$, and $R^V$ include $C_1$-$C_{40}$-alkynyl, preferably $C_2$-$C_{24}$-alkynyl or branched or cyclic $C_3$-$C_{40}$-alkynyl, more preferably $C_2$-$C_{18}$-alkynyl or branched or cyclic $C_3$-$C_{18}$-alkynyl, even more preferably $C_2$-$C_{12}$-alkynyl or branched or cyclic $C_3$-$C_{12}$-alkynyl, even more preferably $C_2$-$C_6$-alkynyl or branched or cyclic $C_3$-$C_6$-alkynyl, and particularly preferably $C_1$-$C_4$-alkynyl or branched $C_3$-$C_4$-alkynyl.

In a preferred embodiment, $R^1$, $R^2$, $R^3$, $R^4$, $R^I$, $R^{II}$, $R^{III}$, $R^{IV}$, and $R^V$ are independently from one another selected from the group consisting of:

hydrogen;
deuterium;
$N(R^5)_2$;
$OR^5$;
$SR^5$;
$Si(R^5)_3$;
$B(OR^5)_2$;
$B(R^5)_2$;
$OSO_2R^5$;
$CF_3$;
CN;
halogen;
$C_1$-$C_{18}$-alkyl,
which is optionally substituted with one or more substituents $R^5$ and
wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;
$C_1$-$C_{18}$-alkoxy,
which is optionally substituted with one or more substituents $R^5$ and
wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;
$C_1$-$C_{18}$-thioalkoxy,
which is optionally substituted with one or more substituents $R^5$ and
wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;
$C_2$-$C_{18}$-alkenyl,
which is optionally substituted with one or more substituents $R^5$ and
wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;
$C_2$-$C_{18}$-alkynyl,
which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$.

$R^5$ is at each occurrence independently from one another selected from the group consisting of: hydrogen, deuterium, $N(R^6)_2$, $OR^6$, $Si(R^6)_3$, $B(OR^6)_2$, $B(R^6)_2$, $OSO_2R^6$, $CF_3$, CN, F, Br, I, $C_1$-$C_{18}$-alkyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_1$-$C_{18}$-alkoxy, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_1$-$C_{18}$-thioalkoxy, which is optionally substituted with one or more substituents $R^6$ and wherein one or more non-adjacent $CH_2$-groups are optionally substituted by $R^6C{=}CR^B$, $C{\equiv}C$, $Si(R^6)_2$, $Ge(R^B)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_2$-$C_{18}$-alkenyl, which is optionally substituted with one or more substituents $R^6$ and wherein one or more non-adjacent $CH_2$-groups are optionally substituted by $R^BC{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^B$, $P({=}O)(R^6)$, SO, $SO_2$, $NR^6$, O, S or $CONR^6$;

$C_2$-$C_{18}$-alkynyl, which is optionally substituted with one or more substituents $R^6$ and wherein one or more non-adjacent $CH_2$-groups are optionally substituted by $R^6C{=}CR^B$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$.

In a preferred embodiment n=1.

In another embodiment n=0.

In a preferred embodiment, $R^1$, $R^2$, $R^3$, $R^4$, $R^5$, $R^I$, $R^{II}$, $R^{III}$, $R^{IV}$, and $R^V$ are independently from one another selected from the group consisting of:

hydrogen;

deuterium;

$N(R^5)_2$;

$OR^5$;

$Si(R^5)_3$;

$B(R^5)_2$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$; and $R^5$ is at each occurrence independently from one another selected from the group consisting of: hydrogen, deuterium, $N(R^6)_2$, $OR^6$, $Si(R^6)_3$, $B(R^6)_2$, $CF_3$, CN, F, Br, I, $C_1$-$C_{18}$-alkyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$.

In a preferred embodiment, $R^1$, $R^2$, $R^3$, $R^4$, $R^I$, $R^{II}$, $R^{III}$, $R^{IV}$, and $R^V$ are independently from one another selected from the group consisting of:

hydrogen;

deuterium;

$N(R^5)_2$;

$OR^5$;

$Si(R^5)_3$;

$B(R^5)_2$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$; and $R^5$ is at each occurrence independently from one another selected from the group consisting of: hydrogen, deuterium, $N(R^6)_2$, $OR^6$, $Si(R^6)_3$, $B(R^6)_2$, $CF_3$, CN, F, Br, I, $C_1$-$C_{18}$-alkyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, C=O, C=S, C=Se, $C=NR^6$, $P(=O)(R^6)$, SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$ wherein groups $R^1$, $R^2$, $R^3$, $R^I$, $R^{II}$, $R^{III}$, $R^{IV}$, $R^5$, and $R^V$ are optionally bonded to each other and form an aryl or heteroaryl ring, which is optionally substituted with one or more $C_1$-$C_5$-alkyl substituents, deuterium, halogen, CN or $CF_3$.

In a preferred embodiment, $R^1$, $R^2$, $R^3$, $R^4$, $R^I$, $R^{II}$, $R^{III}$, $R^{IV}$, and $R^V$ are independently from one another selected from the group consisting of:

hydrogen;

deuterium;

$N(R^5)_2$;

$OR^5$;

$Si(R^5)_3$;

$B(R^5)_2$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$; and $R^5$ is at each occurrence independently from one another selected from the group consisting of: hydrogen, deuterium, $N(R^6)_2$, $OR^6$, $Si(R^6)_3$, $B(R^6)_2$, $CF_3$, CN, F, Br, I, $C_1$-$C_{18}$-alkyl, which is optionally substituted with one or more substituents $R^6$ and wherein one or more non-adjacent $CH_2$-groups are optionally substituted by $R^6C=CR^6$, C≡C, $Si(R^6)_2$, $Ge(R^6)_2$, $Sn(R^6)_2$, C=O, C=S, C=Se, $C=NR^6$, $P(=O)(R^6)$, SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$ wherein groups $R^1$, $R^2$, $R^I$, $R^{II}$, $R^{III}$, $R^{IV}$, $R^5$, and $R^V$ positioned adjacent to each other are optionally bonded to each other and form an aryl or heteroaryl ring, which is optionally substituted with one or more $C_1$-$C_5$-alkyl substituents, deuterium, halogen, CN or $CF_3$.

In a preferred embodiment, $R^1$, $R^2$, $R^3$, $R^4$, $R^I$, $R^{II}$, $R^{III}$, $R^{IV}$, and $R^V$ are independently from one another selected from the group consisting of:

hydrogen;

deuterium;

$N(R^5)_2$;

$OR^5$;

$Si(R^5)_3$;

$B(R^5)_2$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$; and $R^5$ is at each occurrence independently from one another selected from the group consisting of: hydrogen, deuterium, $N(R^6)_2$, $OR^6$, $Si(R^6)_3$, $B(R^6)_2$, $CF_3$, CN, F, Br, I;

$C_1$-$C_{18}$-alkyl, which is optionally substituted with one or more substituents $R^6$ and wherein one or more non-adjacent $CH_2$-groups are optionally substituted by $R^6C=CR^6$, C≡C, $Si(R^6)_2$, $Ge(R^6)_2$, $Sn(R^6)_2$, C=O, C=S, C=Se, $C=NR^6$, $P(=O)(R^6)$, SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$.

In one embodiment, $R^1$, $R^2$, $R^3$, $R^4$, $R^I$, $R^{II}$, $R^{III}$, $R^{IV}$, and $R^V$ are independently from one another selected from the group consisting of:

hydrogen;

deuterium;

$C_1$-$C_{18}$-alkyl, which is optionally substituted with one or more substituents $R^5$ and wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$.

In one embodiment, $R^1$, $R^2$, $R^I$, $R^{II}$, $R^{III}$, $R^{IV}$, and $R^V$ are independently from one another selected from the group consisting of:

hydrogen;

deuterium;

$C_1$-$C_{18}$-alkyl, which is optionally substituted with one or more substituents $R^5$ and wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$;

wherein any of the substituents $R^1$, $R^2$, $R^I$, $R^{II}$, $R^{III}$, $R^{IV}$, and $R^V$ positioned adjacent to each other are optionally bonded to each other and form an aryl or heteroaryl ring, which is optionally substituted with one or more $C_1$-$C_5$-alkyl substituents, deuterium, halogen, CN or $CF_3$.

In one embodiment, $R^3$, and $R^4$ are independently from one another selected from the group consisting of:

$C_1$-$C_{18}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$.

In one embodiment, $R^1$, $R^2$, $R^3$, $R^4$, $R^I$, $R^{II}$, $R^{III}$, $R^{IV}$, and $R^V$ are independently from one another selected from the group consisting of:

$C_1$-$C_{18}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$.

In another embodiment, $R^1$, $R^2$, $R^3$, $R^4$, $R^I$, $R^{II}$, $R^{III}$, $R^{IV}$, and $R^V$ are independently from one another selected from the group consisting of:

$C_6$-$C_{18}$-aryl, which is optionally substituted with one or more substituents $R^5$; and $C_2$-$C_{17}$-heteroaryl, which is optionally substituted with one or more substituents $R^5$.

In another embodiment, $R^1$, $R^2$, $R^3$, $R^4$, $R^I$, $R^{II}$, $R^{III}$, $R^{IV}$, and $R^V$ are independently from one another selected from the group consisting of:

$C_6$-$C_{18}$-aryl, which is optionally substituted with one or more substituents $R^5$.

In a preferred embodiment, $R^3$ is independently from one another selected from the group consisting of:

$C_1$-$C_{40}$-alkyl, which is optionally substituted with one or more substituents $R^5$;

$C_6$-$C_{18}$-aryl, which is optionally substituted with one or more substituents $R^5$; and $C_2$-$C_{17}$-heteroaryl, which is optionally substituted with one or more substituents $R^5$.

In a preferred embodiment, $R^3$ is independently from one another selected from the group consisting of:

$C_6$-$C_{18}$-aryl, which is optionally substituted with one or more substituents $R^5$; and $C_2$-$C_{17}$-heteroaryl, which is optionally substituted with one or more substituents $R^5$.

In a more preferred embodiment, $R^3$ is independently from one another selected from the group consisting of:

$C_6$-$C_{18}$-aryl, which is optionally substituted with one or more substituents $R^5$.

In a more preferred embodiment, $R^3$ is a $C_6$-$C_{18}$-aryl, which is optionally substituted with one or more substituents $R^6$.

In a more preferred embodiment, $R^3$ is a phenyl (Ph), which is optionally substituted with one or more substituents $R^5$.

In a certain embodiment, $R^3$ is a phenyl (Ph), which is optionally substituted with one or more substituents $R^6$.

In a certain embodiment, $R^3$ is a phenyl (Ph), which is optionally substituted with one or more $C_1$-$C_5$-alkyl substituents.

In a certain embodiment, $R^3$ is a phenyl (Ph), which is independently from each other optionally substituted with one or more $C_1$-$C_5$-alkyl, wherein one or more hydrogen atoms are optionally, independently from each other substituted by deuterium, CN, $CF_3$, or F;

$C_6$-$C_{18}$-aryl, which is optionally substituted with one or more $C_1$-$C_5$-alkyl substituents; and $C_2$-$C_{17}$-heteroaryl, which is optionally substituted with one or more $C_1$-$C_5$-alkyl substituents.

In certain embodiments, $R^3$ is Ph.

In one embodiment, $R^1$, $R^2$, $R^3$, $R^4$, $R^I$, $R^{II}$, $R^{III}$, $R^{IV}$, and $R^V$ are independently from one another selected from the group consisting of:

$C_1$-$C_{18}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$.

In one embodiment, at least one substituent selected from the group consisting of $R^1$, $R^2$, $R^I$, $R^{II}$, $R^{III}$, $R^{IV}$, $R^V$ and $R^a$ is $C_1$-$C_{18}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$.

In one embodiment, at least one substituent selected from the group consisting of $R^1$, $R^2$, $R^I$, $R^{II}$, $R^{III}$, $R^{IV}$, $R^V$ and $R^a$ is independently Me, $^i$Pr, or $^t$Bu.

In one embodiment, $R^a$ is at each occurrence independently from one another selected from the group consisting of:

hydrogen;
deuterium;
$C_1$-$C_{18}$-alkyl,
which is optionally substituted with one or more substituents $R^5$;
$C_6$-$C_{18}$-aryl,
which is optionally substituted with one or more substituents $R^5$; and
$C_2$-$C_{17}$-heteroaryl,
which is optionally substituted with one or more substituents $R^5$.

In one embodiment, $R^a$ is at each occurrence independently from one another selected from the group consisting of:

hydrogen;
deuterium;
$C_1$-$C_{18}$-alkyl,
which is optionally substituted with one or more substituents $R^5$; and
$C_6$-$C_{18}$-aryl,
which is optionally substituted with one or more substituents $R^5$.

In one embodiment, $R^a$ is at each occurrence independently from one another selected from the group consisting of:

hydrogen;
deuterium; and
$C_1$-$C_{18}$-alkyl,
which is optionally substituted with one or more substituents $R^5$.

In one embodiment, at least one $R^a$ is
Me,
$^i$Pr, or
$^t$Bu.

In a preferred embodiment, at least one substituent selected from the group consisting of $R^1$, $R^2$, $R^I$, $R^{II}$, $R^{III}$, $R^{IV}$, and $R^V$ forms a mono- or polycyclic, aliphatic, aromatic, heteroaromatic and/or benzo-fused ring system with one or more adjacent substituents selected from among $R^1$, $R^2$, $R^3$, $R^4$, $R^5$, $R^I$, $R^{II}$, $R^{III}$, $R^{IV}$, and $R^V$.

In a more preferred embodiment, at least one substituent selected from the group consisting of $R^1$, $R^2$, $R^I$, $R^{II}$, $R^{III}$, $R^{IV}$, and $R^V$ forms an aromatic, and/or heteroaromatic benzo-fused ring system with one or more adjacent substituents selected from among $R^1$, $R^2$, $R^3$, $R^4$, $R^5$, $R^I$, $R^{II}$, $R^{III}$, $R^{IV}$, and $R^V$.

In certain embodiments, at least one substituent selected from the group consisting of $R^1$, $R^2$, $R^I$, $R^{II}$, $R^{III}$, $R^{IV}$, and $R^V$ forms an aromatic, and/or heteroaromatic benzo-fused ring system with one or more adjacent substituents selected from among $R^1$, $R^2$, $R^I$, $R^{II}$, $R^{III}$, $R^{IV}$, and $R^V$, wherein preferably $R^1$ is positioned adjacent to $R^I$; $R^I$ is positioned adjacent to $R^{II}$ and $R^1$, $R^{II}$ is positioned adjacent to $R^{III}$ and $R^I$; $R^{III}$ is positioned adjacent to $R^{II}$, $R^2$ is positioned adjacent to $R^V$, $R^V$ is positioned adjacent to $R^2$ and $R^{IV}$ and $R^{IV}$ is positioned adjacent to $R^V$.

In certain embodiments, at least one substituent selected from the group consisting of $R^1$, $R^2$, $R^I$, $R^{II}$, $R^{III}$, $R^{IV}$, and $R^V$ forms a mono- or polycyclic, aliphatic, aromatic, heteroaromatic and/or benzo-fused ring system with one or more adjacent substituents selected from among $R^1$, $R^2$, $R^I$, $R^{II}$, $R^{III}$, $R^{IV}$, and $R^V$, wherein preferably $R^1$ is positioned adjacent to $R^I$; $R^I$ is positioned adjacent to $R^{II}$ and $R^1$, $R^{II}$ is positioned adjacent to $R^{III}$ and $R^I$; $R^{III}$ is positioned adjacent to $R^{II}$, $R^2$ is positioned adjacent to $R^V$, $R^V$ is positioned adjacent to $R^2$ and $R^{IV}$, and $R^{IV}$ is positioned adjacent to $R^V$.

In a preferred embodiment, at least one substituent selected from the group consisting of $R^1$, $R^2$, $R^I$, $R^{II}$, $R^{III}$, $R^{IV}$, and $R^V$ forms a mono- or polycyclic, aliphatic, aromatic, heteroaromatic and/or benzo-fused ring system with one or more adjacent substituents selected from among $R^1$, $R^2$, $R^3$, $R^4$, $R^5$, $R^I$, $R^{II}$, $R^{III}$, $R^{IV}$, and $R^V$, wherein the ring system is selected from the following groups:

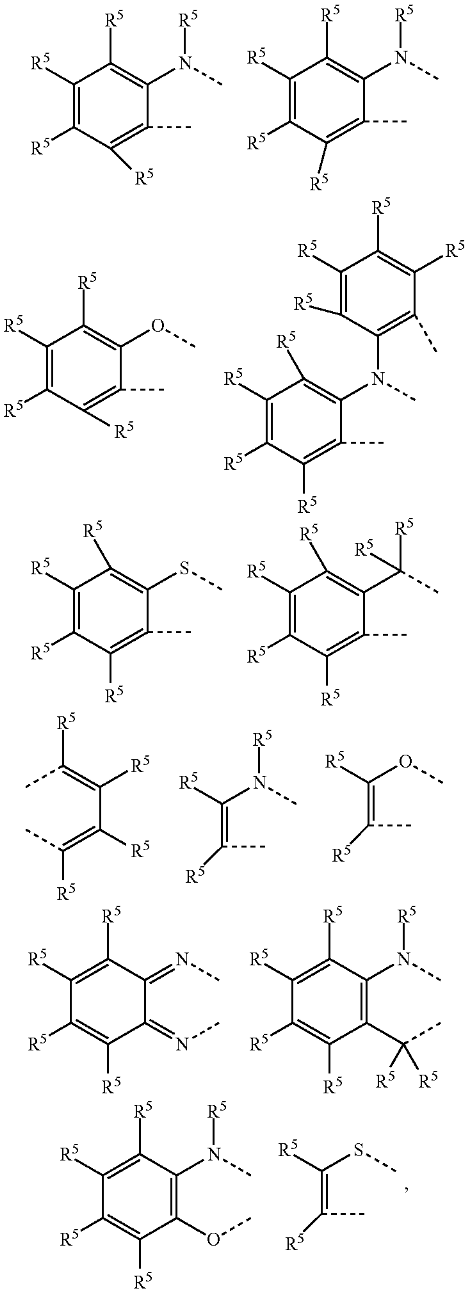

wherein each dotted line is an attachment point.

In a preferred embodiment, at least one substituent selected from the group consisting of $R^1$, $R^2$, $R^I$, $R^{II}$, $R^{III}$, $R^{IV}$, and $R^V$ forms a mono- or polycyclic, aliphatic, aromatic, heteroaromatic and/or benzo-fused ring system with one or more substituents selected from among $R^1$, $R^2$, $R^3$, $R^4$, $R^5$, $R^I$, $R^{II}$, $R^{III}$, $R^{IV}$, and $R^V$, wherein the ring system is selected from the following groups:

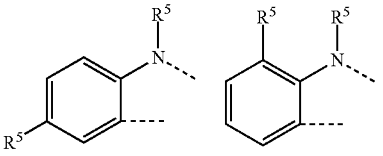

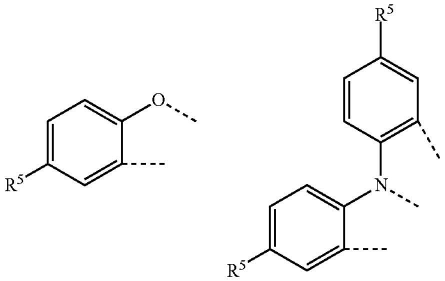

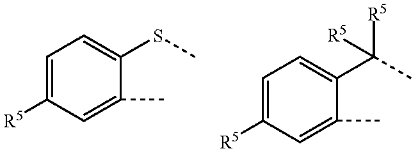

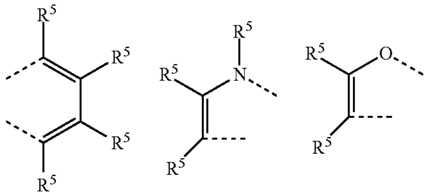

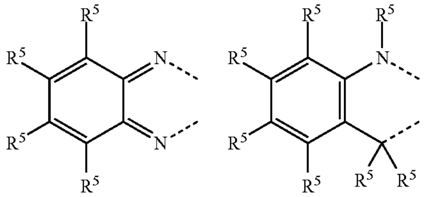

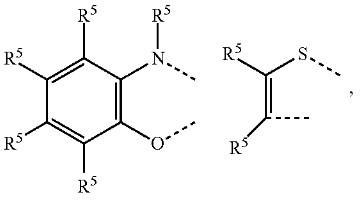

wherein each dotted line indicates an attachment point.

In preferred embodiments, the attachment points are positioned adjacent to each other. This means that $R^1$ preferably forms a ring system with $R^I$; $R^I$ preferably forms a ring system with $R^{II}$ and/or $R^1$, $R^{II}$ preferably forms a ring system with $R^{III}$ and/or $R^I$; $R^{III}$ preferably forms a ring system with $R^{II}$, $R^2$ preferably forms a ring system with $R^V$, $R^V$ preferably forms a ring system with $R^2$ and/or $R^{IV}$, and $R^{IV}$ preferably forms a ring system with $R^V$.

Specific examples are listed below:

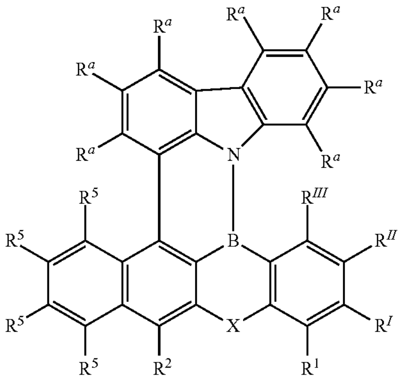

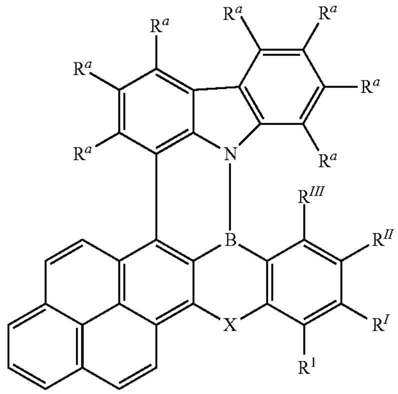

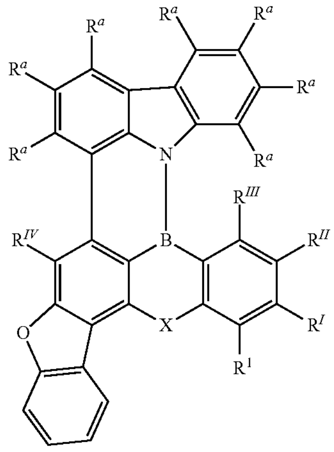

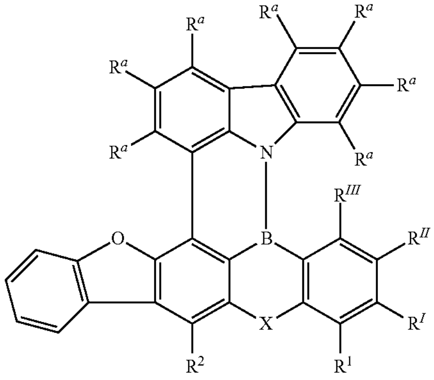

-continued

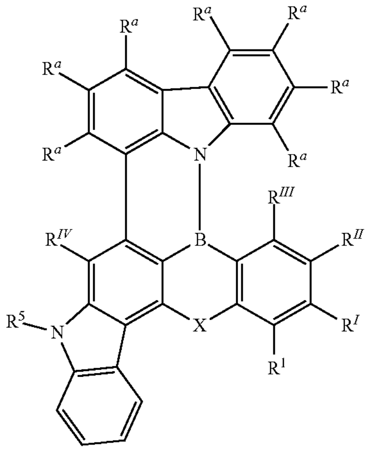

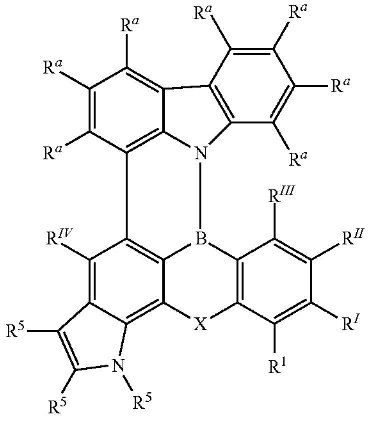

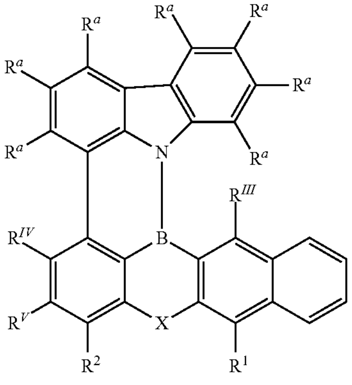

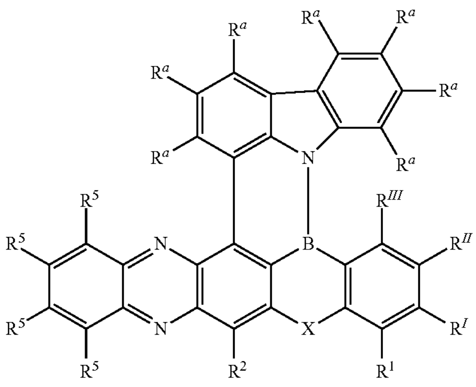

-continued

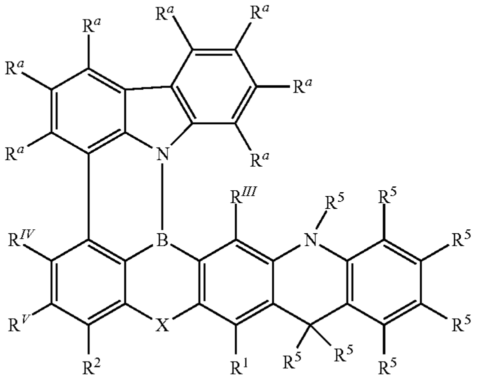

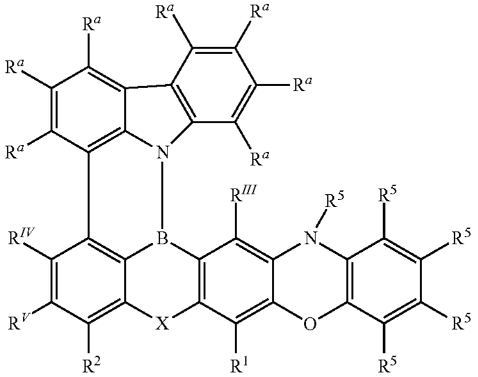

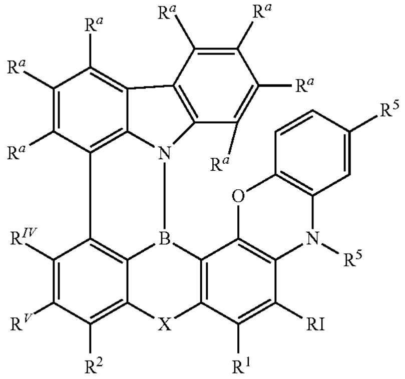

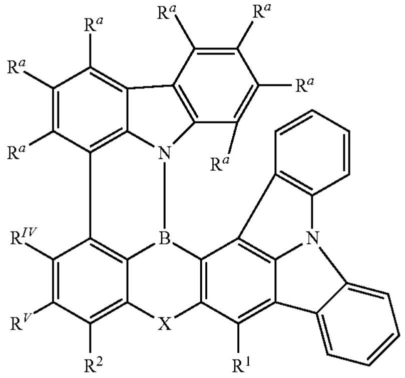

In one embodiment, at least one substituent selected from the group consisting of $R^1$, $R^2$, $R^I$, $R^{II}$, $R^{III}$, $R^{IV}$, and $R^V$ forms a mono- or polycyclic, aliphatic, aromatic, heteroaromatic and/or benzo-fused ring system with one or more adjacent substituents selected from among $R^1$, $R^2$, $R^I$, $R^{II}$, $R^{III}$, $R^{IV}$, and $R^V$, wherein the ring system is selected from the following group:

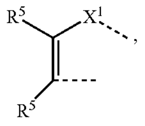

wherein $X^1$ is S, O or $NR^5$.

In a preferred embodiment of the organic molecule, the attachment points are positioned adjacent to each other (with no atom in between).

In another embodiment, at least one substituent selected from the group consisting of $R^1$, $R^I$, $R^{II}$, and $R^{III}$ forms a mono- or polycyclic, aliphatic, aromatic, heteroaromatic and/or benzo-fused ring system with one or more other substituents $R^1$, $R^I$, $R^{II}$, and/or $R^{III}$, wherein the ring system is selected from the following groups:

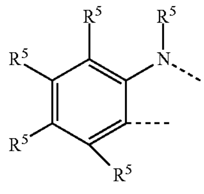
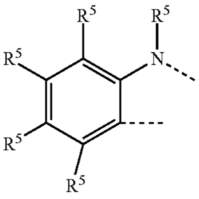

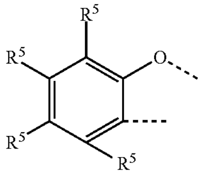
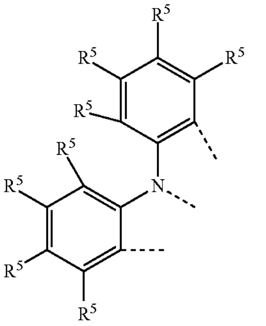

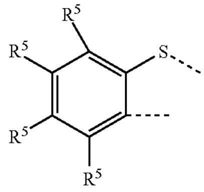
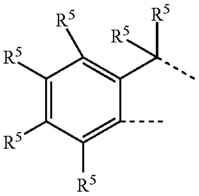

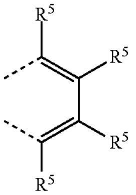
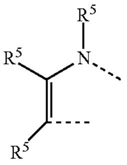
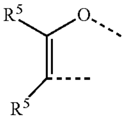

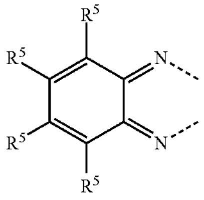
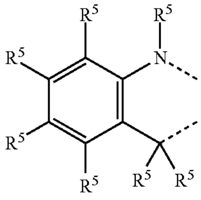

-continued

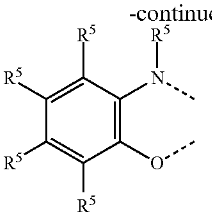
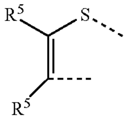
, wherein each dotted line is an attachment point.

In another embodiment, at least one substituent selected from the group consisting of $R^I$, $R^{II}$, and $R^{III}$ forms a mono- or polycyclic, aliphatic, aromatic, heteroaromatic and/or benzo-fused ring system with one or more other substituents $R^1$, $R^I$, $R^{II}$, and/or $R^{III}$, wherein the ring system is selected from the following groups:

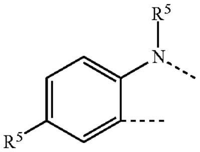
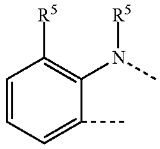

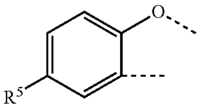
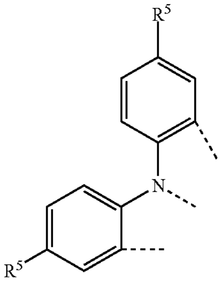

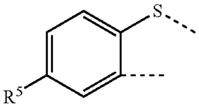
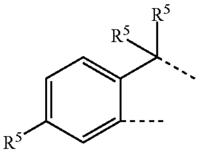

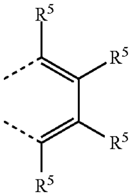
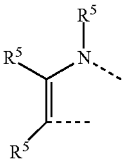
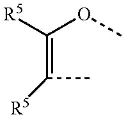

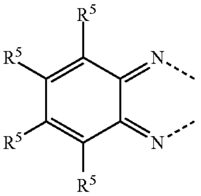
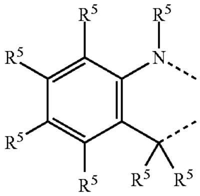

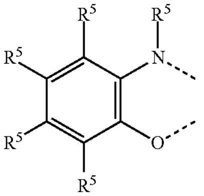
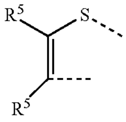
, wherein each dotted line is an attachment point.

In a preferred embodiment, the attachment points are positioned adjacent to each other. This means that $R^1$ preferably forms a ring system with $R^I$; $R^I$ preferably forms a ring system with $R^{II}$ and/or $R^1$; $R^{II}$ preferably forms a ring system with $R^{III}$ and/or $R^I$; and $R^{III}$ preferably forms a ring system with $R^{II}$.

In one embodiment, at least one substituent selected from the group consisting of $R^1$, $R^2$, $R^I$, $R^{II}$, $R^{III}$, $R^{IV}$, and $R^V$ forms a mono- or polycyclic, aliphatic, aromatic, heteroaromatic and/or benzo-fused ring system with one or more adjacent substituents selected from among $R^1$, $R^2$, $R^I$, $R^{II}$, $R^{III}$, $R^{IV}$, and $R^V$, wherein the ring system is selected from the following group:

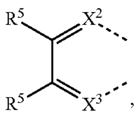

, wherein $X^2$ is N or $CR^5$; and
wherein $X^3$ is N or $CR^5$.

In a preferred embodiment the attachment points are positioned adjacent to each other.

In a preferred embodiment, $R^d$ and $R^e$ are at each occurrence independently selected from the group consisting of: hydrogen, deuterium, $CF_3$, CN, F, Br, I;

$C_1$-$C_{18}$-alkyl,
which is optionally substituted with one or more substituents $R^a$ and
wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;
$C_6$-$C_{18}$-aryl,
which is optionally substituted with one or more substituents $R^a$; and
$C_2$-$C_{17}$-heteroaryl,
which is optionally substituted with one or more substituents $R^a$;

In a preferred embodiment, $R^a$ is at each occurrence independently from one another selected from the group consisting of:
hydrogen;
deuterium;
$N(R^5)_2$;
$OR^5$;
$SR^5$;
$Si(R^5)_3$;
$B(OR^5)_2$;
$B(R^5)_2$;
$OSO_2R^5$;
$CF_3$;
CN;
halogen;
$C_1$-$C_{18}$-alkyl,
which is optionally substituted with one or more substituents $R^5$ and
wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;
$C_1$-$C_{18}$-alkoxy,
which is optionally substituted with one or more substituents $R^5$ and
wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;
$C_1$-$C_{18}$-thioalkoxy,
which is optionally substituted with one or more substituents $R^5$ and
wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;
$C_2$-$C_{18}$-alkenyl,
which is optionally substituted with one or more substituents $R^5$ and
wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;
$C_2$-$C_{18}$-alkynyl,
which is optionally substituted with one or more substituents $R^5$ and
wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;
$C_6$-$C_{18}$-aryl,
which is optionally substituted with one or more substituents $R^5$; and
$C_2$-$C_{17}$-heteroaryl,
which is optionally substituted with one or more substituents $R^5$.

In one embodiment, at least one $R^a$ is different from hydrogen in the organic molecule.

In one embodiment, $R^a$ is at each occurrence independently from one another selected from the group consisting of:
hydrogen;
deuterium;
$N(R^5)_2$;
$C_1$-$C_{18}$-alkyl,
which is optionally substituted with one or more substituents $R^5$ and
wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;
$C_6$-$C_{18}$-aryl,
which is optionally substituted with one or more substituents $R^5$; and
$C_2$-$C_{17}$-heteroaryl,
which is optionally substituted with one or more substituents $R^5$,
or forms a mono- or polycyclic, aliphatic, aromatic, heteroaromatic and/or benzo-fused ring system with one or more adjacent substituents selected from among $R^a$ and $R^5$.

In one embodiment, $R^a$ is at each occurrence independently from one another selected from the group consisting of: hydrogen,
deuterium,
$N(R^5)_2$,
$C_1$-$C_{18}$-alkyl,
which is optionally substituted with one or more substituents $R^5$ and
wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$, or forms an aromatic or heteroaromatic ring system with one or more adjacent substituents selected from among $R^a$ and $R^5$.

In one embodiment of the invention, $R^a$ is at each occurrence independently selected from the group consisting of:

hydrogen,

Me, $^i$Pr, $^t$Bu, CN, $CF_3$, F, aryl, which is optionally substituted with one or more substituents independently from each other selected from the group consisting of Me, $^i$Pr, $^t$Bu, CN, $CF_3$, F and Ph, pyridinyl, which is optionally substituted with one or more substituents independently from each other selected from the group consisting of Me, $^i$Pr, $^t$Bu, CN, $CF_3$, F and Ph, carbazolyl, which is optionally substituted with one or more substituents independently from each other selected from the group consisting of Me, $^i$Pr, $^t$Bu, CN, $CF_3$, F and Ph, triazinyl, which is optionally substituted with one or more substituents independently from each other selected from the group consisting of Me, $^i$Pr, $^t$Bu, CN, $CF_3$, F and Ph, and $N(Ph)_2$, which is optionally substituted with one or more substituents independently from each other selected from the group consisting of Me, $^i$Pr, $^t$Bu, F and Ph, wherein groups $R^a$ positioned adjacent to each other are optionally bonded to each other and form an aryl or heteroaryl ring, which is optionally substituted with one or more $C_1$-$C_5$-alkyl substituents, $C_6$-$C_{18}$-aryl substituents, deuterium, halogen, CN or $CF_3$.

In one embodiment of the invention, $R^a$ is at each occurrence independently selected from the group consisting of:

hydrogen,

Me, $^i$Pr, $^t$Bu, CN, $CF_3$, F, aryl, which is optionally substituted with one or more substituents independently from each other selected from the group consisting of Me, $^i$Pr, $^t$Bu, CN, $CF_3$, F and Ph, pyridinyl, which is optionally substituted with one or more substituents independently from each other selected from the group consisting of Me, $^i$Pr, $^t$Bu, CN, $CF_3$, F and Ph, carbazolyl, which is optionally substituted with one or more substituents independently from each other selected from the group consisting of Me, $^i$Pr, $^t$Bu, CN, $CF_3$, F and Ph, triazinyl, which is optionally substituted with one or more substituents independently from each other selected from the group consisting of Me, $^i$Pr, $^t$Bu, CN, $CF_3$, F and Ph, and $N(Ph)_2$, which is optionally substituted with one or more substituents independently from each other selected from the group consisting of Me, $^i$Pr, $^t$Bu, F and Ph.

In a further embodiment of the invention, $R^a$ is at each occurrence independently selected from the group consisting of:

hydrogen,

Me, $^i$Pr, $^t$Bu, F,

Ph, which is optionally substituted with one or more substituents independently from each other selected from the group consisting of Me, $^i$Pr, $^t$Bu, CN, $CF_3$, F and Ph, carbazolyl, which is optionally substituted with one or more substituents independently from each other selected from the group consisting of Me, $^i$Pr, $^t$Bu, CN, $CF_3$, F and Ph, and $N(Ph)_2$, which is optionally substituted with one or more substituents independently from each other selected from the group consisting of Me, $^i$Pr, $^t$Bu, F and Ph.

In one embodiment of the invention, $R^a$ is at each occurrence independently selected from the group consisting of:

hydrogen,

Me, $^i$Pr, $^t$Bu, F,

Ph, which is optionally substituted with one or more substituents independently from each other selected from the group consisting of Me, $^i$Pr, $^t$Bu, CN, $CF_3$, F and Ph, carbazolyl, which is optionally substituted with one or more substituents independently from each other selected from the group consisting of Me, $^i$Pr, $^t$Bu, CN, $CF_3$, F and Ph, and $N(Ph)_2$, which is optionally substituted with one or more substituents independently from each other selected from the group consisting of Me, $^i$Pr, $^t$Bu, F and Ph wherein groups $R^a$ positioned adjacent to each other are optionally bonded to each other and form an aryl or heteroaryl ring, which is optionally substituted with one or more $C_1$-$C_5$-alkyl substituents, $C_6$-$C_{18}$-aryl substituents, deuterium, halogen, CN or $CF_3$.

In a further embodiment of the invention, $R^a$ is at each occurrence independently selected from the group consisting of:

hydrogen,

Me, $^i$Pr, $^t$Bu, F

Ph, which is optionally substituted with one or more substituents independently from each other selected from the group consisting of Me, $^i$Pr, $^t$Bu, F and Ph, carbazolyl, which is optionally substituted with one or more substituents independently from each other selected from the group consisting of Me, $^i$Pr, $^t$Bu, F and Ph, and $N(Ph)_2$, which is optionally substituted with one or more substituents independently from each other selected from the group consisting of Me, $^i$Pr, $^t$Bu, F and Ph.

In a further embodiment of the invention, $R^a$ is at each occurrence independently selected from the group consisting of:

hydrogen,

Me, $^i$Pr, $^t$Bu,

Ph, which is optionally substituted with one or more substituents independently from each other selected from the group consisting of Me, $^i$Pr, $^t$Bu, and Ph, carbazolyl, which is optionally substituted with one or more substituents independently from each other selected from the group consisting of Me, $^i$Pr, $^t$Bu, and Ph, and $N(Ph)_2$, which is optionally substituted with one or more substituents independently from each other selected from the group consisting of Me, $^i$Pr, $^t$Bu, and Ph.

In a further embodiment of the invention, $R^a$ is at each occurrence independently selected from the group consisting of:

hydrogen,

Me, $^i$Pr, $^t$Bu,

Ph, which is optionally substituted with one or more substituents independently from each other selected from the group consisting of Me, $^{i}$Pr, $^{t}$Bu, and Ph, and $N(Ph)_2$, which is optionally substituted with one or more substituents independently from each other selected from the group consisting of Me, $^{i}$Pr, $^{t}$Bu, and Ph.

In a further embodiment of the invention, $R^a$ is at each occurrence independently selected from the group consisting of:

hydrogen,

Me, $^{i}$Pr, $^{t}$Bu, and

Ph, which is optionally substituted with one or more substituents independently from each other selected from the group consisting of Me, $^{i}$Pr, $^{t}$Bu, and Ph.

In one embodiment, $R^a$ is at each occurrence independently from one another selected from the group consisting of: hydrogen;

deuterium;

$N(R^5)_2$;

$C_1$-$C_{18}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$, or forms a mono- or polycyclic, aliphatic, aromatic, heteroaromatic and/or benzo-fused ring system with one or more adjacent substituents selected from among $R^a$ and $R^5$, wherein the ring system is selected from the following groups:

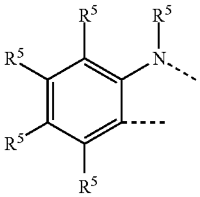

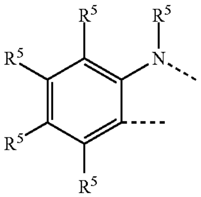

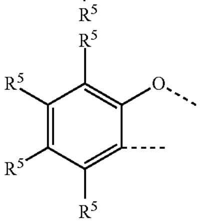

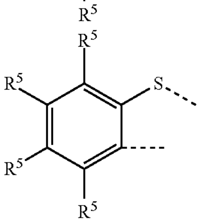

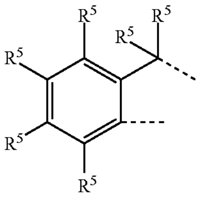

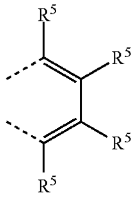

-continued

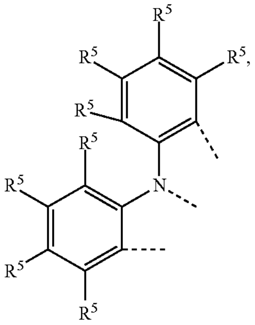

wherein each dotted line is an attachment point.

In one embodiment, $R^a$ is at each occurrence independently from one another selected from the group consisting of: hydrogen, deuterium, $N(R^5)_2$, $C_1$-$C_{18}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$, or forms a mono- or polycyclic, aliphatic, aromatic, heteroaromatic and/or benzo-fused ring system with one or more adjacent substituents selected from among $R^a$ and $R^5$, wherein the ring system is selected from the following groups:

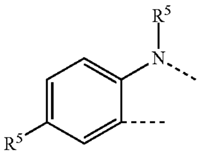

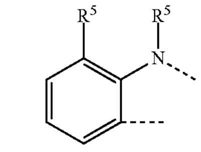

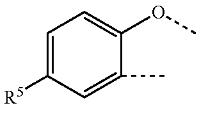

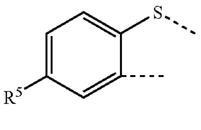

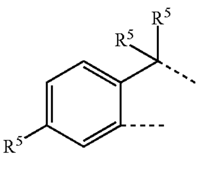

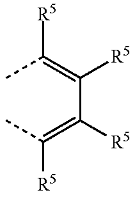

-continued
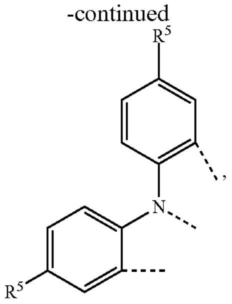
wherein each dotted line is an attachment point.
In a preferred embodiment, the attachment points are positioned adjacent to each other. This means that $R^a$ preferably forms a ring system with $R^a$ positioned adjacent to each other.
Specific examples are listed below:
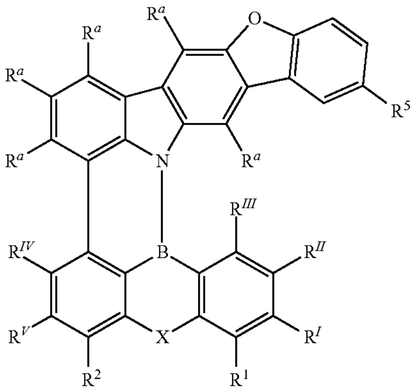
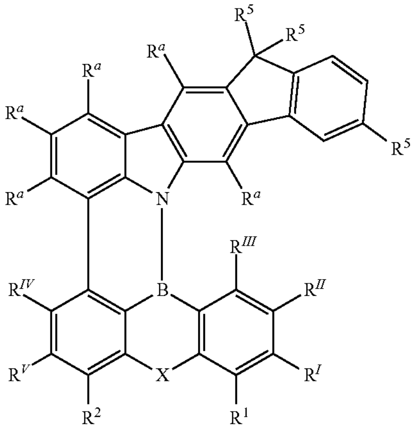
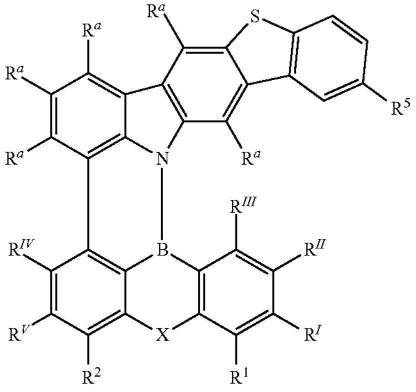
-continued
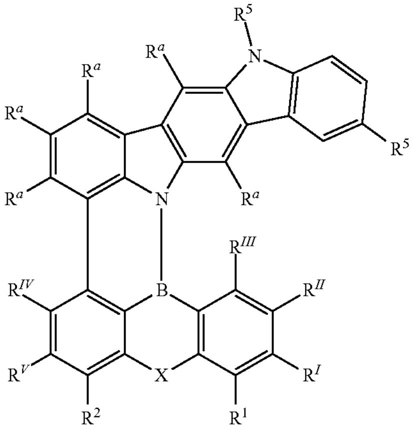
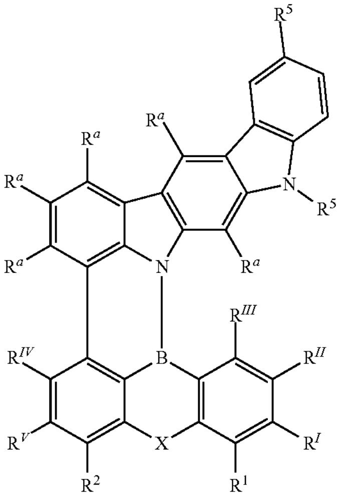
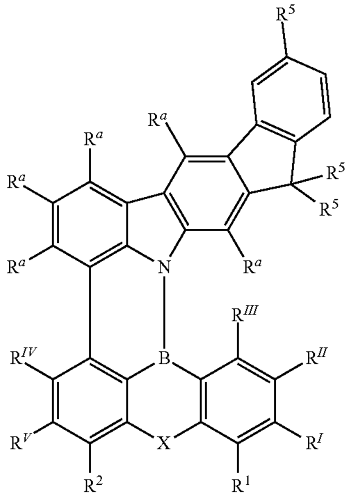

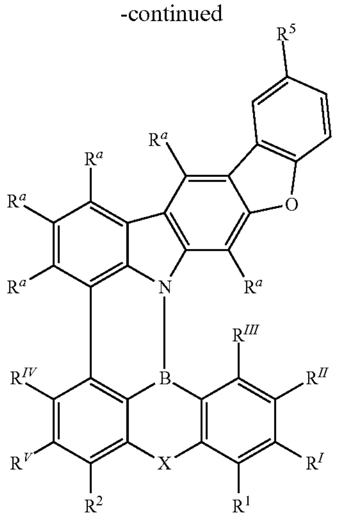
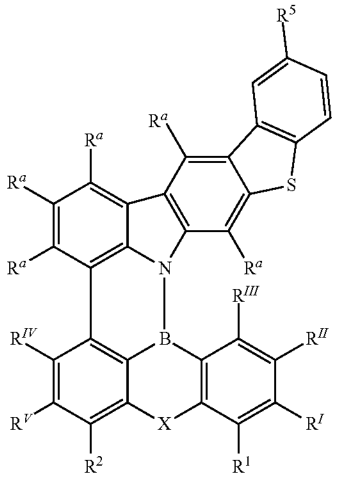
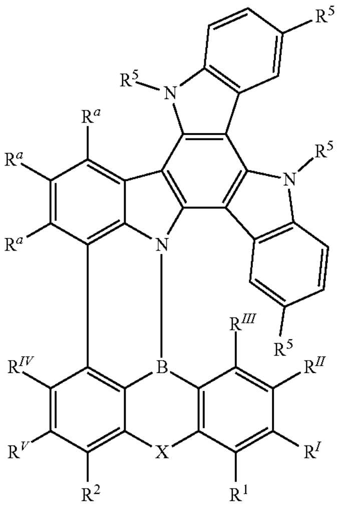
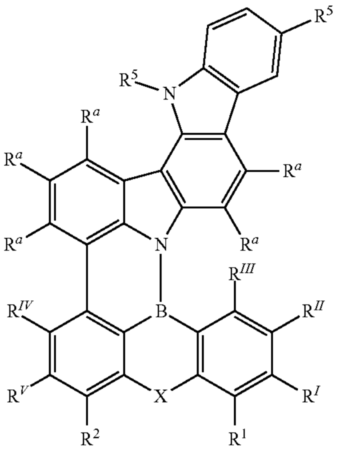
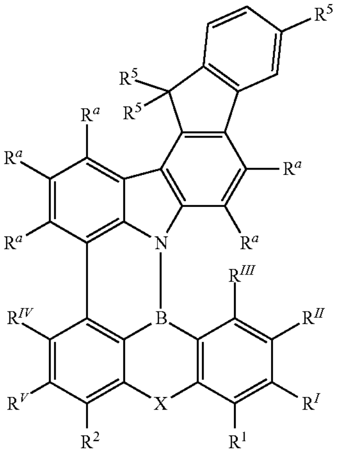
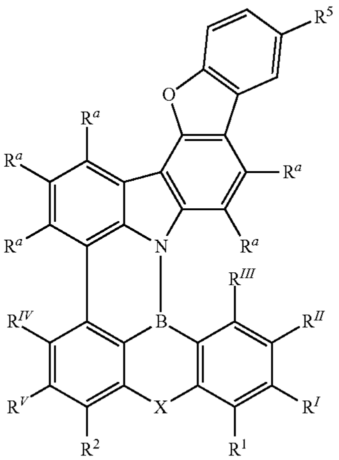

-continued
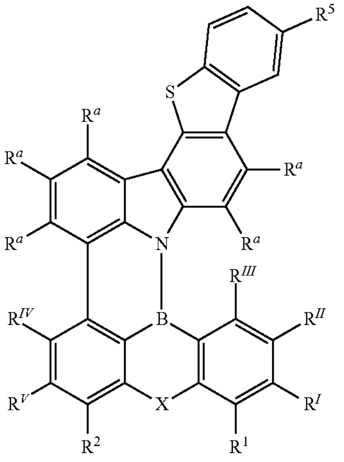
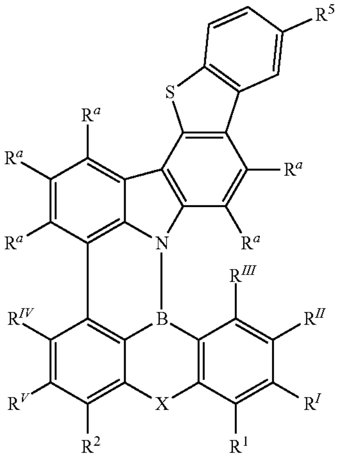
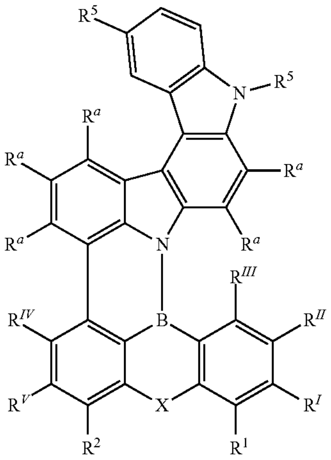
-continued
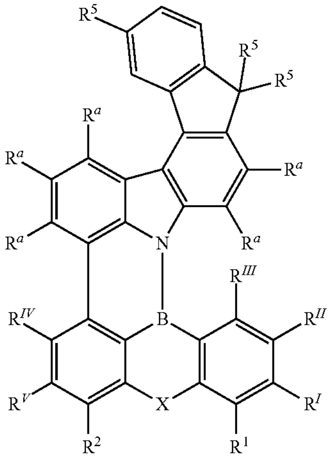
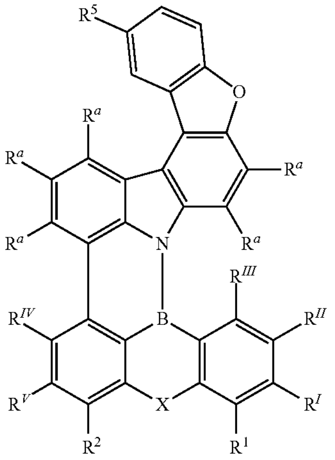
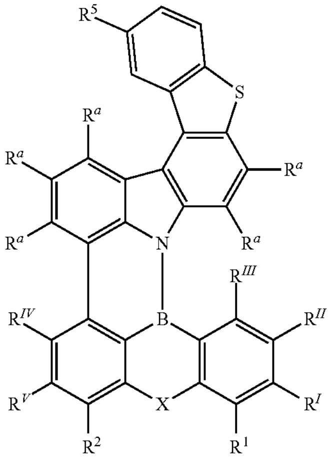

-continued

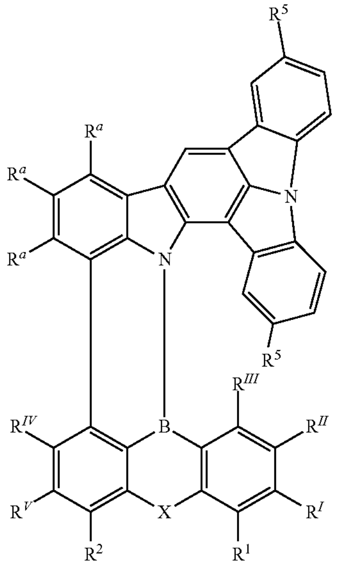

In one embodiment, at least one $R^a$ forms a mono- or polycyclic, aliphatic, aromatic, heteroaromatic and/or benzo-fused ring system with one or more substituents $R^a$ and/or $R^5$, wherein the ring system is selected from the following group:

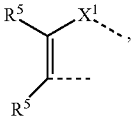

wherein $X^1$ is S, O or $NR^5$.

In a preferred embodiment the attachment points are positioned adjacent to each other.

In a preferred embodiment, the organic molecule of the invention includes or consists of a structure of Formula I, with the proviso that, if X is $NR^3$ and $R^d$ and $R^e$ are connected to each other to form an aromatic ring system, $R^V$ is $N(R^5)_2$ or forms a mono- or polycyclic, aliphatic, aromatic, heteroaromatic and/or benzo-fused ring system with one or more substituents $R^2$, $R^3$, $R^5$ and/or $R^{IV}$.

Specific examples are listed below:

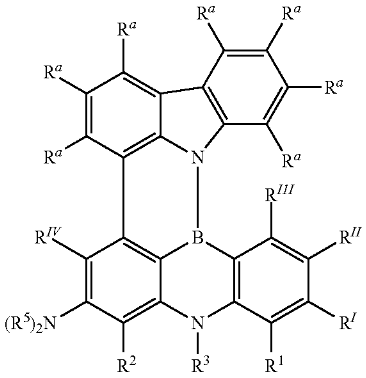

-continued

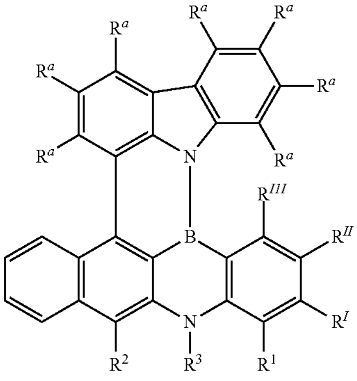

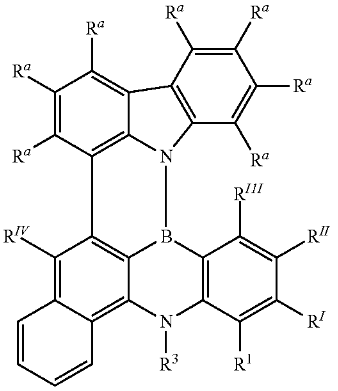

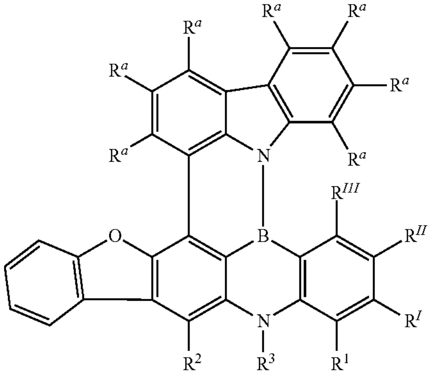

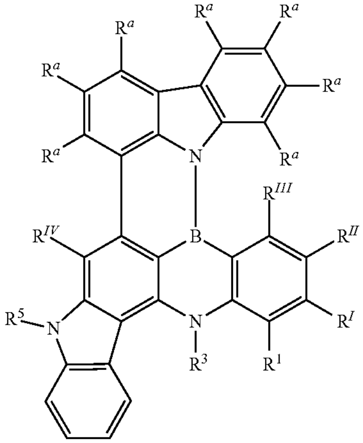

-continued

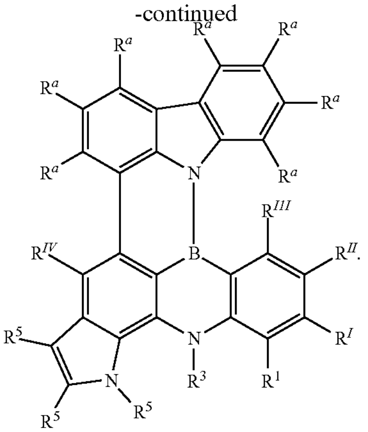

In a preferred embodiment, the organic molecule of the invention includes or consists of a structure of Formula I, with the proviso that if X is $NR^3$ and $R^d$ and $R^e$ are connected to each other to form an aromatic ring system, $R^V$ is $N(R^6)_2$ or forms a mono- or polycyclic, aliphatic, aromatic, heteroaromatic and/or benzo-fused ring system with one or more substituents $R^2$, $R^3$, $R^5$, and/or $R^{IV}$.

In a preferred embodiment, the organic molecule of the invention includes or consists of a structure of Formula I, with the proviso that, if X is $NR^3$ and $R^d$ and $R^e$ are connected to each other to form an aromatic ring system, $R^V$ is $N(R^5)_2$ or forms a mono- or polycyclic, aliphatic, aromatic, heteroaromatic and/or benzo-fused ring system with one or more adjacent substituents selected from among $R^2$ and $R^{IV}$.

In a preferred embodiment, the organic molecule of the invention includes or consists of a structure of Formula I, with the proviso that, if X is $NR^3$ and $R^d$ and $R^e$ are connected to each other to form an aromatic ring system, $R^V$ is $N(R^6)_2$ or forms a mono- or polycyclic, aliphatic, aromatic, heteroaromatic and/or benzo-fused ring system with one or more adjacent substituents selected from among $R^2$ and $R^{IV}$.

In a preferred embodiment, the organic molecule of the invention includes or consists of a structure of Formula I, with the proviso that, if X is $NR^3$ and $R^d$ and $R^e$ are connected to each other to form an aromatic ring system, $R^V$ is $N(R^5)_2$.

In a preferred embodiment, the organic molecule of the invention includes or consists of a structure of Formula I, with the proviso that, if X is $NR^3$ and $R^d$ and $R^e$ are connected to each other to form an aromatic ring system, $R^V$ is $N(R^6)_2$.

In another preferred embodiment, the organic molecule of the invention includes or consists of a structure of Formula I, with the proviso that, if X is $NR^3$ and $R^d$ and $R^e$ are connected to each other to form an aromatic ring system, $R^V$ forms a mono- or polycyclic, aliphatic, aromatic, heteroaromatic and/or benzo-fused ring system with one or more adjacent substituents selected from among $R^2$, $R^3$, $R^5$, and $R^{IV}$.

In more preferred embodiment, the organic molecule of the invention includes or consists of a structure of Formula I, with the proviso that, if X is $NR^3$ and $R^d$ and $R^e$ are connected to each other to form an aromatic ring system, $R^V$ forms a mono- or polycyclic, aliphatic, aromatic, heteroaromatic and/or benzo-fused ring system with one or more adjacent substituents $R^2$, and/or $R^{IV}$.

Below, examples for n=0 and n=1 with different substituents X are shown:

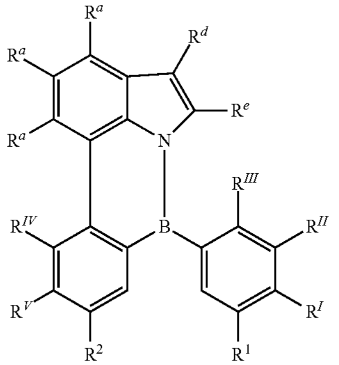

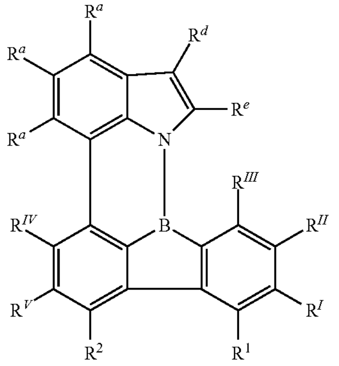

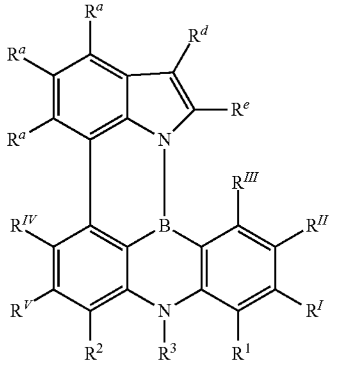

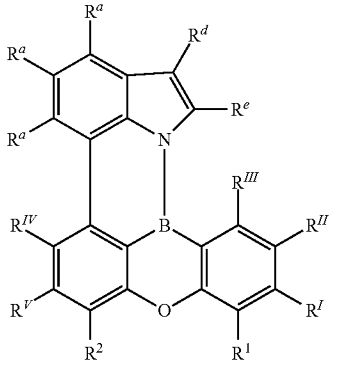

-continued
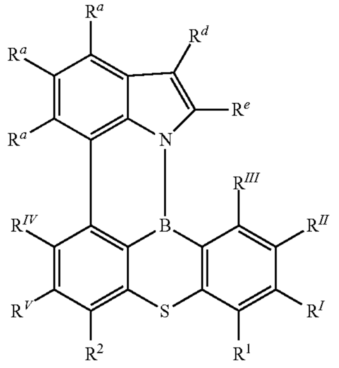
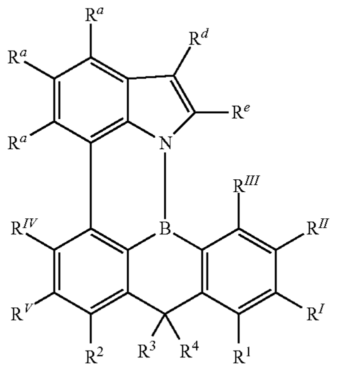
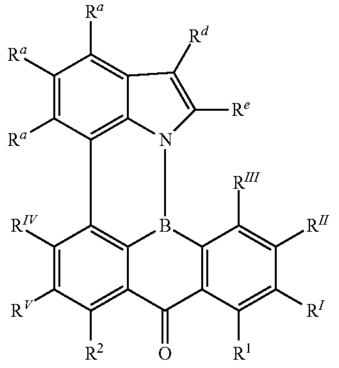
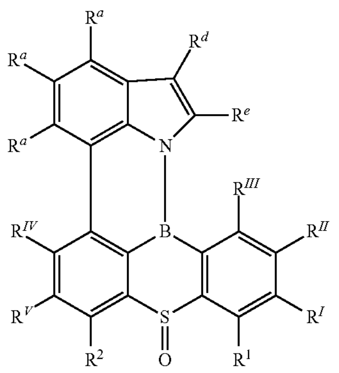
-continued
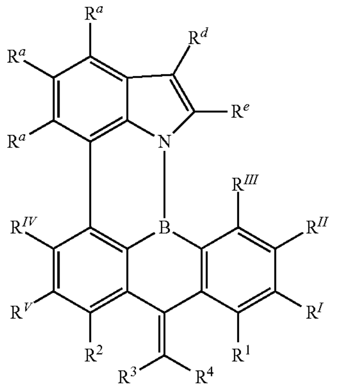
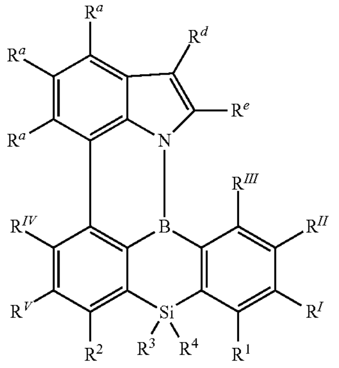
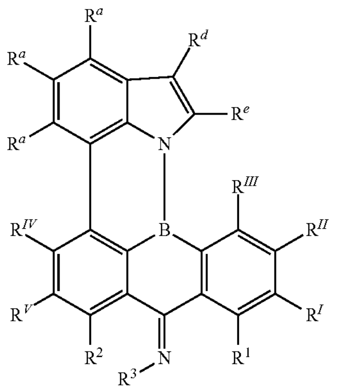
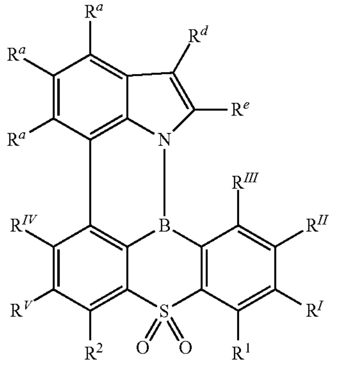
Additional examples of the organic molecules according to the invention include:

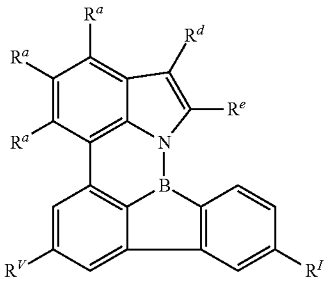

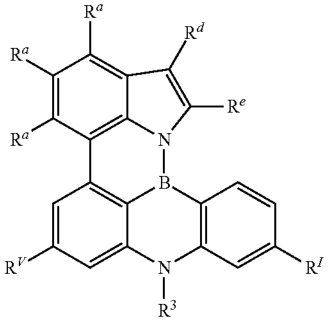

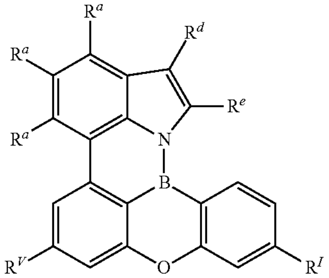

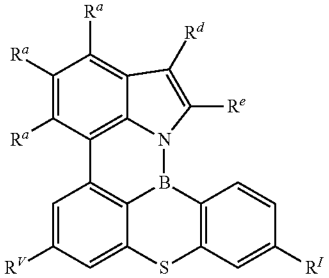

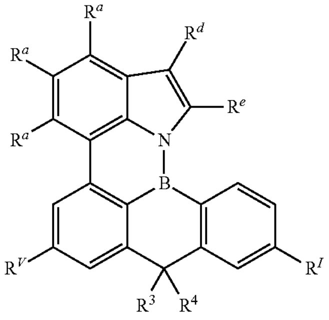

In a preferred embodiment, X is at each occurrence independently from one another selected from the group consisting of a direct bond, $NR^3$, $CR^3R^4$, S and O.

In a more preferred embodiment, X is at each occurrence independently from one another selected from the group consisting of a direct bond, $NR^3$, S and O.

In a certain embodiment, X is at each occurrence independently from one another selected from the group consisting of a direct bond and $NR^3$.

In one embodiment of the invention, $R^1$, $R^2$, $R^3$, $R^4$, $R^I$, $R^{II}$, $R^{III}$, $R^{IV}$ and $R^V$ is at each occurrence independently from one another selected from the group consisting of:

hydrogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In one embodiment of the invention the organic molecule includes or consists of a structure of Formula II Formula II

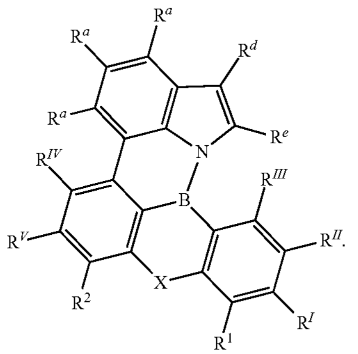

In a preferred embodiment of the invention, X is at each occurrence independently from one another selected from the group consisting of a direct bond, $NR^3$ and O.

In a preferred embodiment, the organic molecule of the invention includes or consists of a structure of Formula II, with the proviso that, if X is $NR^3$ and $R^d$ and $R^e$ are connected to each other to form an aromatic ring system, $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In a preferred embodiment, the organic molecule of the invention includes or consists of a structure of Formula II, with the proviso that, if X is $NR^3$ and $R^d$ and $R^e$ are connected to each other to form an aromatic ring system, $R^V$ is $N(R^5)_2$ or forms a mono- or polycyclic, aliphatic, aromatic, heteroaromatic and/or benzo-fused ring system with one or more adjacent substituents $R^2$, and/or $R^{IV}$.

In one embodiment of the invention the organic molecule includes or consists of a structure of Formula II-1

Formula II-1

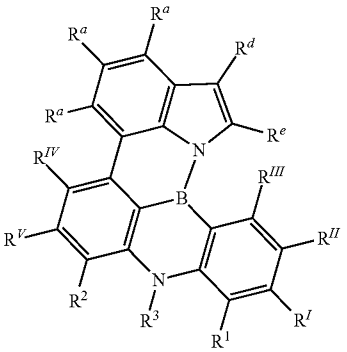

wherein $R^3$ is selected from the group consisting of $C_6$-$C_{18}$-aryl, which is optionally substituted with one or more substituents $R^5$; and $C_2$-$C_{57}$-heteroaryl, which is optionally substituted with one or more substituents $R^5$.

In one embodiment of the invention the organic molecule includes or consists of a structure of Formula II-1, wherein $R^3$ is selected from the group consisting of $C_6$-$C_{18}$-aryl, which is optionally substituted with one or more substituents $R^5$; and $C_2$-$C_{57}$-heteroaryl, which is optionally substituted with one or more substituents $R^5$.

In a preferred embodiment of the invention the organic molecule includes or consists of a structure of Formula II-1, wherein $R^3$ is a $C_6$-$C_{18}$-aryl, which is optionally substituted with one or more substituents $R^5$.

In another embodiment of the invention the organic molecule includes or consists of a structure of Formula II-1, wherein $R^3$ is a $C_6$-$C_{18}$-aryl, which is optionally substituted with one or more substituents $R^6$.

In a preferred embodiment, the organic molecule of the invention includes or consists of a structure of Formula II-1, with the proviso that, if $R^d$ and $R^e$ are connected to each other to form an aromatic ring system, $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In a preferred embodiment, the organic molecule of the invention includes or consists of a structure of Formula II-1, with the proviso that, if $R^d$ and $R^e$ are connected to each other to form an aromatic ring system, $R^V$ is $N(R^5)_2$ or forms a mono- or polycyclic, aliphatic, aromatic, heteroaromatic and/or benzo-fused ring system with one or more adjacent substituents selected from among $R^2$ and $R^{IV}$.

In a preferred embodiment of the invention, the organic molecule includes or consists of a structure of Formula II-1a Formula II-1a

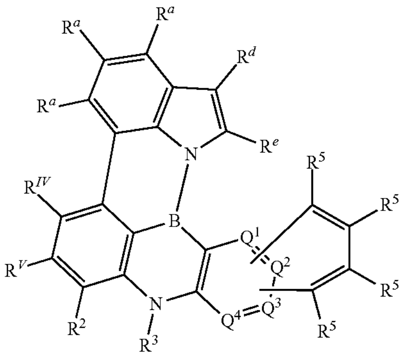

wherein $R^3$ is a $C_6$-$C_{18}$-aryl, which is optionally substituted with one or more substituents $R^5$;

$Q^1$ is selected from the group consisting of C and $CR^{III}$;
$Q^2$ is selected from the group consisting of C and $CR^{II}$;
$Q^3$ is selected from the group consisting of C and $CR^{I}$;
$Q^4$ is selected from the group consisting of C and $CR^1$;

wherein at least one substituent selected from the group consisting of $Q^2$ and $Q^3$ is C;

exactly one substituent selected from the group consisting of $Q^1$ and $Q^4$ is C (and the other is $CR^{III}$ or $CR^1$, respectively), if exactly one substituent selected from the group consisting of $Q^2$ and $Q^3$ is C.

This means a structure of Formula II-1a is build-up of the following three structure Formula II-1aa, Formula II-1ab and Formula II-1ac:

Formula II-1aa

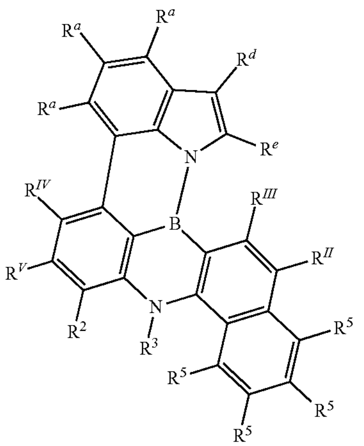

Formula II-1ab

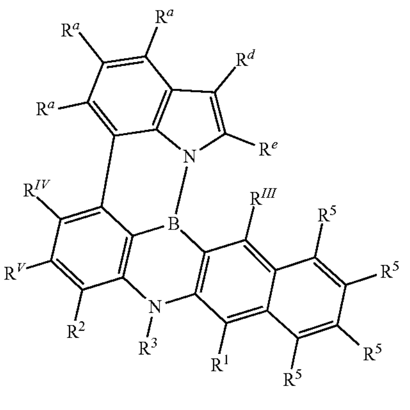

-continued

Formula II-1ac

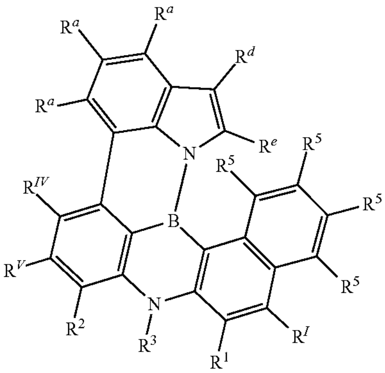

In a more preferred embodiment of the invention, the organic molecule includes or consists of a structure of Formula II-1a, wherein at least one substituent selected from the group consisting of $R^2$, $R^V$, and $R^{IV}$ forms a mono- or polycyclic, aliphatic, aromatic, heteroaromatic and/or benzo-fused ring system with one or more adjacent substituents selected from among $R^2$, $R^V$, and $R^{IV}$.

In a more preferred embodiment of the invention, the organic molecule includes or consists of a structure of Formula II-1a, wherein at least one substituent $R^V$ forms a mono- or polycyclic, aliphatic, aromatic, heteroaromatic and/or benzo-fused ring system with one or more adjacent substituents selected from among $R^2$ and $R^{IV}$.

In a more preferred embodiment of the invention, the organic molecule includes or consists of a structure of Formula II-1a, wherein at least one substituent selected from the group consisting of $R^2$, $R^V$, and $R^{IV}$ forms a mono- or polycyclic, aliphatic, aromatic, heteroaromatic and/or benzo-fused ring system with one or more adjacent substituents selected from among $R^2$, $R^V$, and $R^{IV}$, wherein the ring system is selected from the following groups:

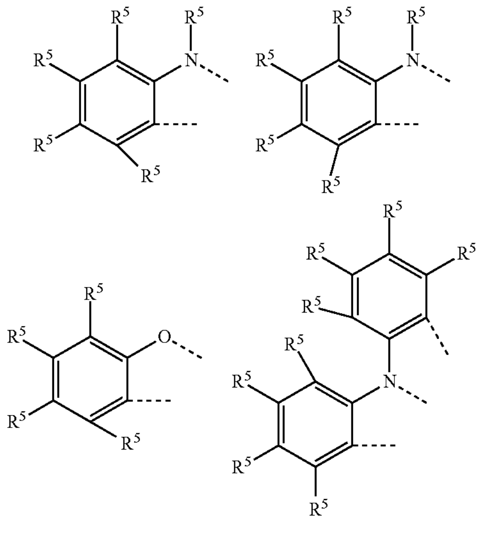

-continued

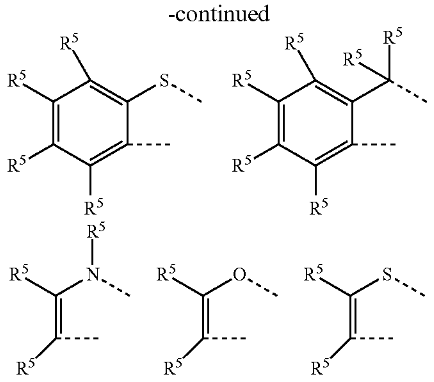

wherein each dotted line is an attachment point.

In a preferred embodiment the attachment points are positioned adjacent to each other. This means that $R^2$ preferably forms a ring system with $R^V$; $R^V$ preferably forms a ring system with $R^2$ and/or $R^{IV}$ and $R^{IV}$ preferably forms a ring system with $R^V$.

In a more preferred embodiment of the invention, the organic molecule includes or consists of a structure of Formula II-1a, wherein at least one substituent selected from the group consisting of $R^2$, $R^V$, and $R^{IV}$ forms a mono- or polycyclic, aliphatic, aromatic, heteroaromatic and/or benzo-fused ring system with one or more adjacent substituents selected from among $R^2$, $R^V$, and $R^{IV}$, wherein the ring system is selected from the following groups:

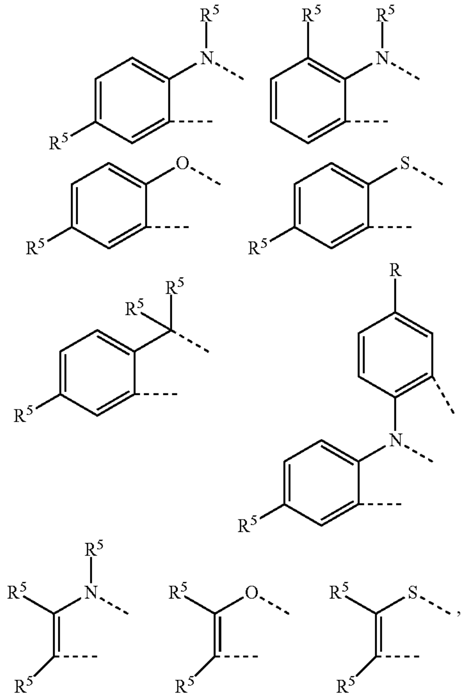

wherein each dotted line is an attachment point.

In a particular embodiment of the invention, the organic molecule includes or consists of a structure of Formula II-1a, wherein at least one substituent selected from the group consisting of $R^2$, $R^V$, and $R^{IV}$ forms a mono- or polycyclic, aliphatic, aromatic, heteroaromatic and/or benzo-fused ring system with one or more substituents $R^2$, $R^V$, and/or $R^{IV}$, wherein the ring system is selected from the following group:

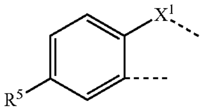

wherein $X^1$ is S, O or $NR^5$.

In a particular embodiment of the invention, the organic molecule includes or consists of a structure of Formula II-1a, wherein at least one substituent selected from the group consisting of $R^2$, $R^V$, and $R^{IV}$ forms a mono- or polycyclic, aliphatic, aromatic, heteroaromatic and/or benzo-fused ring system with one or more substituents $R^2$, $R^V$, and/or $R^{IV}$, wherein the ring system is selected from the following groups:

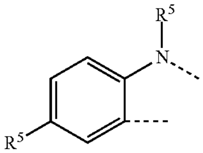

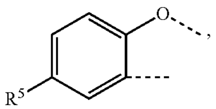

wherein each dotted line is an attachment point.

In a certain embodiment of the invention, the organic molecule includes or consists of a structure of Formula II-1a, wherein at least one substituent selected from the group consisting of $R^2$, $R^V$, and $R^{IV}$ forms a mono- or polycyclic, aliphatic, aromatic, heteroaromatic and/or benzo-fused ring system with one or more substituents $R^2$, $R^V$, and/or $R^{IV}$, wherein the ring system is selected from the following groups:

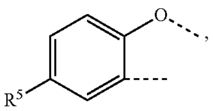

wherein each dotted line indicates an attachment point.

In a preferred embodiment, the organic molecule includes or consists of a structure of Formula II-1ac Formula II-1ac

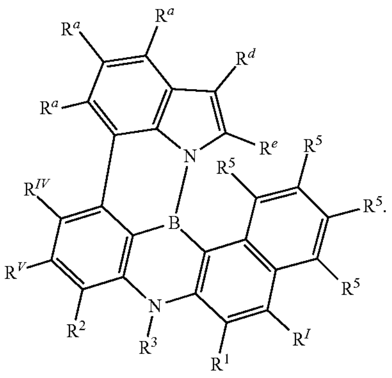

In another embodiment, the organic molecule includes or consists of a structure of Formula II-1ab Formula II-1ab

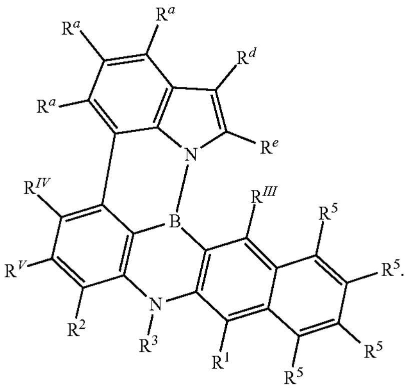

In one embodiment of the invention, the organic molecule includes or consists of a structure of Formula IIa Formula IIa

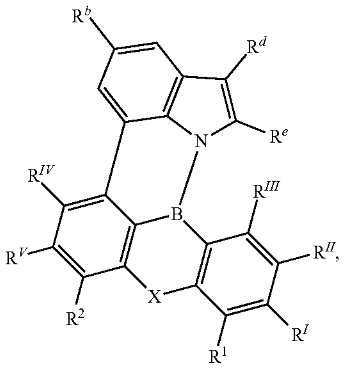

wherein $R^b$ is at each occurrence independently from one another selected from the group consisting of hydrogen, deuterium, $N(R^5)_2$, $OR^5$, $Si(R^5)_3$, $B(OR^5)_2$, $OSO_2R^5$, $CF_3$, CN, F, Br, I;

$C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^5$; and $C_2$-$C_{57}$-heteroaryl, which is optionally substituted with one or more substituents $R^5$; and apart from that, the aforementioned definitions apply.

In a further embodiment of the invention, $R^b$ is at each occurrence independently from one another selected from the group consisting of:

hydrogen, deuterium,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, $R^b$ is at each occurrence independently from one another selected from the group consisting of:

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a preferred embodiment, the organic molecule of the invention includes or consists of a structure of Formula IIa, with the proviso that if X is $NR^a$ and $R^d$ and $R^e$ are connected to each other to form an aromatic ring system, $R^V$ is $N(R^5)_2$ or forms a mono- or polycyclic, aliphatic, aromatic, heteroaromatic and/or benzo-fused ring system with one or more substituents $R^2$, $R^3$, $R^5$, and/or $R^{IV}$.

In a preferred embodiment of the invention, the organic molecule includes or consists of a structure of Formula III Formula III

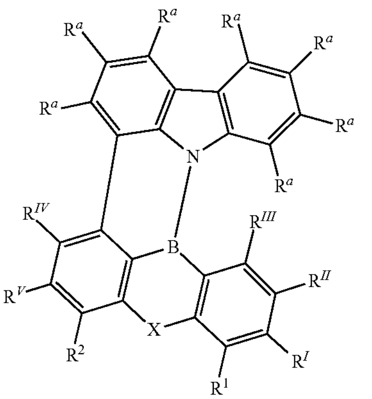

wherein the substituents $R^a$, and $R^5$, independently from each other, optionally form a mono- or polycyclic, aliphatic, aromatic, heteroaromatic and/or benzo-fused ring system with one or more adjacent substituents selected from among $R^a$ and $R^5$; and wherein the substituents $R^1$, $R^2$, $R^3$, $R^4$, $R^5$, $R^I$, $R^{II}$, $R^{III}$, $R^{IV}$, and $R^V$ independently from each other, optionally form a mono- or polycyclic, aliphatic, aromatic, heteroaromatic and/or benzo-fused ring system with one or more adjacent substituents selected from among $R^1$, $R^2$, $R^3$, $R^4$, $R^5$, $R^I$, $R^{II}$, $R^{III}$, $R^{IV}$, and $R^V$.

In a preferred embodiment, the organic molecule of the invention includes or consists of a structure of Formula III, with the proviso that, if X is $NR^3$, $R^V$ is $N(R^5)_2$ or forms a mono- or polycyclic, aliphatic, aromatic, heteroaromatic and/or benzo-fused ring system with one or more substituents $R^2$, $R^3$, $R^5$, and/or $R^{IV}$.

In a preferred embodiment of the invention the organic molecule includes or consists of a structure of Formula III-1

Formula III-1

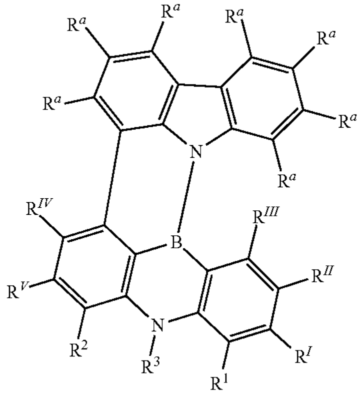

wherein $R^3$ is a $C_6$-$C_{60}$-aryl, which is optionally substituted with one or more substituents $R^6$.

In a preferred embodiment, the organic molecule of the invention includes or consists of a structure of Formula III-1, wherein $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In a preferred embodiment of the invention, the organic molecule includes or consists of a structure of Formula III-2

Formula III-2

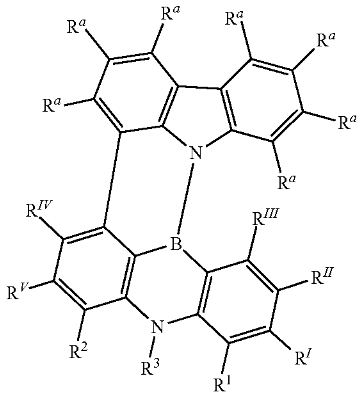

wherein $R^3$ is a $C_6$-$C_{18}$-aryl, which is optionally substituted with one or more substituents $R^5$.

In a preferred embodiment of the invention, the organic molecule includes or consists of a structure of Formula III-2 wherein $R^3$ is a $C_6$-$C_{18}$-aryl, which is optionally substituted with one or more substituents $R^6$, and $R^V$ is selected from the group consisting of $C_2$-$C_{17}$-heteroaryl, which is optionally substituted with one or more substituents $R^5$; and $N(R^5)_2$.

In a preferred embodiment, the organic molecule of the invention includes or consists of a structure of Formula III-2, wherein $R^V$ is $N(R^5)_2$ or forms a mono- or polycyclic, aliphatic, aromatic, heteroaromatic and/or benzo-fused ring system with one or more substituents $R^2$, $R^3$, $R^5$, and/or $R^{IV}$.

In a preferred embodiment, the organic molecule includes or consists of a structure of Formula III-2, wherein $R^V$ is $N(C_6$-$C_{18}$-aryl$)_2$.

In a preferred embodiment of the invention, the organic molecule includes or consists of a structure of Formula III-2a Formula III-2a

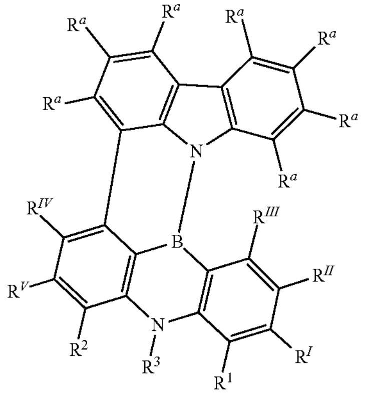

wherein at least one substituent selected from the group consisting of $R^1$, $R^2$, $R^I$, $R^{II}$, $R^{III}$, $R^{IV}$, and $R^V$ forms a mono- or polycyclic, aliphatic, aromatic, heteroaromatic and/or benzo-fused ring system with one or more adjacent substituents selected from among $R^1$, $R^2$, $R^3$, $R^4$, $R^5$, $R^I$, $R^{II}$, $R^{III}$, $R^{IV}$, and $R^V$, wherein the ring system is selected from the following groups:

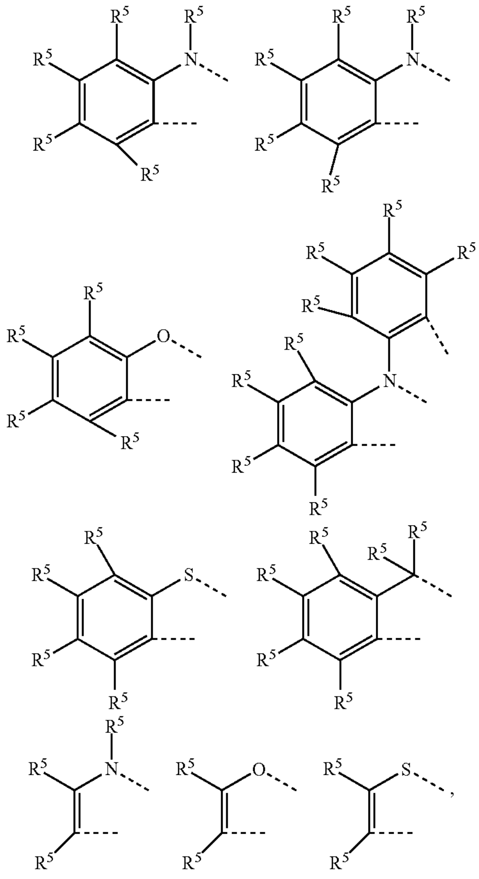

, wherein each dotted line is an attachment point.

In a preferred embodiment of the invention, the organic molecule includes or consists of a structure of Formula III-2a, wherein $R^3$ is a $C_6$-$C_{18}$-aryl, which is optionally substituted with one or more substituents $R^5$ and wherein at least one substituent selected from the group consisting of $R^1$, $R^2$, $R^I$, $R^{II}$, $R^{III}$, $R^{IV}$, and $R^V$ forms a mono- or polycyclic, aliphatic, aromatic, heteroaromatic and/or benzo-fused ring system with one or more adjacent substituents selected from among $R^1$, $R^2$, $R^3$, $R^4$, $R^5$, $R^I$, $R^{II}$, $R^{III}$, $R^{IV}$, and $R^V$, wherein the ring system is selected from the following groups:

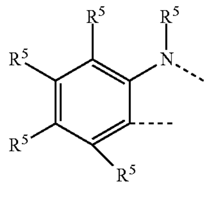
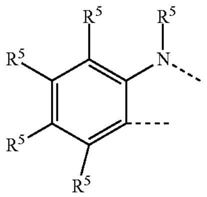
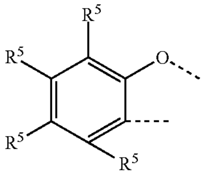
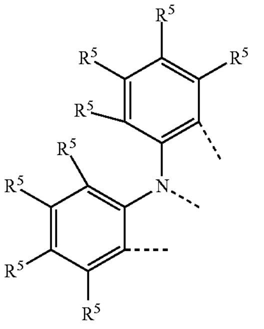
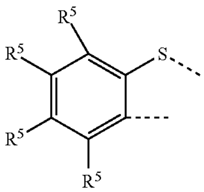
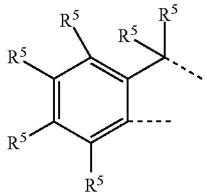
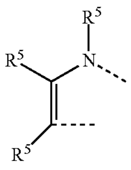
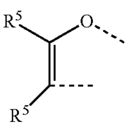
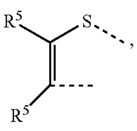, wherein each dotted line is an attachment point.

In a preferred embodiment of the invention, the organic molecule includes or consists of a structure of Formula III-2b Formula III-2b

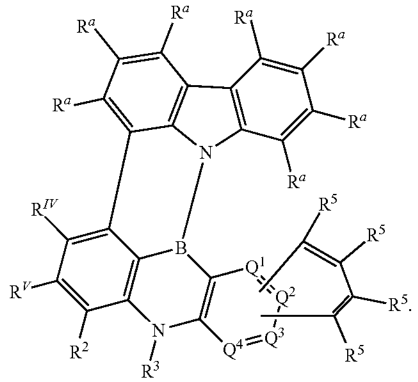

In a more preferred embodiment of the invention, the organic molecule includes or consists of a structure of Formula III-2b, wherein at least one substituent selected from the group consisting of $R^2$, $R^V$, and $R^{IV}$ forms a mono- or polycyclic, aliphatic, aromatic, heteroaromatic and/or benzo-fused ring system with one or more adjacent substituents selected from among $R^2$, $R^V$, and $R^{IV}$, wherein the ring system is selected from the following groups:

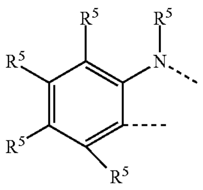
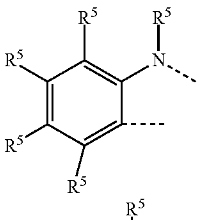
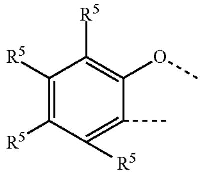
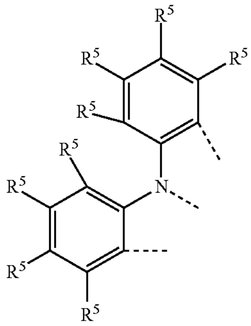
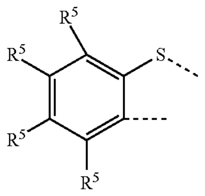
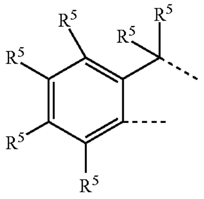
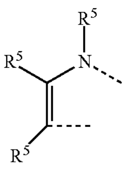
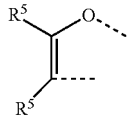
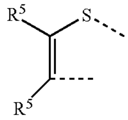, wherein each dotted line is an attachment point.

In a certain embodiment of the invention, the organic molecule includes or consists of a structure of Formula III-2b, wherein at least one substituent selected from the group consisting of $R^2$, $R^V$, and $R^{IV}$ forms a mono- or polycyclic, aliphatic, aromatic, heteroaromatic and/or benzo-fused ring system with one or more substituents $R^2$, $R^V$, and/or $R^{IV}$, wherein the ring system is selected from the following groups:

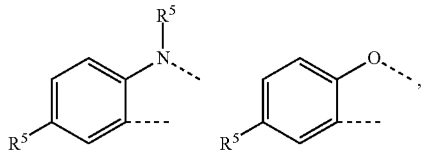

wherein each dotted line is an attachment point.

In a certain embodiment of the invention, the organic molecule includes or consists of a structure of Formula III-2b, wherein at least one substituent selected from the group consisting of $R^2$, $R^V$, and $R^{IV}$ forms a mono- or polycyclic, aliphatic, aromatic, heteroaromatic and/or benzo-fused ring system with one or more adjacent substituents selected from among $R^2$, $R^V$, and $R^{IV}$, wherein the ring system is selected from the following groups:

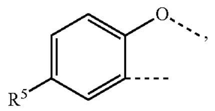

wherein each dotted line is an attachment point.

In one embodiment of the invention, the organic molecule/oligomer includes or consists of a structure of Formula III-2b, wherein at least one $R^a$ is different from hydrogen.

In a preferred embodiment of the invention, the organic molecule includes or consists of a structure of Formula III-2c Formula III-2c

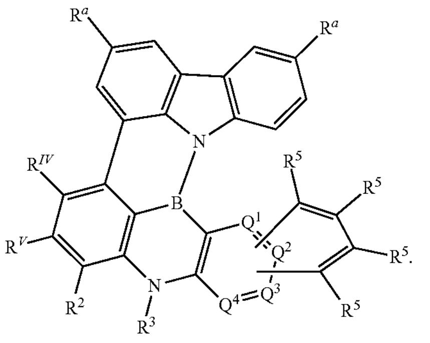

In a more preferred embodiment of the invention, the organic molecule includes or consists of a structure of Formula III-2c, wherein at least one substituent selected from the group consisting of $R^2$, $R^V$, and $R^{IV}$ forms a mono- or polycyclic, aliphatic, aromatic, heteroaromatic and/or benzo-fused ring system with one or more substituents $R^2$, $R^V$, and/or $R^{IV}$, wherein the ring system is selected from the following groups:

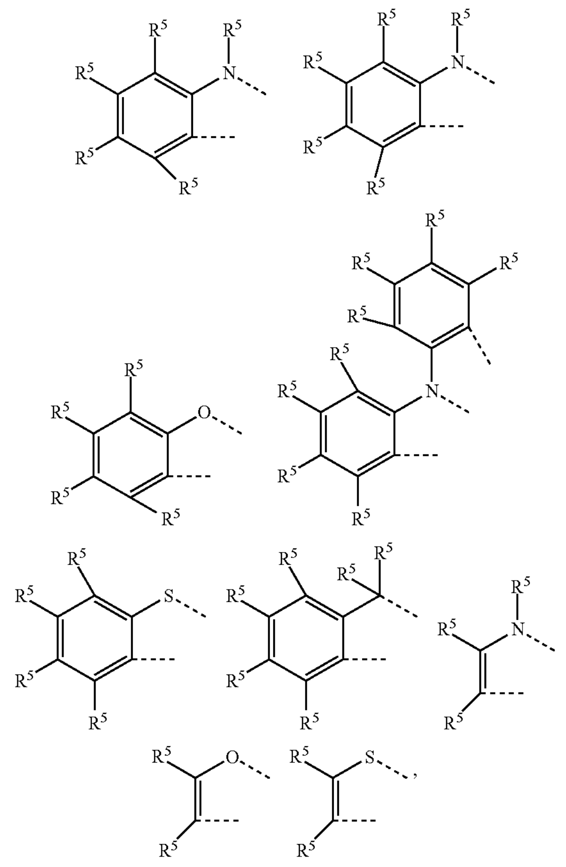

wherein each dotted line is an attachment point.

In an even more preferred embodiment of the invention, the organic molecule includes or consists of a structure of Formula III-2c, wherein at least one substituent selected from the group consisting of $R^2$, $R^V$, and $R^{IV}$ forms a mono- or polycyclic, aliphatic, aromatic, heteroaromatic and/or benzo-fused ring system with one or more substituents $R^2$, $R^V$, and/or $R^{IV}$, wherein the ring system is selected from the following group:

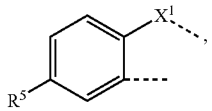

wherein each dotted line is an attachment point.

In an even more preferred embodiment of the invention, the organic molecule includes or consists of a structure of Formula III-2c, wherein at least one substituent selected from the group consisting of $R^2$, $R^V$, and $R^{IV}$ forms a mono- or polycyclic, aliphatic, aromatic, heteroaromatic and/or benzo-fused ring system with one or more adjacent substituents selected from among $R^2$, $R^V$, and $R^{IV}$, wherein the ring system is selected from the following groups:

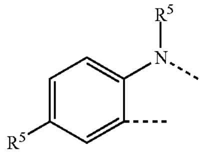

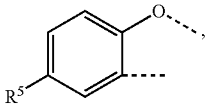

wherein each dotted line is an attachment point.

In a certain embodiment of the invention, the organic molecule includes or consists of a structure of Formula III-2c, wherein at least one substituent selected from the group consisting of $R^2$, $R^V$, and $R^{IV}$ forms a mono- or polycyclic, aliphatic, aromatic, heteroaromatic and/or benzo-fused ring system with one or more substituents $R^2$, $R^V$, and/or $R^{IV}$, wherein the ring system is selected from the following groups:

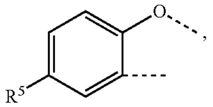

wherein each dotted line is an attachment point.

In one embodiment of the invention, the organic molecule/oligomer includes or consists of a structure of Formula III-2c, wherein at least one $R^a$ is different from hydrogen.

In a preferred embodiment of the invention, the organic molecule includes or consists of a structure of Formula III-2d-I, Formula III-2d-II, Formula III-2d-III, and/or Formula III-2d-IV:

Formula III-2d-I

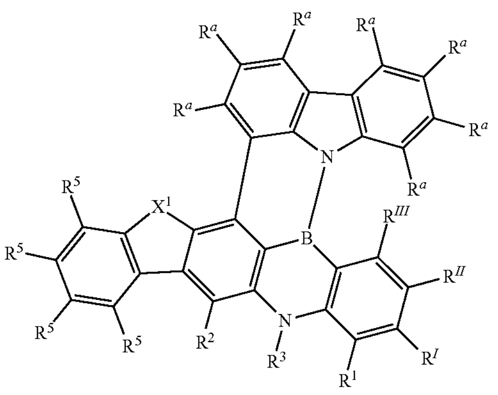

-continued

Formula II-2d-II

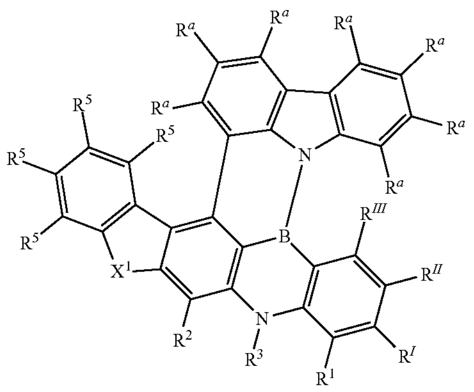

Formula III-2d-III

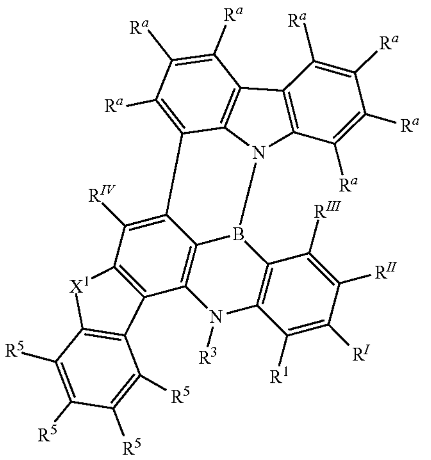

Formula II-2d-IV

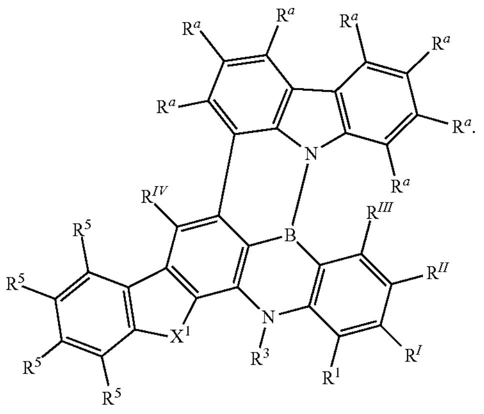

In one embodiment of the invention, the organic molecule/oligomer includes or consists of a structure of Formula III-2d-I, Formula III-2d-II, Formula III-2d-III, and/or Formula III-2d-IV, wherein at least one $R^a$ is different from hydrogen.

In one embodiment of the invention, the organic molecule/oligomer includes or consists of a structure of Formula III-2d-I, Formula III-2d-II, Formula III-2d-III, and/or Formula III-2d-IV, wherein $X^1$ is O.

In a more preferred embodiment of the invention, the organic molecule includes or consists of a structure of Formula III-2d-III:

Formula III-2d-III

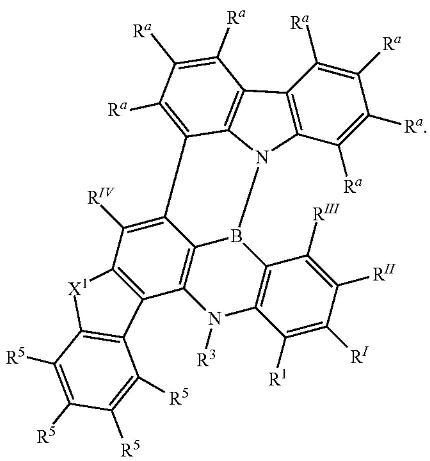

In one embodiment of the invention, the organic molecule/oligomer includes or consists of a structure of Formula III-2d-III, wherein at least one $R^5$ is different from hydrogen.

In one embodiment of the invention, the organic molecule/oligomer includes or consists of a structure of Formula III-2d-III, wherein $X^1$ is O.

In a more preferred embodiment of the invention, the organic molecule includes or consists of a structure of Formula III-2d-IIIa:

Formula III-2d-IIIa

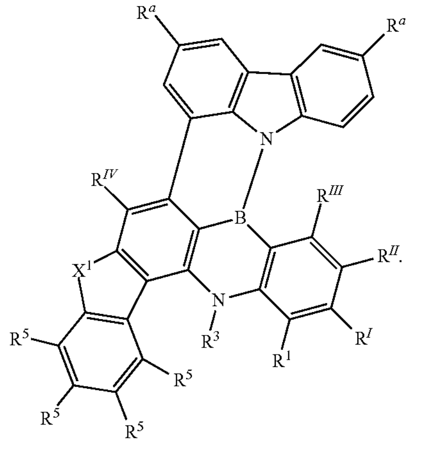

In one embodiment of the invention, the organic molecule/oligomer includes or consists of a structure of Formula III-2d-IIIa, wherein at least one $R^a$ is different from hydrogen.

In one embodiment of the invention, the organic molecule/oligomer includes or consists of a structure of Formula III-2d-IIIa, wherein $X^1$ is O.

In a more preferred embodiment of the invention, the organic molecule includes or consists of a structure of Formula III-2d-IIIb:

Formula III-2d-IIIb

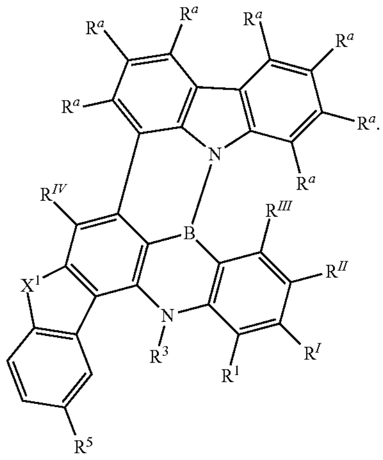

In one embodiment of the invention, the organic molecule/oligomer includes or consists of a structure of Formula III-2d-IIIb, wherein at least one $R^a$ is different from hydrogen.

In one embodiment of the invention, the organic molecule/oligomer includes or consists of a structure of Formula III-2d-IIIb, wherein $X^1$ is O.

In a certain embodiment of the invention, the organic molecule includes or consists of a structure of Formula III-2d-IIIc:

Formula III-2d-IIIc

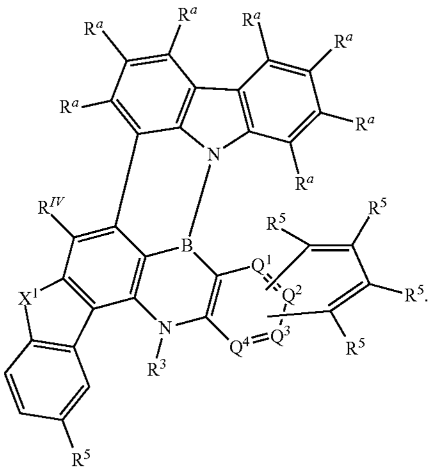

In one embodiment of the invention, the organic molecule/oligomer includes or consists of a structure of Formula III-2d-IIIc, wherein at least one $R^8$ is different from hydrogen.

In one embodiment of the invention, the organic molecule/oligomer includes or consists of a structure of Formula III-2d-IIIc, wherein $X^1$ is O.

In another preferred embodiment of the invention, the organic molecule includes or consists of a structure of Formula III-3, Formula III-4, or Formula III-5

Formula III-3

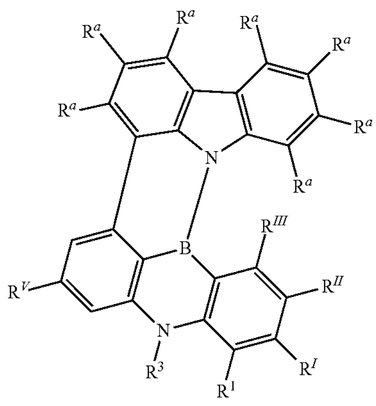

Formula III-4

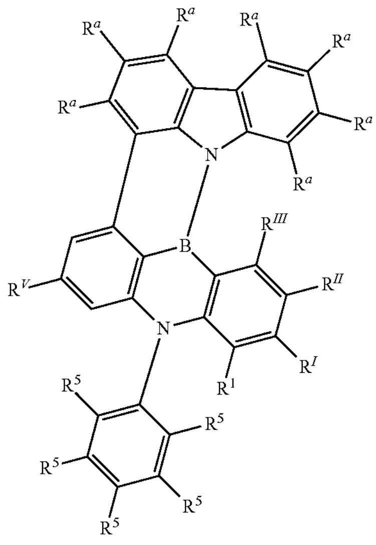

Formula III-5

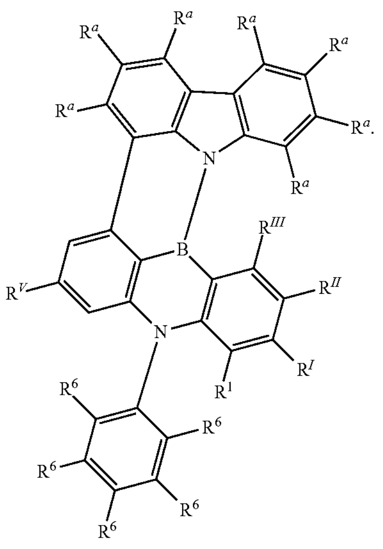

In one embodiment, the organic molecule includes or consists of a structure of Formula III-3, Formula III-4, or Formula III-5, wherein $R^V$ is selected from the group consisting of OPh, $CF_3$, CN, F;

$C_1$-$C_5$-alkyl, wherein one or more hydrogen atoms are optionally, independently from each other substituted by deuterium, CN, $CF_3$, or F;

$C_1$-$C_5$-alkoxy, wherein one or more hydrogen atoms are optionally, independently from each other substituted by deuterium, CN, $CF_3$, or F;

$C_1$-$C_5$-thioalkoxy, wherein one or more hydrogen atoms are optionally, independently from each other substituted by deuterium, CN, $CF_3$, or F;

$C_2$-$C_5$-alkenyl, wherein one or more hydrogen atoms are optionally, independently from each other substituted by deuterium, CN, $CF_3$, or F;

$C_2$-$C_5$-alkynyl, wherein one or more hydrogen atoms are optionally, independently from each other substituted by deuterium, CN, $CF_3$, or F;

$C_6$-$C_{18}$-aryl, which is optionally substituted with one or more $C_1$-$C_5$-alkyl substituents;

$C_2$-$C_{17}$-heteroaryl, which is optionally substituted with one or more $C_1$-$C_5$-alkyl substituents;

$N(C_6$-$C_{18}$-aryl$)_2$;

$N(C_2$-$C_{17}$-heteroaryl$)_2$; and $N(C_2$-$C_{17}$-heteroaryl$)(C_6$-$C_{18}$-aryl$)$.

Different exemplary embodiments for Formula III are shown in the following:

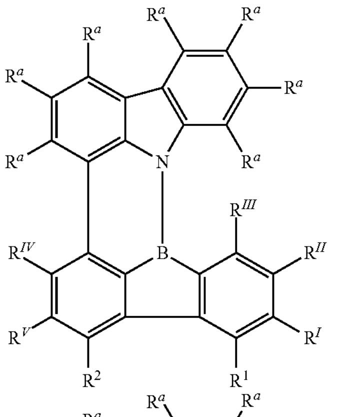

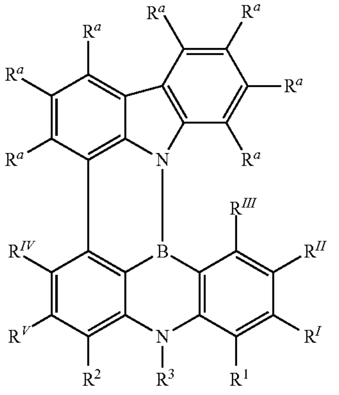

-continued
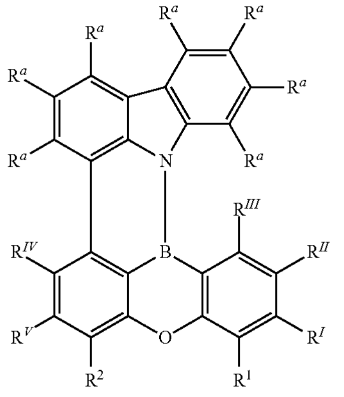
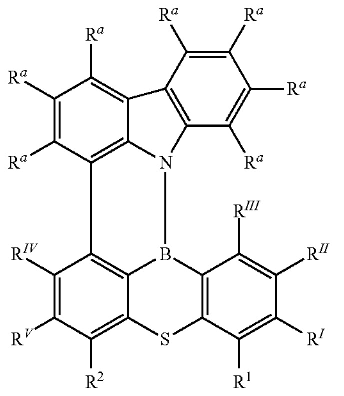
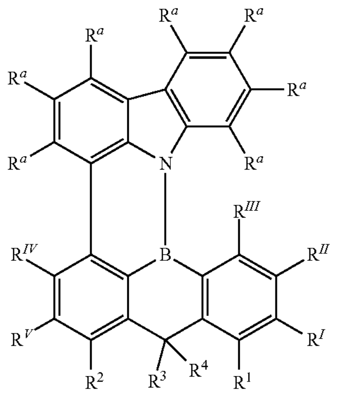
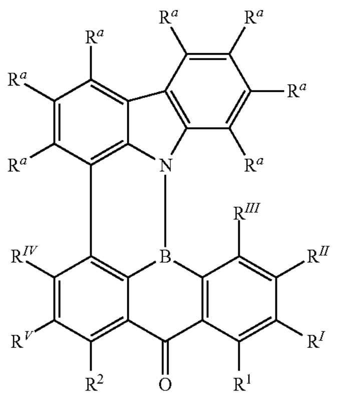
-continued
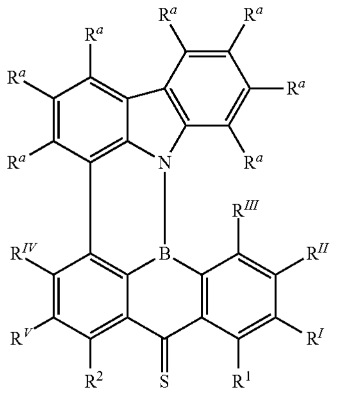
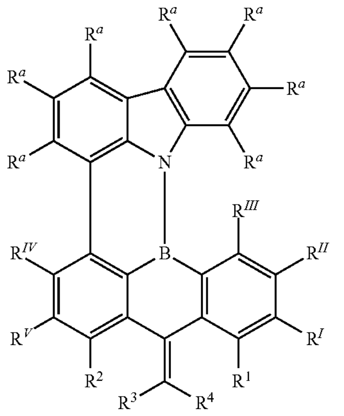
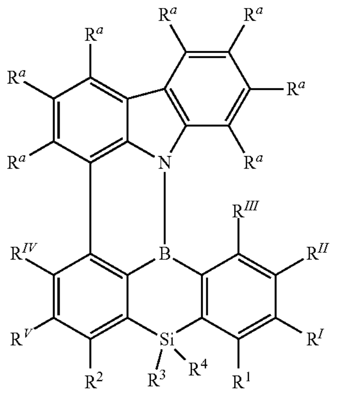
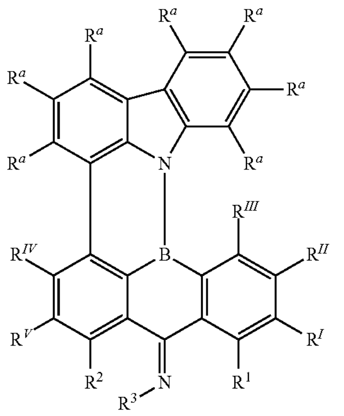

-continued

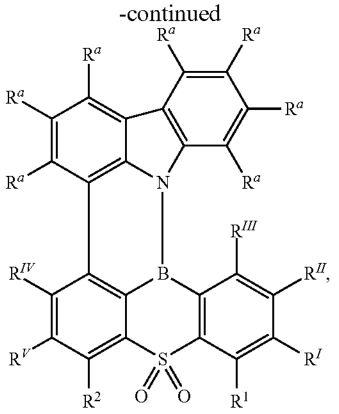

wherein the substituents $R^a$ and $R^5$ independently from each other, optionally form a mono- or polycyclic, aliphatic, aromatic, heteroaromatic and/or benzo-fused ring system with one or more adjacent substituents selected from among $R^a$ and $R^5$; and wherein apart from that, any one of the aforementioned definitions apply Additional examples of the organic molecule:

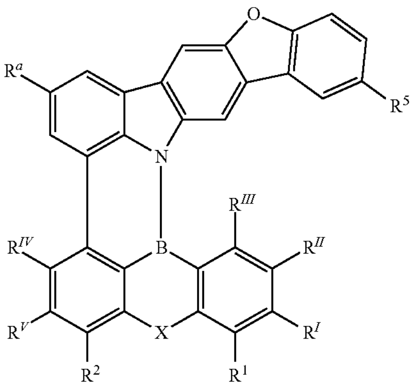

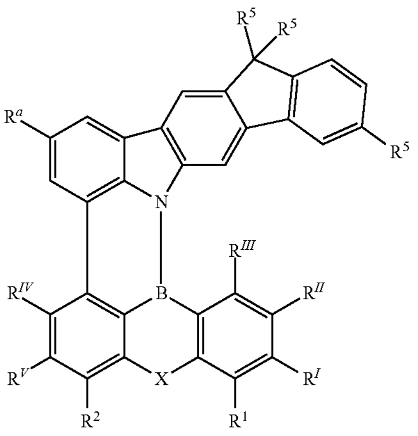

-continued

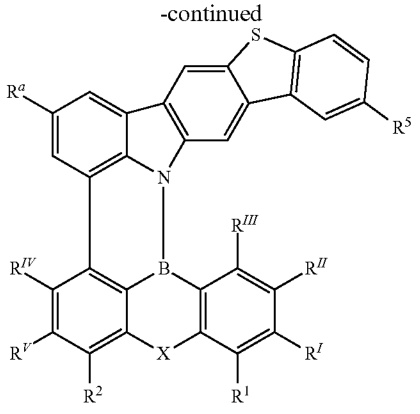

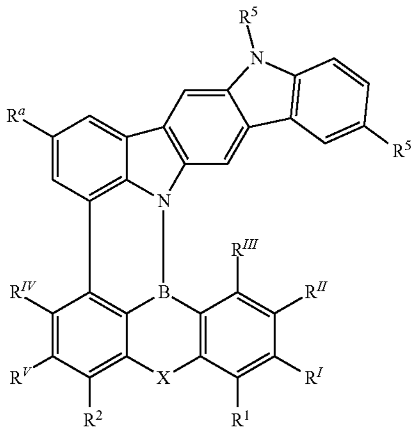

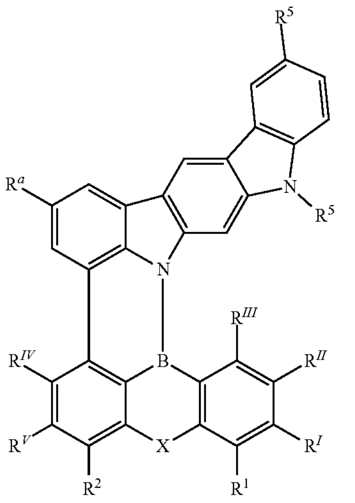

-continued
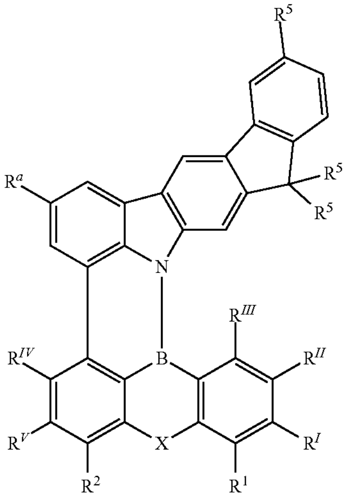
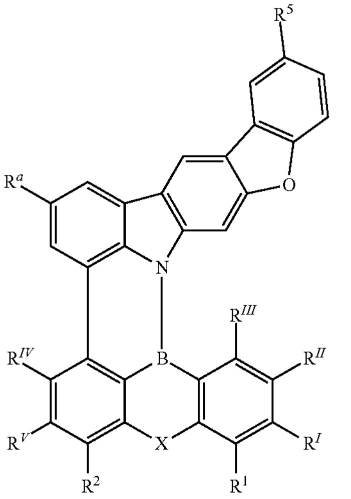
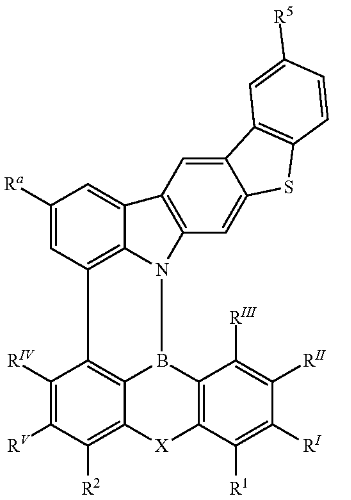
-continued
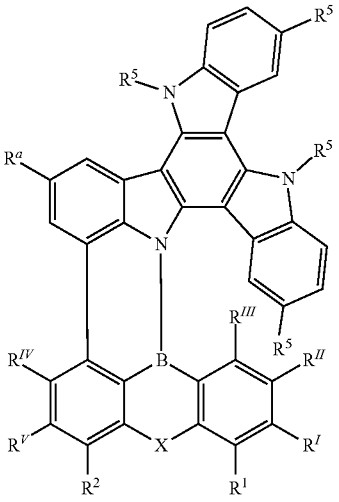
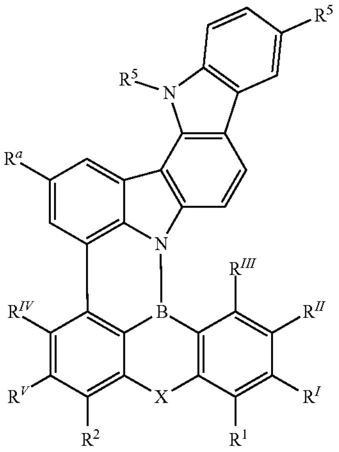
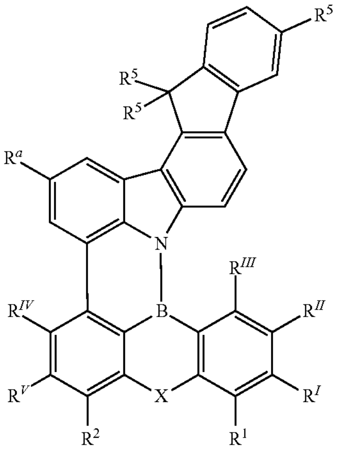

-continued
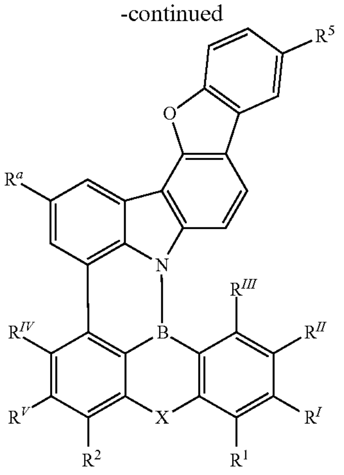
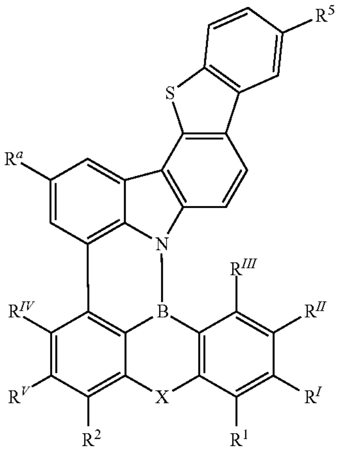
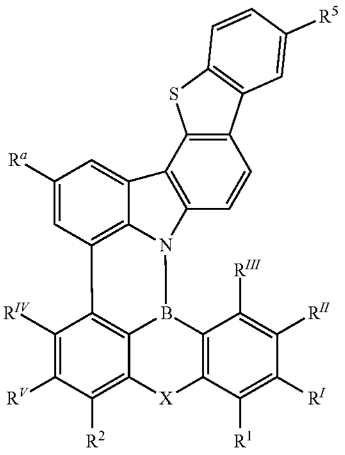
-continued
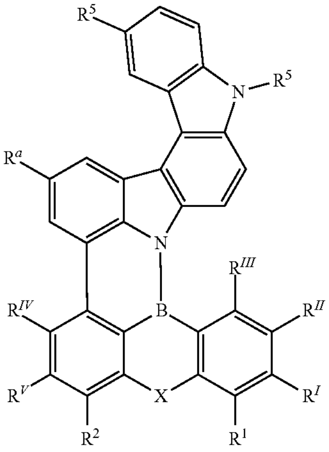
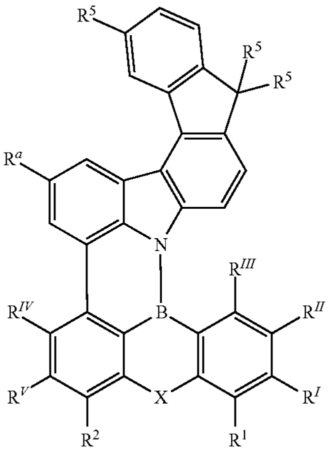
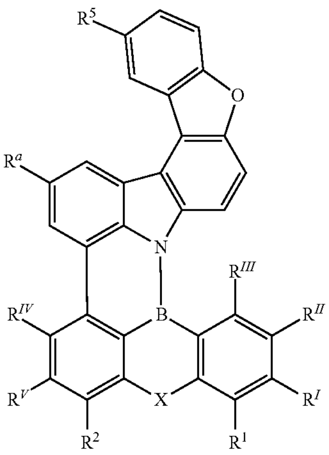

-continued
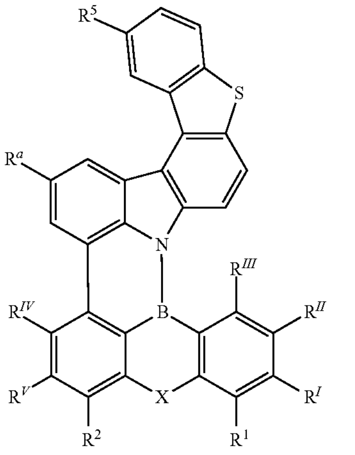
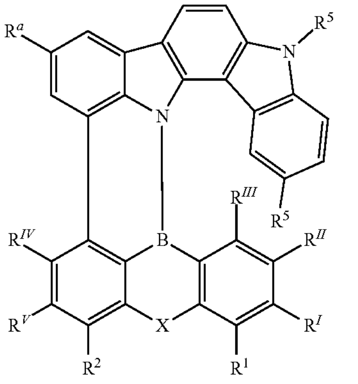
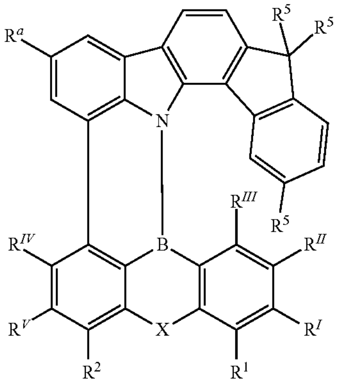
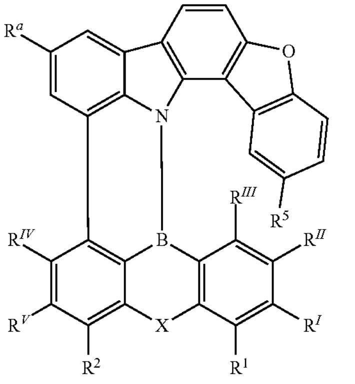
-continued
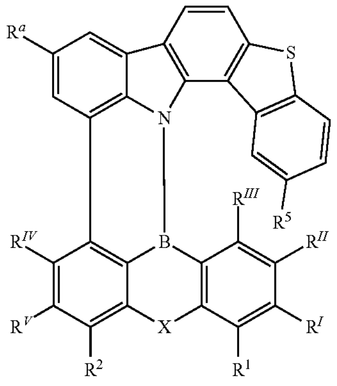
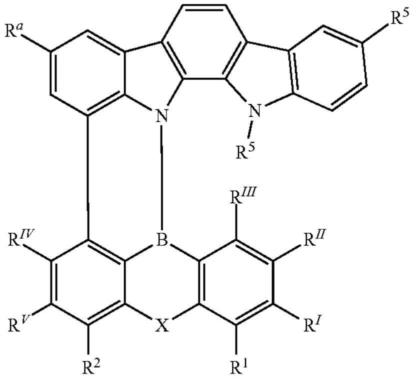
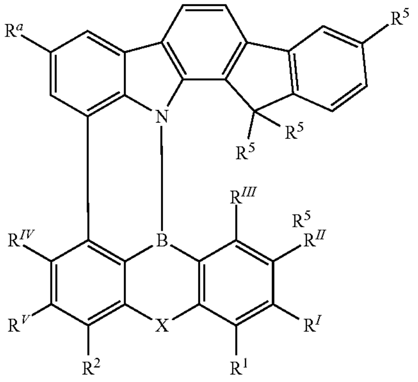
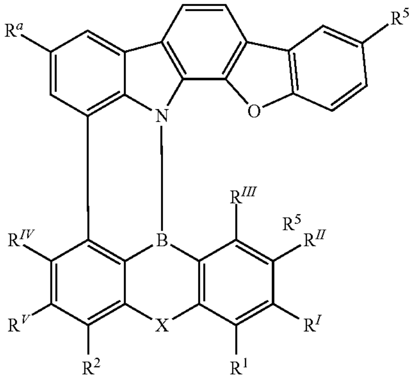

-continued

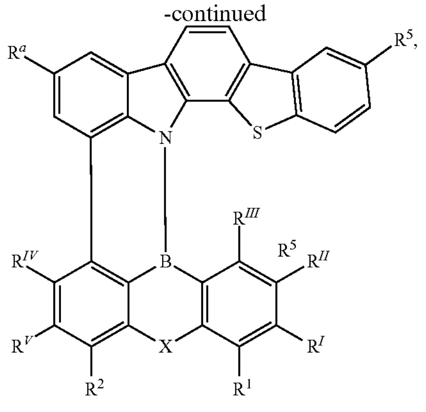

wherein any of the aforementioned definitions apply.

In one embodiment, $R^a$ and $R^5$ is at each occurrence independently from one another selected from the group consisting of hydrogen (H), methyl (Me), i-propyl ($CH(CH_3)_2$) ($^iPr$), t-butyl ($^tBu$), phenyl (Ph), CN, $CF_3$, and diphenylamine ($NPh_2$).

In a preferred embodiment of the invention, the organic molecule includes or consists of a structure of Formula IIIa Formula IIIa

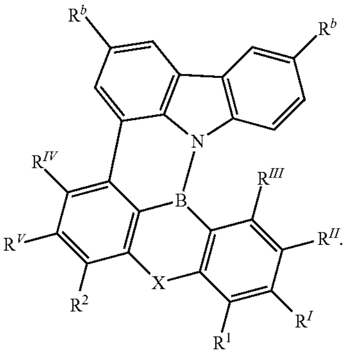

In a preferred embodiment, the organic molecule of the invention includes or consists of a structure of Formula IIIa, with the proviso that, if X is $NR^3$, $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In a preferred embodiment of the invention, the organic molecule includes or consists of a structure selected from the group consisting of Formula IIIa-1 and Formula IIIa-2

Formula IIIa-1

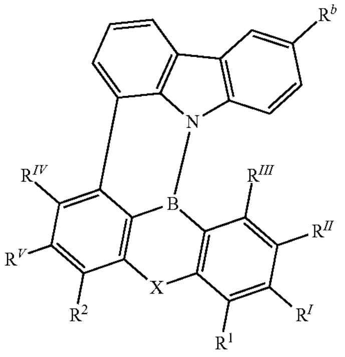

Formula IIIa-2

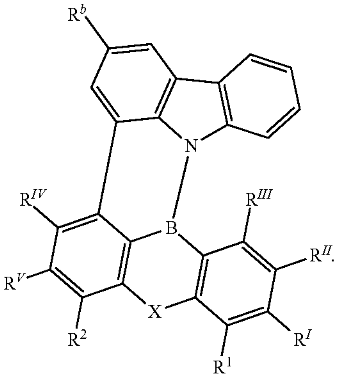

In a preferred embodiment, the organic molecule of the invention includes or consists of a structure of Formula IIIa-1 or IIIa-2, with the proviso that if X is $NR^3$, $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In a preferred embodiment of the invention, the organic molecule includes or consists of a structure of Formula IIIb Formula IIIb

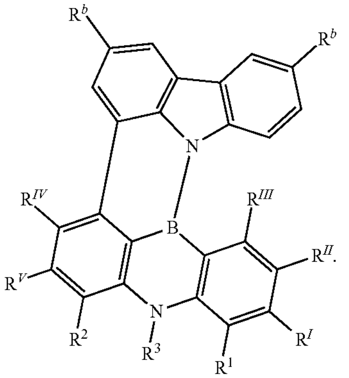

In a preferred embodiment, the organic molecule of the invention includes or consists of a structure of Formula IIIb, wherein $R^V$ is $N(R^5)_2$ or forms a mono- or polycyclic, aliphatic, aromatic, heteroaromatic and/or benzo-fused ring system with one or more substituents $R^2$, $R^3$, $R^5$, and/or $R^{IV}$.

In a preferred embodiment of the invention, the organic molecule includes or consists of a structure selected from the group consisting of Formula IIIb-1 and/or Formula IIIb-2

Formula IIIb-1

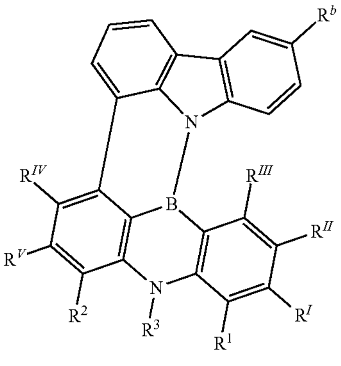

Formula IIIb-2

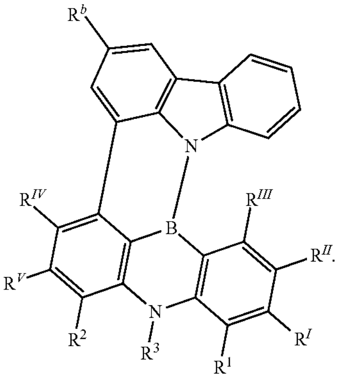

In a preferred embodiment, the organic molecule of the invention includes or consists of a structure of Formula IIIb-1 or IIIb-2, wherein $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In a preferred embodiment of the invention, the organic molecule includes or consists of a structure of Formula IIIc Formula IIIc

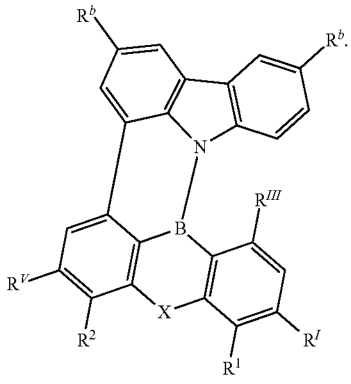

In a preferred embodiment, the organic molecule of the invention includes or consists of a structure of Formula IIIc, with the proviso that if X is $NR^3$, $R^V$ is $N(R^5)_2$ or forms a mono- or polycyclic, aliphatic, aromatic, heteroaromatic and/or benzo-fused ring system with one or more substituents $R^2$, $R^3$, and/or $R^5$.

In a preferred embodiment of the invention, the organic molecule includes or consists of a structure selected from the group consisting of Formula IIIc-1 and Formula IIIc-2

Formula IIIc-1

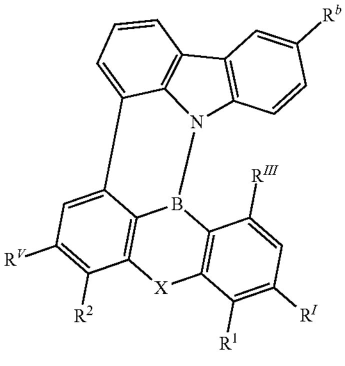

Formula IIIc-2

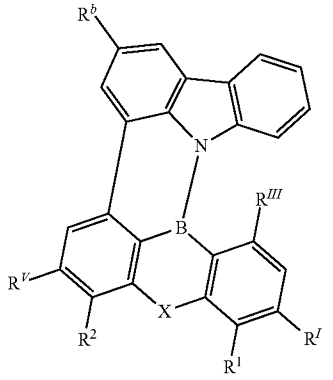

In a preferred embodiment, the organic molecule of the invention includes or consists of a structure of Formula IIIc-1 or IIIc-2, with the proviso that if X is $NR^3$, $R^V$ is $N(R^5)_2$ or forms a mono- or polycyclic, aliphatic, aromatic, heteroaromatic and/or benzo-fused ring system with one or more substituents $R^2$, $R^3$, and/or $R^5$.

In a preferred embodiment of the invention, the organic molecule includes or consists of a structure of Formula IIId Formula IIId

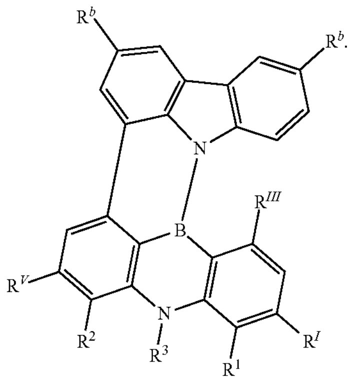

In a preferred embodiment, the organic molecule of the invention includes or consists of a structure of Formula IIId, wherein $R^V$ is $N(R^5)_2$ or forms a mono- or polycyclic, aliphatic, aromatic, heteroaromatic and/or benzo-fused ring system with one or more substituents $R^2$, $R^3$, and/or $R^5$.

In a preferred embodiment of the invention, the organic molecule includes or consists of a structure selected from the group consisting of Formula IIId-1 and Formula IIId-2

Formula IIId-1

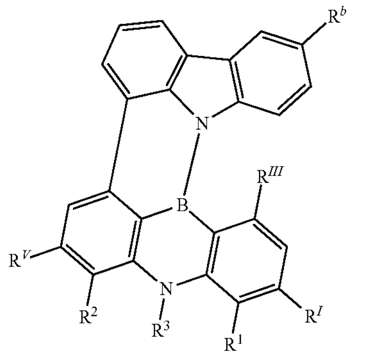

Formula IIId-2

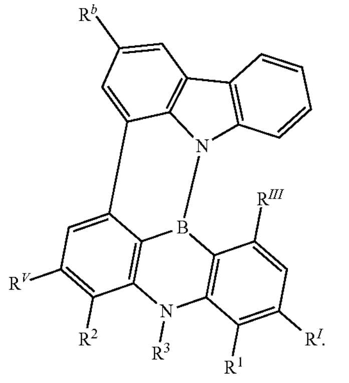

In a preferred embodiment, $R^V$ is selected from the group consisting of $C_2$-$C_{17}$-heteroaryl, which is optionally substituted with one or more substituents $R^5$; and $N(R^5)_2$.

In a preferred embodiment of the invention, the organic molecule includes or consists of a structure of Formula IIIe-0

Formula IIIe-0

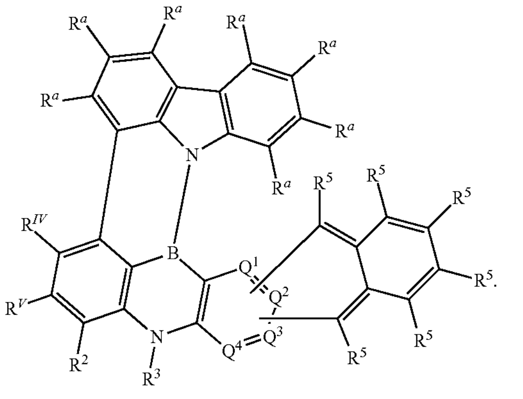

$Q^1$ is selected from the group consisting of C and $CR^{III}$;

$Q^2$ is selected from the group consisting of C and $CR^{II}$;

$Q^3$ is selected from the group consisting of C and $CR^I$;

$Q^4$ is selected from the group consisting of C and $CR^1$;

wherein at least one substituent selected from the group consisting of $Q^2$ and $Q^3$ is C; and exactly one substituent selected from the group consisting of $Q^1$ and $Q^4$ is C (and the other is $CR^{III}$ or $CR^1$), if exactly one substituent (only one and not both) selected from the group consisting of $Q^2$ and $Q^3$ is C.

In one embodiment, the organic molecule of the invention includes or consists of a structure of Formula IIIe-0, wherein $R^V$ is $N(R^5)_2$ or forms a mono- or polycyclic, aliphatic, aromatic, heteroaromatic and/or benzo-fused ring system with one or more substituents $R^2$, $R^3$, $R^5$, and $R^{IV}$.

In one embodiment, the organic molecule of the invention includes or consists of a structure of Formula IIIe-0, wherein $R^V$ forms a mono- or polycyclic, aliphatic, aromatic, heteroaromatic and/or benzo-fused ring system with one or more adjacent substituents selected from among $R^2$, $R^3$, $R^5$, and $R^{IV}$.

In one embodiment, the organic molecule of the invention includes or consists of a structure of Formula IIIe-0, wherein at least one substituent selected from the group consisting of $R^1$, $R^2$, $R^{III}$, $R^{IV}$, and $R^V$ forms a mono- or polycyclic, aliphatic, aromatic, heteroaromatic and/or benzo-fused ring system with one or more adjacent substituents selected from among $R^1$, $R^2$, $R^3$, $R^4$, $R^5$, $R^I$, $R^{II}$, $R^{III}$, $R^{IV}$, and $R^V$.

In one embodiment, the organic molecule of the invention includes or consists of a structure of Formula IIIe-0, wherein $R^3$ is independently from one another selected from the group consisting of:

$C_6$-$C_{18}$-aryl, which is optionally substituted with one or more substituents $R^5$; and $C_2$-$C_{17}$-heteroaryl, which is optionally substituted with one or more substituents $R^5$.

In one embodiment, the organic molecule of the invention includes or consists of a structure of Formula IIIe-0, wherein $R^3$ is independently from one another selected from the group consisting of:

$C_6$-$C_{18}$-aryl, which is optionally substituted with one or more substituents $R^5$.

In one embodiment, the organic light-emitting molecule of the invention includes or consists of a structure of Formula IIIe-0, wherein $Q^4$ is $CR^1$.

In one embodiment, the organic molecule of the invention includes or consists of a structure of Formula IIIe-0, wherein $R^a$ is at each occurrence independently from one another selected from the group consisting of:

hydrogen;

deuterium;

$N(R^5)_2$;

$OR^5$;

$SR^5$;

$Si(R^5)_3$;

$B(OR^5)_2$;

$B(R^5)_2$;

$OSO_2R^5$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P(=O)(R^5)$, SO, $SO_2$, $NR^5$, O, S or $CONR^5$;

$C_1$-$C_{18}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{18}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{18}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{18}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$.

In one embodiment, the organic molecule of the invention includes or consists of a structure of Formula IIIe-0, wherein $R^a$ is at each occurrence independently from one another selected from the group consisting of:

hydrogen;

deuterium;

$C_1$-$C_{18}$-alkyl, which is optionally substituted with one or more substituents $R^5$;

$C_6$-$C_{18}$-aryl, which is optionally substituted with one or more substituents $R^5$; and $C_2$-$C_{17}$-heteroaryl, which is optionally substituted with one or more substituents $R^5$.

In one embodiment, the organic molecule of the invention includes or consists of a structure of Formula IIIe-0, wherein $R^a$ is at each occurrence independently from one another selected from the group consisting of: hydrogen, deuterium, and $C_1$-$C_{18}$-alkyl, which is optionally substituted with one or more substituents $R^5$.

In one embodiment, the organic molecule of the invention includes or consists of a structure of Formula IIIe-0, wherein $R^1$, $R^2$, $R^3$, $R^4$, $R^I$, $R^{II}$, $R^{III}$, $R^{IV}$, and $R^V$ are independently from one another selected from the group consisting of:

hydrogen;

deuterium;

$N(R^5)_2$;

$OR^5$;

$Si(R^5)_3$;

$B(R^5)_2$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$; and $R^5$ is at each occurrence independently from one another selected from the group consisting of: hydrogen, deuterium, $N(R^6)_2$, $OR^6$, $Si(R^6)_3$, $B(R^6)_2$, $CF_3$, CN, F, Br, I, $C_1$-$C_{18}$-alkyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$ wherein groups $R^1$, $R^2$, $R^3$, $R^I$, $R^{II}$, $R^{III}$, $R^{IV}$, $R^5$, and $R^V$ are optionally bonded to each other and form an aryl or heteroaryl ring, which is optionally substituted with one or more $C_1$-$C_5$-alkyl substituents, deuterium, halogen, CN or $CF_3$.

In certain embodiments, the organic molecule of the invention includes or consists of a structure of Formula IIIe-0, wherein $R^1$ is not hydrogen and $R^1$ is not deuterium.

In one embodiment, the organic molecule of the invention includes or consists of a structure of Formula IIIe-0, wherein $R^1$ is selected from the group consisting of:

$N(R^5)_2$, $OR^5$, $Si(R^5)_3$, $B(OR^5)_2$, $B(R^5)_2$, $OSO_2R^5$, $CF_3$, CN, F, Br, I;

$C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^5$; and $C_2$-$C_{57}$-heteroaryl, which is optionally substituted with one or more substituents $R^5$.

The structure of Formula IIIe-0 may refer to the following three structures, namely of Formula IIIe-0a, Formula IIIe and Formula IIIe-0b:

Formula IIIe-0a

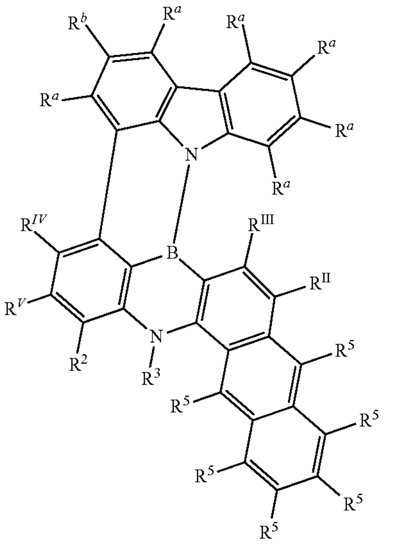

Formula IIIe

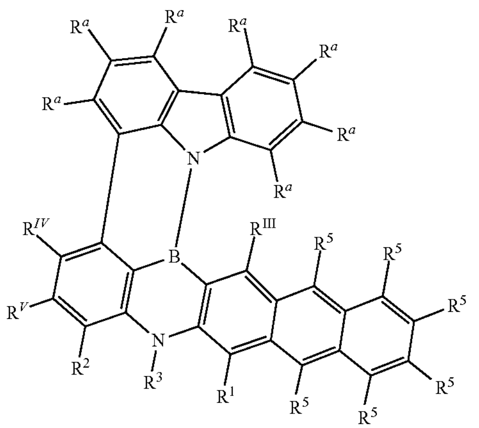

-continued

Formula IIIe-0b

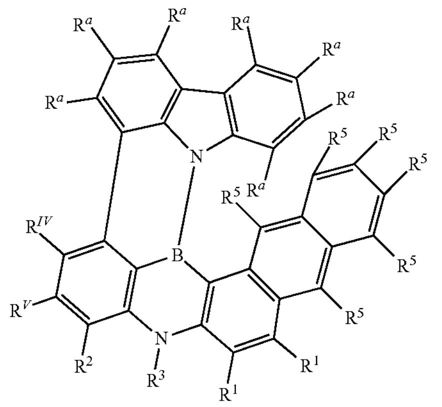

In one embodiment of the invention, the organic molecule includes or consists of a structure of Formula IIIe-0b Formula IIIe-0b

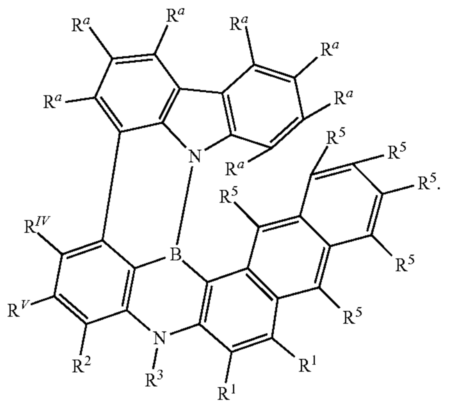

In a preferred embodiment of the invention, the organic molecule includes or consists of a structure of Formula IIIe Formula IIIe

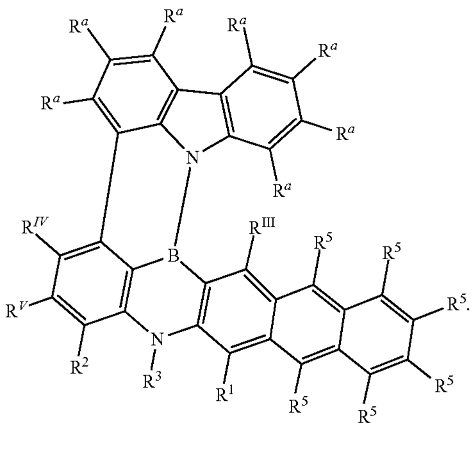

In one embodiment, the organic molecule of the invention includes or consists of a structure of Formula IIIe, wherein $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In one embodiment, the organic molecule of the invention includes or consists of a structure of Formula IIIe, wherein $R^V$ forms a mono- or polycyclic, aliphatic, aromatic, heteroaromatic and/or benzo-fused ring system with one or more adjacent substituents selected from among $R^2$, $R^3$, $R^5$, and $R^{IV}$.

In one embodiment, the organic molecule of the invention includes or consists of a structure of Formula IIIe, wherein at least one substituent selected from the group consisting of $R^1$, $R^2$, $R^{III}$, $R^{IV}$, and $R^V$ forms a mono- or polycyclic, aliphatic, aromatic, heteroaromatic and/or benzo-fused ring system with one or more adjacent substituents selected from among $R^1$, $R^2$, $R^3$, $R^4$, $R^5$, $R^I$, $R^{II}$, $R^{III}$, $R^{IV}$, and $R^V$.

In one embodiment, the organic molecule of the invention includes or consists of a structure of Formula IIIe, wherein $R^3$ is independently from one another selected from the group consisting of:

$C_6$-$C_{18}$-aryl,
which is optionally substituted with one or more substituents $R^5$; and
$C_2$-$C_{17}$-heteroaryl,
which is optionally substituted with one or more substituents $R^5$.

In one embodiment, the organic molecule of the invention includes or consists of a structure of Formula IIIe, wherein $R^3$ is independently from one another selected from the group consisting of:

$C_6$-$C_{18}$-aryl,
which is optionally substituted with one or more substituents $R^5$.

In one embodiment, the organic molecule of the invention includes or consists of a structure of Formula IIIe, wherein $R^a$ is at each occurrence independently from one another selected from the group consisting of:

hydrogen;
deuterium;
$N(R^5)_2$;
$OR^5$;
$SR^5$;
$Si(R^5)_3$;
$B(OR^5)_2$;
$B(R^5)_2$;
$OSO_2R^5$;
$CF_3$;
CN;
halogen;
$C_1$-$C_{18}$-alkyl,
which is optionally substituted with one or more substituents $R^5$ and
wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;
$C_1$-$C_{18}$-alkoxy,
which is optionally substituted with one or more substituents $R^5$ and
wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;
$C_1$-$C_{18}$-thioalkoxy,
which is optionally substituted with one or more substituents $R^5$ and
wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;
$C_2$-$C_{18}$-alkenyl,
which is optionally substituted with one or more substituents $R^5$ and
wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;
$C_2$-$C_{18}$-alkynyl,
which is optionally substituted with one or more substituents $R^5$ and
wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;
$C_6$-$C_{18}$-aryl,
which is optionally substituted with one or more substituents $R^5$; and
$C_2$-$C_{17}$-heteroaryl,
which is optionally substituted with one or more substituents $R^5$.

In one embodiment, the organic molecule of the invention includes or consists of a structure of Formula IIIe, wherein $R^a$ is at each occurrence independently from one another selected from the group consisting of:

hydrogen;
deuterium;
$C_1$-$C_{18}$-alkyl,
which is optionally substituted with one or more substituents $R^5$;
$C_6$-$C_{18}$-aryl,
which is optionally substituted with one or more substituents $R^5$; and
$C_2$-$C_{17}$-heteroaryl,
which is optionally substituted with one or more substituents $R^5$.

In one embodiment, the organic molecule of the invention includes or consists of a structure of Formula IIIe, wherein $R^a$ is at each occurrence independently from one another selected from the group consisting of: hydrogen,
deuterium, and
$C_1$-$C_{18}$-alkyl,
which is optionally substituted with one or more substituents $R^5$.

In one embodiment, the organic molecule of the invention includes or consists of a structure of Formula IIIe, wherein $R^1$, $R^2$, $R^3$, $R^4$, $R^I$, $R^{II}$, $R^{III}$, $R^{IV}$, and $R^V$ are independently from one another selected from the group consisting of:

hydrogen;
deuterium;
$N(R^5)_2$;
$OR^5$;
$Si(R^5)_3$;
$B(R^5)_2$;
$CF_3$;
CN;
halogen;
$C_1$-$C_{18}$-alkyl,
which is optionally substituted with one or more substituents $R^5$ and
wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$; and $R^5$ is at each occurrence independently from one another selected from the group consisting of: hydrogen, deuterium, $N(R^6)_2$, $OR^6$, $Si(R^6)_3$, $B(R^6)_2$, $CF_3$, CN, F, Br, I, $C_1$-$C_{18}$-alkyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, C═$NR^6$, P(═O)($R^6$), SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$ wherein groups $R^1$, $R^2$, $R^3$, $R^I$, $R^{II}$, $R^{III}$, $R^{IV}$, $R^5$, and $R^V$ are optionally bonded to each other and form an aryl or heteroaryl ring, which is optionally substituted with one or more $C_1$-$C_5$-alkyl substituents, deuterium, halogen, CN or $CF_3$.

In a preferred embodiment, the organic molecule of the invention includes or consists of a structure of Formula IIIe, wherein $R^1$ is not hydrogen and is not deuterium.

In a preferred embodiment, the organic molecule of the invention includes or consists of a structure of Formula IIIe, wherein $R^1$ is selected from the group consisting of:

$N(R^5)_2$, $OR^5$, $Si(R^5)_3$, $B(OR^5)_2$, $B(R^5)_2$, $OSO_2R^5$, $CF_3$, CN, F, Br, I;

$C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_6$-$C_{60}$-aryl, which is optionally substituted with one or more substituents $R^5$; and $C_2$-$C_{57}$-heteroaryl, which is optionally substituted with one or more substituents $R^5$.

In a preferred embodiment of the invention, the organic molecule includes or consists of a structure of Formula IIIe-2

Formula IIIe-2

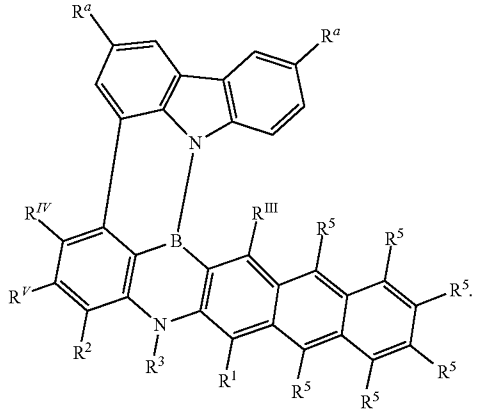

In one embodiment, the organic molecule of the invention includes or consists of a structure of Formula IIIe-2, wherein $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In one embodiment, the organic molecule of the invention includes or consists of a structure of Formula IIIe-2, wherein $R^V$ forms a mono- or polycyclic, aliphatic, aromatic, heteroaromatic and/or benzo-fused ring system with one or more adjacent substituents selected from among $R^2$, $R^3$, $R^5$, and $R^{IV}$.

In one embodiment, the organic molecule of the invention includes or consists of a structure of Formula IIIe-2, wherein at least one substituent selected from the group consisting of $R^1$, $R^2$, $R^{III}$, $R^{IV}$, and $R^V$ forms a mono- or polycyclic, aliphatic, aromatic, heteroaromatic and/or benzo-fused ring system with one or more adjacent substituents selected from among $R^1$, $R^2$, $R^3$, $R^4$, $R^5$, $R^I$, $R^{II}$, $R^{III}$, $R^{IV}$, and $R^V$.

In one embodiment, the organic molecule of the invention includes or consists of a structure of Formula IIIe-2, wherein $R^3$ is independently from one another selected from the group consisting of:

$C_6$-$C_{18}$-aryl, which is optionally substituted with one or more substituents $R^5$; and $C_2$-$C_{17}$-heteroaryl, which is optionally substituted with one or more substituents $R^5$.

In one embodiment, the organic molecule of the invention includes or consists of a structure of Formula IIIe-2, wherein $R^3$ is independently from one another selected from the group consisting of:

$C_6$-$C_{18}$-aryl, which is optionally substituted with one or more substituents $R^5$.

In one embodiment, the organic molecule of the invention includes or consists of a structure of Formula IIIe-2, wherein $R^a$ is at each occurrence independently from one another selected from the group consisting of:

hydrogen;

deuterium;

$N(R^5)_2$;

$OR^5$;

$SR^5$;

$Si(R^5)_3$;

$B(OR^5)_2$;

$B(R^5)_2$;

$OSO_2R^5$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{18}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{18}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{18}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{18}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$.

In one embodiment, the organic molecule of the invention includes or consists of a structure of Formula IIIe-2, wherein $R^a$ is at each occurrence independently from one another selected from the group consisting of:

hydrogen;

deuterium;

$C_1$-$C_{18}$-alkyl, which is optionally substituted with one or more substituents $R^5$;

$C_6$-$C_{18}$-aryl, which is optionally substituted with one or more substituents $R^5$; and $C_2$-$C_{17}$-heteroaryl, which is optionally substituted with one or more substituents $R^5$.

In one embodiment, the organic molecule of the invention includes or consists of a structure of Formula IIIe-2, wherein $R^a$ is at each occurrence independently from one another selected from the group consisting of: hydrogen, deuterium, and $C_1$-$C_{18}$-alkyl, which is optionally substituted with one or more substituents $R^5$.

In one embodiment, the organic molecule of the invention includes or consists of a structure of Formula IIIe-2, wherein $R^1$, $R^2$, $R^3$, $R^4$, $R^I$, $R^{II}$, $R^{III}$, $R^{IV}$, and $R^V$ are independently from one another selected from the group consisting of:

hydrogen;

deuterium;

$N(R^5)_2$;

$OR^5$;

$Si(R^5)_3$;

$B(R^5)_2$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$; and $R^5$ is at each occurrence independently from one another selected from the group consisting of:

hydrogen, deuterium, $N(R^6)_2$, $OR^6$, $Si(R^6)_3$, $B(R^6)_2$, $CF_3$, CN, F, Br, I;

$C_1$-$C_{18}$-alkyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$ wherein groups $R^1$, $R^2$, $R^3$, $R^I$, $R^{II}$, $R^{III}$, $R^{IV}$, $R^5$, and $R^V$ are optionally bonded to each other and form an aryl or heteroaryl ring, which is optionally substituted with one or more $C_1$-$C_5$-alkyl substituents, deuterium, halogen, CN or $CF_3$.

In a preferred embodiment of the invention, the organic molecule includes or consists of a structure of Formula IIIe-3

Formula IIIe-3

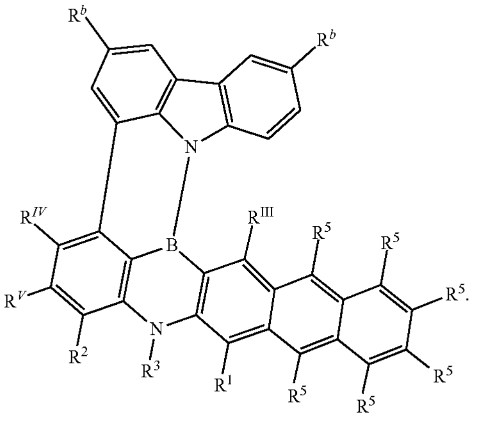

In a preferred embodiment of the invention, the organic molecule includes or consists of a structure of Formula IIIe-4

Formula IIIe-4

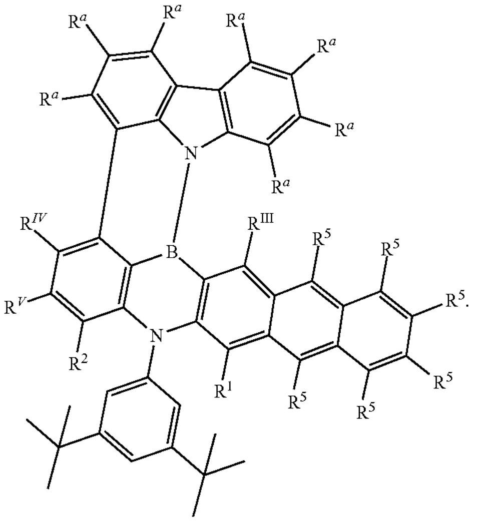

In one embodiment, the organic molecule of the invention includes or consists of a structure of Formula IIIe-4, wherein $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In one embodiment, the organic molecule of the invention includes or consists of a structure of Formula IIIe-4, wherein $R^V$ forms a mono- or polycyclic, aliphatic, aromatic, heteroaromatic and/or benzo-fused ring system with one or more adjacent substituents selected from among $R^2$, $R^3$, $R^5$, and $R^{IV}$.

In one embodiment, the organic molecule of the invention includes or consists of a structure of Formula IIIe-4, wherein at least one substituent selected from the group consisting of $R^1$, $R^2$, $R^{III}$, $R^{IV}$, and $R^V$ forms a mono- or polycyclic, aliphatic, aromatic, heteroaromatic and/or benzo-fused ring system with one or more adjacent substituents selected from among $R^1$, $R^2$, $R^3$, $R^4$, $R^5$, $R^I$, $R^{II}$, $R^{III}$, $R^{IV}$, and $R^V$.

In one embodiment, the organic molecule of the invention includes or consists of a structure of Formula IIIe-4, wherein $R^3$ is independently from one another selected from the group consisting of:

$C_6$-$C_{18}$-aryl, which is optionally substituted with one or more substituents $R^5$; and $C_2$-$C_{17}$-heteroaryl, which is optionally substituted with one or more substituents $R^5$.

In one embodiment, the organic molecule of the invention includes or consists of a structure of Formula IIIe-4, wherein $R^3$ is independently from one another selected from the group consisting of:

$C_6$-$C_{18}$-aryl, which is optionally substituted with one or more substituents $R^5$.

In one embodiment, the organic molecule of the invention includes or consists of a structure of Formula IIIe-4, wherein $R^a$ is at each occurrence independently from one another selected from the group consisting of:

hydrogen;

deuterium;

$N(R^5)_2$;

$OR^5$;

$SR^5$;

$Si(R^5)_3$;

$B(OR^5)_2$;

$B(R^5)_2$;

$OSO_2R^5$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{18}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{18}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{18}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{18}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C═NR^5$, $P(═O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$.

In one embodiment, the organic molecule of the invention includes or consists of a structure of Formula IIIe-4, wherein $R^a$ is at each occurrence independently from one another selected from the group consisting of:

hydrogen;

deuterium;

$C_1$-$C_{18}$-alkyl, which is optionally substituted with one or more substituents $R^5$;

$C_6$-$C_{18}$-aryl, which is optionally substituted with one or more substituents $R^5$; and $C_2$-$C_{17}$-heteroaryl, which is optionally substituted with one or more substituents $R^5$.

In one embodiment, the organic molecule of the invention includes or consists of a structure of Formula IIIe-4, wherein $R^a$ is at each occurrence independently from one another selected from the group consisting of: hydrogen, deuterium, and $C_1$-$C_{18}$-alkyl, which is optionally substituted with one or more substituents $R^5$.

In one embodiment, the organic molecule of the invention includes or consists of a structure of Formula IIIe-4, wherein $R^1$, $R^2$, $R^3$, $R^4$, $R^I$, $R^{II}$, $R^{III}$, $R^{IV}$, and $R^V$ are independently from one another selected from the group consisting of:

hydrogen;

deuterium;

$N(R^5)_2$;

$OR^5$;

$Si(R^5)_3$;

$B(R^5)_2$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C═CR^5$, C≡C, $Si(R^5)_2$, $Ge(R^5)_2$, $Sn(R^5)_2$, C═O, C═S, C═Se, $C═NR^5$, $P(═O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$; and $R^5$ is at each occurrence independently from one another selected from the group consisting of: hydrogen, deuterium, $N(R^6)_2$, $OR^6$, $Si(R^6)_3$, $B(R^6)_2$, $CF_3$, CN, F, Br, I, $C_1$-$C_{18}$-alkyl, which is optionally substituted with one or more substituents $R^6$ and wherein one or more non-adjacent $CH_2$-groups are optionally substituted by $R^6C═CR^6$, C≡C, $Si(R^6)_2$, $Ge(R^6)_2$, $Sn(R^6)_2$, C═O, C═S, C═Se, $C═NR^6$, $P(═O)(R^6)$, SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$ wherein groups $R^1$, $R^2$, $R^3$, $R^I$, $R^{II}$, $R^{III}$, $R^{IV}$, $R^5$, and $R^V$ are optionally bonded to each other and form an aryl or heteroaryl ring, which is optionally substituted with one or more $C_1$-$C_5$-alkyl substituents, deuterium, halogen, CN or $CF_3$.

In preferred embodiments, at least one substituent selected from the group of $R^1$, $R^2$, $R^3$, $R^4$, $R^I$, $R^{II}$, $R^{III}$, $R^{IV}$ and $R^V$ is different from hydrogen.

The present invention also provides organic molecules in the form of an oligomer for the use as an emitter in an optoelectronic device. The oligomer includes or consists of a plurality (i.e. 2, 3, 4, 5, or 6) of units represented by the Formula IV Formula IV

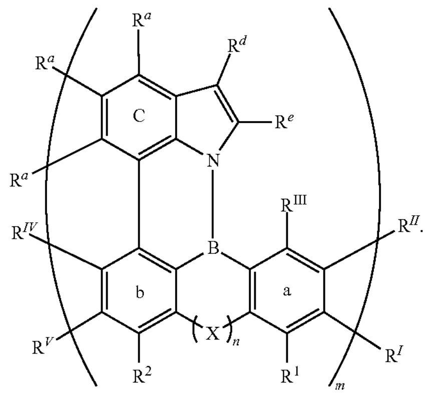

The oligomer is a dimer to a hexamer (m=2, 3, 4, 5, or 6), in particular a dimer to trimer (m=2 or 3), or preferably a dimer (m=2). The oligomer may be in a form having a plurality of the units shown as Formula IV, or may be in a form in which a plurality of the units shown as Formula IV are linked via a linking group selected from the group consisting of a single bond, an alkylene group having 1 to 3 carbon atoms, a phenylene group, a naphthylene group, an anthracene group, a pyrene group, a pyridine group, a pyrimidine group, and a triazine group, or may be in a form in which a plurality of the units are linked such that ring a and/or ring b contained in the unit according to Formula I-AB Formula I-AB

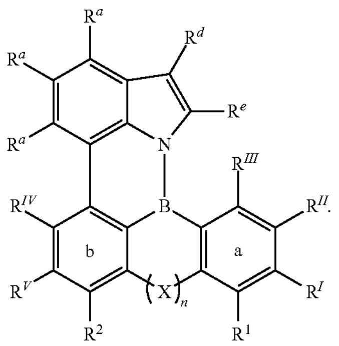

is shared by at least one other adjacent unit of the oligomer, or may be in a form in which units of the oligomer are linked such that ring a and/or ring b of a unit is fused with ring a and/or ring b of an adjacent unit of the oligomer;

may be in a form in which a plurality of the units are linked such that ring a and/or ring b and/or ring c contained in the unit according to Formula I-ABC Formula I-ABC

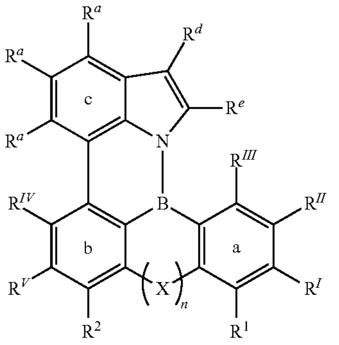

is shared by at least one other adjacent unit of the oligomer, or may be in a form in which units of the oligomer are linked such that ring a and/or ring b and/or ring c of a unit is fused with ring a and/or ring b and/or ring c of an adjacent unit of the oligomer, wherein if ring b and ring c of one unit of the oligomer is shared by ring b and ring c of an adjacent oligomer, the direct bond between ring b and ring c may be also shared, as shown in the following exemplary structure:

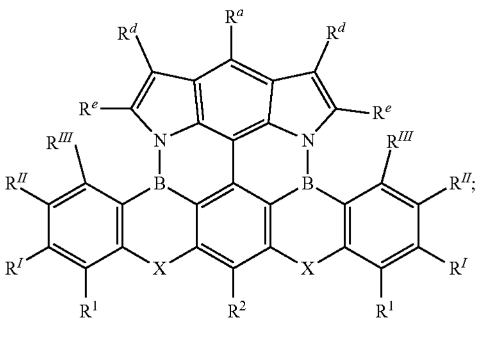

and wherein any substituent $R^a$, $R^d$, $R^e$, $R^{IV}$, $R^V$, $R^2$, $R^1$, $R^I$, $R^{II}$, $R^{III}$, $R^3$ or $R^4$ of a unit shown in Formula IV may be bonded to any substituent $R^a$, $R^d$, $R^e$, $R^{IV}$, $R^V$, $R^2$, $R^1$, $R^I$, $R^{II}$, $R^{III}$, $R^3$ or $R^4$ of an adjacent unit to form a direct bond or an aryl or heteroaryl ring by fusing, which is optionally substituted with one or more $C_1$-$C_5$-alkyl substituents, Ph, deuterium, halogen, CN or $CF_3$, and wherein two adjacent rings may share a bond. Below different examples are shown an such structures:

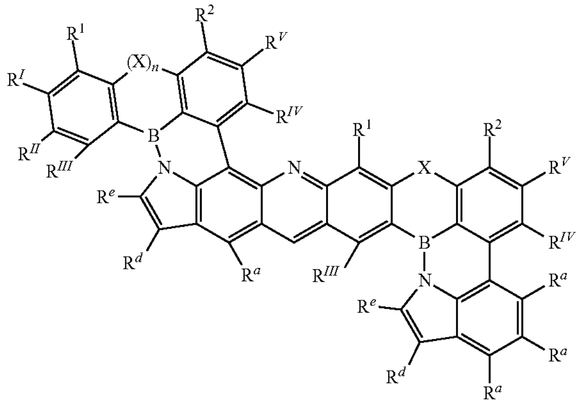

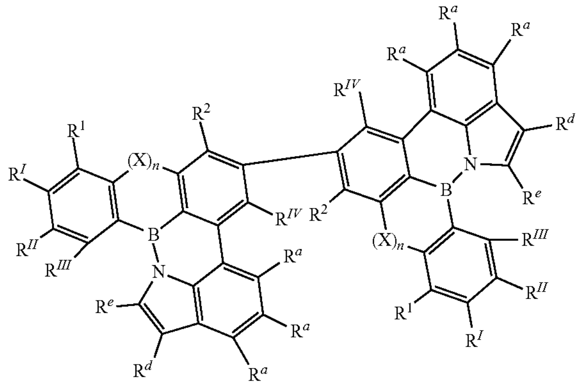

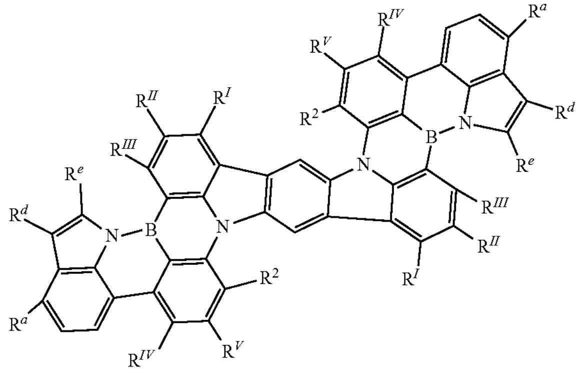

-continued
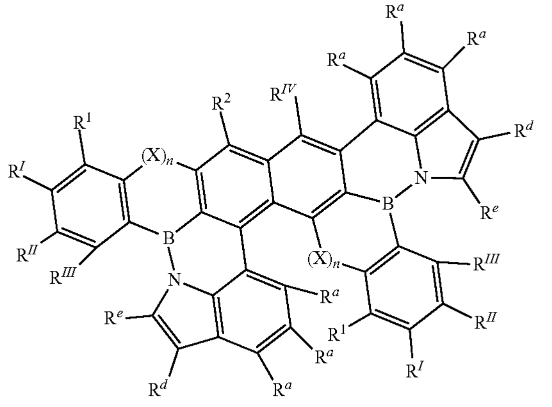
-continued
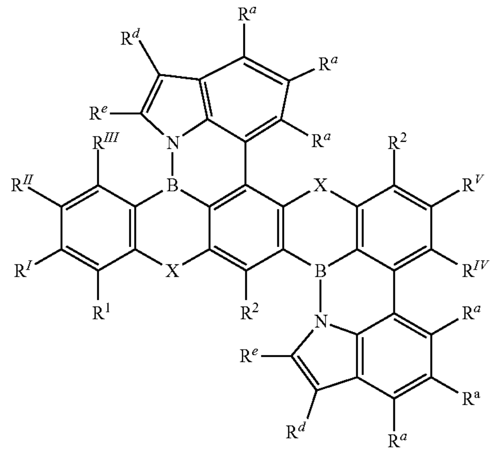
In some embodiments of the oligomer, a part of the unit shown in Formula IV (ring a and/or b and/or ring c) is bonded so as to be shared by an adjacent unit, as shown in the following exemplary structures:
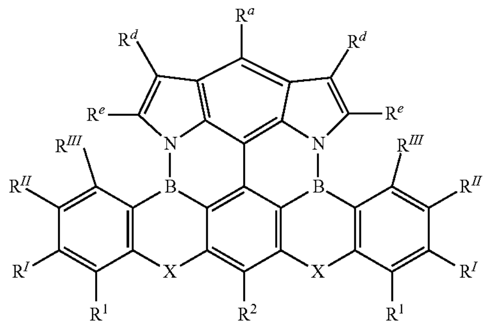
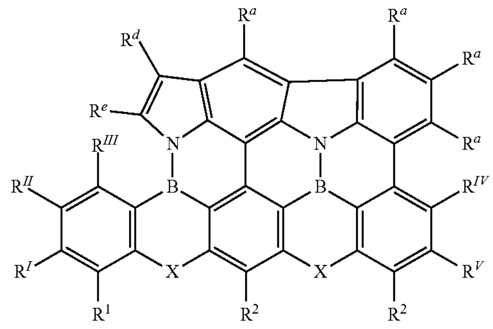
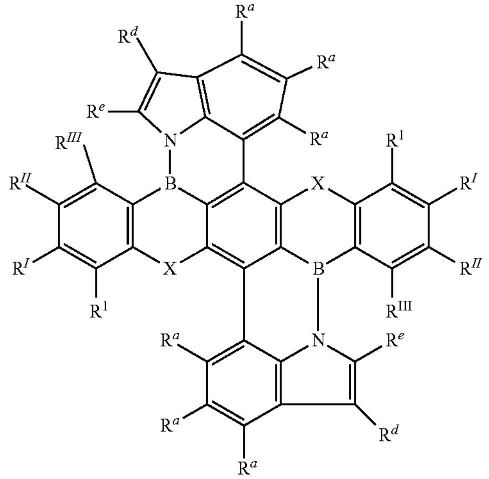
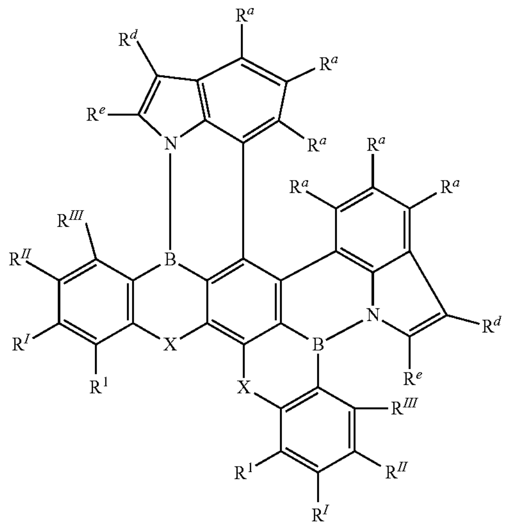

-continued
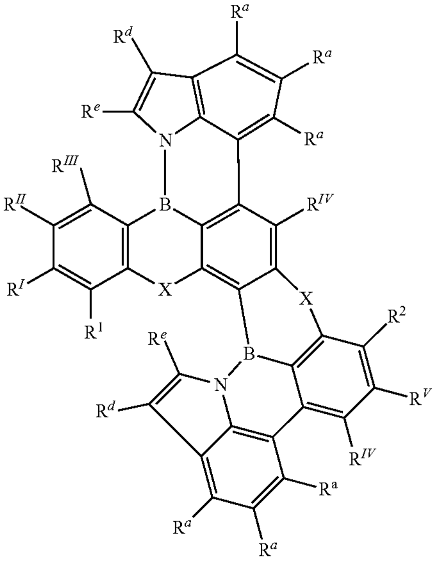
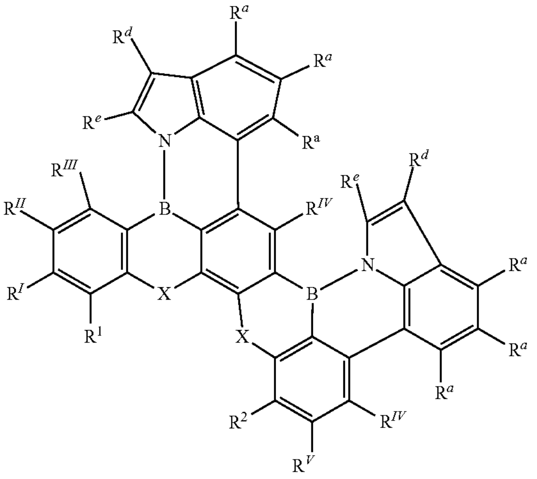
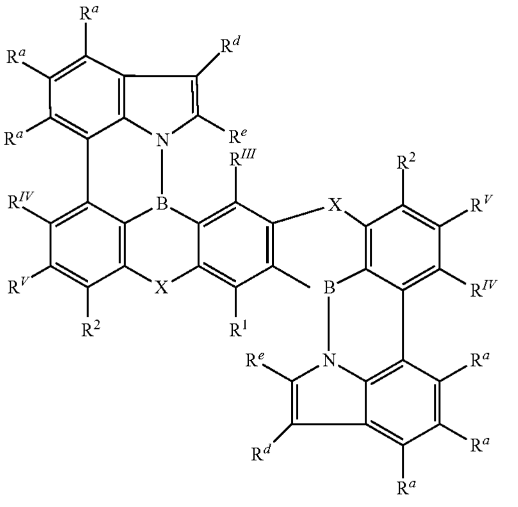
-continued
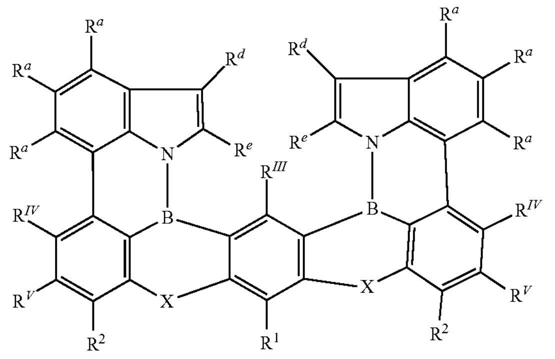
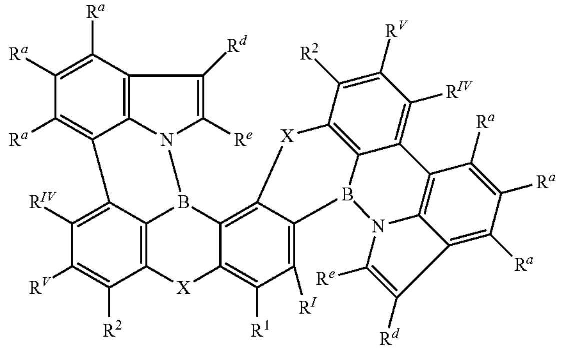
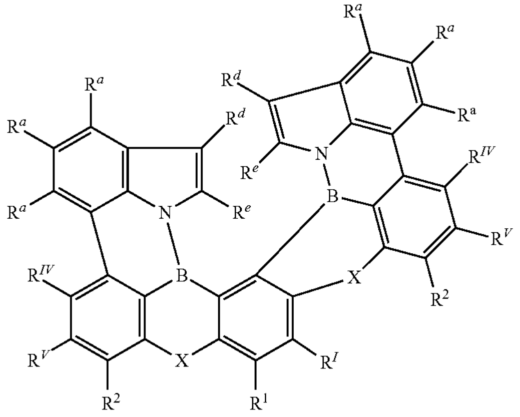
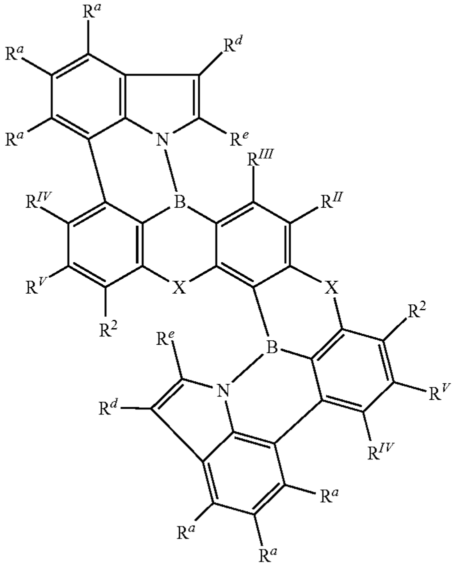

-continued
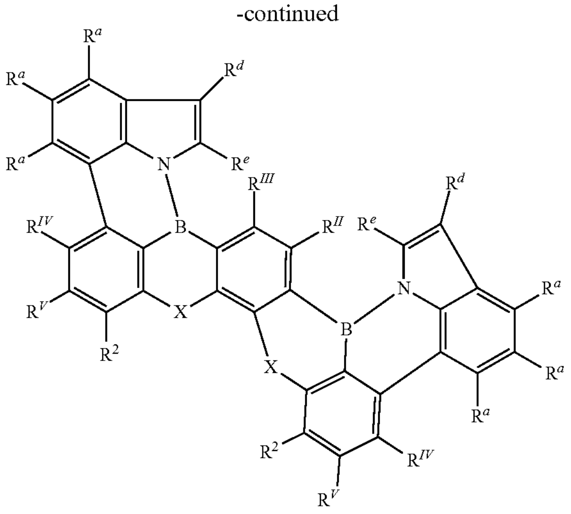
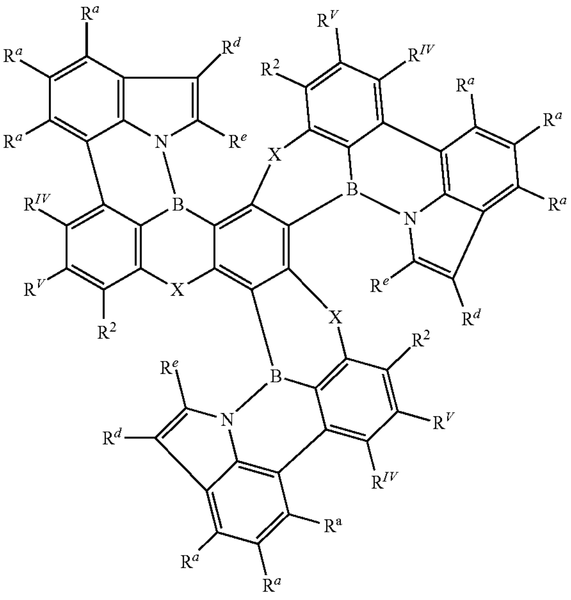
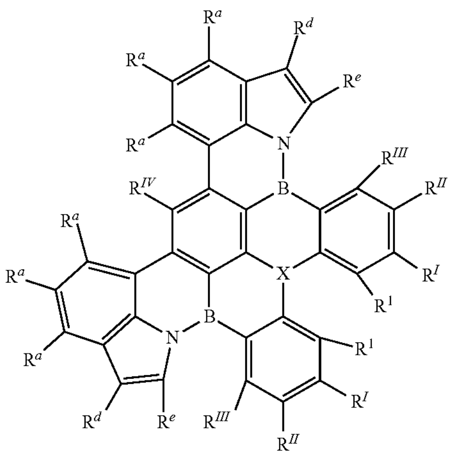
-continued
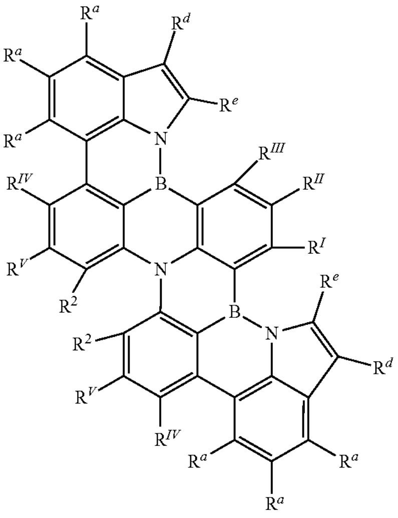
Additional examples for oligomers in the form of dimers (m=2) according to the invention:
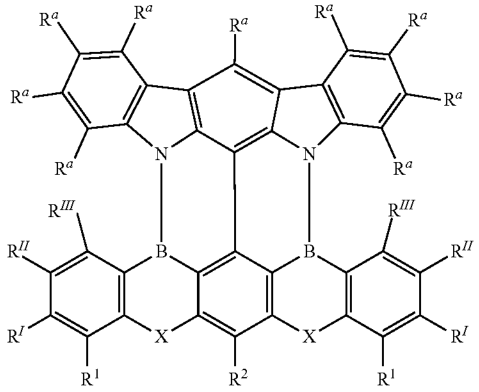
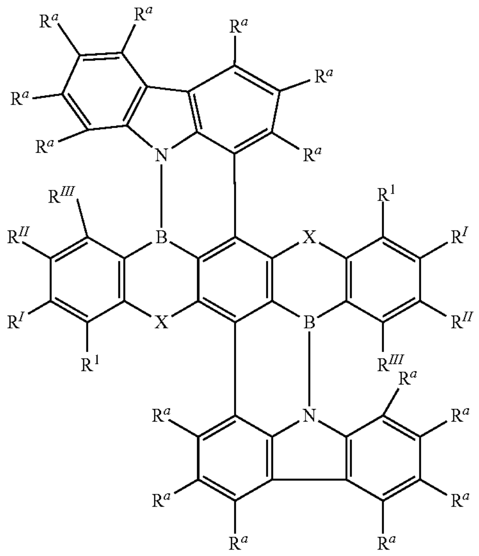

-continued
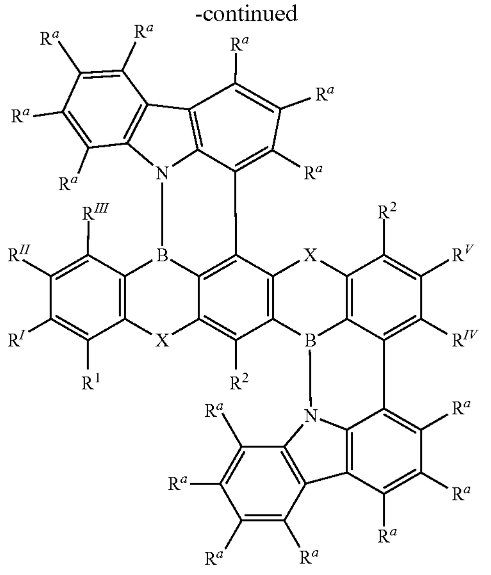
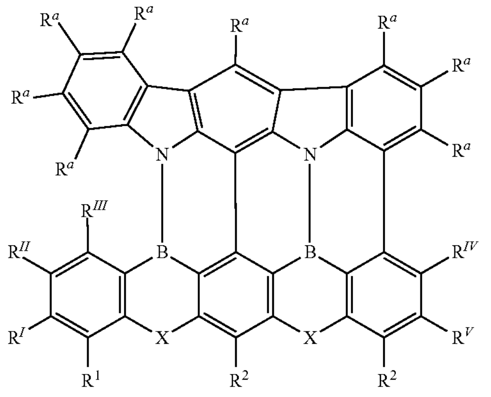
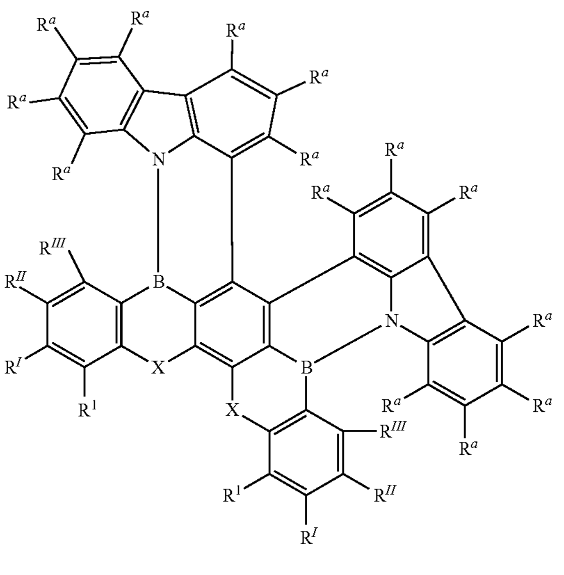
-continued
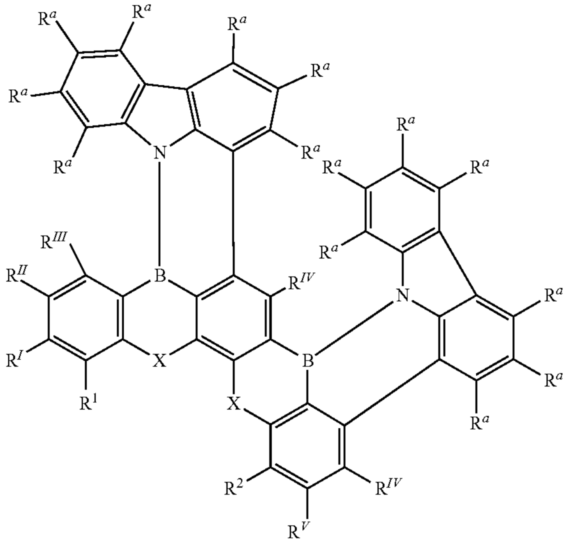
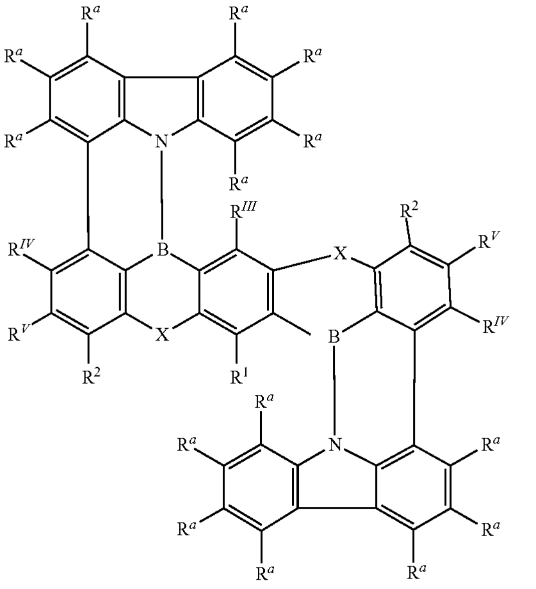
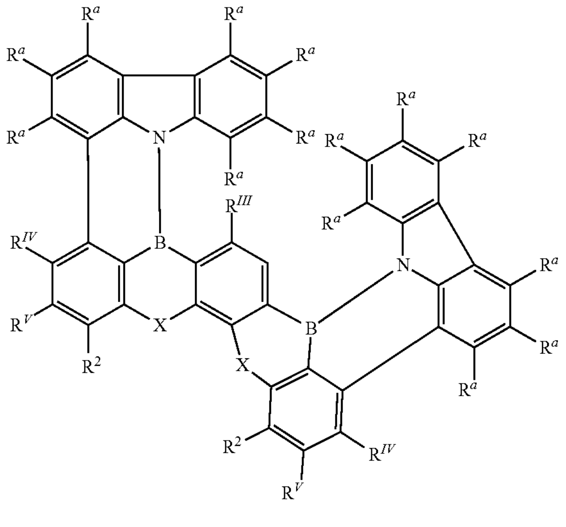

-continued
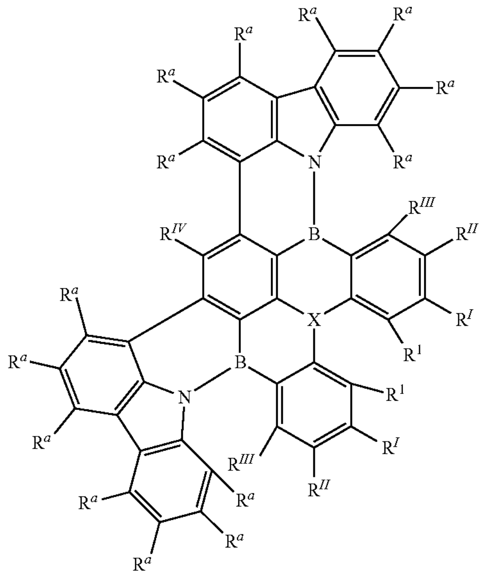
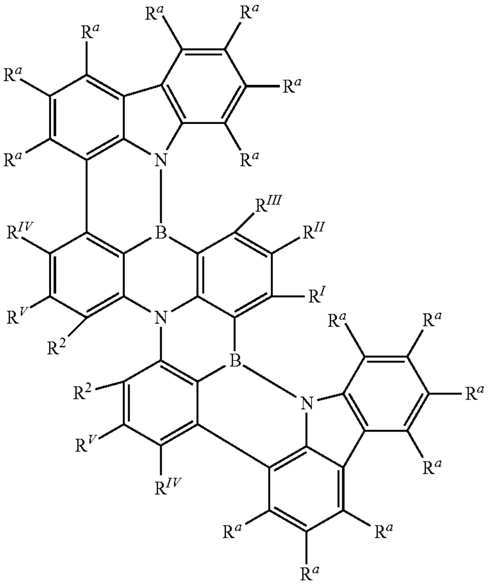
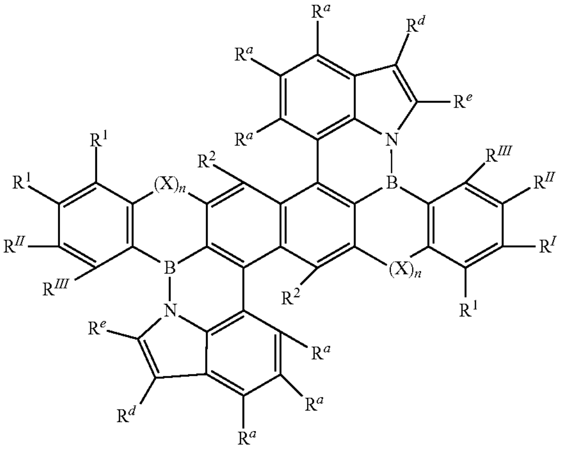
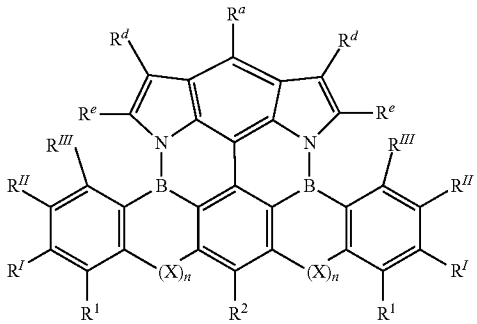
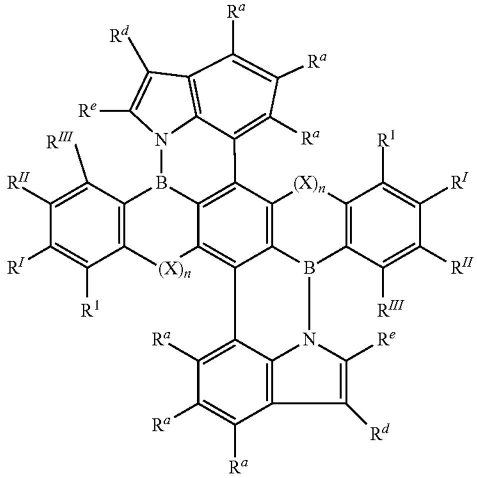
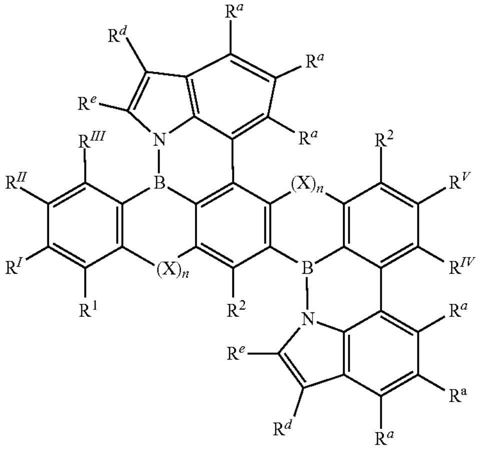
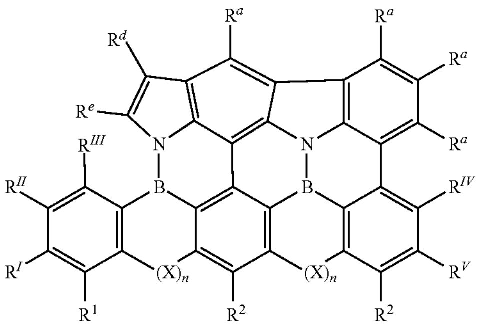
In one embodiment of the invention, the oligomer includes or consists of a structure selected from the following group:

-continued
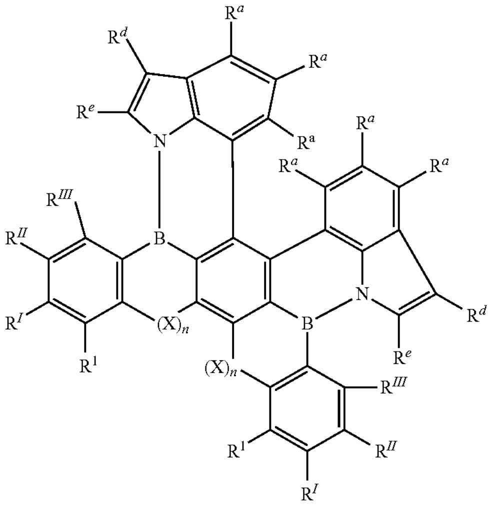
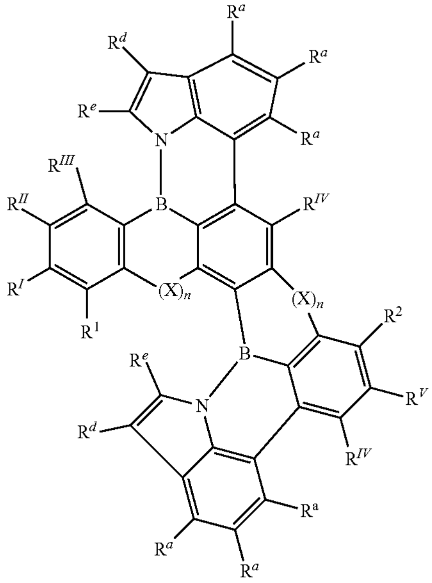
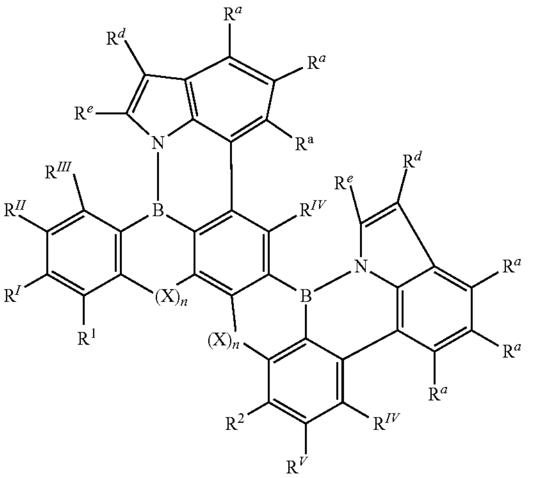
-continued
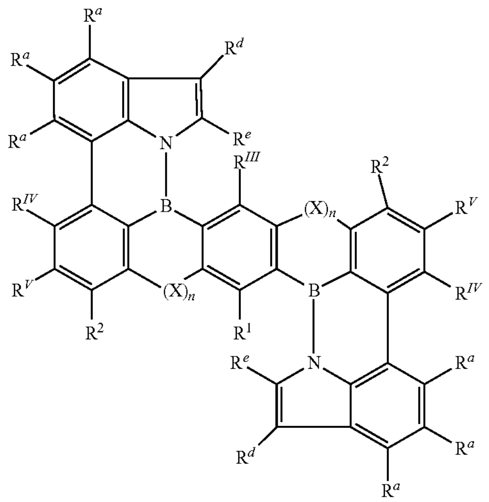
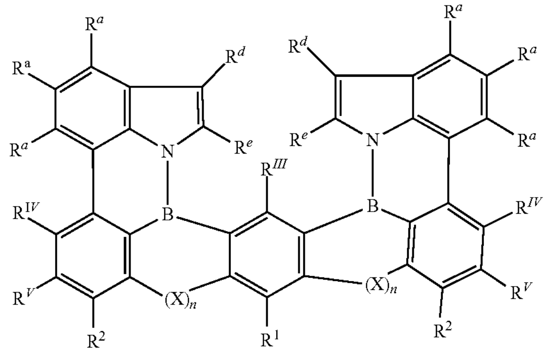
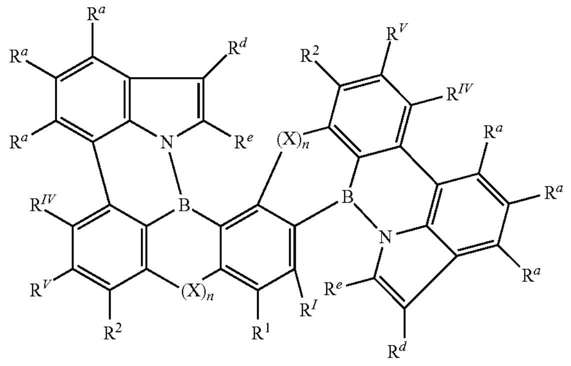
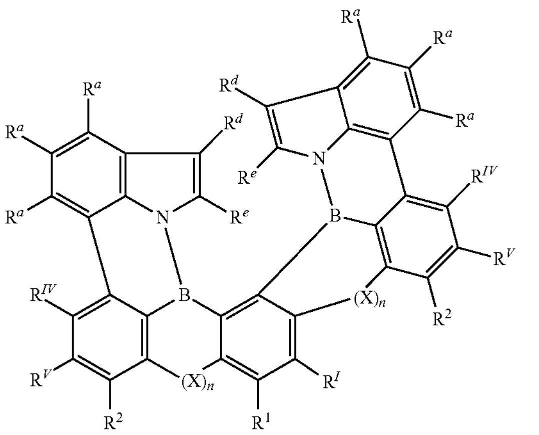

-continued
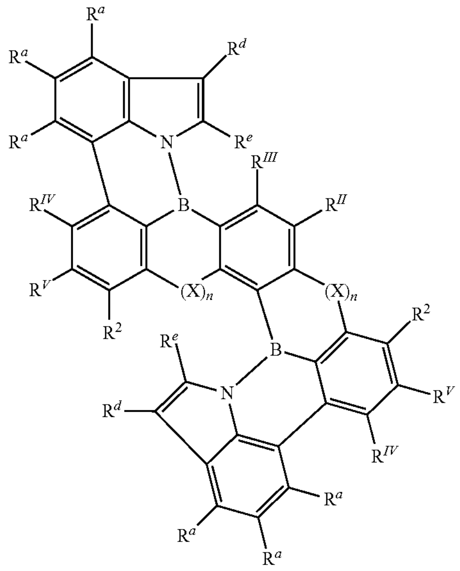
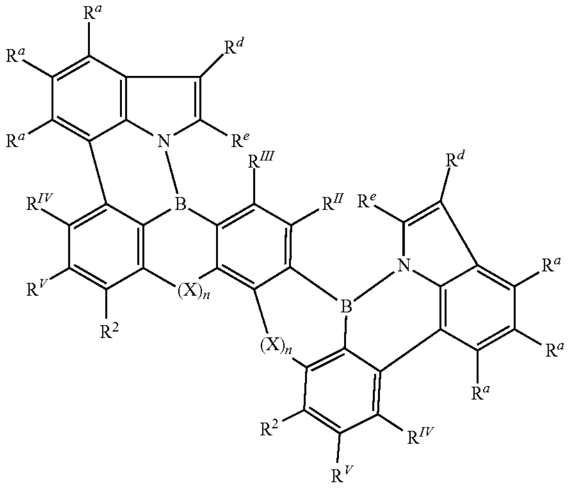
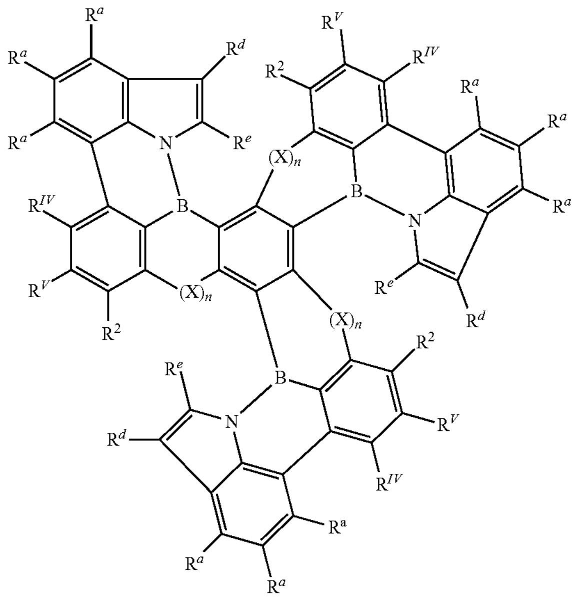
-continued
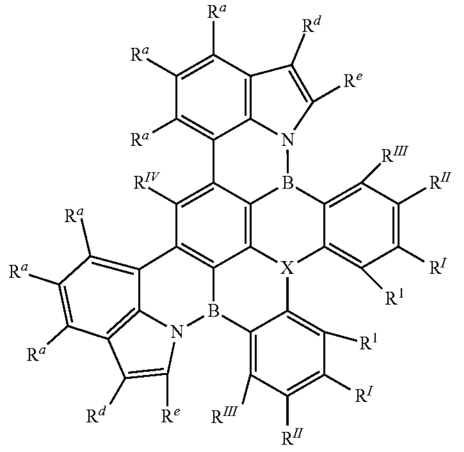
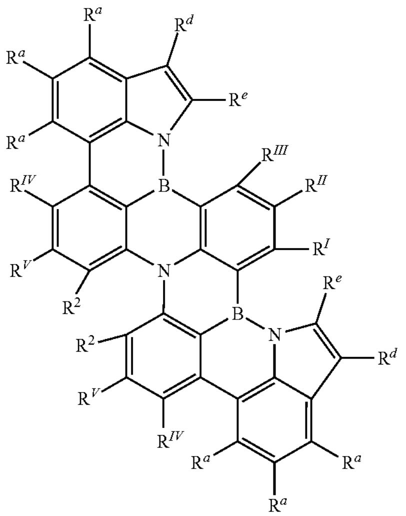
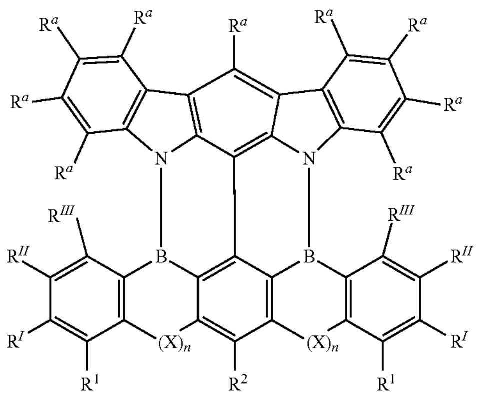

-continued
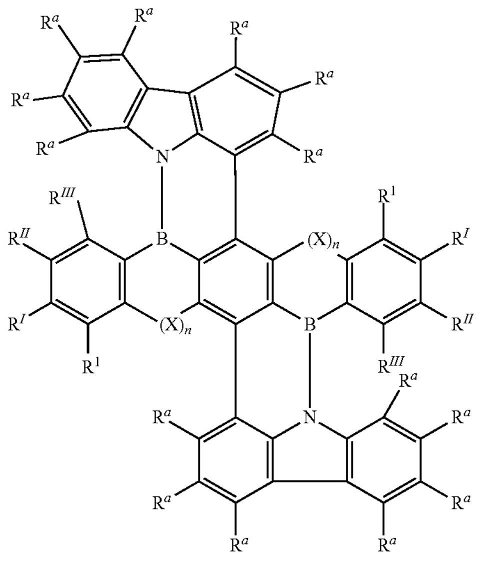
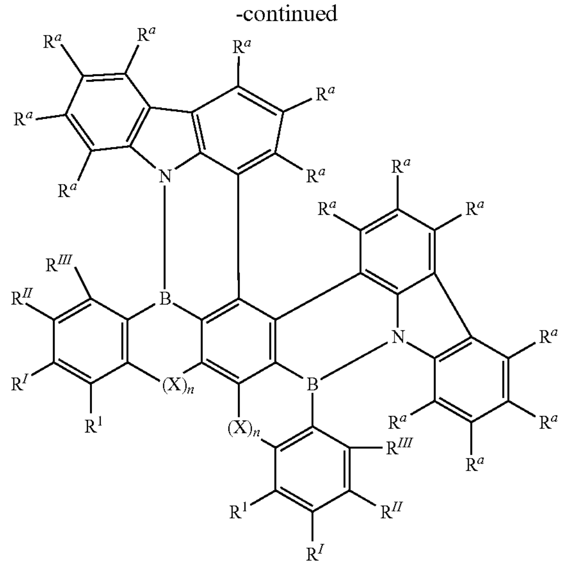
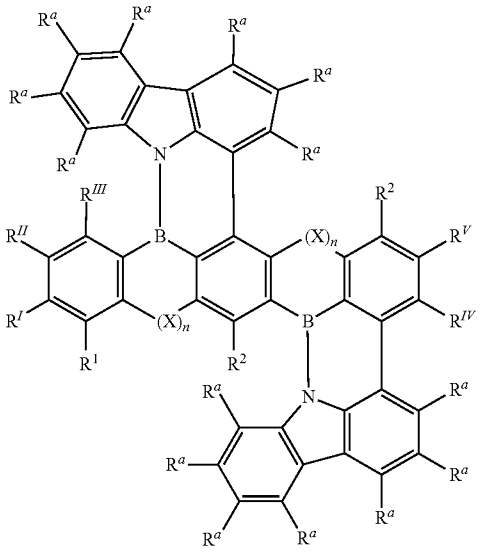
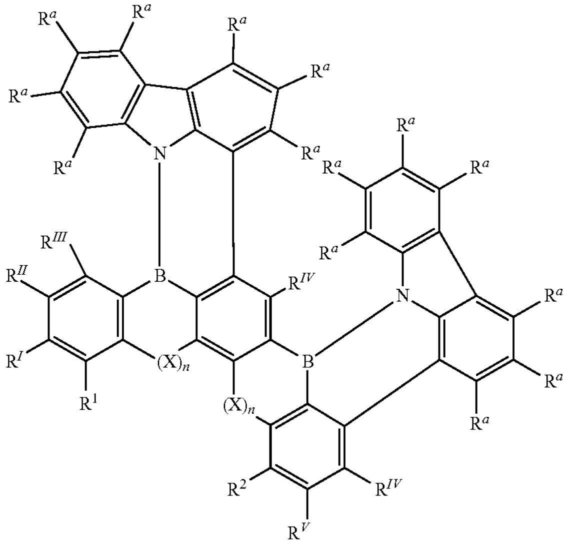
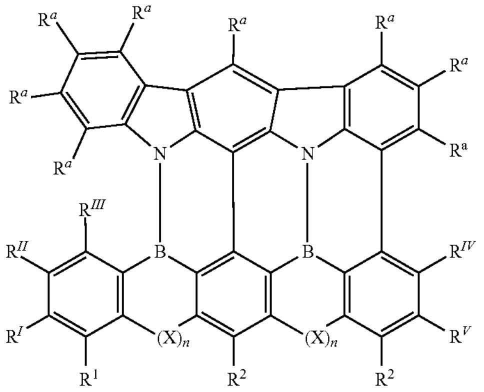
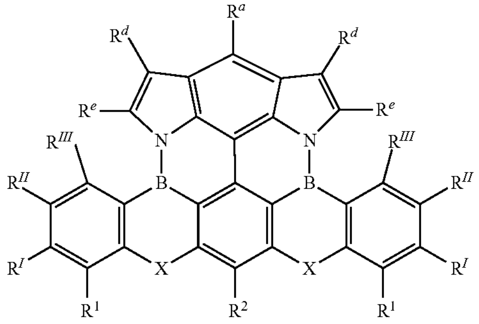

-continued
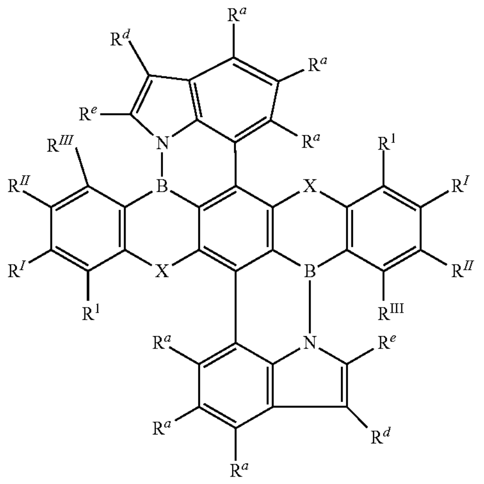
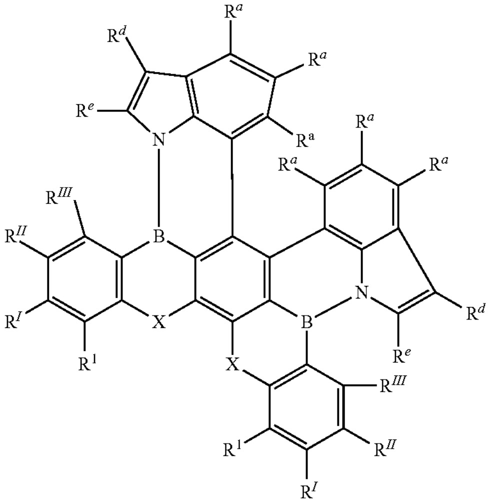
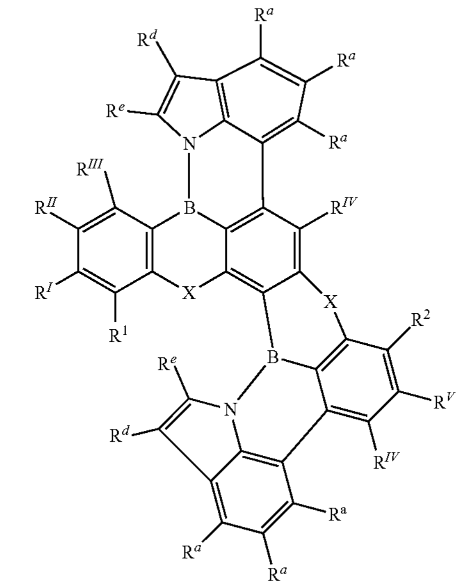
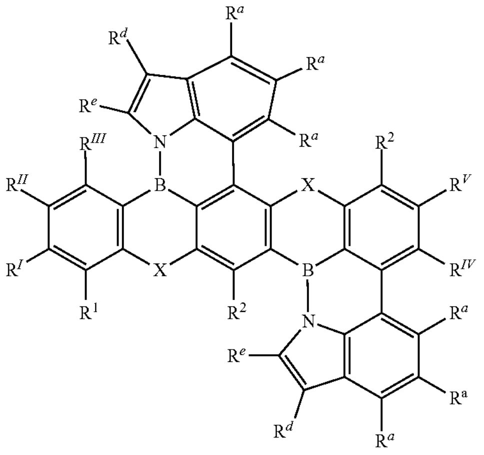
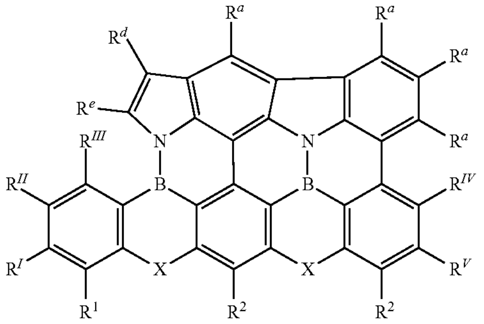
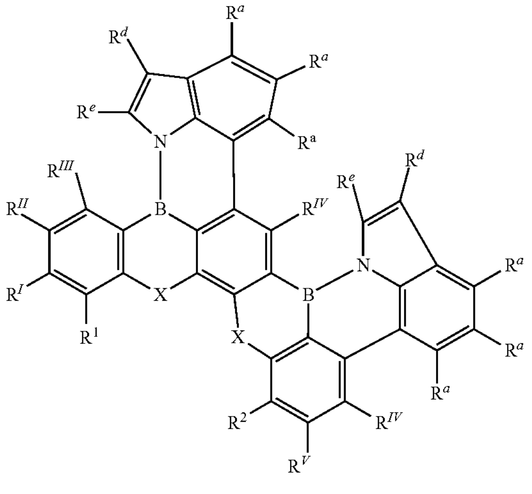

-continued
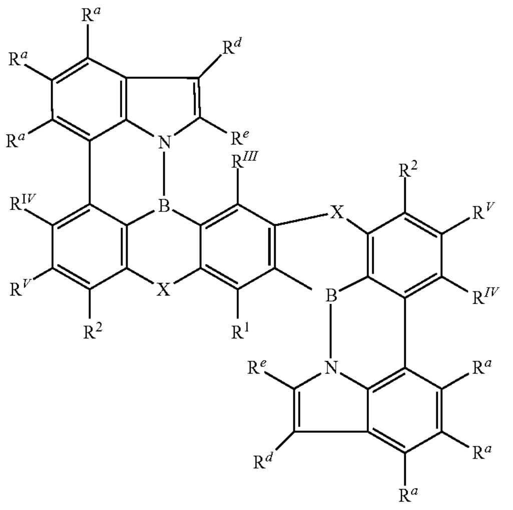
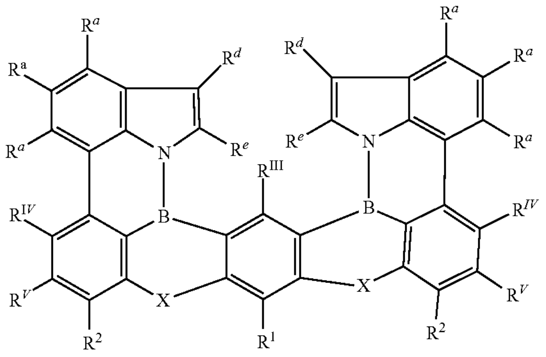
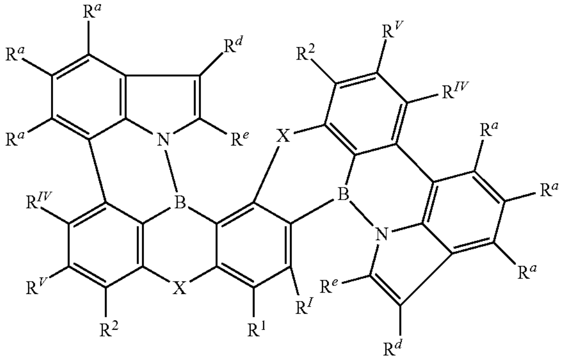
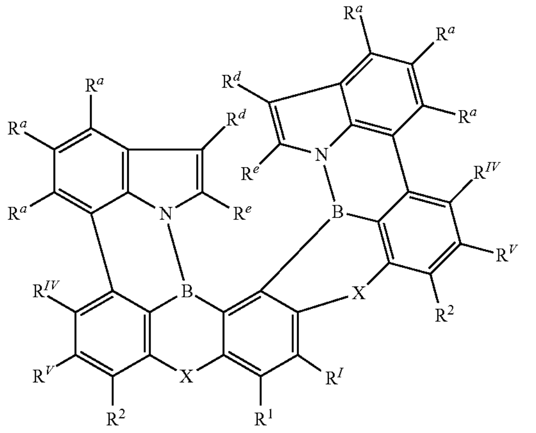
-continued
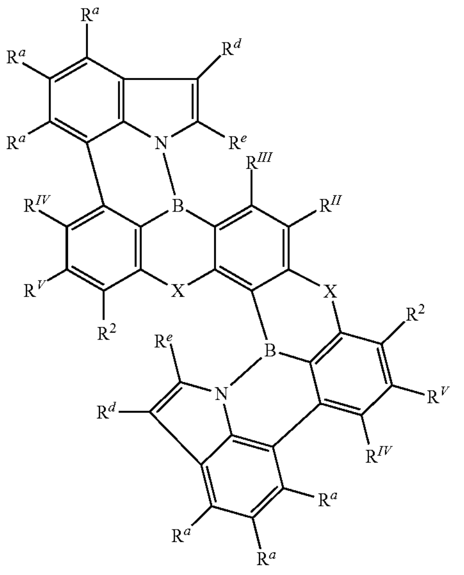
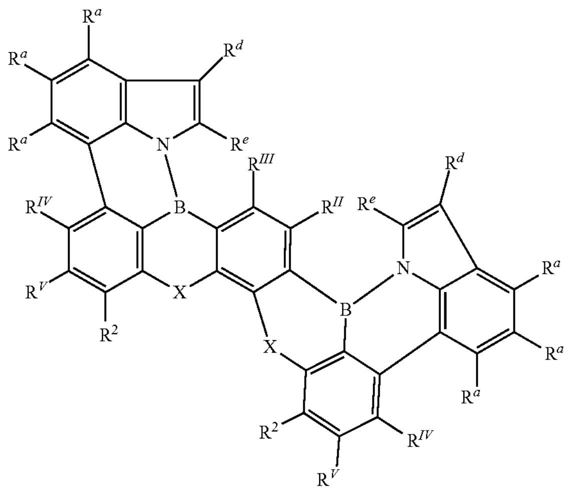
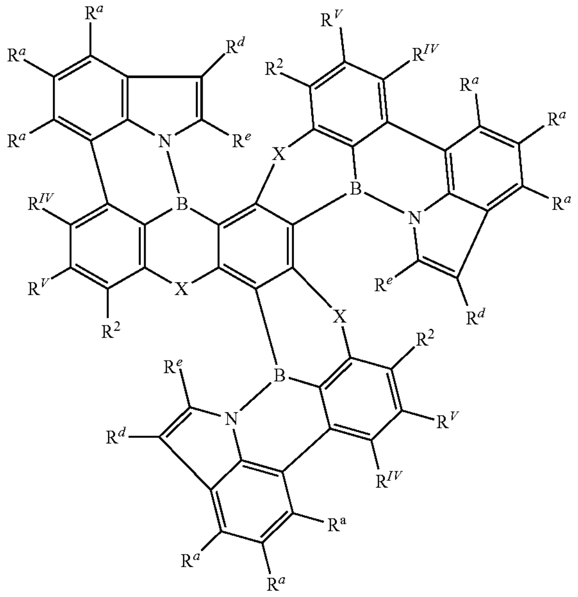

-continued
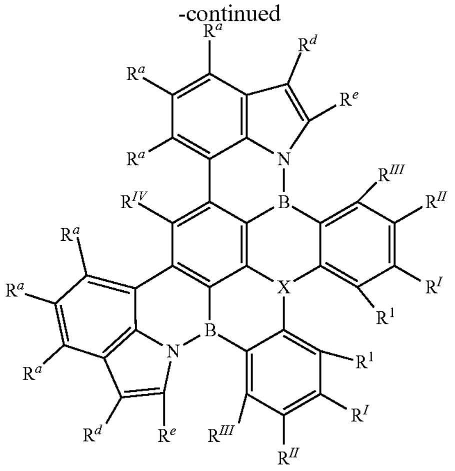
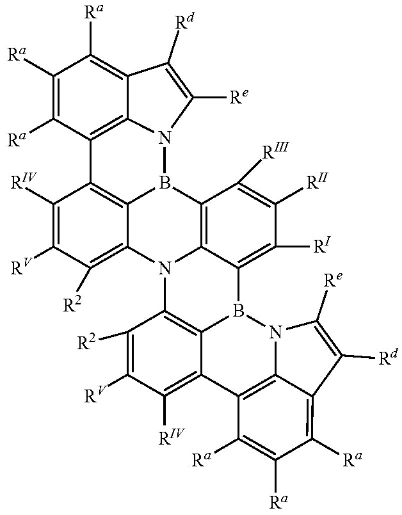
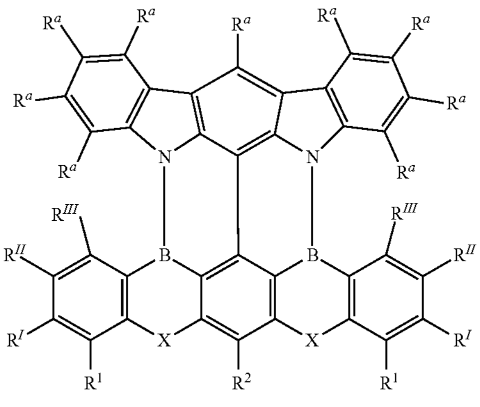
-continued
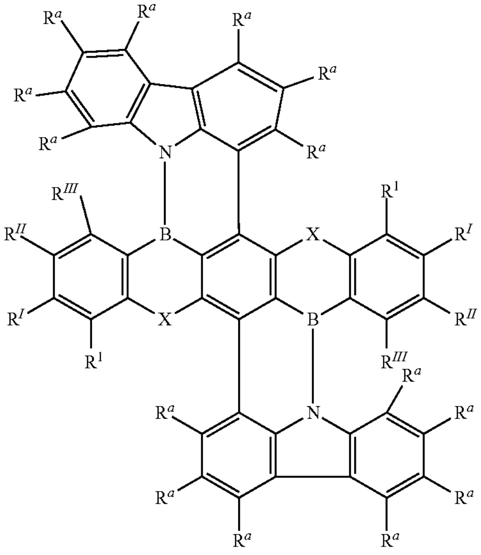
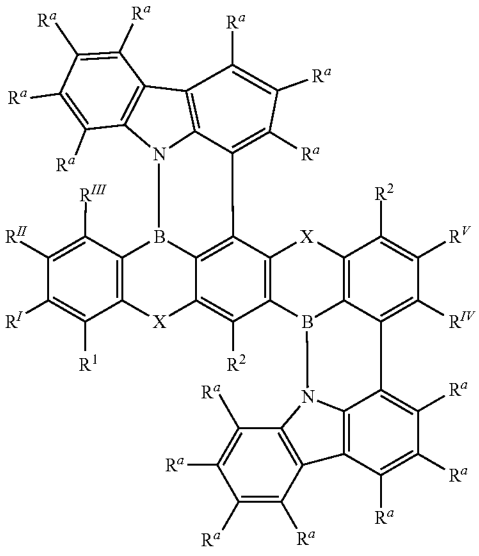
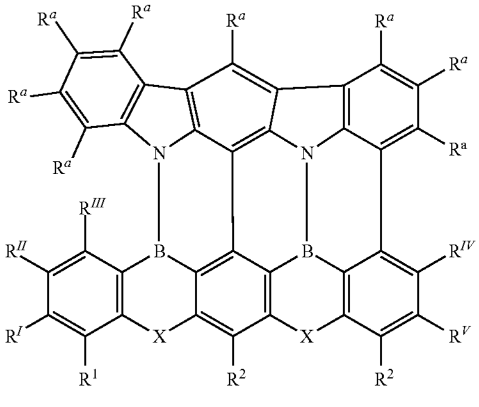

-continued
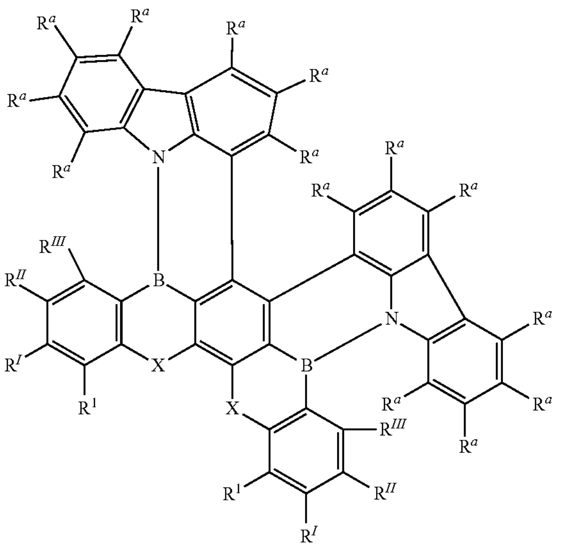
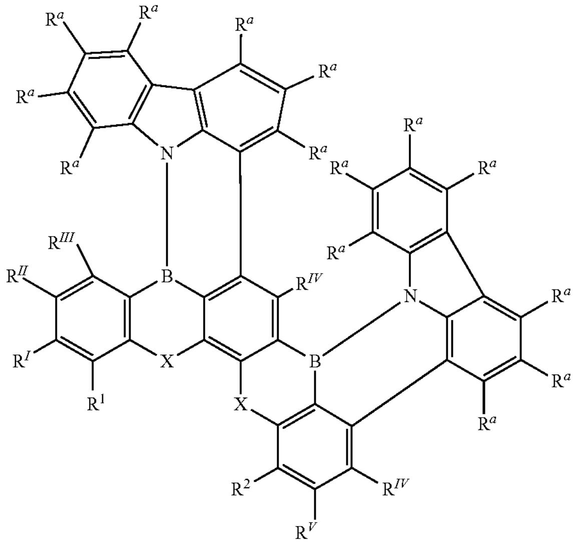
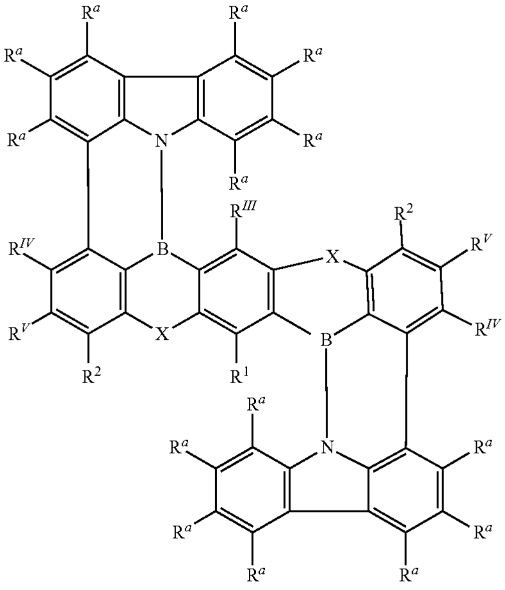
-continued
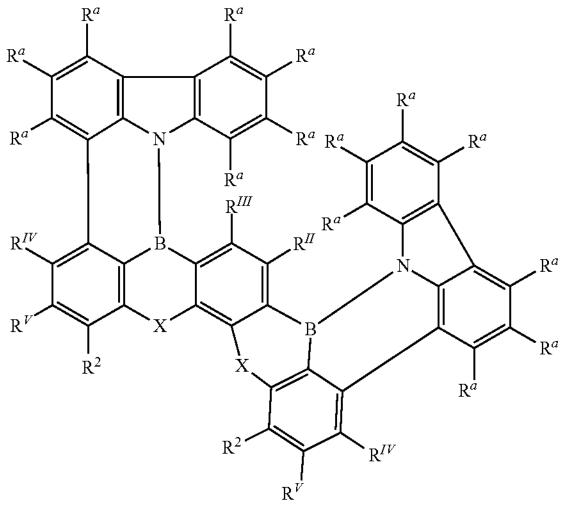
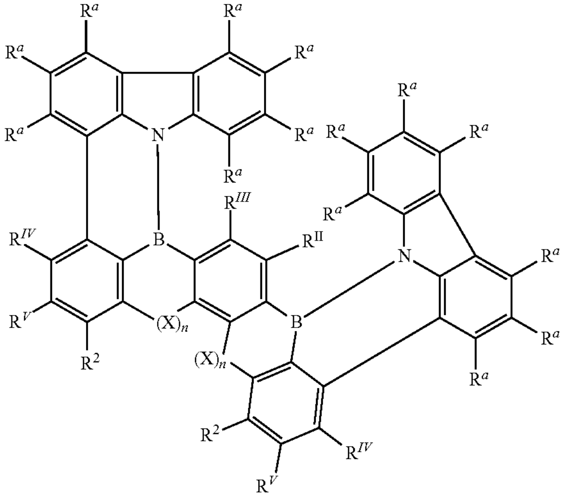
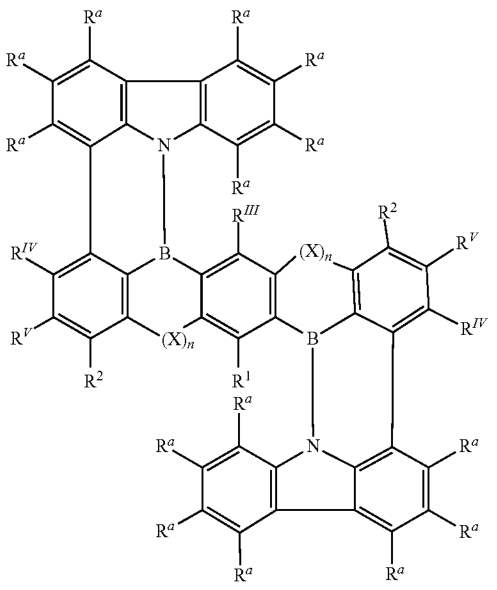

-continued

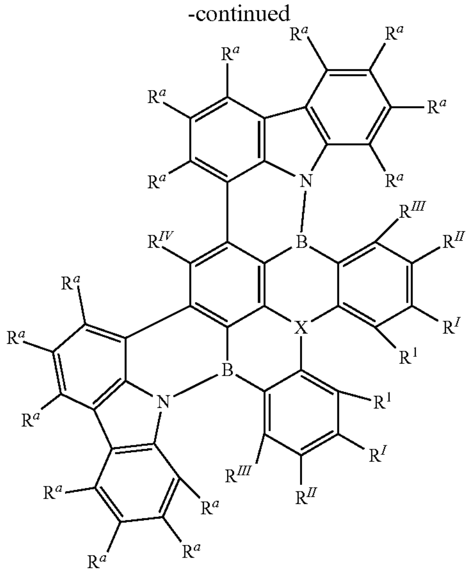

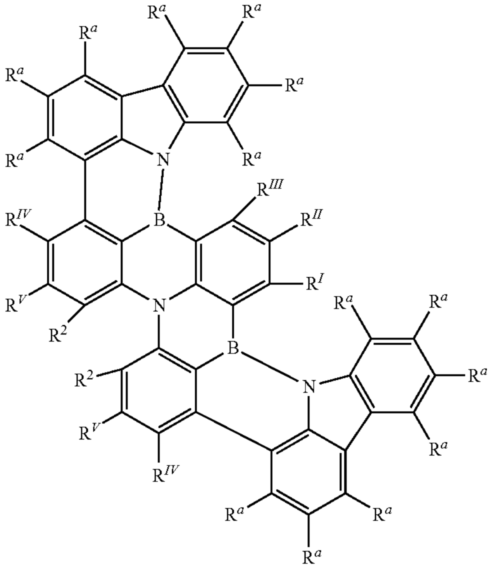

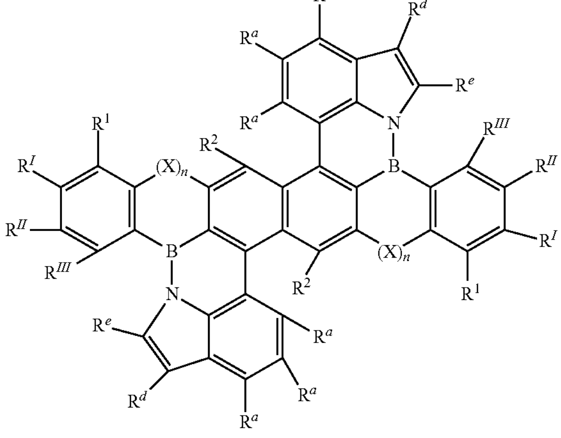

-continued

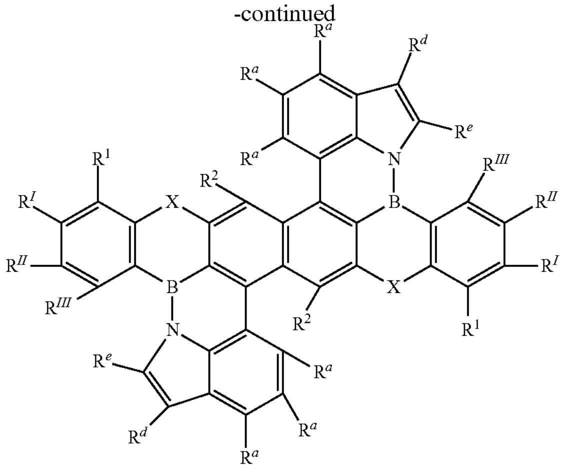

In certain embodiments of the invention, the oligomer is a dimer (m=2) or trimer (m=3), preferably a dimer.

In a preferred embodiment, $R^1$, $R^2$, $R^3$, $R^4$, $R^I$, $R^{II}$, $R^{III}$, $R^{IV}$, and/or $R^V$ is independently from one another selected from the group consisting of: hydrogen, deuterium;

$N(R^5)_2$;

$OR^5$;

$Si(R^5)_3$;

$B(R^5)_2$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$; and $R^5$ is at each occurrence independently from one another selected from the group consisting of: hydrogen, deuterium, $N(R^6)_2$, $OR^6$, $Si(R^6)_3$, $B(R^6)_2$, $CF_3$, CN, F, Br, I, $C_1$-$C_{18}$-alkyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$ wherein groups $R^1$, $R^2$, $R^3$, $R^I$, $R^{II}$, $R^{III}$, $R^{IV}$, $R^5$, and $R^V$ are optionally bonded to each other and form an aryl or heteroaryl ring, which is optionally substituted with one or more $C_1$-$C_5$-alkyl substituents, deuterium, halogen, CN or $CF_3$.

In certain embodiments of the oligomer, $R^1$, $R^2$, $R^3$, $R^4$, $R^I$, $R^{II}$, $R^{III}$, $R^{IV}$, and $R^V$ are independently from one another selected from the group consisting of: hydrogen;

deuterium;

$N(R^5)_2$;

$OR^5$;

$Si(R^5)_3$;

$B(R^5)_2$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$; and $R^5$ is at each occurrence independently from one another selected from the group consisting of: hydrogen, deuterium, $N(R^6)_2$, $OR^6$, $Si(R^6)_a$, $B(R^6)_2$, $CF_3$, CN, F, Br, I, $C_1$-$C_{18}$-alkyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$ wherein groups $R^1$, $R^2$, $R^I$, $R^{II}$, $R^{III}$, $R^{IV}$, $R^5$, and $R^V$ positioned adjacent to each other are optionally bonded to each other and form an aryl or heteroaryl ring, which is optionally substituted with one or more $C_1$-$C_5$-alkyl substituents, deuterium, halogen, CN or $CF_3$.

In certain embodiments of the oligomer, $R^1$, $R^2$, $R^3$, $R^4$, $R^I$, $R^{II}$, $R^{III}$, $R^{IV}$, $R^V$, and $R^a$ are each independently from one another selected from the group consisting of:

hydrogen;

deuterium;

$N(R^5)_2$;

$OR^5$;

$SR^5$;

$Si(R^5)_3$;

$B(OR^5)_2$;

$B(R^5)_2$;

$OSO_2R^5$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{18}$-alkoxy, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{18}$-thioalkoxy, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{18}$-alkenyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{18}$-alkynyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$;

$R^5$ is at each occurrence independently from one another selected from the group consisting of: hydrogen, deuterium, $N(R^6)_2$, $OR^6$, $Si(R^6)_3$, $B(OR^6)_2$, $B(R^6)_2$, $OSO_2R^6$, $CF_3$, CN, F, Br, I, $C_1$-$C_{18}$-alkyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_1$-$C_{18}$-alkoxy, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_1$-$C_{18}$-thioalkoxy, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_2$-$C_{18}$-alkenyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, C═O, C═S, C═Se, $C═NR^6$, $P(═O)(R^6)$, SO, $SO_2$, $NR^6$, O, S or $CONR^6$;

$C_2$-$C_{18}$-alkynyl, which is optionally substituted with one or more substituents $R^6$ and wherein one or more non-adjacent $CH_2$-groups are optionally substituted by $R^6C═CR^6$, C≡C, $Si(R^6)_2$, $Ge(R^6)_2$, $Sn(R^6)_2$, C═O, C═S, C═Se, $C═NR^6$, $P(═O)(R^6)$, SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$;

wherein the substituents $R^a$, $R^d$, $R^e$, and $R^5$, independently from each other, optionally form a mono- or polycyclic, aliphatic, aromatic, heteroaromatic and/or benzo-fused ring system with one or more adjacent substituents selected from among $R^a$, $R^d$, $R^e$, and $R^5$;

wherein the substituents $R^1$, $R^2$, $R^3$, $R^4$, $R^5$, $R^I$, $R^{II}$, $R^{III}$, $R^{IV}$, and $R^V$ independently from each other, optionally form a mono- or polycyclic, aliphatic, aromatic, heteroaromatic and/or benzo-fused ring system with one or more adjacent substituents selected from among $R^1$, $R^2$, $R^3$, $R^4$, $R^5$, $R^I$, $R^{II}$, $R^{III}$, $R^{IV}$, and $R^V$.

In one embodiment of the invention, the organic molecule consists of a dimer or trimer, wherein $R^1$, $R^2$, $R^a$, $R^d$, $R^e$, $R^I$, $R^{II}$, $R^{III}$, $R^{IV}$ and $R^V$ are at each occurrence independently from one another selected from the group consisting of:

hydrogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In one embodiment of the invention, the organic molecule/oligomer includes or consists of a structure of Formula IV, wherein at least one $R^a$ is different from hydrogen.

In a preferred embodiment, the organic molecule of the invention includes or consists of a structure of Formula IV, with the proviso that, if X is $NR^3$ and $R^d$ and $R^e$ are connected to each other to form an aromatic ring system, $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In a preferred embodiment of the invention, the organic molecule/oligomer includes or consists of a structure of Formula IV, wherein X is at each occurrence independently from one another selected from the group consisting of a direct bond, $NR^3$, $CR^3R^4$, S and O.

In a more preferred embodiment of the invention, the organic molecule/oligomer includes or consists of a structure of Formula IV, wherein X is at each occurrence independently from one another selected from the group consisting of a direct bond, $NR^3$, S and O.

In a certain embodiment of the invention, the organic molecule/oligomer includes or consists of a structure of Formula IV, wherein X is at each occurrence independently from one another selected from the group consisting of a direct bond and $NR^3$.

In a certain embodiment of the invention, the organic molecule/oligomer includes or consists of a structure of Formula IV, wherein X is $NR^3$.

In a preferred embodiment of the invention, the organic molecule/oligomer includes or consists of a structure of Formula IV, wherein $R^3$ is independently from one another selected from the group consisting of:

$C_1$-$C_{40}$-alkyl, which is optionally substituted with one or more substituents $R^5$;

$C_6$-$C_{18}$-aryl, which is optionally substituted with one or more substituents $R^5$; and $C_2$-$C_{17}$-heteroaryl, which is optionally substituted with one or more substituents $R^5$.

In a preferred embodiment of the invention, the organic molecule/oligomer includes or consists of a structure of Formula IV, wherein $R^V$ is at each occurrence independently from one another selected from the group consisting of:

$N(R^5)_2$, $OR^5$, $C_1$-$C_{18}$-alkyl, which is optionally substituted with one or more substituents $R^5$ and wherein one or more non-adjacent $CH_2$-groups are optionally substituted by $R^5C═CR^5$, C≡C, $Si(R^5)_2$, $Ge(R^5)_2$, $Sn(R^5)_2$, C═O, C═S, C═Se, $C═NR^5$, $P(═O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, wherein $R^V$ independently from each other, optionally form a mono- or polycyclic, aliphatic, aromatic, heteroaromatic and/or benzo-fused ring system with one or more adjacent substituents selected from among $R^2$ and $R^{IV}$, which is optionally substituted with one or more $C_1$-$C_5$-alkyl substituents, deuterium, halogen, CN or $CF_3$.

In a preferred embodiment of the invention, the organic molecule/oligomer includes or consists of a structure of Formula IVa-0 and/or Formula IVb-0 (dimer):

Formula IVa-0

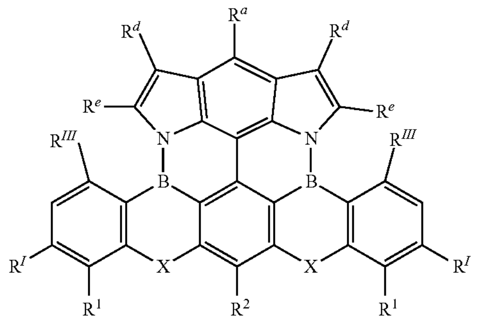

Formula IVb-0

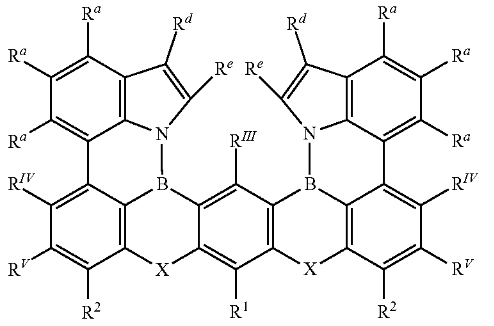

In a preferred embodiment of the invention, the organic molecule/oligomer includes or consists of a structure of Formula IVa, and/or Formula IVb-0:

Formula IVa

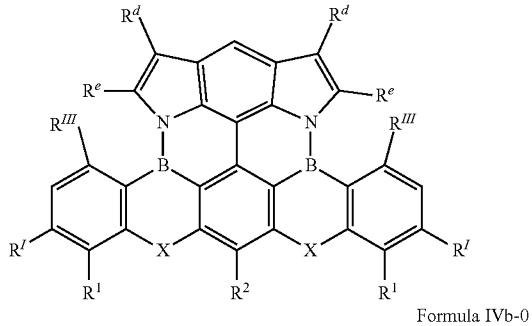

Formula IVb-0

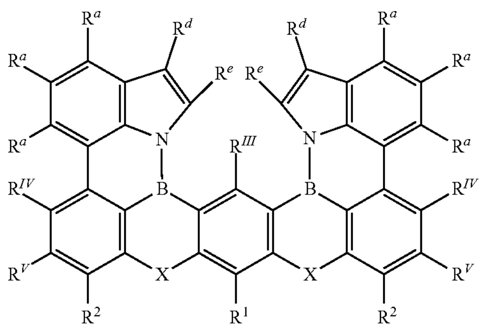

In one embodiment of the invention, the organic molecule/oligomer includes or consists of a structure of Formula IVa, and/or Formula IVb-0, wherein at least one $R^a$ is different from hydrogen.

In a preferred embodiment, the organic light-emitting molecule of the invention includes or consists of a structure of Formula IVa, and/or Formula IVb-0, with the proviso that, if X is $NR^3$ and $R^d$ and $R^e$ are connected to each other to form an aromatic ring system, $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In a preferred embodiment of the invention, the organic molecule/oligomer includes or consists of a structure of Formula IVa, and/or Formula IVb-0, wherein X is at each occurrence independently from one another selected from the group consisting of a direct bond, $NR^3$, $CR^3R^4$, S and O.

In a more preferred embodiment of the invention, the organic molecule/oligomer includes or consists of a structure of Formula IVa, and/or Formula IVb-0, wherein X is at each occurrence independently from one another selected from the group consisting of a direct bond, $NR^3$, S and O.

In a certain embodiment of the invention, the organic molecule/oligomer includes or consists of a structure of Formula IVa, and/or Formula IVb-0, wherein X is at each occurrence independently from one another selected from the group consisting of a direct bond and $NR^3$.

In a certain embodiment of the invention, the organic molecule/oligomer includes or consists of a structure of Formula IVa, and/or Formula IVb-0, wherein X is $NR^3$.

In a preferred embodiment of the invention, the organic molecule/oligomer includes or consists of a structure of Formula IVa, and/or Formula IVb-0, wherein $R^3$ is independently from one another selected from the group consisting of:

$C_1$-$C_{40}$-alkyl, which is optionally substituted with one or more substituents $R^5$;

$C_6$-$C_{18}$-aryl, which is optionally substituted with one or more substituents $R^5$; and $C_2$-$C_{17}$-heteroaryl, which is optionally substituted with one or more substituents $R^5$.

In a preferred embodiment of the invention, the organic molecule/oligomer includes or consists of a structure of Formula IVa, and/or Formula IVb-0, wherein $R^V$ is at each occurrence independently from one another selected from the group consisting of:

$N(R^5)_2$;

$OR^5$;

$C_1$-$C_{18}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, wherein the $R^V$ independently from each other, optionally form a mono- or polycyclic, aliphatic, aromatic, heteroaromatic and/or benzo-fused ring system with one or more adjacent substituents selected from among $R^2$ and $R^{IV}$, which is optionally substituted with one or more $C_1$-$C_5$-alkyl substituents, deuterium, halogen, CN or $CF_3$.

In one embodiment of the invention, the organic molecule/oligomer includes or consists of a structure of Formula IVa-0 (dimer)

Formula IVa-0

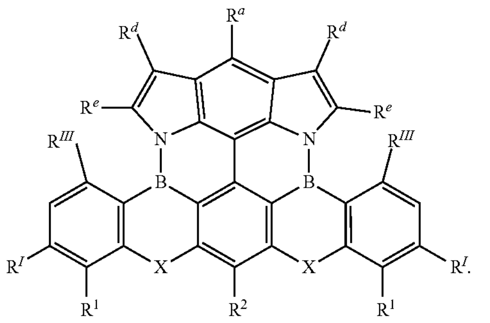

In a preferred embodiment of the invention, the organic molecule/oligomer includes or consists of a structure of Formula IVa Formula IVa

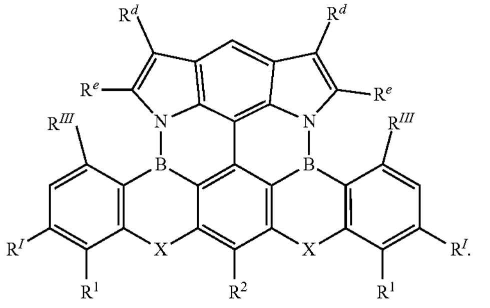

In one embodiment of the invention, the organic molecule/oligomer includes or consists of a structure of Formula IVa-2

Formula IVa-2

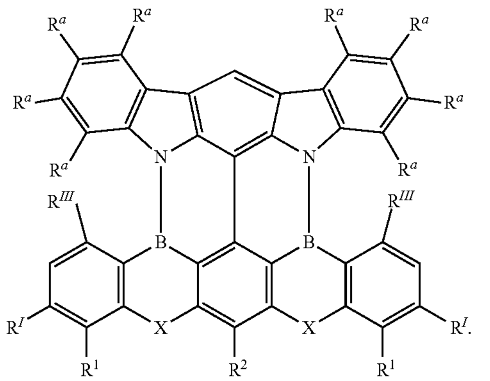

In one embodiment of the invention, the organic molecule/oligomer includes or consists of a structure of Formula IVa-3

Formula IVa-3

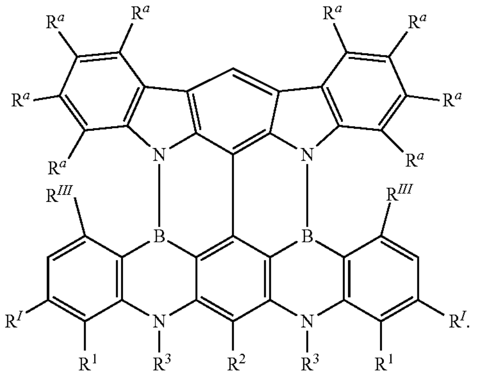

In one embodiment of the invention, the organic molecule/oligomer includes or consists of a structure of Formula IVa-4

Formula IVa-4

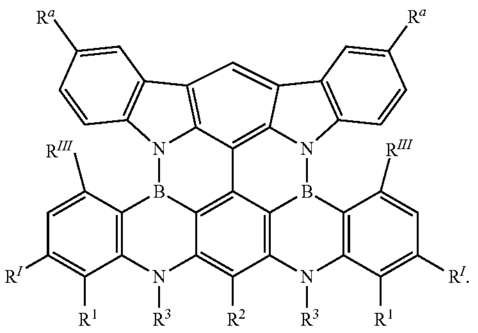

In a preferred embodiment of the invention, the organic molecule/oligomer includes or consists of a structure of Formula IVb-0

Formula IVb-0

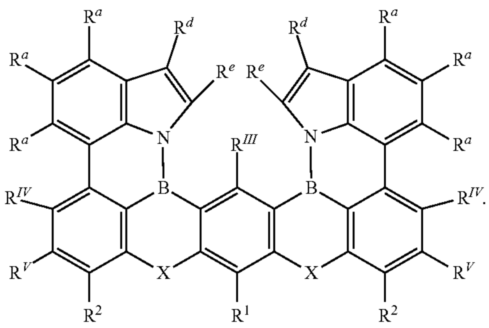

In one embodiment of the invention, the organic molecule/oligomer includes or consists of a structure of Formula IVb-0, wherein at least one $R^a$ is different from hydrogen.

In a preferred embodiment, the organic molecule of the invention includes or consists of a structure of Formula IVb-0, with the proviso that, if X is $NR^3$ and $R^d$ and $R^e$ are connected to each other to form an aromatic ring system, $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In a preferred embodiment of the invention, the organic molecule/oligomer includes or consists of a structure of Formula IVb-0, wherein X is at each occurrence independently from one another selected from the group consisting of a direct bond, $NR^3$, $CR^3R^4$, S and O.

In a more preferred embodiment of the invention, the organic molecule/oligomer includes or consists of a structure of Formula IVb-0, wherein X is at each occurrence independently from one another selected from the group consisting of a direct bond, $NR^3$, S and O.

In a certain embodiment of the invention, the organic molecule/oligomer includes or consists of a structure of Formula IVb-0, wherein X is at each occurrence independently from one another selected from the group consisting of a direct bond and $NR^3$.

In a certain embodiment of the invention, the organic molecule/oligomer includes or consists of a structure of Formula IVb-0, wherein X is $NR^3$.

In a more preferred embodiment of the invention, the organic molecule/oligomer includes or consists of a structure of Formula IVb-0a Formula IVb-0a

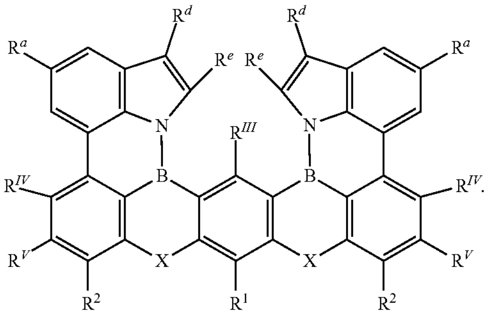

In one embodiment of the invention, the organic molecule/oligomer includes or consists of a structure of Formula IVb-0a, wherein at least one $R^a$ is different from hydrogen.

In a preferred embodiment, the organic molecule of the invention includes or consists of a structure of Formula IVb-0a, with the proviso that, if X is $NR^3$ and $R^d$ and $R^e$ are connected to each other to form an aromatic ring system, $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In a preferred embodiment of the invention, the organic molecule/oligomer includes or consists of a structure of Formula IVb-0a, wherein X is at each occurrence independently from one another selected from the group consisting of a direct bond, $NR^3$, $CR^3R^4$, S and O.

In a more preferred embodiment of the invention, the organic molecule/oligomer includes or consists of a structure of Formula IVb-0a, wherein X is at each occurrence independently from one another selected from the group consisting of a direct bond, $NR^3$, S and O.

In a certain embodiment of the invention, the organic molecule/oligomer includes or consists of a structure of Formula IVb-0a, wherein X is at each occurrence independently from one another selected from the group consisting of a direct bond and $NR^3$.

In a certain embodiment of the invention, the organic molecule/oligomer includes or consists of a structure of Formula IVb-0a, wherein X is $NR^3$.

In a preferred embodiment of the invention, the organic molecule/oligomer includes or consists of a structure of Formula IVb-0b Formula IVb-0b

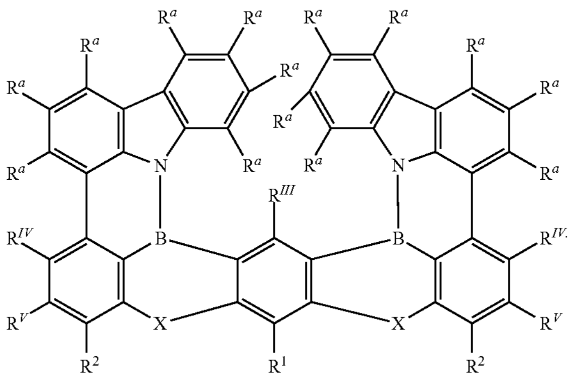

In one embodiment of the invention, the organic molecule/oligomer includes or consists of a structure of Formula IVb-0b, wherein at least one $R^a$ is different from hydrogen.

In a preferred embodiment, the organic molecule of the invention includes or consists of a structure of Formula IVb-0b, with the proviso that, if X is $NR^3$, $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In a preferred embodiment of the invention, the organic molecule/oligomer includes or consists of a structure of Formula IVb-0b, wherein X is at each occurrence independently from one another selected from the group consisting of a direct bond, $NR^3$, $CR^3R^4$, S and O.

In a more preferred embodiment of the invention, the organic molecule/oligomer includes or consists of a structure of Formula IVb-0b, wherein X is at each occurrence independently from one another selected from the group consisting of a direct bond, $NR^3$, S and O.

In a certain embodiment of the invention, the organic molecule/oligomer includes or consists of a structure of Formula IVb-0b, wherein X is at each occurrence independently from one another selected from the group consisting of a direct bond and $NR^3$.

In a certain embodiment of the invention, the organic molecule/oligomer includes or consists of a structure of Formula IVb-0b, wherein X is $NR^3$.

In a more preferred embodiment of the invention, the organic molecule/oligomer includes or consists of a structure of Formula IVb-0c Formula IVb-0c

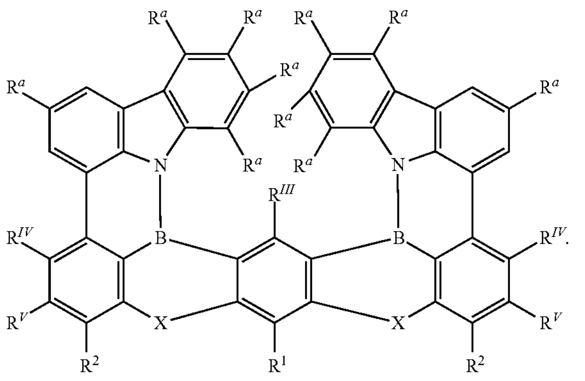

In one embodiment of the invention, the organic molecule/oligomer includes or consists of a structure of Formula IVb-0c, wherein at least one $R^a$ is different from hydrogen.

In a preferred embodiment, the organic molecule of the invention includes or consists of a structure of Formula IVb-0c, with the proviso that, if X is $NR^3$, $R^V$ is $N(R^5)_2$ or forms a mono- or polycyclic, aliphatic, aromatic, heteroaromatic and/or benzo-fused ring system with one or more substituents $R^2$, $R^3$, $R^5$, and/or $R^{IV}$.

In a preferred embodiment of the invention, the organic molecule/oligomer includes or consists of a structure of Formula IVb-0c, wherein X is at each occurrence independently from one another selected from the group consisting of a direct bond, $NR^3$, $CR^3R^4$, S and O.

In a more preferred embodiment of the invention, the organic molecule/oligomer includes or consists of a structure of Formula IVb-0c, wherein X is at each occurrence independently from one another selected from the group consisting of a direct bond, $NR^3$, S and O.

In a certain embodiment of the invention, the organic molecule/oligomer includes or consists of a structure of Formula IVb-0c, wherein X is at each occurrence independently from one another selected from the group consisting of a direct bond and $NR^3$.

In a certain embodiment of the invention, the organic molecule/oligomer includes or consists of a structure of Formula IVb-0c, wherein X is $NR^3$.

In a preferred embodiment of the invention, the organic molecule/oligomer includes or consists of a structure of Formula IVb Formula IVb

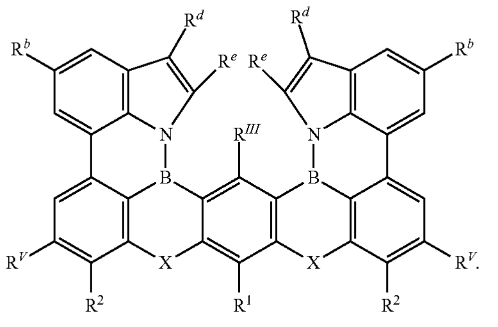

In a preferred embodiment of the invention, the organic molecule/oligomer includes or consists of a structure of Formula IVb-2

Formula IVb-2

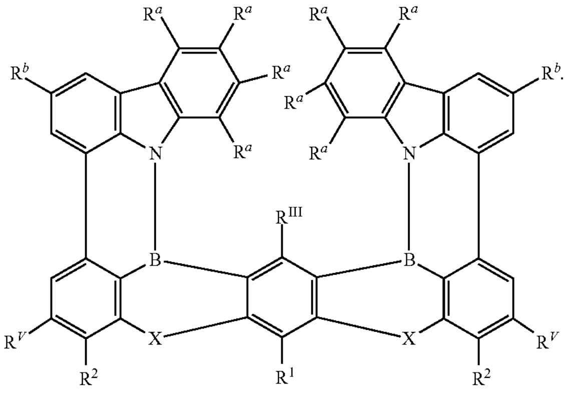

In a preferred embodiment of the invention, the organic molecule/oligomer includes or consists of a structure of Formula IVb-3

Formula IVb-3

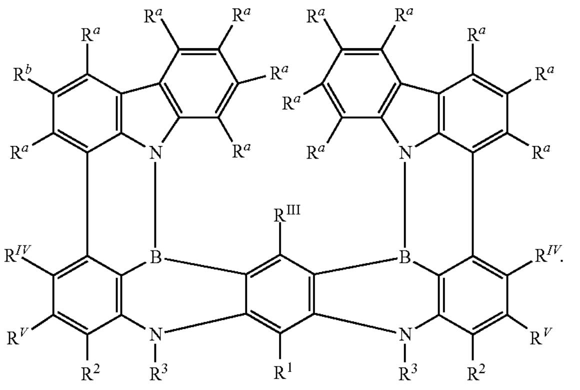

In one embodiment of the invention, the organic molecule/oligomer includes or consists of a structure of Formula IVb-3, wherein at least one $R^a$ is different from hydrogen.

In a preferred embodiment, the organic molecule of the invention includes or consists of a structure of Formula IVb-3, wherein $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In a preferred embodiment of the invention, the organic molecule/oligomer includes or consists of a structure of Formula IVb-4

Formula IVb-4

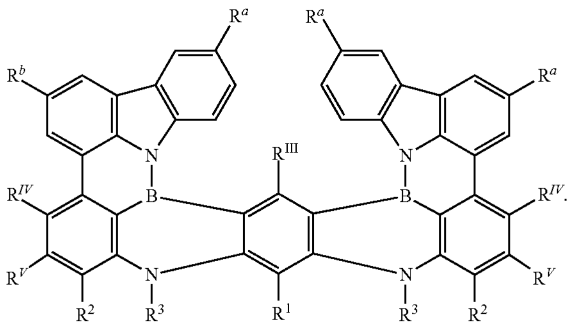

In one embodiment of the invention, the organic molecule/oligomer includes or consists of a structure of Formula IVb-4, wherein at least one $R^a$ is different from hydrogen.

In a preferred embodiment, the organic molecule of the invention includes or consists of a structure of Formula IVb-3, wherein $R^V$ is $N(R^5)_2$ or forms a mono- or polycyclic, aliphatic, aromatic, heteroaromatic and/or benzo-fused ring system with one or more adjacent substituents selected from among $R^2$, $R^3$, $R^5$, and $R^{IV}$.

In one embodiment of the invention, the organic molecule/oligomer includes or consists of a structure of Formula IVc Formula IVc

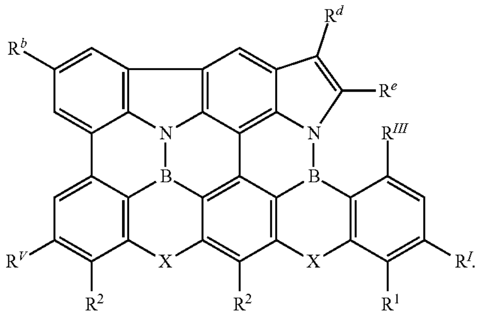

In one embodiment of the invention, the organic molecule/oligomer includes or consists of a structure of Formula IVc-2

Formula IVc-2

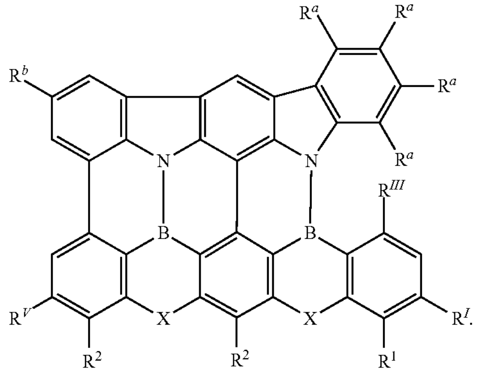

In one embodiment of the invention, the organic molecule/oligomer includes or consists of a structure of Formula IVd Formula IVd

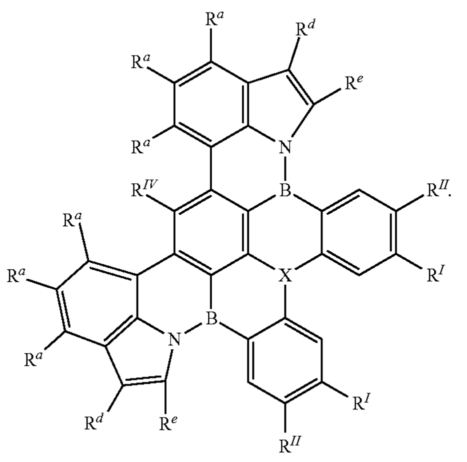

In a preferred embodiment of the invention, the organic molecule/oligomer includes or consists of a structure of Formula IVd-2

Formula IVd-2

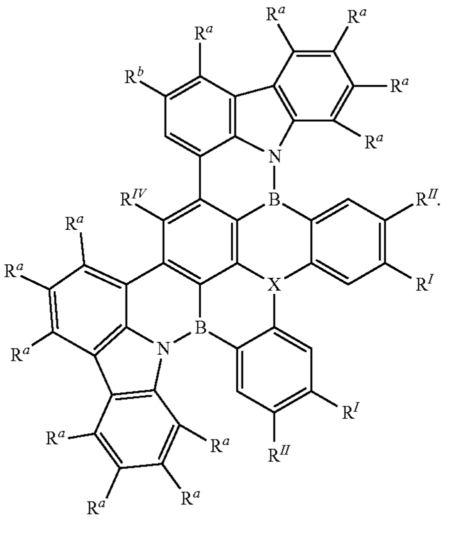

In one embodiment of the invention, the organic molecule/oligomer includes or consists of a structure of Formula IVe Formula IVe

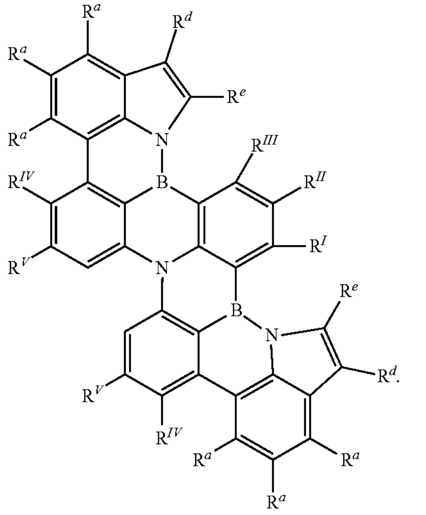

In a preferred embodiment of the invention, the organic molecule/oligomer includes or consists of a structure of Formula IVe-2

Formula IVe-2

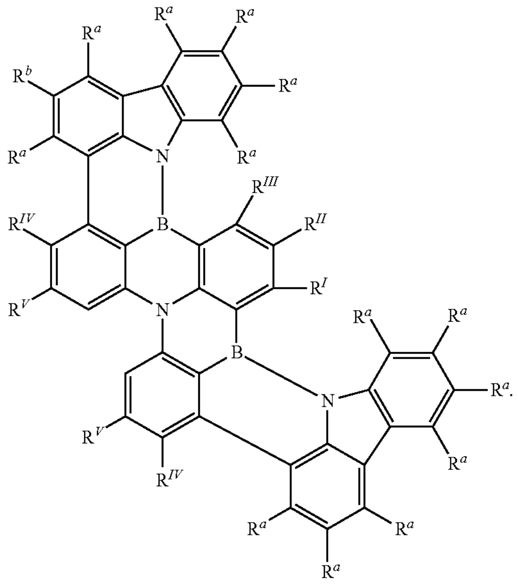

As used throughout the present application, the terms "aryl" and "aromatic" may be understood in the broadest sense as any mono-, bi- or polycyclic aromatic moieties. Accordingly, an aryl group contains 6 to 60 aromatic ring atoms, and a heteroaryl group contains 5 to 60 aromatic ring atoms, of which at least one is a heteroatom. Notwithstanding, throughout the application the number of aromatic ring atoms may be given as subscripted number in the definition of certain substituents. In particular, the heteroaromatic ring includes one to three heteroatoms. Again, the terms "heteroaryl" and "heteroaromatic" may be understood in the broadest sense as any mono-, bi- or polycyclic heteroaromatic moieties that include at least one heteroatom. The heteroatoms may at each occurrence be the same or different and be individually selected from the group consisting of N, O and S. Accordingly, the term "arylene" refers to a divalent substituent that bears two binding sites to other molecular structures and thereby serving as a linker structure. In case, a group in the exemplary embodiments is defined differently from the definitions given here, for example, the number of aromatic ring atoms or number of heteroatoms differs from the given definition, the definition in the exemplary embodiments is to be applied. According to the invention, a condensed (annulated) aromatic or heteroaromatic polycycle is built of two or more single aromatic or heteroaromatic cycles, which formed the polycycle via a condensation reaction.

In particular, as used throughout, the term "aryl group or heteroaryl group" includes groups which can be bound via any position of the aromatic or heteroaromatic group, derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene; pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridoimidazole, pyrazinoimidazole, quinoxalinoimidazole, oxazole, benzoxazole, naphthooxazole, anthroxazol, phenanthroxazol, isoxazole, 1,2-thiazole, 1,3-thiazole, benzothiazole, pyridazine, benzopyridazine, pyrimidine, benzopyrimidine, 1,3,5-trazine, quinoxaline, pyrazine, phenazine, naphthyridine, carboline, benzocarboline, phenanthroline, 1,2,3-triazole, 1,2,4-triazole, benzotriazole, 1,2,3-oxadiazole, 1,2,4-oxadiazole, 1,2,5-oxadiazole, 1,2,3,4-tetrazine, purine, pteridine, indolizine and benzothiadiazole or combinations of the abovementioned groups.

As used throughout, the term "cyclic group" may be understood in the broadest sense as any mono-, bi- or polycyclic moieties.

As used throughout, the term "biphenyl" as a substituent may be understood in the broadest sense as ortho-biphenyl, meta-biphenyl, or para-biphenyl, wherein ortho, meta and para are defined in regard to the binding site to another chemical moiety.

As used throughout, the term "alkyl group" may be understood in the broadest sense as any linear, branched, or cyclic alkyl substituent. In particular, the term alkyl includes the substituents methyl (Me), ethyl (Et), n-propyl ($^{n}$Pr), i-propyl ($^{i}$Pr), cyclopropyl, n-butyl ($^{n}$Bu), i-butyl ($^{i}$Bu), s-butyl ($^{s}$Bu), t-butyl ($^{t}$Bu), cyclobutyl, 2-methylbutyl, n-pentyl, s-pentyl, t-pentyl, 2-pentyl, neo-pentyl, cyclopentyl, n-hexyl, s-hexyl, t-hexyl, 2-hexyl, 3-hexyl, neo-hexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2,2,2]octyl, 2-bicyclo[2,2,2]-octyl, 2-(2,6-dimethyl)octyl, 3-(3,7-dimethyl)octyl, adamantyl, 2,2,2-trifluorethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)-cyclohex-1-yl, 1-(n-butyl)-cyclohex-1-yl, 1-(n-hexyl)-cyclohex-1-yl, 1-(n-octyl)-cyclohex-1-yl and 1-(n-decyl)-cyclohex-1-yl.

As used throughout, the term "alkenyl" includes linear, branched, and cyclic alkenyl substituents. The term "alkenyl group", for example, includes the substituents ethenyl, propenyl, butenyl, pentenyl, cyclopentenyl, hexenyl, cyclohexenyl, heptenyl, cycloheptenyl, octenyl, cyclooctenyl or cyclooctadienyl.

As used throughout, the term "alkynyl" includes linear, branched, and cyclic alkynyl substituents. The term "alkynyl group", for example, includes ethynyl, propynyl, butynyl, pentynyl, hexynyl, heptynyl or octynyl.

As used throughout, the term "alkoxy" includes linear, branched, and cyclic alkoxy substituents. The term "alkoxy group" exemplarily includes methoxy, ethoxy, n-propoxy, i-propoxy, n-butoxy, i-butoxy, s-butoxy, t-butoxy and 2-methylbutoxy.

As used throughout, the term "thioalkoxy" includes linear, branched, and cyclic thioalkoxy substituents, in which the 0 of the exemplarily alkoxy groups is replaced by S.

As used throughout, the terms "halogen" and "halo" may be understood in the broadest sense as being preferably fluorine, chlorine, bromine or iodine.

Whenever hydrogen (H) is mentioned herein, it could also be replaced by deuterium at each occurrence.

It is understood that when a molecular fragment is described as being a substituent or otherwise attached to another moiety, its name may be written as if it were a fragment (e.g. naphthyl, dibenzofuryl) or as if it were the whole molecule (e.g. naphthalene, dibenzofuran). As used herein, these different ways of designating a substituent or attached fragment are considered to be equivalent.

In one embodiment, the organic molecules according to the invention have an excited state lifetime of not more than 5.0 μs, of not more than 2.5 μs, in particular of not more than 2.0 μs, more preferably of not more than 1.0 μs or not more than 0.7 μs in a film of poly(methyl methacrylate) (PMMA) with 1% to 5%, in particular with 2% by weight of the organic molecule at room temperature.

In a further embodiment of the invention, the organic molecules according to the invention have an emission peak in the visible or nearest ultraviolet range, i.e., in the range of a wavelength of from 380 to 800 nm, with a full width at half maximum of less than 0.25 eV, preferably less than 0.22 eV, more preferably less than 0.18 eV, even more preferably less than 0.15 eV or even less than 0.12 eV in a film of poly(methyl methacrylate) (PMMA) with 1% to 5%, in particular with 2% by weight of the organic molecule at room temperature.

Orbital and excited state energies can be determined either by means of experimental methods. The energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is calculated as $E^{HOMO}+E^{gap}$, wherein $E^{gap}$ is determined as follows: For host compounds, the onset of the emission spectrum of a film with 10% by weight of host in poly (methyl methacrylate) (PMMA) is used as $E^{gap}$, unless stated otherwise. For emitter molecules, $E^{gap}$ is determined as the energy at which the excitation and emission spectra of a film with 1% to 5%, in particular with 2% by weight of emitter in PMMA cross. For the organic molecules according to the invention, $E^{gap}$ is determined as the energy at which the excitation and emission spectra of a film with 1% to 5%, in particular with 2% by weight of emitter in PMMA cross.

The energy of the first excited triplet state T1 is determined from the onset of the emission spectrum at low temperature, typically at 77 K. For host compounds, where the first excited singlet state and the lowest triplet state are energetically separated by >0.4 eV, the phosphorescence is usually visible in a steady-state spectrum in 2-Me-THF. The triplet energy can thus be determined as the onset of the phosphorescence spectrum. For TADF emitter molecules, the energy of the first excited triplet state T1 is determined from the onset of the delayed emission spectrum at 77 K, if not otherwise stated, measured in a film of PMMA with 1% to 5%, in particular with 2% by weight of emitter and in case of the organic molecules according to the invention with 1% to 5%, in particular with 2% by weight of the organic molecules according to the invention. Both for host and emitter compounds, the energy of the first excited singlet state S1 is determined from the onset of the emission spectrum, if not otherwise stated, measured in a film of PMMA with 10% by weight of host or emitter compound and in case of the organic molecules according to the invention with 1% to 5%, in particular with 2% by weight of the organic molecules according to the invention.

The onset of an emission spectrum is determined by computing the intersection of the tangent to the emission spectrum with the x-axis. The tangent to the emission spectrum is set at the high-energy side of the emission band and at the point at half maximum of the maximum intensity of the emission spectrum.

A further aspect of the invention relates to the use of an organic molecule of the invention as a luminescent emitter or as an absorber, and/or as a host material and/or as an electron transport material, and/or as a hole injection material, and/or as a hole blocking material in an optoelectronic device.

A preferred embodiment relates to the use of an organic molecule according to the invention as a luminescent emitter in an optoelectronic device.

The optoelectronic device may be understood in the broadest sense as any device based on organic materials that is suitable for emitting light in the visible or nearest ultraviolet (UV) range, i.e., in the range of a wavelength of from 380 to 800 nm. More preferably, the optoelectronic device may be able to emit light in the visible range, i.e., of from 400 nm to 800 nm.

In the context of such use, the optoelectronic device is more particularly selected from the group consisting of:

- organic light-emitting diodes (OLEDs),
- light-emitting electrochemical cells,
- OLED sensors, especially in gas and vapor sensors that are not hermetically shielded to the surroundings,
- organic diodes,
- organic solar cells,
- organic transistors,
- organic field-effect transistors,
- organic lasers, and
- down-conversion elements.

In a preferred embodiment in the context of such use, the optoelectronic device is a device selected from the group consisting of an organic light emitting diode (OLED), a light emitting electrochemical cell (LEC), and a light-emitting transistor.

In the case of the use, the fraction of the organic molecule according to the invention in the emission layer in an optoelectronic device, more particularly in an OLED, is 0.1% to 99% by weight, more particularly 1% to 80% by weight. In an alternative embodiment, the proportion of the organic molecule in the emission layer is 100% by weight.

In one embodiment, the light-emitting layer includes not only the organic molecules according to the invention, but also a host material whose triplet (T1) and singlet (S1) energy levels are energetically higher than the triplet (T1) and singlet (S1) energy levels of the organic molecule.

A further aspect of the invention relates to a composition including or consisting of:

(a) at least one organic molecule according to the invention, in particular in the form of an emitter and/or a host, and
(b) one or more emitter and/or host materials, which differ from the organic molecule according to the invention, and
(c) optional one or more dyes and/or one or more solvents.

In one embodiment, the light-emitting layer includes (or essentially consists of) a composition including or consisting of:

(a) at least one organic molecule according to the invention, in particular in the form of an emitter and/or a host, and
(b) one or more emitter and/or host materials, which differ from the organic molecule according to the invention, and
(c) optional one or more dyes and/or one or more solvents.

In a particular embodiment, the light-emitting layer EML includes (or essentially consists of) a composition including or consisting of:

(i) 0.1-10% by weight, preferably 0.5-5% by weight, in particular 1-3% by weight, of one or more organic molecules according to the invention E;
(ii) 5-99% by weight, preferably 15-85% by weight, in particular 20-75% by weight, of at least one host compound H; and
(iii) 0.9-94.9% by weight, preferably 14.5-80% by weight, in particular 24-77% by weight, of at least one further host compound D with a structure differing from the structure of the molecules according to the invention; and
(iv) optionally 0-94% by weight, preferably 0-65% by weight, in particular 0-50% by weight, of a solvent; and
(v) optionally 0-30% by weight, in particular 0-20% by weight, preferably 0-5% by weight, of at least one further emitter molecule F with a structure differing from the structure of the molecules according to the invention.

Preferably, energy can be transferred from the host compound H to the one or more organic molecules according to the invention, in particular transferred from the first excited triplet state T1(H) of the host compound H to the first excited triplet state T1(E) of the one or more organic molecules according to the invention E and/or from the first excited singlet state S1(H) of the host compound H to the first excited singlet state S1(E) of the one or more organic molecules according to the invention E.

In one embodiment, the host compound H has a highest occupied molecular orbital HOMO(H) having an energy $E^{HOMO}(H)$ in the range of from −5 to −6.5 eV and the at least one further host compound D has a highest occupied molecular orbital HOMO(D) having an energy $E^{HOMO}$ (D), wherein $E^{HOMO}(H)>E^{HOMO}$ (D).

In a further embodiment, the host compound H has a lowest unoccupied molecular orbital LUMO(H) having an energy $E^{LUMO}(H)$ and the at least one further host compound D has a lowest unoccupied molecular orbital LUMO(D) having an energy $E^{LUMO}(D)$, wherein $E^{LUMO}(H)>E^{LUMO}$ (D).

In one embodiment, the host compound H has a highest occupied molecular orbital HOMO(H) having an energy $E^{HOMO}(H)$ and a lowest unoccupied molecular orbital LUMO(H) having an energy $E^{LUMO}(H)$, and the at least one further host compound D has a highest occupied molecular orbital HOMO(D) having an energy $E^{HOMO}$ (D) and a lowest unoccupied molecular orbital LUMO(D) having an energy $E^{LUMO}(D)$ the organic molecule according to the invention E has a highest occupied molecular orbital HOMO(E) having an energy $E^{HOMO}(E)$ and a lowest unoccupied molecular orbital LUMO(E) having an energy $E^{LUMO}(E)$, wherein $E^{HOMO}$ (H)>$E^{HOMO}$ (D) and the difference between the energy level of the highest occupied molecular orbital HOMO(E) of the organic molecule according to the invention E ($E^{HOMO}$ (E)) and the energy level of the highest occupied molecular orbital HOMO(H) of the host compound H ($E^{HOMO}$ (H)) is between −0.5 eV and 0.5 eV, more preferably between −0.3 eV and 0.3 eV, even more preferably between −0.2 eV and 0.2 eV or even between −0.1 eV and 0.1 eV; and $E^{LUMO}(H)>E^{LUMO}(D)$ and the difference between the energy level of the lowest unoccupied molecular orbital LUMO(E) of the organic molecule according to the invention E ($E^{LUMO}(E)$) and the energy level of the lowest unoccupied molecular orbital LUMO(D) of the at least one further host compound D ($E^{LUMO}(D)$) is between −0.5 eV and 0.5 eV, more preferably between −0.3 eV and 0.3 eV, even more preferably between −0.2 eV and 0.2 eV or even between −0.1 eV and 0.1 eV.

In one embodiment of the invention the host compound D and/or the host compound H is a thermally-activated delayed fluorescence (TADF)-material. TADF materials exhibit a $\Delta E_{ST}$ value, which corresponds to the energy difference between the first excited singlet state (S1) and the first excited triplet state (T1), of less than 2500 $cm^{-1}$. Preferably the TADF material exhibits a $\Delta E_{ST}$ value of less than 3000 $cm^{-1}$, more preferably less than 1500 $cm^{-1}$, even more preferably less than 1000 $cm^{-1}$ or even less than 500 $cm^{-1}$.

In one embodiment, the host compound D is a TADF material and the host compound H exhibits a $\Delta E_{ST}$ value of more than 2500 $cm^{-1}$. In a particular embodiment, the host compound D is a TADF material and the host compound H is selected from group consisting of CBP, mCP, mCBP, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole.

In one embodiment, the host compound H is a TADF material and the host compound D exhibits a $\Delta E_{ST}$ value of more than 2500 $cm^{-1}$. In a particular embodiment, the host compound H is a TADF material and the host compound D is selected from group consisting of T2T (2,4,6-tris(biphenyl-3-yl)-1,3,5-triazine), T3T (2,4,6-tris(triphenyl-3-yl)-1,3,5-trazine) and/or TST (2,4,6-tris(9,9'-spirobifluorene-2-yl)-1,3,5-triazine).

In a further aspect, the invention relates to an optoelectronic device including an organic molecule or a composition of the type described here, more particularly in the form of a device selected from the group consisting of organic light-emitting diode (OLED), light-emitting electrochemical cell, OLED sensor, more particularly gas and vapour sensors not hermetically externally shielded, organic diode, organic solar cell, organic transistor, organic field-effect transistor, organic laser and down-conversion element.

In a preferred embodiment, the optoelectronic device is a device selected from the group consisting of an organic light emitting diode (OLED), a light emitting electrochemical cell (LEC), and a light-emitting transistor.

In one embodiment of the optoelectronic device of the invention, the organic molecule according to the invention E is used as emission material in a light-emitting layer EML.

In one embodiment of the optoelectronic device of the invention, the light-emitting layer EML consists of the composition according to the invention described here.

When the optoelectronic device is an OLED, it may, for example, have the following layer structure:

1. substrate
2. anode layer, A
3. hole injection layer, HIL
4. hole transport layer, HTL
5. electron blocking layer, EBL
6. emitting layer, EML
7. hole blocking layer, HBL
8. electron transport layer, ETL
9. electron injection layer, EIL
10. cathode layer, C wherein the OLED only optionally includes each layer selected from the group of HIL, HTL, EBL, HBL, ETL, and EIL, and the different layers may be merged together into, e.g., one or more layers, and the OLED may include more than one layer of each layer type defined above.

Furthermore, the optoelectronic device may, in one embodiment, include one or more protective layers protecting the device from damaging exposure to harmful species in the environment including, for example, moisture, vapor and/or gases.

In one embodiment of the invention, the optoelectronic device is an OLED, with the following inverted layer structure:

1. substrate
2. cathode layer, C
3. electron injection layer, EIL
4. electron transport layer, ETL
5. hole blocking layer, HBL
6. emitting layer, EML
7. electron blocking layer, EBL
8. hole transport layer, HTL
9. hole injection layer, HIL
10. anode layer A wherein the OLED only optionally includes each layer selected from the group of HIL, HTL, EBL, HBL, ETL, and EIL, and the different layers may be merged into, one or more layers, and the OLED may include more than one layer of each layer types defined above.

In one embodiment of the invention, the optoelectronic device is an OLED, which may have a stacked architecture. In this architecture, contrary to the typical arrangement in which the OLEDs are placed side by side, the individual units are stacked on top of each other. Blended light may be generated with OLEDs exhibiting a stacked architecture, in particular white light may be generated by stacking blue, green and red OLEDs. Furthermore, the OLED exhibiting a stacked architecture may include a charge generation layer (CGL), which is typically located between two OLED subunits and typically consists of a n-doped and p-doped layer with the n-doped layer of one CGL being typically located closer to the anode layer.

In one embodiment of the invention, the optoelectronic device is an OLED, which includes two or more emission layers between anode and cathode. In particular, this so-called tandem OLED includes three emission layers, wherein one emission layer emits red light, one emission layer emits green light and one emission layer emits blue light, and optionally may include further layers such as charge generation layers, blocking or transporting layers between the individual emission layers. In a further embodiment, the emission layers are adjacently stacked. In a further embodiment, the tandem OLED includes a charge generation layer between each two emission layers. In addition, adjacent emission layers or emission layers separated by a charge generation layer may be merged.

The substrate may be formed by any material or composition of materials. Most frequently, glass slides are used as substrates. Alternatively, thin metal layers (e.g., copper, gold, silver or aluminum films) or plastic films or slides may be used. This may allow for a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C is transparent. Preferably, the anode layer A includes a large content or even consists of transparent conductive oxides (TCOs). Such anode layer A may, for example, include indium tin oxide, aluminum zinc oxide, fluorine doped tin oxide, indium zinc oxide, PbO, SnO, zirconium oxide, molybdenum oxide, vanadium oxide, tungsten oxide, graphite, doped Si, doped Ge, doped GaAs, doped polyaniline, doped polypyrrol and/or doped polythiophene.

The anode layer A (essentially) may consist of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may include poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may, for example, include PEDOT:PSS (poly-3,4-ethylendioxy thiophene:polystyrene sulfonate), PEDOT (poly-3,4-ethylendioxy thiophene), mMTDATA (4,4',4"-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)benzidine), HAT-CN (2,3,6,7,10,11-hexacyano-1,4,5,8,9,12-hexaazatriphenyle) and/or Spiro-NPD (N,N'-diphenyl-N,N'-bis-(1-naphthyl)-9,9'-spirobifluorene-2,7-diamine).

Adjacent to the anode layer A or hole injection layer (HIL), a hole transport layer (HTL) is typically located. Herein, any hole transport compound may be used. For example, electron-rich heteroaromatic compounds such as triarylamines and/or carbazoles may be used as hole transport compound. The HTL may decrease the energy barrier between the anode layer A and the light-emitting layer EML. The hole transport layer (HTL) may also be an electron blocking layer (EBL). Preferably, hole transport compounds bear comparably high energy levels of their triplet states T1. For example, the hole transport layer (HTL) may include a star-shaped heterocycle such as tris(4-carbazoyl-9-ylphenyl)amine (TCTA), poly-TPD (poly(4-butylphenyl-diphenylamine)), NPD (2,2'-dimethyl-N,N'-di-[(1-naphthyl)-N,N'-diphenyl]-1,1'-biphenyl-4,4'-diamine), TAPC (4,4'-cyclohexyliden-bis[N,N-bis(4-methylphenyl) benzenamine]), 2-TNATA (4,4',4"-tris[2-naphthyl(phenyl) amino]triphenylamine), Spiro-TAD, DNTPD, NPB, NPNPB, MeO-TPD, HAT-CN and/or Tris-Pcz (9,9'-diphenyl-6-(9-phenyl-9H-carbazol-3-yl)-9H,9'H-3,3'-bicarbazole). In addition, the HTL may include a p-doped layer, which may be composed of an inorganic or organic dopant in an organic hole-transporting matrix. Transition metal oxides such as vanadium oxide, molybdenum oxide or tungsten oxide may, for example, be used as inorganic dopant. Tetrafluorotetracyanoquinodimethane (F4-TCNQ), copper-pentafluorobenzoate (Cu(I)pFBz) or transition metal complexes may, for example, be used as organic dopant.

The EBL may, for example, include mCP (1,3-bis(carbazol-9-yl)benzene), TCTA, 2-TNATA, mCBP (3,3-di(9H-carbazol-9-yl)biphenyl), tris-Pcz, CzSi (9-(4-tert-Butylphenyl)-3,6-bis(triphenylsilyl)-9H-carbazole), and/or DCB (N,N'-dicarbazolyl-1,4-dimethylbenzene).

Adjacent to the hole transport layer (HTL), the light-emitting layer EML is typically located. The light-emitting layer EML includes at least one light emitting molecule. Particularly, the EML includes at least one light emitting molecule according to the invention E. In one embodiment, the light-emitting layer includes only the organic molecules according to the invention. Typically, the EML additionally includes one or more host materials H. For example, the host material H is selected from CBP (4,4'-bis-(N-carbazolyl)-biphenyl), mCP, mCBP Sif87 (dibenzo[b,d]thiophen-2-yltriphenylsilane), CzSi, Sif88 (dibenzo[b,d]thiophen-2-yl)diphenylsilane), DPEPO (bis[2-(diphenylphosphino)phenyl] ether oxide), 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine). The host material H typically should be selected to exhibit first triplet (T1) and first singlet (S1) energy levels, which are energetically higher than the first triplet (T1) and first singlet (S1) energy levels of the organic molecule.

In one embodiment of the invention, the EML includes a so-called mixed-host system with at least one hole-dominant host and one electron-dominant host. In a particular embodiment, the EML includes exactly one light emitting organic molecule according to the invention and a mixed-host system including T2T as the electron-dominant host and a host selected from CBP, mCP, mCBP, 9-[3-(dibenzofuran-2-yl) phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as the hole-dominant host. In a further embodiment the EML includes 50-80% by weight, preferably 60-75% by weight of a host selected from CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole; 10-45% by weight, preferably 15-30% by weight of T2T and 5-40% by weight, preferably 10-30% by weight of light emitting molecule according to the invention.

Adjacent to the light-emitting layer EML, an electron transport layer (ETL) may be located. Herein, any electron transporter may be used. Exemplarily, electron-poor compounds such as, e.g., benzimidazoles, pyridines, triazoles, oxadiazoles (e.g., 1,3,4-oxadiazole), phosphinoxides and sulfone, may be used. An electron transporter may also be a star-shaped heterocycle such as 1,3,5-tri(1-phenyl-1H-benzo[d]imidazol-2-yl)phenyl (TPBi). The ETL may include NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl)diphenylsilane), BmPyPhB (1,3-bis[3,5-di(pyridin-3-yl)phenyl]benzene) and/or BTB (4,4'-bis-[2-(4,6-diphenyl-1,3,5-triazinyl)]-1,1'-biphenyl). Optionally, the ETL may be doped with materials such as Liq. The electron transport layer (ETL) may also block holes or a hole blocking layer (HBL) is introduced.

The HBL may, for example, include BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphinoxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluorene-2-yl)-1,3,5-triazine), and/or TCB/TCP (1,3,5-tris(N-carbazolyl)benzol/1,3,5-tris (carbazol)-9-yl) benzene).

Adjacent to the electron transport layer (ETL), a cathode layer C may be located. The cathode layer C may, for example, include or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer may also consist of (essentially) intransparent metals such as Mg, Ca or Al. Alternatively or additionally, the cathode layer C may also include graphite and or carbon nanotubes (CNTs). Alternatively, the cathode layer C may also consist of nanoscalic silver wires.

An OLED may further, optionally, include a protection layer between the electron transport layer (ETL) and the cathode layer C (which may be designated as electron injection layer (EIL)). This layer may include lithium fluoride, cesium fluoride, silver, Liq (8-hydroxyquinolinolatolithium), $Li_2O$, $BaF_2$, MgO and/or NaF.

Optionally, the electron transport layer (ETL) and/or a hole blocking layer (HBL) may also include one or more host compounds H.

In order to modify the emission spectrum and/or the absorption spectrum of the light-emitting layer EML further, the light-emitting layer EML may further include one or more further emitter molecules F. Such an emitter molecule F may be any emitter molecule known in the art. Preferably such an emitter molecule F is a molecule with a structure differing from the structure of the molecules according to the invention E. The emitter molecule F may optionally be a TADF emitter. Alternatively, the emitter molecule F may optionally be a fluorescent and/or phosphorescent emitter molecule which is able to shift the emission spectrum and/or the absorption spectrum of the light-emitting layer EML. Exemplarily, the triplet and/or singlet excitons may be transferred from the organic emitter molecule according to the invention to the emitter molecule F before relaxing to the ground state S0 by emitting light typically red-shifted in comparison to the light emitted by an organic molecule. Optionally, the emitter molecule F may also provoke two-photon effects (i.e., the absorption of two photons of half the energy of the absorption maximum).

Optionally, an optoelectronic device (e.g., an OLED) may, for example, be an essentially white optoelectronic device. For example, such a white optoelectronic device may include at least one (deep) blue emitter molecule and one or more emitter molecules emitting green and/or red light. Then, there may also optionally be energy transmittance between two or more molecules as described above.

As used herein, if not defined more specifically in the particular context, the designation of the colors of emitted and/or absorbed light is as follows:

violet: wavelength range of >380-420 nm;
deep blue: wavelength range of >420-480 nm;
sky blue: wavelength range of >480-500 nm;
green: wavelength range of >500-560 nm;
yellow: wavelength range of >560-580 nm;
orange: wavelength range of >580-620 nm;
red: wavelength range of >620-800 nm.

With respect to emitter molecules, such colors refer to the emission maximum. Therefore, for example, a deep blue emitter has an emission maximum in the range of from >420 to 480 nm, a sky blue emitter has an emission maximum in the range of from >480 to 500 nm, a green emitter has an emission maximum in a range of from >500 to 560 nm, and a red emitter has an emission maximum in a range of from >620 to 800 nm.

A deep blue emitter may preferably have an emission maximum of below 480 nm, more preferably below 470 nm, even more preferably below 465 nm or even below 460 nm. It will typically be above 420 nm, preferably above 430 nm, more preferably above 440 nm or even above 450 nm.

A green emitter has an emission maximum of below 560 nm, more preferably below 550 nm, even more preferably below 545 nm or even below 540 nm. It will typically be above 500 nm, more preferably above 510 nm, even more preferably above 515 nm or even above 520 nm.

Accordingly, a further aspect of the present invention relates to an OLED, which exhibits an external quantum efficiency at 1000 cd/m$^2$ of more than 8%, more preferably of more than 10%, more preferably of more than 13%, even more preferably of more than 15% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/m$^2$ of more than 100 h, preferably more than 200 h, more preferably more than 400 h, even more preferably more than 750 h or even more than 1000 h. Accordingly, a further aspect of the present invention relates to an OLED, whose emission exhibits a CIEy color coordinate of less than 0.45, preferably less than 0.30, more preferably less than 0.20 or even more preferably less than 0.15 or even less than 0.10.

A further aspect of the present invention relates to an OLED, which emits light at a distinct color point. According to the present invention, the OLED emits light with a narrow emission band (small full width at half maximum (FWHM)). In one aspect, the OLED according to the invention emits light with a FWHM of the main emission peak of less than 0.25 eV, preferably less than 0.20 eV, more preferably less than 0.17 eV, even more preferably less than 0.15 eV or even less than 0.13 eV.

A further aspect of the present invention relates to an OLED, which emits light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g. UHD-TVs. Accordingly, a further aspect of the present invention relates to an OLED, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

Another embodiment of the present invention relates to an OLED, which emits light with CIEx and CIEy color coordinates close to the CIEx (=0.170) and CIEy (=0.797) color coordinates of the primary color green (CIEx=0.170 and CIEy=0.797) as defined by ITU-R Recommendation BT.2020 (Rec. 2020) and thus is suited for the use in Ultra High Definition (UHD) displays, e.g. UHD-TVs. In this context, the term "close to" refers to the ranges of CIEx and CIEy coordinates provided at the end of this paragraph. In commercial applications, typically top-emitting (top-electrode is transparent) devices are used, whereas test devices as used throughout the present application represent bottom-emitting devices (bottom-electrode and substrate are transparent). Accordingly, a further aspect of the present invention relates to an OLED, whose emission exhibits a CIEx color coordinate of between 0.15 and 0.45 preferably between 0.15 and 0.35, more preferably between 0.15 and 0.30 or even more preferably between 0.15 and 0.25 or even between 0.15 and 0.20 and/or a CIEy color coordinate of between 0.60 and 0.92, preferably between 0.65 and 0.90, more preferably between 0.70 and 0.88 or even more preferably between 0.75 and 0.86 or even between 0.79 and 0.84.

Accordingly, a further aspect of the present invention relates to an OLED, which exhibits an external quantum efficiency at 14500 cd/m$^2$ of more than 8%, more preferably of more than 10%, more preferably of more than 13%, even more preferably of more than 15% or even more than 17%, or even more than 20% and/or exhibits an emission maximum between 485 nm and 560 nm, preferably between 500 nm and 560 nm, more preferably between 510 nm and 550 nm, even more preferably between 515 nm and 540 nm and/or exhibits a LT97 value at 14500 cd/m$^2$ of more than 100 h, preferably more than 250 h, more preferably more than 500 h, even more preferably more than 750 h or even more than 1000 h.

In a further embodiment of the invention, the composition has a photoluminescence quantum yield (PLQY) of more than 20%, preferably more than 30%, more preferably more than 35%, more preferably more than 40%, more preferably more than 45%, more preferably more than 50%, more preferably more than 55%, even more preferably more than 60% or even more than 70% at room temperature.

In a further aspect, the invention relates to a method for producing an optoelectronic component. In this case an organic molecule of the invention is used.

The optoelectronic device, in particular the OLED according to the present invention can be fabricated by any means of vapor deposition and/or liquid processing. Accordingly, at least one layer is prepared by means of a sublimation process,
prepared by means of an organic vapor phase deposition process,
prepared by means of a carrier gas sublimation process, and/or
solution processed or printed.

The methods used to fabricate the optoelectronic device, in particular the OLED according to the present invention are known in the art. The different layers are individually and successively deposited on a suitable substrate by means of subsequent deposition processes. The individual layers may be deposited using the same or differing deposition methods.

Vapor deposition processes, for example, include thermal (co)evaporation, chemical vapor deposition and physical vapor deposition. For active matrix OLED display, an AMOLED backplane is used as substrate. The individual layer may be processed from solutions or dispersions employing adequate solvents. Solution deposition process, for example, includes spin coating, dip coating and jet printing.

Liquid processing may optionally be carried out in an inert atmosphere (e.g., in a nitrogen atmosphere) and the solvent may be completely or partially removed by means known in the state of the art.

EXAMPLES

General synthesis scheme I

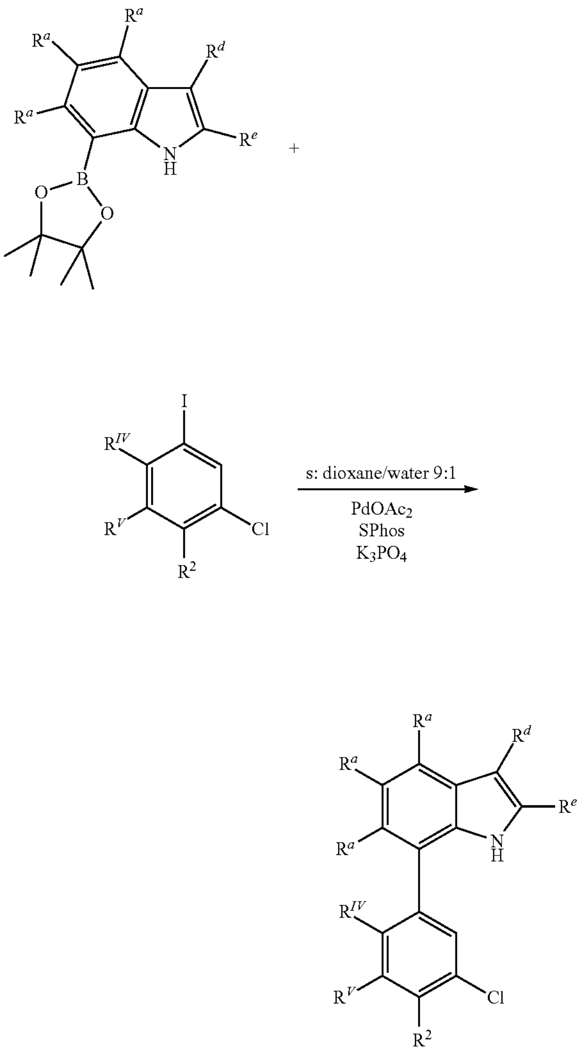

-continued

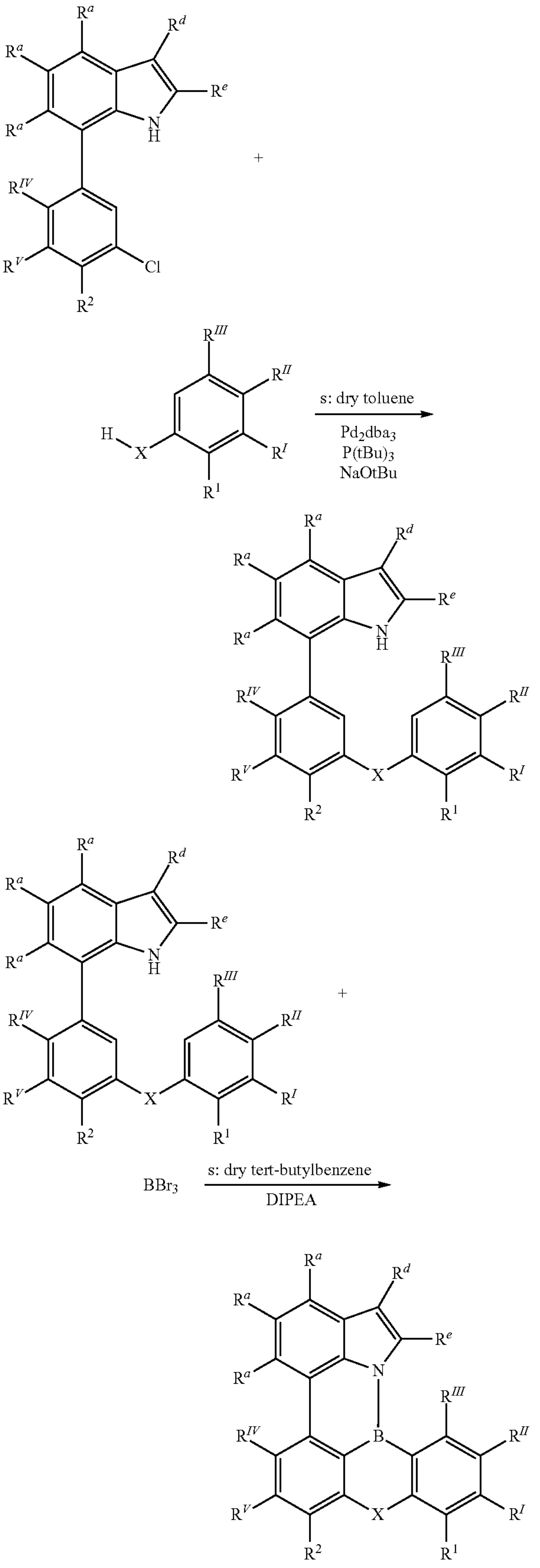

General synthesis scheme II

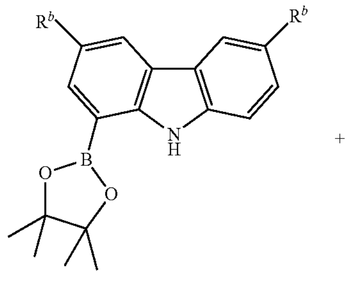

I0

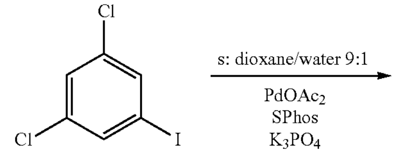

I0-1

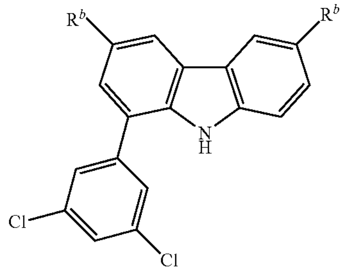

I-1

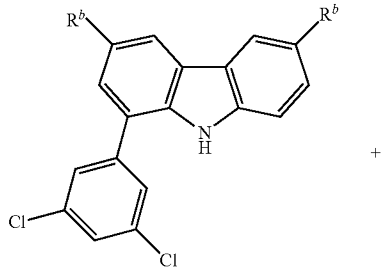

I-1

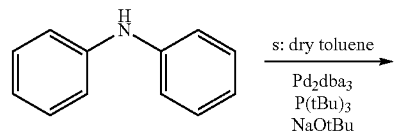

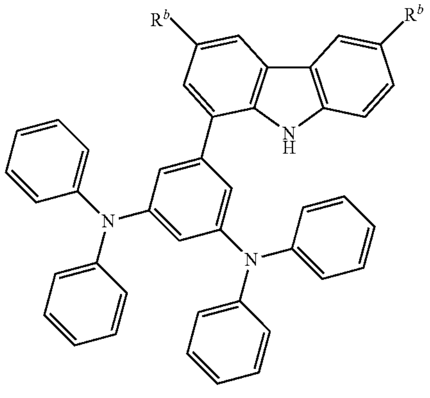

I-2

-continued

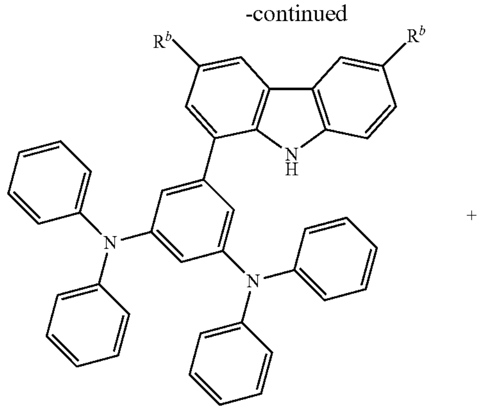

I-2

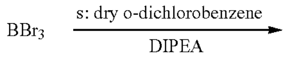

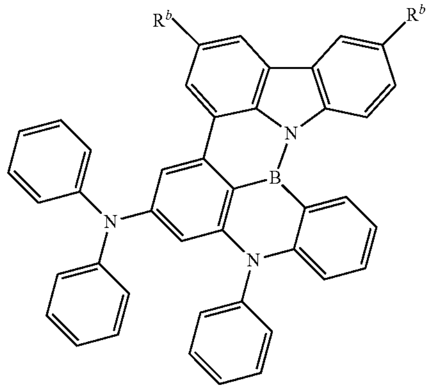

P

General Procedure for Synthesis:

AAV1: I0 (1.00 equivalents), 3,5-dichloro-iodobenzene (I0-1, 0.8 equivalents), palladium(II) acetate (0.03 equivalents), 2-dicyclohexylphosphino-2',6'-dimethoxybiphenyl (S-Phos, CAS: 657408-07-6, 0.06 equivalents) and tribasic potassium phosphate ($K_3PO_4$; 3.00 equivalents) were stirred under nitrogen atmosphere in a dioxane/water mixture at 90° C. for 12 h. After cooling down to room temperature (rt), the reaction mixture was extracted between DCM and brine and the phases were separated and then the solvent was removed under reduced pressure. The crude material was purified by column chromatography and I-1 was obtained with a yield of 84%. GC-MS: 313.02 m/z.

AAV2: I-1 (1.00 equivalents), diphenylamine (CAS: 122-39-4, 2.5 equivalents), tris(dibenzylideneacetone)dipalladium(0) (CAS: 51364-51-3, 0.01 equivalents), tri-tert-butyl phosphine (CAS: 13716-12-6, 0.04 equivalents) and sodium tert-butoxide (CAS: 865-48-5, 4.00 equivalents) were stirred under nitrogen atmosphere in dry toluene at 100° C. for 12 h. After cooling down to room temperature (rt) the reaction mixture was washed with water and brine and the phases were separated and then the solvent was removed under reduced pressure. The crude material was purified by recrystallization and I-2 was obtained with a yield of 45%. LC-MS: 578.40 m/z at rt: 4.69 min.

AAV3: I-2 (1.00 equivalents) was placed in a round bottom flask under nitrogen. The solvent (1,2-dichlorobenzene was added. Boron tribromide (CAS: 10294-33-4, 6.00 equivalents) was added dropwise and it was heated to 180° C. After cooling to rt, it was further cooled to 0° C. DIPEA (CAS: 7087-68-5, 10.00 equivalents) was added and it was stirred for 1 h. The reaction mixture was washed with water and the phases were separated and then the solvent was removed under reduced pressure. The crude material was purified by column chromatography and P was obtained with a yield of 32%. LC-MS: 586 m/z at rt: 5.73 min.

General synthesis scheme III

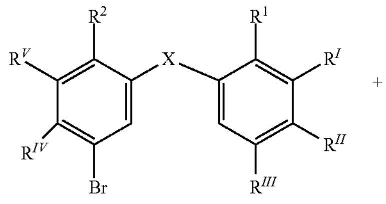

E1

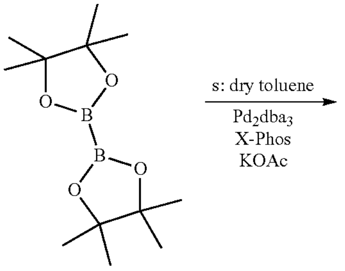

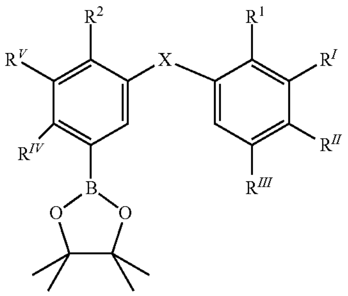

I-4

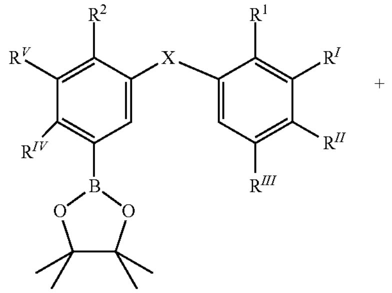

I-4

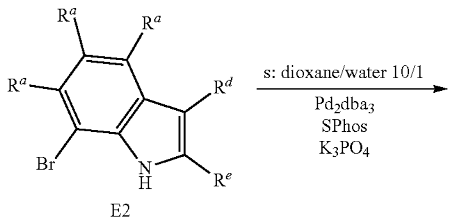

E2

-continued

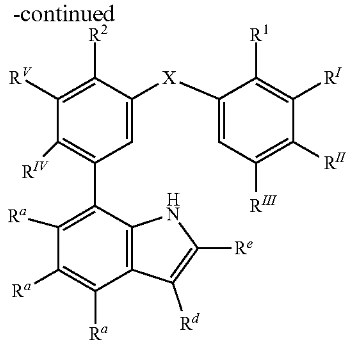

I-5

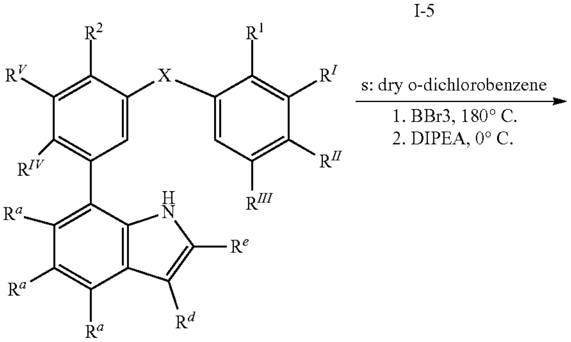

I-5

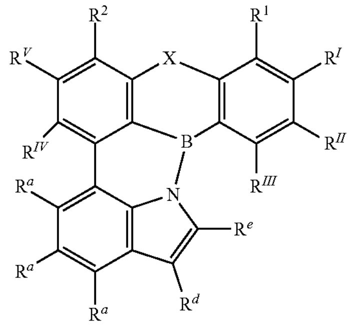

P-1

General Procedure for Synthesis:

AAV4: E1 (1.00 equivalents), bis(pinacolato)diboron (CAS: 73183-34-3, 1.0 equivalents), tris(dibenzylideneacetone)dipalladium (CAS: 51364-51-3, 0.02 equivalents), 2-dicyclohexylphosphino-2',4',6'-tri-isopropyl-1,1'-biphenyl (X-Phos, CAS: 564483-18-7, 0.08 equivalents) and potassium acetate (KOAc; CAS: 127-08-2, 2.00 equivalents) were stirred under nitrogen atmosphere in dry toluene at 105° C. for 24 h. After cooling down to room temperature (rt), the reaction mixture was extracted between ethyl acetate and brine and the combined organic layers were concentrated under reduced pressure. The crude material was purified by column chromatography or by recrystallization and I-4 was obtained as a solid.

AAV5: I-4 (1.00 equivalents), E2 (1.0 equivalents), tris (dibenzylideneacetone)dipalladium(0) (CAS: 51364-51-3, 0.01 equivalents), S-Phos (CAS: 657408-07-6, 0.04 equivalents) and potassium phosphate tribasic ($K_3PO_4$, CAS: 7778-53-2, 3.00 equivalents) were stirred under nitrogen atmosphere in a dioxane/water mixture at 100° C. for 2 h. After cooling down to room temperature (rt), the reaction mixture was washed with water and brine. The combined organic layers were dried over MgSO4, filtered and concentrated under reduced pressure. The crude material was purified by recrystallization or column chromatography and I-5 was obtained as a solid.

AAV6: I-5 (1.00 equivalents) was placed in a round bottom flask under nitrogen. The solvent (1,2-dichlorobenzene was added. Boron tribromide (CAS: 10294-33-4, 4.00 equivalents) was added dropwise and it was heated to 180° C. overnight. After cooling to rt, it was further cooled to 0° C. DIPEA (CAS: 7087-68-5, 10.00 equivalents) was added and it was stirred for 1 h. The reaction mixture was washed with water and the phases were separated and then the solvent was removed under reduced pressure. The crude material was purified by column chromatography or by recrystallization and P-1 was obtained as a solid.

General synthesis scheme IV

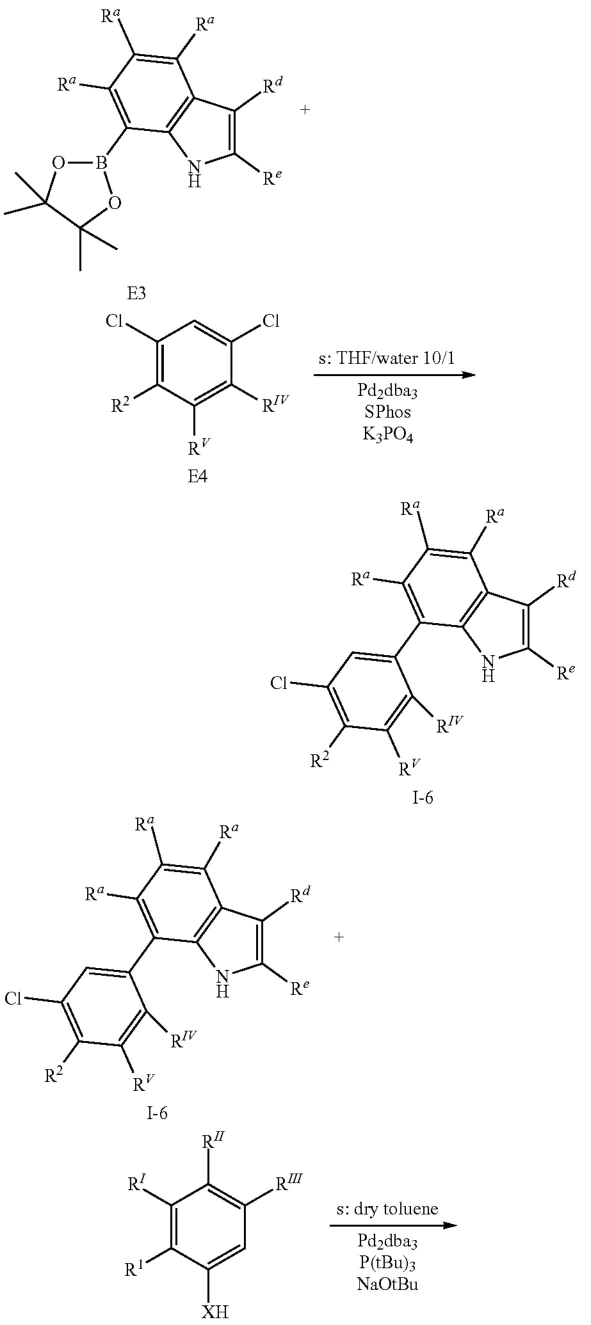

E3

E4

I-6

I-6

E5

-continued

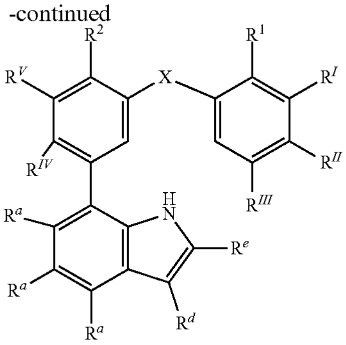

I-7

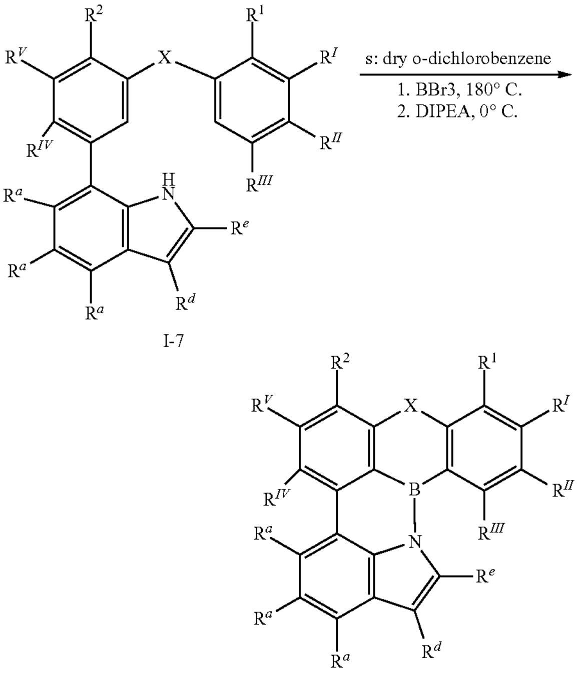

I-7

P-2

General Procedure for Synthesis:

AAV7: E3 (2.00 equivalents), E4 (1.0 equivalents), tris (dibenzylideneacetone)dipalladium(0) (CAS: 51364-51-3, 0.01 equivalents), 2-dicyclohexylphosphino-2',6'-dimethoxybiphenyl (S-Phos, CAS: 657408-07-6, 0.04 equivalents) and tribasic potassium phosphate ($K_3PO_4$; 3.00 equivalents) were stirred under nitrogen atmosphere in a THF/water mixture at 80 TC. After cooling down to room temperature (rt), the reaction mixture was extracted between ethyl acetate and brine and the phases were separated and then the solvent was removed under reduced pressure. The crude material was purified by column chromatography or by recrystallization and I-6 was obtained as solid.

AAV8: I-6 (1.00 equivalents), E5 (1.00 equivalents), tris(dibenzylideneacetone)dipalladium(0) (CAS: 51364-51-3, 0.01 equivalents), tri-tert-butyl phosphine (CAS: 13716-12-6, 0.04 equivalents) and sodium tert-butoxide (CAS: 865-48-5, 3.00 equivalents) were stirred under nitrogen atmosphere in dry toluene at 110° C. for 72 h. After cooling down to room temperature (rt), the reaction mixture was washed with water and brine and the phases were separated and then the solvent was removed under reduced pressure. The crude material was purified by recrystallization or column chromatography and I-7 was obtained as a solid.

AAV9: I-7 (1.00 equivalents) was placed in a round bottom flask under nitrogen. The solvent (1,2-dichlorobenzene was added. Boron tribromide (CAS: 10294-33-4, 4.00 equivalents) was added dropwise and it was heated to 180° C. After cooling to rt, it was further cooled to 0° C. DIPEA (CAS: 7087-68-5, 10.00 equivalents) was added and it was stirred for 1 h. The reaction mixture was washed with water and the phases were separated and then the solvent was removed under reduced pressure. The crude material was purified by column chromatography or by recrystallization and P-2 was obtained as a solid.

General synthesis scheme V

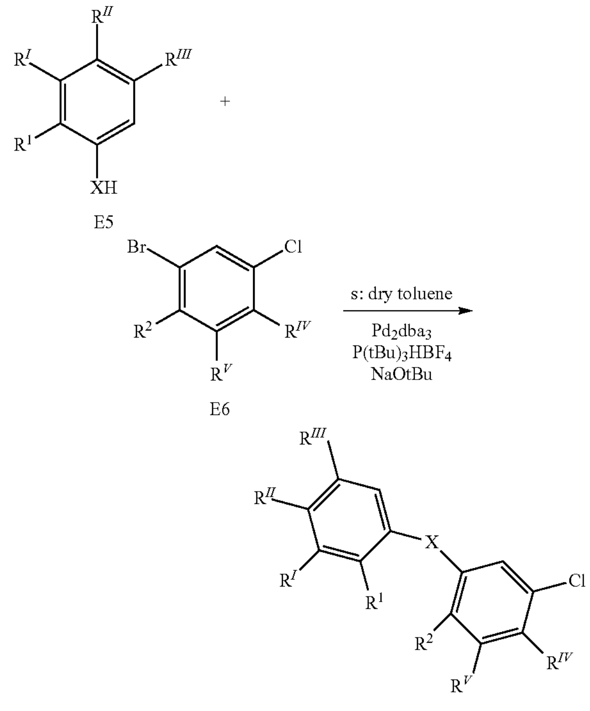

E5

E6

I-8

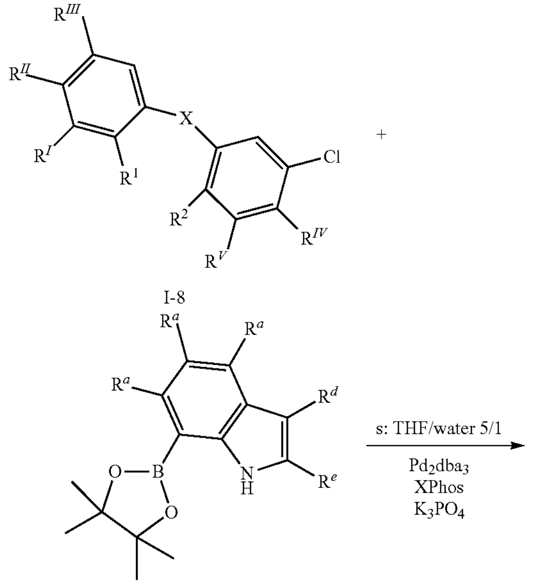

I-8

E3

-continued

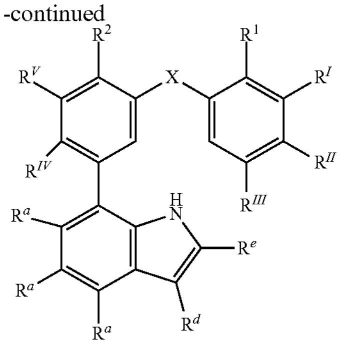

I-7

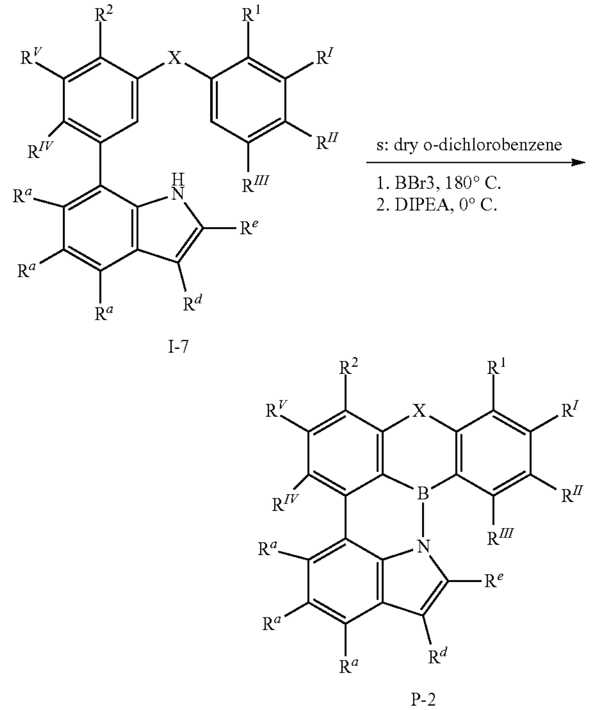

I-7

P-2

General Procedure for Synthesis:

AAV10: E5 (1.05 equivalents), E6 (1.00 equivalents), tris(dibenzylideneacetone)dipalladium (0) (CAS: 51364-51-3, 0.005 equivalents), sodium tert-butoxide (NaOtBu, CAS: 865-48-5, 1.50 equivalents) and td-tert-butylphosphonium tetrafluoroborate ($P(tBu)_3HBF_4$; CAS: 131274-22-1, 0.02 equivalents) were stirred under nitrogen atmosphere in dry toluene at 100° C. overnight. After cooling down to room temperature (rt), the reaction mixture was added water, the phases were separated and the combined organic layers dried over $MgSO_4$, filtered and concentrated under reduced pressure. The crude material was purified by column chromatography or by recrystallization and I-8 was obtained as solid.

AAV11: I-8 (1.00 equivalents), E3 (1.2 equivalents), tris(dibenzylideneacetone)dipalladium(0) (CAS: 51364-51-3, 0.01 equivalents), X-Phos (CAS: 564483-18-7, 0.04 equivalents) and potassium phosphate tribasic ($K_3PO_4$, CAS: 7778-53-2, 2.00 equivalents) were stirred under nitrogen atmosphere in a THF/water mixture at 80° C. for 96 h. After cooling down to room temperature (rt), the reaction mixture was washed with water and brine, the combined organic layers were dried over $MgSO_4$, filtered and concentrated under reduced pressure. The crude material was purified by recrystallization or column chromatography and I-7 was obtained as a solid.

The last reaction step was performed as described in AAV9, where 1,2-dichlorobenzene was used as the solvent and where the reaction temperature was 180° C.

General synthesis scheme VI

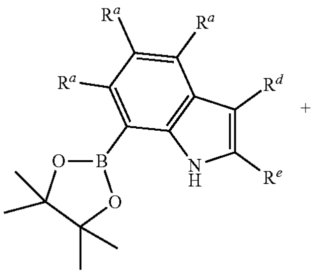

E3

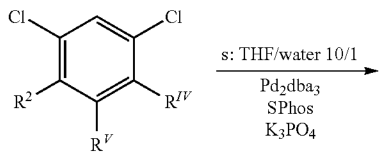

E4

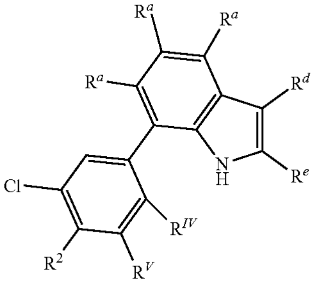

I-6

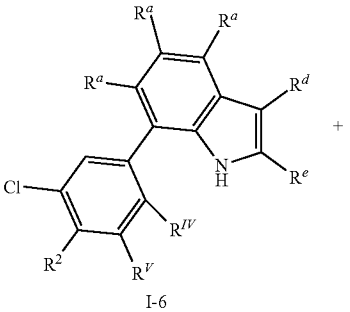

I-6

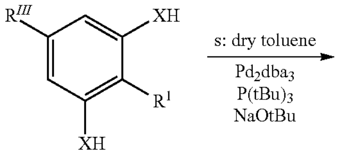

E7

-continued

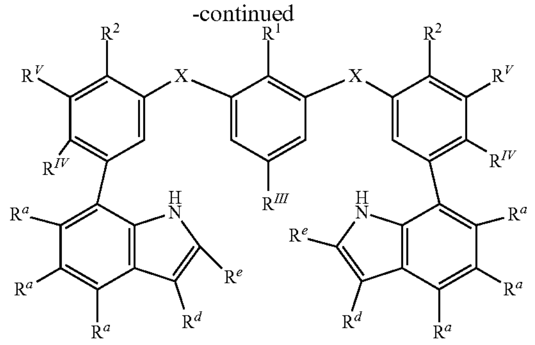

I-9

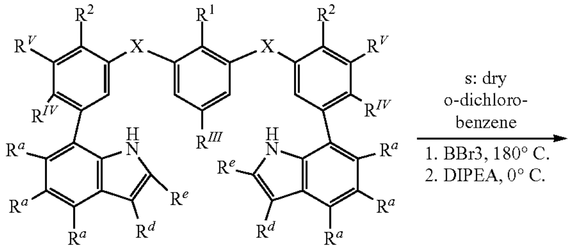

I-9

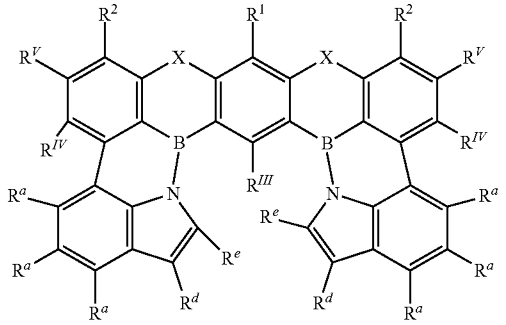

P-3

General Procedure for Synthesis:

The first reaction step was performed as described in AAV7.

AAV12: I-6 (2.00 equivalents), E7 (1.0 equivalents), tris(dibenzylideneacetone)dipalladium(0) (CAS: 51364-51-3, 0.01 equivalents), tri-tert-butyl phosphine (CAS: 13716-12-6, 0.04 equivalents) and sodium tert-butoxide (CAS: 865-48-5, 6.00 equivalents) were stirred under nitrogen atmosphere in dry toluene at 110° C. for 72 h. After cooling down to room temperature (rt), the reaction mixture extracted between ethyl acetate and brine and the phases were separated and the solvent was removed under reduced pressure. The crude material was purified by recrystallization or by column chromatography and I-9 was obtained as a solid.

AAV13: I-9 (1.00 equivalents) was placed in a round bottom flask under nitrogen. The solvent (1,2-dichlorobenzene was added. Boron tribromide (CAS: 10294-33-4, 6.00 equivalents) was added dropwise and it was heated to 180° C. After cooling to rt, it was further cooled to 0° C. DIPEA (CAS: 7087-68-5, 10.00 equivalents) was added and it was stirred for 1 h. The reaction mixture was washed with water and the phases were separated and then the solvent was removed under reduced pressure. The crude material was purified by column chromatography or recrystallization and P-3 was obtained as a solid.

General synthesis scheme VII

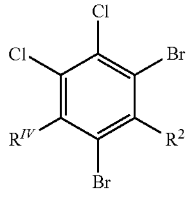

E8

+

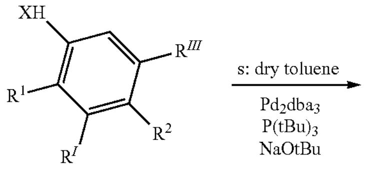

E5

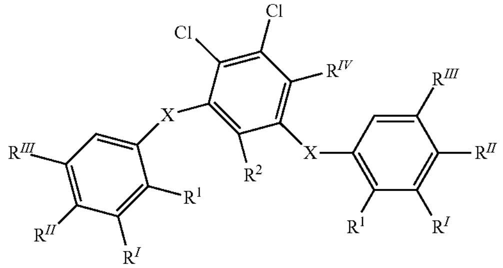

I-10

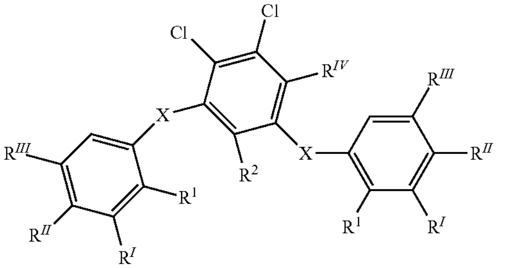

I-10

+

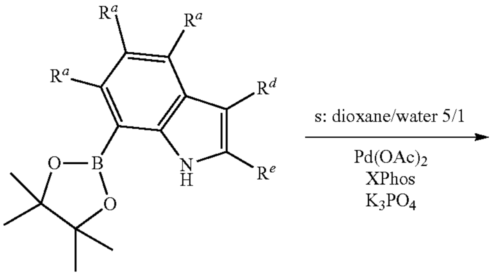

E3

-continued

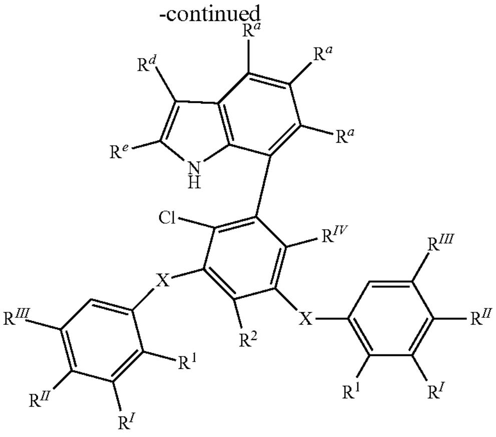

I-11

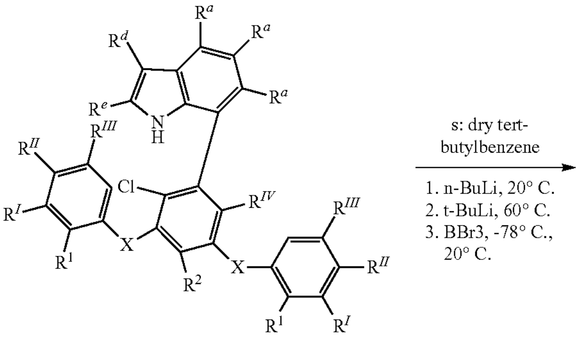

I-11

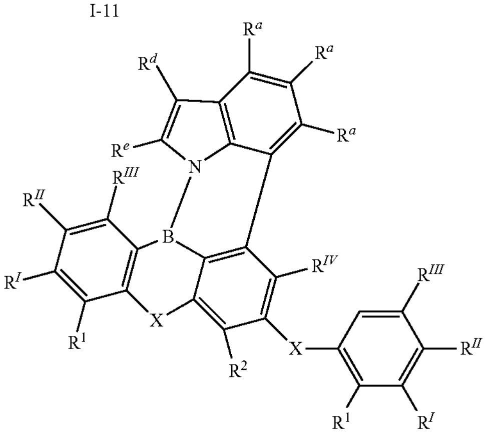

P-4

General Procedure for Synthesis:

AAV14: E5 (2.10 equivalents), E8 (1.00 equivalents), tris(dibenzylideneacetone)-dipalladium(0) (CAS: 51364-51-3, 0.01 equivalents), sodium tert-butoxide (NaOtBu, CAS: 865-48-5, 3.15 equivalents) and tri-tert-butylphosphine ($P(tBu)_3$; CAS: 13716-12-6, 0.04 equivalents) were stirred under nitrogen atmosphere in dry toluene at 110° C. for 1 h. After cooling down to room temperature (rt), the reaction mixture was extracted between ethyl acetate and brine and the combined organic layers were concentrated under reduced pressure. The crude material was purified by column chromatography or by recrystallization and I-10 was obtained as solid.

AAV15: 1-10 (1.00 equivalents), E3 (1.2 equivalents), Palladium(II) acetate (CAS: 3375-31-3, 0.06 equivalents), X-Phos (CAS: 564483-18-7, 0.12 equivalents) and potassium phosphate tribasic ($K_3PO_4$, CAS: 7778-53-2, 3.00 equivalents) were stirred under nitrogen atmosphere in a dioxane/water mixture at 100° C. for 55 h. After cooling down to room temperature (rt), the reaction mixture was extracted between toluene and brine and the combined organic layers were concentrated under reduced pressure.

The crude material was purified by recrystallization or column chromatography and I-11 was obtained as a solid.

AAV0-3:

Under nitrogen, I-11 (1.00 equivalents) was dissolved in tert-butylbenzene. At 20° C., n-BuLi (2.5 M in hexane, CAS: 109-72-8, 1.1 equivalents) was injected and the mixture stirred for 15 min. Subsequently, t-BuLi (1 M in pentane, CAS: 594-19-4, 2.2 equivalents) was added and the mixture stirred at 60° C. for 2 h. Subsequently, the mixture was cooled down below −60° C., followed by dropwise addition of $BBr_3$ CAS: 10294-33-4, 1.3 equivalents). The mixture was allowed to warm to rt, followed by stirring at rt for 16 h. The mixture was extracted between ethyl acetate and water and the combined organic layers were concentrated under reduced pressure. The crude was purified with column chromatography or by recrystallization to obtain the target compound P-4 as a solid.

General synthesis scheme VIII

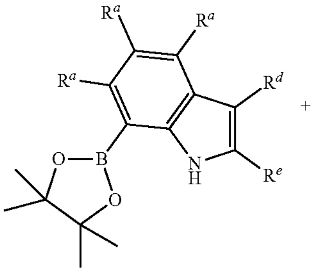

E3

+

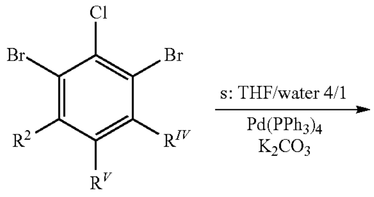

E9

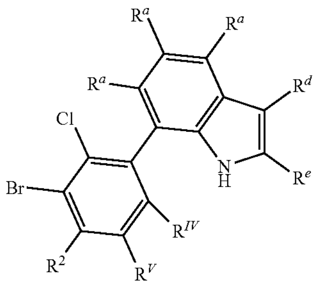

I-12

-continued

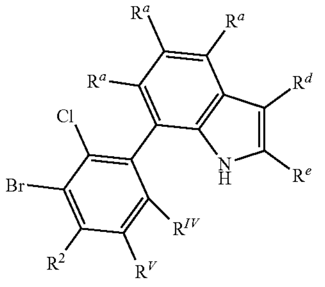

I-12

+

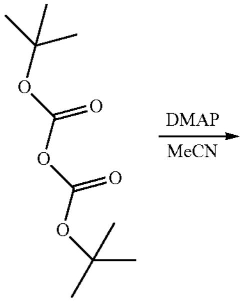

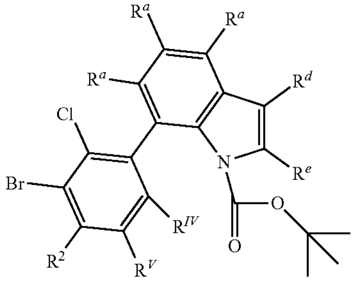

I-13

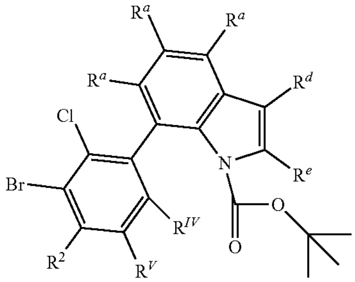

I-13

+

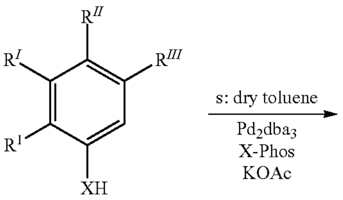

E5

-continued

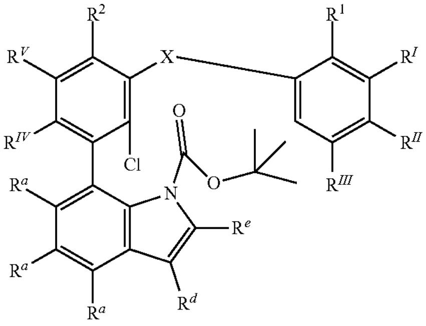

I-14

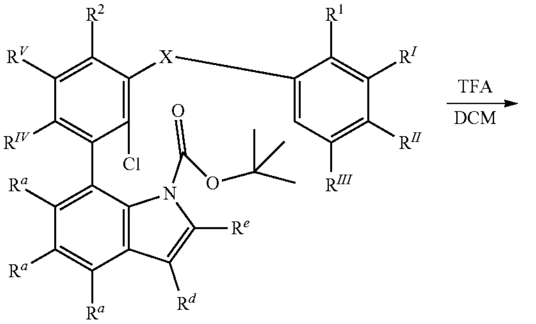

I-14

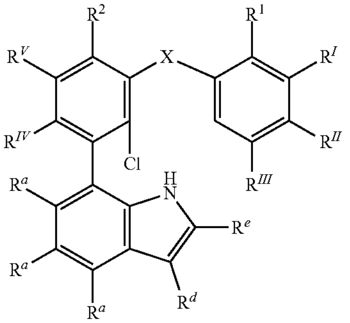

I-15

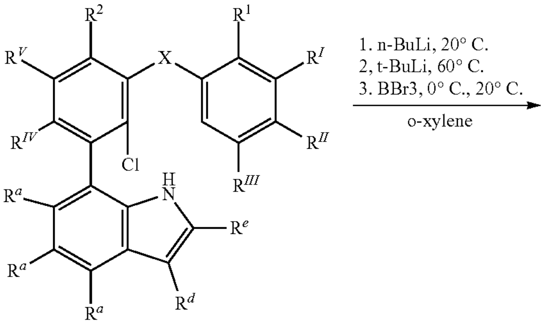

I-15

-continued

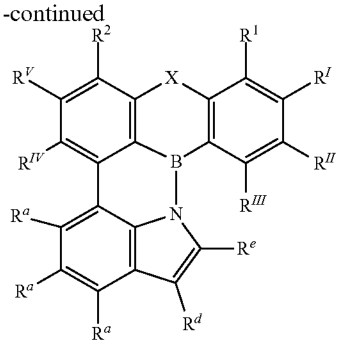

P-5

General Procedure for Synthesis:

AAV16: E3 (1.00 equivalents), E9 (1.1 equivalents), Tetrakis(triphenylphosphine)palladium (0) ($Pd(PPh_3)_4$, CAS: 14221-01-3, 0.02 equivalents) and potassium carbonate ($K_2CO_3$; 2.00 equivalents) were stirred under nitrogen atmosphere in a THF/water mixture at 80° C. for 48 h. After cooling down to room temperature (rt), the phases were separated and the aqueous layer was extracted with ethyl acetate. The combined organic layers were dried over $MgSO_4$, filtered and concentrated under reduced pressure. The crude material was purified by column chromatography or by recrystallization and I-12 was obtained as solid.

AAV17: I-12 (1.00 equivalents), Di-tert-butyl dicarbonate (CAS: 24424-99-5, 1.4 equivalents), 4-Dimethylaminopyridin (4-DMAP, CAS: 1122-58-3, 1.00 equivalents) were stirred under nitrogen atmosphere in dry MeCN at room temperature for 16 h. The reaction mixture was added NaOH solution (1 M), the phases were separated and the aqueous layer was extracted with ethyl acetate. The combined organic layers were washed with water and brine, dried over MgSO4, filtered and concentrated under reduced pressure. The crude material was purified by column chromatography or by recrystallization and I-13 was obtained as solid.

AAV18: I-13 (1.00 equivalents), E5 (1.20 equivalents), tris(dibenzylideneacetone)dipalladium(0) (CAS: 51364-51-3, 0.01 equivalents), tri-tert-butylphosphonium tetrafluoroborate (CAS: 131274-22-1, 0.04 equivalents) and sodium tert-butoxide (CAS: 865-48-5, 2.00 equivalents) were stirred under nitrogen atmosphere in dry toluene at 110° C. for 16 h. After cooling down to room temperature (rt), the reaction mixture was washed with water and the aqueous layer was extracted with ethyl acetate. The combined organic layers were dried over $MgSO_4$, filtered and concentrated under reduced pressure. The crude material was purified by recrystallization or column chromatography and I-14 was obtained as a solid.

AAV19: I-14 (1.00 equivalents) was solved in dichloromethane (DCM). trifluoroacetic Acid (CAS: 76-05-1; 99.7 equivalents) was added at room temperature and the reaction mixture was stirred for 2 h. Subsequently, the phases were separated and the TFA layer was extracted with DCM. The combined organic layers were washed with a saturated $NaHCO_3$ solution and water, dried over $MgSO_4$ and filtered. After removal of the solvent under reduced pressure, the crude material was purified by recrystallization or column chromatography and I-15 was obtained as a solid.

AAV20: I-15 (1.00 equivalents) was placed in a round bottom flask under nitrogen. The solvent o-xylene was added. At 0° C., n-butyllithium (2.5 M in hexane, CAS: 109-72-8, 1.10 equivalents) was added dropwise and the mixture stirred for 15 min. Subsequently, tert-Butyllithium (1.6 M in hexane, CAS: 594-19-4, 2.20 equivalents) was added dropwise, the temperature was increased to 60° C. and the reaction mixture was stirred for 2 h. The reaction mixture was cooled down to room temperature. At 0° C., boron tribromide (1 M in heptane, CAS: 10294-33-4, 1.30 equivalents) was added dropwise, the mixture stirred at 0° C. for 1 h, followed by stirring at rt for 6 h. The reaction mixture was poured in 5% NH3 solution, the phases were separated and the organic layer washed with water. The organic layer was dried over $MgSO_4$, filtered and concentrated under reduced pressure. The crude material was purified by column chromatography or by recrystallization and P-5 was obtained as a solid.

General synthesis scheme IX

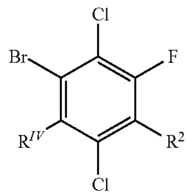

E10

+

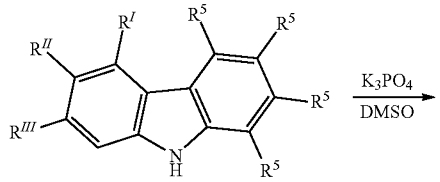

E11

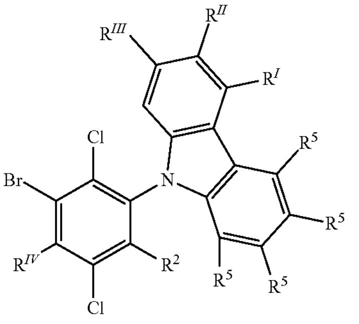

I-16

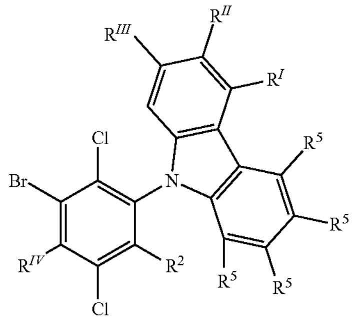

I-16

+

-continued

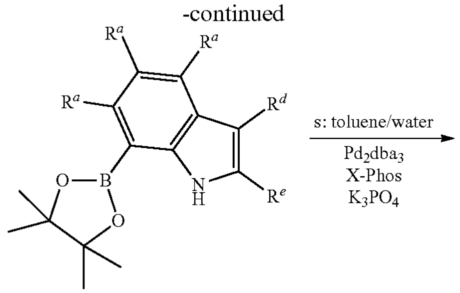

E3

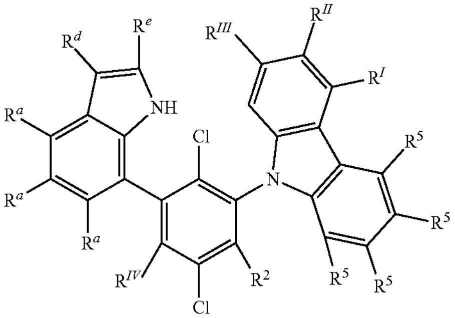

I-17

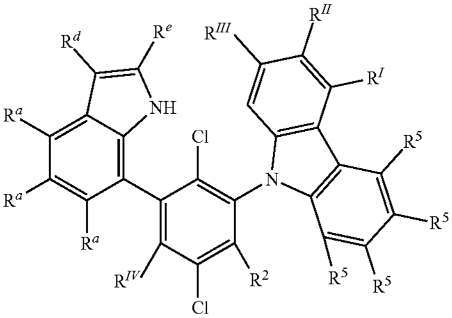

+

I-17

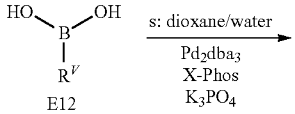

E12

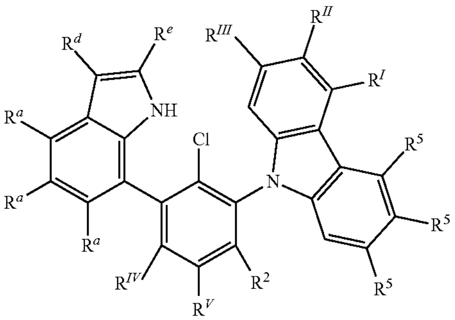

I-18

-continued

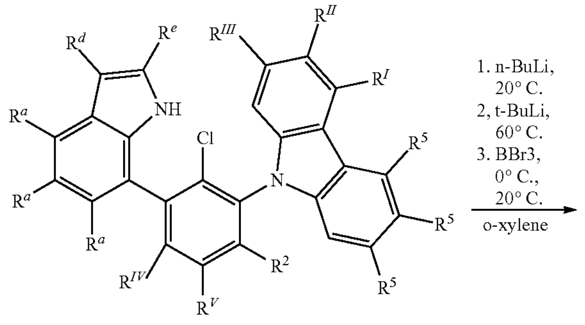

I-18

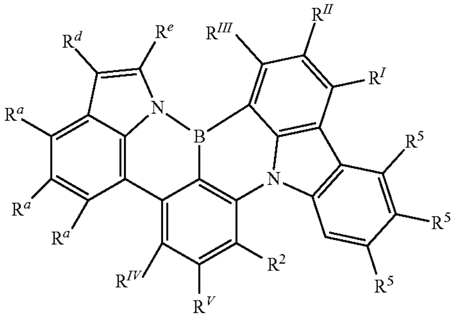

P-6

General Procedure for Synthesis:

AAV21: In dry DMSO, E10 (1.10 equivalents), E11 (1.00 equivalents) and tribasic potassium phosphate (1.50 equivalents, CAS: 7778-53-2) were heated at 100° C. for 48 h. After cooling down to rt, the mixture was poured onto ice water. The precipitate was filtered off, washed with water and ethanol and collected. The crude was purified by recrystallization or column chromatography to yield compound I-16 as a solid.

AAV22: Under nitrogen, in a mixture of toluene/water (8:1 by vol.), I-16 (1.00 equivalents) was reacted with E3 (1.00 equivalents), tribasic potassium phosphate (1.80 equivalents, CAS: 7778-53-2), tris(dibenzylideneacetone) dipalladium(0) (0.01 equivalents, CAS: 51364-51-3) and X-Phos (0.04 equivalents, CAS: 564483-18-7) at 95° C. for 48 h. After cooling down to rt, the phases were separated and the aqueous layer was extracted with ethyl acetate. The combined organic layers were dried over $MgSO_4$, filtered and concentrated under reduced pressure. The crude was purified by column chromatography or recrystallization to yield compound I-17 as a solid.

AAV23: Under nitrogen, in a mixture of dioxane/water (5:1 by vol.), I-17 (1.00 equivalents) was reacted with E12 (1.50 equivalents), tribasic potassium phosphate (3.00 equivalents, CAS: 7778-53-2), tris(dibenzylideneacetone) dipalladium(0) (0.01 equivalents, CAS: 51364-51-3) and X-Phos (0.04 equivalents, CAS: 564483-18-7) at 100° C. for 5 h. After cooling down to rt, the phases were separated and the aqueous layer was extracted with ethyl acetate. The combined organic layers were dried over $MgSO_4$, filtered and concentrated under reduced pressure. The crude was purified by column chromatography or recrystallization to yield compound I-18 as a solid.

The last reaction step was performed as described in AAV20.

General synthesis scheme X

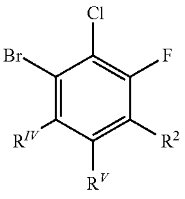

E13

+

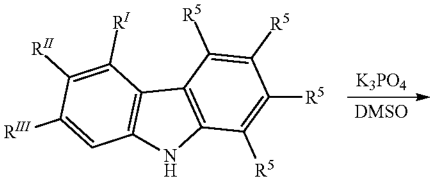

E11

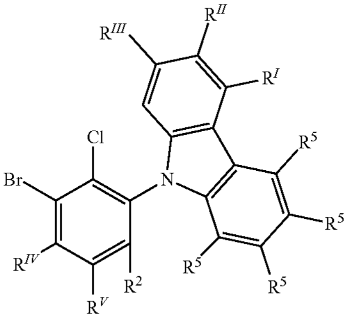

I-19

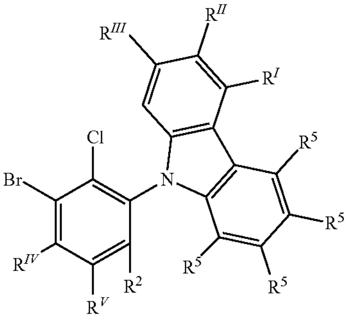

I-19

+

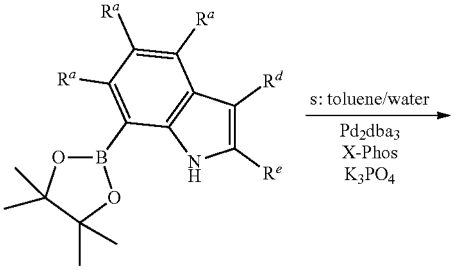

E3

-continued

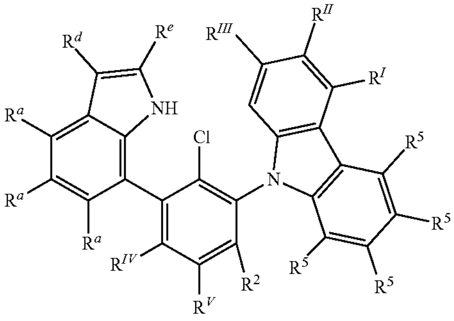

I-20

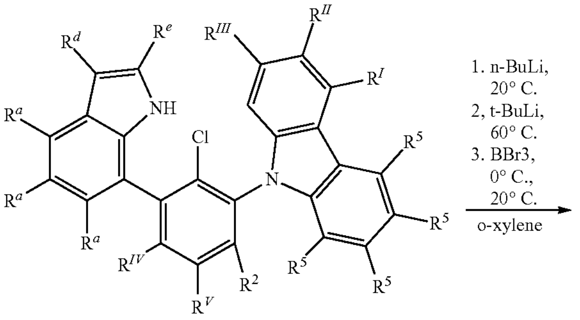

I-20

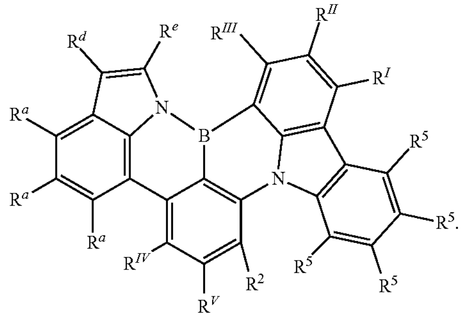

P-7

General Procedure for Synthesis:

AAV24: In dry DMSO, E13 (1.10 equivalents), E11 (1.00 equivalents) and tribasic potassium phosphate (1.50 equivalents, CAS: 7778-53-2) were heated at 100° C. for 48 h. After cooling down to rt, the mixture was poured onto ice water. The precipitate was filtered off, washed with water and ethanol and collected. The crude was purified by recrystallization or column chromatography to yield compound I-19 as a solid.

AAV25: Under nitrogen, in a mixture of toluene/water (8:1 by vol.), I-19 (1.00 equivalents) was reacted with E3 (1.20 equivalents), tribasic potassium phosphate (2.00 equivalents, CAS: 7778-53-2), tris(dibenzylideneacetone) dipalladium(0) (0.01 equivalents, CAS: 51364-51-3) and X-Phos (0.04 equivalents, CAS: 564483-18-7) at 100° C. for 5 h. After cooling down to rt, the phases were separated and the aqueous layer was extracted with ethyl acetate. The combined organic layers were dried over $MgSO_4$, filtered and concentrated under reduced pressure. The crude was purified by column chromatography or recrystallization to yield compound I-20 as a solid.

The last reaction step was performed as described in AAV0-3.

General synthesis scheme XI

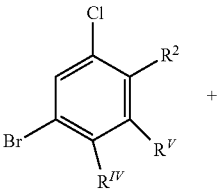

E14

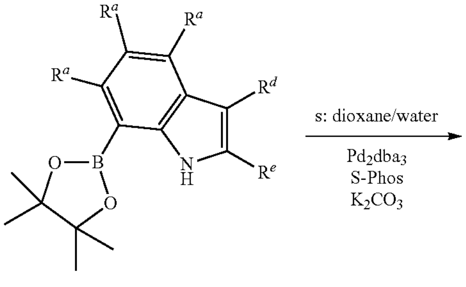

E3

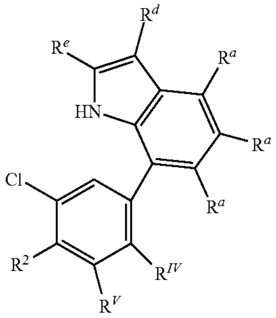

I-21

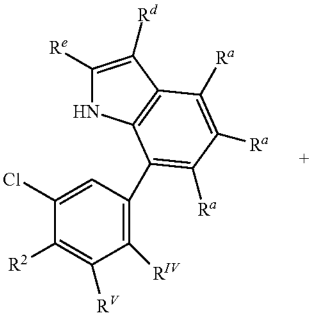

I-21

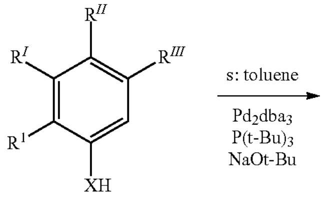

E5

-continued

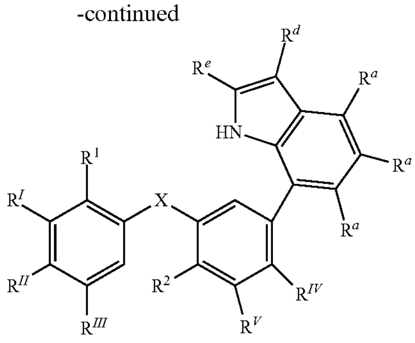

I-22

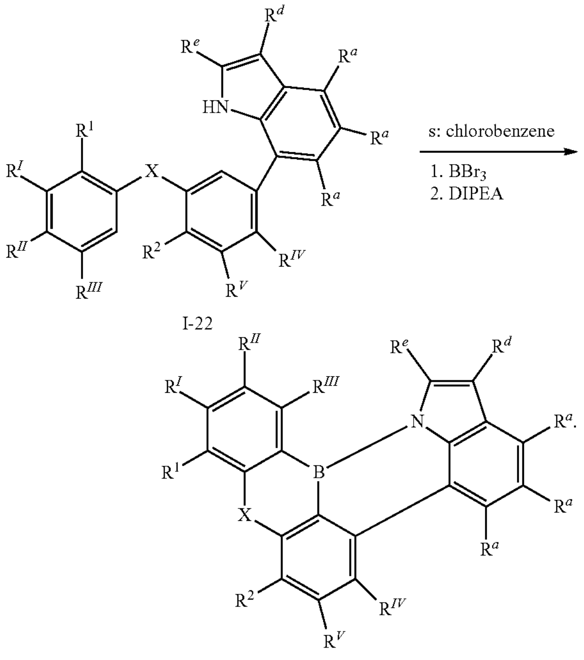

I-22

P-8

General Procedure for Synthesis:

AAV26: Under nitrogen, in a mixture of dioxane/water (10:1 by vol.), E14 (1.00 equivalents) was reacted with E3 (1.00 equivalents), potassium carbonate (2.00 equivalents, CAS: 584-08-7), tris(dibenzylideneacetone)dipalladium(0) (0.02 equivalents, CAS: 51364-51-3) and S-Phos (0.08 equivalents, CAS: 657408-07-6) at 90° C. for 72 h. After cooling down to rt, the phases were separated and the aqueous layer was extracted with ethyl acetate. The combined organic layers were dried over $MgSO_4$, filtered and concentrated under reduced pressure. The crude was purified by column chromatography or recrystallization to yield compound I-21 as a solid.

AAV27: E5 (1.00 equivalents), I-21 (1.00 equivalents), tris(dibenzylideneacetone)-dipalladium(0) (CAS: 51364-51-3, 0.01 equivalents), sodium tert-butoxide (NaOtBu, CAS: 865-48-5, 3.00 equivalents) and tri-tert-butylphosphine ($P(tBu)_3$; CAS: 13716-12-6, 0.04 equivalents) were stirred under nitrogen atmosphere in dry toluene at 110° C. for 24 h. After cooling down to room temperature (rt), the reaction mixture was extracted between ethyl acetate and brine and the combined organic layers were concentrated under reduced pressure. The crude material was purified by column chromatography or by recrystallization and I-22 was obtained as solid.

AAV28: Under nitrogen in dry dichlorobenzene, I-22 (1.00 equivalents) was reacted with $BBr_3$ (3.00 equivalents, CAS: 10294-33-4) at 135° C. for 45 min. After cooling down to rt, the mixture was further cooled down to 0° C., followed by the addition of DIPEA (10.0 equivalents, CAS: 7087-68-5). Water was added, the phases separated and the aqueous layer was extracted with dichloromethane. The combined organic layers were washed with water, dried over $MgSO_4$, filtered and concentrated. The crude was purified by column chromatography or recrystallization to yield compound P-8 as a solid.

General synthesis scheme XII

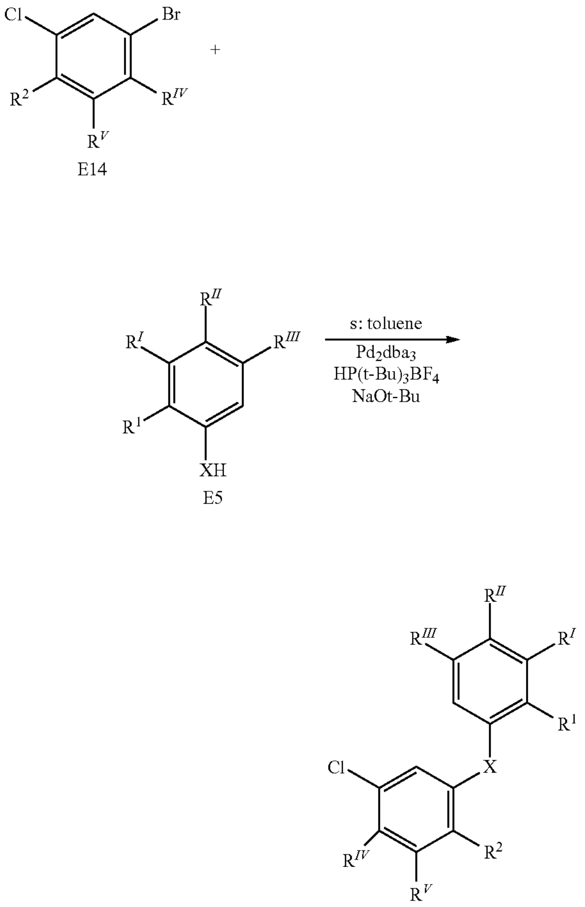

E14

E5

I-23

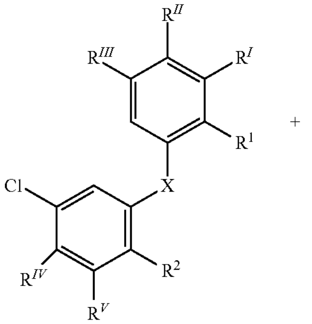

+

I-23

-continued

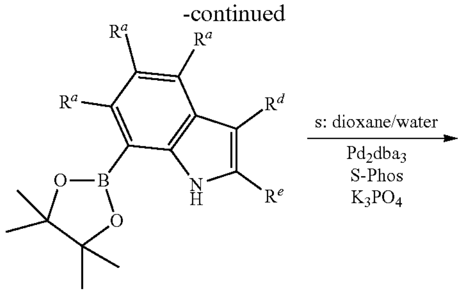

E3

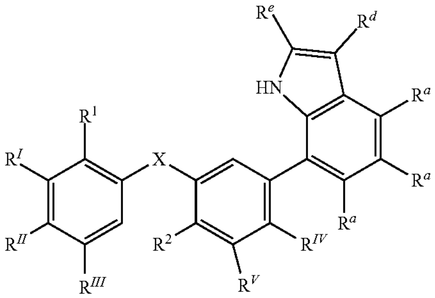

I-24

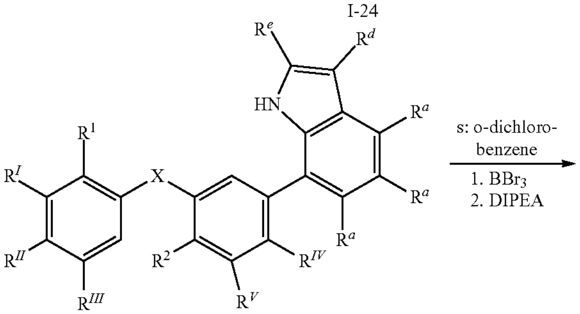

I-24

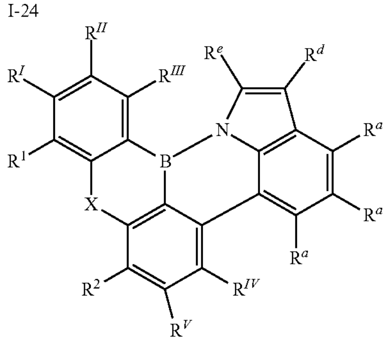

P-9

General Procedure for Synthesis:

AAV29: E5 (1.05 equivalents), E14 (1.00 equivalents), tris(dibenzylideneacetone)-dipalladium(0) (CAS: 51364-51-3, 0.005 equivalents), sodium tert-butoxide (NaOtBu, CAS: 865-48-5, 1.50 equivalents) and tri-tert-butylphosphonium tetrafluoroborate ($HP(tBu)_3BF_4$; CAS: 131274-22-1, 0.02 equivalents) were stirred under nitrogen atmosphere in dry toluene at 100° C. for 1 h. After cooling down to room temperature (rt), the reaction mixture was extracted between ethyl acetate and brine and the combined organic layers were concentrated under reduced pressure. The crude material was purified by column chromatography or by recrystallization and I-23 was obtained as solid.

AAV30: Under nitrogen, in a mixture of dioxane/water (5:1 by vol.), I-23 (1.00 equivalents) was reacted with E3 (1.10 equivalents), tribasic potassium phosphate (2.00 equivalents, CAS: 7778-53-2), tris(dibenzylideneacetone) dipalladium(0) (0.01 equivalents, CAS: 51364-51-3) and S-Phos (0.04 equivalents, CAS: 657408-07-6) at 100° C. for 48 h. After cooling down to rt, the phases were separated and the aqueous layer was extracted with ethyl acetate. The combined organic layers were dried over $MgSO_4$, filtered and concentrated under reduced pressure. The crude was purified by column chromatography or recrystallization to yield compound I-24 as a solid.

AAV31: Under nitrogen in dry dichlorobenzene, I-24 (1.00 equivalents) was reacted with $BBr_3$ (3.00 equivalents, CAS: 10294-33-4) at 90° C. for 1 h. After cooling down to rt, the mixture was further cooled down to 0° C., followed by the addition of DIPEA (10.0 equivalents, CAS: 7087-68-5). Water was added, the phases separated and the aqueous layer was extracted with dichloromethane. The combined organic layers were washed with water, dried over $MgSO_4$, filtered and concentrated. The crude was purified by column chromatography or recrystallization to yield compound P-9 as a solid.

General synthesis scheme XIII

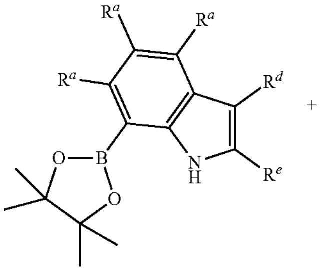

E3

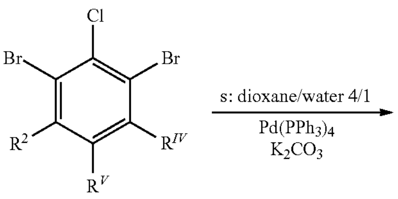

E9

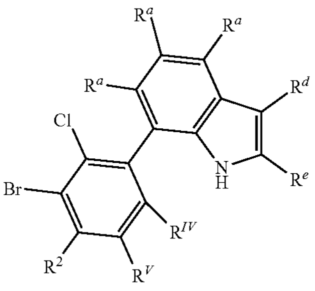

I-12

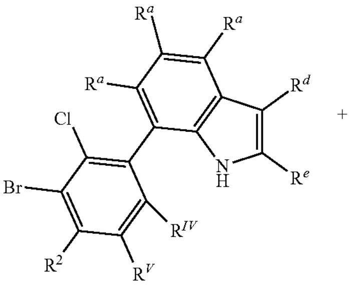

I-12

-continued

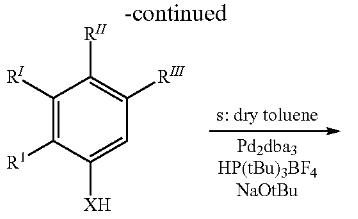

E5

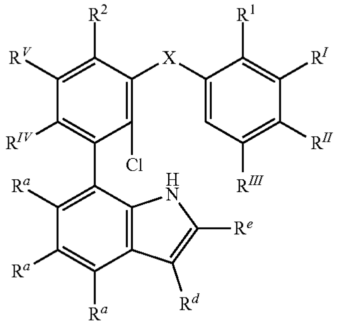

I-15

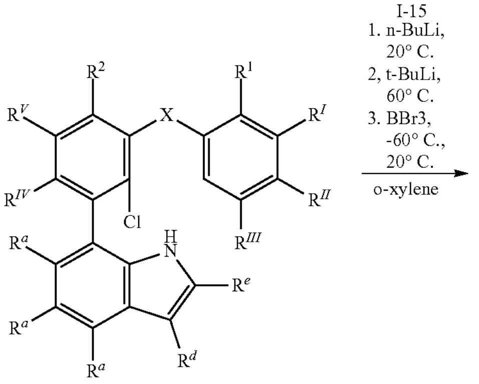

I-15

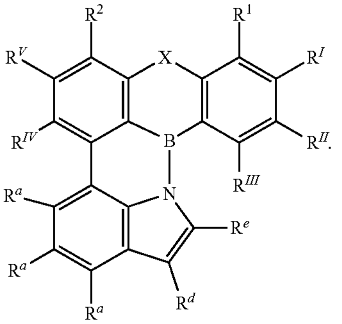

P-5

General Procedure for Synthesis:

AAV32: Under nitrogen, in a mixture of dioxane/water (4:1 by vol.), E3 (1.00 equivalents) was reacted with E9 (1.30 equivalents), potassium carbonate (2.00 equivalents, CAS: 584-08-7) and tetrakis(triphenylphosphine)palladium (0) (0.03 equivalents, CAS: 14221-01-3) at 80° C. for 8 h. After cooling down to rt, the phases were separated and the aqueous layer was extracted with ethyl acetate. The combined organic layers were dried over $MgSO_4$, filtered and concentrated under reduced pressure. The crude was purified by column chromatography or recrystallization to yield compound I-12 as a solid.

AAV33: E5 (1.10 equivalents), I-12 (1.00 equivalents), tris(dibenzylideneacetone)-dipalladium(0) (CAS: 51364-51-3, 0.01 equivalents), sodium tert-butoxide (NaOtBu, CAS:

865-48-5, 3.20 equivalents) and tri-tert-butylphosphonium tetrafluoroborate ($HP(tBu)_3BF_4$; CAS: 131274-22-1, 0.04 equivalents) were stirred under nitrogen atmosphere in dry toluene at 110° C. for 3 h. After cooling down to room temperature (rt), the reaction mixture was extracted between ethyl acetate and brine and the combined organic layers were concentrated under reduced pressure. The crude material was purified by column chromatography or by recrystallization and I-15 was obtained as solid.

AAV34: Under nitrogen, a solution of I-15 (1.00 equivalents) in dry o-xylene was added n-BuLi (2.5 M in hexane, 1.10 equivalents, CAS: 109-72-8) at rt. After 15 min of stirring, t-BuLi (1.6 M in pentane, 2.20 equivalents, CAS: 594-19-4) was added and the mixture heated at 60° C. for 2 h. Subsequently, the mixture was cooled below −78° C., followed by dropwise addition of $BBr_3$ (1.50 equivalents, CAS: 10294-33-4). Subsequently, the mixture was stirred at 0° C. for 1 h, followed by stirring at rt for 16 h. The mixture was poured onto a saturated solution of $NaHCO_3$. The phases were separated and the aqueous layers extracted with ethyl acetate. The combined organic layers were washed with water, dried over $MgSO_4$, filtered and concentrated. The crude was purified by column chromatography or recrystallization to obtain compound P5 as a solid.

General synthesis scheme XIV $XH_2$
E15

+

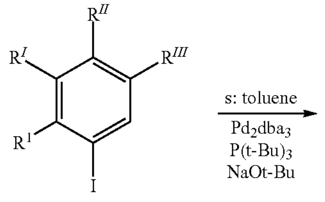

E16

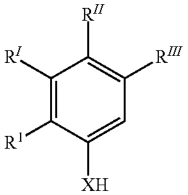

E-5

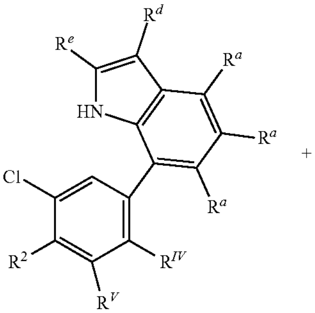

I-21

+

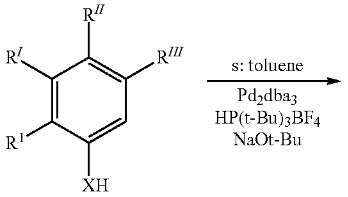

E-5

-continued

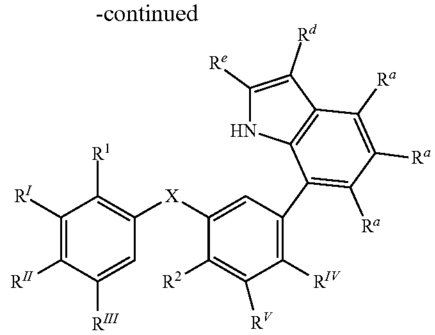

I-22

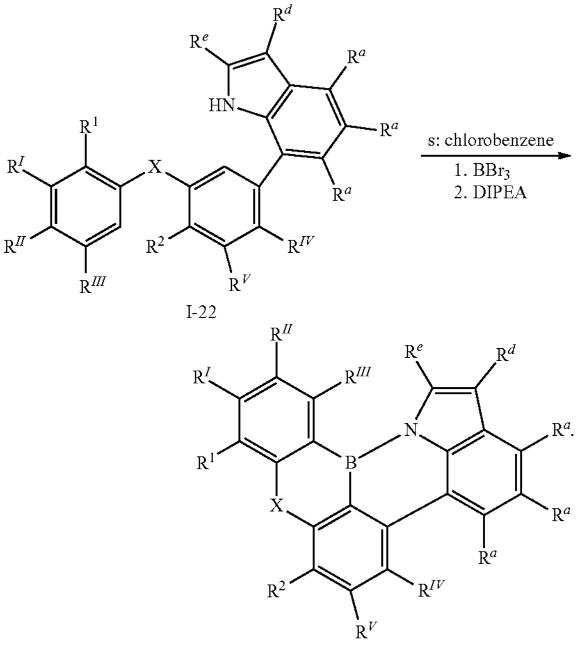

I-22

P-8

For the first reaction step X = N—($C_6$—$C_{18}$-aryl)

General Procedure for Synthesis:

AAV35: E15 (1.10 equivalents), E16 (1.00 equivalents), tris(dibenzylideneacetone)-dipalladium(0) (CAS: 51364-51-3, 0.01 equivalents), sodium tert-butoxide (NaOtBu, CAS: 865-48-5, 2.00 equivalents) and tri-tert-butylphosphine ($P(tBu)_3$; CAS: 13716-12-6, 0.04 equivalents) were stirred under nitrogen atmosphere in dry toluene at 60° C. until completion of the reaction (TLC control). After cooling down to room temperature (rt), the reaction mixture was extracted between ethyl acetate and brine and the combined organic layers were concentrated under reduced pressure. The crude material was purified by column chromatography or by recrystallization and E-5 was obtained as solid.

AAV36: E5 (1.00 equivalents), I-21 (1.00 equivalents), tris(dibenzylideneacetone)-dipalladium(0) (CAS: 51364-51-3, 0.01 equivalents), sodium tert-butoxide (NaOtBu, CAS: 865-48-5, 2.00 equivalents) and tri-tert-butylphosphonium tetrafluoroborate ($HP(t\text{-}Bu)_3BF_4$; CAS: 131274-22-1, 0.02 equivalents) were stirred under nitrogen atmosphere in dry toluene under reflux until completion of the reaction (TLC control). After cooling down to room temperature (rt), the reaction mixture was extracted between toluene and brine and the combined organic layers were concentrated under reduced pressure. The crude material was purified by column chromatography or by recrystallization and I-22 was obtained as solid.

AAV37: I-22 (1.00 equivalents) was placed in a round bottom flask under nitrogen. The solvent (1,2-dichlorobenzene was added. Boron tribromide (CAS: 10294-33-4, 3.00 equivalents) was added dropwise and it was heated to 180° C. until completion of the reaction (TLC control). After cooling to rt, it was further cooled to 0° C. DIPEA (CAS: 7087-68-5, 10.00 equivalents) was added and it was stirred for 1 h. The reaction mixture was washed with water and the phases were separated and then the solvent was removed under reduced pressure. The crude material was purified by column chromatography or by recrystallization and P-8 was obtained as a solid.

General synthesis scheme XV

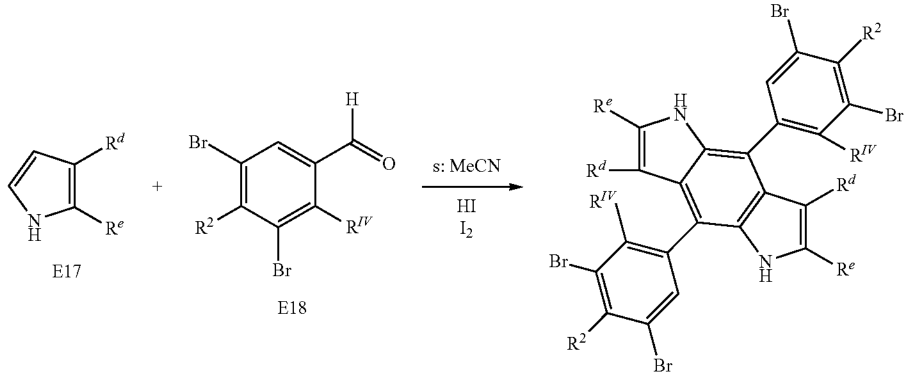

E17 E18 I-25

-continued
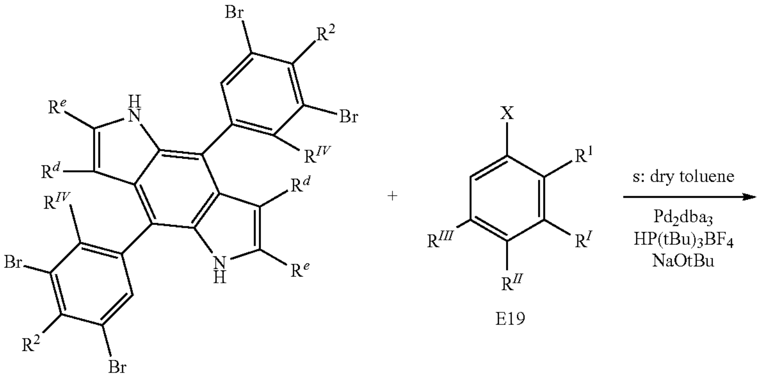
I-25
E19
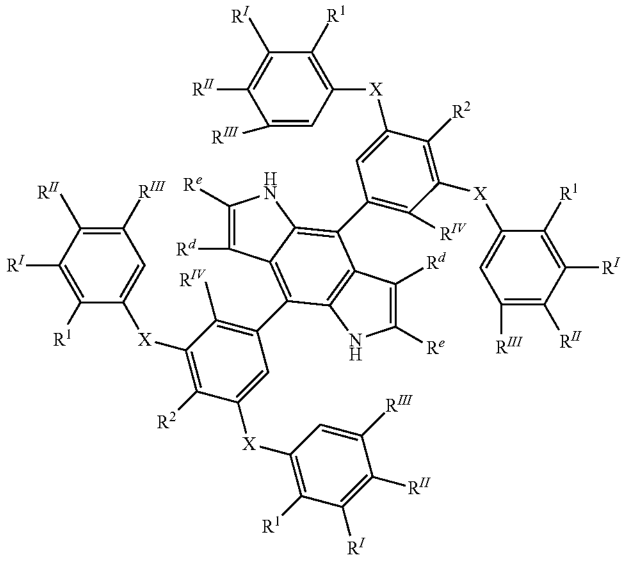
I-26
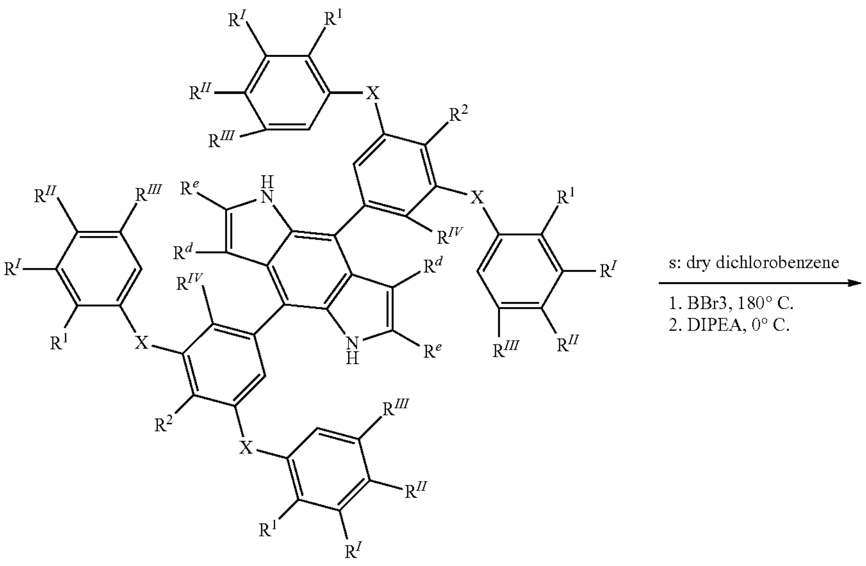
I-26

-continued

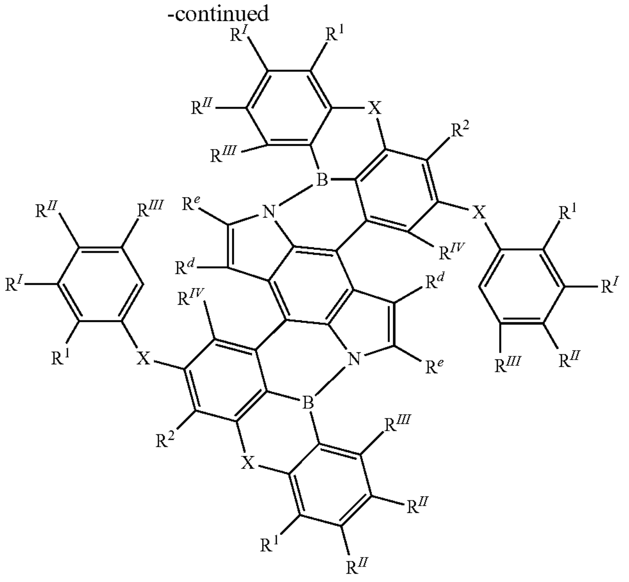

P-10

General Procedure for Synthesis:

AAV38: E17 (1.40 equivalents), E18 (0.9 equivalents), hydroiodic acid (CAS: 10034-85-2, 0.20 equivalents) were stirred under nitrogen atmosphere in dry acetonitrile at 100° C. for 16 h. The reaction mixture was cooled down to 0° C.; the precipitate was filtered and washed with cold acetonitrile. The solid was solved in acetonitrile; iodine (CAS: 7553-56-2, 0.40 equivalents) was added and the mixture was stirred at 100° C. until reaction completion (monitored by TLC). The reaction mixture was quenched with a saturated sodium thiosulfite solution and the precipitate was washed with cold acetonitrile, methanol and hexane. The crude material was purified by recrystallization or by column chromatography and I-25 was obtained as a solid.

AAV39: I-25 (1.00 equivalents), E19 (6.0 equivalents), tris(dibenzylideneacetone)dipalladium(0) (CAS: 51364-51-3, 0.04 equivalents), tri-tert-butylphosphonium tetrafluoroborate (CAS: 131274-22-1, 0.16 equivalents) and sodium tert-butoxide (CAS: 865-48-5, 7.00 equivalents) were stirred under nitrogen atmosphere in dry toluene at 110° C. for 72 h. After cooling down to room temperature (rt), the reaction mixture extracted between ethyl acetate and brine and the phases were separated and the solvent was removed under reduced pressure. The crude material was purified by recrystallization or by column chromatography and I-26 was obtained as a solid.

AAV40: I-26 (1.00 equivalents) was placed in a round bottom flask under nitrogen. The solvent (1,2-dichlorobenzene was added. Boron tribromide (CAS: 10294-33-4, 4.00 equivalents) was added dropwise and it was heated to 180° C. until reaction completion (TLC control). After cooling to rt, it was further cooled to 0° C. DIPEA (CAS: 7087-68-5, 10.00 equivalents) was added and it was stirred for 1 h. The reaction mixture was washed with water and the phases were separated and then the solvent was removed under reduced pressure. The crude material was purified by column chromatography or recrystallization and P-10 was obtained as a solid.

General synthesis scheme XVI

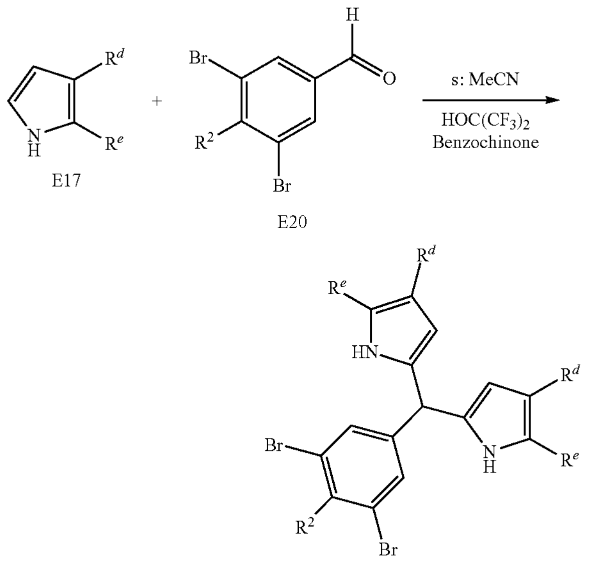

E17 E20

I-27

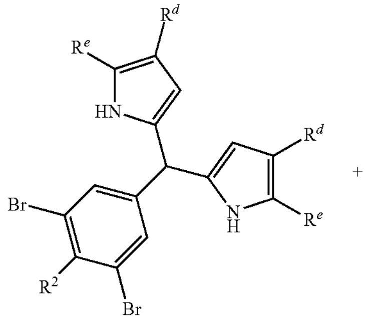

+

I-27

-continued

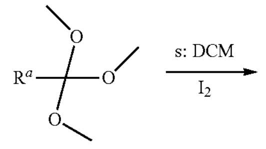

E21

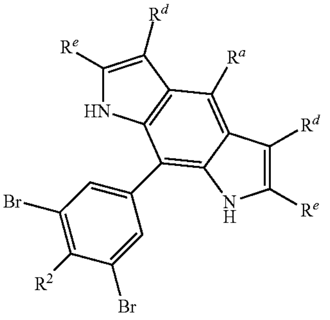

I-28

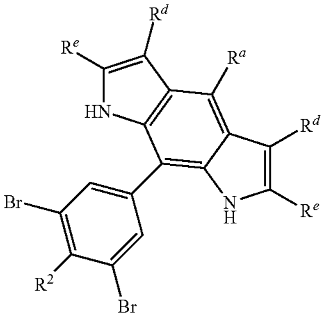

I-28

+

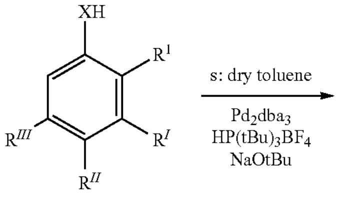

E19

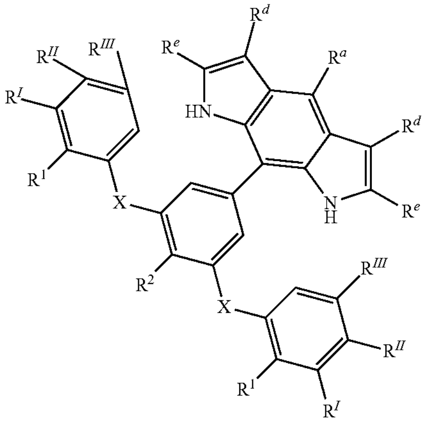

I-29

-continued

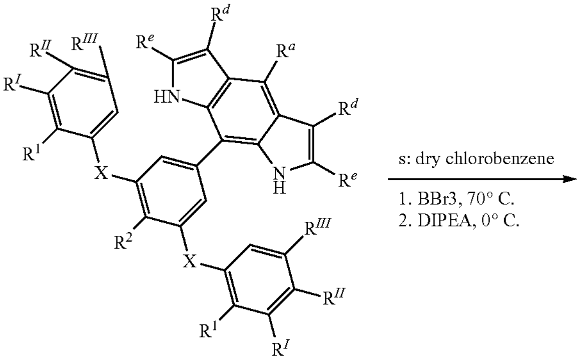

I-29

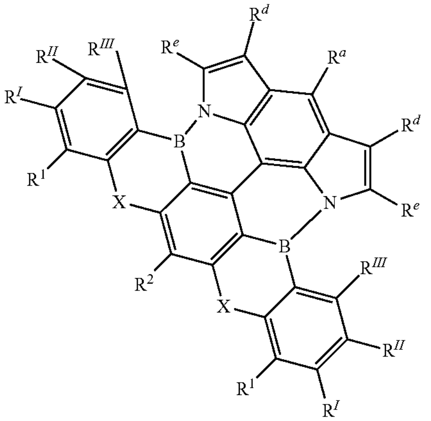

P-11

General Procedure for Synthesis:

AAV41: E17 (2.00 equivalents), E20 (1.0 equivalents), and bis(trifluoromethyl)methanol (CAS: 920-66-1, 300 ml) were stirred under nitrogen atmosphere at room temperature until reaction completion (TLC control). The reaction mixture was cooled down to 0° C.; the precipitate was filtered and washed with cold acetonitrile. The solid was re-dissolved in acetonitrile; 1,4-Benzoquinone (CAS: 106-51-4, 0.20 equivalents) was added and the mixture was stirred at room temperature until reaction completion (monitored by TLC). The solvent was removed under reduced pressure. The crude material was purified by recrystallization or by column chromatography and I-27 was obtained as a solid.

AAV42: I-27 (1.00 equivalents), E21 (1.00 equivalents), were stirred under nitrogen atmosphere in dichloromethane at room temperature. Iodine (CAS: 7553-56-2, 0.03 equivalents) was added and the mixture was stirred at room temperature until reaction completion (monitored by TLC). The solvent was removed under reduced pressure. The crude material was purified by recrystallization or by column chromatography and I-28 was obtained as a solid.

AAV43: I-28 (1.00 equivalents), E19 (2.5 equivalents), tris(dibenzylideneacetone)dipalladium(0) (CAS: 51364-51-3, 0.03 equivalents), tri-tert-butylphosphonium tetrafluoroborate (CAS: 131274-22-1, 0.12 equivalents) and sodium tert-butoxide (CAS: 865-48-5, 4.00 equivalents) were stirred under nitrogen atmosphere in dry toluene at 110° C. until reaction completion (TLC control). After cooling down to room temperature (rt), the reaction mixture extracted between ethyl acetate and brine and the phases were separated and the solvent was removed under reduced pressure. The crude material was purified by recrystallization or by column chromatography and I-29 was obtained as a solid.

AAV44: I-29 (1.00 equivalents) was placed in a round bottom flask under nitrogen. The solvent chlorobenzene was added. Boron tribromide (CAS: 10294-33-4, 4.00 equivalents) was added dropwise and it was heated to 70° C. until reaction completion (TLC control). After cooling to rt, it was further cooled to 0° C. DIPEA (CAS: 7087-68-5, 10.00 equivalents) was added and it was stirred for 1 h. The reaction mixture was washed with water and the phases were separated and then the solvent was removed under reduced pressure. The crude material was purified by column chromatography or recrystallization and P-11 was obtained as a solid.

Generation E3

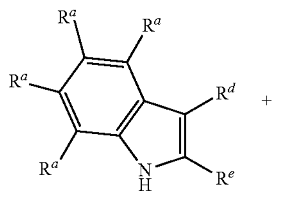

E22

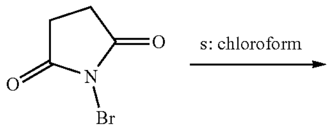

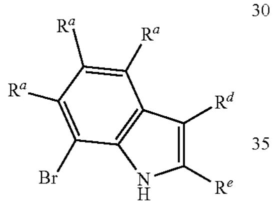

E2

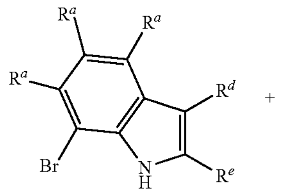

E2

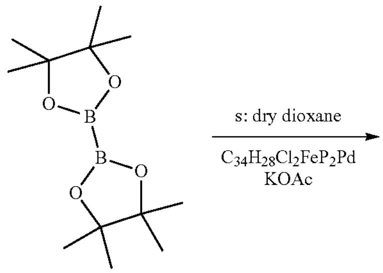

-continued

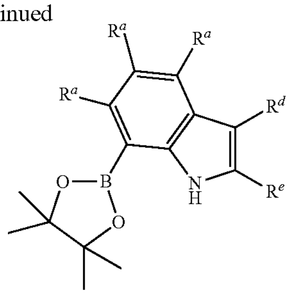

E3

General Procedure for Synthesis:

AAV45: E22 (1.00 equivalents) was solved in dry chloroform and N-bromosuccinimide (CAS: 128-08-5, 1.1 equivalents) was added portion-wise under nitrogen atmosphere at 0° C. The mixture was stirred at room temperature for 4 h and subsequently extracted between dichloromethane and water and the combined organic layers were concentrated under reduced pressure. The crude material was purified by column chromatography or by recrystallization and E2 was obtained as a solid.

AAV46: E2 (1.00 equivalents), bis(pinacolato)diboron (CAS: 73183-34-3, 1.5 equivalents), [1,1'-bis(diphenylphosphino)ferrocene]palladium (II) dichloride (CAS: 72287-26-4, 0.02 equivalents) and potassium acetate (KOAc; CAS: 127-08-2, 3.00 equivalents) were stirred under nitrogen atmosphere in dry dioxane at 95° C. for 24 h. After cooling down to room temperature (rt), the reaction mixture was extracted between dichloromethane and water and the combined organic layers were concentrated under reduced pressure. The crude material was purified by column chromatography or by recrystallization and E3 was obtained as a solid.

General synthesis scheme XVII

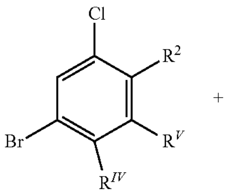

E14

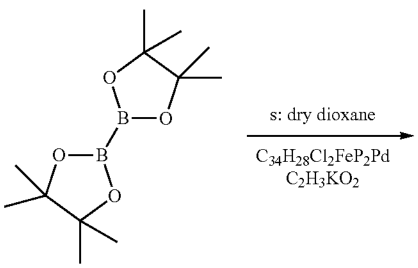

-continued

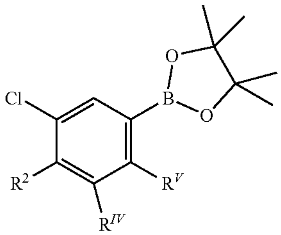

I-30

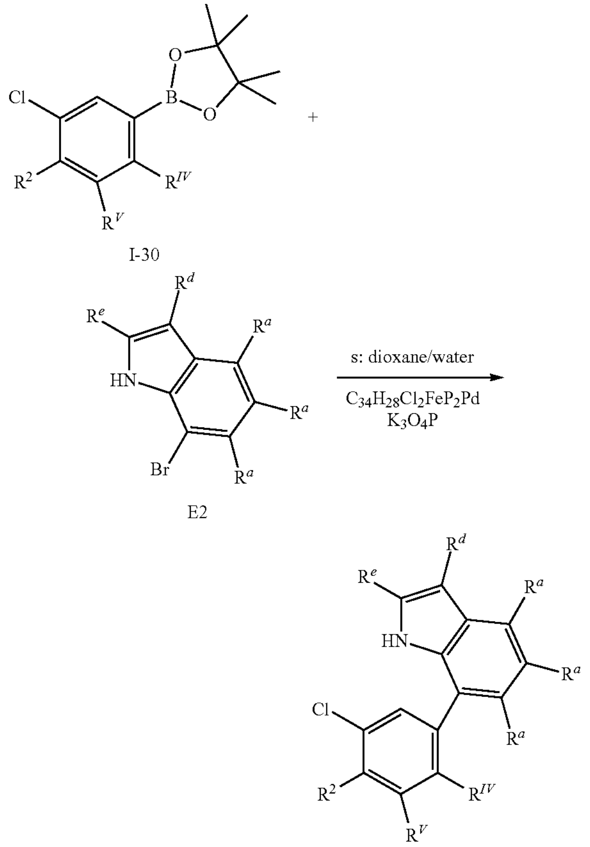

I-30

E2

I-21

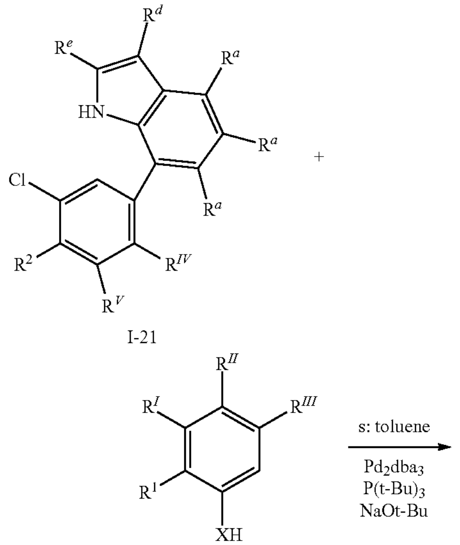

I-21

E5

-continued

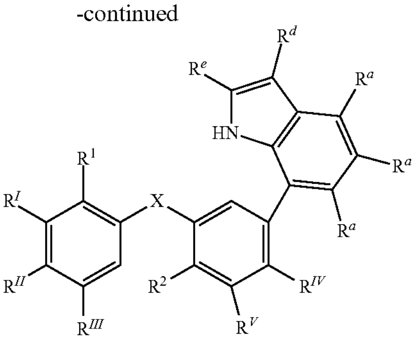

I-22

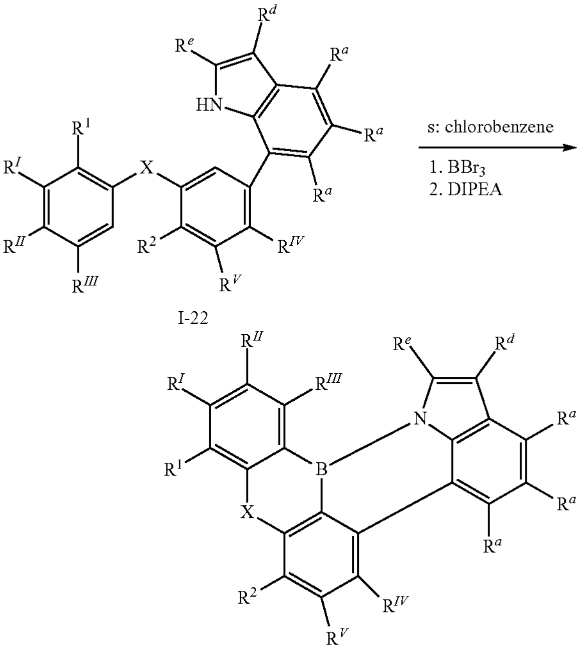

I-22

P-8

General Procedure for Synthesis:

AAV47: Under nitrogen, in a mixture of dry dioxane, E14 (1.00 equivalents) was reacted with bis(pinacolato)diboron (1.50 equivalents, CAS: 73183-34-3), potassium acetate (3.00 equivalents, CAS: 127-08-2), [1,1'-bis(diphenylphosphino)ferrocene]palladium (II) dichloride (0.04 equivalents, CAS: 72287-26-4) at 100° C. for 16 h. After cooling down to rt, water was added, the phases were separated and the aqueous layer was extracted with ethyl acetate. The combined organic layers were dried over $MgSO_4$, filtered and concentrated under reduced pressure. The crude was purified by column chromatography or recrystallization to yield compound I-30 as a solid.

AAV48: E2 (1.00 equivalents), I-30 (1.00 equivalents), [1,1'-bis(diphenylphosphino)ferrocene]palladium (II) dichloride (CAS: 72287-26-4, 0.02 equivalents) and potassium phosphate tribasic ($K_3O_4P$; CAS: 7778-53-2, 3.00 equivalents) were stirred under nitrogen atmosphere in dioxane/water (4:1 by vol.) at 80° C. for 4 h. After cooling down to room temperature (rt), the reaction mixture was extracted between ethyl acetate and water and the combined organic layers were concentrated under reduced pressure. The crude material was purified by column chromatography or by recrystallization and I-21 was obtained as a solid.

The last two reaction steps were performed as described in AAV27 and AAV28.

General synthesis scheme XVIII
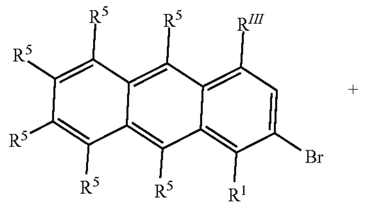
E23
+
$NH_2R^3$
E24
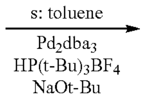
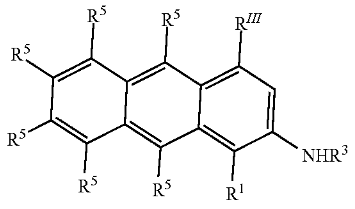
E5a
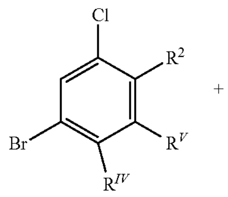
E14
+
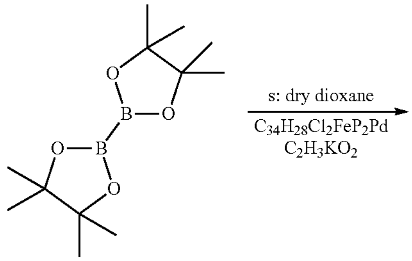
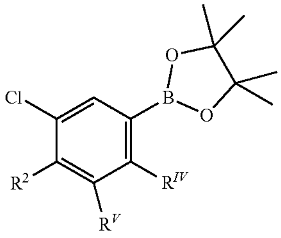
I-30
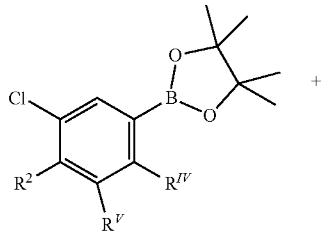
I-30
+
-continued
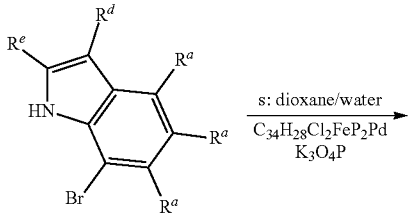
E2
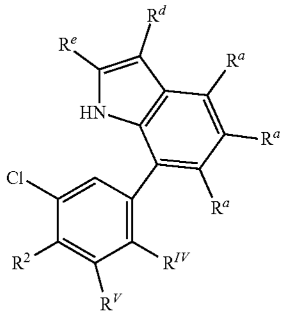
I-21
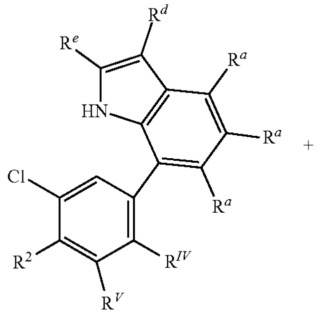
I-21
+
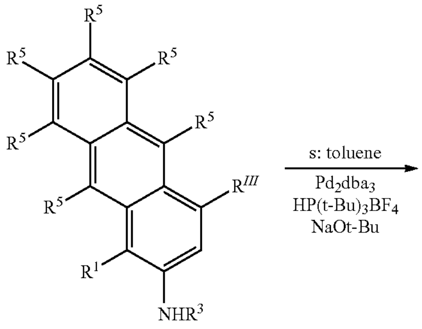
E5a
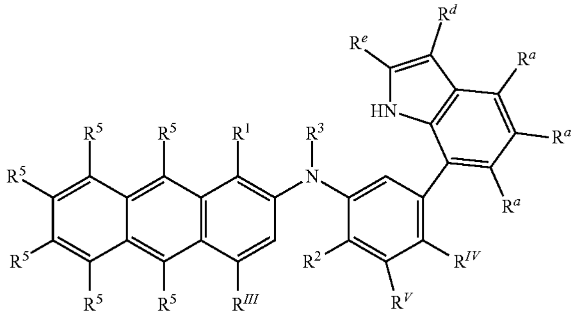
I-31

-continued

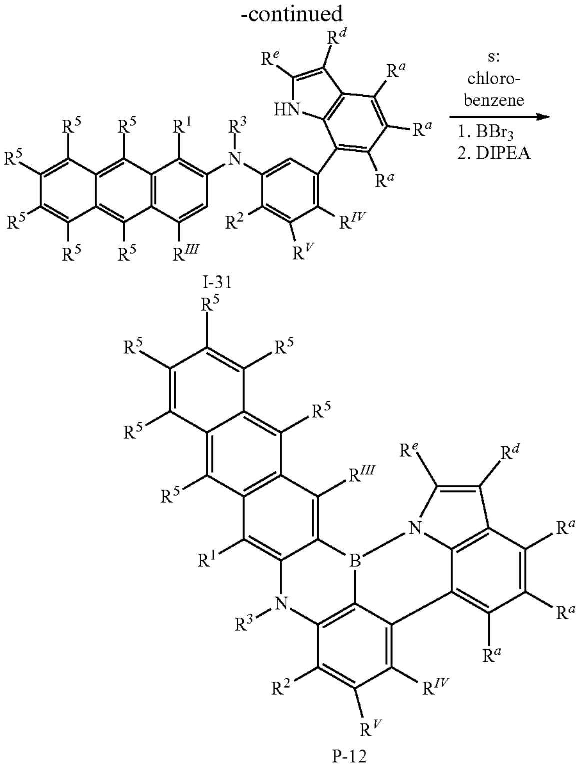

I-31

P-12

(in certain embodiments, $R^1 \neq$ H or D)

General Procedure for Synthesis:

AAV49: E23 (1.00 equivalents), E24 (1.15 equivalents), tris(dibenzylideneacetone)-dipalladium(0) (CAS: 51364-51-3, 0.01 equivalents), sodium tert-butoxide (NaOtBu, CAS: 865-48-5, 3.20 equivalents) and tri-tert-butylphosphonium tetrafluoroborate ($HP(t\text{-}Bu)_3BF_4$; CAS: 131274-22-1, 0.04 equivalents) were stirred under nitrogen atmosphere in dry toluene to 70° C. until completion of the reaction (TLC control). After cooling down to room temperature (rt), the reaction mixture was extracted between ethyl acetate and brine and the combined organic layers were concentrated under reduced pressure. The crude material was purified by column chromatography or by recrystallization and E5a was obtained as solid.

AAV50: Under nitrogen, in a mixture of dry dioxane, E14 (1.00 equivalents) was reacted with bis(pinacolato)diboron (1.50 equivalents, CAS: 73183-34-3), potassium acetate (3.00 equivalents, CAS: 127-08-2), [1,1'-bis(diphenylphosphino)ferrocene]palladium (II) dichloride (0.04 equivalents, CAS: 72287-26-4) at 100° C. for 16 h. After cooling down to rt, water was added, the phases were separated and the aqueous layer was extracted with ethyl acetate. The combined organic layers were dried over $MgSO_4$, filtered and concentrated under reduced pressure. The crude was purified by column chromatography or recrystallization to yield compound I-30 as a solid.

AAV51: E2 (1.00 equivalents), I-30 (1.00 equivalents), [1,1'-bis(diphenylphosphino)ferrocene]palladium (II) dichloride (CAS: 72287-26-4, 0.02 equivalents) and potassium phosphate tribasic ($K_3O_4P$; CAS: 7778-53-2, 3.00 equivalents) were stirred under nitrogen atmosphere in dioxane/water (4:1 by vol.) at 80° C. for 4 h. After cooling down to room temperature (rt), the reaction mixture was extracted between ethyl acetate and water and the combined organic layers were concentrated under reduced pressure. The crude material was purified by column chromatography or by recrystallization and I-21 was obtained as a solid.

AAV52: E5a (1.10 equivalents), I-21 (1.00 equivalents), tris(dibenzylideneacetone)-dipalladium(0) (CAS: 51364-51-3, 0.02 equivalents), sodium tert-butoxide (NaOtBu, CAS: 865-48-5, 3.20 equivalents) and tri-tert-butylphosphonium tetrafluoroborate ($HP(t\text{-}Bu)_3BF_4$; CAS: 131274-22-1, 0.08 equivalents) were stirred under nitrogen atmosphere in dry o-xylol to 120° C. until completion of the reaction (TLC control). After cooling down to room temperature (rt), the reaction mixture was extracted between ethyl acetate and brine and the combined organic layers were concentrated under reduced pressure. The crude material was purified by column chromatography or by recrystallization and I-31 was obtained as solid.

AAV53: Under nitrogen in dry chlorobenzene, I-31 (1.00 equivalents) was reacted with $BBr_3$ (4.00 equivalents, CAS: 10294-33-4) at −10° C. for 3 h, 2 h at rt, 16 h at 50° C. and additionally at 70° C. for 2 h. After cooling down to rt, the mixture was followed by the addition of DIPEA (10.0 equivalents, CAS: 7087-68-5). Water was added, the phases separated and the aqueous layer was extracted with ethyl acetate. The combined organic layers were washed with water, dried over $MgSO_4$, filtered and concentrated. The crude was purified by column chromatography or recrystallization to yield compound P-12 as a solid.

Cyclic Voltammetry

Cyclic voltammograms are measured from solutions having concentration of $10^{-3}$ mol/L of the organic molecules in dichloromethane or a suitable solvent and a suitable supporting electrolyte (e.g. 0.1 mol/L of tetrabutylammonium hexafluorophosphate). The measurements are conducted at room temperature under nitrogen atmosphere with a three-electrode assembly (Working and counter electrodes: Pt wire, reference electrode: Pt wire) and calibrated using $FeCp_2/FeCp_2^+$ as internal standard. The HOMO data was corrected using ferrocene as internal standard against a saturated calomel electrode (SCE).

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and an m4-grid for numerical integration are used. The Turbomole program package is used for all calculations.

Photophysical Measurements

Sample pretreatment: Spin-coating

Apparatus: Spin150, SPS euro.

The sample concentration is 10 mg/ml, dissolved in a suitable solvent.

Program: 1) 3 s at 400 U/min; 2) 20 s at 1000 U/min at 1000 Upm/s. 3) 10 s at 4000 U/min at 1000 Upm/s. After coating, the films are tried at 70° C. for 1 min.

Photoluminescence Spectroscopy and Time-Correlated Single-Photon Counting (TCSPC)

Steady-state emission spectroscopy is measured by a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:

NanoLED 370 (wavelength: 371 nm, puls duration: 1.1 ns)

NanoLED 290 (wavelength: 294 nm, puls duration: <1 ns)

SpectraLED 310 (wavelength: 314 nm)

SpectraLED 355 (wavelength: 355 nm).

Data analysis (exponential fit) is done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates are determined using the software U6039-05 version 3.6.0.

Emission maxima are given in nm, quantum yields m in % and CIE coordinates as x,y values.

PLOY is determined using the following protocol:

Quality assurance: Anthracene in ethanol (known concentration) is used as reference Excitation wavelength: the absorption maximum of the organic molecule is determined and the molecule is excited using this wavelength Measurement Quantum yields are measured, for sample, of solutions or films under nitrogen atmosphere. The yield is calculated using the equation:

$$\Phi_{PL} = \frac{n_{photon}\text{, emited}}{n_{photon}\text{, absorbed}} = \frac{\int \frac{\lambda}{hc}\left[\text{Int}_{emitted}^{sample}(\lambda) - \text{Int}_{absorbed}^{sample}(\lambda)\right]d\lambda}{\int \frac{\lambda}{hc}\left[\text{Int}_{emitted}^{reference}(\lambda) - \text{Int}_{absorbed}^{reference}(\lambda)\right]d\lambda}$$

wherein $n_{photon}$ denotes the photon count and Int. denotes the intensity.

Production and Characterization of Optoelectronic Devices

Optoelectronic devices, such as OLED devices including organic molecules according to the invention can be produced via vacuum-deposition methods. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT 95 to the time point, at which the measured luminance decreased to 95% of the initial luminance etc.

Accelerated lifetime measurements are performed (e.g. applying increased current densities). For example, LT80 values at 500 cd/m$^2$ are determined using the following equation:

$$LT80\left(500\frac{\text{cd}^2}{\text{m}^2}\right) = LT80(L_0)\left(\frac{L_0}{500\frac{\text{cd}^2}{\text{m}^2}}\right)^{1.6}$$

wherein $L_0$ denotes the initial luminance at the applied current density.

The values correspond to the average of several pixels (typically two to eight), the standard deviation between these pixels is given.

HPLC-MS:

HPLC-MS analysis is performed on an HPLC by Agilent (1100 series) with MS-detector (Thermo LTQ XL).

Exemplary a typical HPLC method is as follows: a reverse phase column 4.6 mm×150 mm, particle size 3.5 μm from Agilent (ZORBAX Eclipse Plus 95A C18, 4.6×150 mm, 3.5 μm HPLC column) is used in the HPLC. The HPLC-MS measurements are performed at room temperature (rt) with the following gradients

| Flow rate [ml/min] | Time [min] | A[%] | B[%] | C[%] |
|---|---|---|---|---|
| 2.5 | 0 | 40 | 50 | 10 |
| 2.5 | 5 | 40 | 50 | 10 |
| 2.5 | 25 | 10 | 20 | 70 |
| 2.5 | 35 | 10 | 20 | 70 |
| 2.5 | 35.01 | 40 | 50 | 10 |
| 2.5 | 40.01 | 40 | 50 | 10 |
| 2.5 | 41.01 | 40 | 50 | 10 |

using the following solvent mixtures:

| | | |
|---|---|---|
| Solvent A: | H2O (90%) | MeCN (10%) |
| Solvent B: | H2O (10%) | MeCN (90%) |
| Solvent C: | THF (50%) | MeCN (50%) |

An injection volume of 5 μL from a solution with a concentration of 0.5 mg/mL of the analyte is taken for the measurements.

Ionization of the probe is performed using an APCI (atmospheric pressure chemical ionization) source either in positive (APCI+) or negative (APCI−) ionization mode.

Example 1

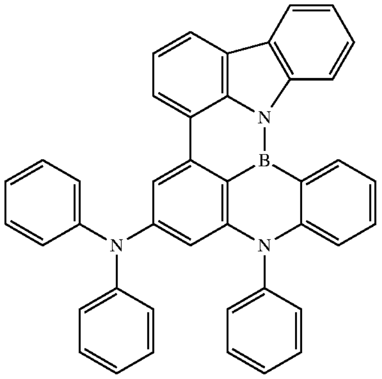 [SMILES: c1ccc(N(c2ccccc2)c2cc3c4c(c2)N(c2ccccc2)c2ccccc2B4n2c4ccccc4c4cccc-3c42)cc1]

Example 1 was synthesized according to

AAV1 (84% yield),

AAV2 (45% yield),

AAV3 (32% yield).

MS (LC-MS): 586 m/z at rt: 5.73 min.

The emission maximum of example 1 (2% by weight in PMMA) is at 428 nm, the full width at half maximum (FWHM) is 0.27 eV. The CIEx coordinate is 0.16 and the CIEy coordinate is 0.08. The photoluminescence quantum yield (PLQY) is 54%.

Example 2

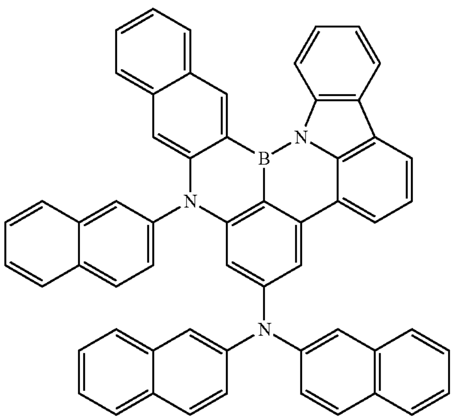 [SMILES: c1ccc2cc(N(c3cc4c5c(c3)N(c3ccc6ccccc6c3)c3cc6ccccc6cc3B5n3c5ccccc5c5cccc-4c53)c3ccc4ccccc4c3)ccc2c1]

Example 2 was synthesized according to general synthesis scheme VII

AAV14 (33% yield), wherein 1,5-dibromo-2,3-dichlorobenzene (CAS: 81067-42-73) and 2,2'-dinaphthylamine (CAS: 532-18-3) were used as reactant E8 and E5, respectively, AAV15 (34% yield), wherein 1-(tetramethyl-1,3,2-dioxaborolan-2-yl)-9H-carbazole (CAS: 1219637-88-3) was used as reactant E3, AAV0-3 (3% yield).

MS (LC-MS, APCI ion source): 786.5 m/z at rt: 7.00 min.

The emission maximum of example 2 (2% by weight in PMMA) is at 434 nm, the CIEx coordinate is 0.16 and the CIEy coordinate is 0.11.

Example 3

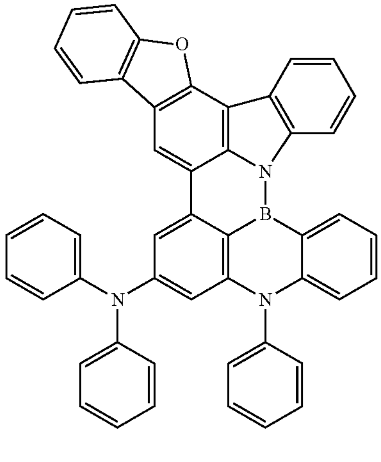 [SMILES: c1ccc(N(c2ccccc2)c2cc3c4c(c2)N(c2ccccc2)c2ccccc2B4n2c4ccccc4c4c5oc6ccccc6c5cc-3c42)cc1]

Example 3 was synthesized according to general synthesis scheme III

AAV4 (30% yield), wherein 5-bromo-N1,N1,N3,N3-tetraphenyl-1,3-benzenediamine (CAS: 1290039-73-4) was used as reactant E1, AAV5 (21% yield), wherein 6-bromo-5H-Benzofuro[3,2-c]carbazole (CAS: 1438427-35-0) was used as reactant E2, AAV6 (4% yield).

MS (LC-MS, APCI ion source): 676.7 m/z at rt: 6.87 min.

The emission maximum of example 3 (2% by weight in PMMA) is at 440 nm, the full width at half maximum (FWHM) is 0.21 eV. The CIEx coordinate is 0.15 and the CIEy coordinate is 0.06. The photoluminescence quantum yield (PLQY) is 56%.

Example 4

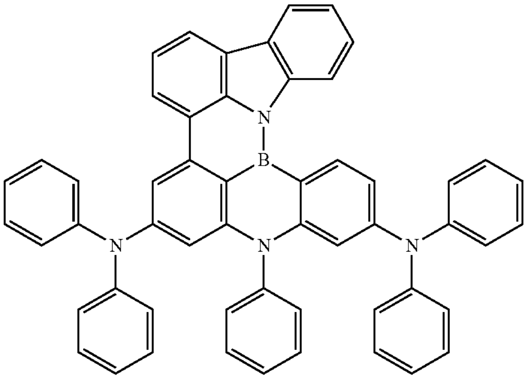 [SMILES: c1ccc(N(c2ccccc2)c2ccc3c(c2)N(c2ccccc2)c2cc(N(c4ccccc4)c4ccccc4)cc4c2B3n2c3ccccc3c3cccc-4c32)cc1]

Example 4 was synthesized according to general synthesis scheme IV

AAV7 (71% yield), wherein 1-(tetramethyl-1,3,2-dioxaborolan-2-yl)-9H-carbazole (CAS: 1219637-88-3) and 3,5-dichloro-N,N-diphenylaniline (CAS: 1329428-05-8) were used as reactant E3 and E4, respectively, AAV8 (52% yield), wherein N,N,N'-triphenyl-benzene-1,3-diamine (CAS: 1554227-26-7) was used as reactant E5, AAV9 (3% yield).

MS (LC-MS, APCI ion source): 753.9 m/z at rt: 6.62 min.

The emission maximum of example 4 (2% by weight in PMMA) is at 427 nm, the full width at half maximum (FWHM) is 0.13 eV. The CIEx coordinate is 0.16 and the CIEy coordinate is 0.05. The photoluminescence quantum yield (PLQY) is 58%.

Example 5

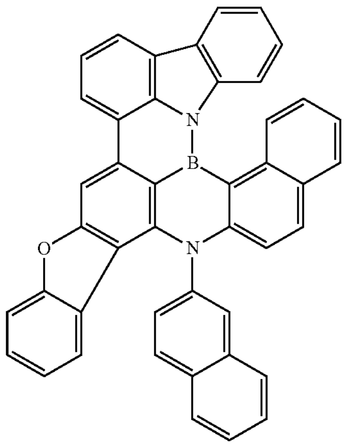 [SMILES: c1ccc2cc(N3c4ccc5ccccc5c4B4c5c(cc6oc7ccccc7c6c53)-c3cccc5c6ccccc6n4c35)ccc2c1]

Example 5 was synthesized according to general synthesis scheme V

AAV10 (68% yield), wherein 2,2'-dinaphthylamine (CAS: 532-18-3) and 1-bromo-3-chlorodibenzo[b,d]furan (CAS: 2043962-13-4) were used as reactant E5 and E6, respectively, AAV11 (90% yield), wherein 1-(tetramethyl-1,3,2-dioxaborolan-2-yl)-9H-carbazole (CAS: 1219637-88-3) was used as reactant E3, AAV9 (38% yield).

MS (LC-MS, APCI ion source): 609.5 m/z at rt: 6.26 min.

The emission maximum of example 5 (2% by weight in PMMA) is at 462 nm, the full width at half maximum (FWHM) is 0.14 eV. The CIEx coordinate is 0.14 and the CIEy coordinate is 0.22. The photoluminescence quantum yield (PLQY) is 65%.

Example 6

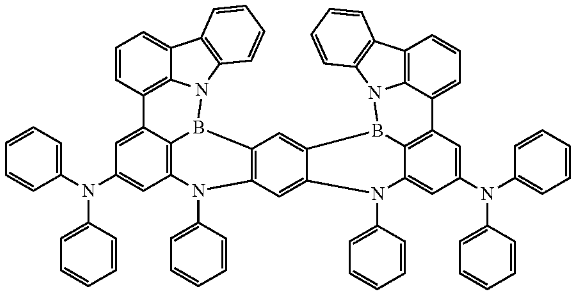 [SMILES: c1ccc(N(c2ccccc2)c2cc3c4c(c2)N(c2ccccc2)c2cc5c(cc2B4n2c4ccccc4c4cccc-3c42)B2c3c(cc(N(c4ccccc4)c4ccccc4)cc3N5c3ccccc3)-c3cccc4c5ccccc5n2c34)cc1]

Example 6 was synthesized according to

AAV7 (71% yield), wherein 1-(tetramethyl-1,3,2-dioxaborolan-2-yl)-9H-carbazole (CAS: 1219637-88-3) and 3,5-dichloro-N,N-diphenylaniline (CAS: 1329428-05-8) were used as reactant E3 and E4, respectively, AAV12 (54% yield), wherein N,N'-diphenyl-m-phenylenediamine (CAS: 5905-36-2) was used as reactant E7, AAV13 (2% yield).

MS (LC-MS, APCI ion source): 1094.1 m/z at rt: 8.18 min.

The emission maximum of example 6 (2% by weight in PMMA) is at 443 nm, the full width at half maximum (FWHM) is 0.13 eV. The CIEx coordinate is 0.15 and the CIEy coordinate is 0.07. The photoluminescence quantum yield (PLQY) is 61%.

Example 7

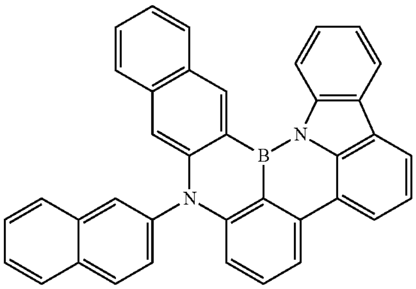 [SMILES: c1cc2c3c(c1)N(c1ccc4ccccc4c1)c1cc4ccccc4cc1B3n1c3ccccc3c3cccc-2c31]

Example 7 was synthesized according to AAV16 (49% yield), wherein 1-(tetramethyl-1,3,2-dioxaborolan-2-yl)-9H-carbazole (CAS: 1219637-88-3) and 1,3-dibromo-2-chlorobenzene (CAS: 19230-27-4) were used as reactant E3 and E9, respectively, AAV17 (78% yield), AAV18 (56% yield), wherein 2,2'-dinaphthylamine (CAS: 532-18-3) was used as reactant E5, AAV19 (69% yield), AAV20 (5% yield).

MS (LC-MS, APCI ion source): 519.6 m/z at rt: 5.54 min.

The emission maximum of example 7 (2% by weight in PMMA) is at 480 nm, the full width at half maximum (FWHM) is 0.18 eV. The CIEx coordinate is 0.13 and the CIEy coordinate is 0.33. The photoluminescence quantum yield (PLQY) is 53%.

Example 8

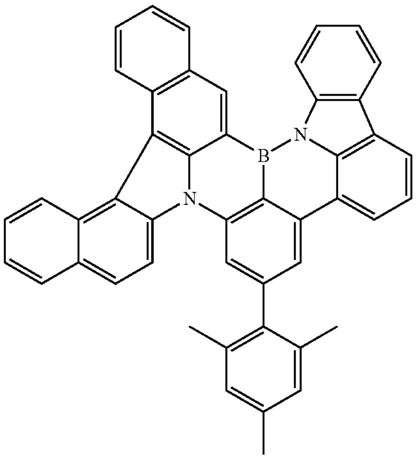 [SMILES: Cc1cc(C)c(-c2cc3c4c(c2)-n2c5ccc6ccccc6c5c5c6ccccc6cc(c52)B4n2c4ccccc4c4cccc-3c42)c(C)c1]

Example 8 was synthesized according to AAV21 (85% yield), wherein 1-bromo-2,5-dichloro-3-fluorobenzene (CAS: 202865-57-4) and 7H-dibenzo[c,g]carbazole (CAS: 194-59-2) were used as reactants E10 and E11, respectively;

AAV22 (62% yield), wherein 1-(tetramethyl-1,3,2-dioxaborolan-2-yl)-9H-carbazole (CAS: 1219637-88-3) was used as the substrate E3;

AAV23 (78% yield), wherein 2,4,6-trimethylphenylboronic acid (CAS: 5980-97-2) represented reactant E12;

and AAV0-3 (2% yield).

MS (LC-MS, APCI ion source): m/z=635.7 at rt=7.72 min.

The emission maximum of example 8 (2% by weight in PMMA) is at 470 nm, the full width at half maximum (FWHM) is 0.24 eV. The CIEx coordinate is 0.15 and the CIEy coordinate is 0.25. The photoluminescence quantum yield (PLQY) is 48%.

Example 9

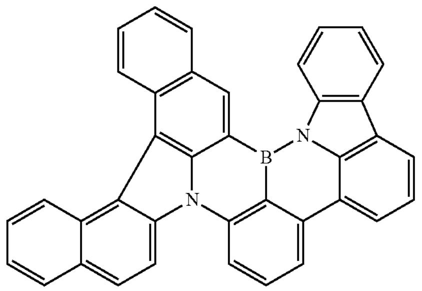 [SMILES: c1cc2c3c(c1)-n1c4ccc5ccccc5c4c4c5ccccc5cc(c41)B3n1c3ccccc3c3cccc-2c31]

Example 9 was synthesized according to

AAV24 (70% yield), wherein 1-bromo-2-chloro-3-fluorobenzene (CAS: 883499-24-9) and 7H-dibenzo[c,g]carbazole (CAS: 194-59-2) were used as the reactants E13 and E11, respectively;

AAV25 (51% yield), wherein 1-(tetramethyl-1,3,2-dioxaborolan-2-yl)-9H-carbazole (CAS: 1219637-88-3) was used as reactant E3;

and AAV0-3 (2% yield).

MS (LC-MS, APCI ion source): m/z=517 at rt=6.45 min.

The emission maximum of example 9 (2% by weight in PMMA) is at 478 nm, the full width at half maximum (FWHM) is 0.26 eV. The CIEx coordinate is 0.16 and the CIEy coordinate is 0.36. The photoluminescence quantum yield (PLQY) is 37%.

Example 10

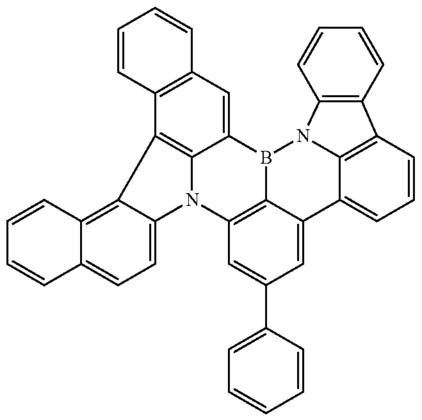 [SMILES: c1ccc(-c2cc3c4c(c2)-n2c5ccc6ccccc6c5c5c6ccccc6cc(c52)B4n2c4ccccc4c4cccc-3c42)cc1]

Example 10 was synthesized according to

AAV21 (85% yield), wherein 1-bromo-2,5-dichloro-3-fluorobenzene (CAS: 202865-57-4) and 7H-dibenzo[c,g]carbazole (CAS: 194-59-2) were used as reactants E10 and E11, respectively;

AAV22 (62% yield), wherein 1-(tetramethyl-1,3,2-dioxaborolan-2-yl)-9H-carbazole (CAS: 1219637-88-3) was used as the substrate E3;

AAV23 (69% yield), wherein phenylboronic acid (CAS: 98-80-6) represented reactant E12;

and AAV0-3 (1% yield).

MS (LC-MS, APCI ion source): m/z=593 at rt=7.25 min.

The emission maximum of example 10 (2% by weight in PMMA) is at 485 nm.

Example 11

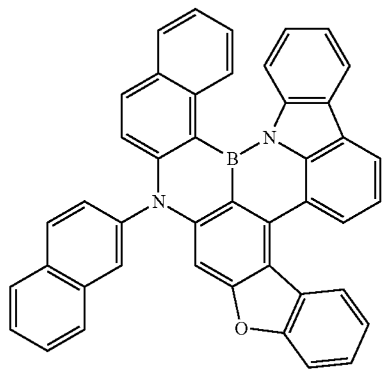 [SMILES: c1ccc2cc(N3c4cc5oc6ccccc6c5c5c4B(c4c3ccc3ccccc43)n3c4ccccc4c4cccc-5c43)ccc2c1]

Example 11 was synthesized according to

AAV26 (34% yield), wherein 1-bromo-3-chlorodibenzo[b,d]furan (CAS: 2043962-13-4) and 1-(tetramethyl-1,3,2-dioxaborolan-2-yl)-9H-carbazole (CAS: 1219637-88-3) were used as the reactants E14 and E3;

AAV27 (37% yield), wherein 2,2'-Dinaphthylamine (CAS: 532-18-3) was used as reactant E5;

and AAV28 (3% yield).

MS (LC-MS, APCI ion source): m/z=609.5 at rt=6.38 min.

The emission maximum of example 11 (2% by weight in PMMA) is at 456 nm, the full width at half maximum (FWHM) is 0.22 eV. The CIEx coordinate is 0.15 and the CIEy coordinate is 0.13. The photoluminescence quantum yield (PLQY) is 45%.

Example 12

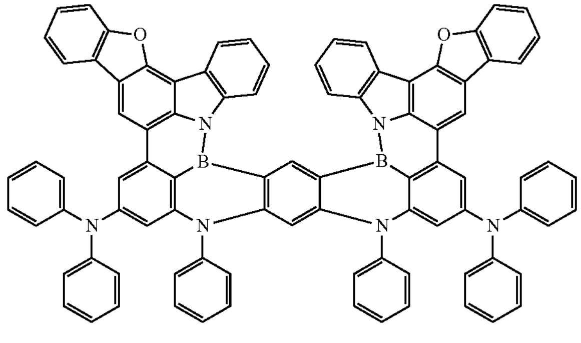 [SMILES: c1ccc(N2Cc3cc4c(cc3CB3c5c(cc(N(c6ccccc6)c6ccccc6)cc52)-c2cc5c6ccccc6oc5c5c6ccccc6n3c25)B2c3c(cc(N(c5ccccc5)c5ccccc5)cc3N(c3ccccc3)C4)-c3cc4c5ccccc5oc4c4c5ccccc5n2c34)cc1]

MS (LC-MS, APCI ion source): m/z=1275.2 at rt=8.99 min.

The emission maximum of example 12 (2% by weight in PMMA) is at 459 nm, the full width at half maximum (FWHM) is 0.15 eV. The CIEx coordinate is 0.14 and the CIEy coordinate is 0.13. The photoluminescence quantum yield (PLQY) is 53%.

Example 13

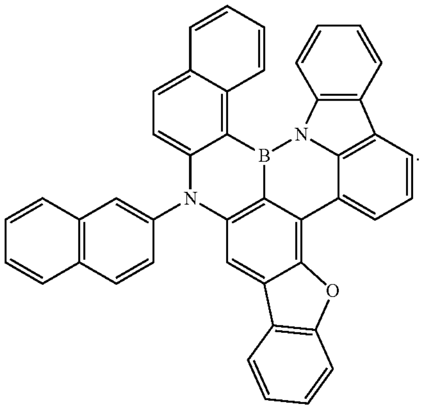 [SMILES: c1ccc2cc(N3c4cc5c(oc6ccccc65)c5c4B(c4c3ccc3ccccc43)n3c4ccccc4c4cccc-5c43)ccc2c1]

Example 13 was synthesized according to

AAV29 (71% yield), where 4-bromo-3-chlorodibenzo[b, d]furan (CAS: 1960445-63-9) and 2,2'-Dinaphthylamine (CAS: 532-18-3) were used as the reactants E14 and E5, respectively;

AAV30 (54% yield), where 1-(tetramethyl-1,3,2-dioxaborolan-2-yl)-9H-carbazole (CAS: 1219637-88-3) was used as compound E3;

and AAV31 (31% yield).

MS (LC-MS, APCI ion source): m/z=609.7 at rt=6.23 min.

The emission maximum of example 13 (2% by weight in PMMA) is at 464 nm, the full width at half maximum (FWHM) is 0.13 eV. The CIEx coordinate is 0.14 and the CIEy coordinate is 0.18. The photoluminescence quantum yield (PLQY) is 58%.

Example 14

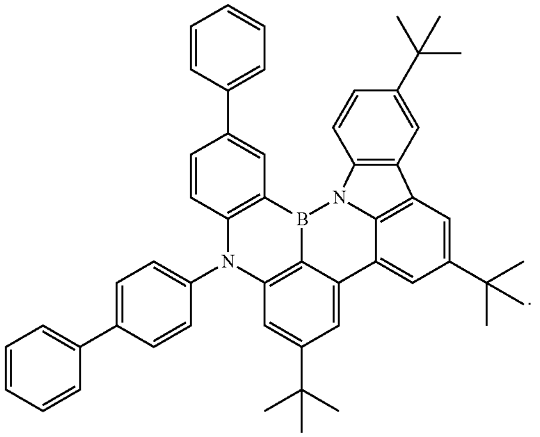 [SMILES: CC(C)(C)c1cc2c3c(c1)N(c1ccc(-c4ccccc4)cc1)c1ccc(-c4ccccc4)cc1B3n1c3ccc(C(C)(C)C)cc3c3cc(C(C)(C)C)cc-2c31]

Example 14 was synthesized according to

AAV32 (31% yield), where 3,6-bis(1,1-dimethylethyl)-1-(4,4,5,5-tetramethyl-1,3,2-dioxaborolan-2-yl)-9H-carbazole (CAS: 1510810-80-6) and 1,3-dibromo-5-tert-butyl-2-chlorobenzene (CAS: 1000578-25-5) were used as the reactants E3 and E9, respectively;

AAV33 (48% yield), wherein N-[1,1'-biphenyl]-4-yl-[1, 1'-Biphenyl]-4-amine (CAS: 102113-98-4) was used as compound E5;

and AAV33 (24% yield).

MS (LC-MS, APCI ionization source): m/z=740.0 at rt=7.90 min.

The emission maximum of example 14 (2% by weight in PMMA) is at 440 nm, the full width at half maximum (FWHM) is 0.22 eV. The CIEx coordinate is 0.15 and the CIEy coordinate is 0.06. The photoluminescence quantum yield (PLQY) is 74%.

Example 15

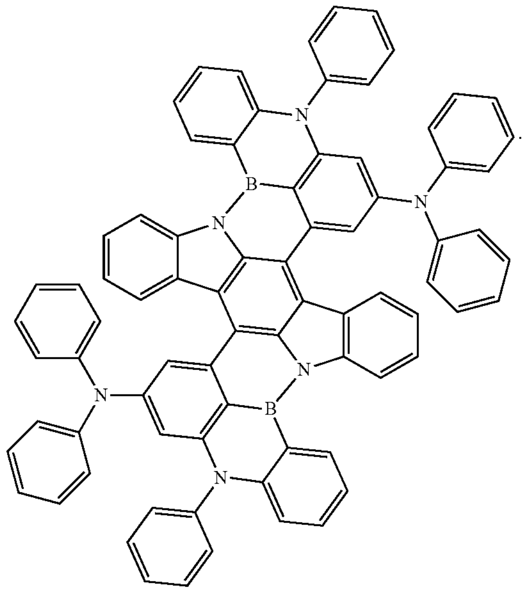 [SMILES: c1ccc(N(c2ccccc2)c2cc3c4c(c2)N(c2ccccc2)c2ccccc2B4n2c4ccccc4c4c5c6c(c-3c42)c2ccccc2n6B2c3ccccc3N(c3ccccc3)c3cc(N(c4ccccc4)c4ccccc4)cc-5c32)cc1]

Example 15 was synthesized according to AAV38 (25% yield), where Indole (CAS: 120-72-9) and 3,5-dibromobenzaldehyde (CAS: 56990-024) were used as the reactants E17 and E18, respectively;

AAV39 (51% yield), where diphenylamine (CAS: 122-39-4) was used as E19;

and AAV40 (38% yield).

MS (LC-MS, APCI ionization source): m/z=1094.0 at rt=8.14 min.

The emission maximum of example 15 (2% by weight in PMMA) is at 515 nm, the full width at half maximum (FWHM) is 0.13 eV. The CIEx coordinate is 0.31 and the CIEy coordinate is 0.64. The photoluminescence quantum yield (PLQY) is 31%.

Example 16

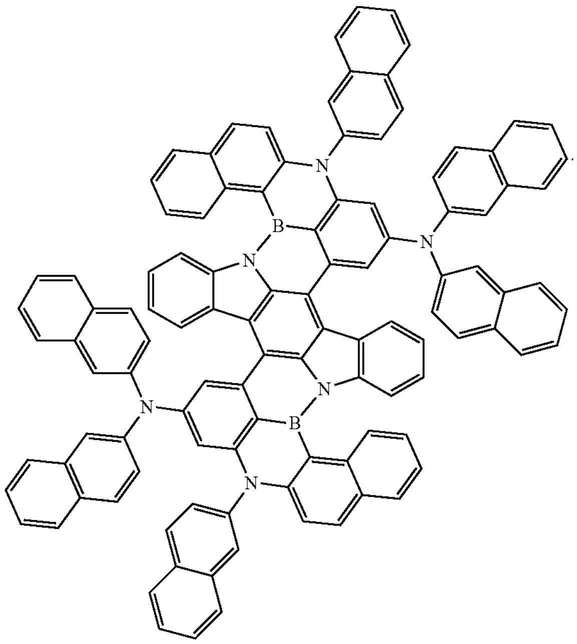 [SMILES: c1ccc2cc(N(c3cc4c5c(c3)N(c3ccc6ccccc6c3)c3ccc6ccccc6c3B5n3c5ccccc5c5c6c7c(c-4c53)c3ccccc3n7B3c4c-6cc(N(c5ccc6ccccc6c5)c5ccc6ccccc6c5)cc4N(c4ccc5ccccc5c4)c4ccc5ccccc5c43)c3ccc4ccccc4c3)ccc2c1]

Example 16 was synthesized according to

AAV38 (25% yield), where indole (CAS: 120-72-9) and 3,5-dibromobenzaldehyd (CAS: 56990-02-4) were used as the reactants E17 and E18, respectively;

AAV39 (70% yield), where 2,2'-dinaphthylamine (CAS: 532-18-3) was used as E19;

and AAV40 (47% yield).

MS (LC-MS, APCI ionization source): m/z=1494.0 at rt=8.74 min.

The emission maximum of example 16 (2% by weight in PMMA) is at 522 nm, the full width at half maximum (FWHM) is 0.09 eV. The photoluminescence quantum yield (PLQY) is 48%.

Example 17

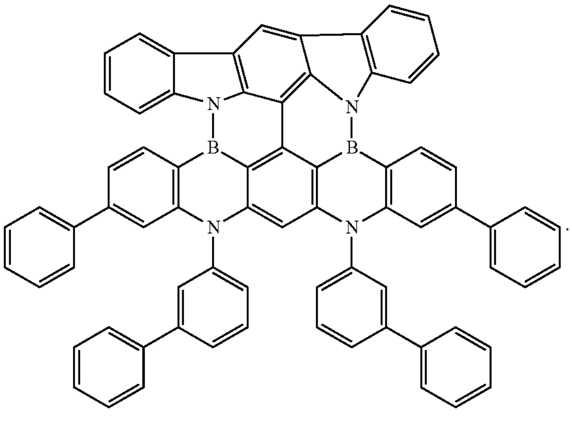 [SMILES: c1ccc(-c2cccc(N3c4cc(-c5ccccc5)ccc4B4c5c3cc3c6c5-c5c7c(cc8c9ccccc9n(c58)B6c5ccc(-c6ccccc6)cc5N3c3cccc(-c5ccccc5)c3)c3ccccc3n74)c2)cc1]

Example 17 was synthesized according to

AAV41 (34% yield), wherein 4,7-dihydro-1H-indole (CAS: 26686-10-2) and 3,5-dibromobenzaldehyde (CAS: 56990-02-4) were used as the reactants E17 and E20;

AAV42 (15% yield), where trimethyl orthoformate (CAS: 149-73-5) was used as E21;

AAV43 (19% yield), where bis(3-biphenylyl)amine (CAS: 169224-65-1) was used as E19;

and AAV44 (27% yield).

MS (LC-MS, APCI ionization source): m/z=988.0 at rt=8.56 min.

The emission maximum of example 17 (2% by weight in PMMA) is at 444 nm, the full width at half maximum (FWHM) is 0.29 eV. The CIEx coordinate is 0.15 and the CIEy coordinate is 0.09. The photoluminescence quantum yield (PLQY) is 45%.

Example 18

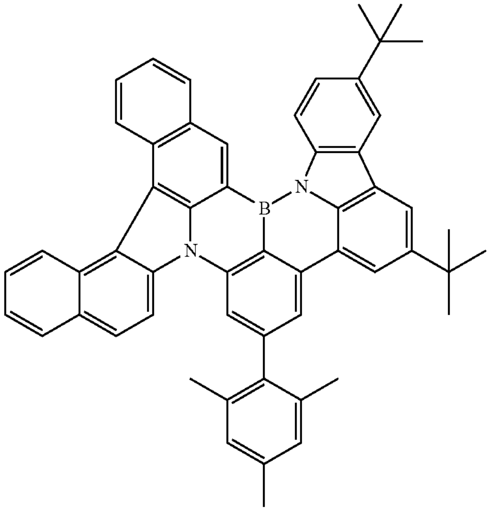 [SMILES: Cc1cc(C)c(-c2cc3c4c(c2)-n2c5ccc6ccccc6c5c5c6ccccc6cc(c52)B4n2c4ccc(C(C)(C)C)cc4c4cc(C(C)(C)C)cc-3c42)c(C)c1]

Example 18 was synthesized according to

AAV45 (85% yield), wherein 3,6-Di-tert-butylcarbazole (CAS: 37500-95-1) was used as the substrate E22;

AAV46 (83% yield);

AAV21 (85% yield), wherein 1-bromo-2,5-dichloro-3-fluorobenzene (CAS: 202865-57-4) and 7H-dibenzo[c, g]carbazole (CAS: 194-59-2) were used as reactants E10 and E11, respectively;

AAV22 (46% yield);

AAV23 (87% yield), wherein 2,4,6-trimethylphenylboronic acid (CAS: 5980-97-2) represented reactant E12;

and AAV0-3 (7.2% yield).

MS (LC-MS, APCI ion source): m/z=746 at rt=8.90 min.

The emission maximum of example 18 (2% by weight in PMMA) is at 471 nm, the full width at half maximum (FWHM) is 0.24 eV. The CIEx coordinate is 0.14 and the CIEy coordinate is 0.25. The photoluminescence quantum yield (PLQY) is 48%.

Example 19

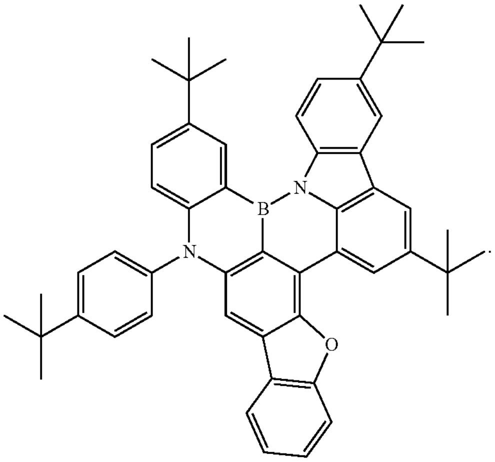 [SMILES: CC(C)(C)c1ccc(N2c3ccc(C(C)(C)C)cc3B3c4c2cc2c(oc5ccccc52)c4-c2cc(C(C)(C)C)cc4c5cc(C(C)(C)C)ccc5n3c24)cc1]

Example 19 was synthesized according to

AAV47 (74% yield), wherein 4-bromo-2-chlorodibenzo[b,d]furan (CAS: 2087889-86-7) was used as the substrate E14;

AAV45 (85% yield), wherein 3,6-di-tert-butylcarbazole (CAS: 37500-95-1) was used as the substrate E22;

AAV48 (74% yield);

AAV27 (33% yield), where bis(4-tert-butylphenyl)amine (CAS: 4627-22-9) was used as compound E5;

and AAV28 (6.1% yield).

MS (LC-MS, APCI ion source): m/z=734.8 at rt=8.73 min.

The emission maximum of example 19 (2% by weight in PMMA) is at 471 nm, the full width at half maximum (FWHM) is 0.16 eV. The CIEx coordinate is 0.13 and the CIEy coordinate is 0.26. The photoluminescence quantum yield (PLQY) is 76%.

Example D1

Example 5 was tested in the OLED D1, which was fabricated with the following layer structure:

| Layer # | Thickness | D1 |
|---|---|---|
| 9 | 100 nm | Al |
| 8 | 2 nm | Liq |
| 7 | 11 nm | NBPhen |
| 6 | 20 nm | MAT1 |
| 5 | 20 nm | MAT2 (98%): Example 5 (2%) |
| 4 | 10 nm | MAT3 |
| 3 | 50 nm | MAT4 |
| 2 | 7 nm | HAT-CN |
| 1 | 50 nm | ITO |
| Substrate | | Glass |

-continued

| Layer # | Thickness | D1 |
|---|---|---|

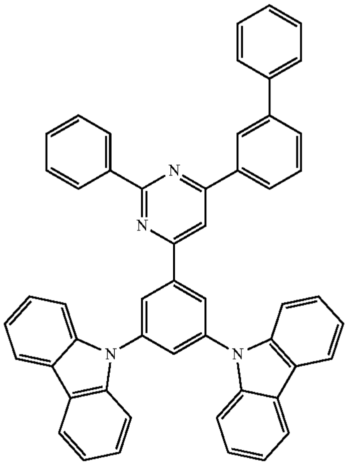

MAT1

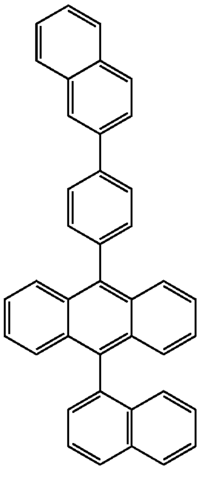

MAT2

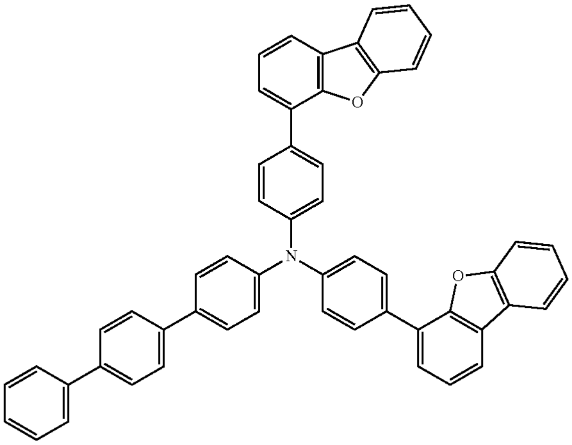

MAT3

-continued
| Layer # | Thickness | D1 |
| --- | --- | --- |
| 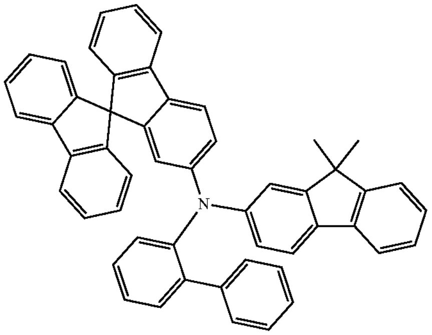 MAT4 | | |
OLED D1 yielded an external quantum efficiency (EQE) at 1000 cd/m$^2$ of 8.7%. The emission maximum is at 466 nm with a FWHM of 18 nm at 3.9 V. The corresponding CIEx value is 0.13 and the CIEy value is 0.16. A LT95-value at 1200 cd/m$^2$ of 55.2 h was determined.
Additional Examples of Organic Molecules/Oligomers of the Invention
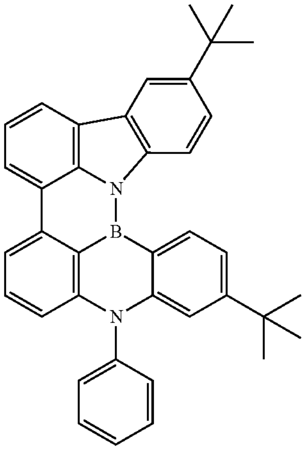
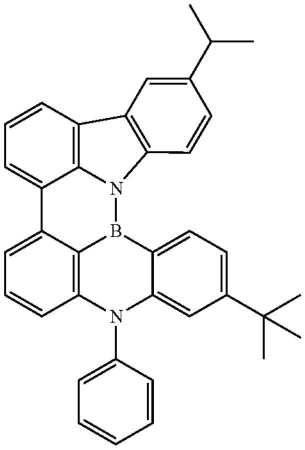
-continued
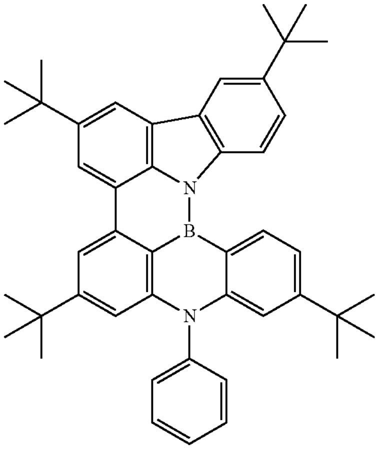
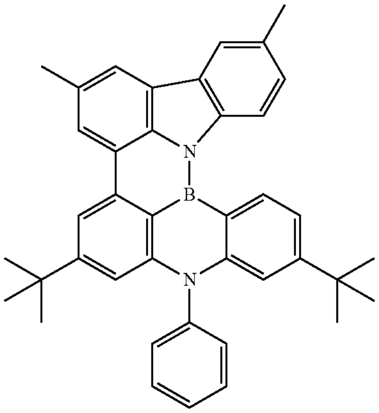
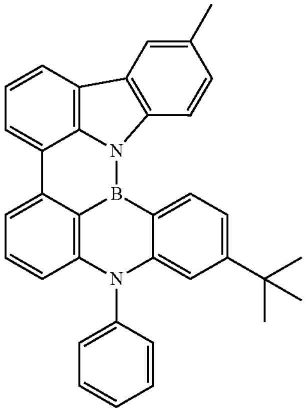
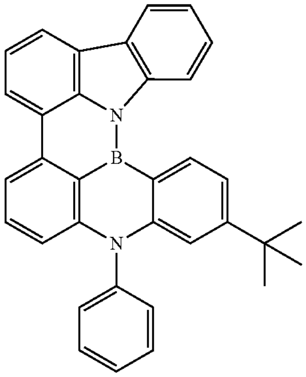

-continued
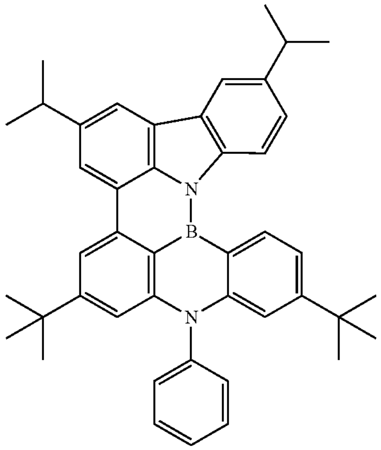
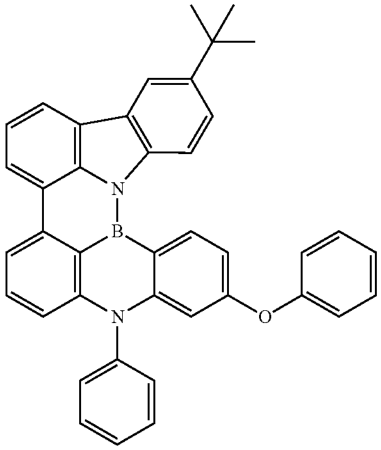
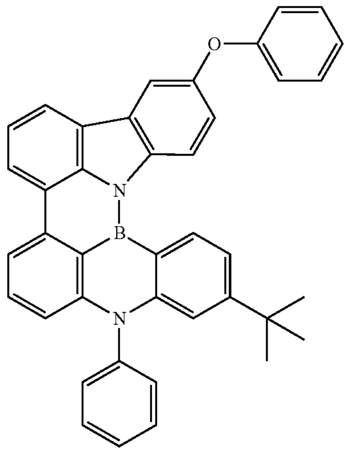
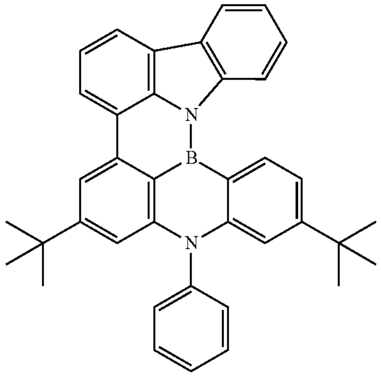
-continued
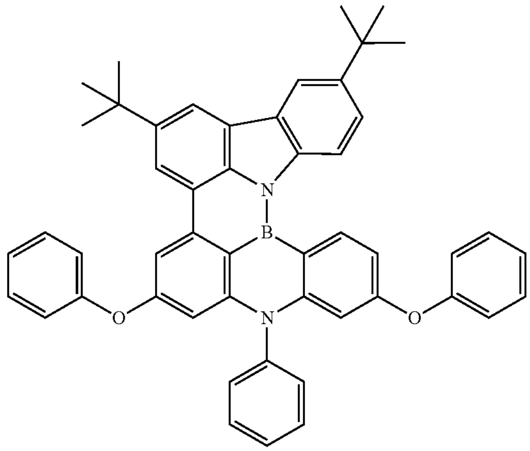
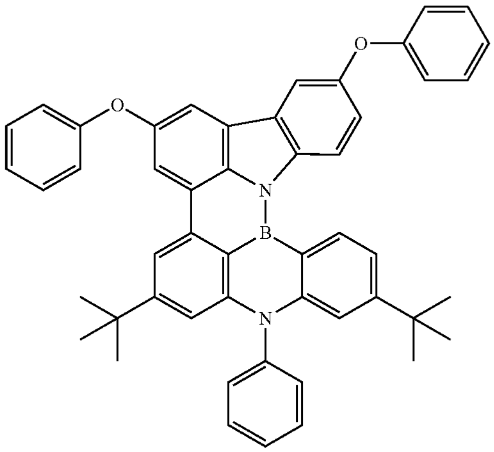
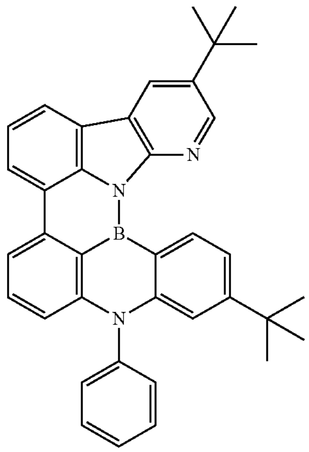

-continued
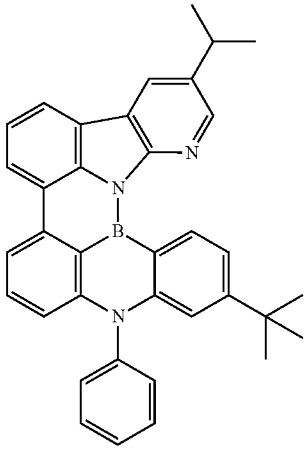
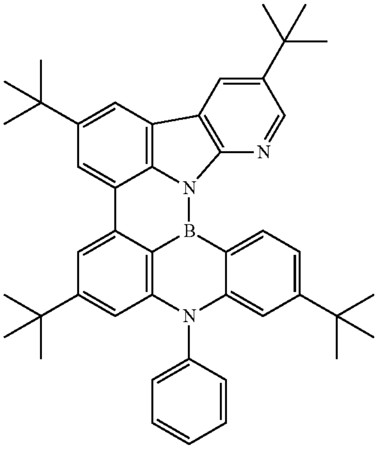
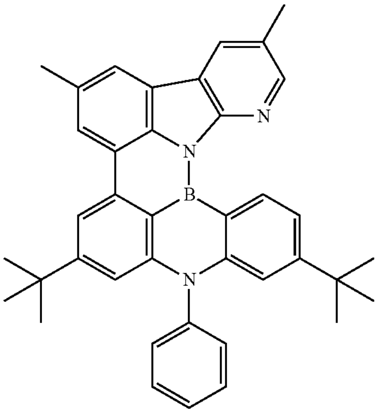
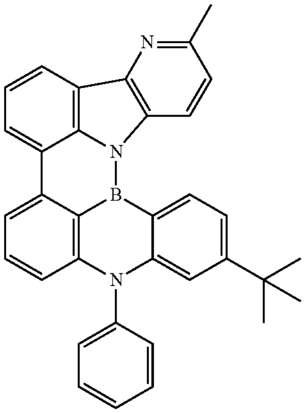
-continued
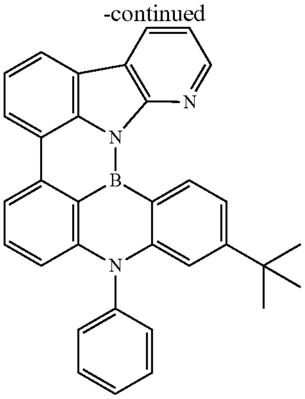
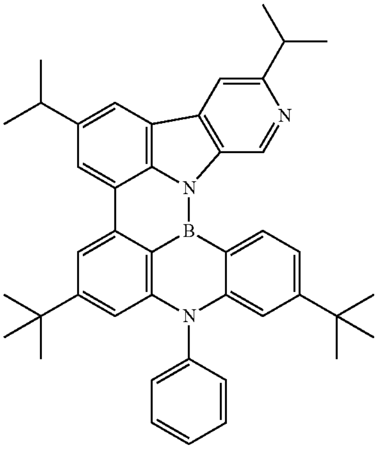
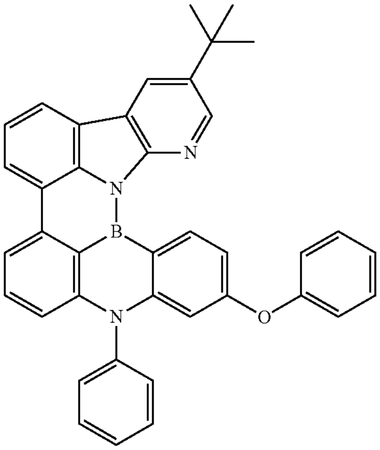
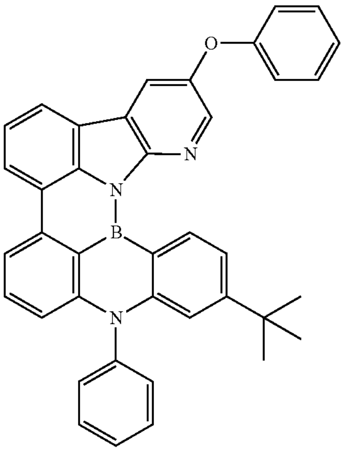

-continued
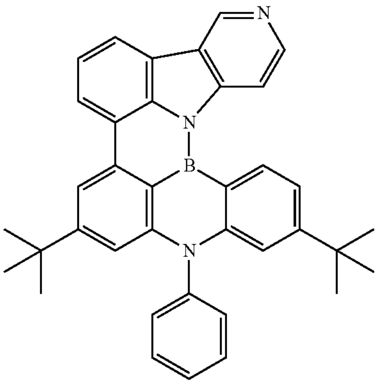
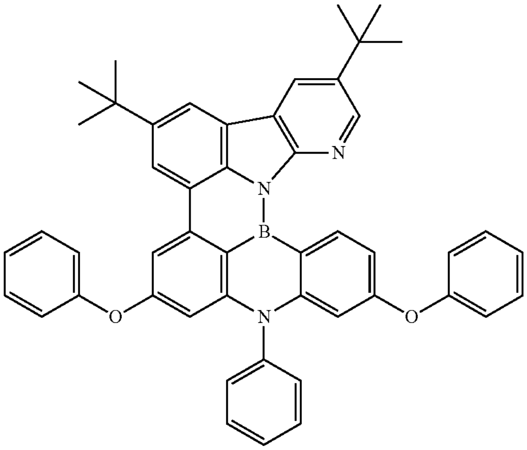
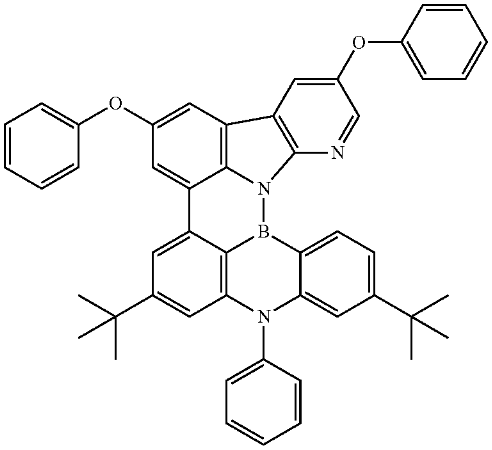
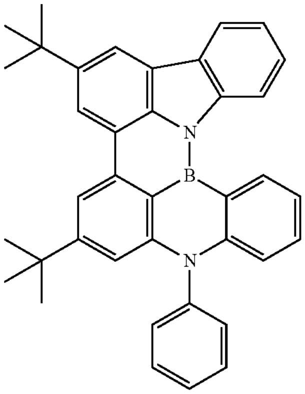
-continued
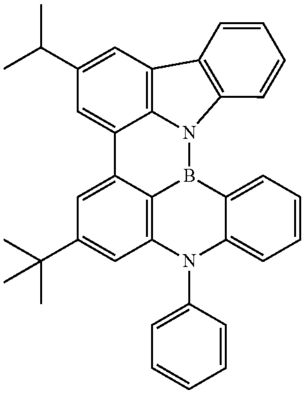
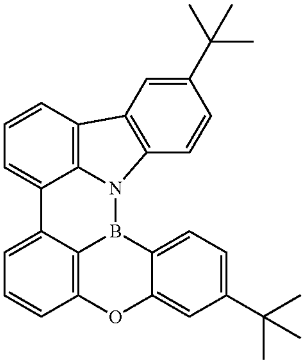
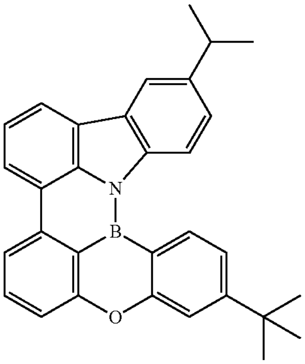
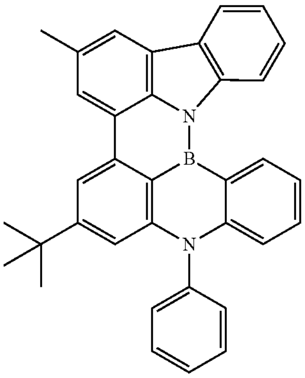

-continued
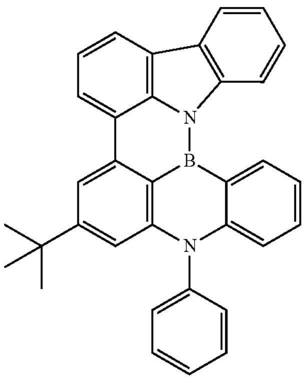
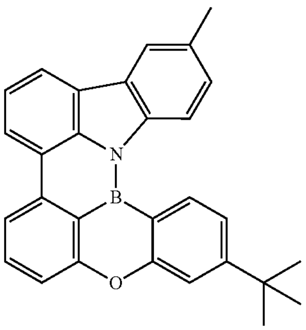
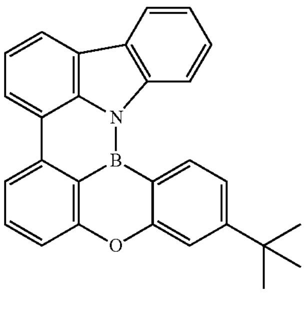
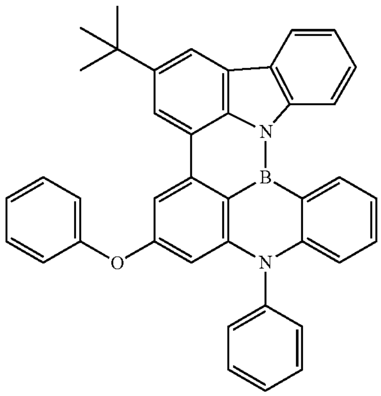
-continued
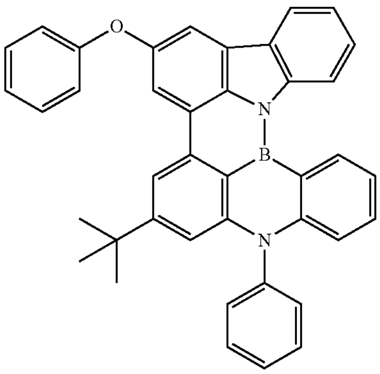
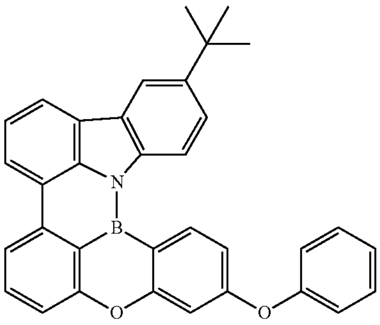
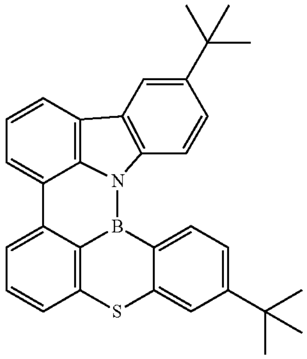
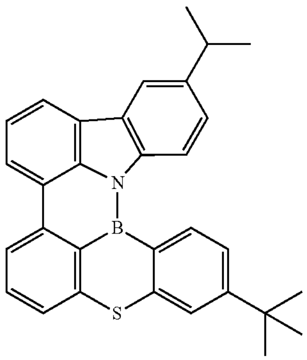

-continued
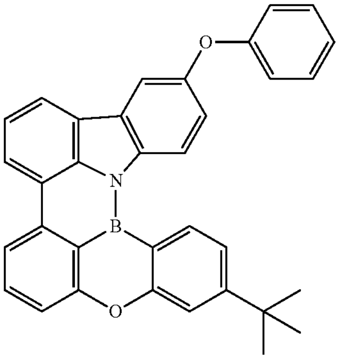
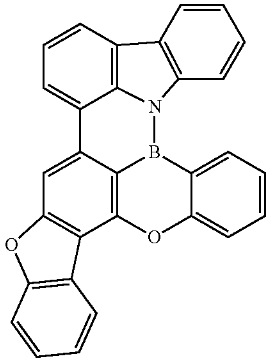
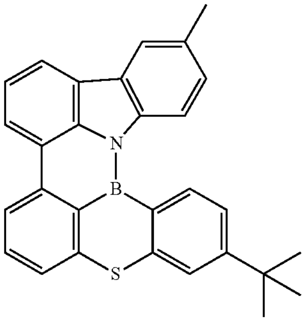
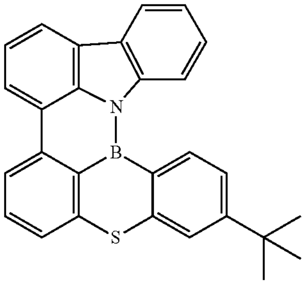
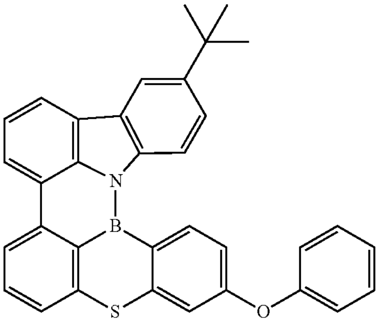
-continued
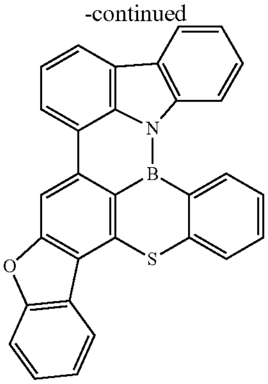
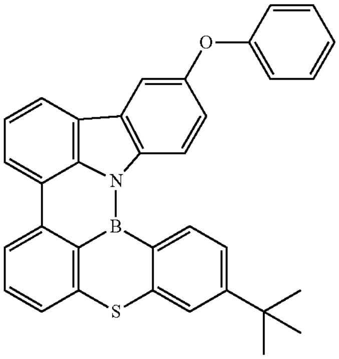
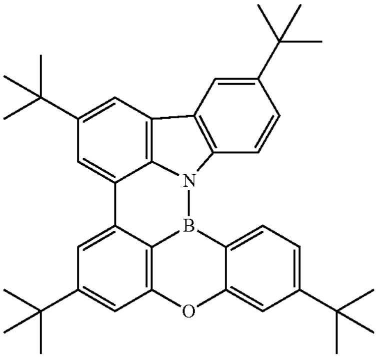
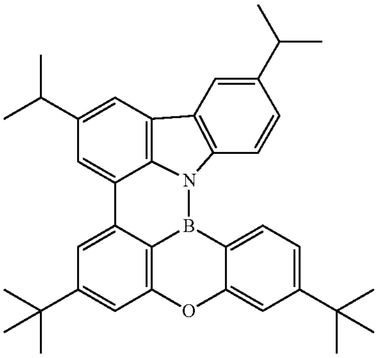

-continued
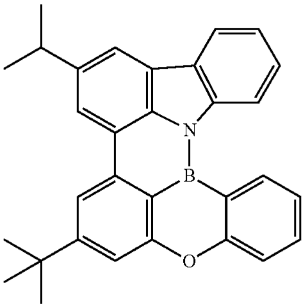
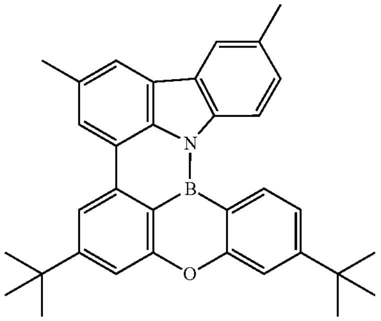
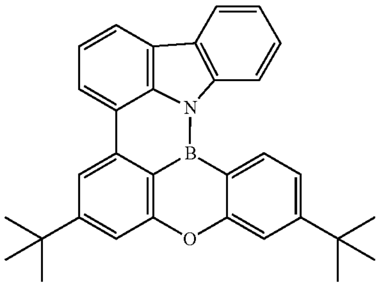
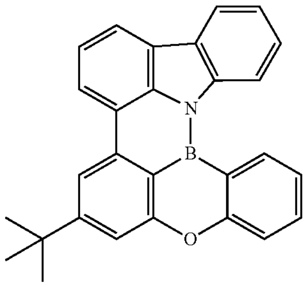
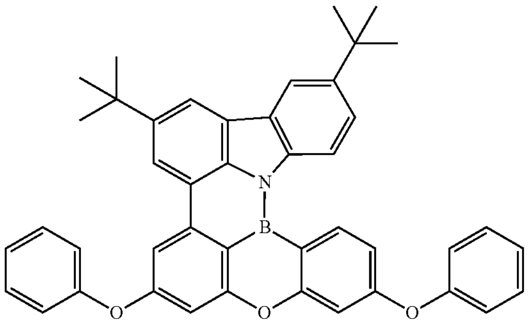
-continued
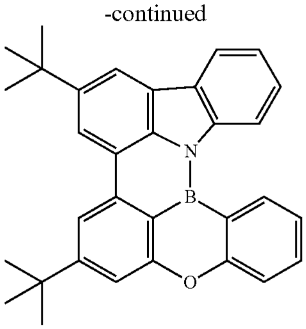
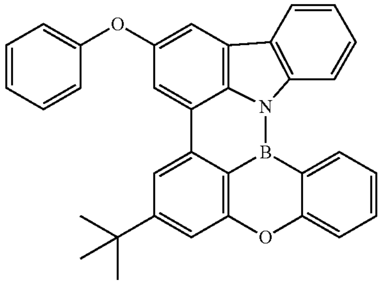
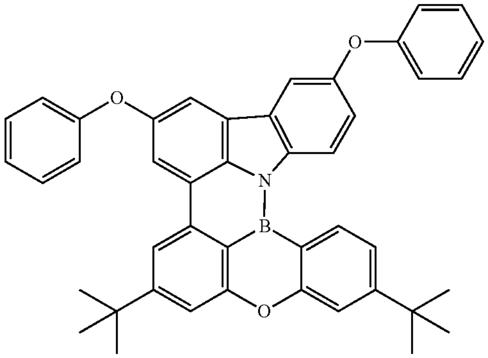
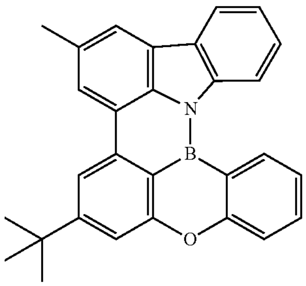
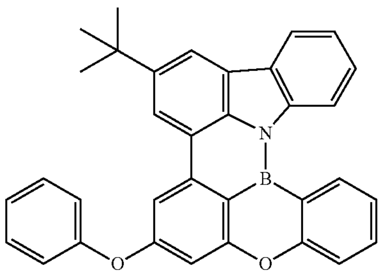

-continued
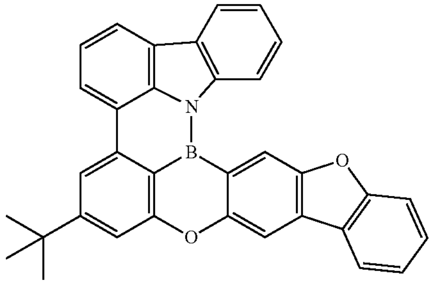
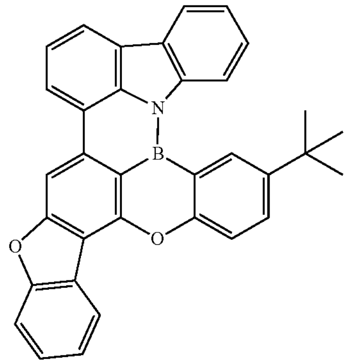
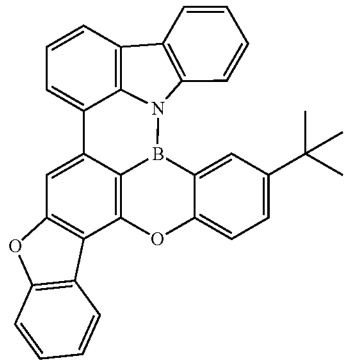
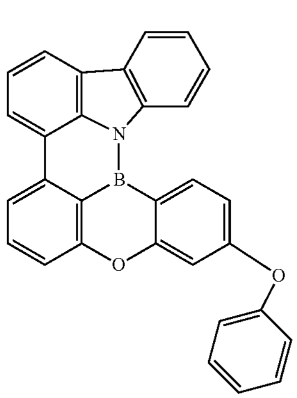
-continued
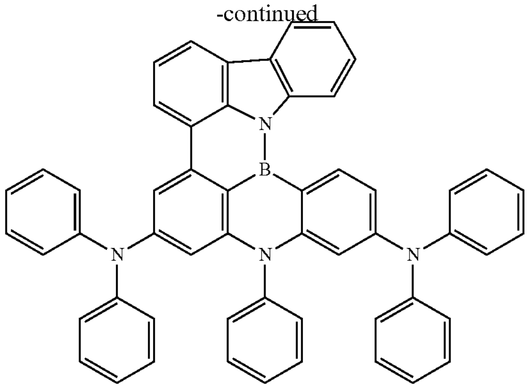
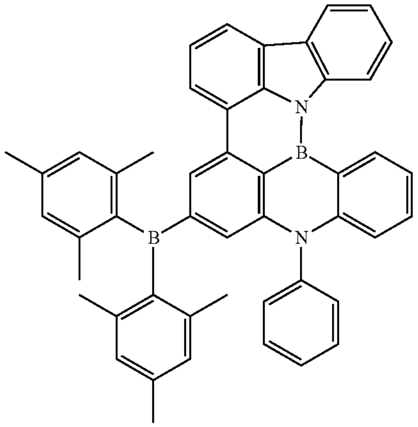
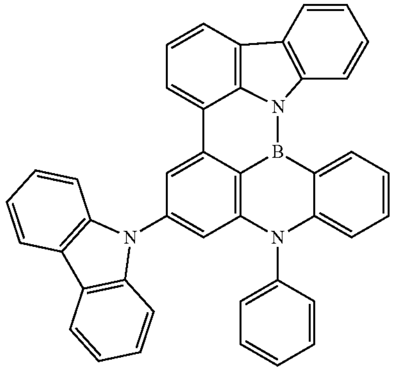
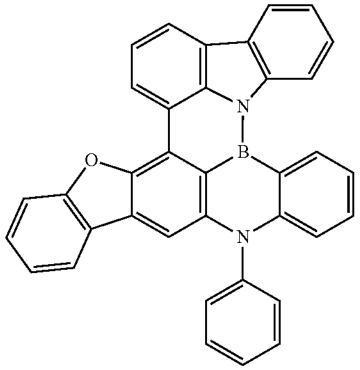

-continued
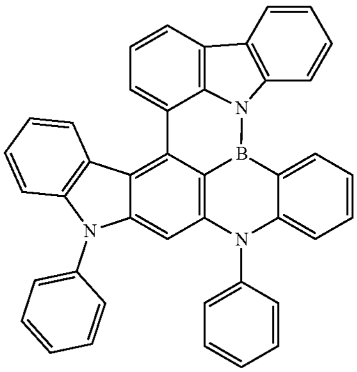
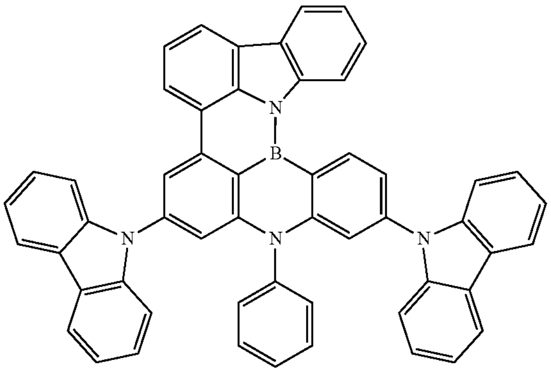
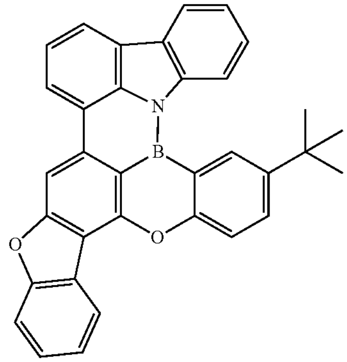
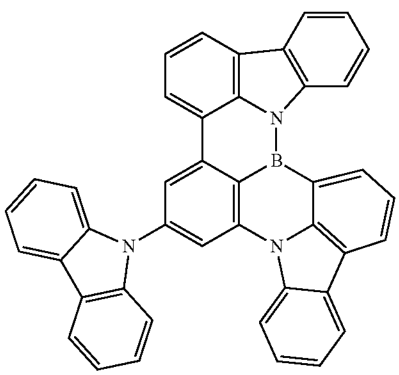
-continued
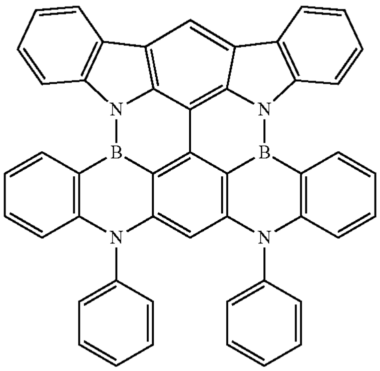
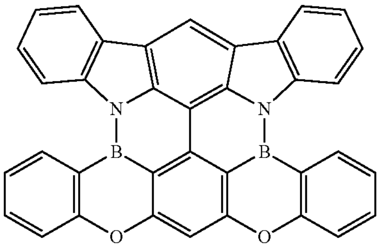
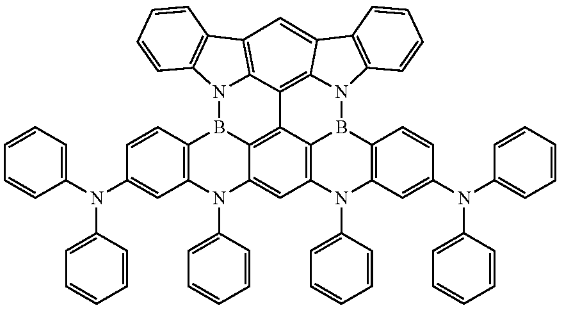
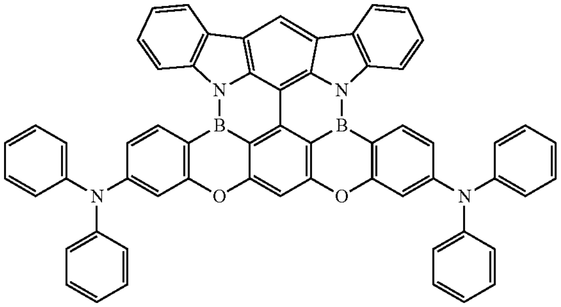
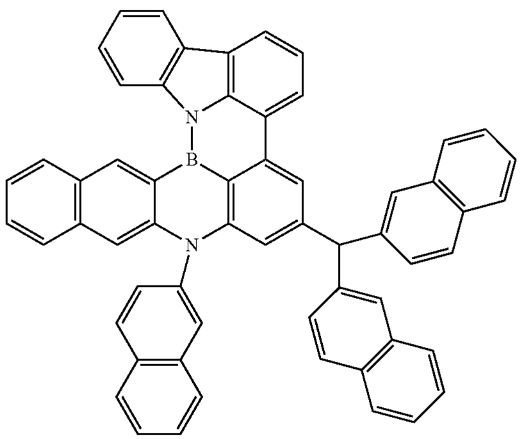

-continued
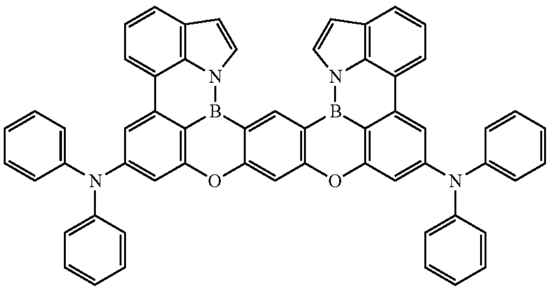
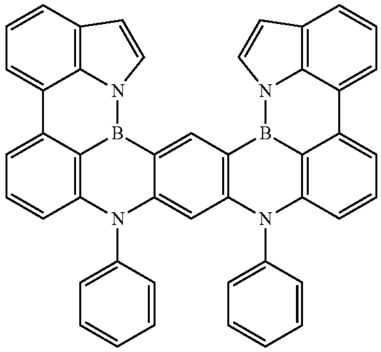
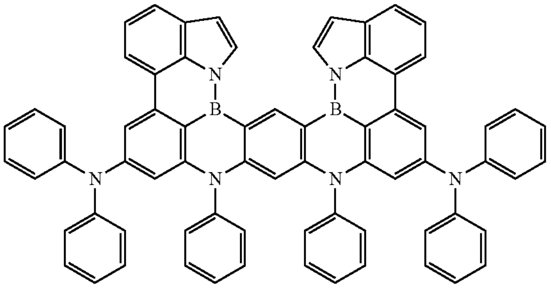
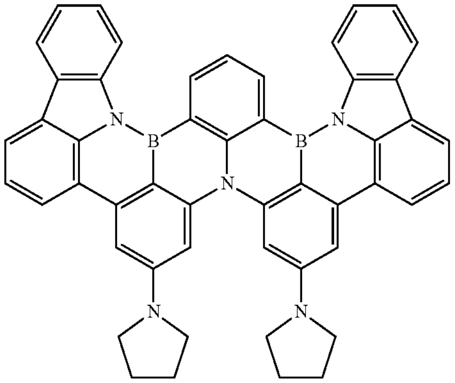
-continued
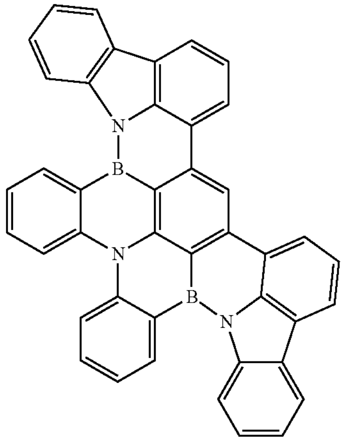
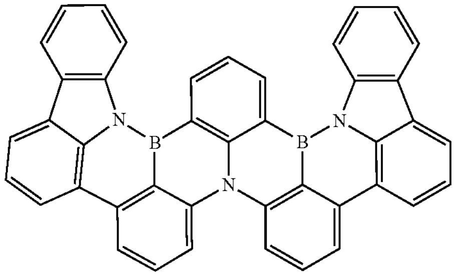
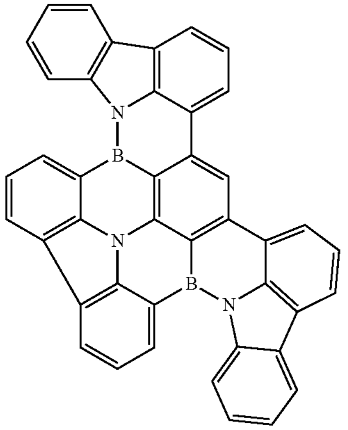
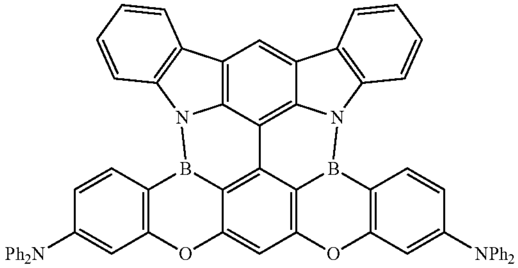

-continued
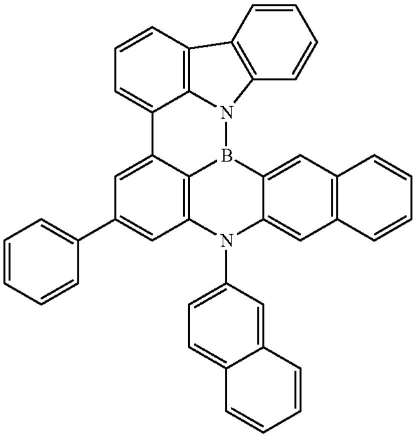
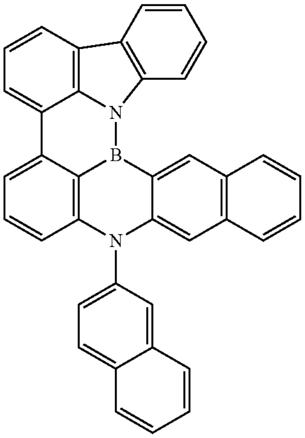
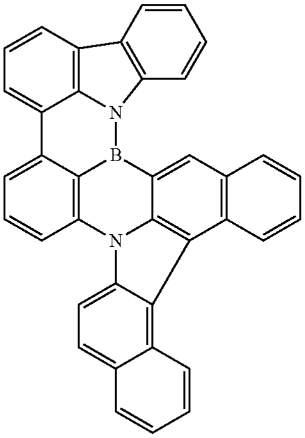
-continued
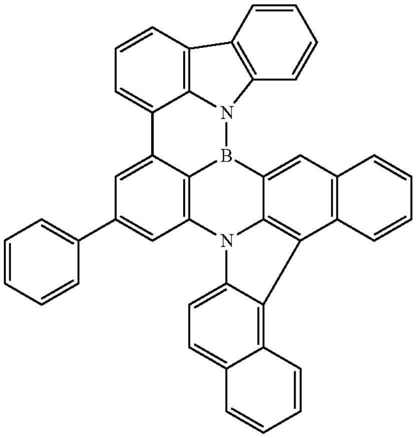
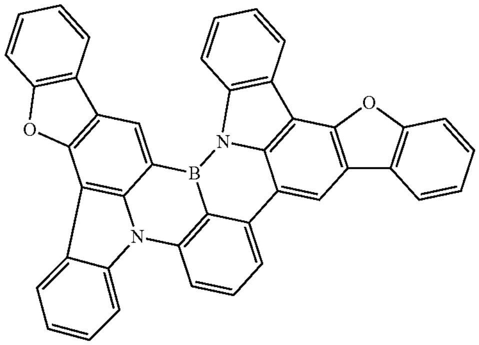
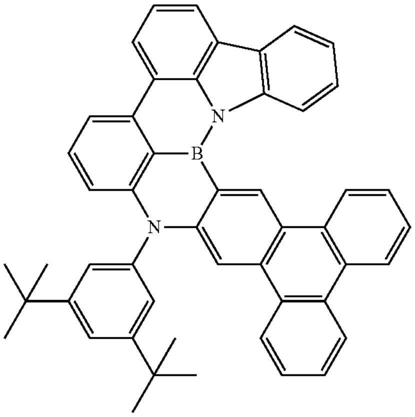
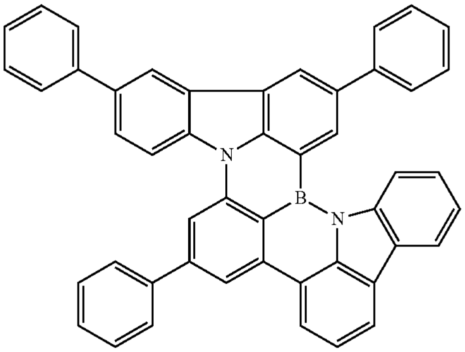

-continued
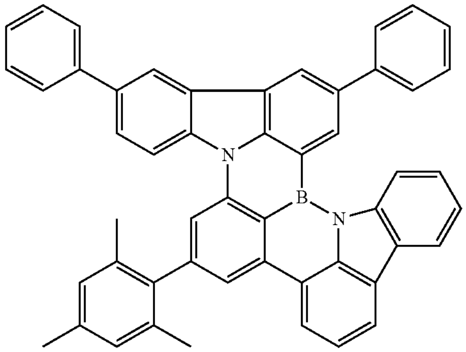
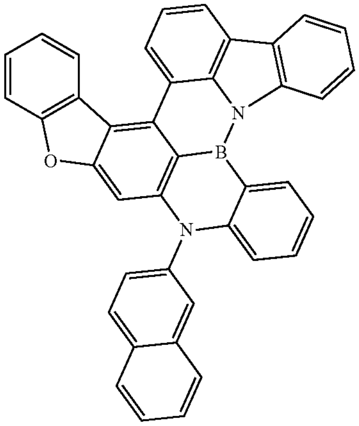
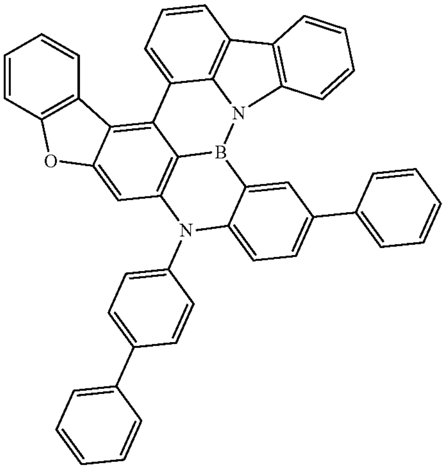
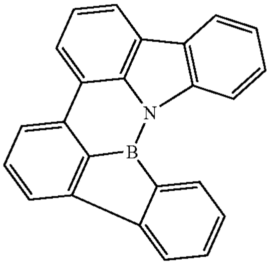
-continued
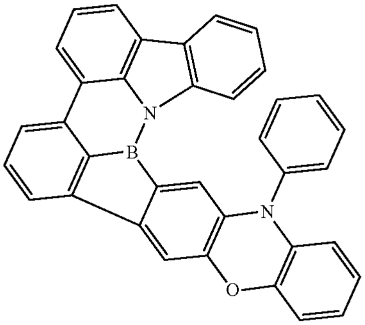
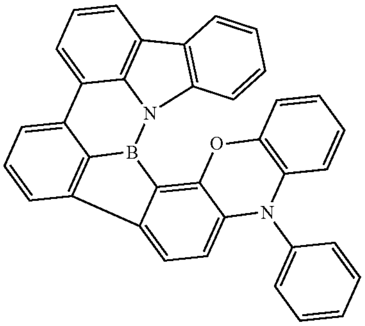
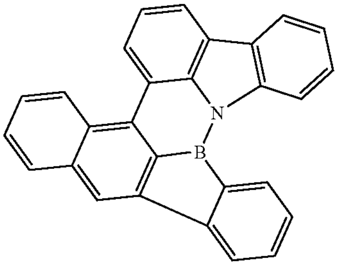
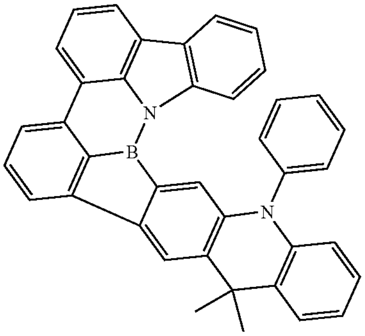
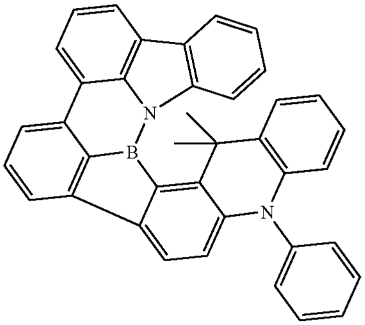

-continued
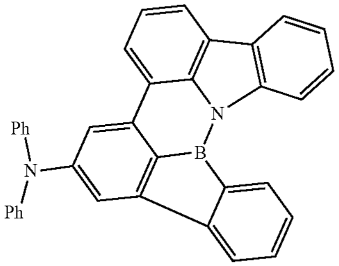
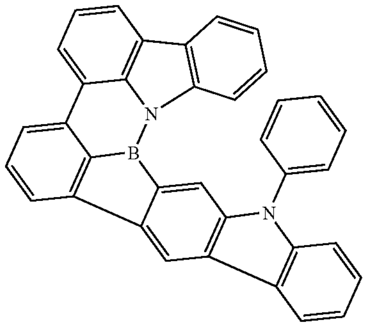
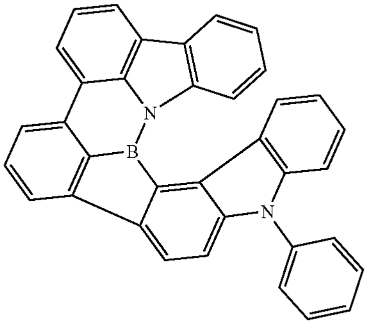
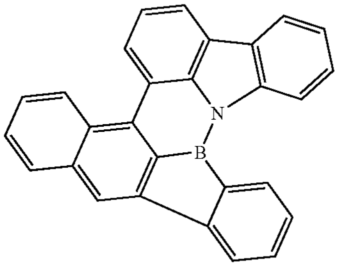
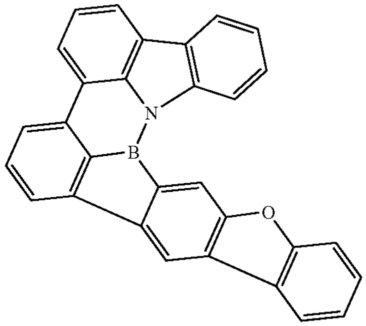
-continued
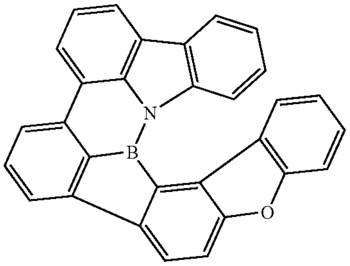
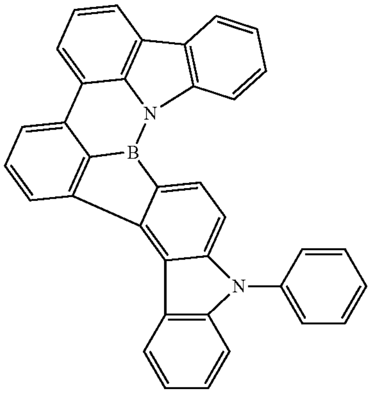
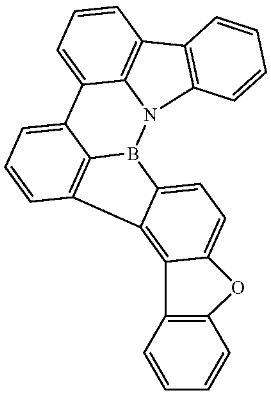
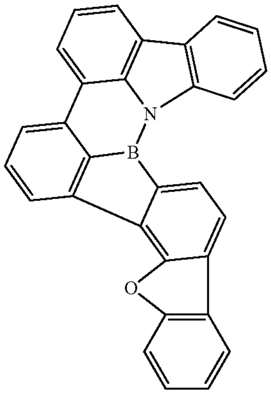

-continued
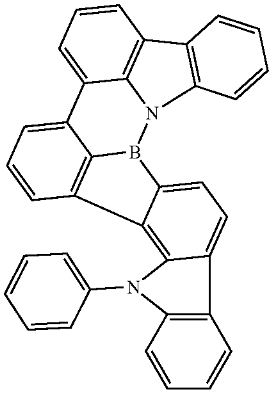
-continued
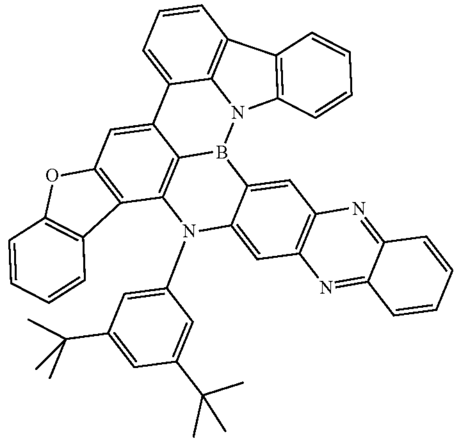
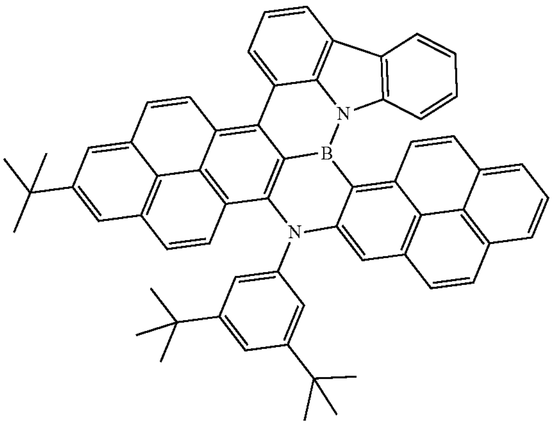
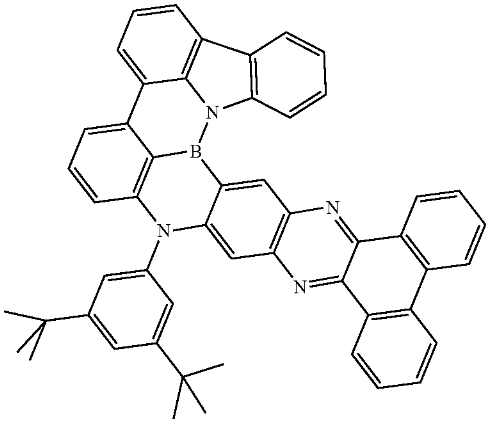
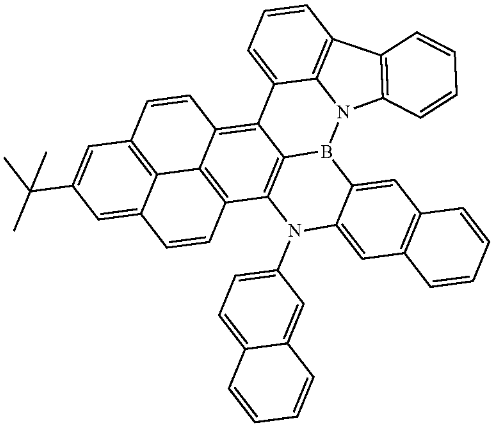
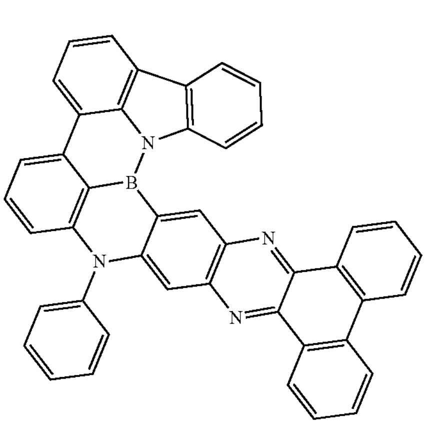

-continued
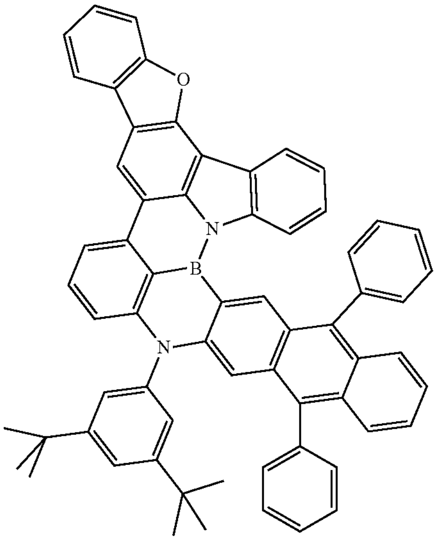
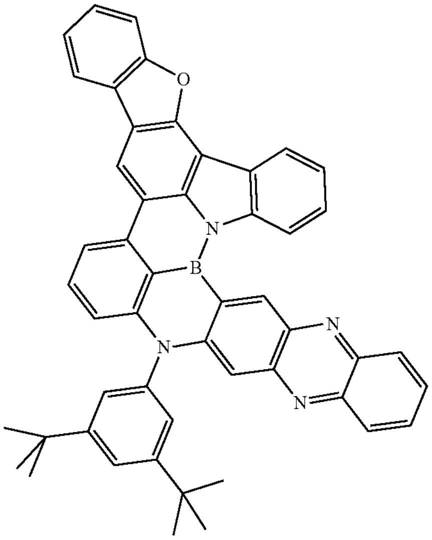
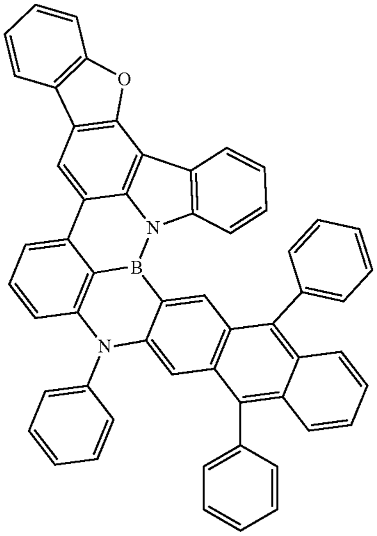
-continued
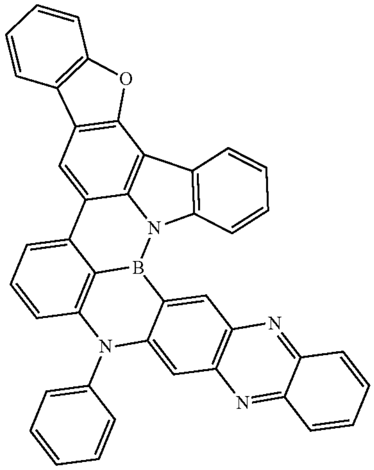
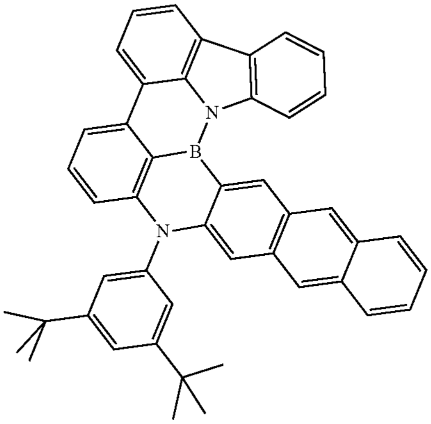
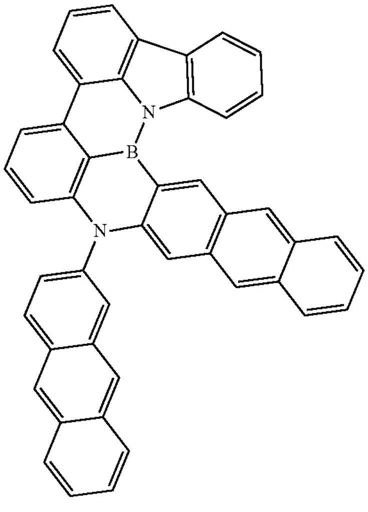

-continued
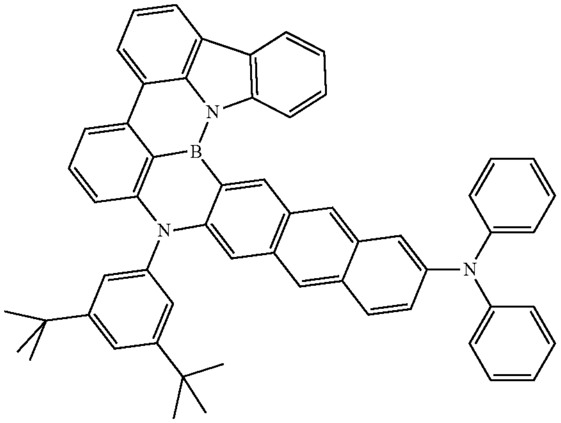
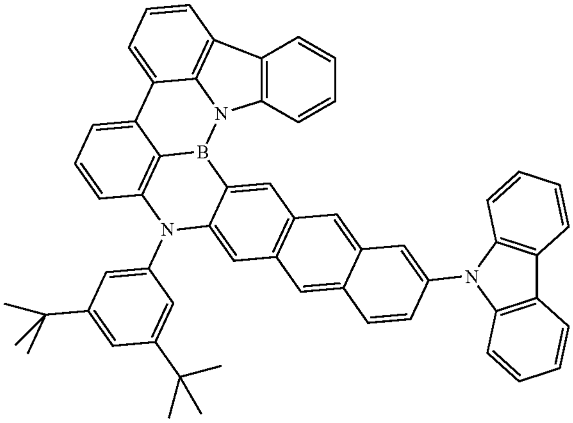
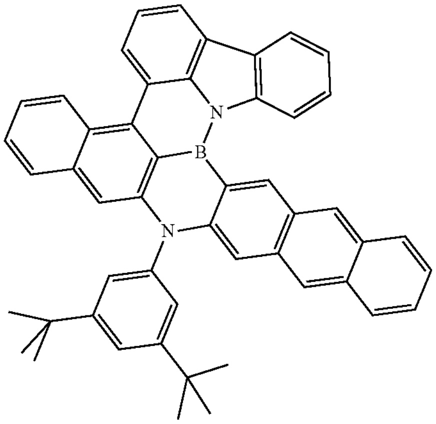
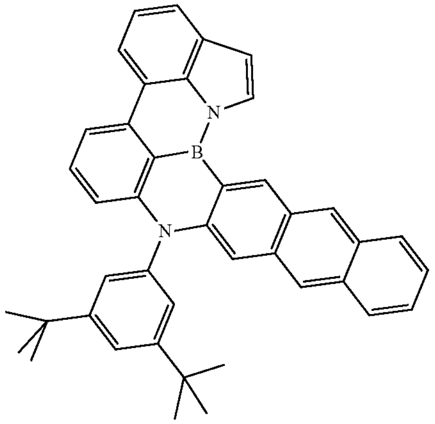
-continued
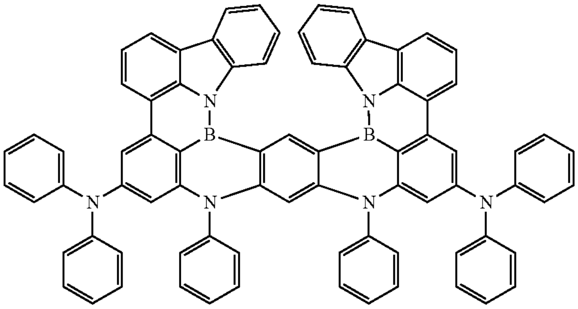
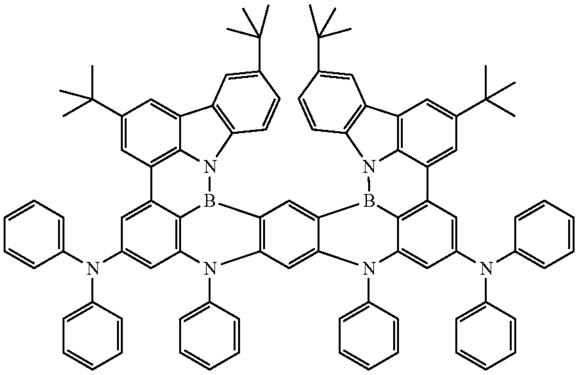
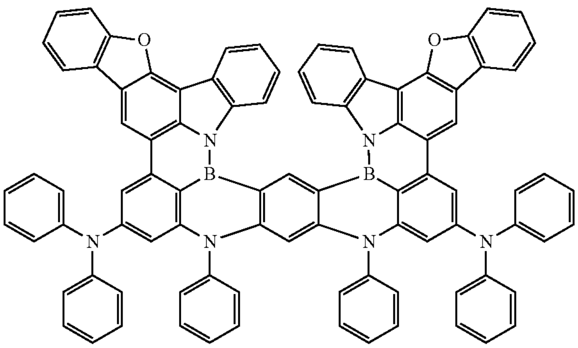
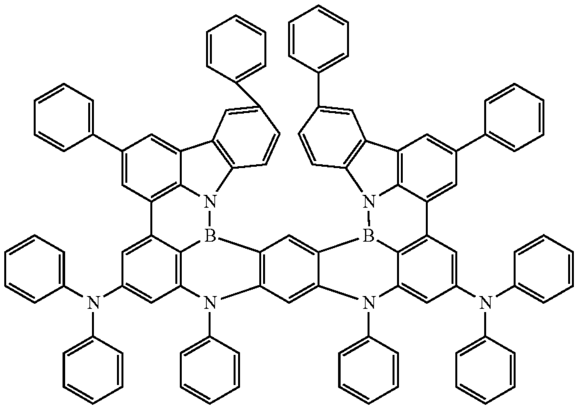

-continued
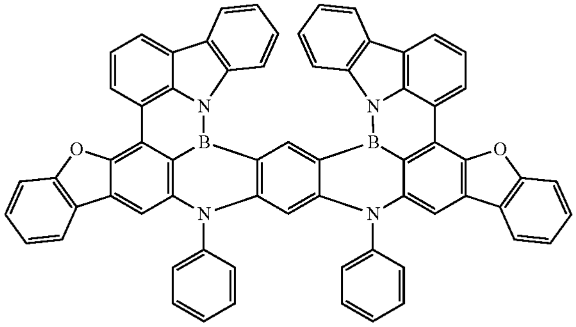
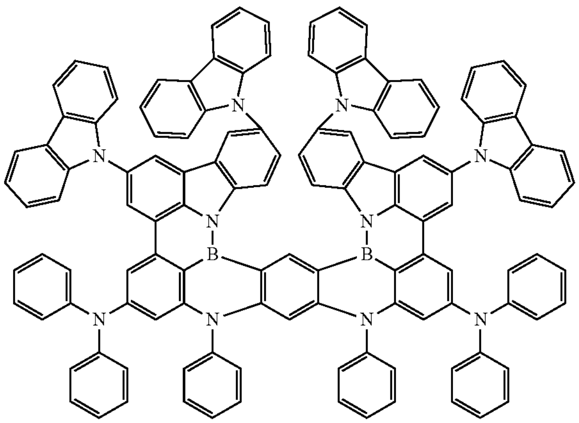
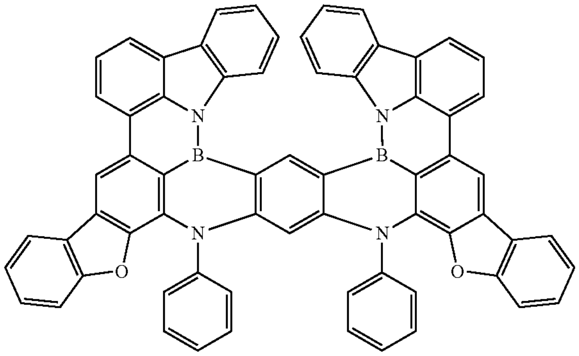
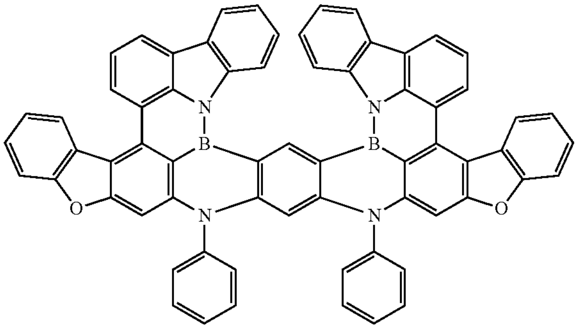
-continued
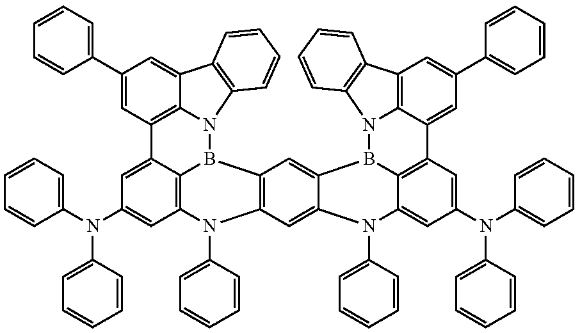
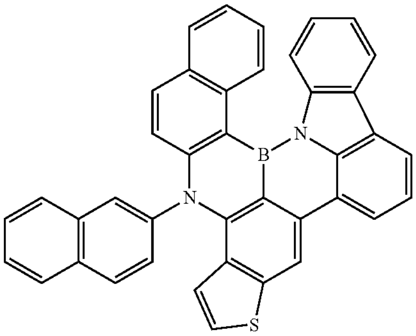
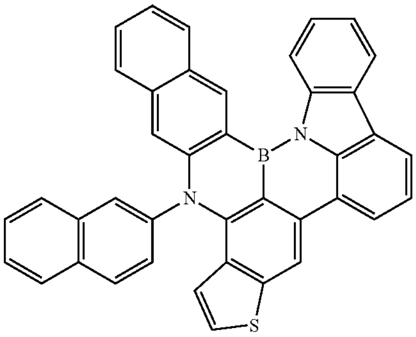
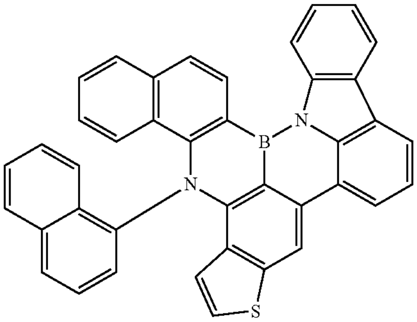

-continued
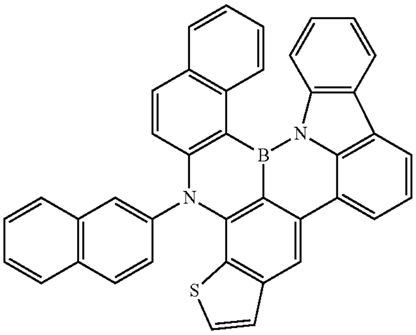
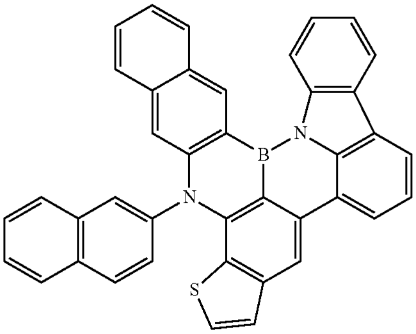
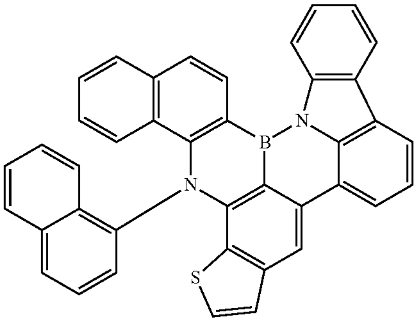
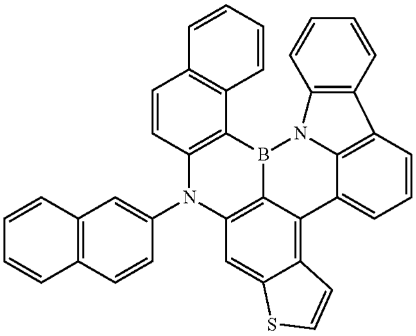
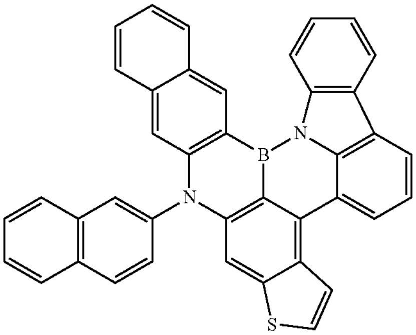
-continued
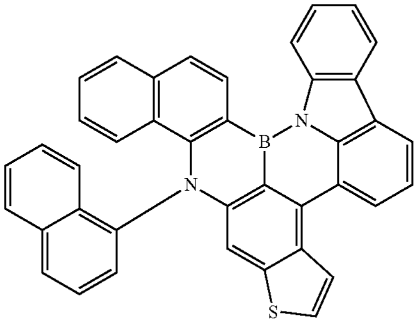
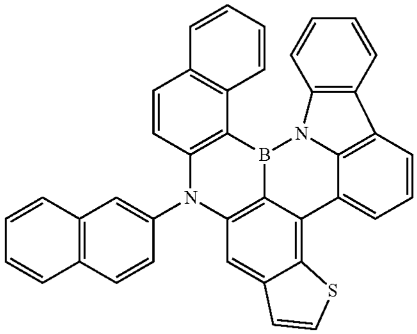
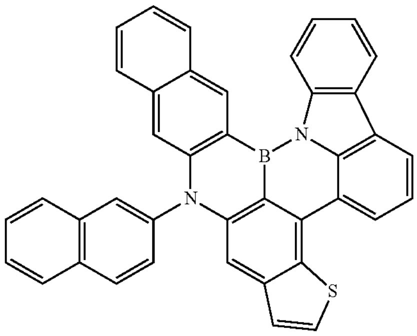
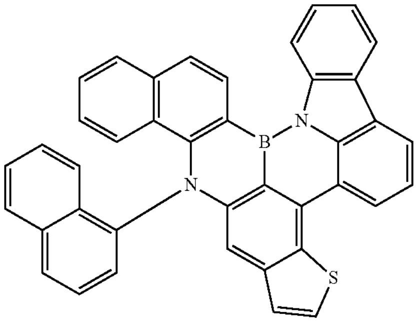
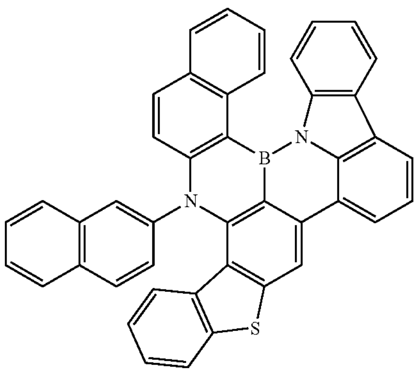

-continued
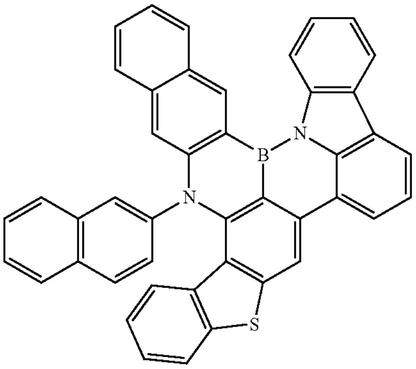
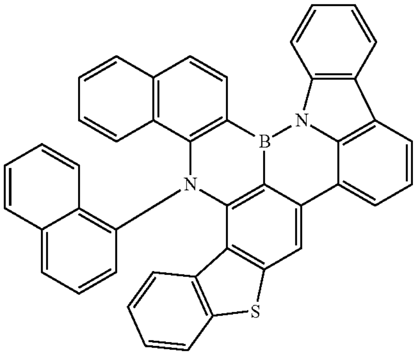
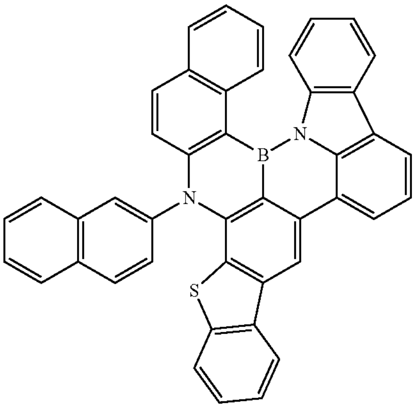
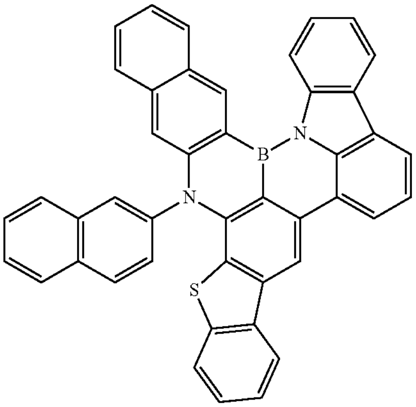
-continued
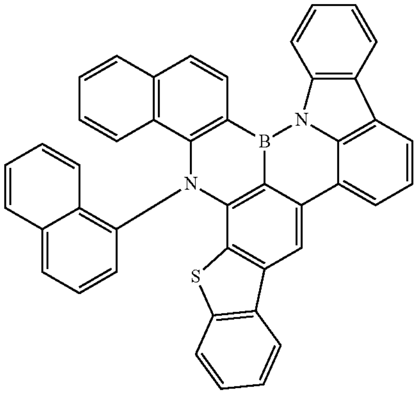
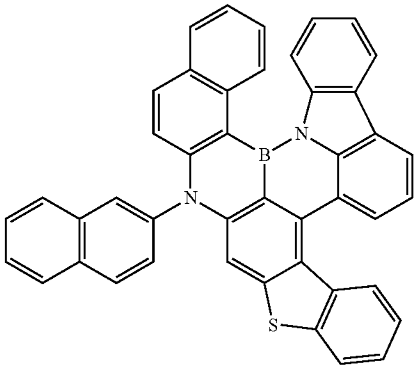
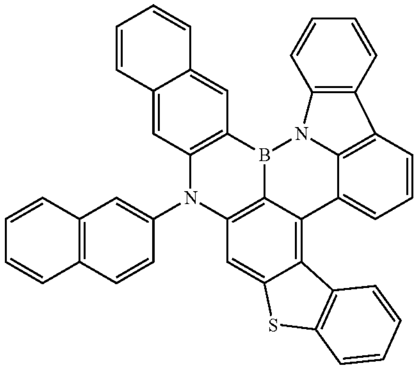
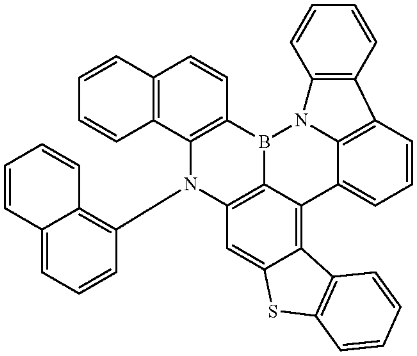

-continued
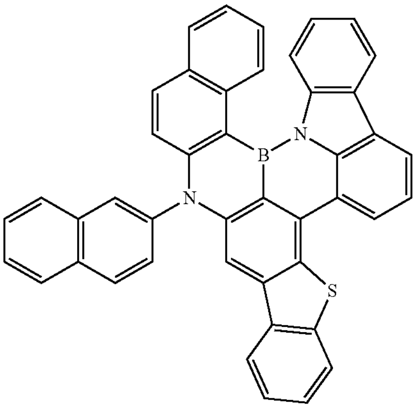
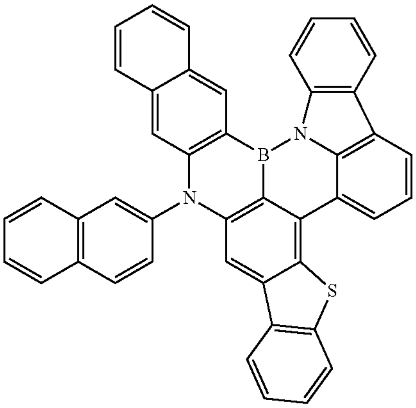
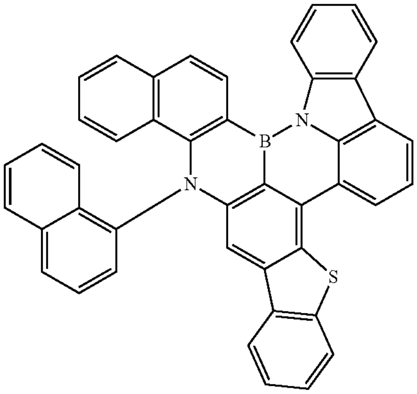
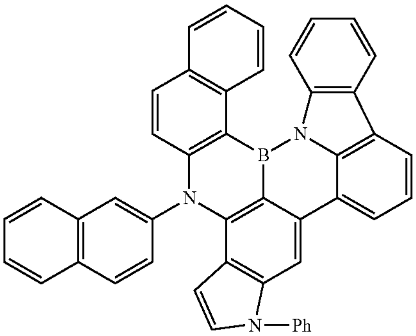
-continued
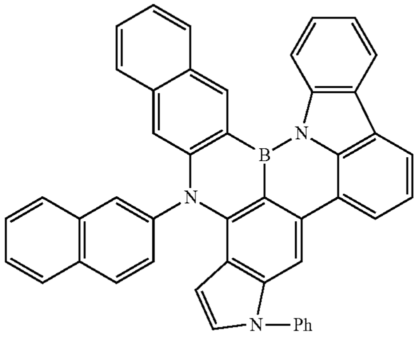
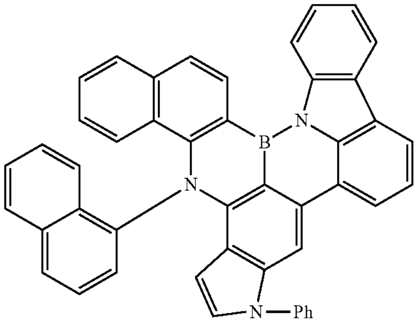
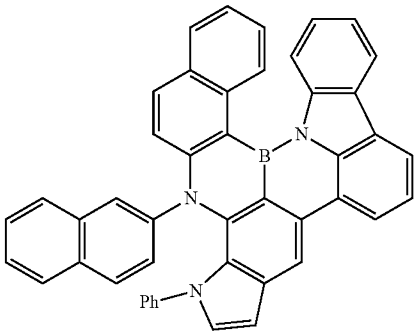
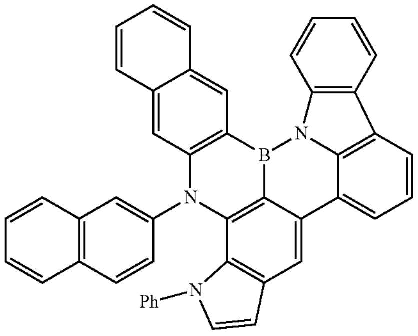
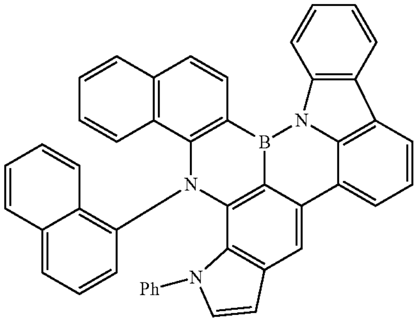

-continued
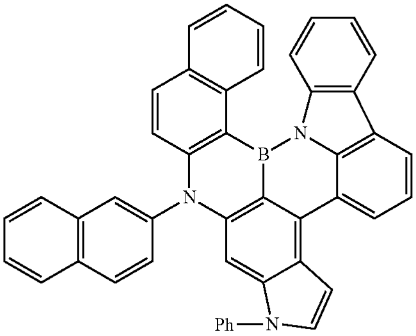
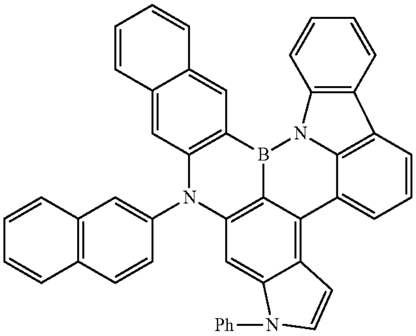
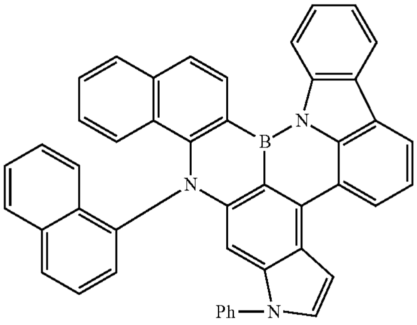
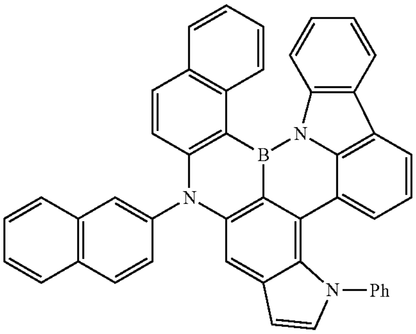
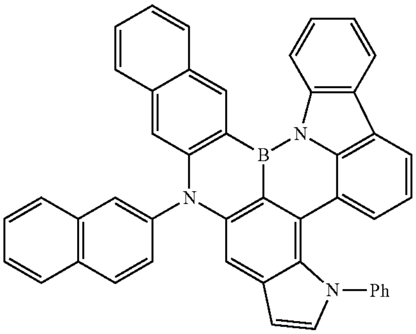
-continued
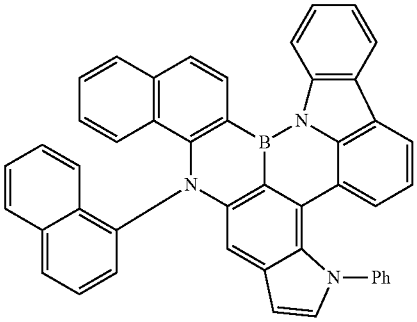
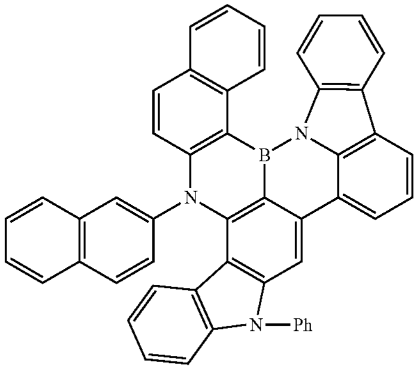
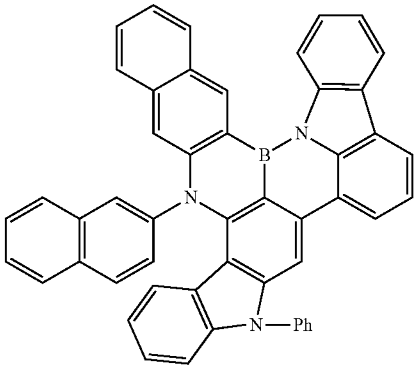
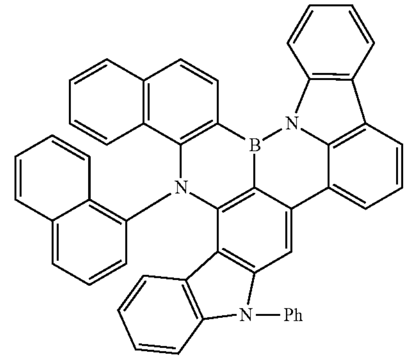

-continued
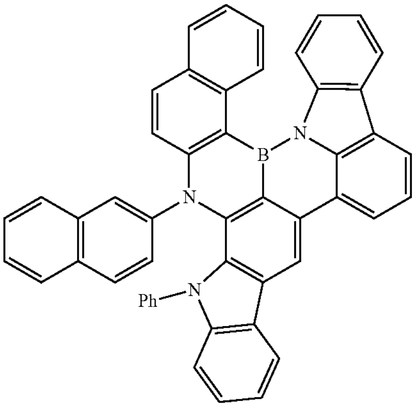
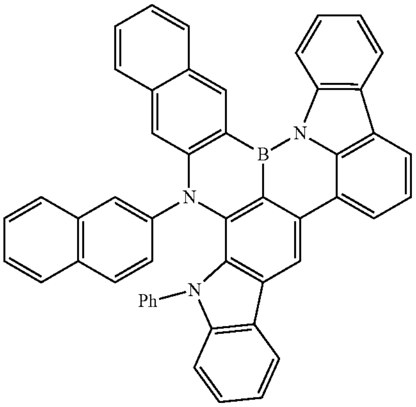
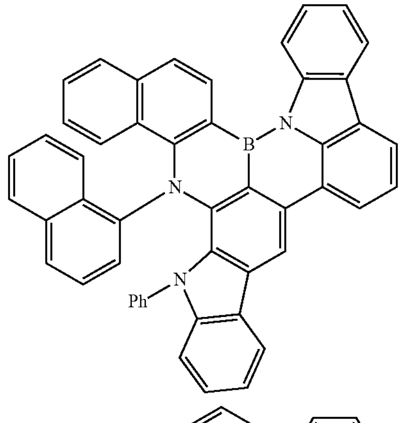
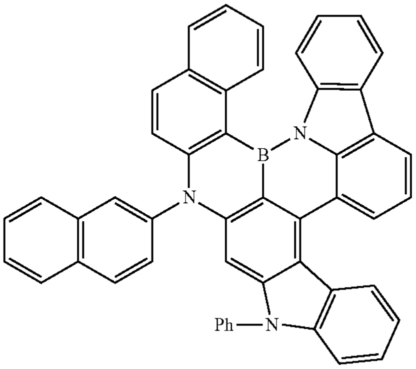
-continued
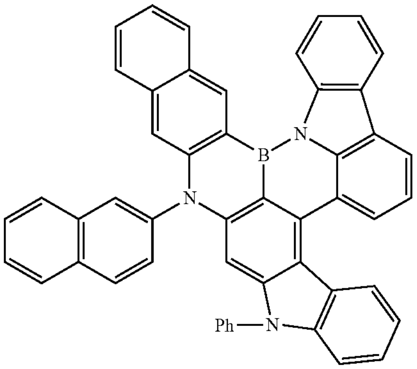
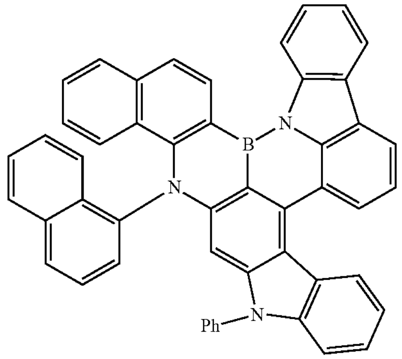
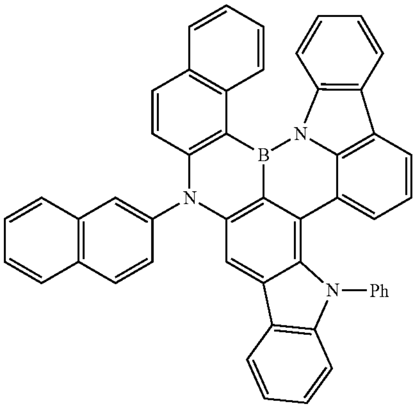
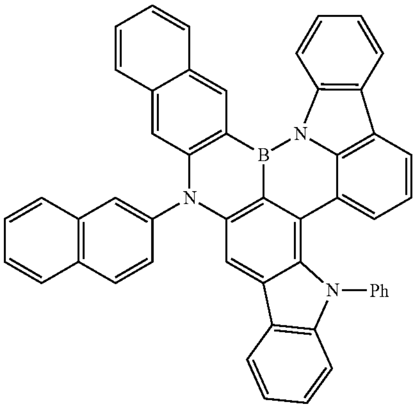

-continued
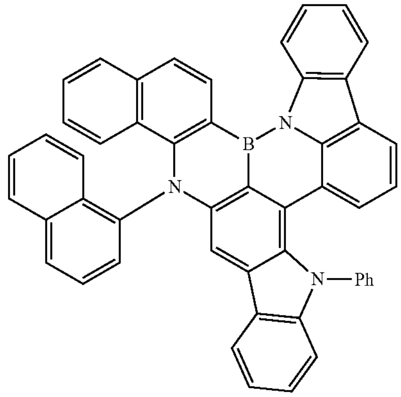
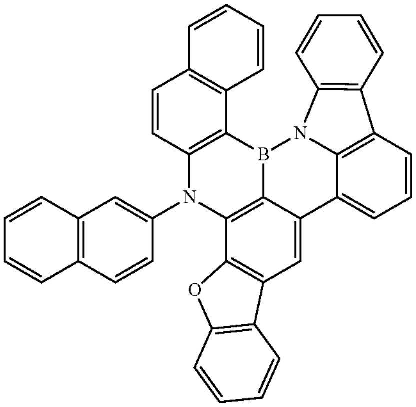
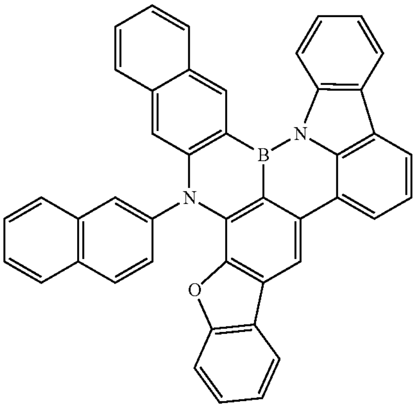
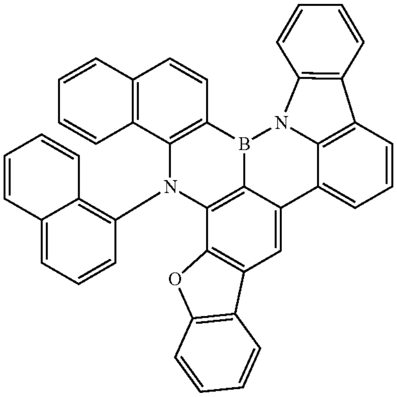
-continued
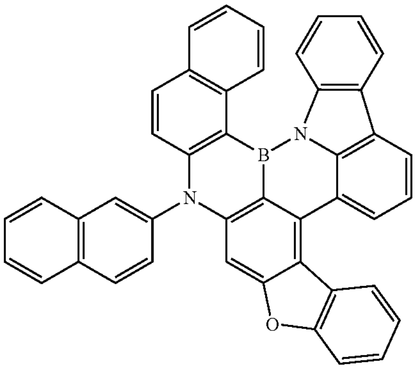
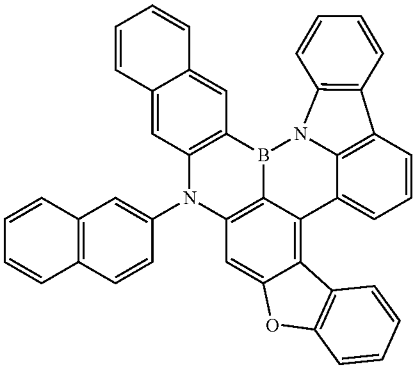
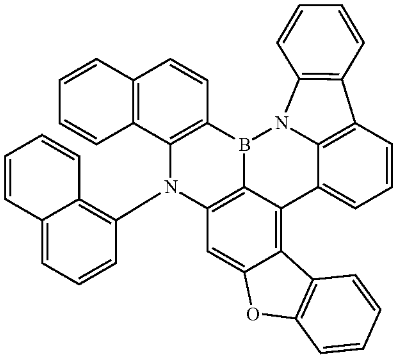
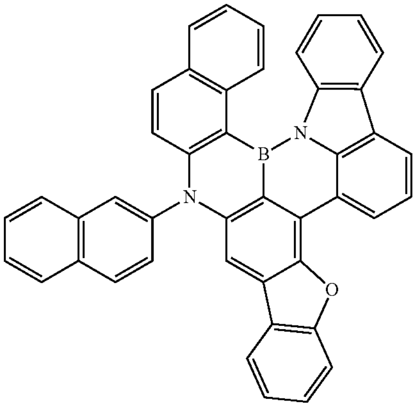

-continued
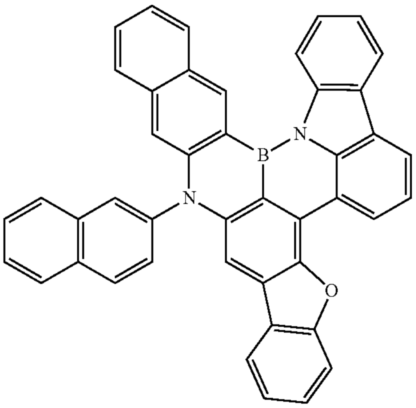
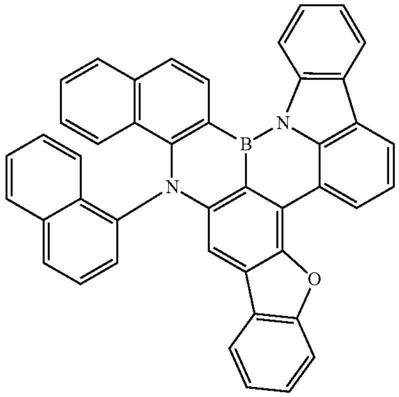
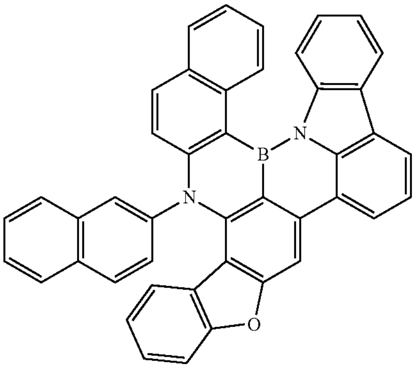
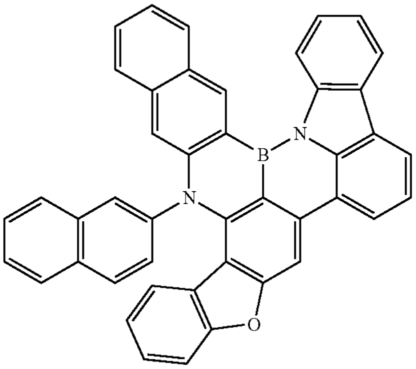
-continued
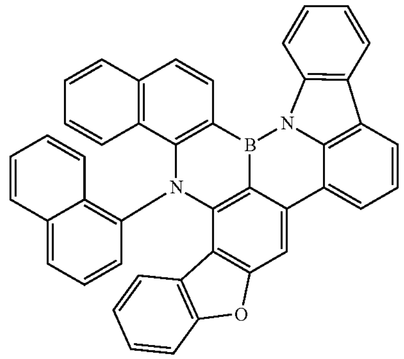
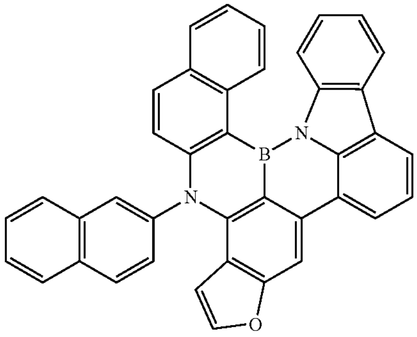
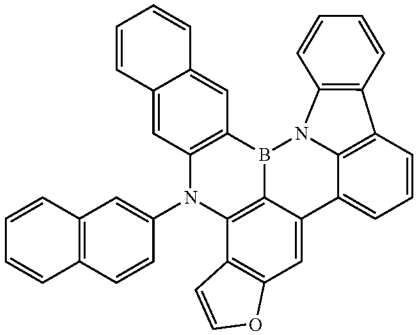
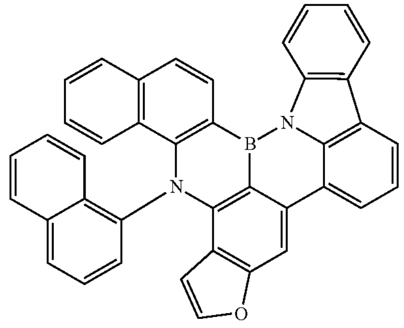
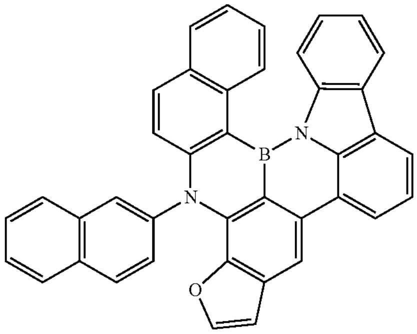

-continued
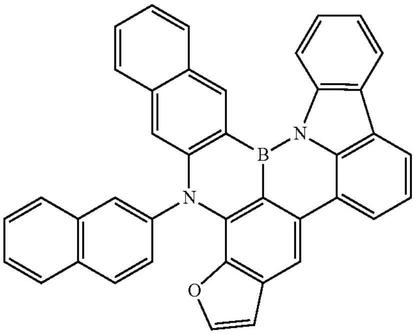
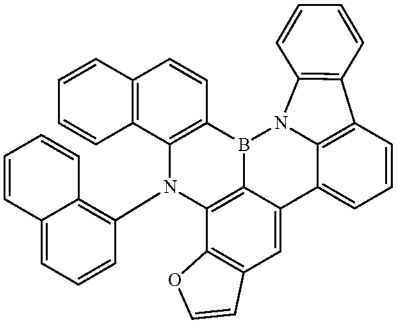
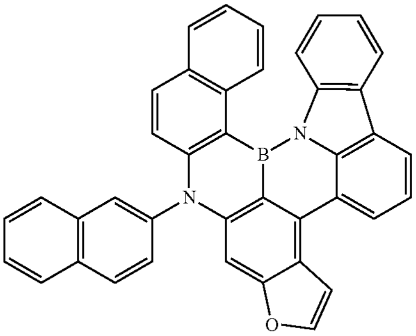
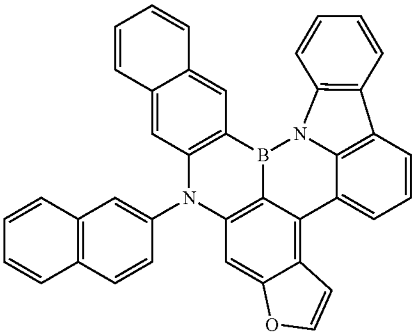
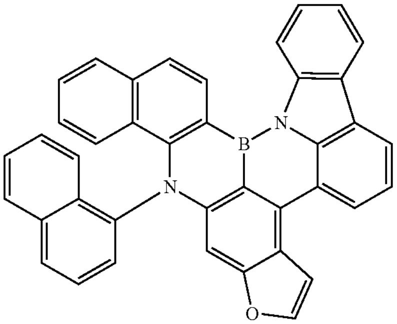
-continued
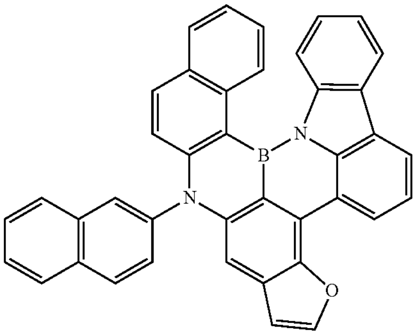
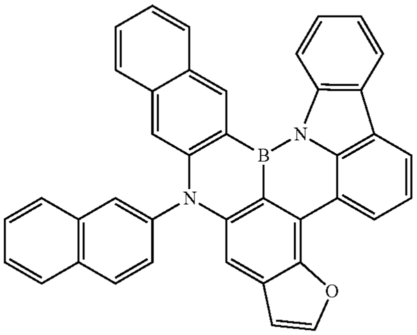
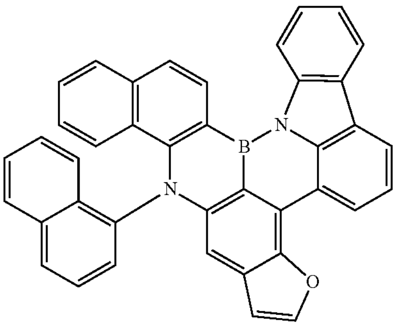
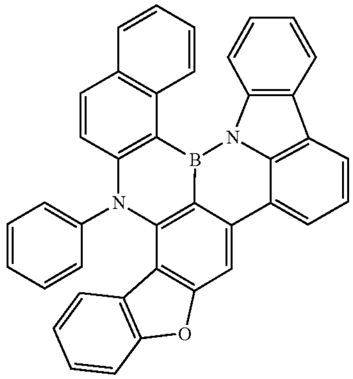

-continued
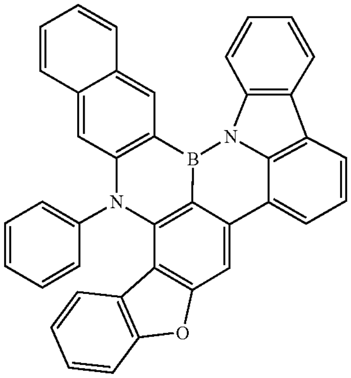
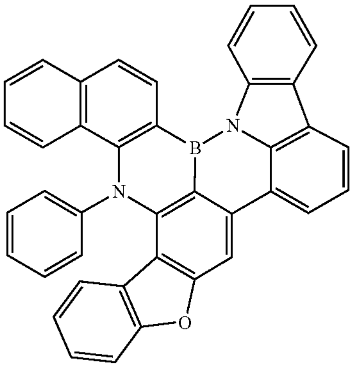
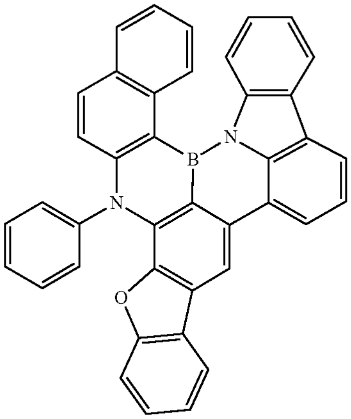
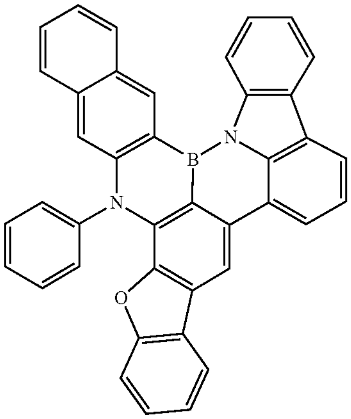
-continued
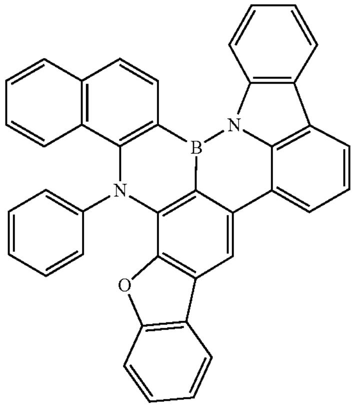
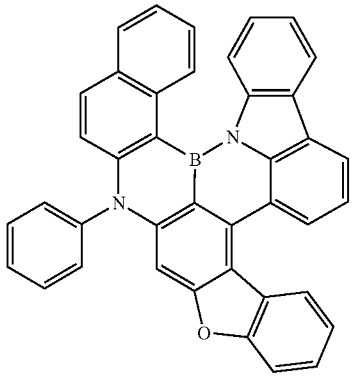
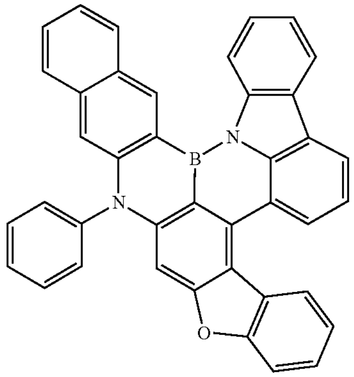
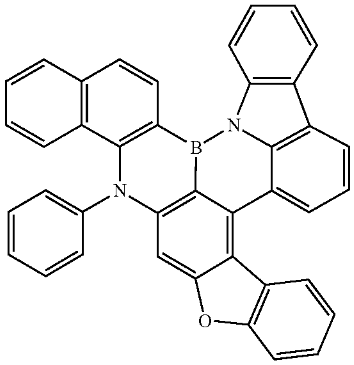

-continued
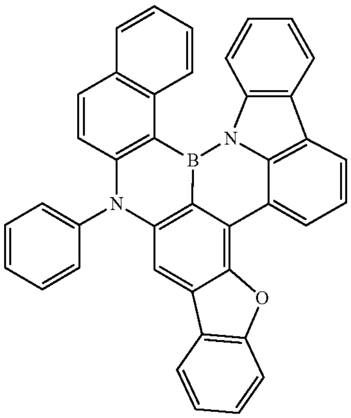
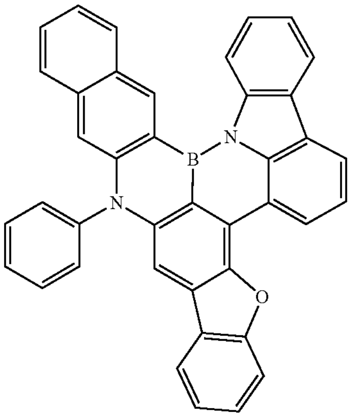
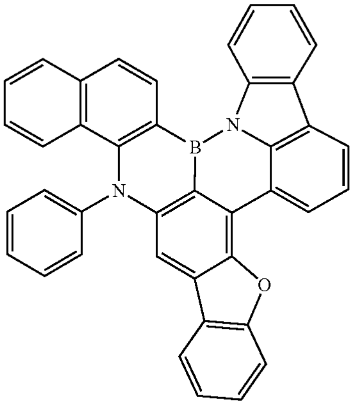
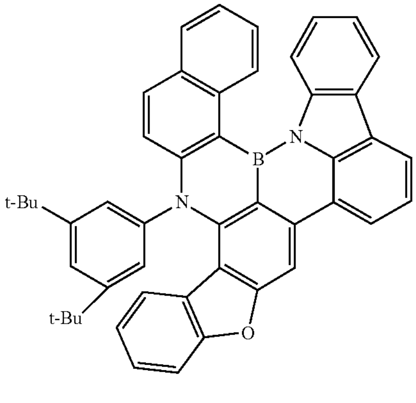
-continued
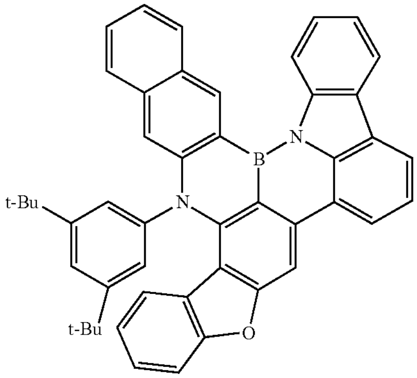
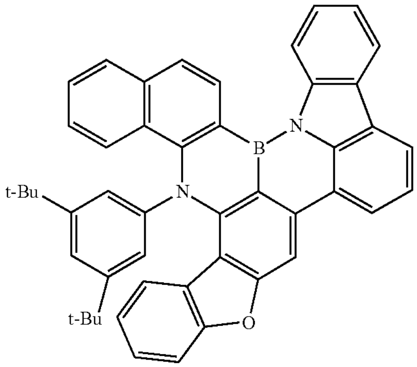
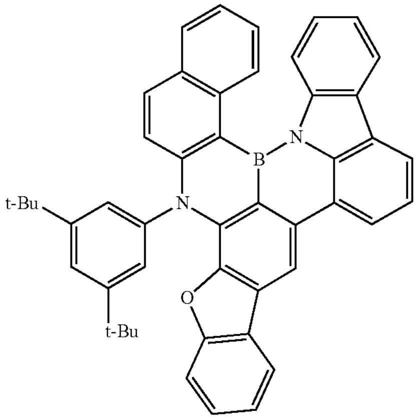
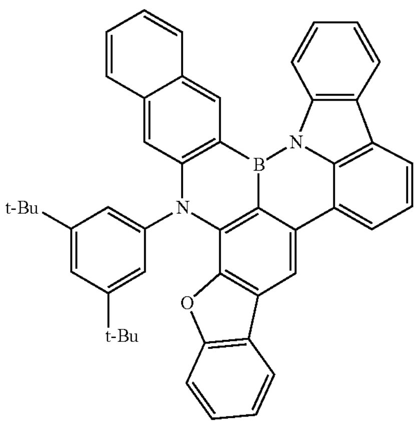

-continued
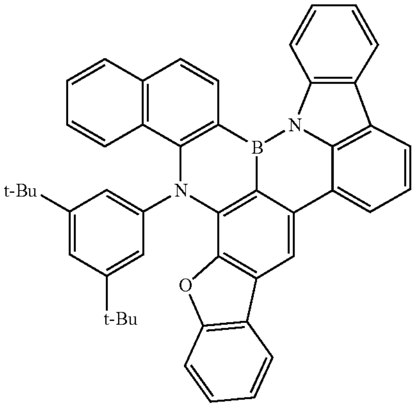
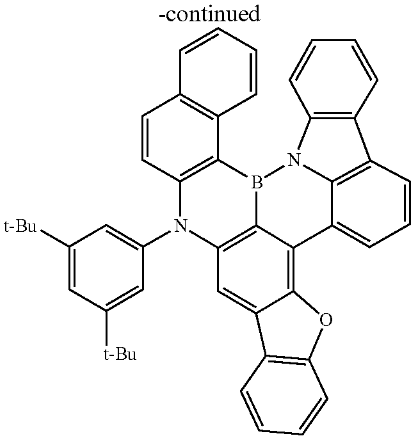
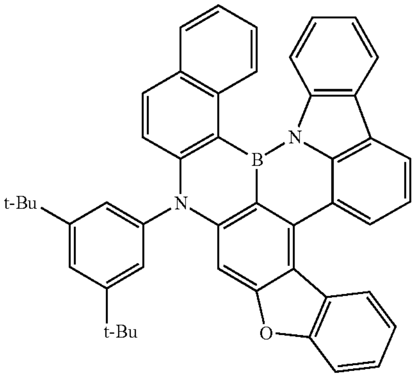
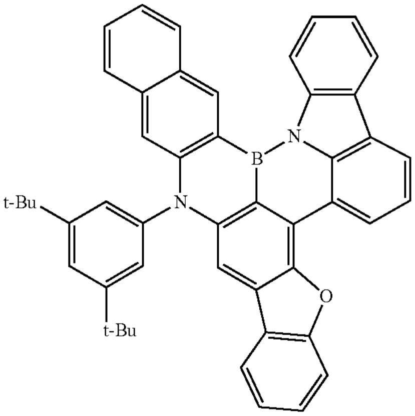
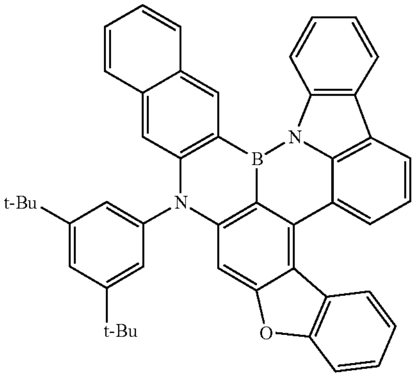
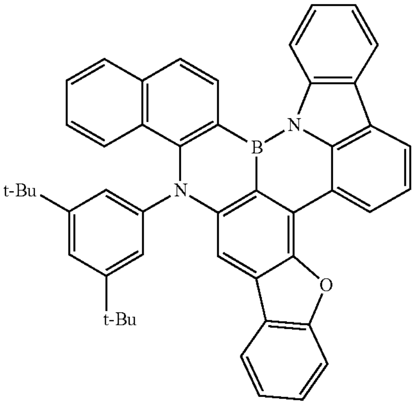
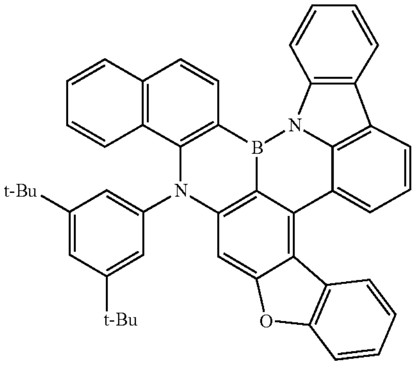
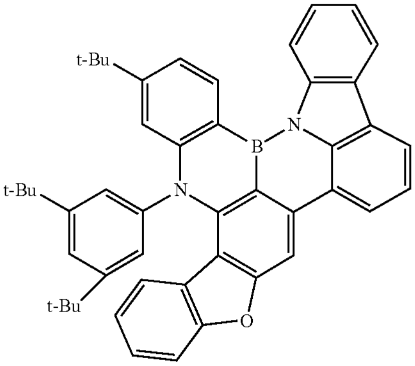

-continued
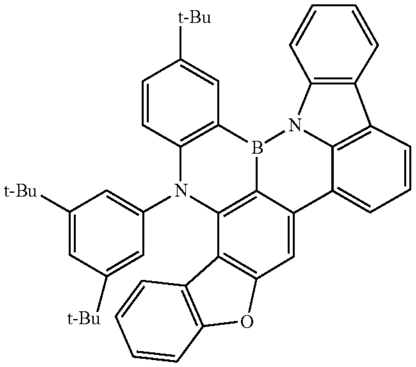
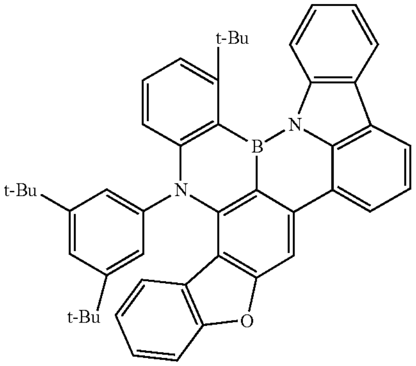
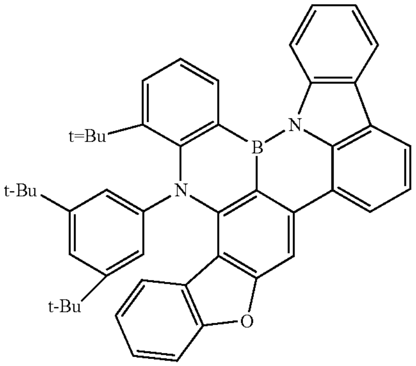
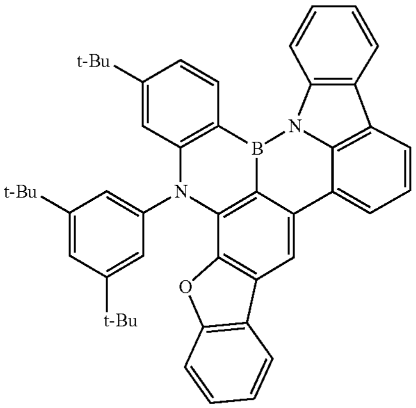
-continued
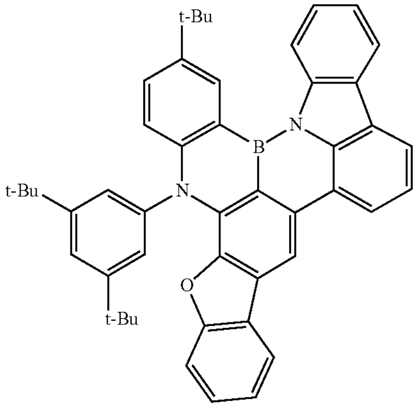
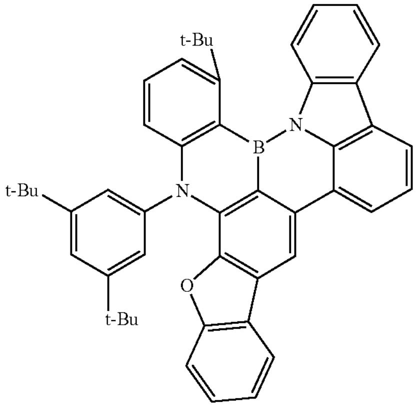
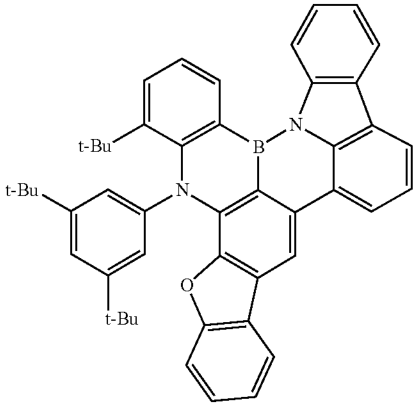
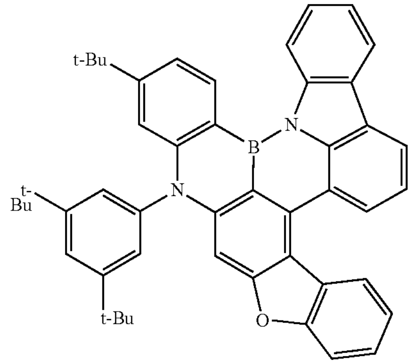

-continued
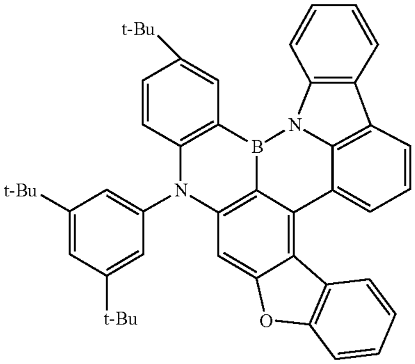
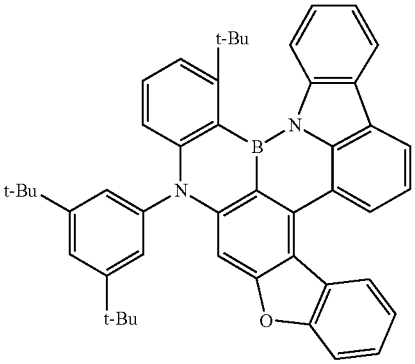
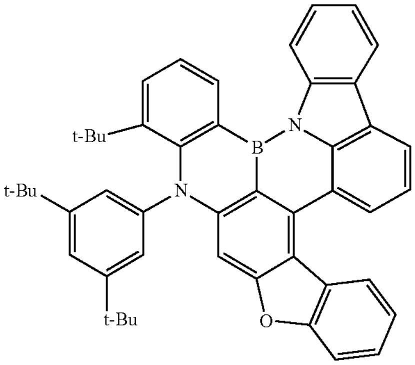
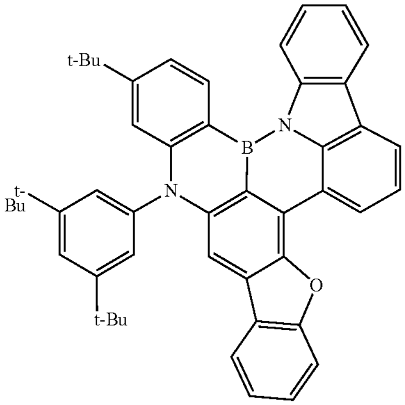
-continued
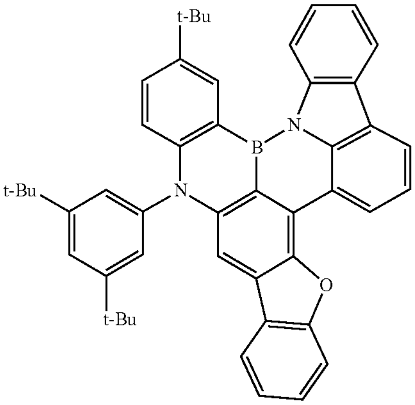
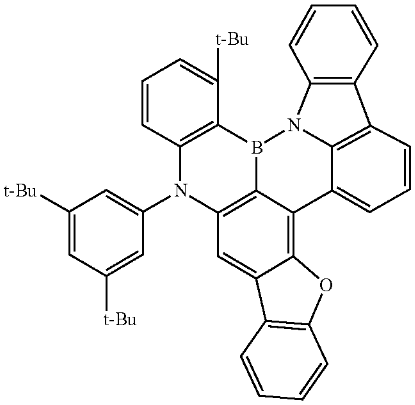
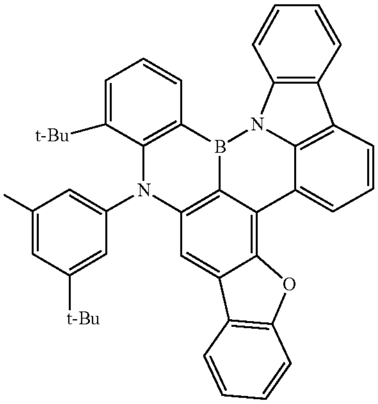
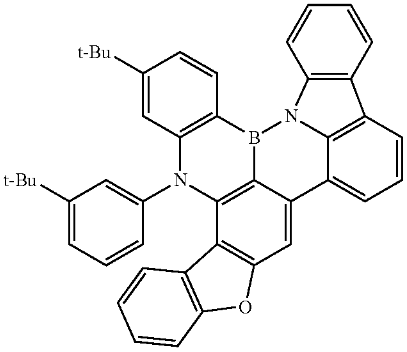

-continued
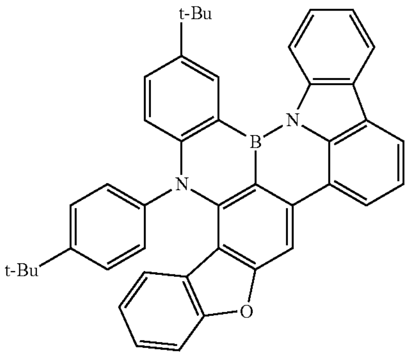
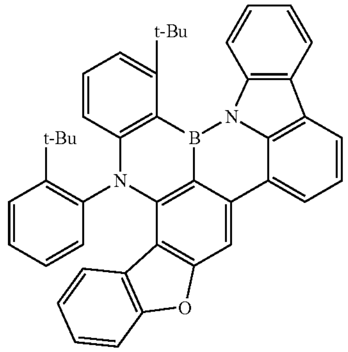
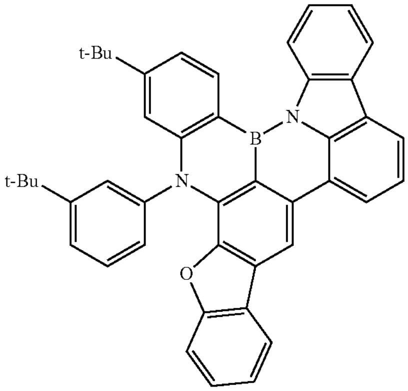
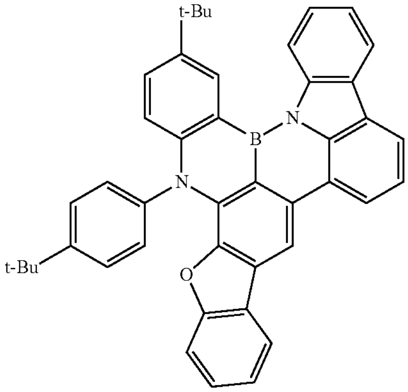
-continued
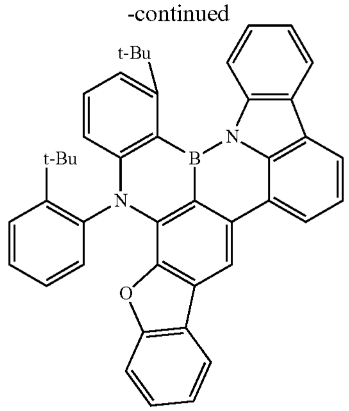
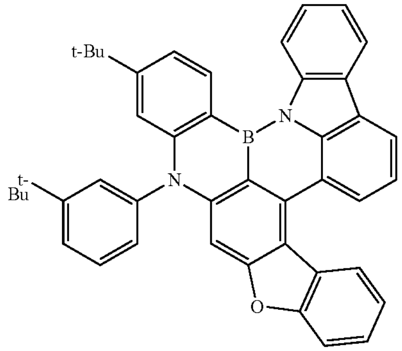
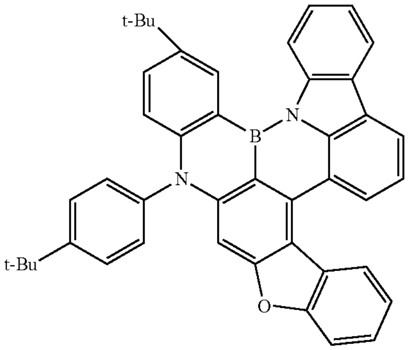
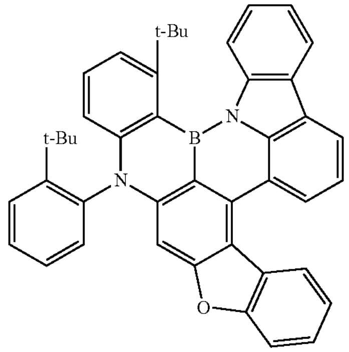

-continued
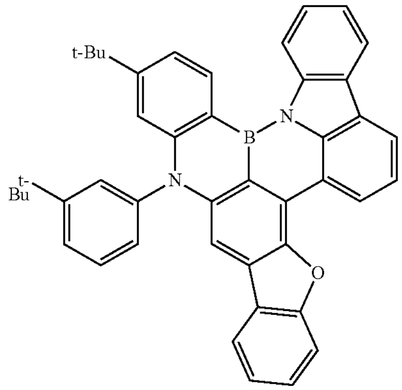
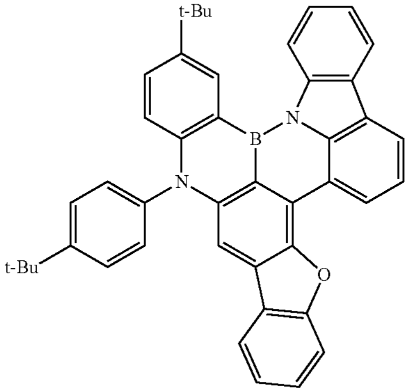
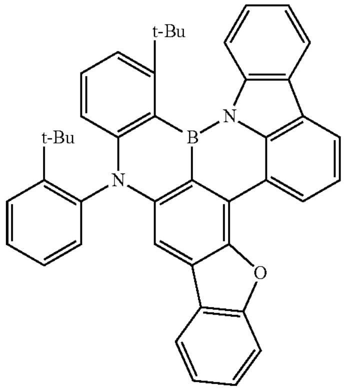
Mes =
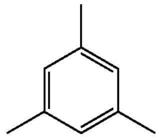
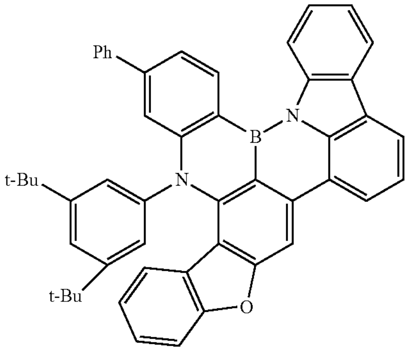
-continued
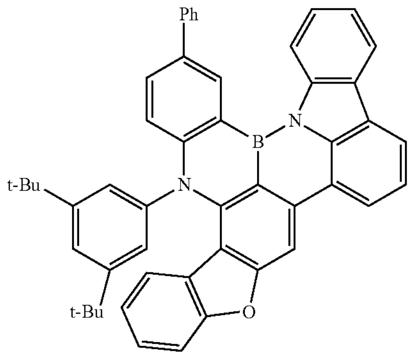
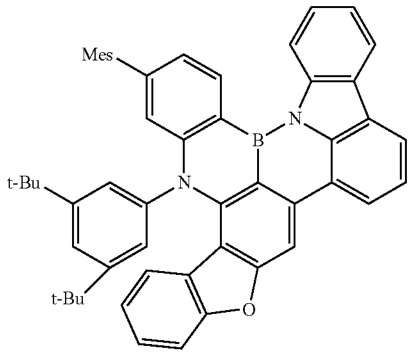
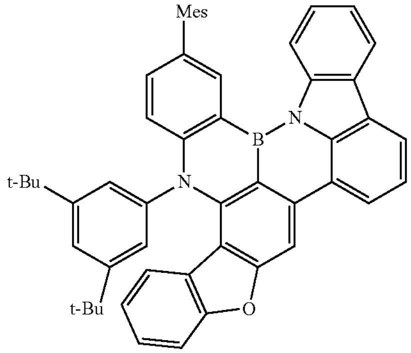
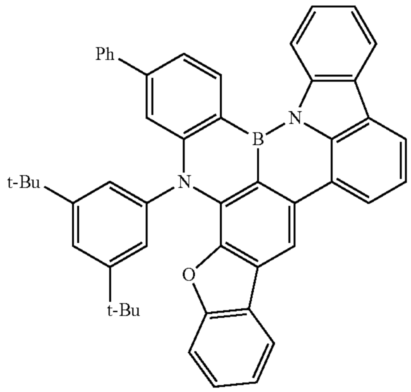

-continued
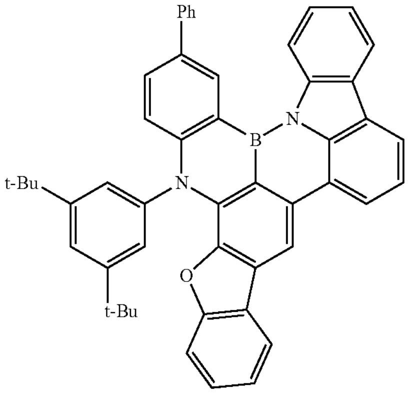
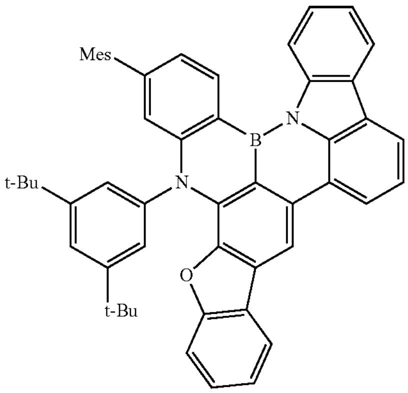
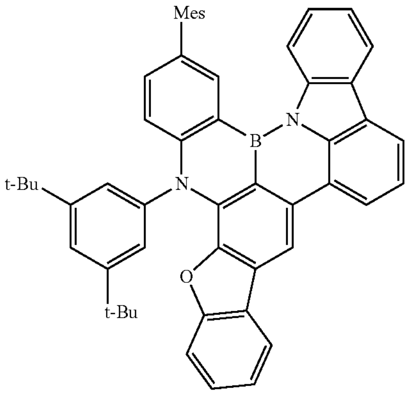
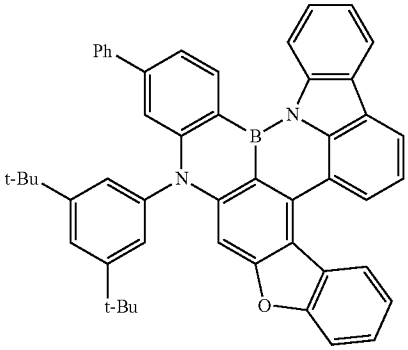
-continued
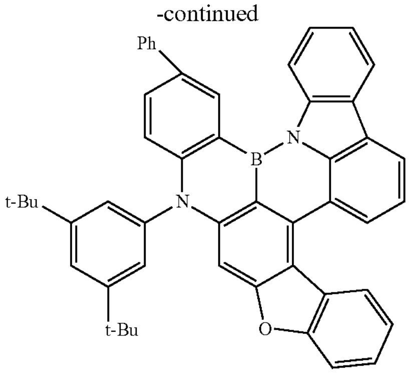
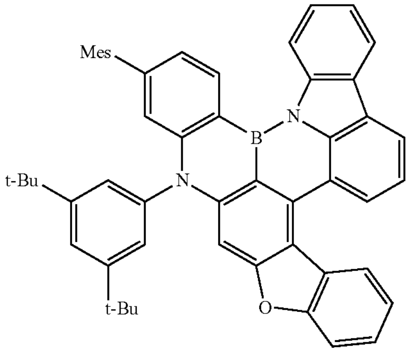
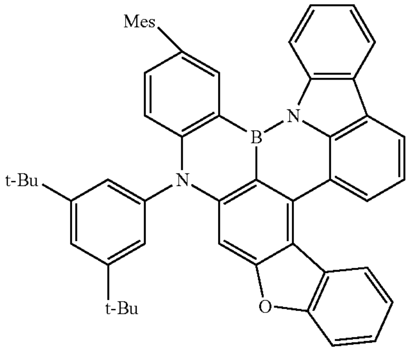
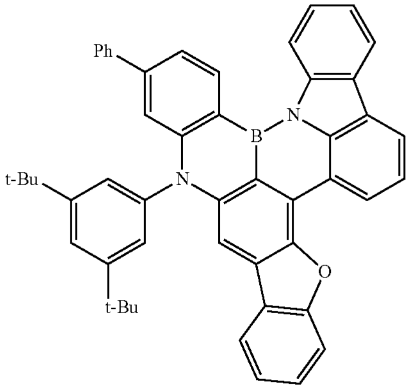

-continued
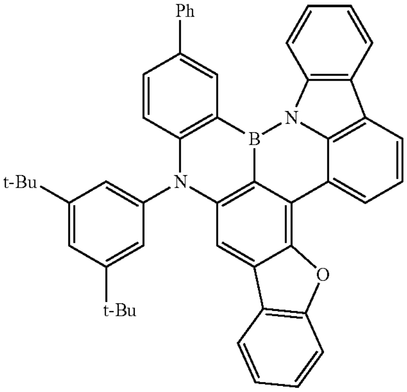
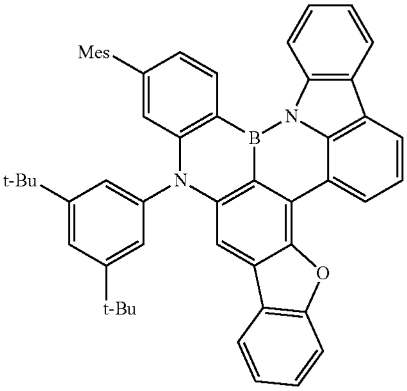
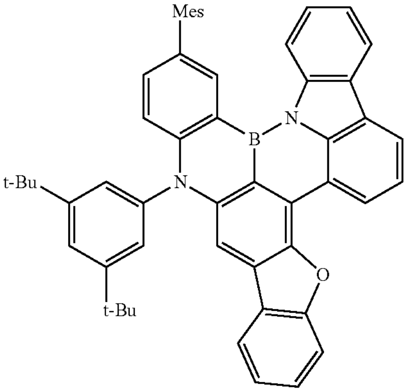
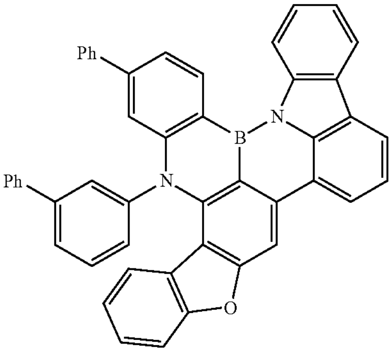
-continued
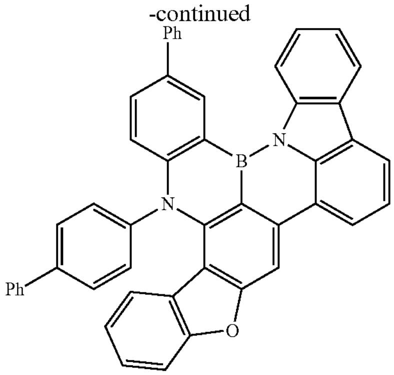
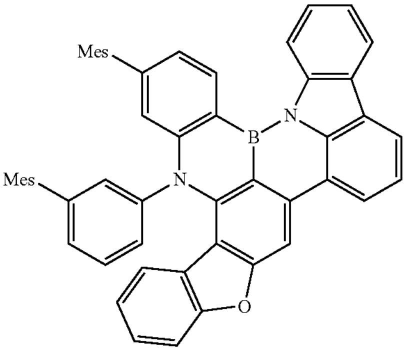
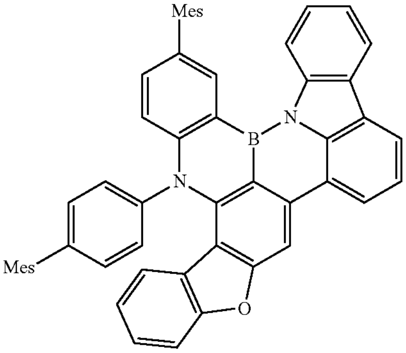
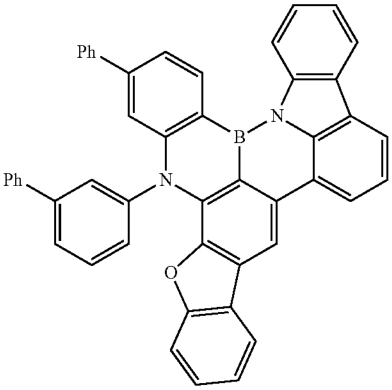

-continued
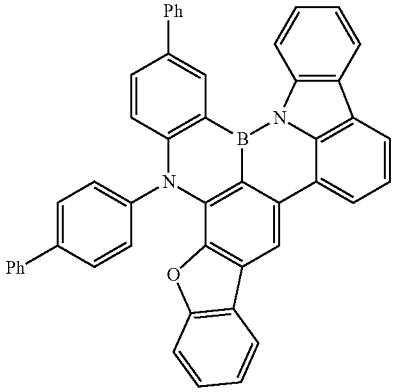
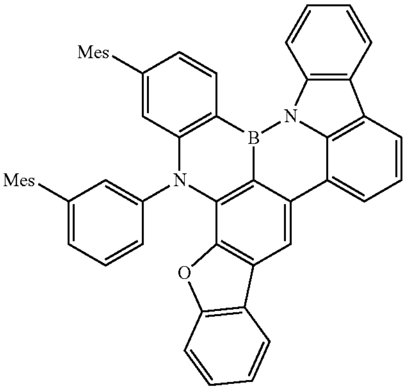
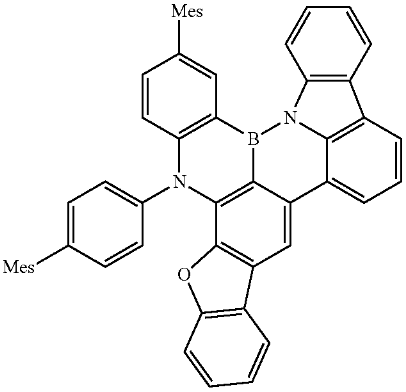
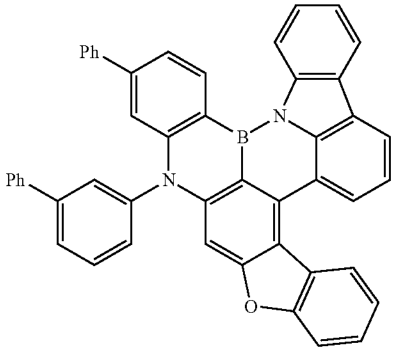
-continued
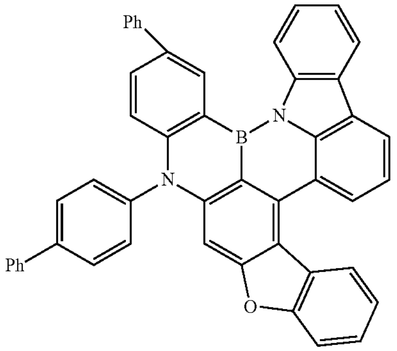
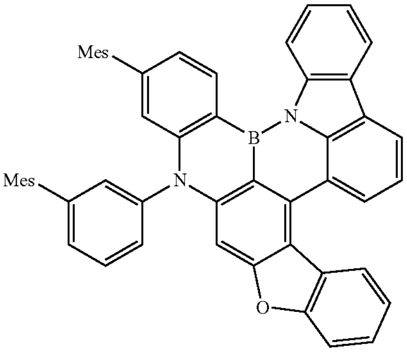
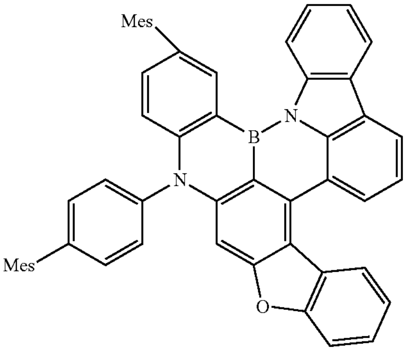
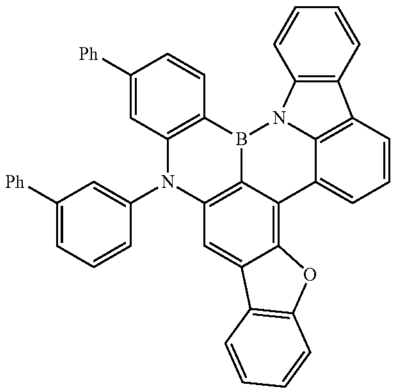

-continued
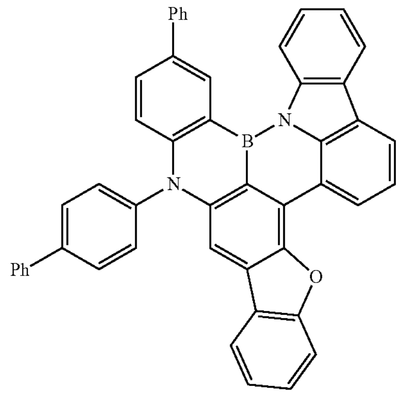
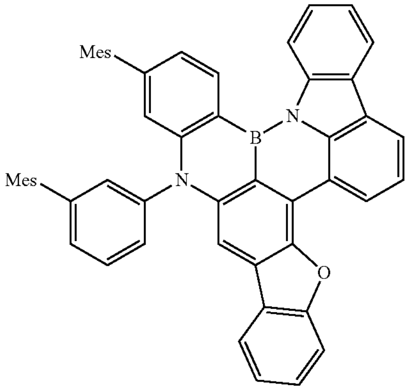
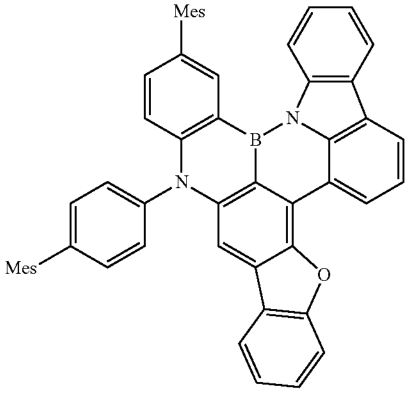
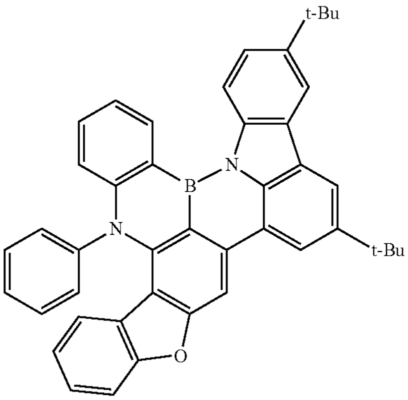
-continued
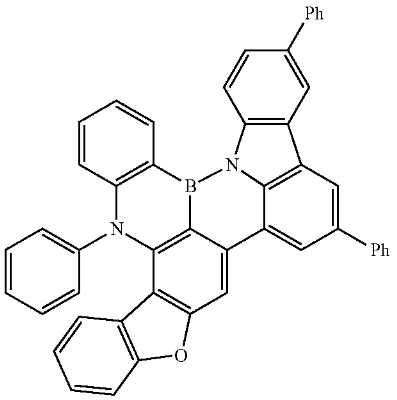
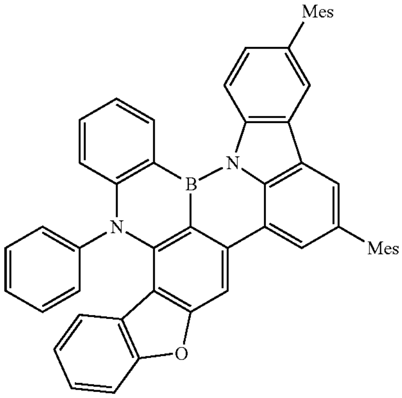
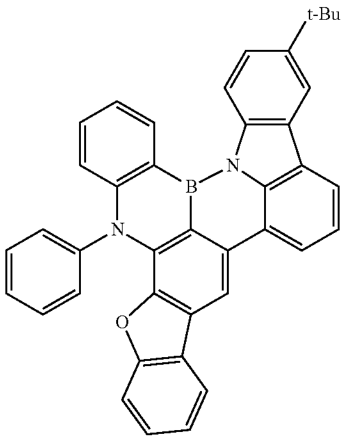
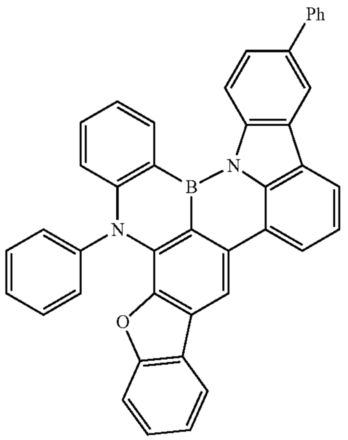

-continued
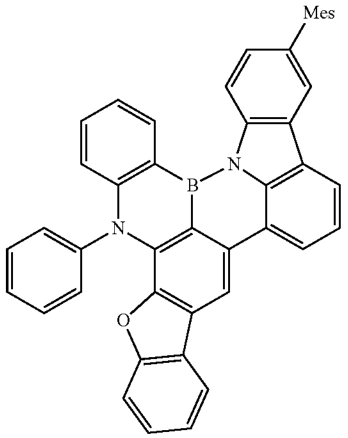
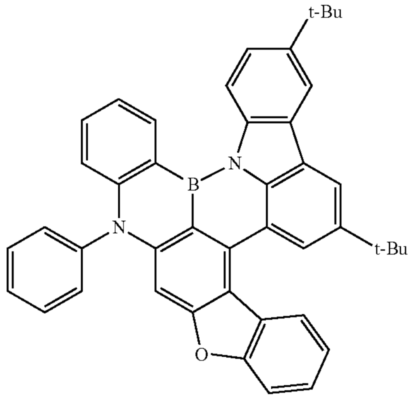
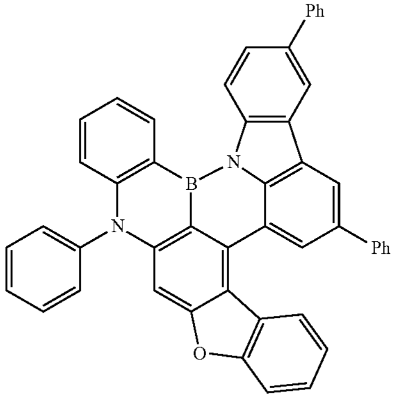
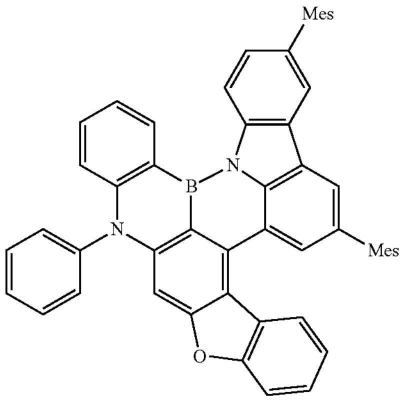
-continued
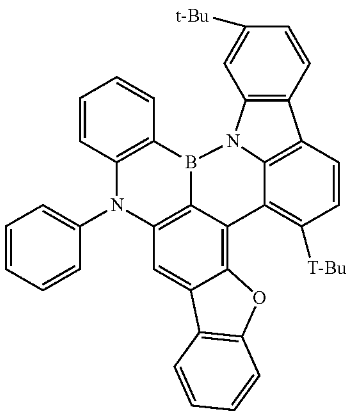
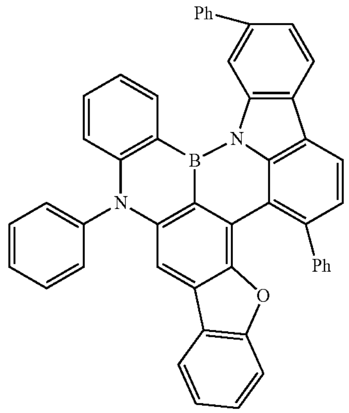
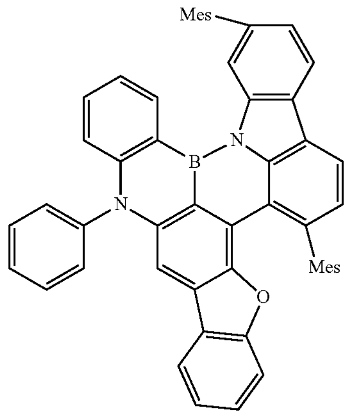
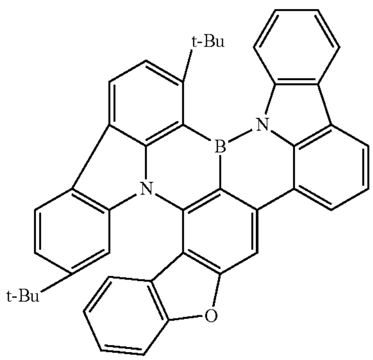

-continued
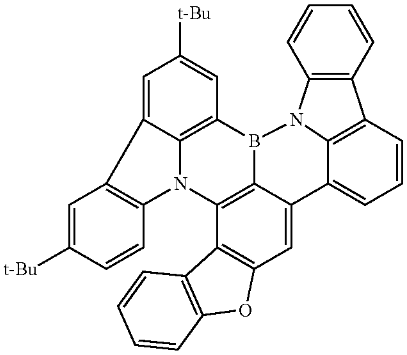
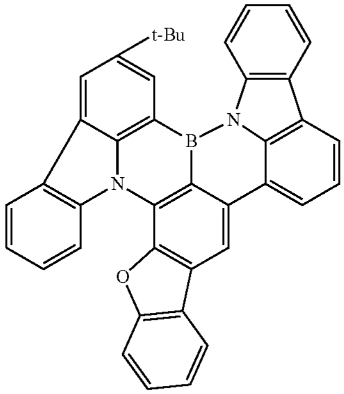
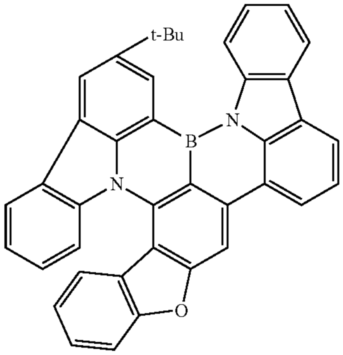
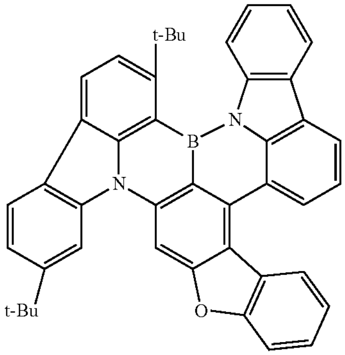
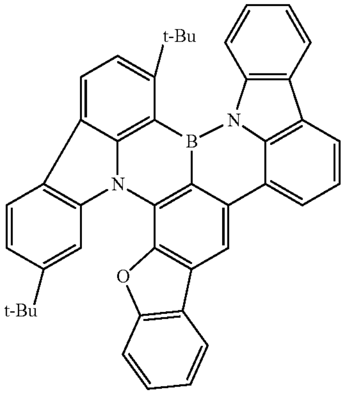
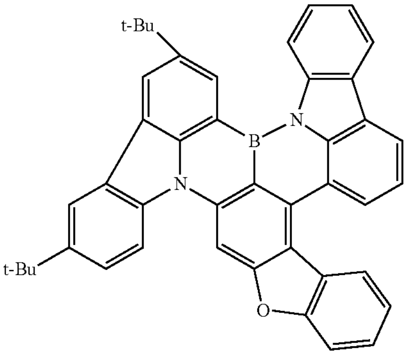
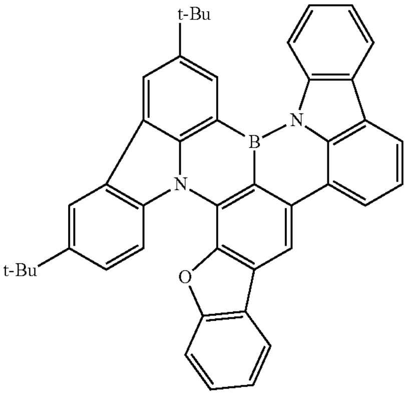
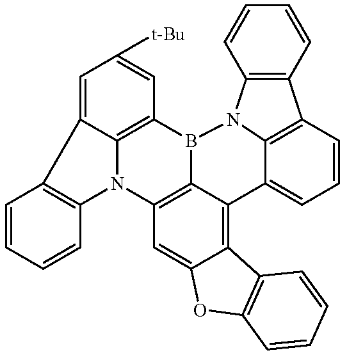

-continued
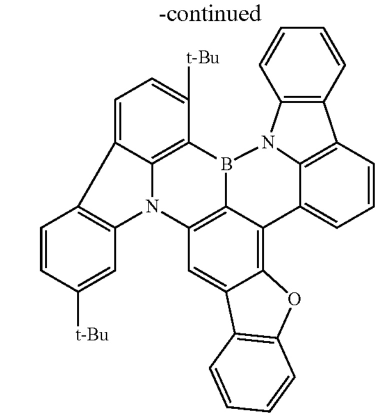
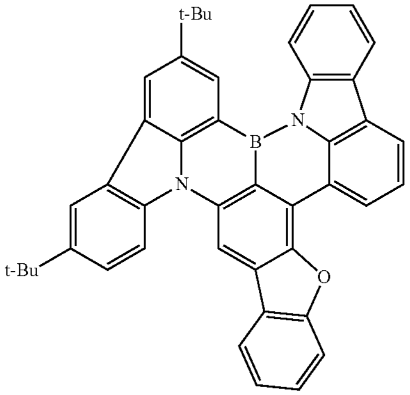
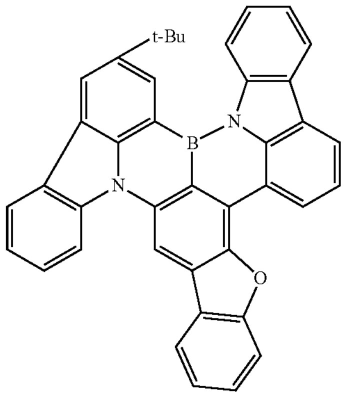
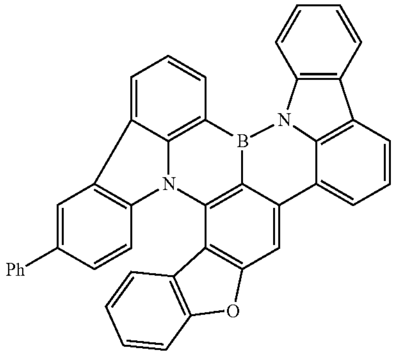
-continued
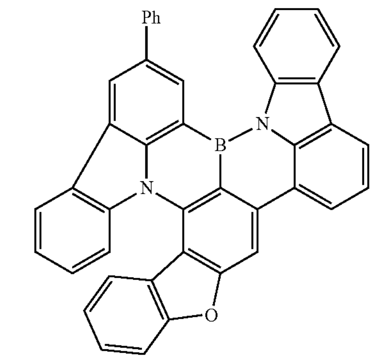
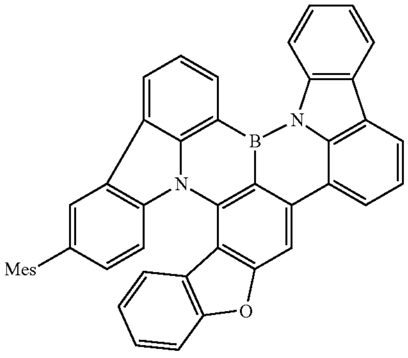
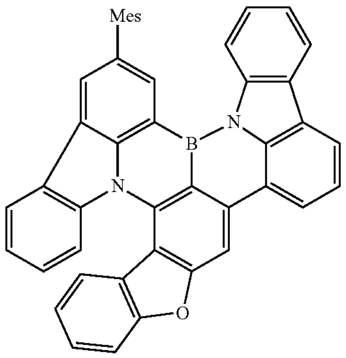
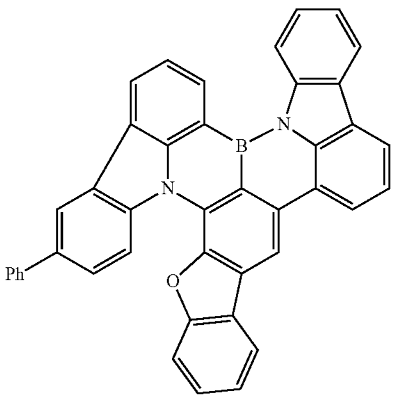

-continued
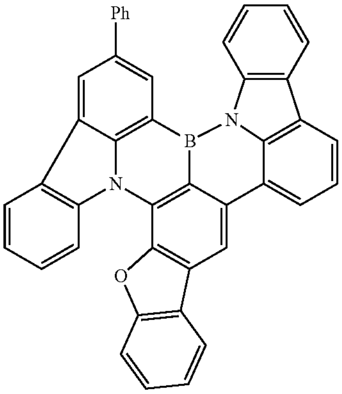
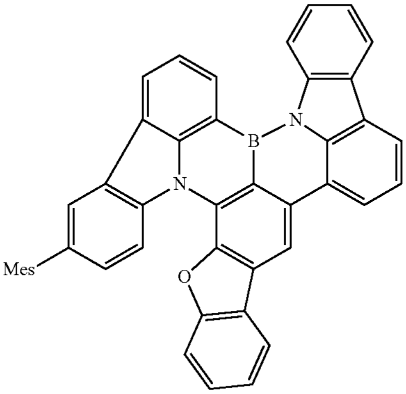
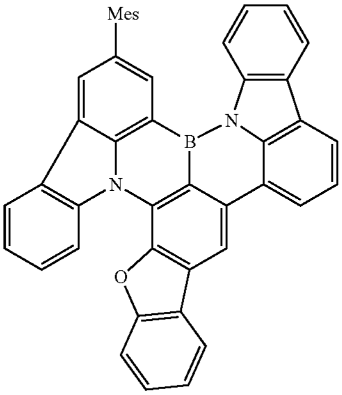
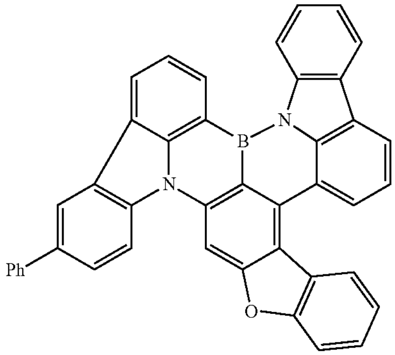
-continued
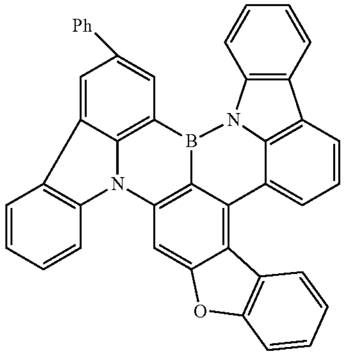
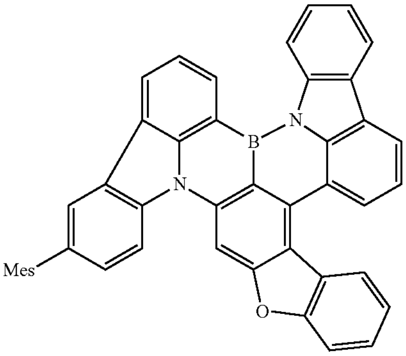
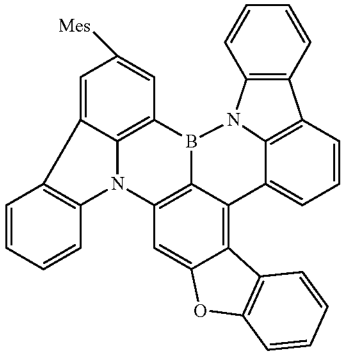
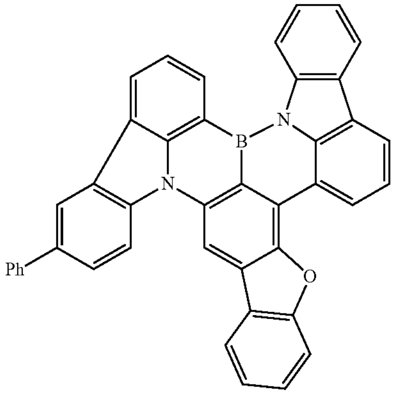

-continued
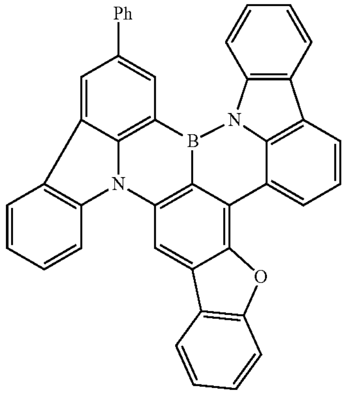
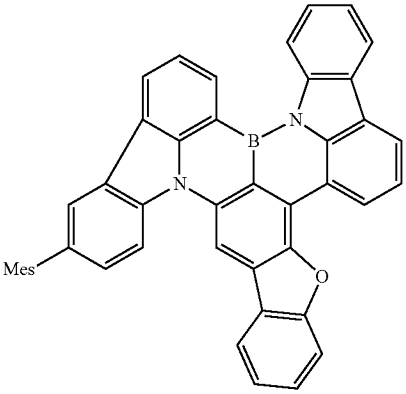
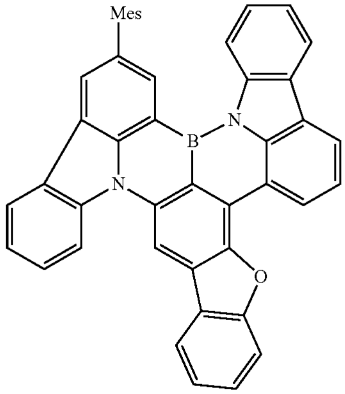
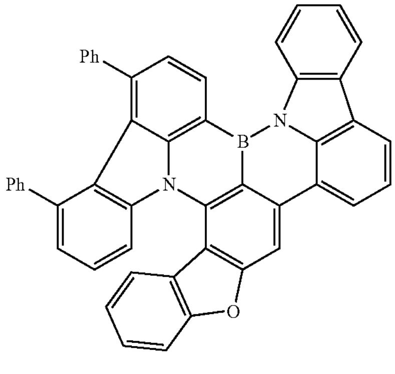
-continued
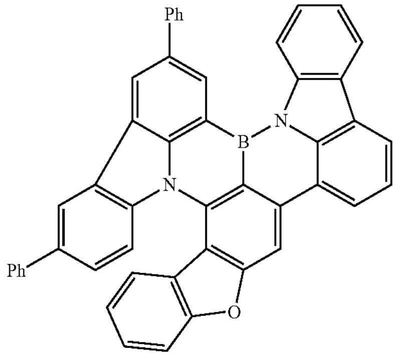
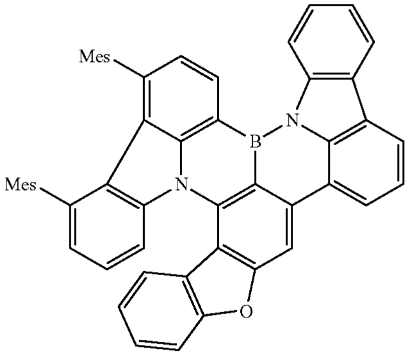
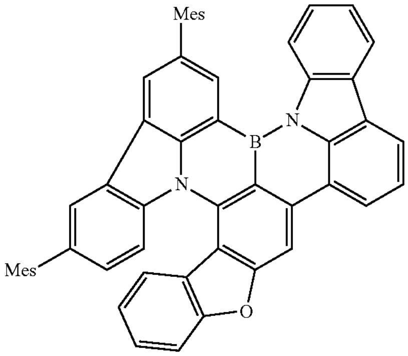
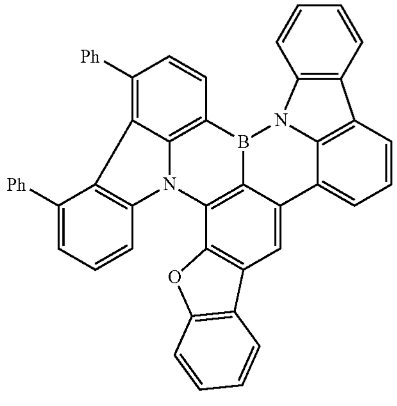

-continued
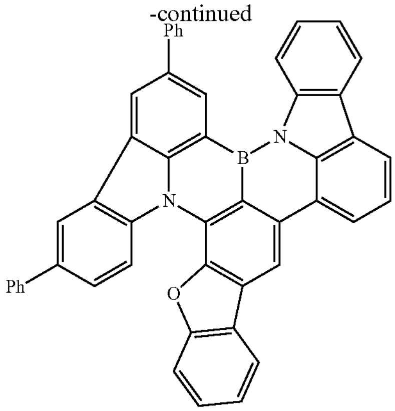
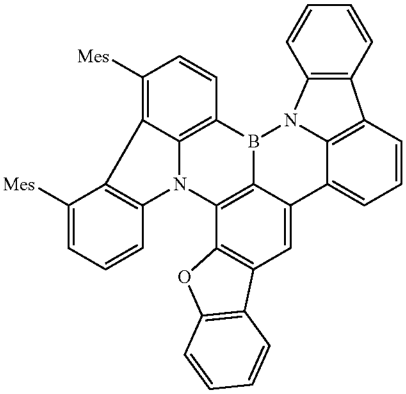
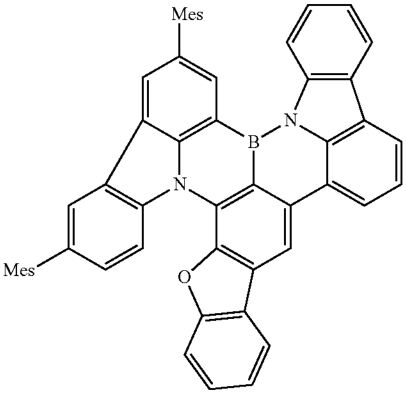
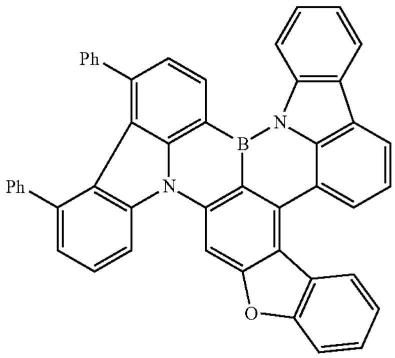
-continued
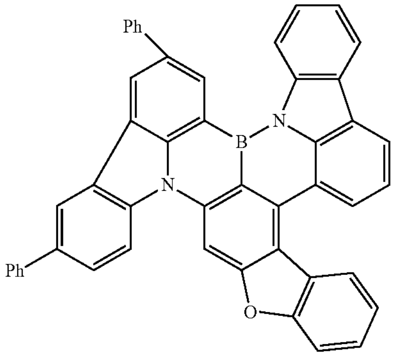
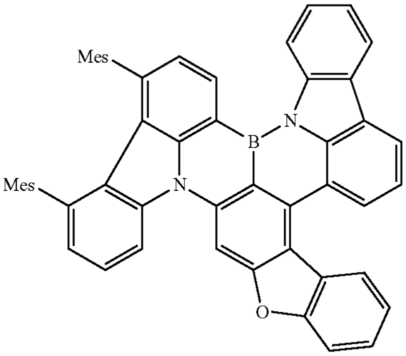
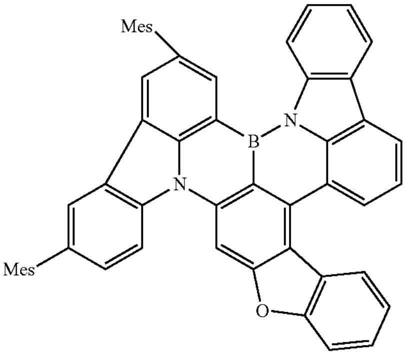
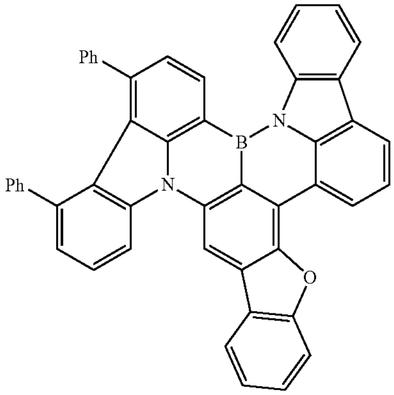

-continued
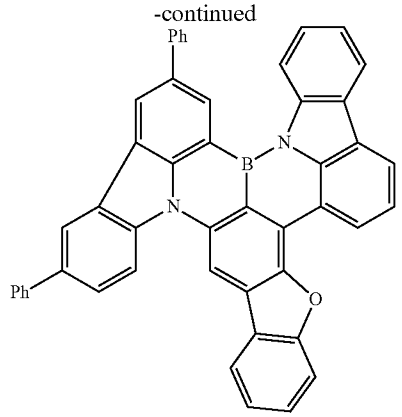
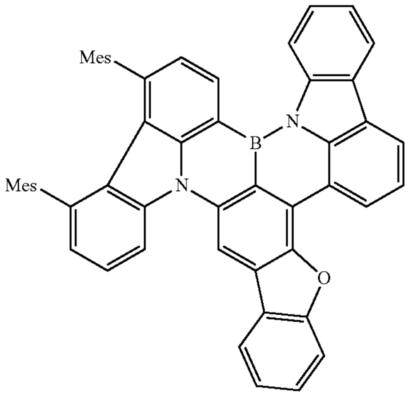
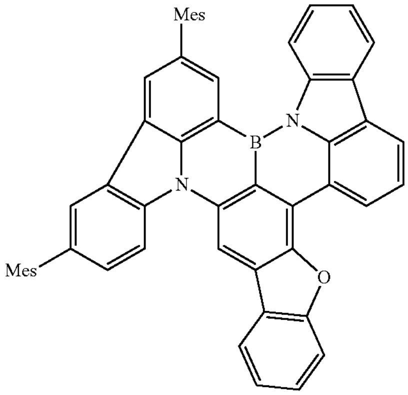
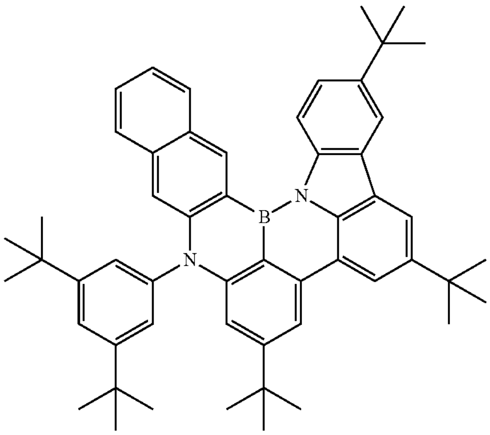
-continued
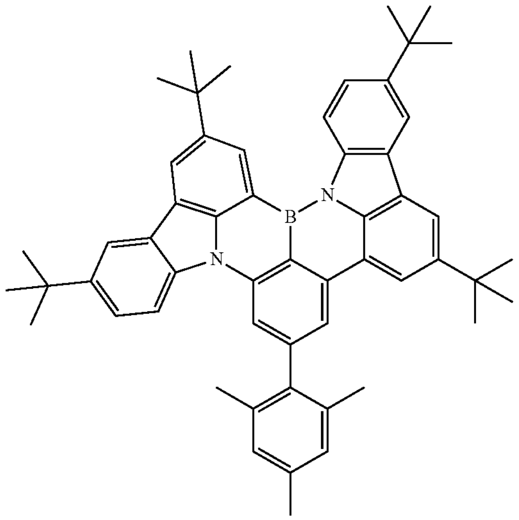
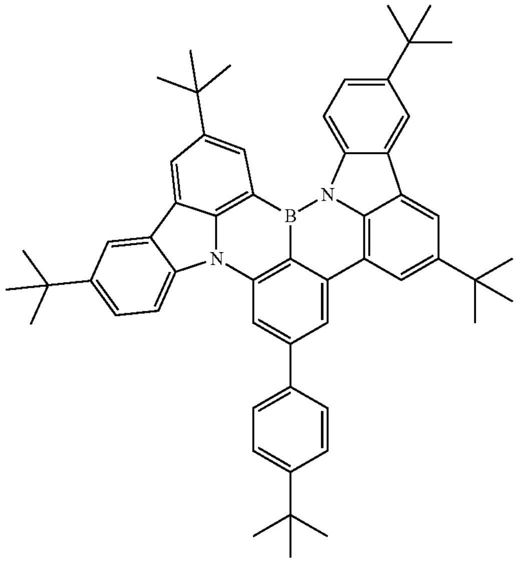
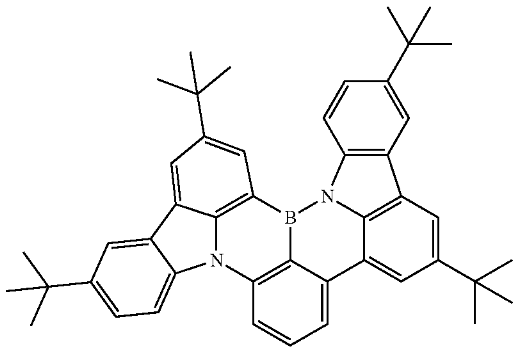

-continued
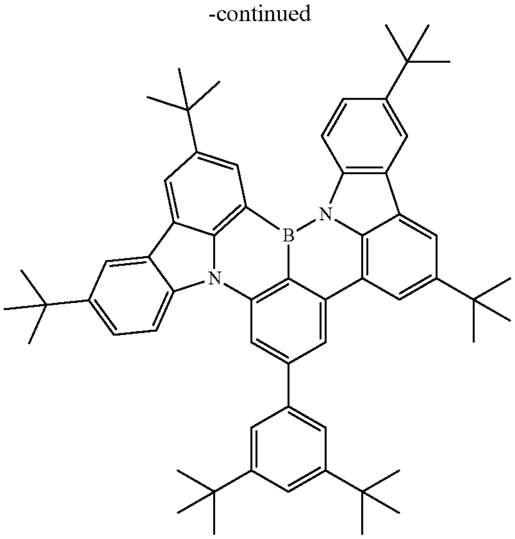
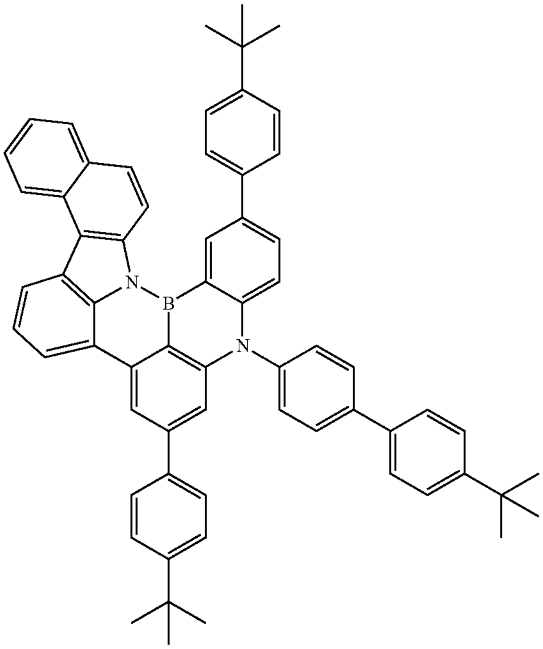
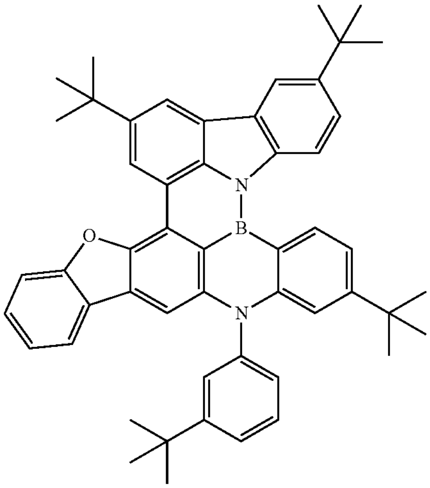
-continued
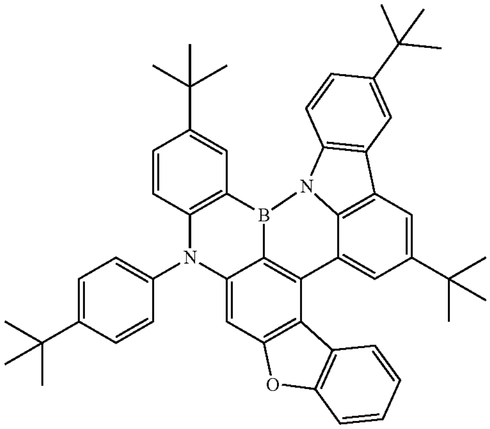
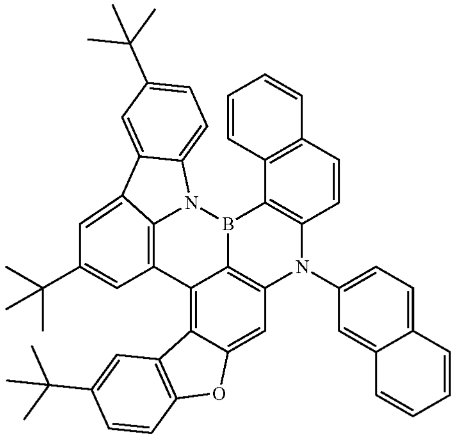
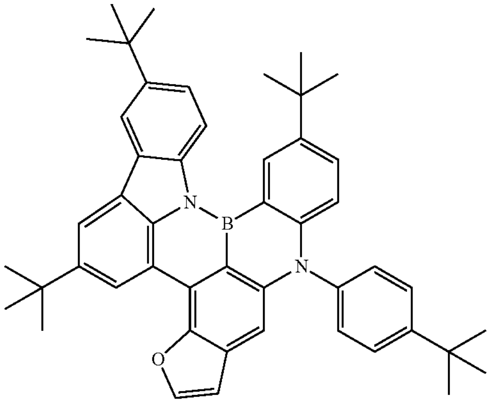

-continued
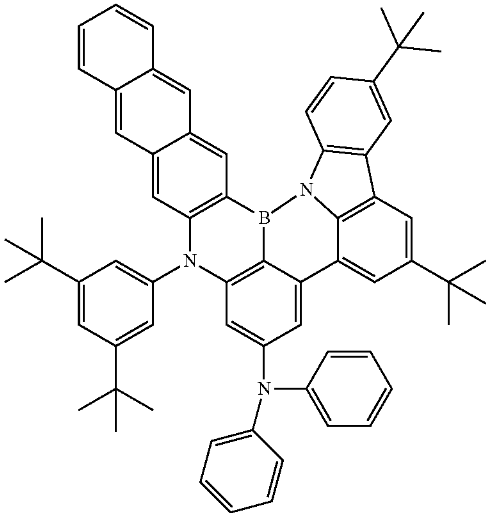
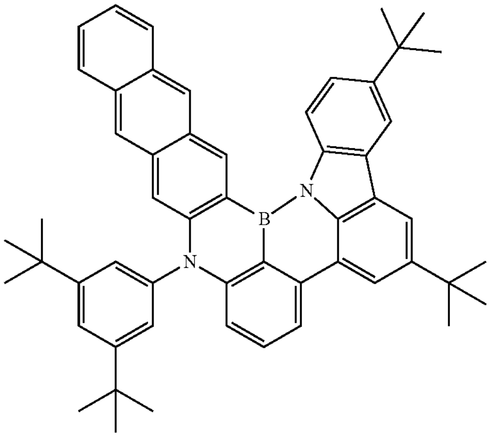
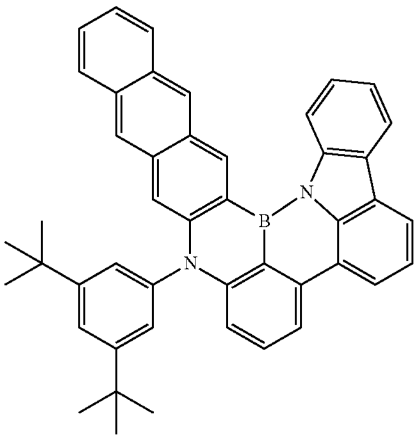
-continued
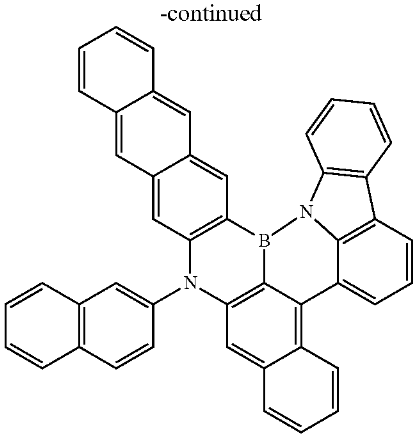
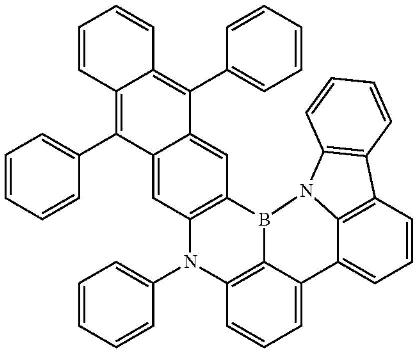
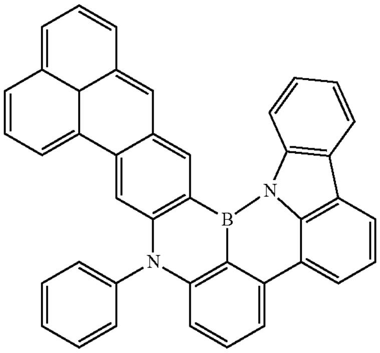
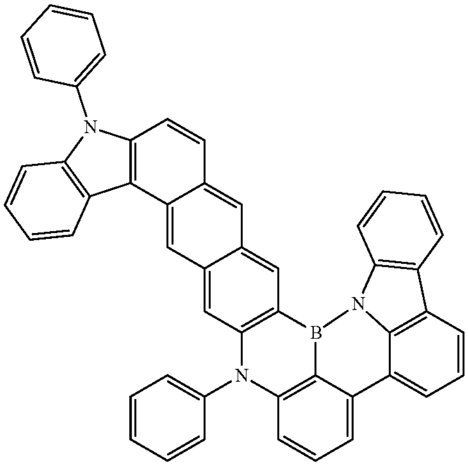

-continued
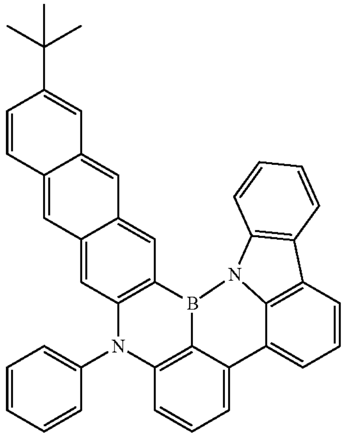
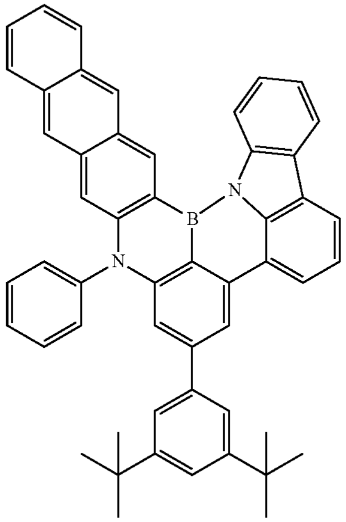
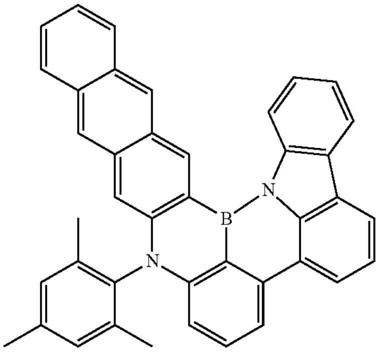
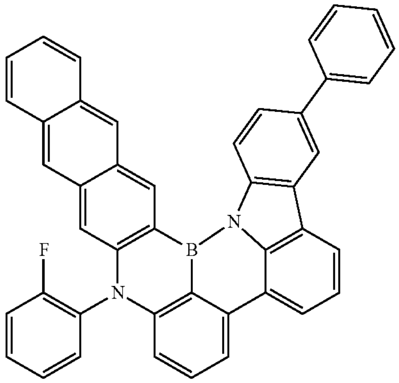
-continued
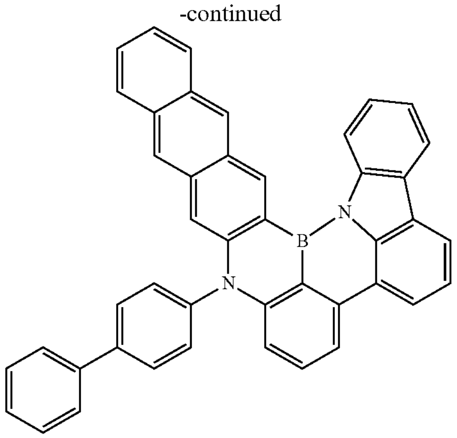
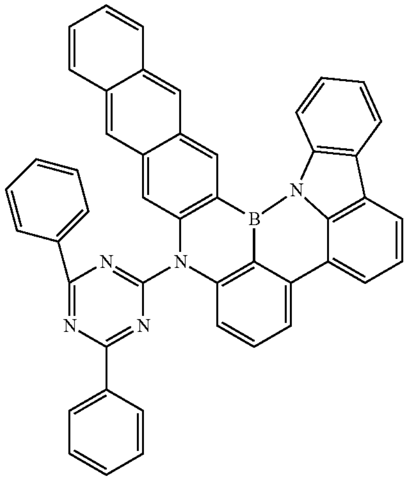
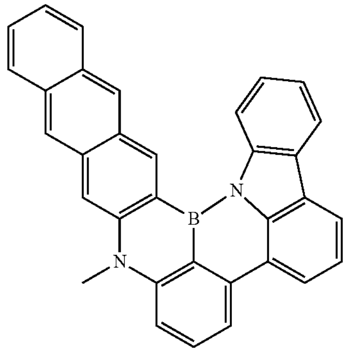
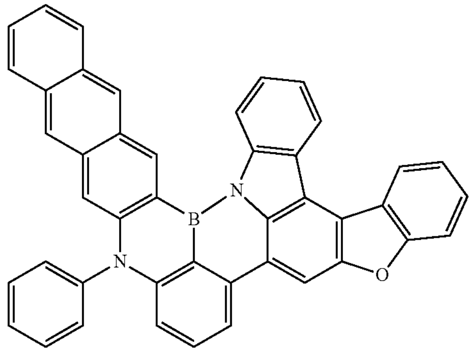

-continued
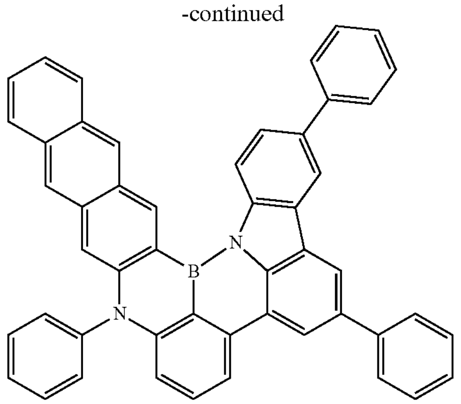
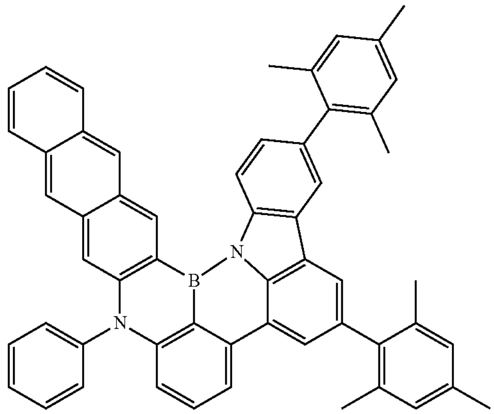
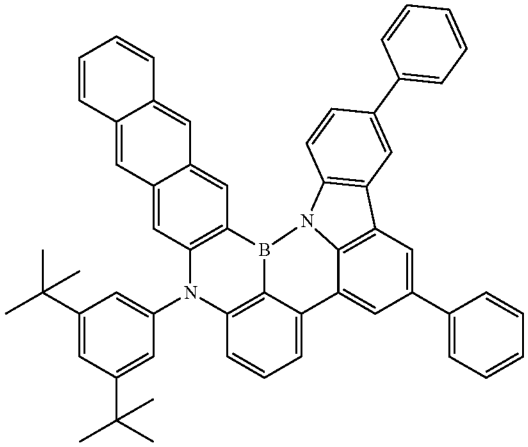
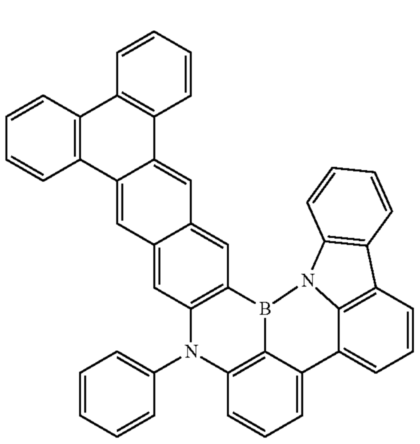
-continued
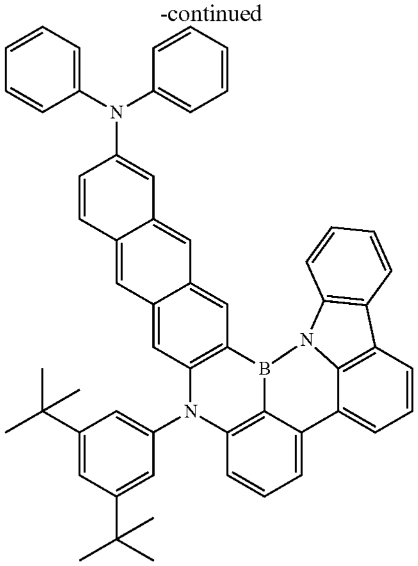
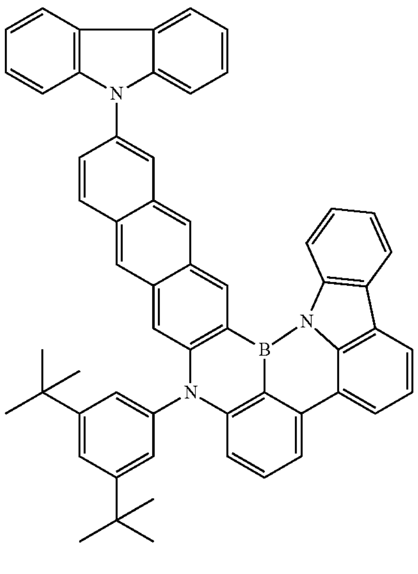
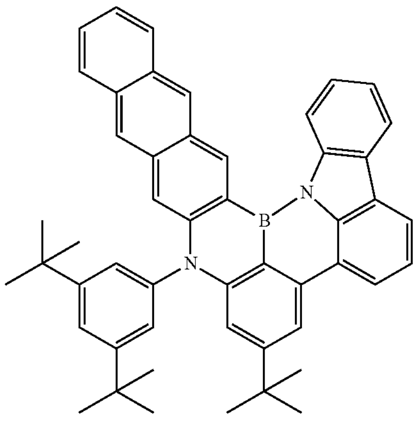

-continued
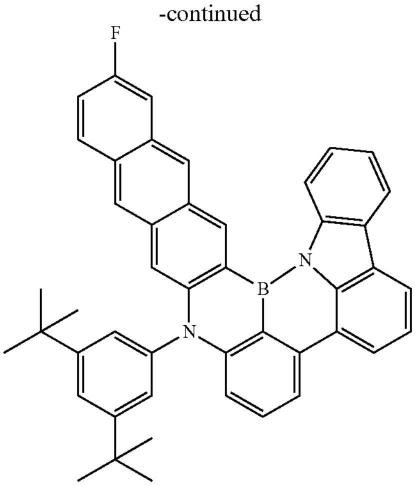
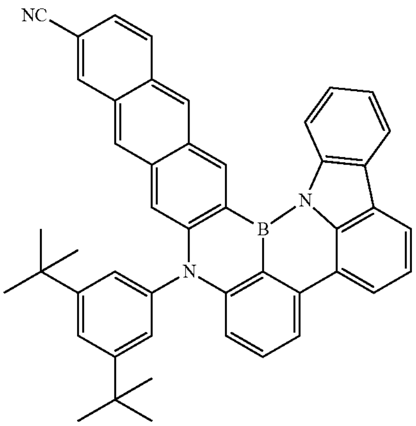
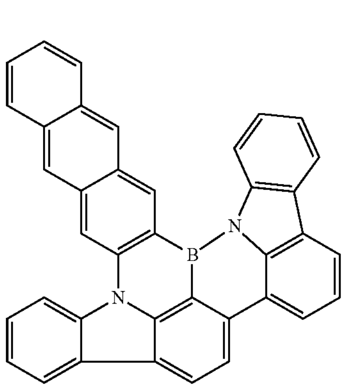
-continued
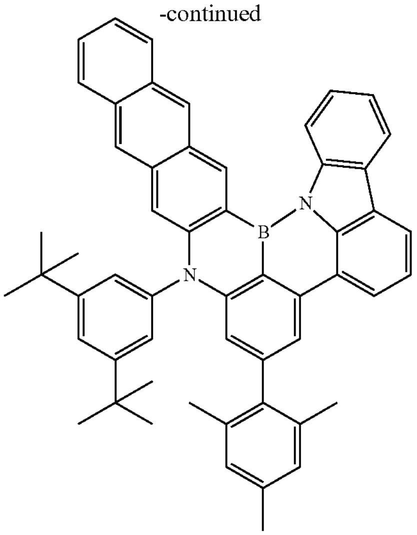
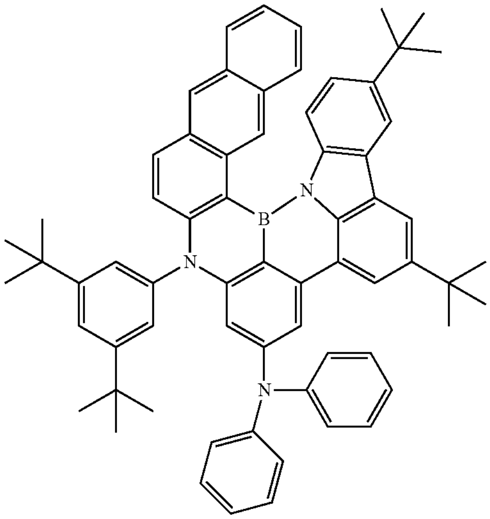
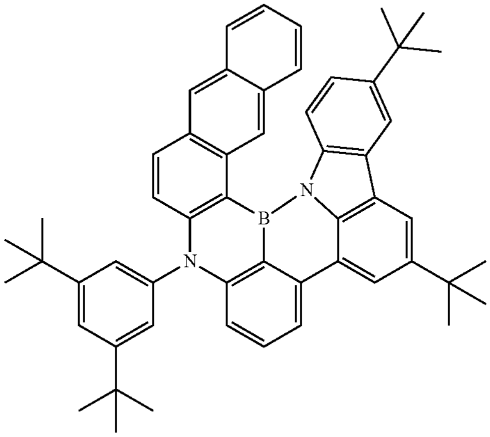

-continued
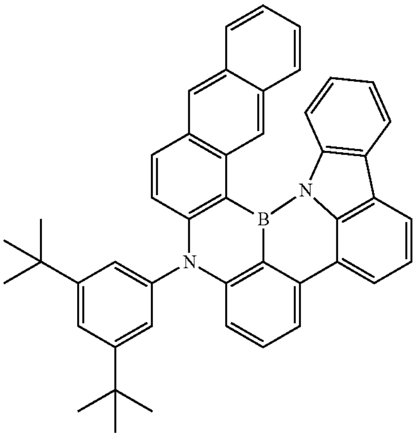
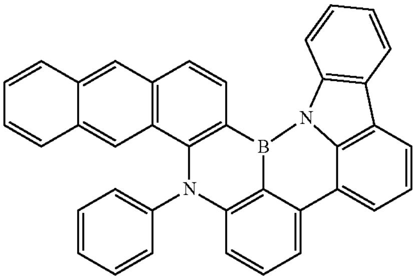
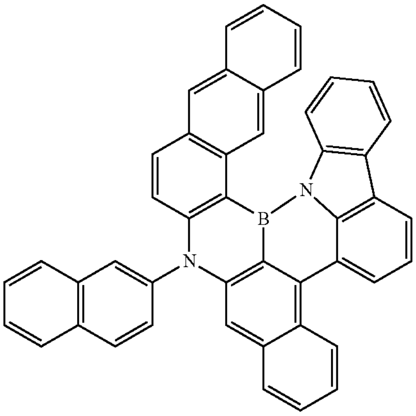
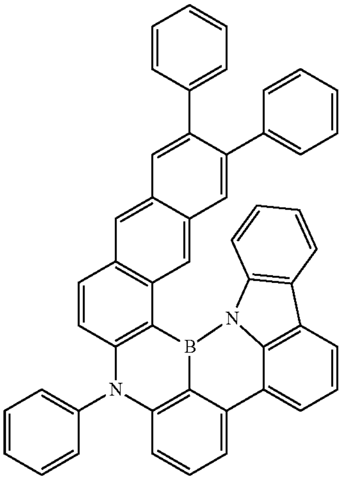
-continued
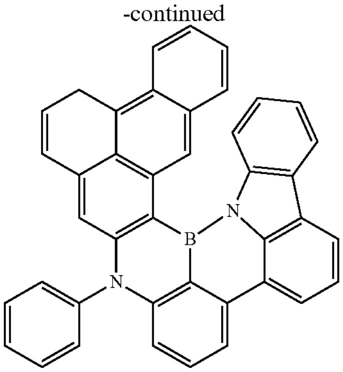
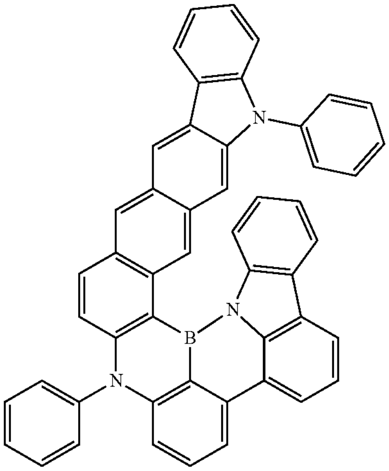
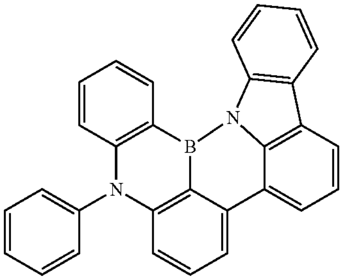
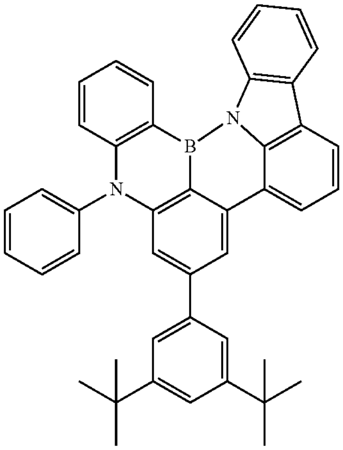

-continued
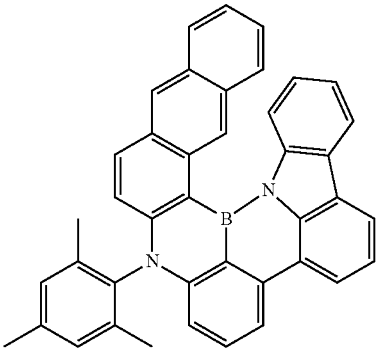
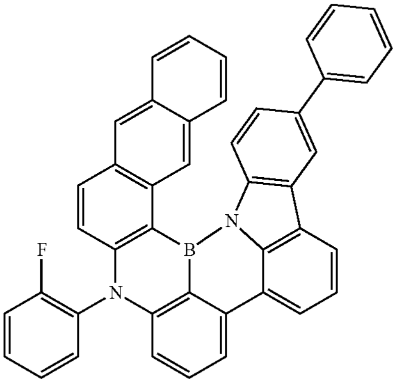
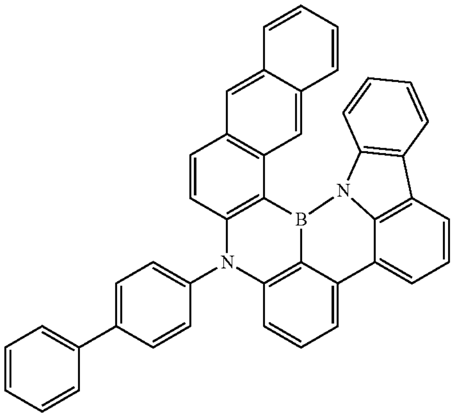
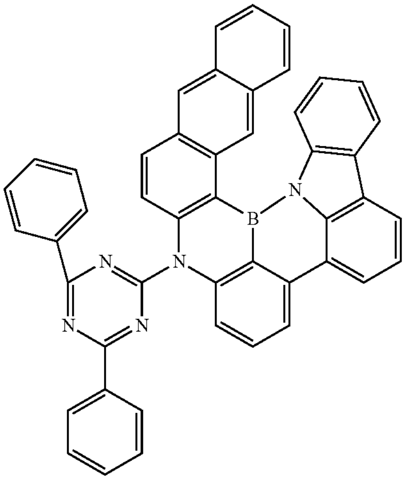
-continued
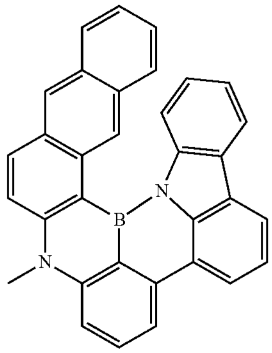
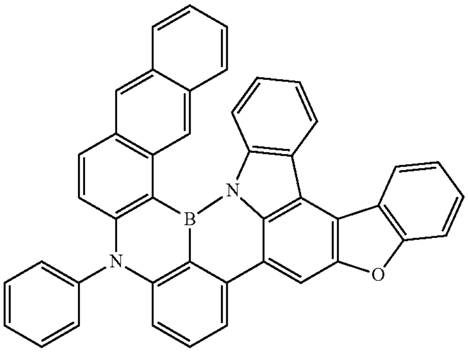
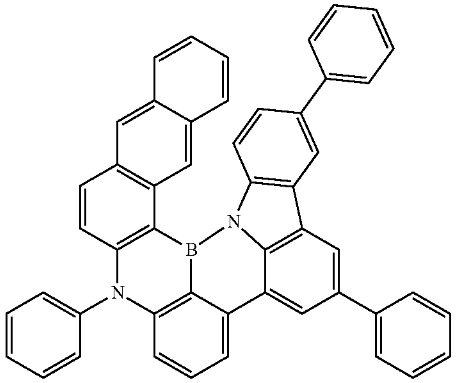
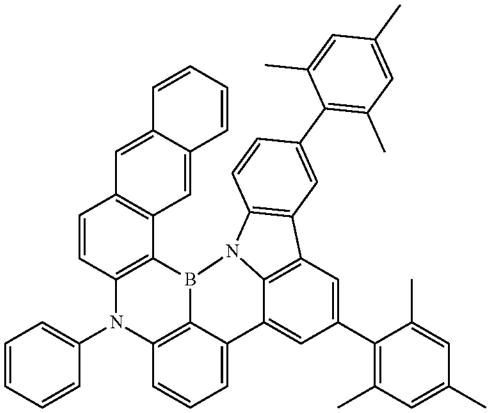

-continued
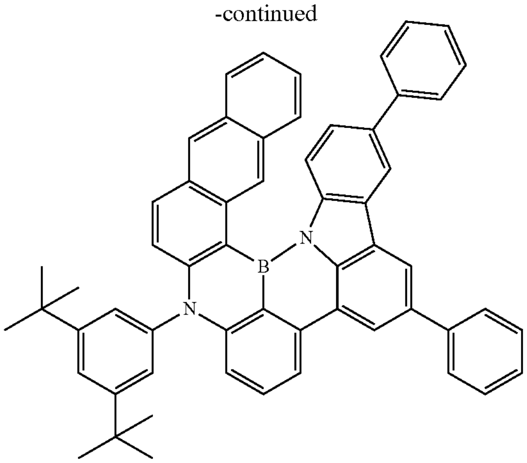
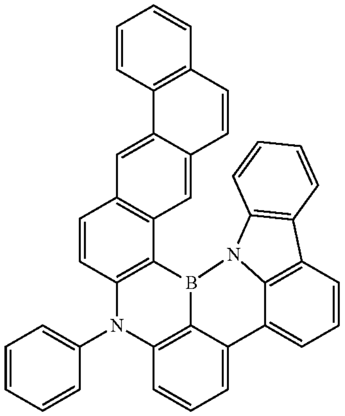
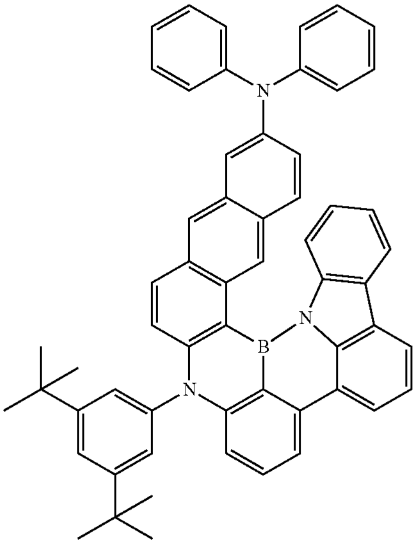
-continued
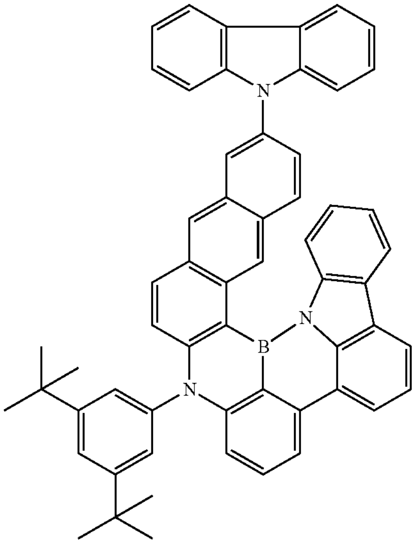
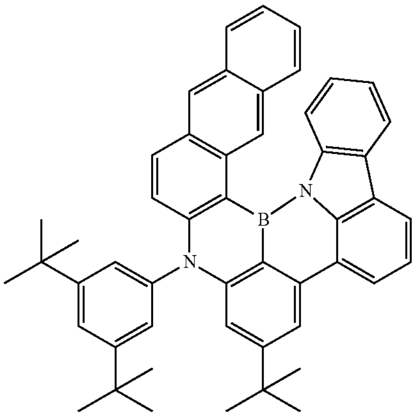
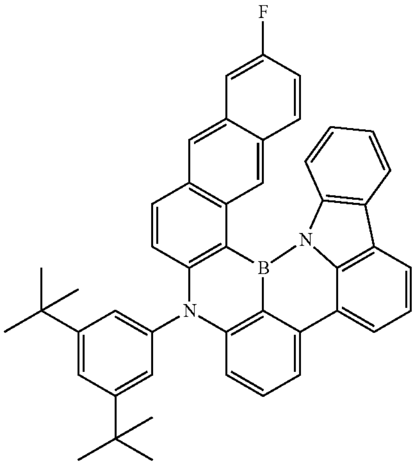

-continued
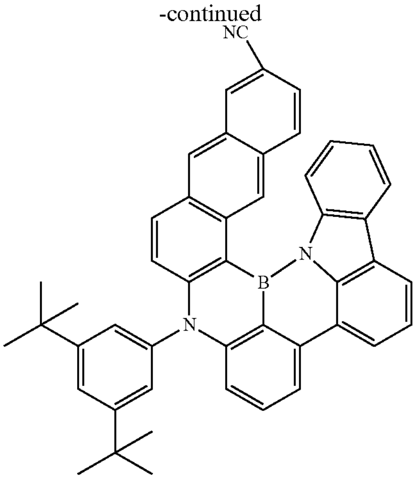
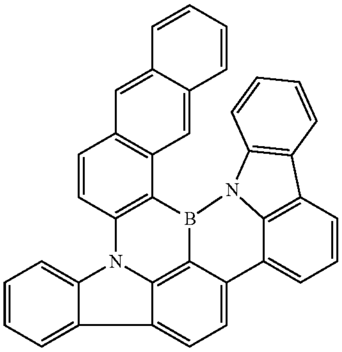
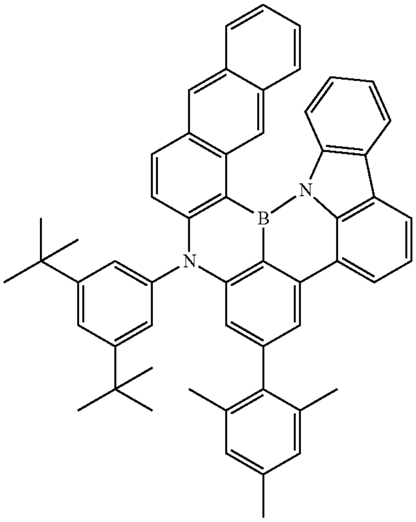
-continued
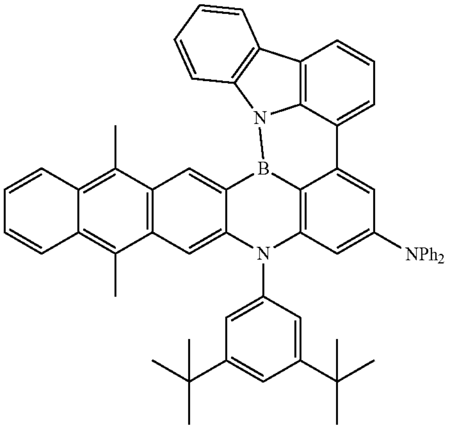
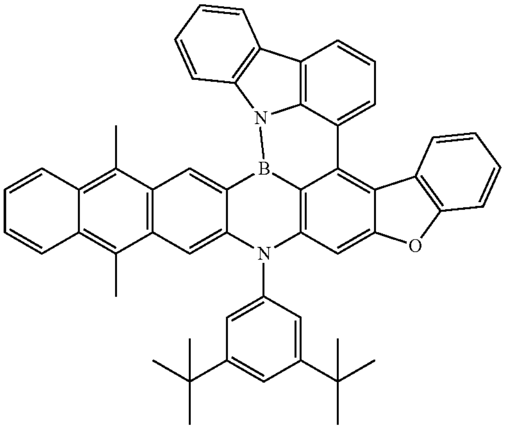
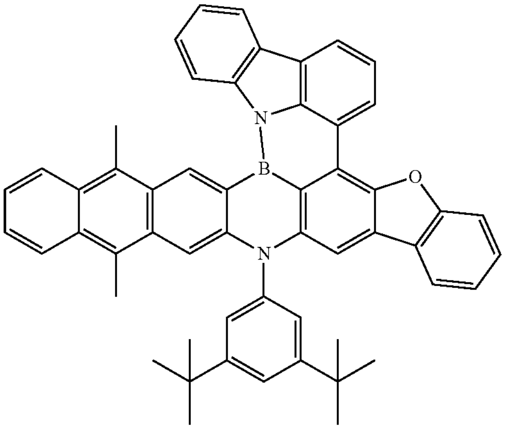
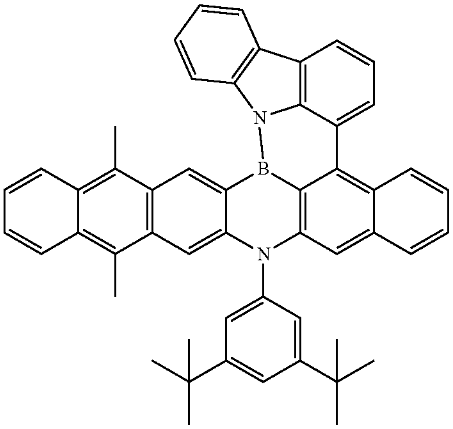

-continued
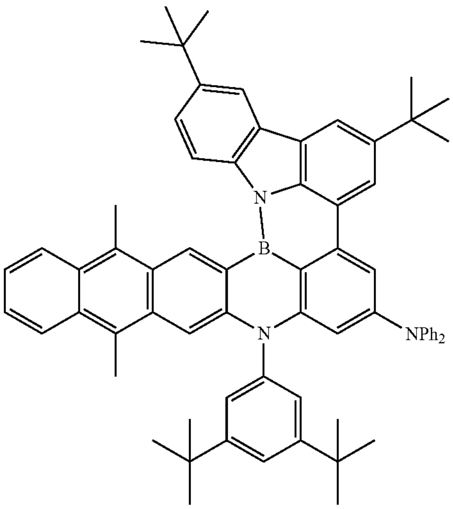
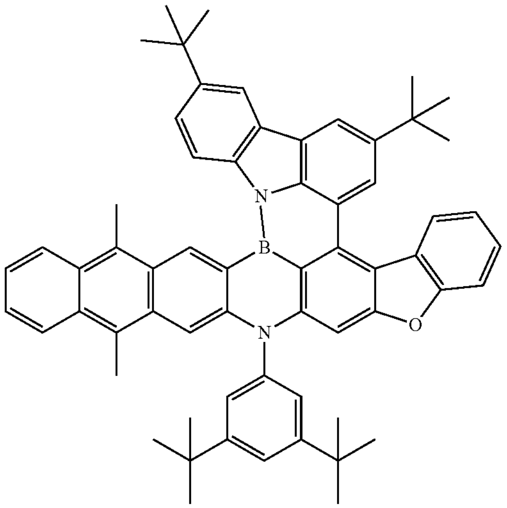
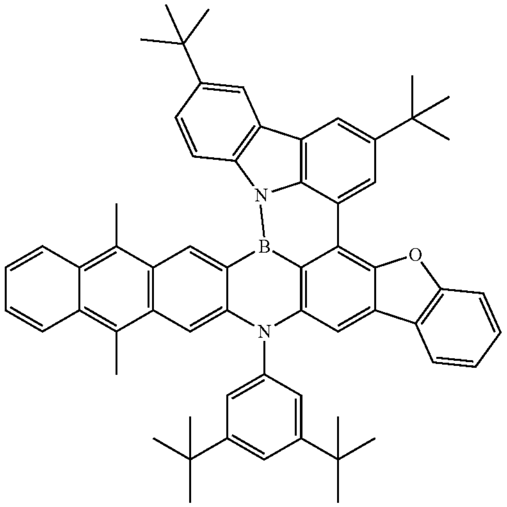
-continued
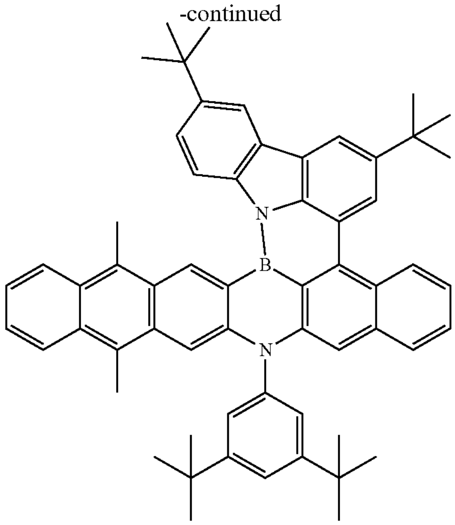
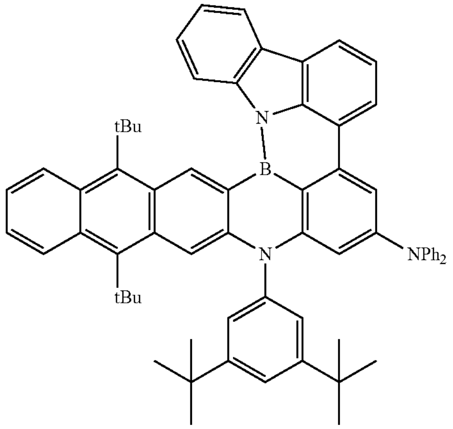
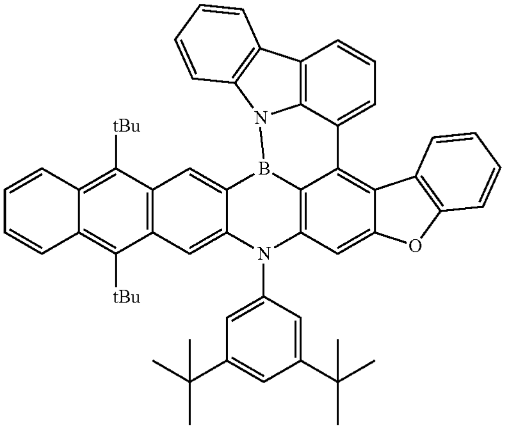

-continued
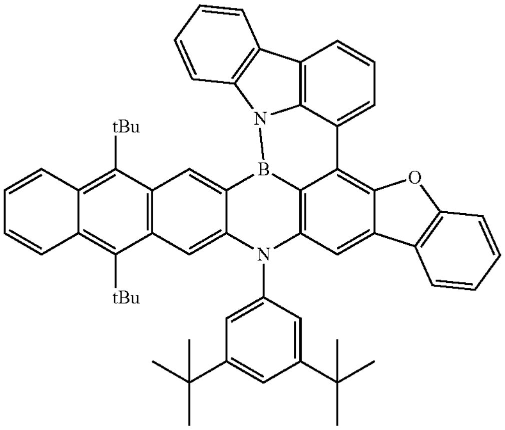
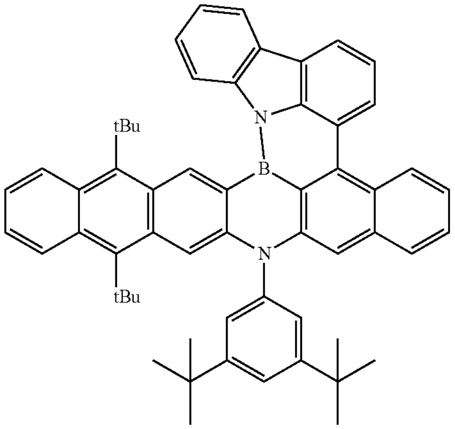
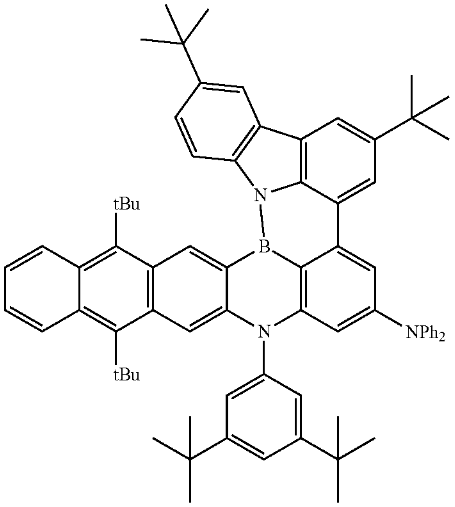
-continued
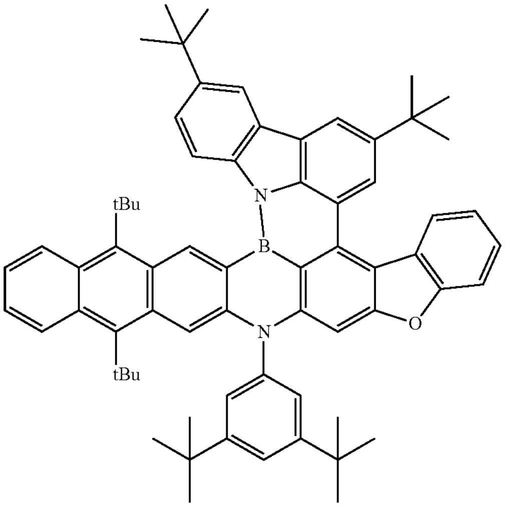
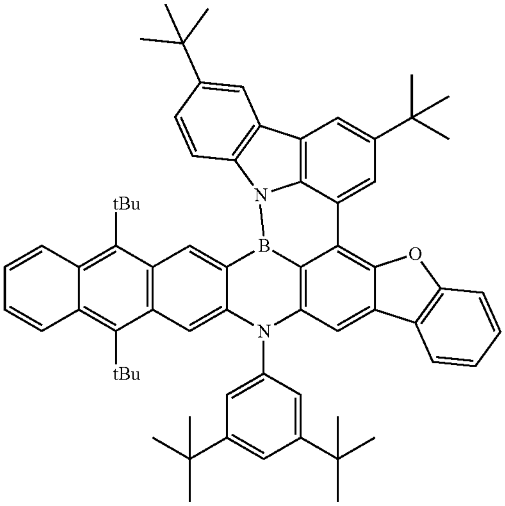
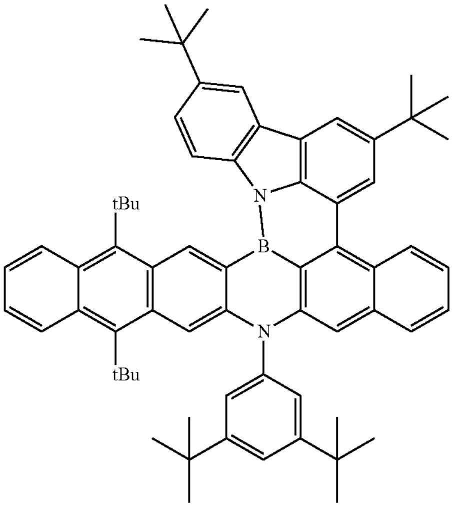

-continued
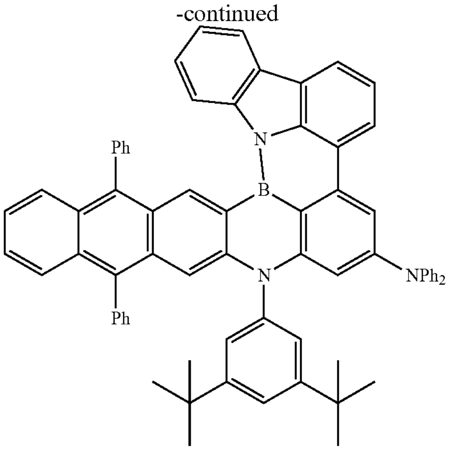
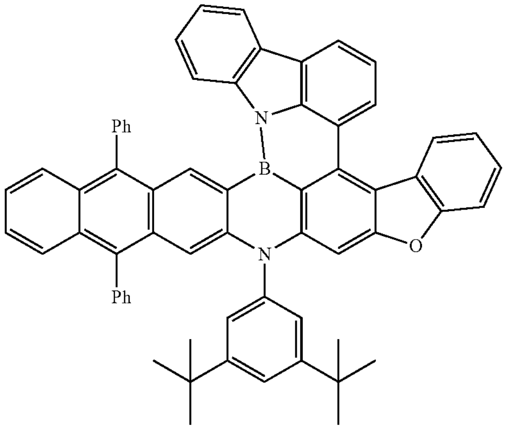
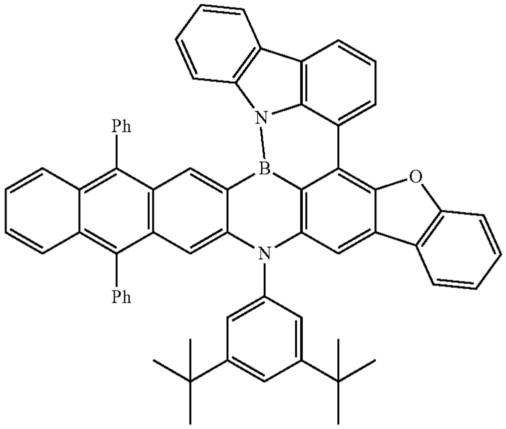
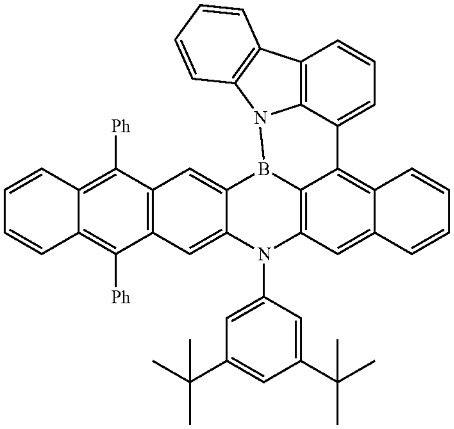
-continued
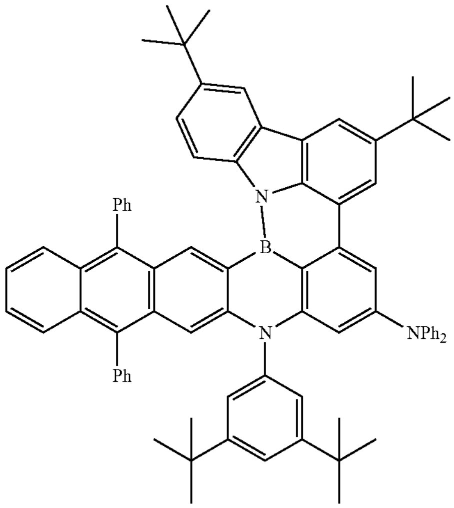
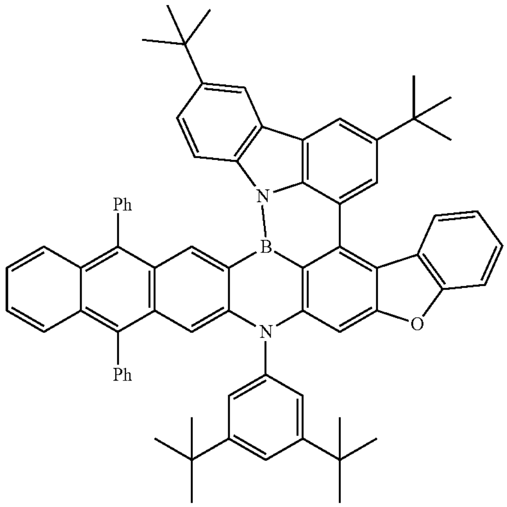
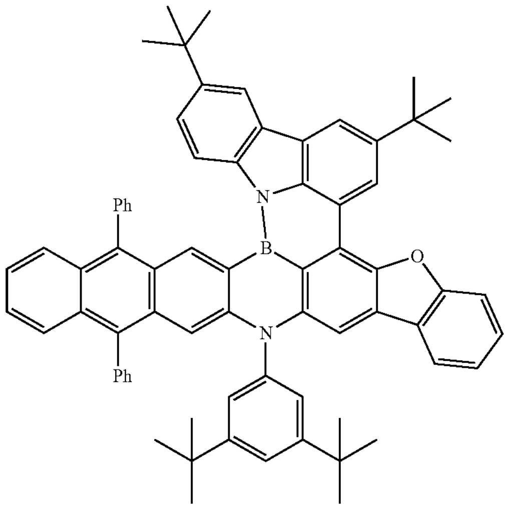

-continued
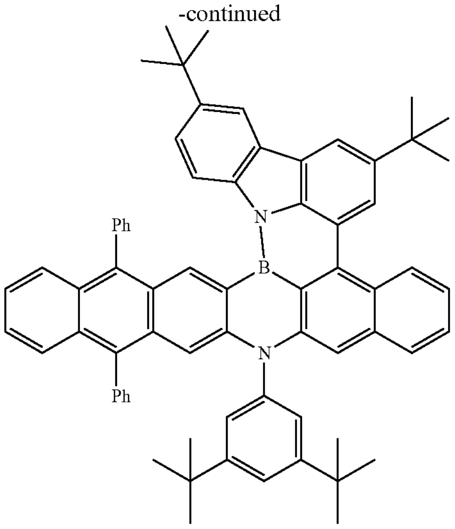
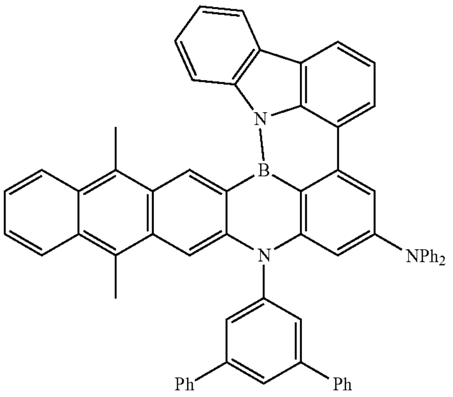
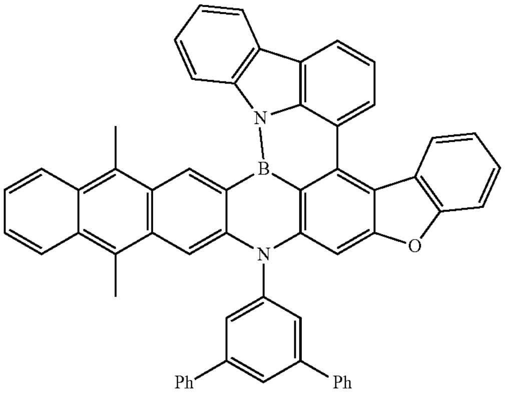
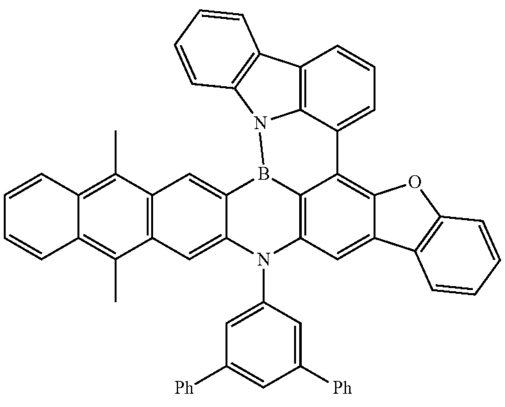
-continued
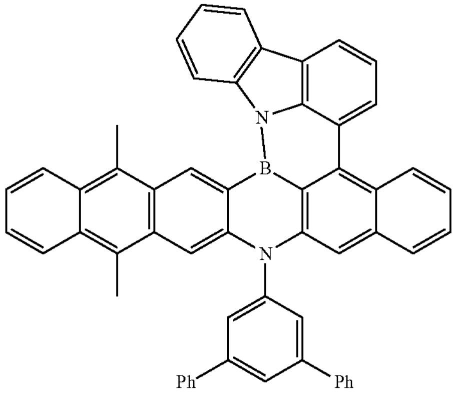
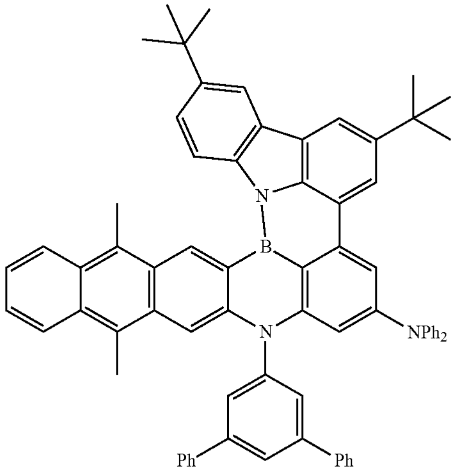
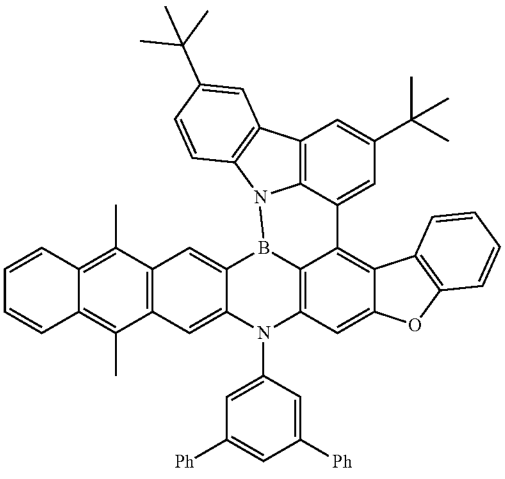

-continued
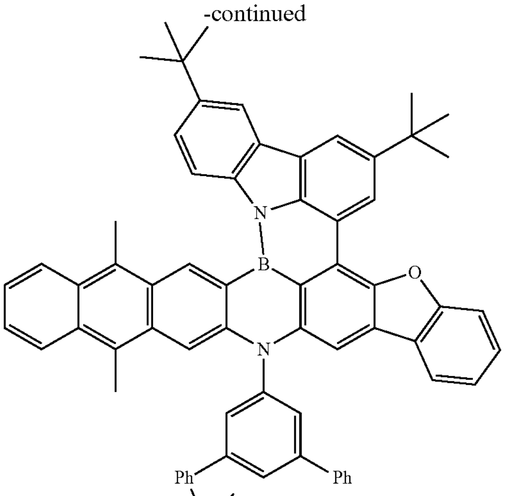
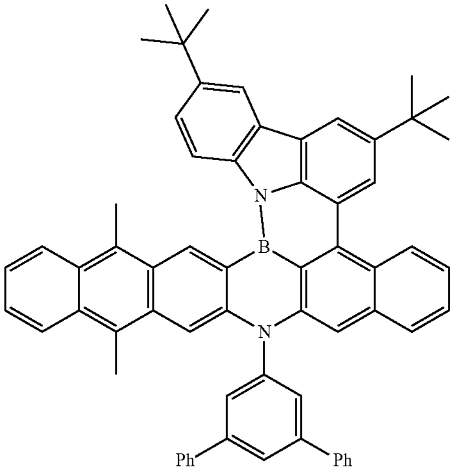
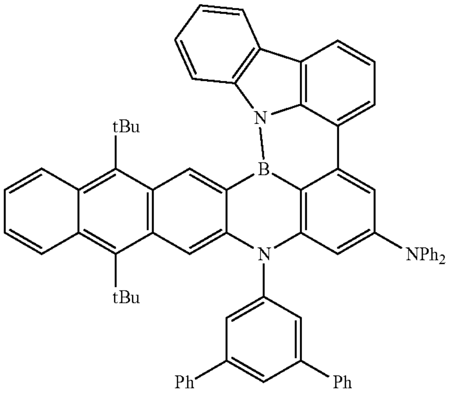
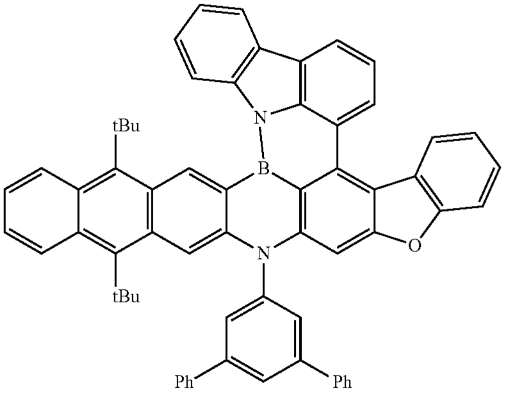
-continued
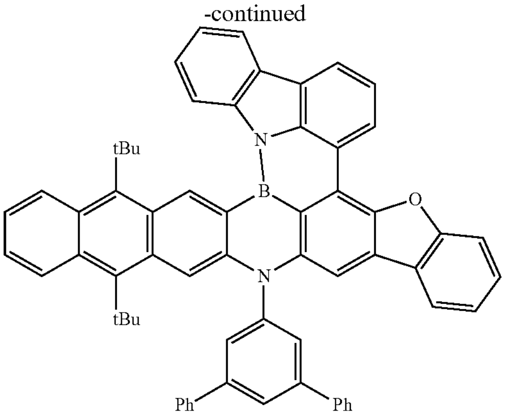
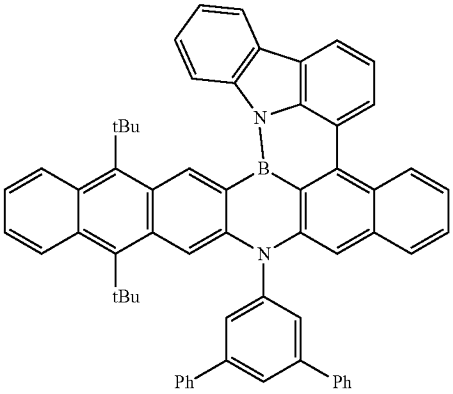
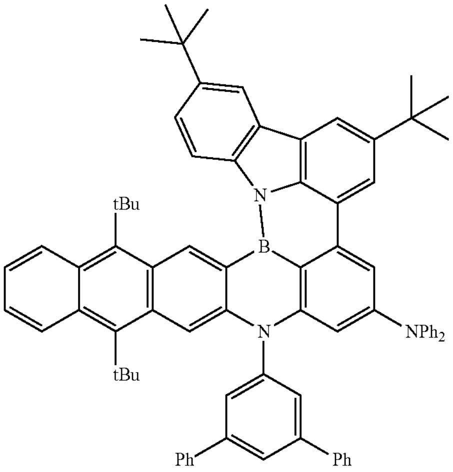
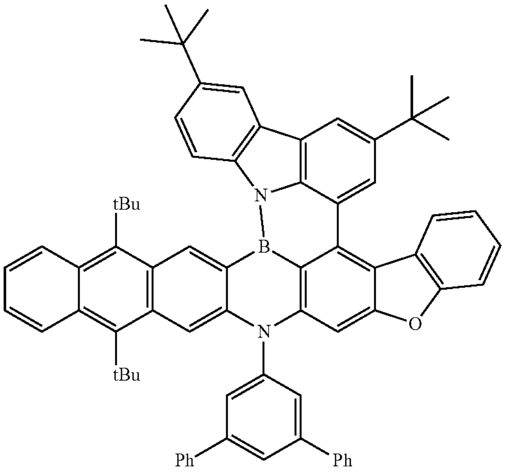

-continued
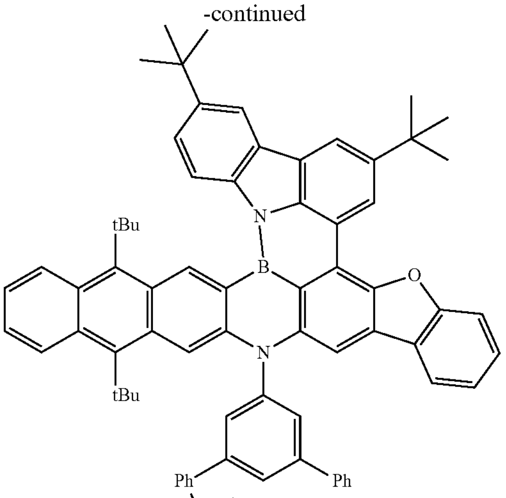
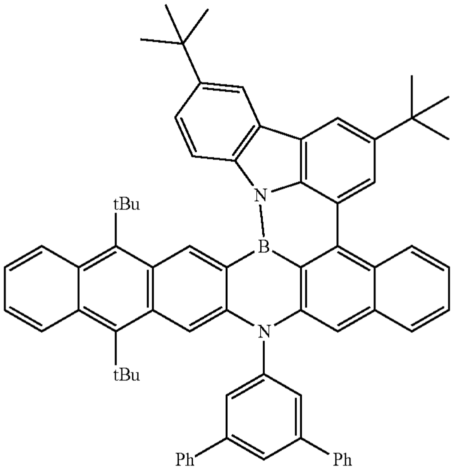
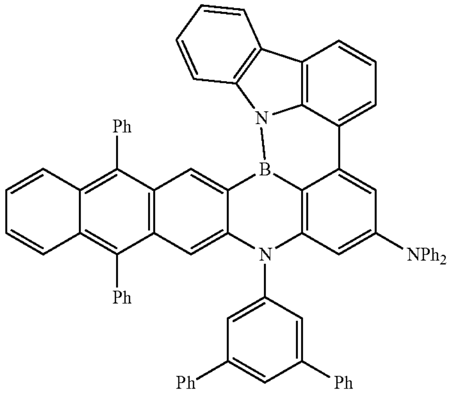
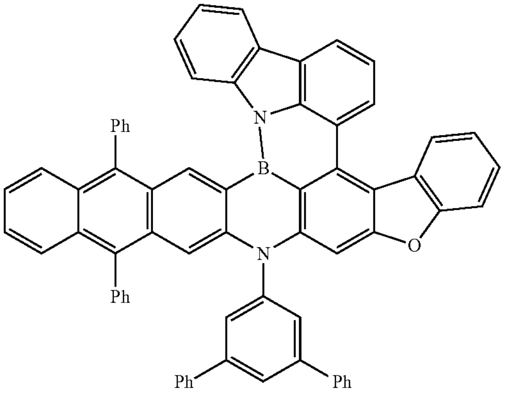
-continued
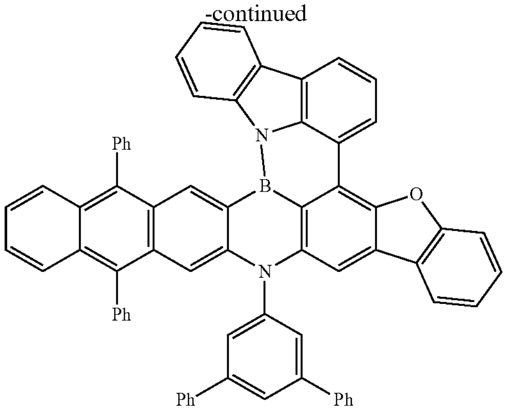
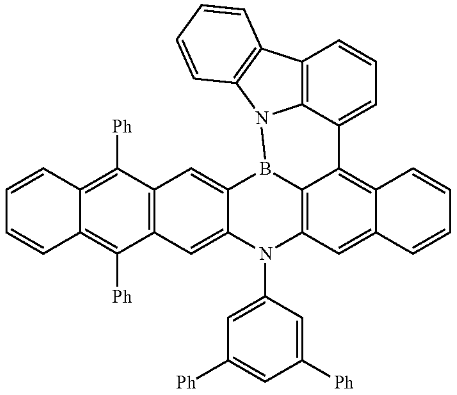
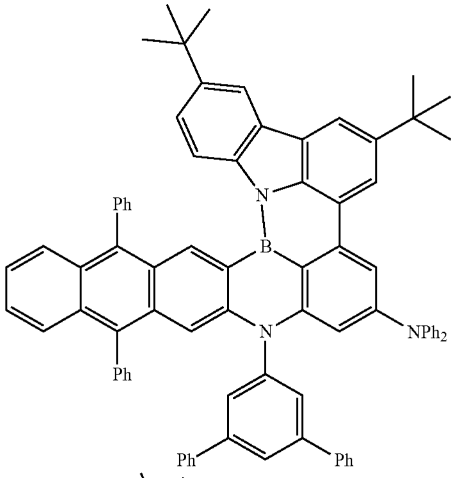
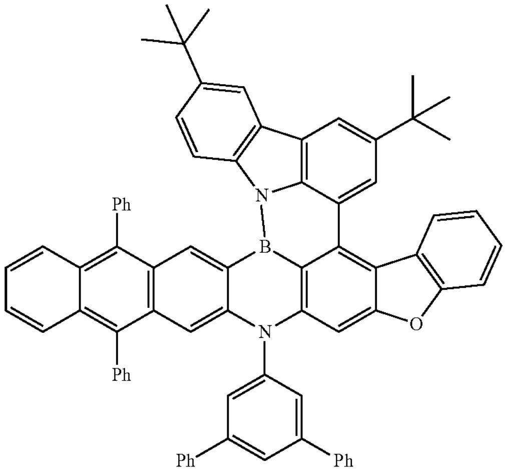

-continued
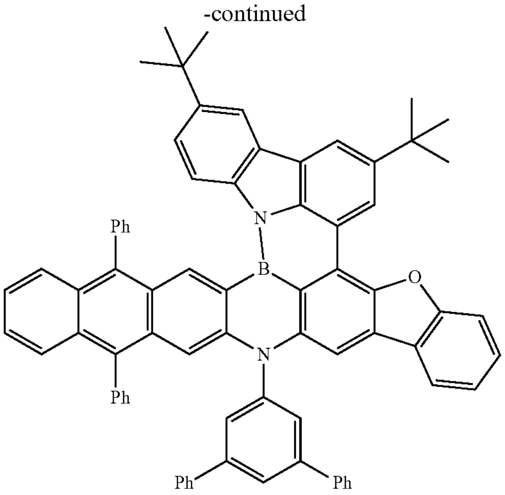
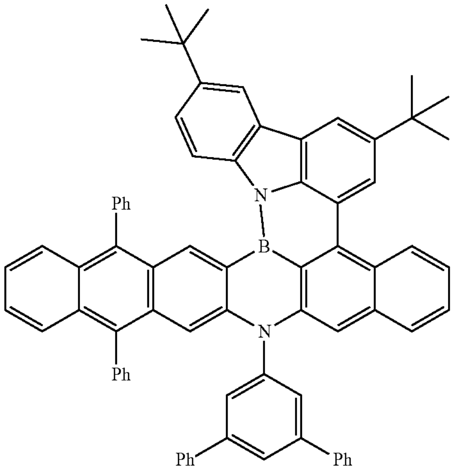
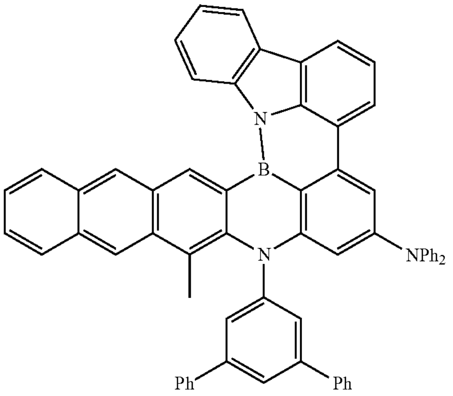
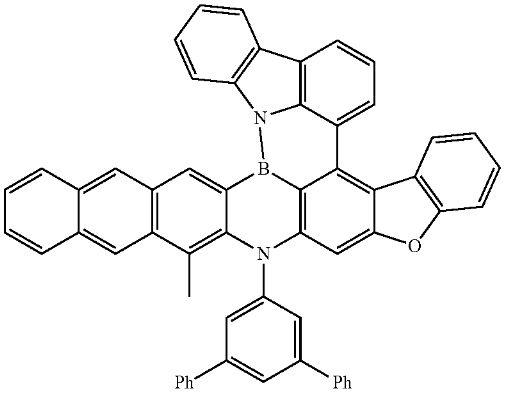
-continued
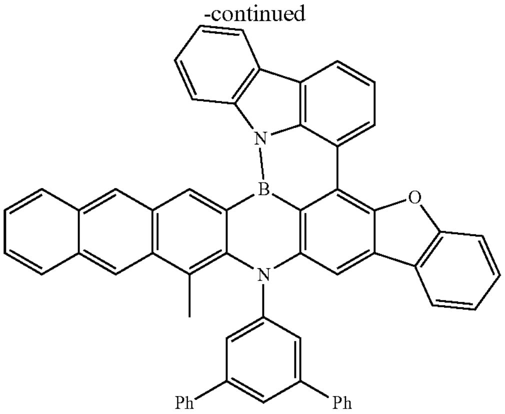
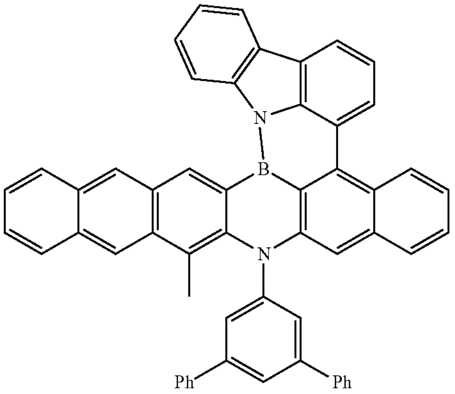
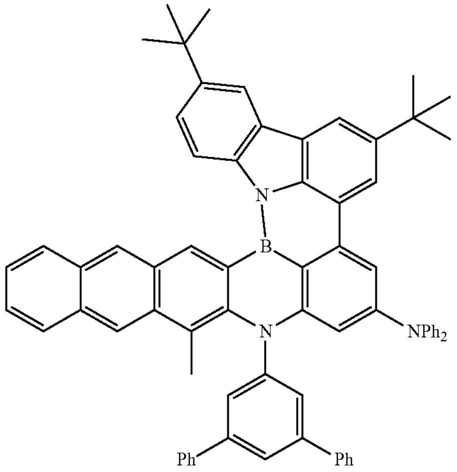
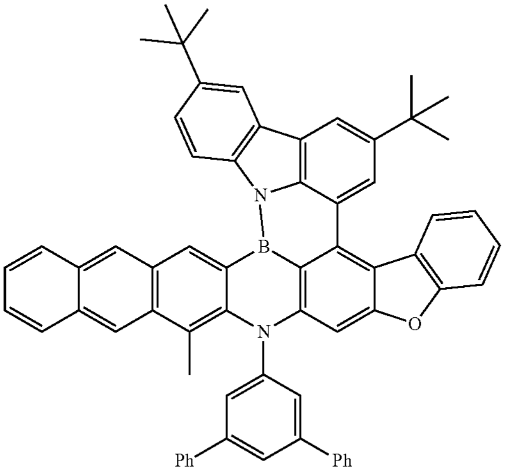

-continued
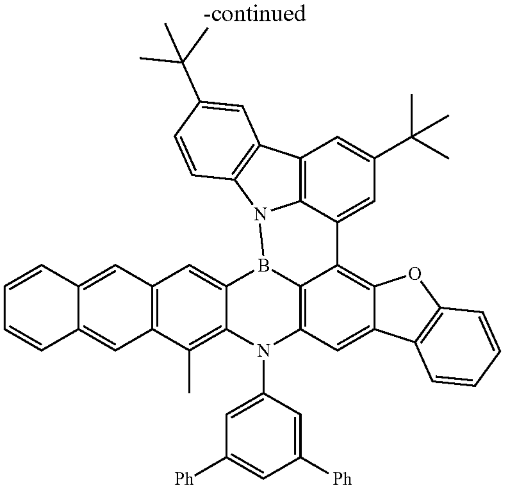
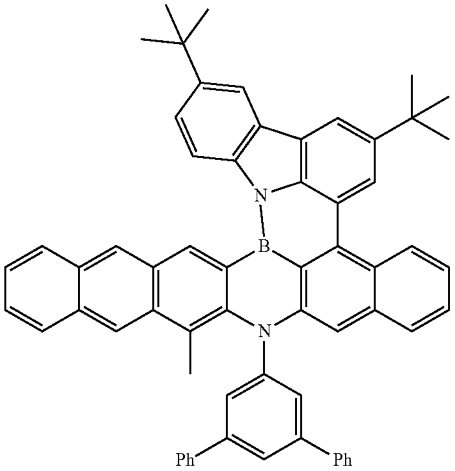
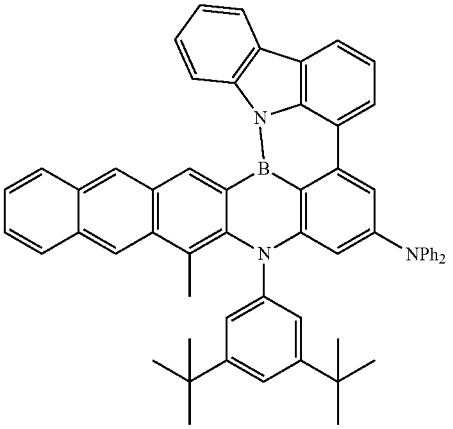
-continued
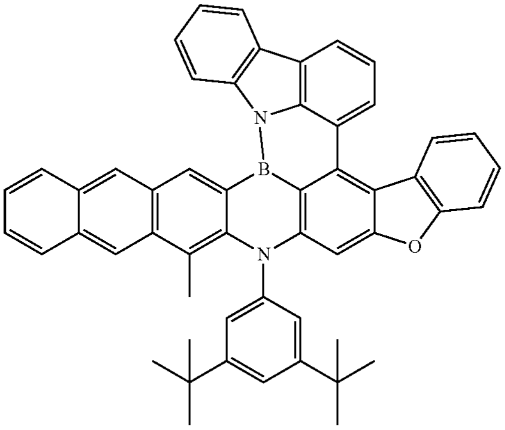
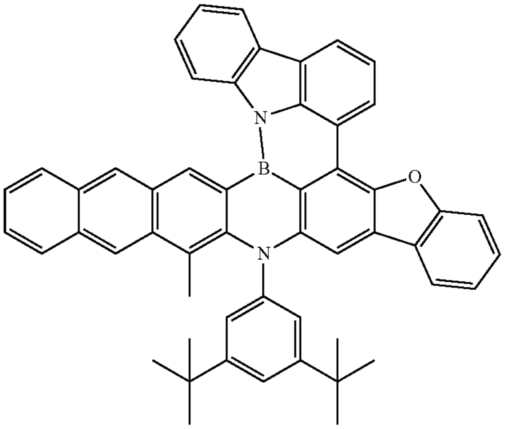
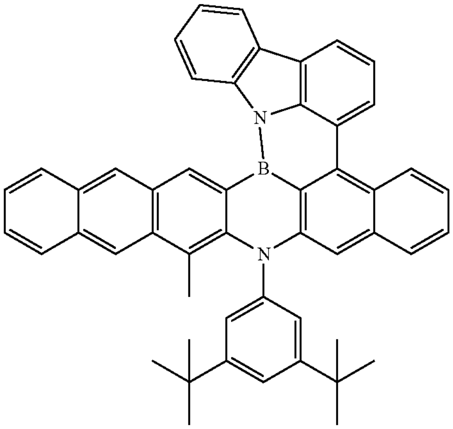

-continued
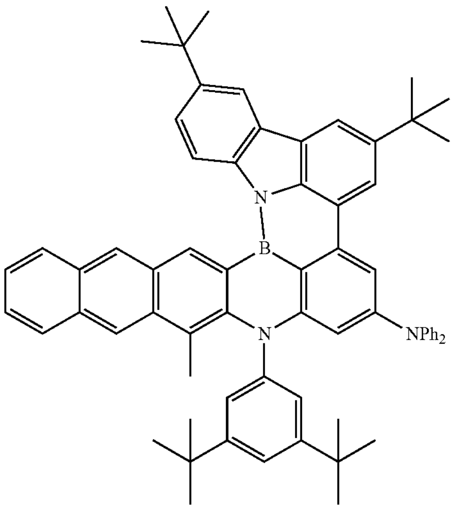
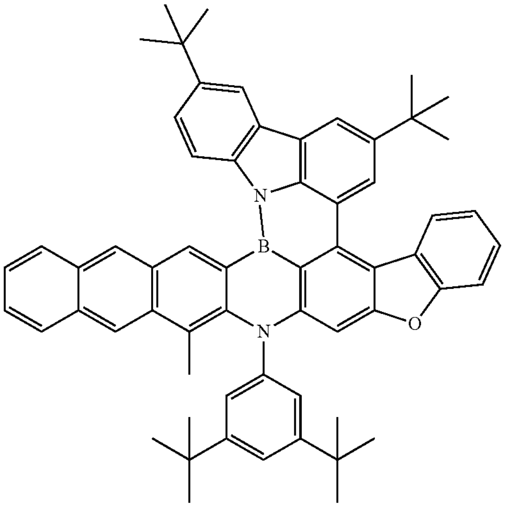
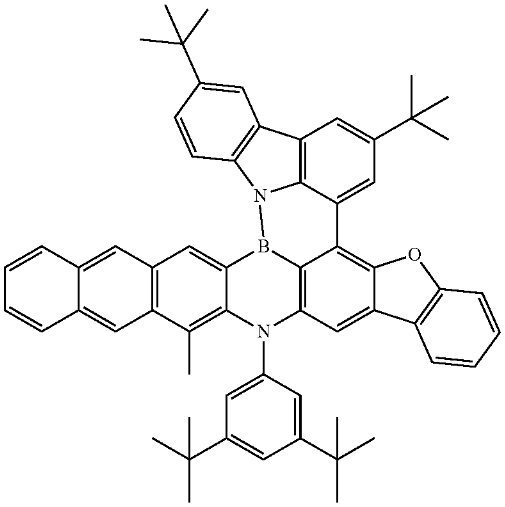
-continued
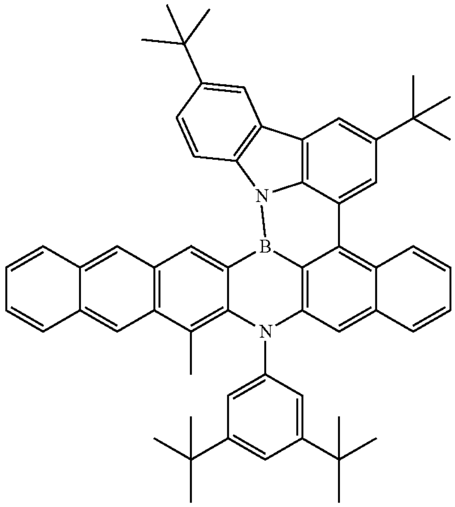
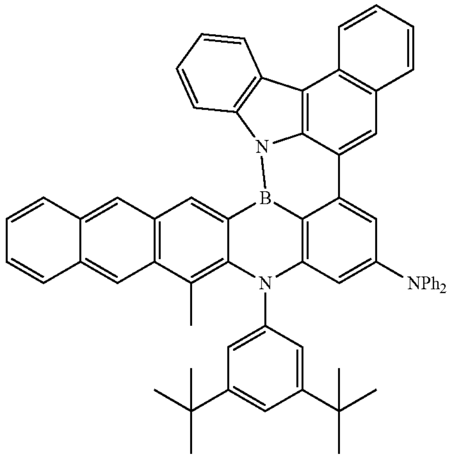
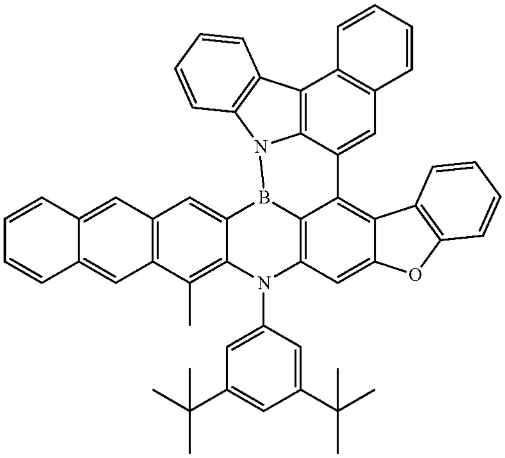

-continued
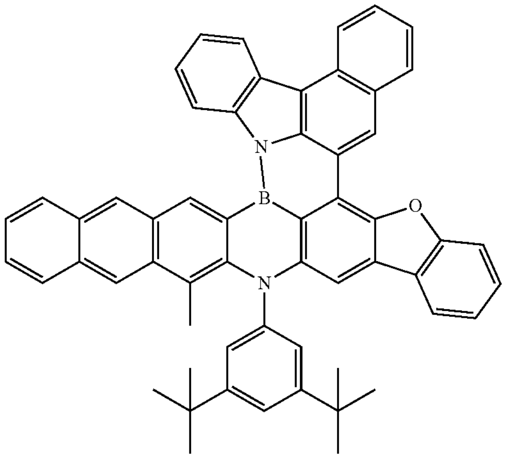
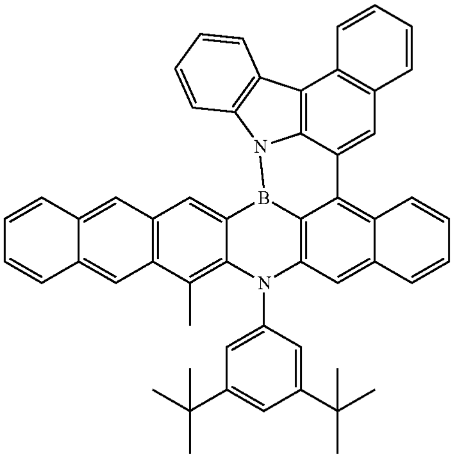
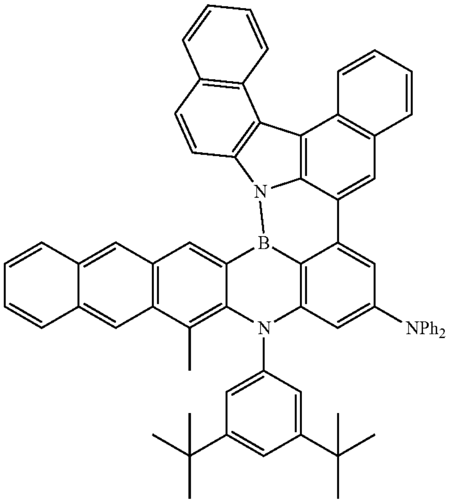
-continued
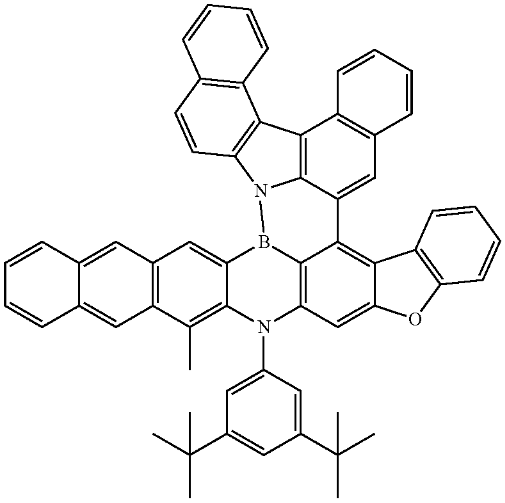
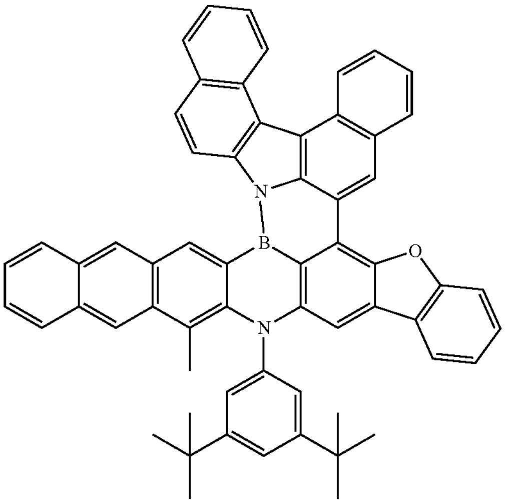
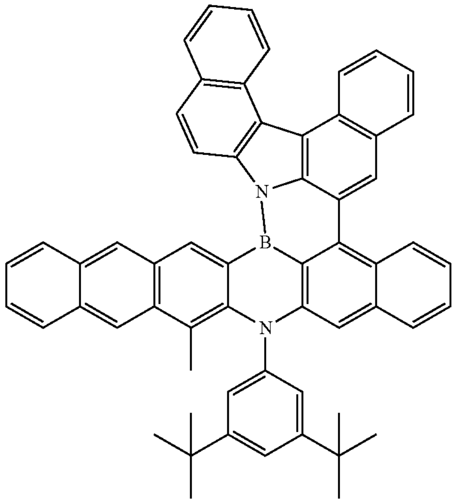

-continued
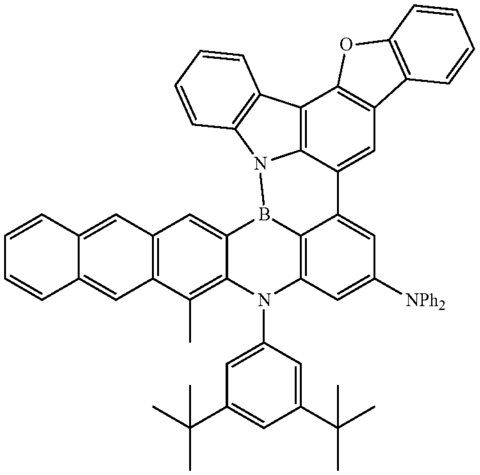
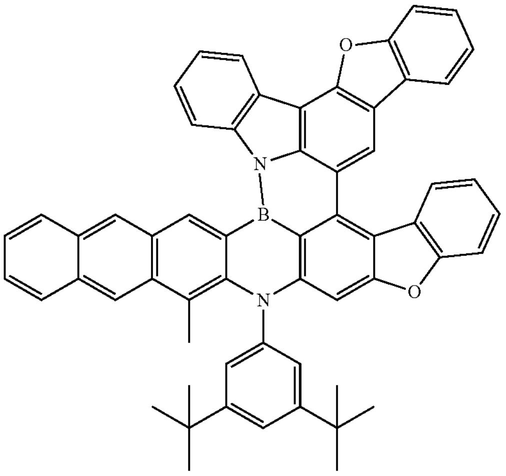
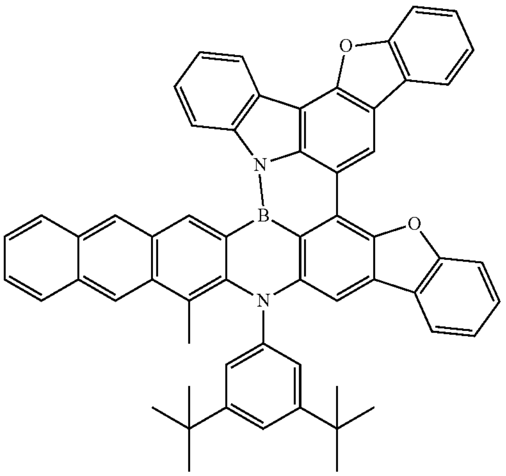
-continued
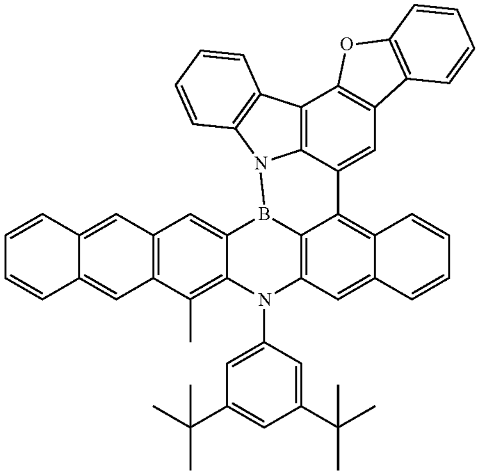
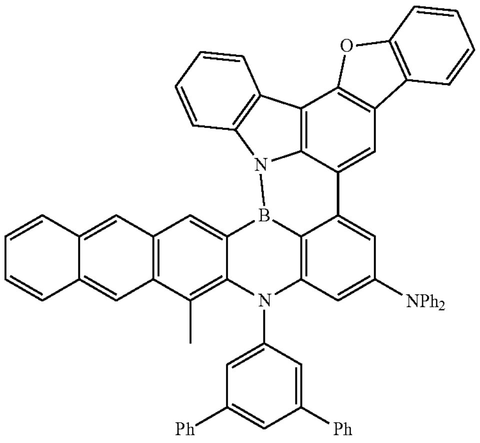
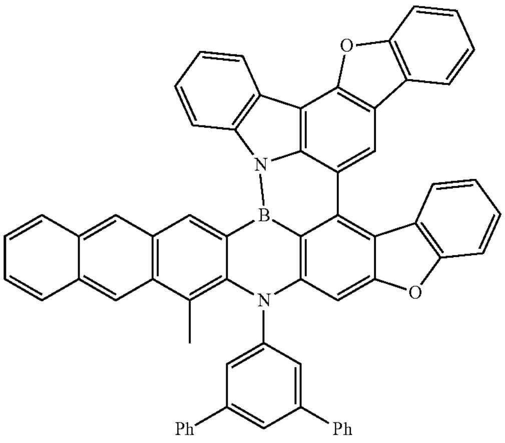

-continued
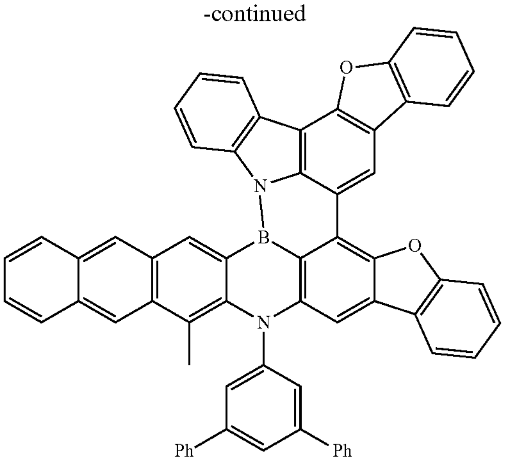
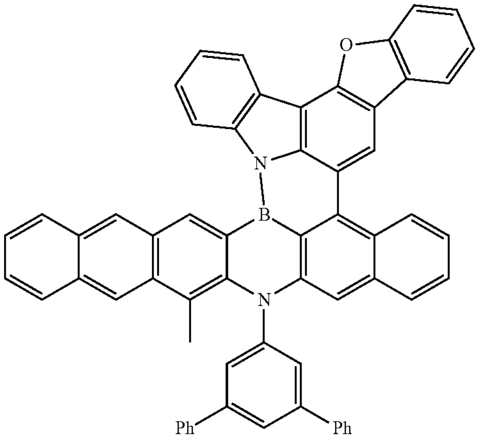
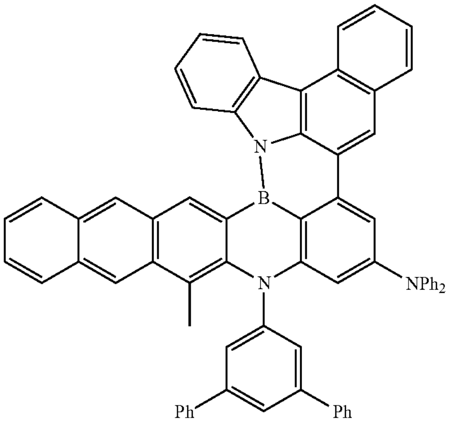
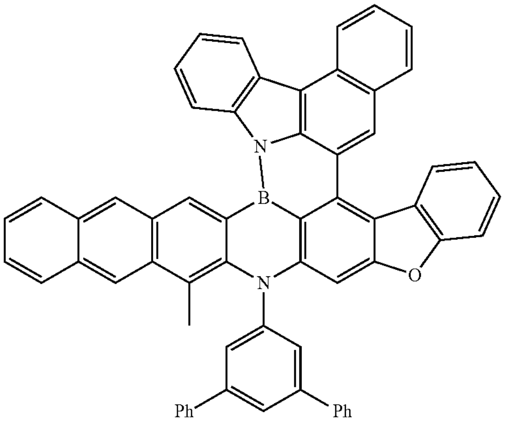
-continued
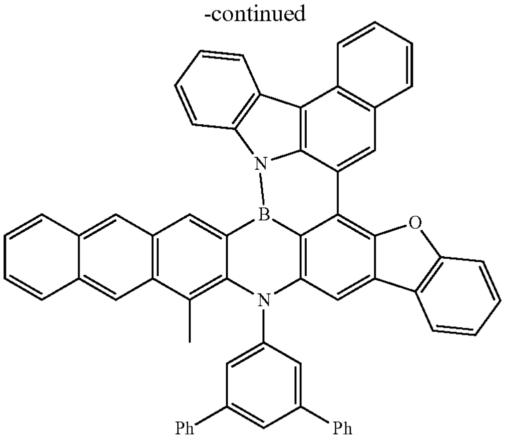
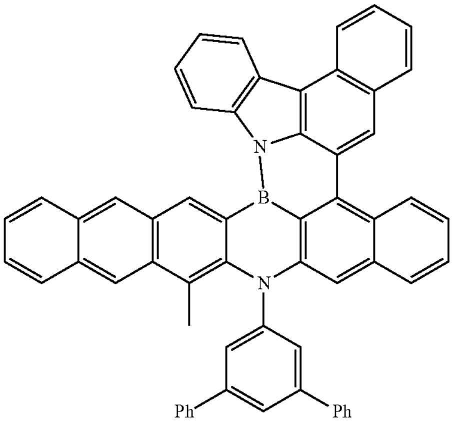
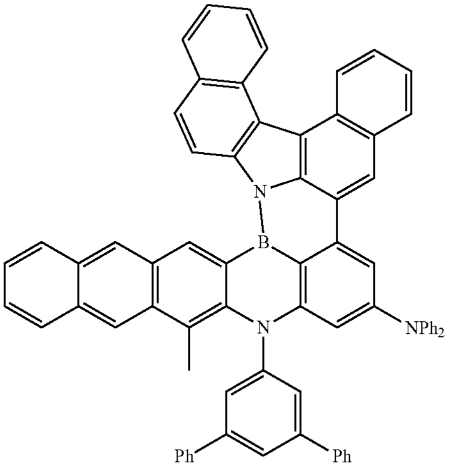

-continued
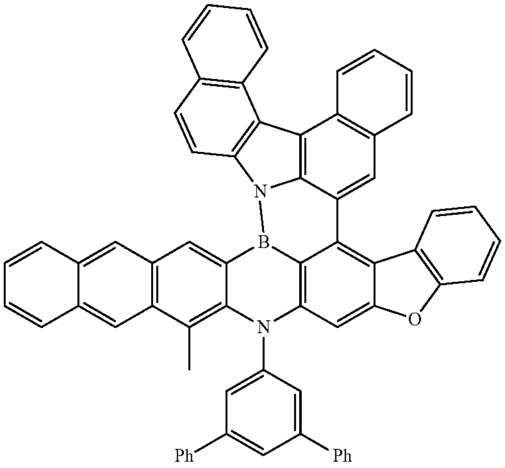
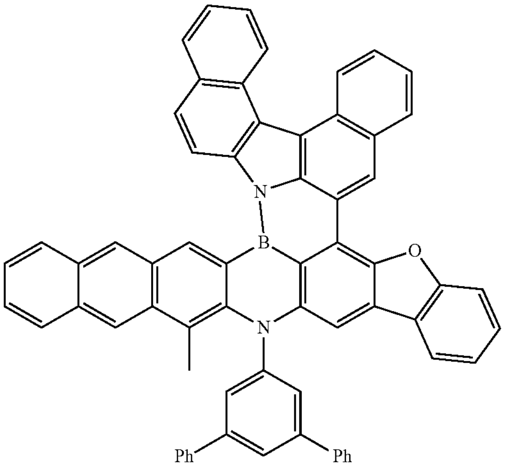
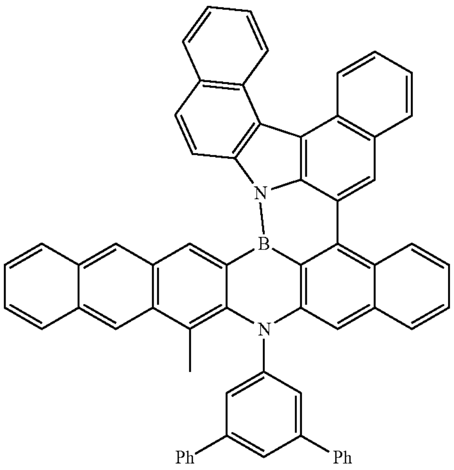
-continued
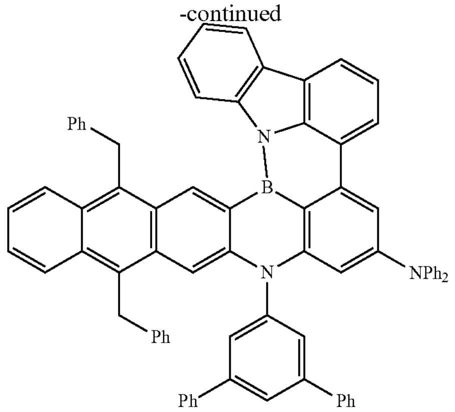
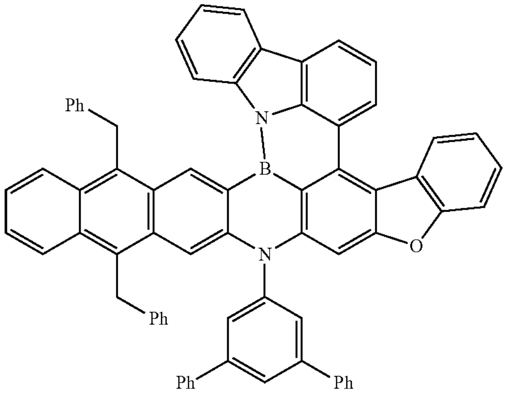
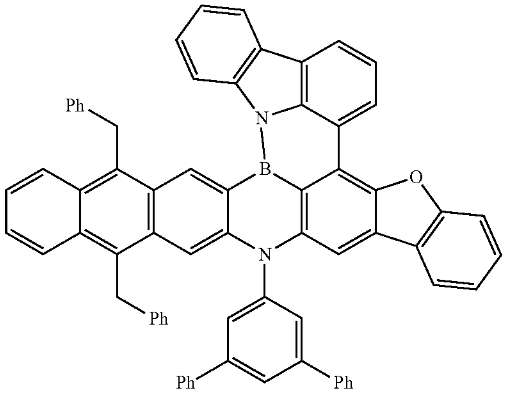
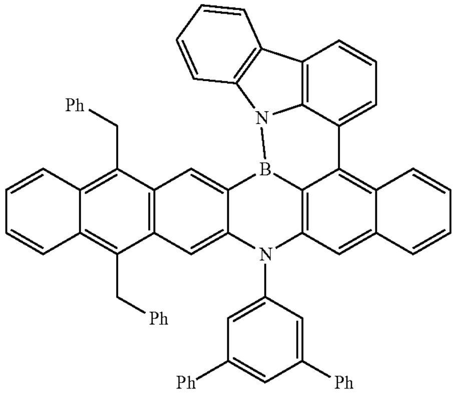

-continued
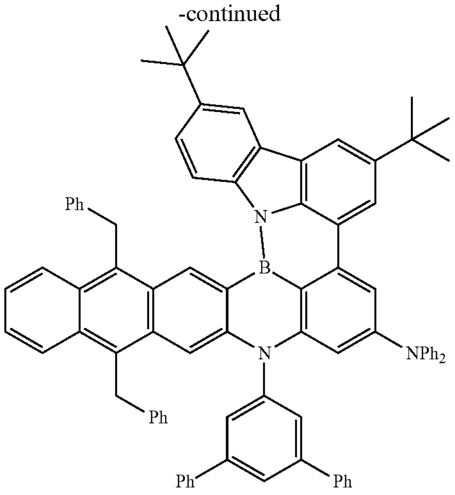
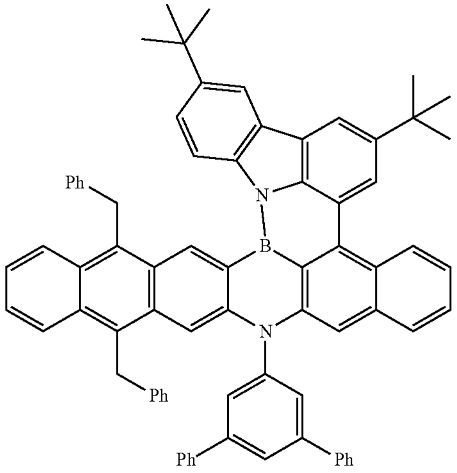
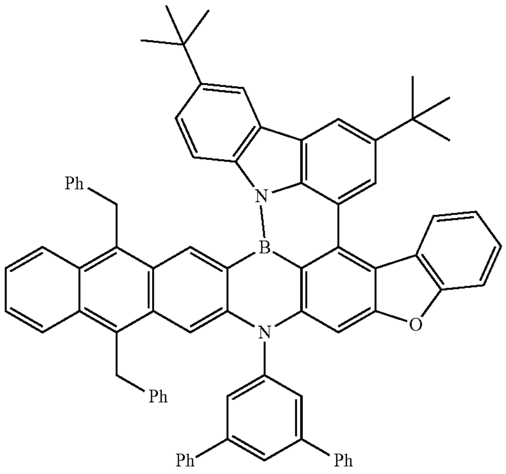
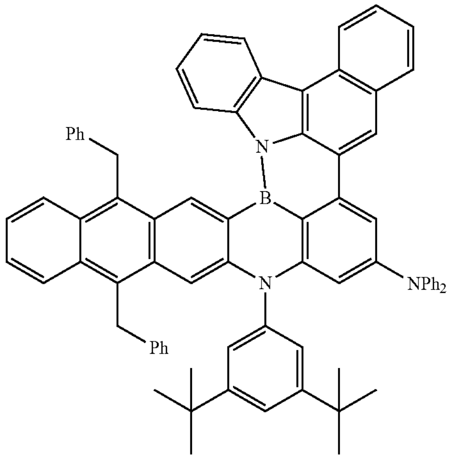
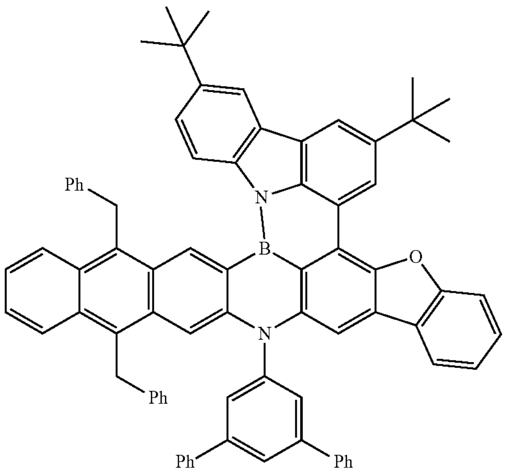
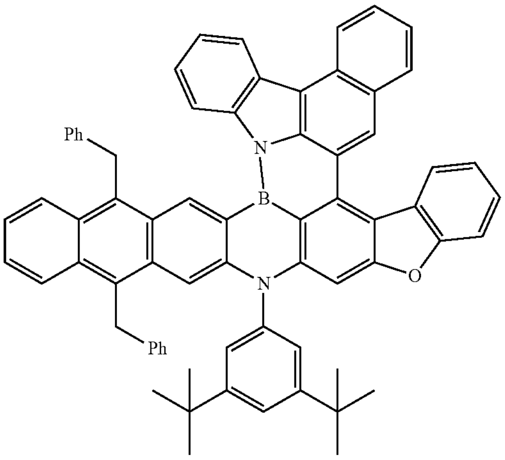

-continued
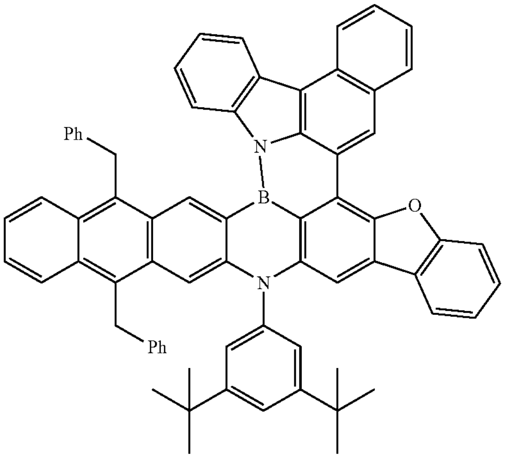
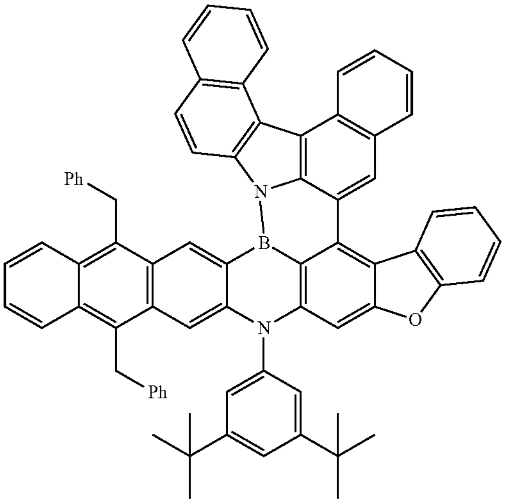
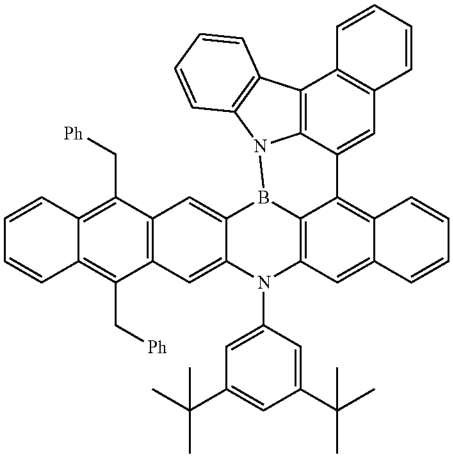
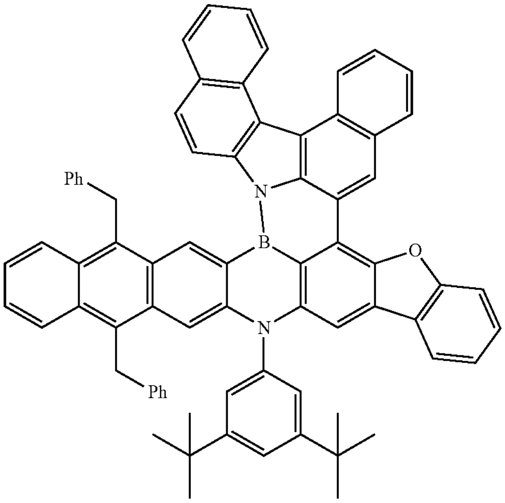
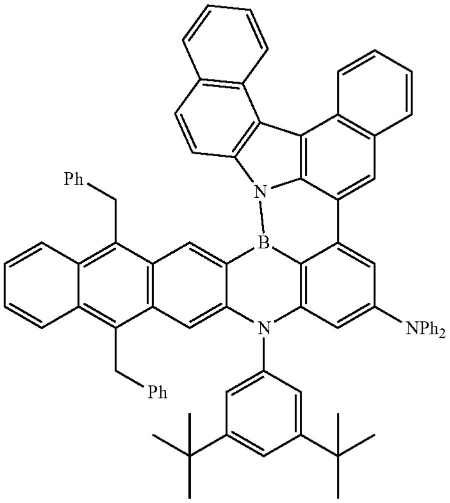
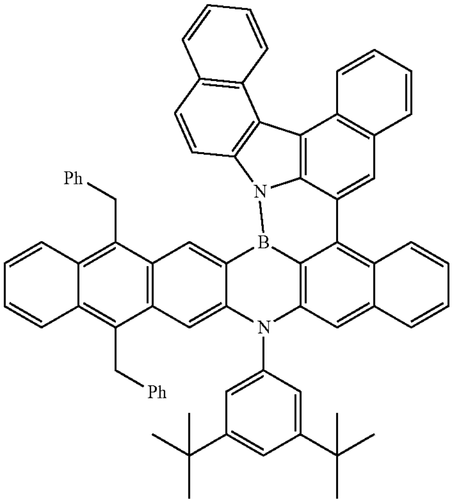
-continued -continued
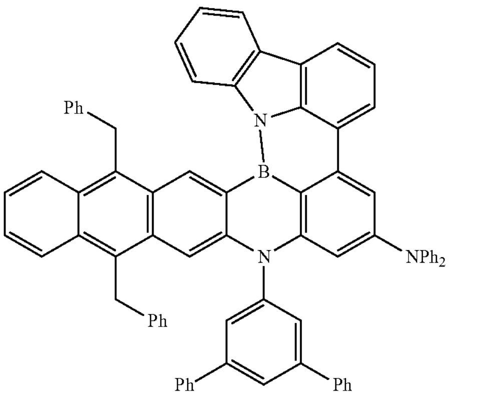
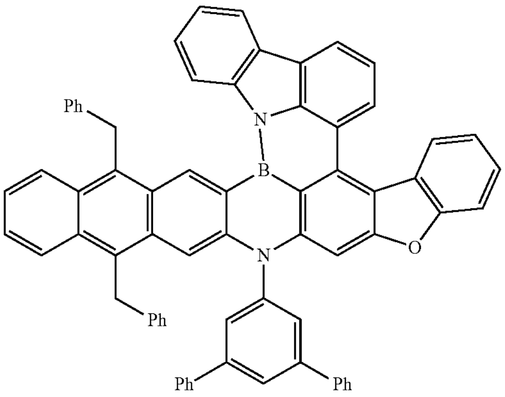
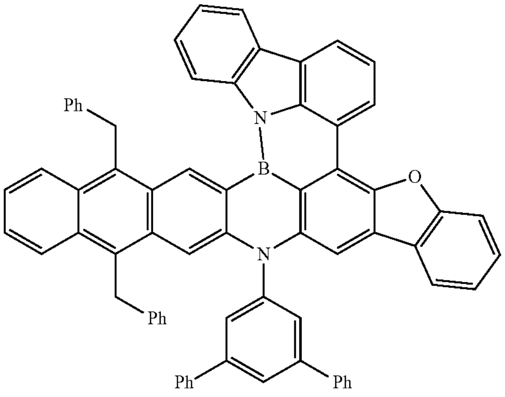
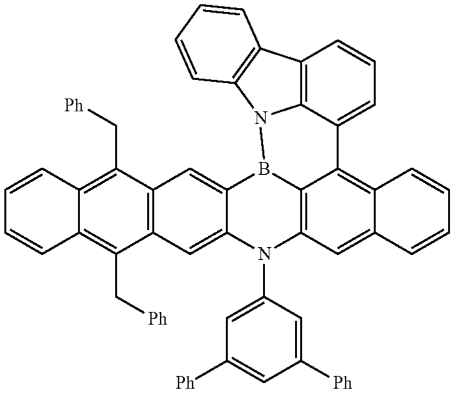
-continued
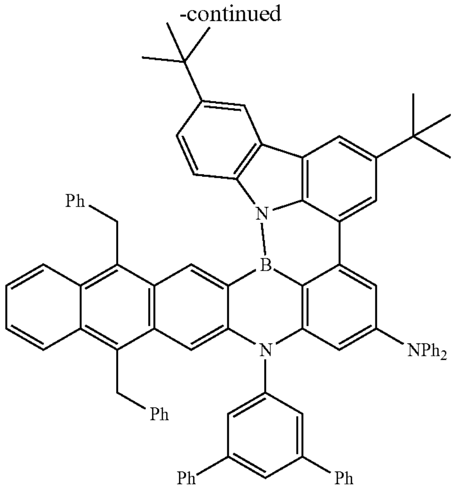
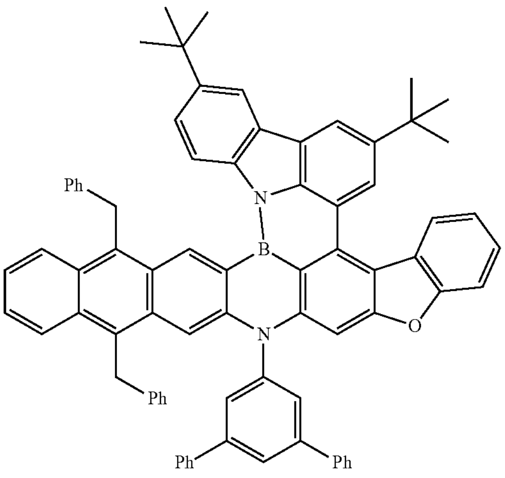
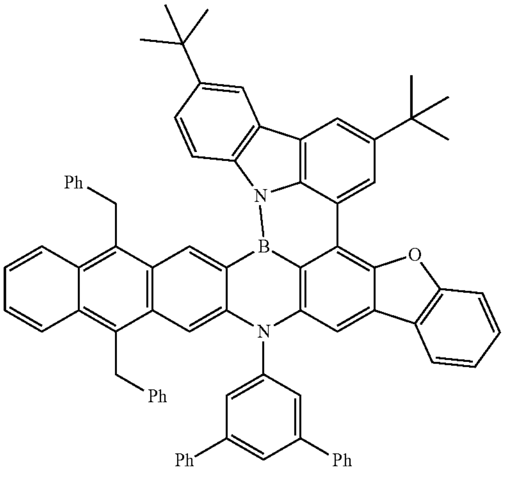

-continued
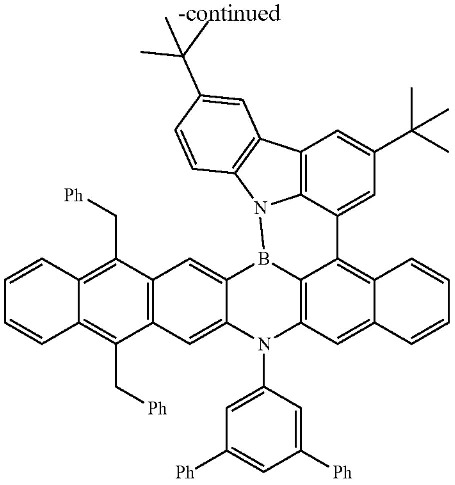
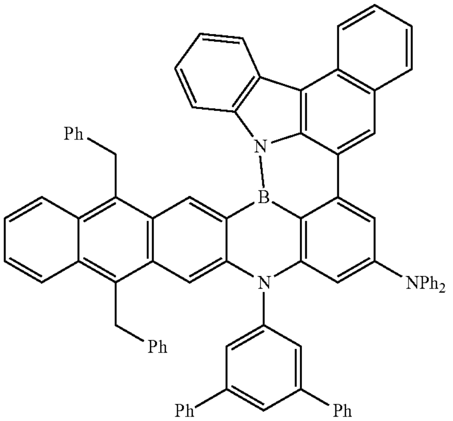
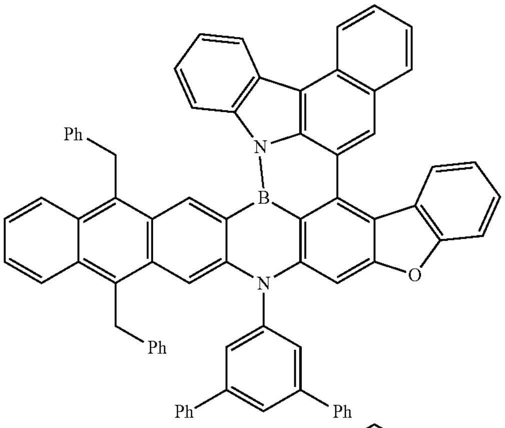
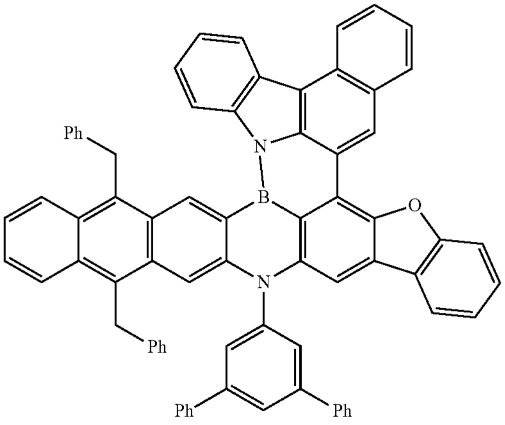
-continued
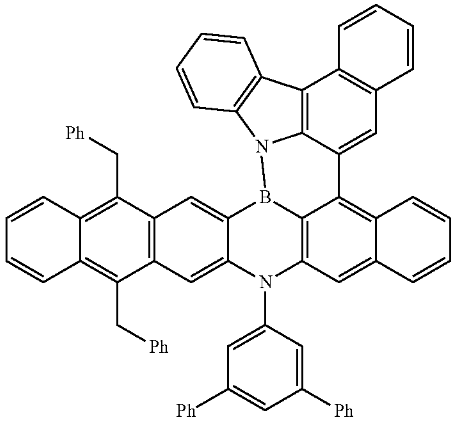
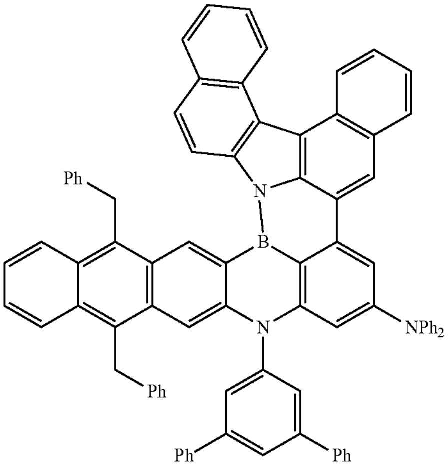
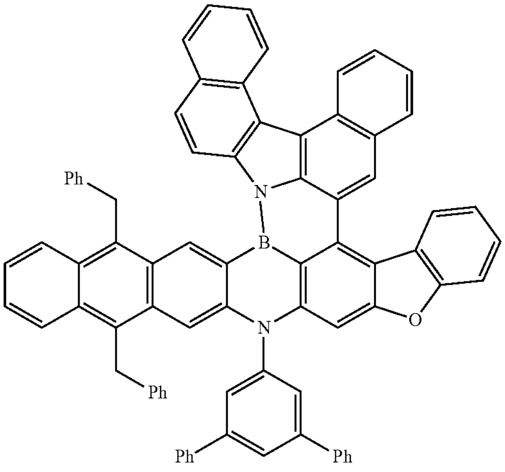

-continued
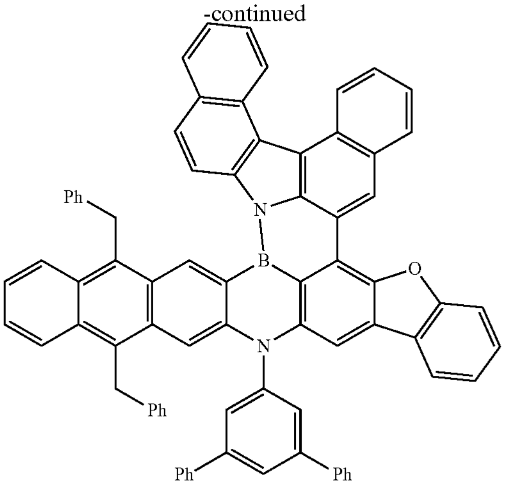
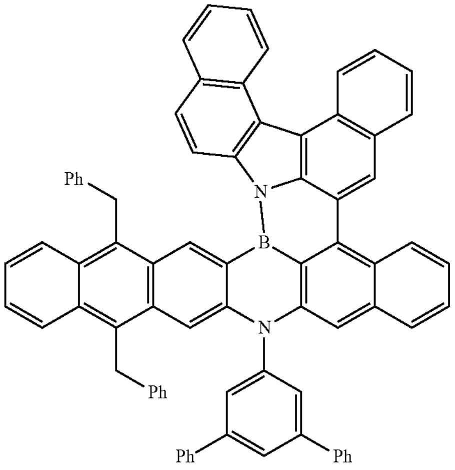
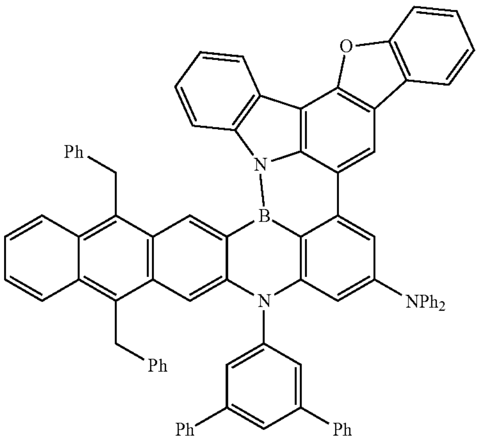
-continued
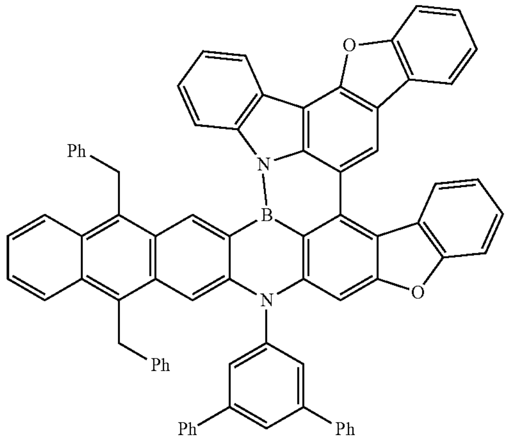
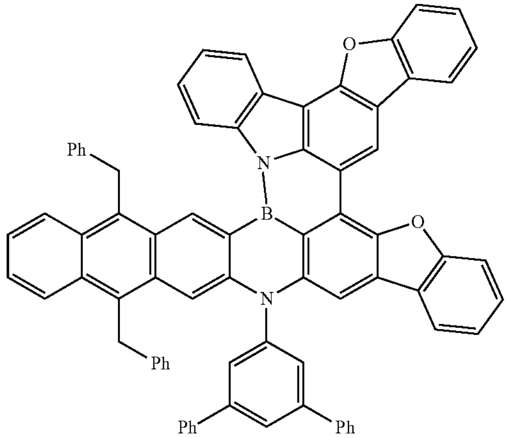
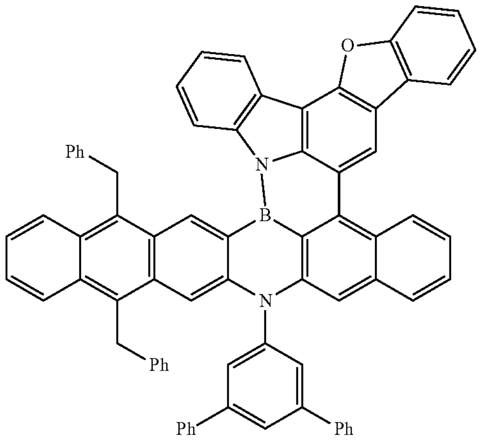

-continued
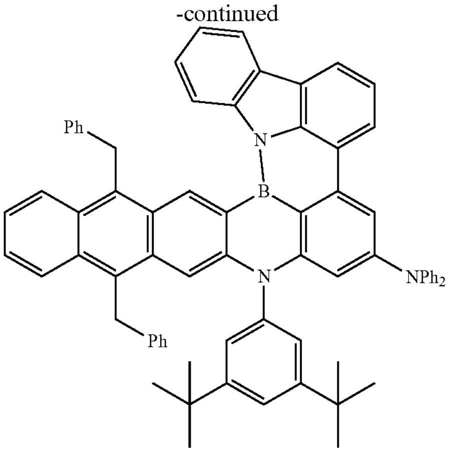
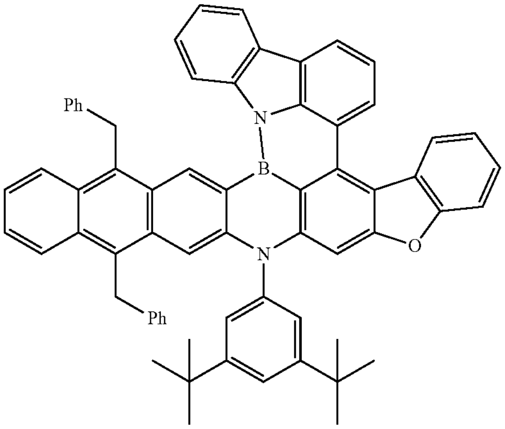
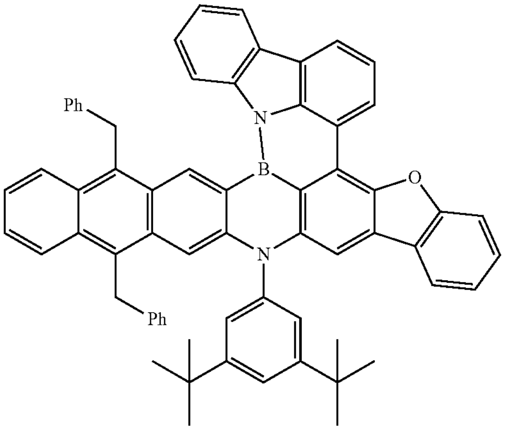
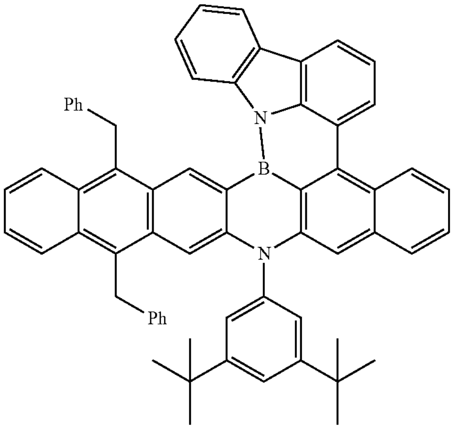
-continued
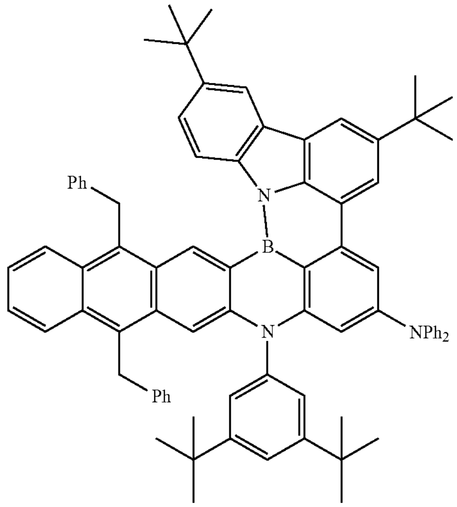
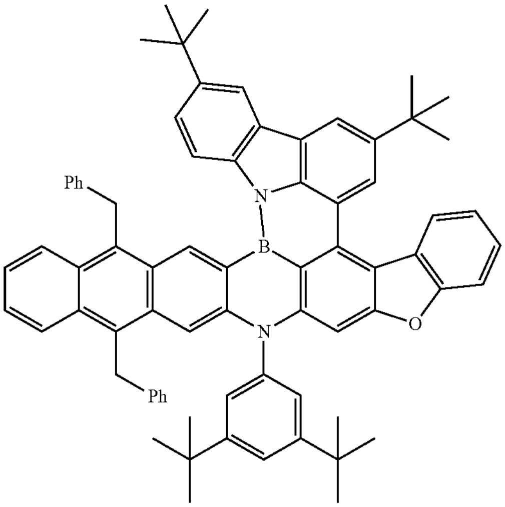
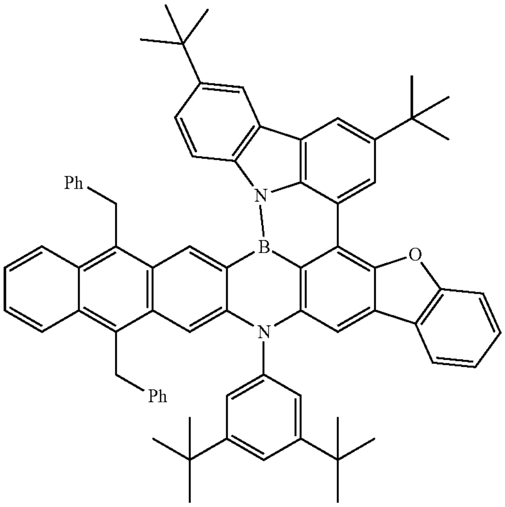

-continued
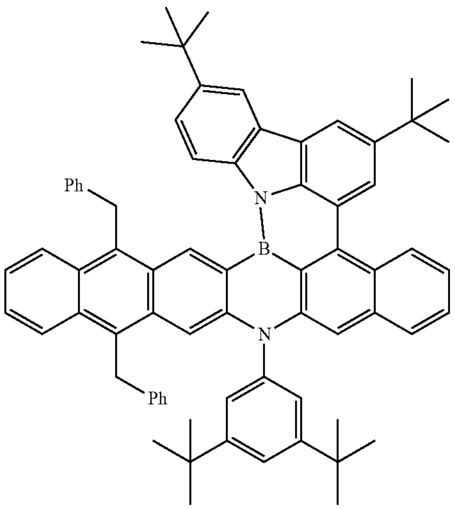
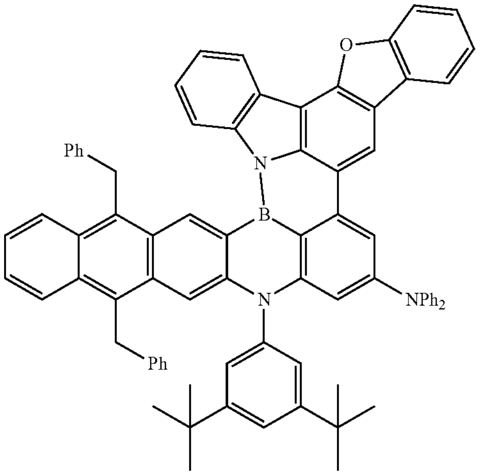
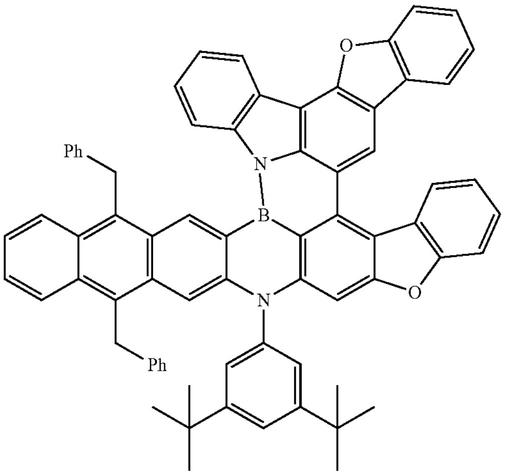
-continued
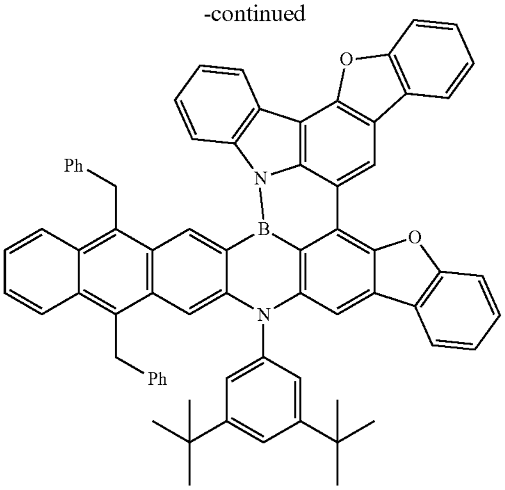
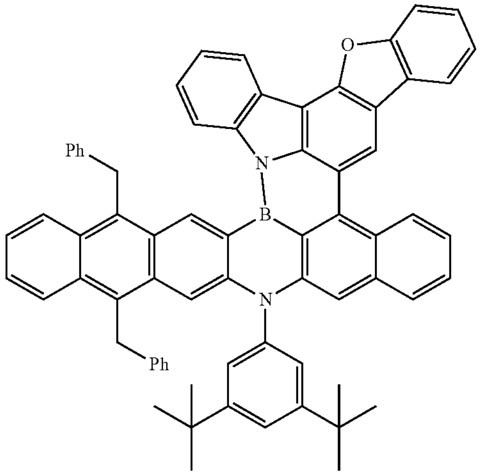
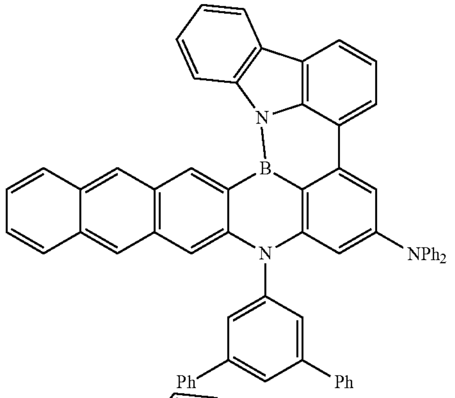
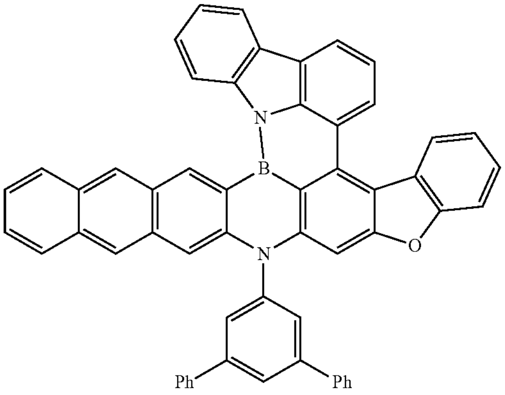

-continued
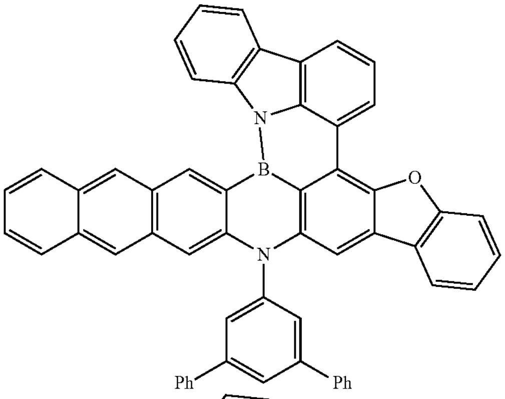
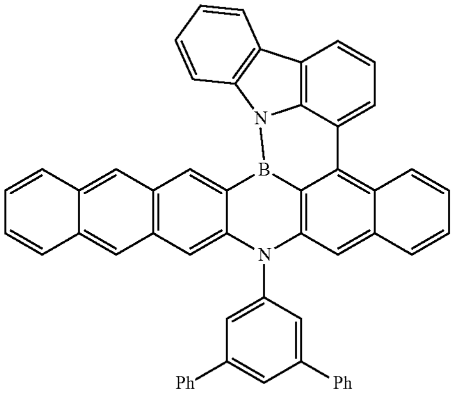
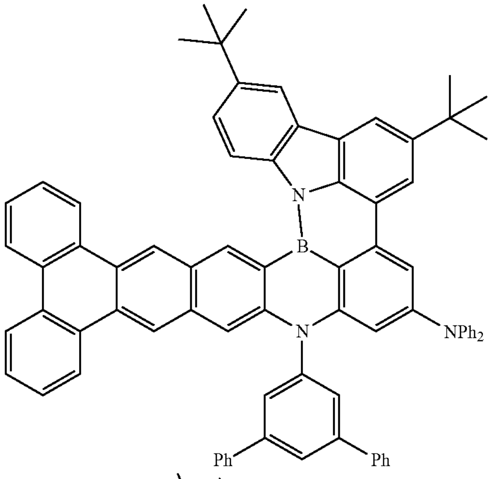
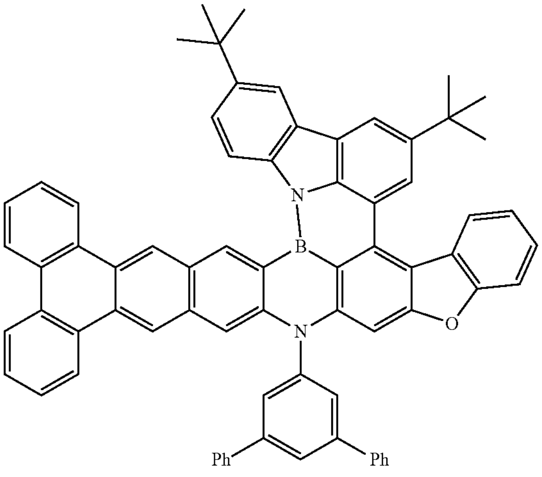
-continued
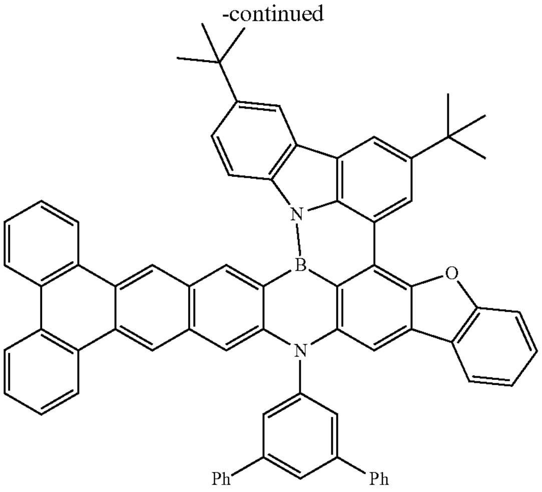
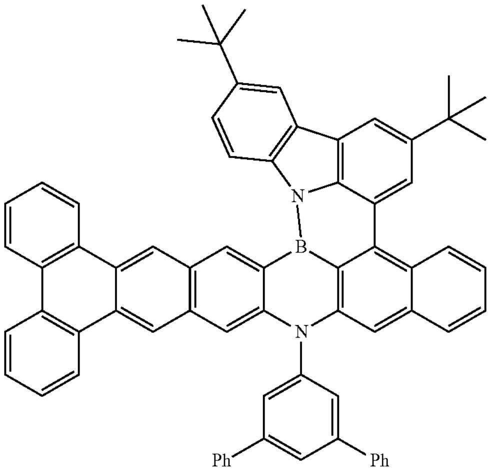
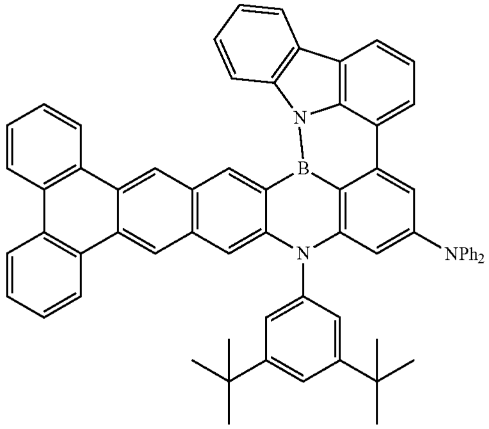

-continued
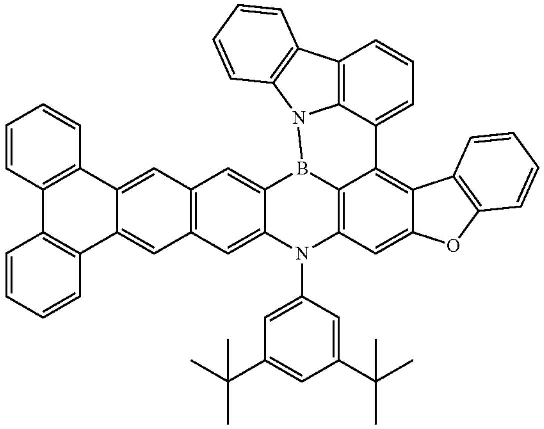
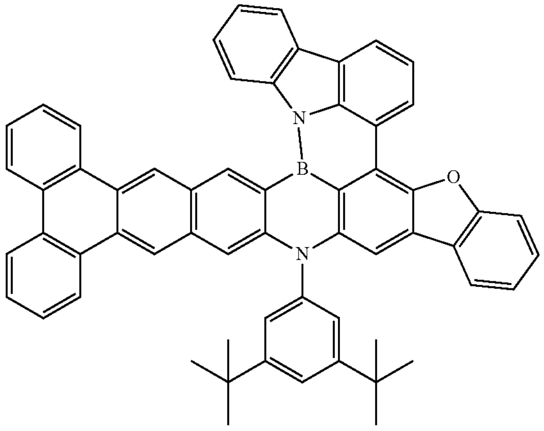
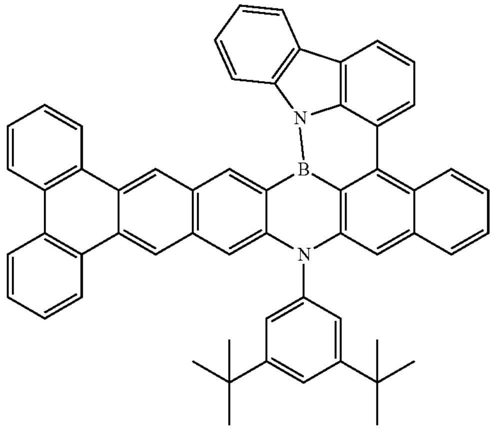
-continued
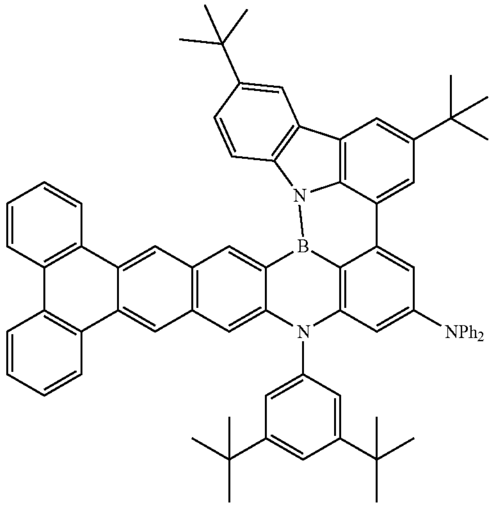
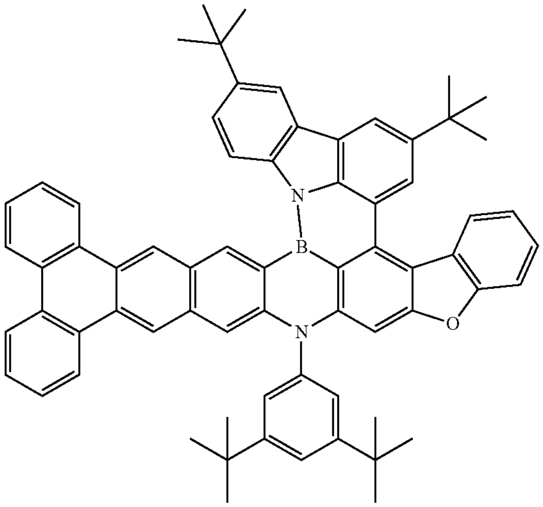
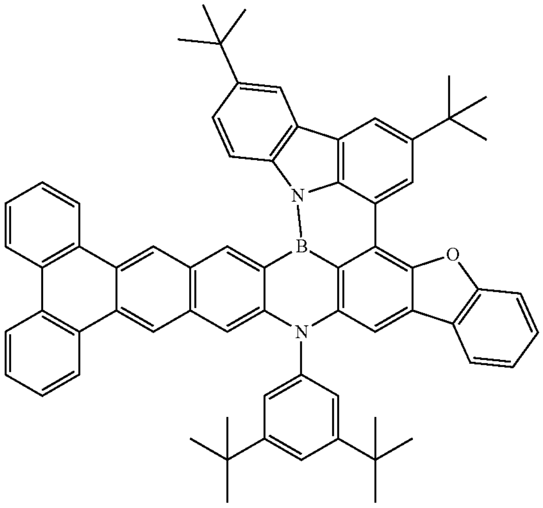

-continued
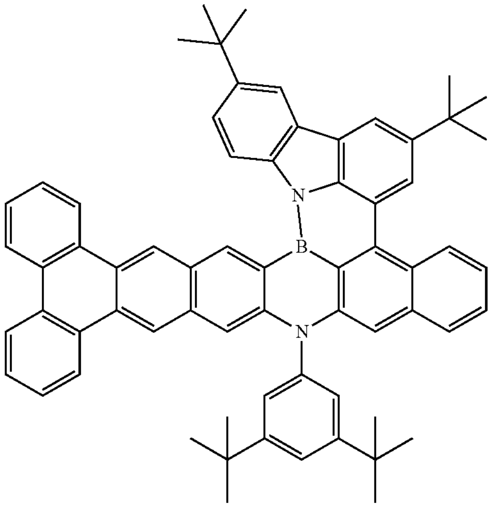
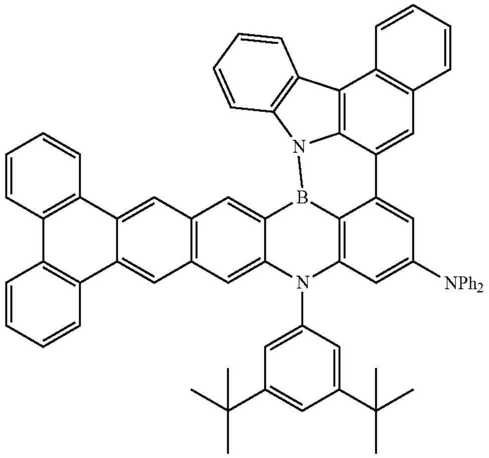
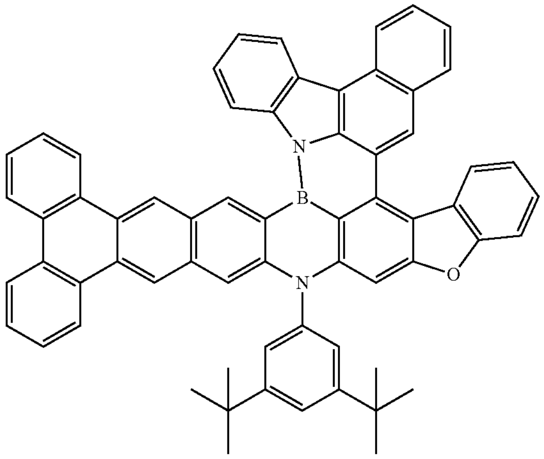
-continued
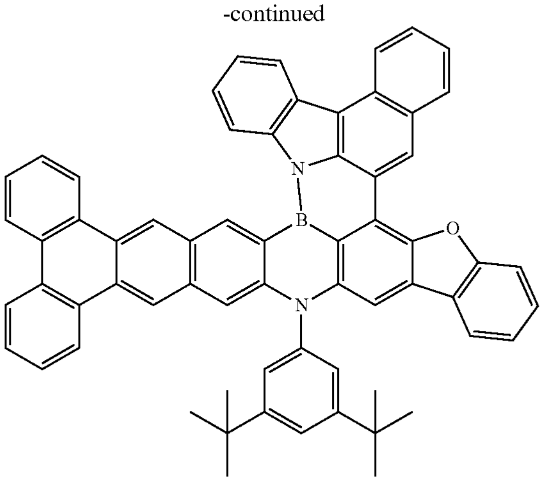
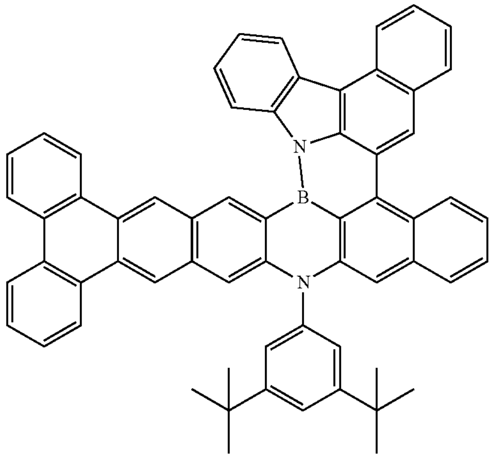
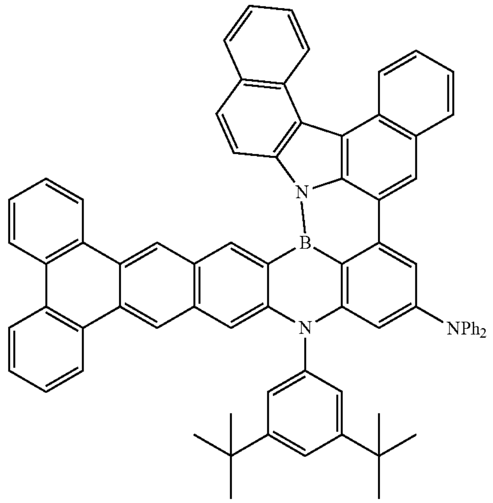

-continued
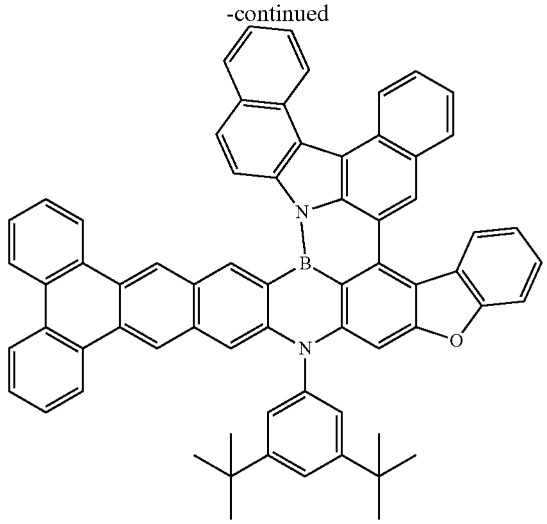
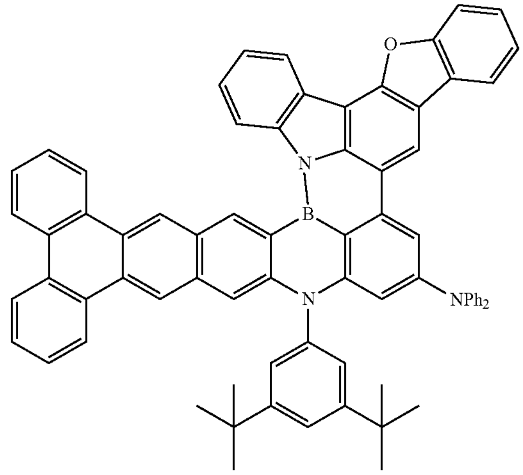
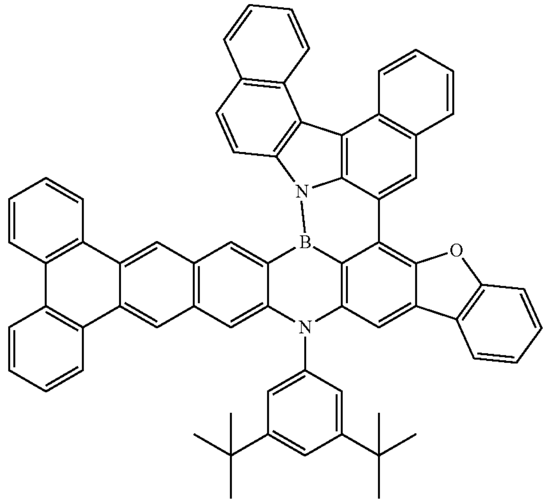
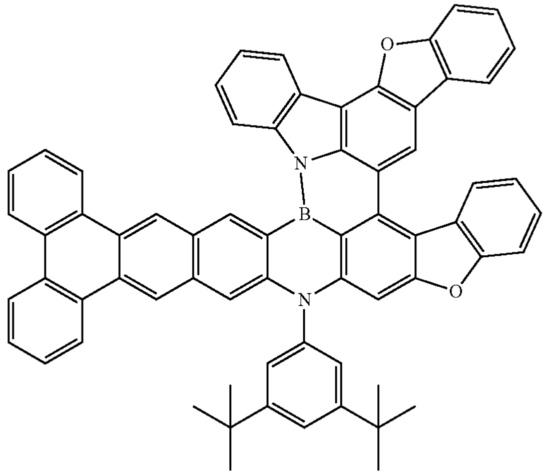
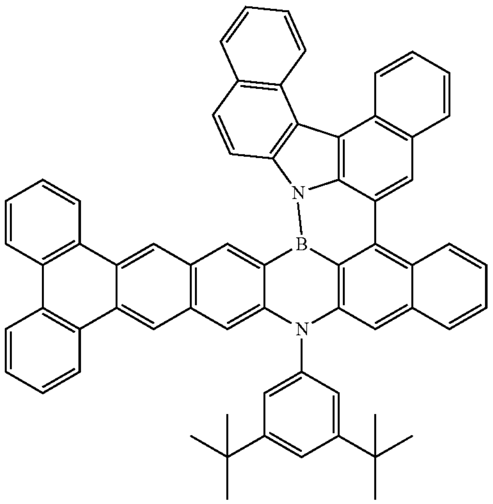
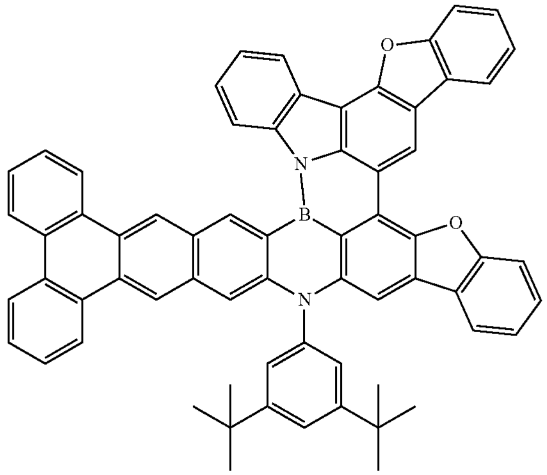
-continued -continued
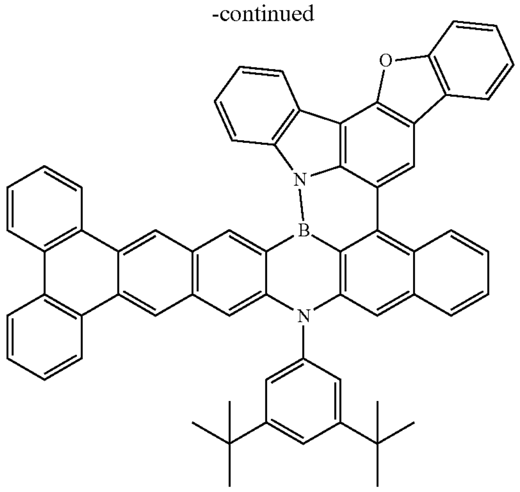
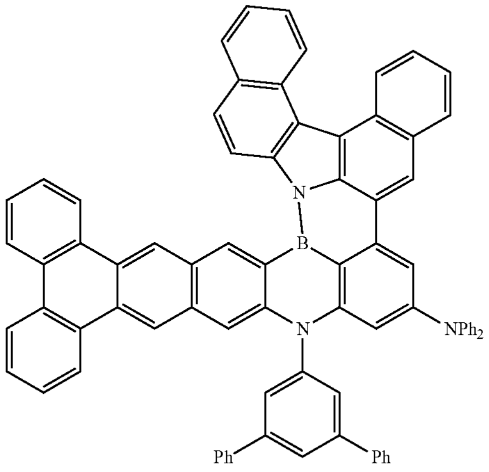
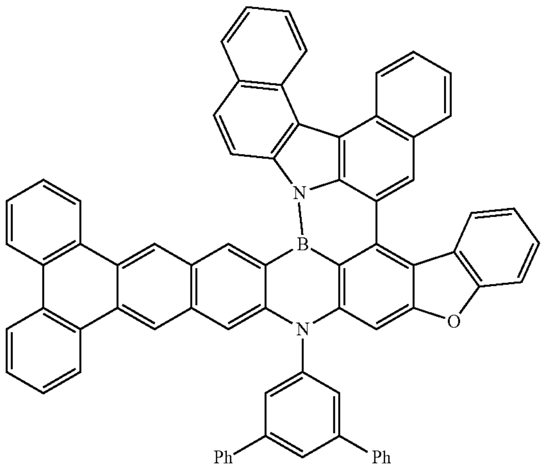
-continued
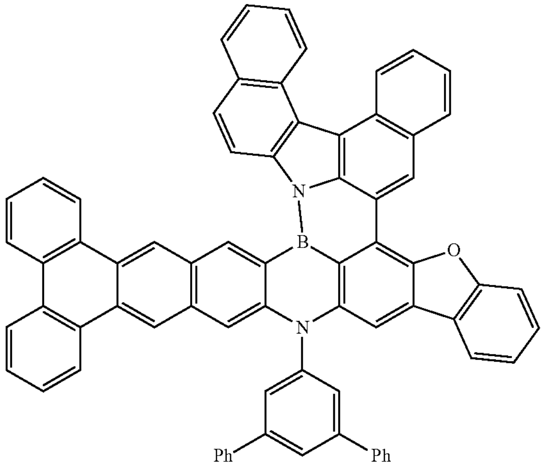
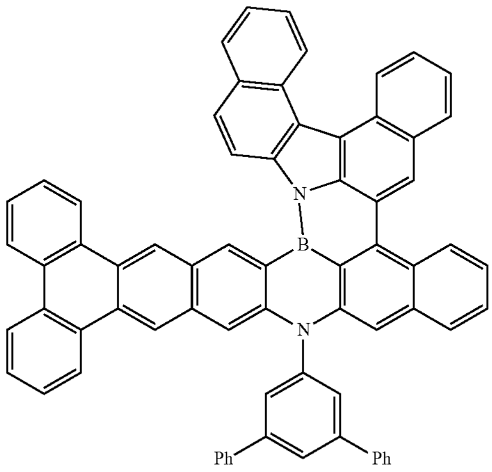
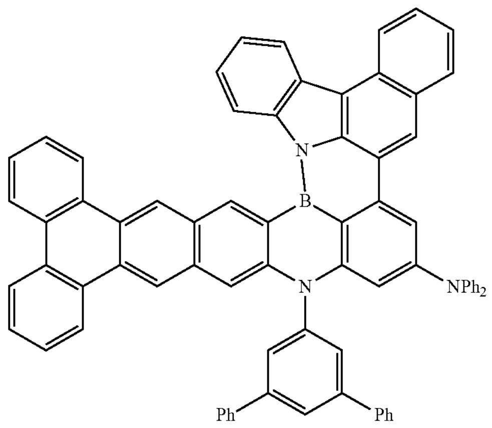

-continued
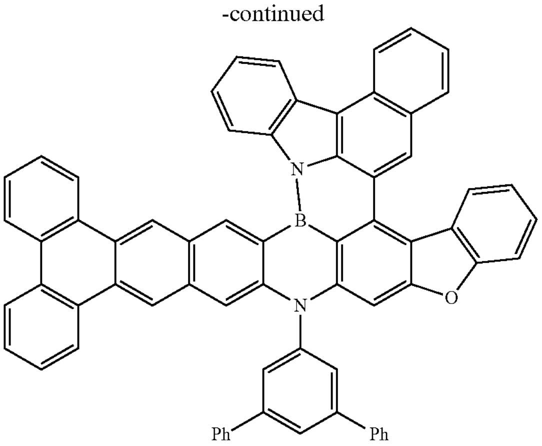
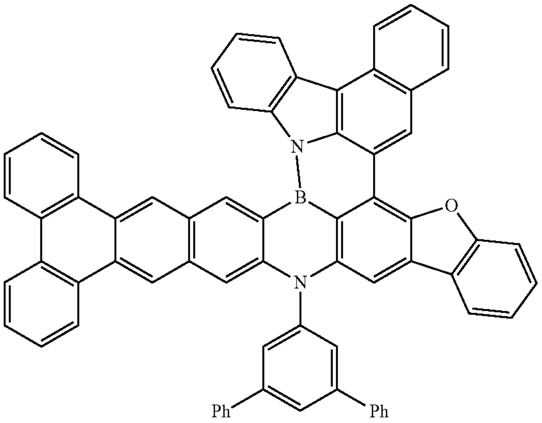
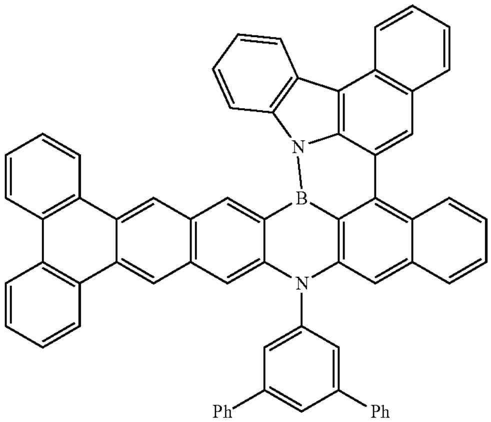
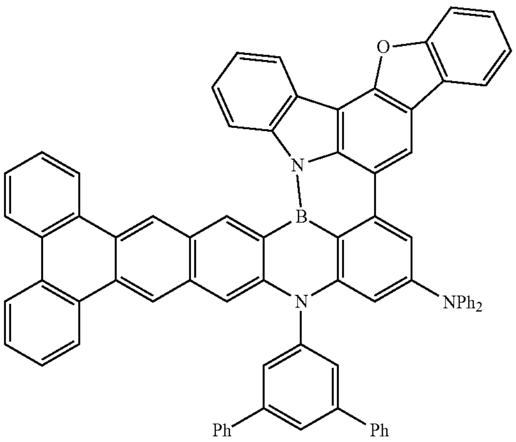
-continued
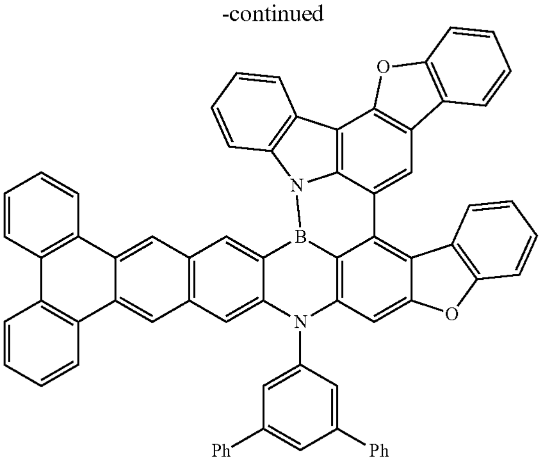
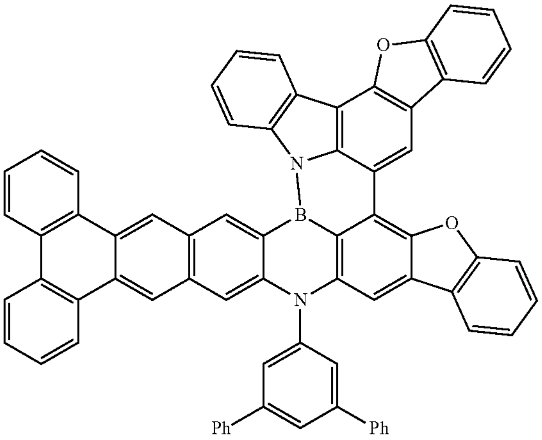
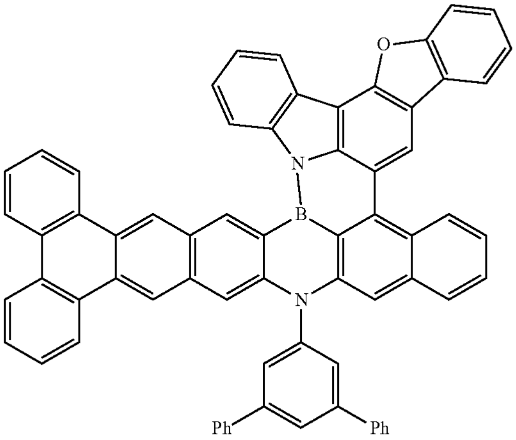

-continued
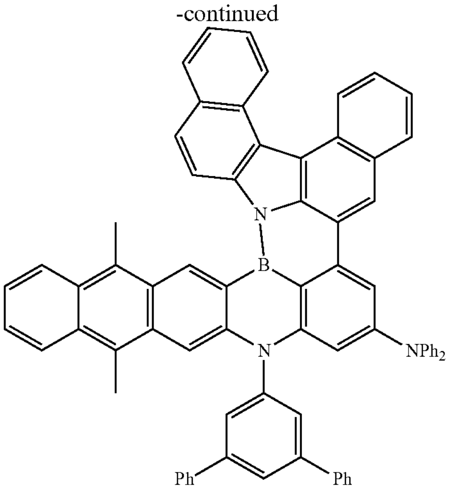
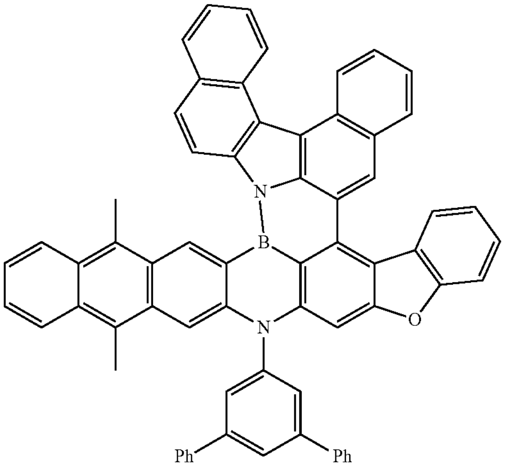
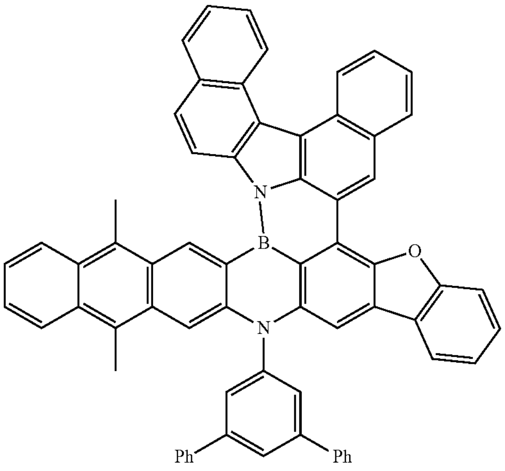
-continued
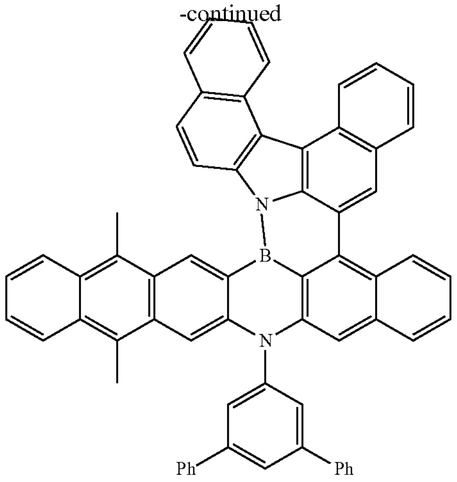
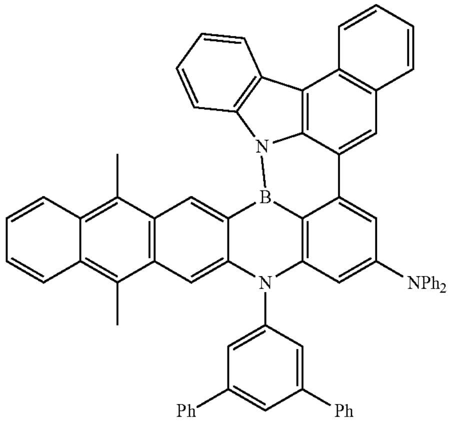
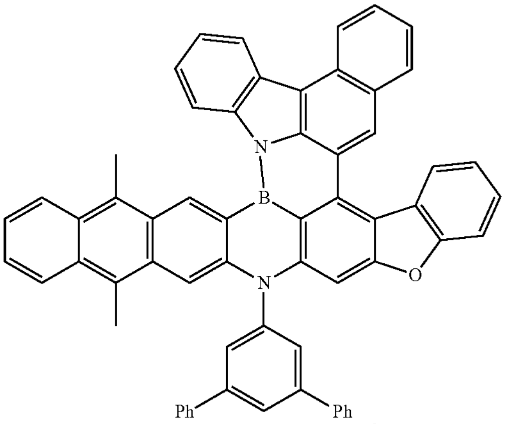
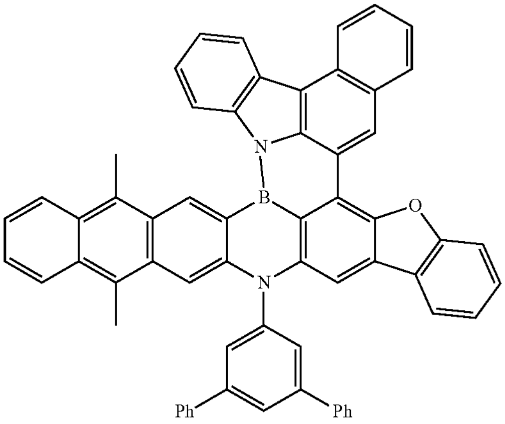

-continued
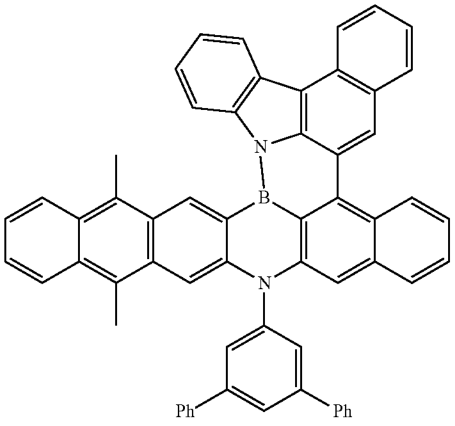
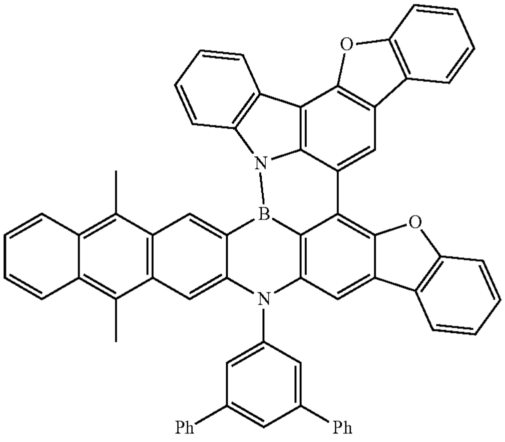
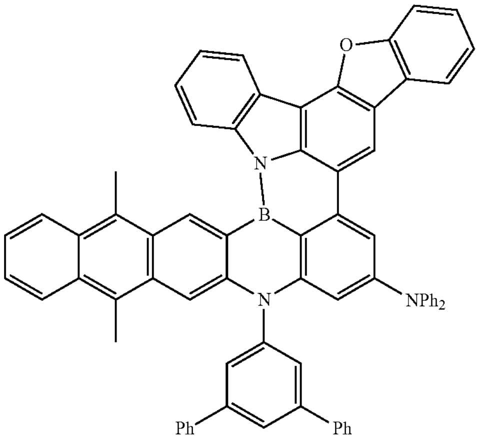
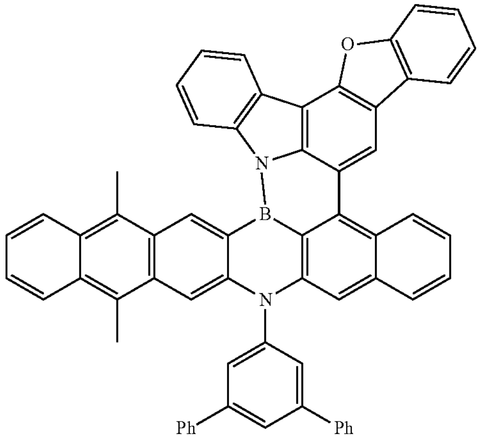
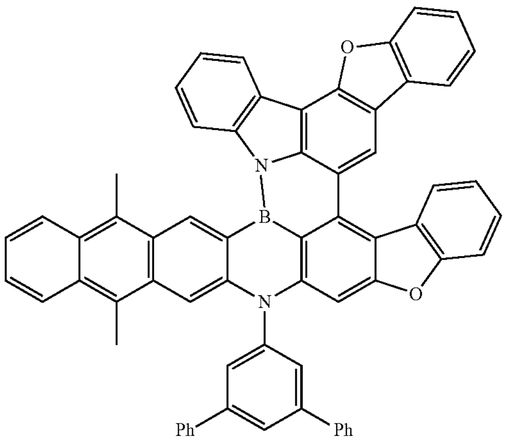
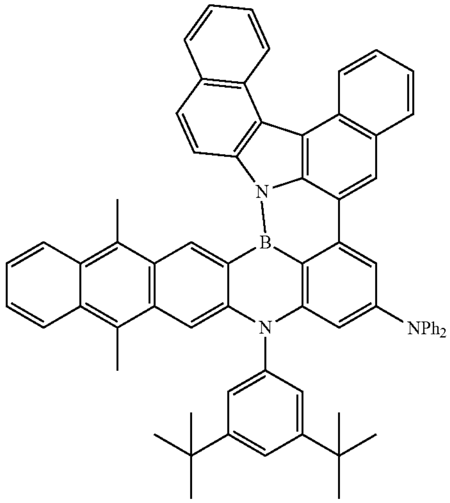
-continued -continued
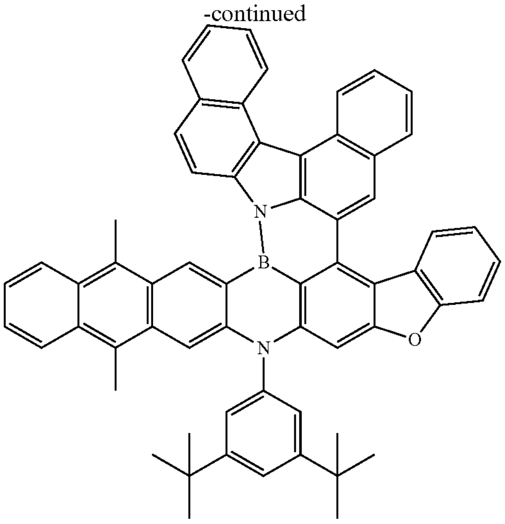
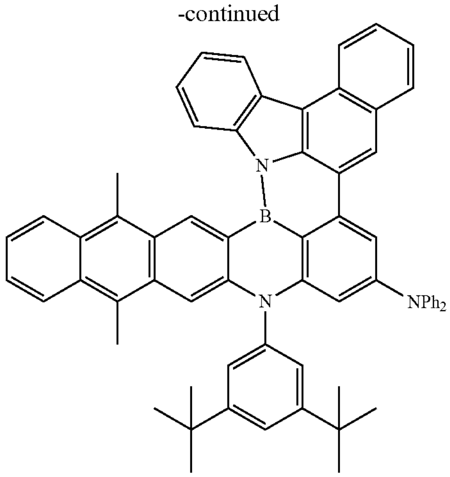
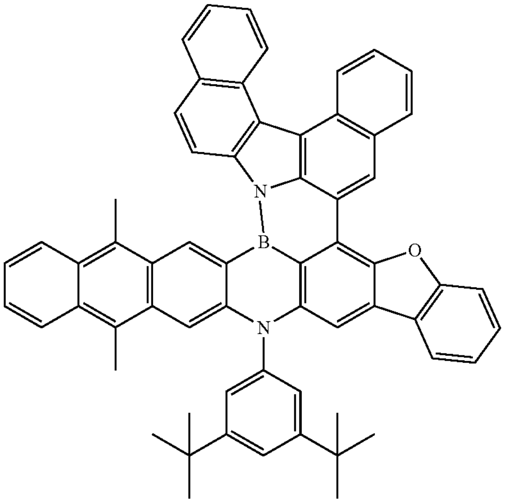
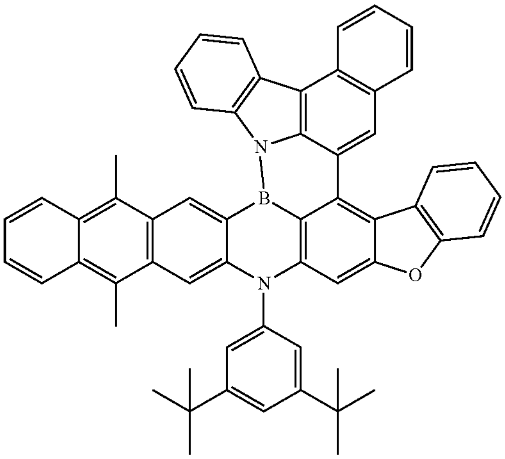
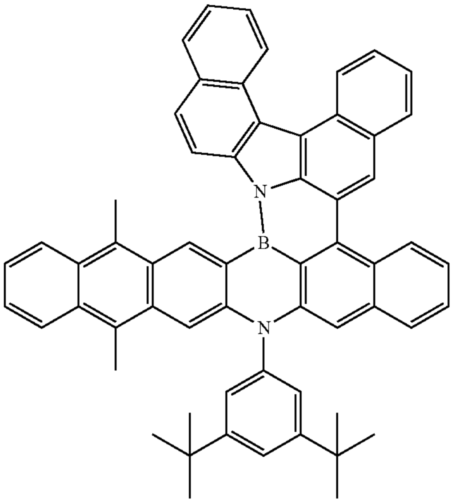
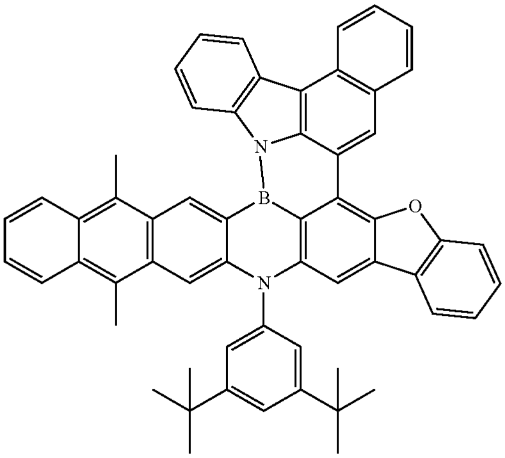
-continued -continued
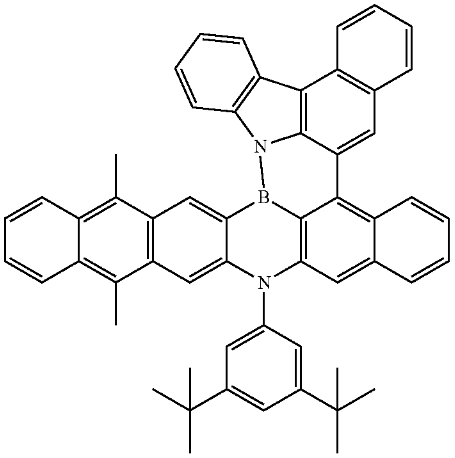
-continued
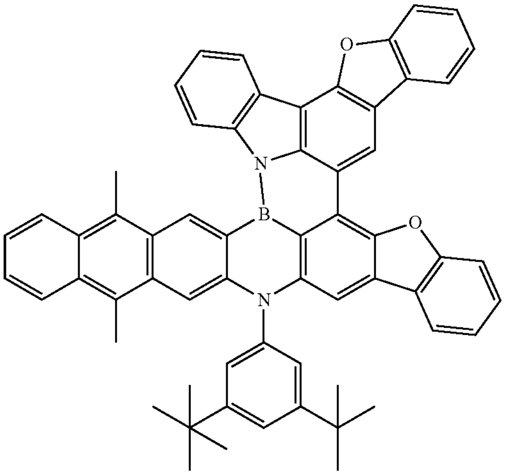
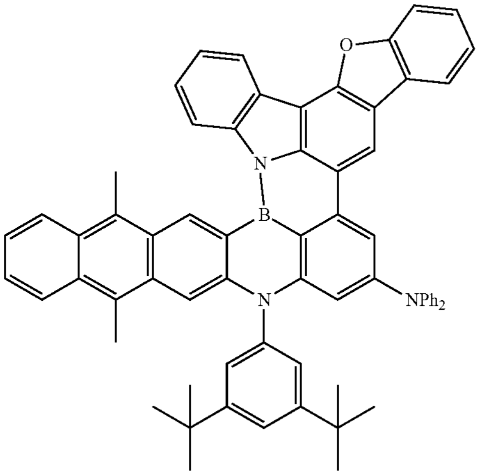
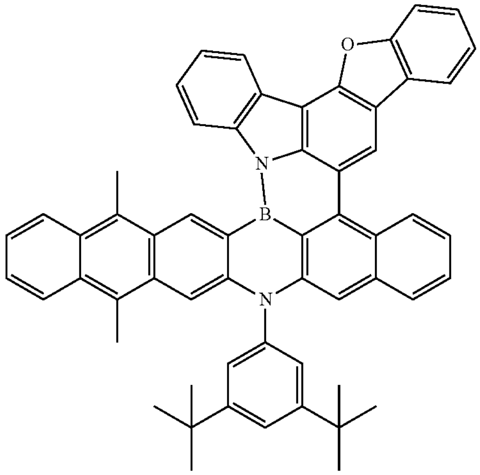
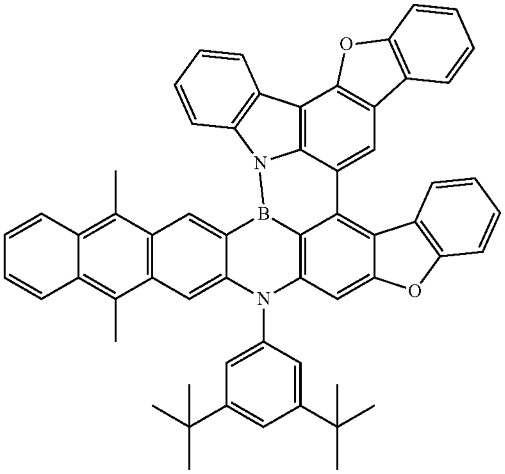
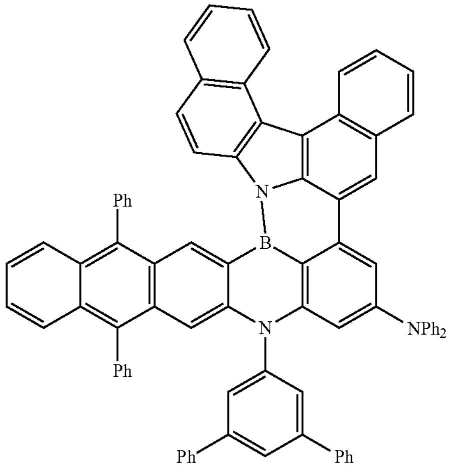

-continued
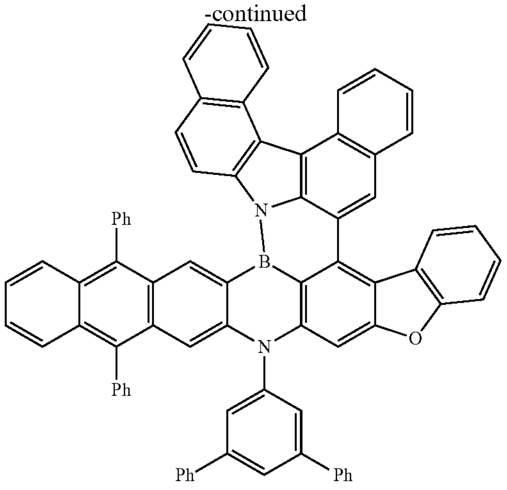
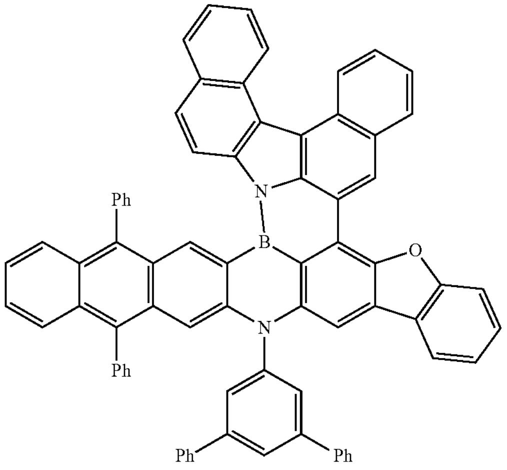
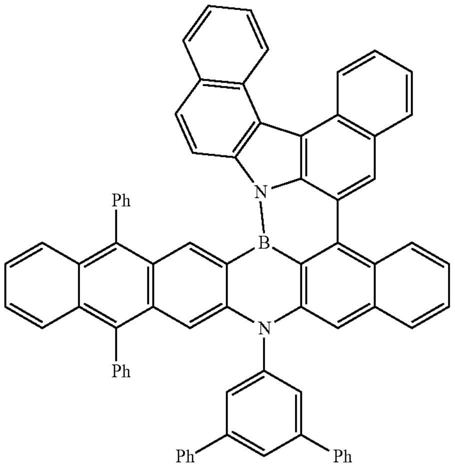
-continued
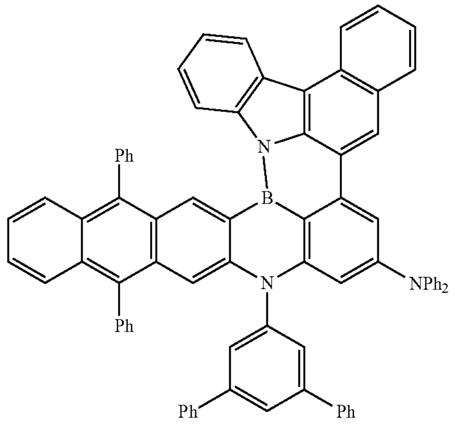
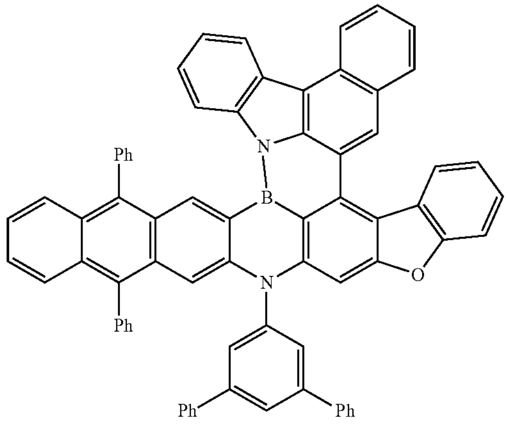
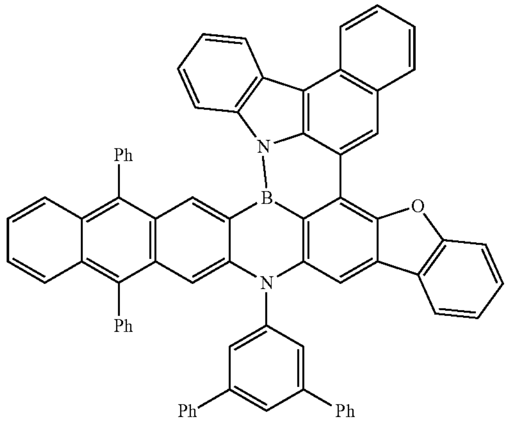
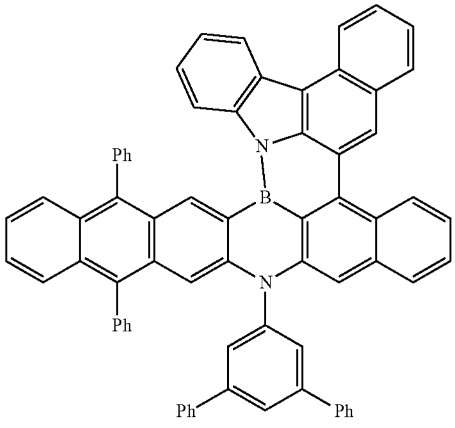

-continued
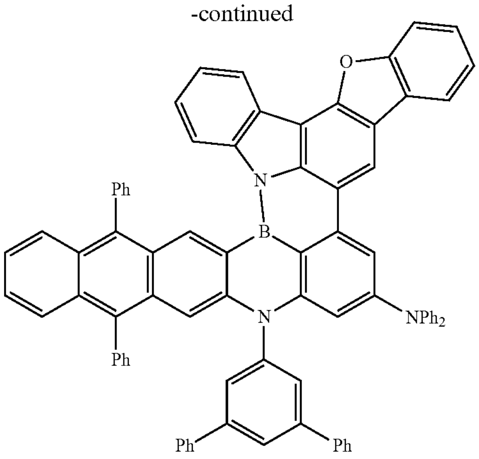
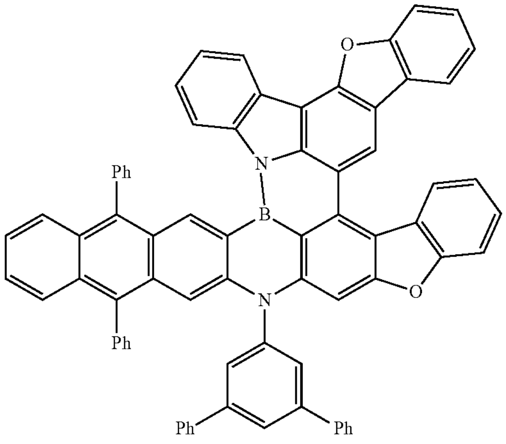
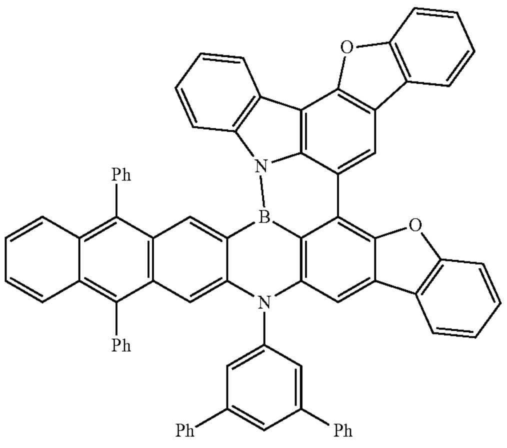
-continued
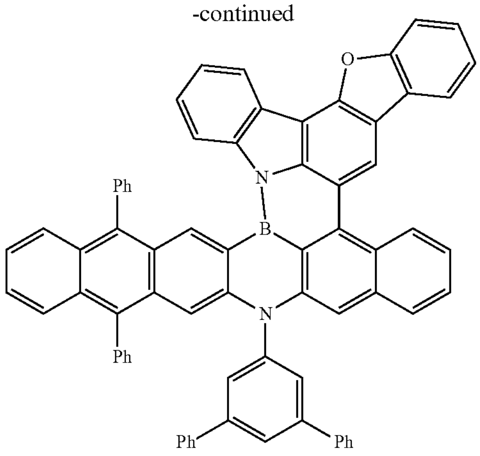
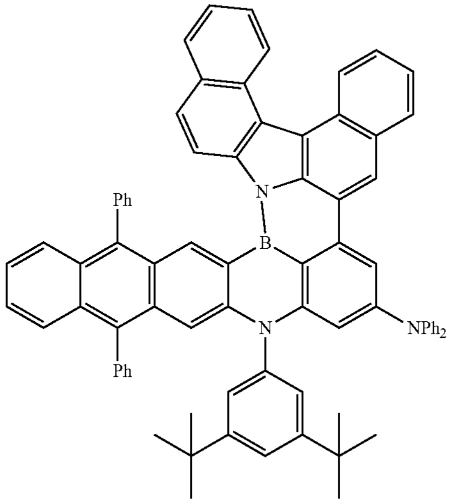
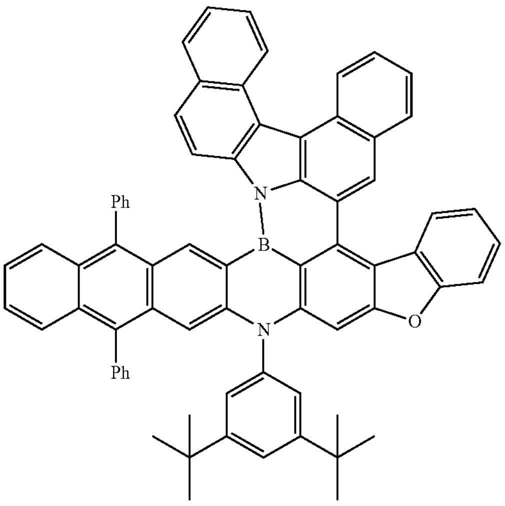

-continued
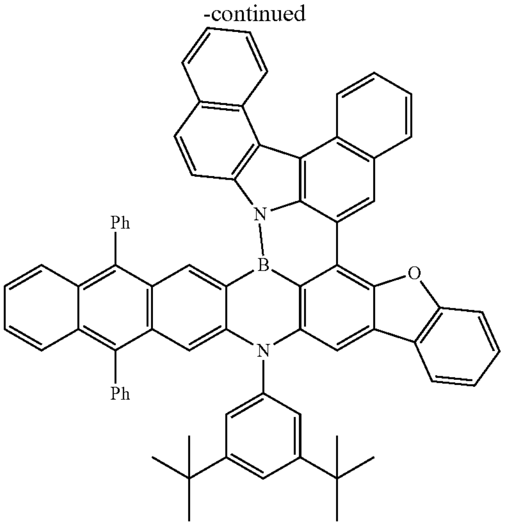
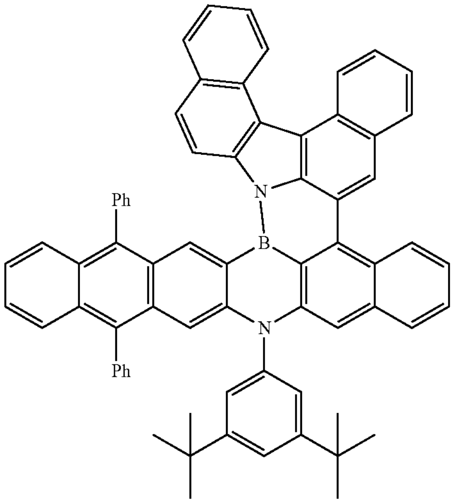
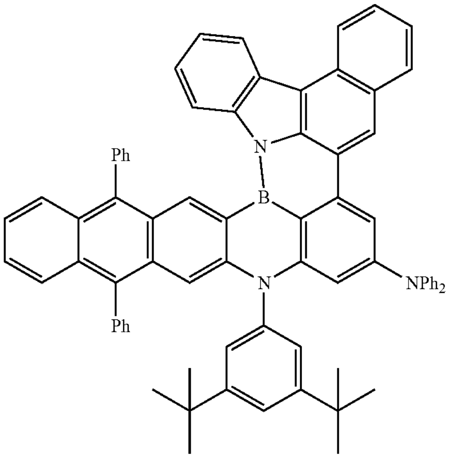
-continued
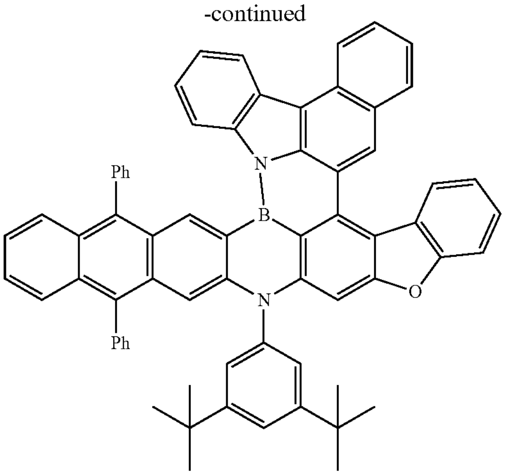
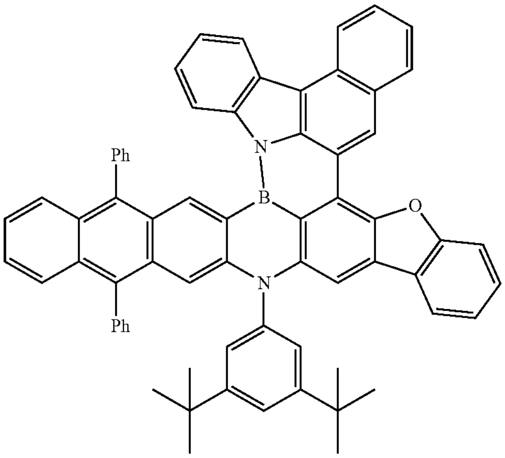
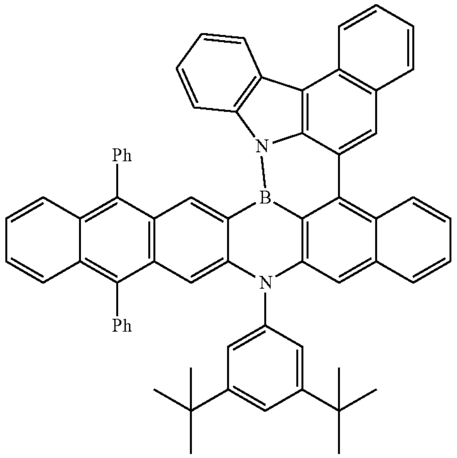

-continued

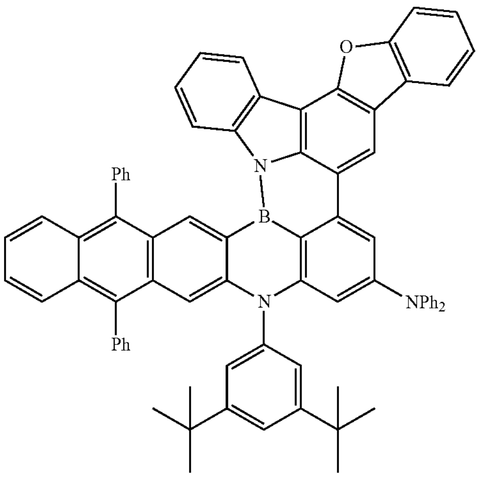

-continued

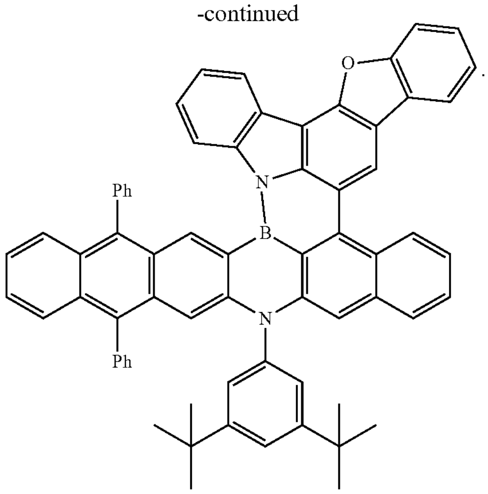

Ph = Phenyl

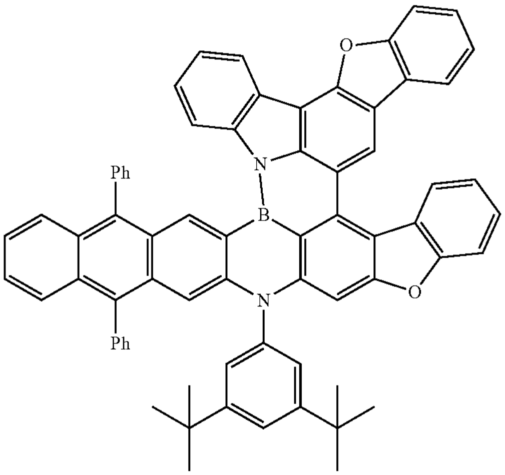

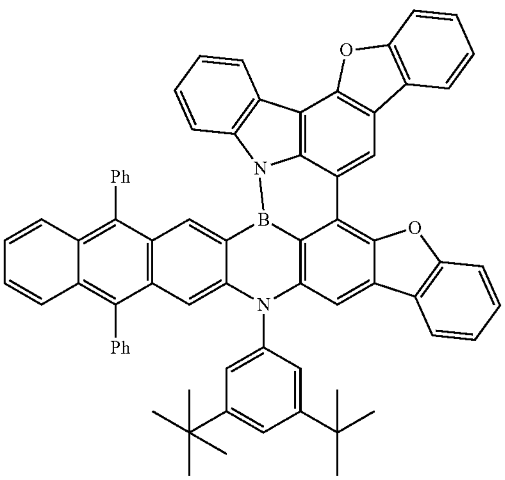

The invention claimed is:

1. An organic molecule, comprising a structure represented by Formula IIIe-0:

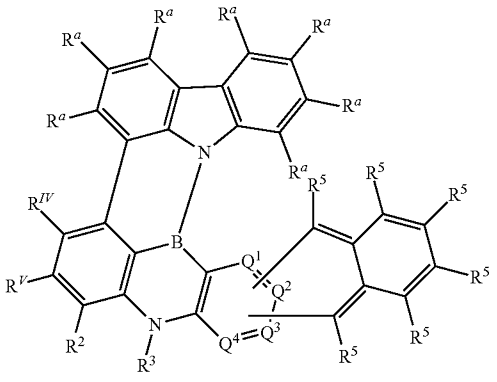

Formula IIIe-0, and wherein in Formula IIIe-0, $Q^1$ is selected from the group consisting of C and $CR^{III}$;

$Q^2$ is selected from the group consisting of C and $CR^{II}$;

$Q^3$ is selected from the group consisting of C and $CR^{I}$;

$Q^4$ is selected from the group consisting of C and $CR^1$;

wherein at least one substituent selected from the group consisting of $Q^2$ and $Q^3$ is C; and when only one substituent selected from the group consisting of $Q^2$ and $Q^3$ is C, exactly one substituent selected from the group consisting of $Q^1$ and $Q^4$ is C;

$R^1$, $R^2$, $R^3$, $R^I$, $R^{II}$, $R^{III}$, $R^{IV}$ and $R^V$ are each independently selected from the group consisting of:

hydrogen, deuterium, $N(R^5)_2$, $OR^5$, $SR^5$, $Si(R^5)_3$, $B(OR^5)_2$, $B(R^5)_2$, $OSO_2R^5$, $CF_3$, CN, F, Br, I;

$C_1$-$C_{40}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^5$; and $C_2$-$C_{57}$-heteroaryl, which is optionally substituted with one or more substituents $R^5$;

$R^a$ is at each occurrence independently selected from the group consisting of:

hydrogen, deuterium, $N(R^5)_2$, $OR^5$, $SR^5$, $Si(R^5)_3$, $B(OR^5)_2$, $B(R^5)_2$, $OSO_2R^5$, $CF_3$, CN, F, Br, I;

$C_1$-$C_{40}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^5$; and $C_2$-$C_{57}$-heteroaryl, which is optionally substituted with one or more substituents $R^5$;

$R^5$ is at each occurrence independently from one another selected from the group consisting of:

hydrogen, deuterium, $N(R^6)_2$, $OR^6$, $Si(R^6)_3$, $B(OR^6)_2$, $B(R^6)_2$, $OSO_2R^6$, $CF_3$, CN, F, Br, I;

$C_1$-$C_{40}$-alkyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_1$-$C_{40}$-alkoxy, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_1$-$C_{40}$-thioalkoxy, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_2$-$C_{40}$-alkenyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_2$-$C_{40}$-alkynyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_6$-$C_{60}$-aryl, which is optionally substituted with one or more substituents $R^6$; and $C_2$-$C_{57}$-heteroaryl, which is optionally substituted with one or more substituents $R^6$;

$R^6$ is at each occurrence independently from one another selected from the group consisting of:

hydrogen, deuterium, OPh, $CF_3$, CN, F;

$C_1$-$C_5$-alkyl, wherein one or more hydrogen atoms are optionally, independently from each other substituted by deuterium, CN, $CF_3$, or F;

$C_1$-$C_5$-alkoxy, wherein one or more hydrogen atoms are optionally, independently from each other substituted by deuterium, CN, $CF_3$, or F;

$C_1$-$C_5$-thioalkoxy, wherein one or more hydrogen atoms are optionally, independently from each other substituted by deuterium, CN, $CF_3$, or F;

$C_2$-$C_5$-alkenyl, wherein one or more hydrogen atoms are optionally, independently from each other substituted by deuterium, CN, $CF_3$, or F;

$C_2$-$C_5$-alkynyl, wherein one or more hydrogen atoms are optionally, independently from each other substituted by deuterium, CN, $CF_3$, or F;

$C_6$-$C_{18}$-aryl, which is optionally substituted with one or more $C_1$-$C_5$-alkyl substituents;

$C_2$-$C_{17}$-heteroaryl, which is optionally substituted with one or more $C_1$-$C_5$-alkyl substituents;

$N(C_6$-$C_{18}$-aryl$)_2$;

$N(C_2$-$C_{17}$-heteroaryl$)_2$; and $N(C_2$-$C_{17}$-heteroaryl$)(C_6$-$C_{18}$-aryl);

wherein any of the substituents $R^a$ and $R^5$ optionally form a mono- or polycyclic, aliphatic, aromatic, heteroaromatic and/or benzo-fused ring system with one or more adjacent substituents selected from among $R^a$ and $R^5$; and wherein any of the substituents $R^1$, $R^2$, $R^3$, $R^5$, $R^I$, $R^{II}$, $R^{III}$, $R^{IV}$, and $R^V$ optionally form a mono- or polycyclic, aliphatic, aromatic, heteroaromatic and/or benzo-fused ring system with one or more adjacent substituents $R^1$, $R^2$, $R^3$, $R^5$, $R^I$, $R^{II}$, $R^{III}$, $R^{IV}$ and/or $R^V$.

2. The organic molecule according to claim 1, wherein $R^1$, $R^2$, $R^3$, $R^5$, $R^I$, $R^{II}$, $R^{III}$, $R^{IV}$, and $R^V$ are each independently selected from the group consisting of:

hydrogen;

deuterium;

$N(R^5)_2$;

$OR^5$;

$Si(R^5)_3$;

$B(R^5)_2$;

$CF_3$;

CN;

halogen;

$C_1$-$C_{18}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$; and $R^5$ is independently selected from the group consisting of: hydrogen, deuterium, $N(R^6)_2$, $OR^6$, $Si(R^6)_3$, $B(R^6)_2$, $CF_3$, CN, F, Br, I;

$C_1$-$C_{18}$-alkyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S or $CONR^6$;

$C_6$-$C_{18}$-aryl, which is optionally substituted with one or more substituents $R^6$; and $C_2$-$C_{17}$-heteroaryl, which is optionally substituted with one or more substituents $R^6$; and wherein any of the substituents $R^1$, $R^2$, $R^3$, $R^I$, $R^{II}$, $R^{III}$, $R^{IV}$, $R^5$, and $R^V$ are optionally bonded to each other and form an aryl or heteroaryl ring, which is optionally substituted with one or more $C_1$-$C_5$-alkyl substituents, deuterium, halogen, CN or $CF_3$.

3. Organic molecule according to claim 1, comprising a structure of Formula IIIe:

Formula IIIe

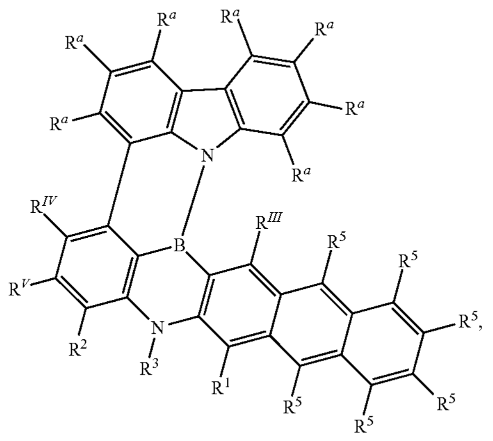

and wherein $R^1$, $R^2$, $R^3$, $R^5$, $R^a$, $R^{III}$, $R^{IV}$ and $R^V$ are the same as respective defined in connection with Formula IIIe-0.

4. The organic molecule according to claim 1, wherein $R^1$ is not hydrogen and $R^1$ is not deuterium.

5. The organic molecule according to claim 1, wherein $R^a$ is at each occurrence independently selected from the group consisting of:

hydrogen, deuterium, $N(R^5)_2$, $OR^5$, $SR^5$, $Si(R^5)_3$, $B(OR^5)_2$, $B(R^5)_2$, $OSO_2R^5$, $CF_3$, CN, halogen;

$C_1$-$C_{18}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{18}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{18}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;

$C_2$-$C_{18}$-alkenyl, which is optionally substituted with one or more substituents $R^5$ and wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;

$C_2$-$C_{18}$-alkynyl, which is optionally substituted with one or more substituents $R^5$ and wherein one or more non-adjacent $CH_2$-groups are optionally substituted by $R^5C=CR^5$, C≡C, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;

$C_6$-$C_{18}$-aryl, which is optionally substituted with one or more substituents $R^5$; and $C_2$-$C_{17}$-heteroaryl, which is optionally substituted with one or more substituents $R^5$.

6. The organic molecule according to claim 1, wherein $R^V$ is $N(R^5)_2$ and/or forms a mono- or polycyclic, aliphatic, aromatic, heteroaromatic and/or benzo-fused ring system with $R^2$, $R^3$, $R^5$, and/or $R^{IV}$.

7. The organic molecule according to claim 1, wherein at least one substituent selected from the group consisting of $R^1$, $R^2$, $R^{III}$, $R^{IV}$, and $R^V$ forms a mono- or polycyclic, aliphatic, aromatic, heteroaromatic and/or benzo-fused ring system with one or more adjacent substituents selected from among $R^1$, $R^2$, $R^3$, $R^5$, $R^I$, $R^{II}$, $R^{III}$, $R^{IV}$, and $R^V$.

8. The organic molecule according to claim 1, wherein $R^3$ is at each occurrence independently selected from the group consisting of:

$C_6$-$C_{18}$-aryl, which is optionally substituted with one or more substituents $R^5$; and $C_2$-$C_{17}$-heteroaryl, which is optionally substituted with one or more substituents $R^5$.

9. The organic molecule according to claim 1, wherein $R^a$ is at each occurrence independently selected from the group consisting of:

hydrogen;

deuterium;

$C_1$-$C_{18}$-alkyl, which is optionally substituted with one or more substituents $R^5$;

$C_6$-$C_{18}$-aryl, which is optionally substituted with one or more substituents $R^5$; and $C_2$-$C_{17}$-heteroaryl, which is optionally substituted with one or more substituents $R^5$.

10. An optoelectronic device comprising the organic molecule according to claim 1 as a luminescent emitter.

11. The optoelectronic device according to claim 10, wherein the optoelectronic device is selected from the group consisting of:

organic light-emitting diodes (OLEDs), light-emitting electrochemical cells,

OLED-sensors, organic diodes, organic solar cells, organic transistors, organic field-effect transistors, organic lasers, and down-conversion elements.

12. A composition, comprising:

(a) the organic molecule according to claim 1, as an emitter and/or a host, and (b) an emitter and/or a host material, which differs from the organic molecule, and (c) optionally, a dye and/or a solvent.

13. An optoelectronic device, comprising the organic molecule according to claim 1, wherein the device is selected from the group consisting of organic light-emitting diode (OLED), light-emitting electrochemical cell, OLED-sensor, organic diode, organic solar cell, organic transistor, organic field-effect transistor, organic laser and down-conversion element.

14. The optoelectronic device according to claim 13, comprising:

a substrate, an anode, and a cathode, wherein the anode or the cathode is on the substrate, and a light-emitting layer between the anode and the cathode, and comprising the organic molecule.

15. A method for producing an optoelectronic device, the method comprising depositing the organic molecule according to claim 1 by a vacuum evaporation method or from a solution.

16. An optoelectronic device, comprising the composition according to claim 12, wherein the device is selected from the group consisting of organic light-emitting diode (OLED), light-emitting electrochemical cell, OLED-sensor, organic diode, organic solar cell, organic transistor, organic field-effect transistor, organic laser and down-conversion element.

17. The optoelectronic device according to claim 16, comprising:

a substrate, an anode, and a cathode, wherein the anode or the cathode is disposed on the substrate, and a light-emitting layer between the anode and the cathode, and comprising the composition.

18. A method for producing an optoelectronic device, the method comprising depositing the composition according to claim 17 by a vacuum evaporation method or from a solution.

* * * * *